US012547267B2

(12) United States Patent
Chaudhri et al.

(10) Patent No.: US 12,547,267 B2
(45) Date of Patent: Feb. 10, 2026

(54) SYSTEMS AND METHODS FOR RESIZING APPLICATIONS IN A MULTITASKING VIEW ON AN ELECTRONIC DEVICE WITH A TOUCH-SENSITIVE DISPLAY

(71) Applicant: Apple Inc., Cupertino, CA (US)

(72) Inventors: Imran A. Chaudhri, San Francisco, CA (US); May-Li Khoe, San Francisco, CA (US); Nicholas Zambetti, Largo, FL (US); Lawrence Y. Yang, Bellevue, WA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 18/094,942

(22) Filed: Jan. 9, 2023

(65) Prior Publication Data

US 2023/0161432 A1 May 25, 2023

Related U.S. Application Data

(63) Continuation of application No. 17/001,600, filed on Aug. 24, 2020, now Pat. No. 11,592,923, which is a
(Continued)

(51) Int. Cl.
*G06F 3/041* (2006.01)
*G06F 3/0481* (2022.01)
(Continued)

(52) U.S. Cl.
CPC .......... *G06F 3/0416* (2013.01); *G06F 3/0481* (2013.01); *G06F 3/04817* (2013.01);
(Continued)

(58) Field of Classification Search
CPC ..... G06F 3/04886; G06Q 10/10; G11B 27/10; H04N 21/47405; H04N 21/84
See application file for complete search history.

(56) References Cited

U.S. PATENT DOCUMENTS 6,173,337 B1 1/2001 Akhond et al.
7,996,045 B1 8/2011 Bauer et al.
(Continued)

FOREIGN PATENT DOCUMENTS

CN 102129345 A 7/2011
CN 102801851 A 11/2012
(Continued)

OTHER PUBLICATIONS

Jbtech 17, "DEMO: Samsung Galaxy S III Pop Up Play", www.youtube.com/watch?v=mKeqQ8q8i5g, Jul. 17, 2012, 3 pages.
(Continued)

*Primary Examiner* — Tadesse Hailu
(74) *Attorney, Agent, or Firm* — Morgan, Lewis & Bockius LLP

(57) ABSTRACT

In an exemplary method performed at an electronic device with a touch-sensitive display. The method includes concurrently displaying a first application and a second application on the touch-sensitive display. The method also includes detecting a first contact at a border between the concurrently displayed first and second applications. Immediately following detecting the first contact: detecting a gesture from a location of the first contact towards an edge of the touch-sensitive display. Upon detecting the gesture: selecting a fixed display area from a plurality of predefined fixed display areas for the second application; automatically resizing the second application to the selected fixed display area; and automatically resizing the first application to occupy substantially all of a remaining area of the touch-sensitive display.

42 Claims, 202 Drawing Sheets

Related U.S. Application Data continuation of application No. 15/589,900, filed on May 8, 2017, now Pat. No. 10,795,490, which is a continuation of application No. 14/732,618, filed on Jun. 5, 2015, now Pat. No. 9,648,062.

(60) Provisional application No. 62/165,171, filed on May 21, 2015, provisional application No. 62/108,990, filed on Jan. 28, 2015, provisional application No. 62/011,531, filed on Jun. 12, 2014.

(51) Int. Cl.

| | |
|---|---|
| ***G06F 3/04817*** | (2022.01) |
| ***G06F 3/0482*** | (2013.01) |
| ***G06F 3/0484*** | (2022.01) |
| ***G06F 3/04883*** | (2022.01) |
| ***G06F 3/04886*** | (2022.01) |
| ***G06Q 10/10*** | (2023.01) |
| ***H04L 65/403*** | (2022.01) |
| ***H04N 21/472*** | (2011.01) |
| ***H04N 21/854*** | (2011.01) |
| ***H10D 30/63*** | (2025.01) |
| ***H10D 30/68*** | (2025.01) |
| ***H10D 30/69*** | (2025.01) |
| ***H10D 62/80*** | (2025.01) |
| *G06F 3/01* | (2006.01) |
| *G11B 27/10* | (2006.01) |
| *H04N 21/00* | (2011.01) |
| *H04N 21/84* | (2011.01) |

(52) U.S. Cl.

CPC .......... *G06F 3/0482* (2013.01); *G06F 3/0484* (2013.01); *G06F 3/04883* (2013.01); *G06F 3/04886* (2013.01); *G06Q 10/10* (2013.01); *H04L 65/403* (2013.01); *H04N 21/47205* (2013.01); *H04N 21/854* (2013.01); *H10D 30/63* (2025.01); *H10D 30/689* (2025.01); *H10D 30/6891* (2025.01); *H10D 30/701* (2025.01); *H10D 62/80* (2025.01); *G06F 3/01* (2013.01); *G06F 2203/04105* (2013.01); *G06F 2203/04803* (2013.01); *G06F 2203/04808* (2013.01); *G11B 27/10* (2013.01); *H04N 21/00* (2013.01); *H04N 21/84* (2013.01)

(56) References Cited

U.S. PATENT DOCUMENTS 8,042,110 B1 10/2011 Kawahara et al.
8,159,469 B2 4/2012 Shiplacoff et al.
8,356,258 B2 1/2013 Matthews et al.
8,508,759 B2 8/2013 Urakawa
8,610,933 B2 12/2013 Tani et al.
8,959,446 B2 2/2015 Igeta
9,052,820 B2 6/2015 Jarrett et al.
9,063,640 B2 * 6/2015 Hoffert ................. G06F 16/743
9,069,434 B1 6/2015 Kuscher et al.
9,104,440 B2 8/2015 Jarrett et al.
9,164,653 B2 10/2015 Keondjian et al.
9,223,472 B2 12/2015 LeVee et al.
9,247,313 B1 * 1/2016 Lewis .............. H04N 21/44004
9,342,236 B2 5/2016 Park et al.
D763,899 S 8/2016 Lee
9,423,938 B1 8/2016 Morris
9,450,952 B2 9/2016 Alphin, III et al.
9,613,627 B2 4/2017 Park et al.
9,658,766 B2 5/2017 Nan et al.
9,772,767 B2 * 9/2017 Jeon .................... G06F 3/04883
9,841,874 B2 12/2017 Gu
9,846,532 B2 12/2017 Herigstad et al.
10,083,047 B2 * 9/2018 Kim .................... G06F 9/44505
10,126,931 B2 11/2018 Min
10,254,942 B2 4/2019 Vranjes et al.
10,303,325 B2 5/2019 Jarrett et al.
10,338,763 B2 7/2019 Lee et al.
10,642,480 B2 5/2020 Kim et al.
10,795,490 B2 10/2020 Chaudhri et al.
11,740,776 B2 8/2023 Wilson et al.
2003/0078077 A1 4/2003 Kokubo
2004/0066407 A1 4/2004 Regan et al.
2004/0263694 A1 * 12/2004 Kim ................... H04N 21/4316 348/705
2005/0162557 A1 * 7/2005 Choi .............. H04N 21/440263 348/565
2005/0193389 A1 9/2005 Murphy et al.
2005/0257168 A1 11/2005 Cummins et al.
2006/0061597 A1 3/2006 Hui
2006/0123353 A1 6/2006 Matthews et al.
2006/0132505 A1 * 6/2006 Shin ......................... G09G 5/00 345/638
2006/0161861 A1 7/2006 Holecek et al.
2006/0212329 A1 9/2006 Lucas et al.
2006/0236264 A1 10/2006 Cain et al.
2007/0188594 A1 * 8/2007 Yoshino ................. H04N 7/147 348/14.1
2009/0031247 A1 1/2009 Walter et al.
2009/0049385 A1 * 2/2009 Blinnikka ............. G06F 3/0481 715/719
2009/0113355 A1 4/2009 Koo
2009/0259937 A1 10/2009 Rohall et al.
2010/0066698 A1 3/2010 Seo
2010/0081475 A1 4/2010 Chiang et al.
2010/0088634 A1 4/2010 Tsuruta et al.
2010/0097335 A1 4/2010 Jung et al.
2010/0107102 A1 * 4/2010 Wang ..................... G11B 27/34 715/771
2011/0078305 A1 * 3/2011 Varela ................ H04N 21/4316 709/224
2011/0138295 A1 6/2011 Momchilov et al.
2011/0138354 A1 * 6/2011 Hertenstein ............. G06F 3/048 717/115
2011/0163969 A1 * 7/2011 Anzures ................. G11B 27/34 345/173
2011/0163971 A1 7/2011 Wagner et al.
2011/0164058 A1 7/2011 Lemay
2011/0175930 A1 7/2011 Hwang et al.
2011/0250930 A1 10/2011 Jung et al.
2011/0252357 A1 10/2011 Chaudhri
2012/0081277 A1 4/2012 de Paz
2012/0084690 A1 4/2012 Sirpal et al.
2012/0084713 A1 4/2012 Desai et al.
2012/0084717 A1 4/2012 Yao et al.
2012/0092376 A1 4/2012 Jones et al.
2012/0131458 A1 * 5/2012 Hayes ................ H04N 21/4788 345/173
2012/0197857 A1 8/2012 Huang et al.
2012/0204106 A1 * 8/2012 Hill ..................... G06F 3/04883 715/716
2012/0240054 A1 9/2012 Webber
2012/0254801 A1 10/2012 Gaffney et al.
2012/0287039 A1 11/2012 Brown et al.
2012/0304092 A1 11/2012 Jarrett et al.
2012/0304102 A1 11/2012 LaVee et al.
2012/0304108 A1 11/2012 Jarrett et al.
2012/0320081 A1 12/2012 Kim et al.
2012/0324365 A1 12/2012 Momchilov et al.
2012/0327172 A1 12/2012 El-Saban et al.
2013/0014052 A1 * 1/2013 Frey ........................ G06F 3/013 715/788
2013/0042203 A1 2/2013 Wong et al.
2013/0047105 A1 2/2013 Jarrett et al.
2013/0067389 A1 3/2013 Jin
2013/0120295 A1 5/2013 Kim
2013/0120447 A1 5/2013 Kim et al.
2013/0123019 A1 * 5/2013 Sullivan .................. A63F 13/35 463/42
2013/0125045 A1 5/2013 Sun et al.
2013/0145267 A1 6/2013 Ramachandran
2013/0145313 A1 6/2013 Roh et al.

(56) References Cited

U.S. PATENT DOCUMENTS

2013/0174049 A1 7/2013 Townsend et al.
2013/0174179 A1 7/2013 Park et al.
2013/0187861 A1 7/2013 Lavallee
2013/0191779 A1 7/2013 Radakovitz et al.
2013/0198634 A1 8/2013 Matas et al.
2013/0215040 A1 8/2013 Bose et al.
2013/0219343 A1 8/2013 Nan et al.
2013/0222296 A1 8/2013 Paek
2013/0268885 A1 10/2013 Lim et al.
2013/0302008 A1* 11/2013 Kwon ................ H04N 21/4884 386/230
2013/0305184 A1 11/2013 Kim et al.
2013/0321340 A1* 12/2013 Seo ....................... G06F 3/1438 345/174
2014/0018053 A1* 1/2014 Cho ...................... H04M 1/724 455/418
2014/0026062 A1 1/2014 Proudfoot et al.
2014/0028572 A1 1/2014 St. Clair
2014/0033040 A1* 1/2014 Thomas ................... G09B 5/06 715/721
2014/0033288 A1 1/2014 Wynn et al.
2014/0053097 A1 2/2014 Shin et al.
2014/0075394 A1 3/2014 Nawle et al.
2014/0078182 A1 3/2014 Utsunomiya
2014/0089833 A1 3/2014 Hwang et al.
2014/0123013 A1* 5/2014 Lee ................... H04M 1/72427 715/719
2014/0132531 A1 5/2014 Lee
2014/0137020 A1 5/2014 Sharma et al.
2014/0140677 A1* 5/2014 Cho ....................... H04N 23/80 386/230
2014/0157163 A1 6/2014 Strutin-Belinoff et al.
2014/0164957 A1 6/2014 Shin et al.
2014/0164966 A1 6/2014 Kim et al.
2014/0164990 A1 6/2014 Kim et al.
2014/0164991 A1 6/2014 Kim et al.
2014/0168076 A1 6/2014 Hicks et al.
2014/0173517 A1 6/2014 Chaudhri
2014/0181843 A1 6/2014 Yang
2014/0189608 A1 7/2014 Shutteworth et al.
2014/0195953 A1 7/2014 Sakai et al.
2014/0210753 A1 7/2014 Lee et al.
2014/0215542 A1* 7/2014 Terpe ................... H04N 21/858 725/112
2014/0282606 A1 9/2014 Clark et al.
2014/0298245 A1 10/2014 Tappen et al.
2014/0304651 A1 10/2014 Johansson et al.
2014/0310646 A1 10/2014 Vranjes et al.
2014/0313341 A1* 10/2014 Stribling .............. H04N 23/632 348/157
2014/0317559 A1 10/2014 Wakefield
2014/0325410 A1 10/2014 Jung et al.
2014/0325430 A1 10/2014 Vranjes et al.
2014/0325432 A1 10/2014 Frederickson et al.
2014/0334797 A1* 11/2014 Lee ........................ G11B 27/28 386/241
2014/0337793 A1 11/2014 Han et al.
2014/0351816 A1 11/2014 Park
2014/0359443 A1* 12/2014 Hwang ................. H04M 1/724 715/768
2014/0359656 A1* 12/2014 Banica ................. H04N 21/234 725/32
2014/0365890 A1* 12/2014 Lei ........................ G06F 3/0484 715/719
2015/0015512 A1 1/2015 Kwak et al.
2015/0033125 A1 1/2015 Kang et al.
2015/0040009 A1* 2/2015 Curry ...................... G06F 3/017 715/719
2015/0062433 A1 3/2015 Wang et al.
2015/0074589 A1 3/2015 Pan et al.
2015/0113407 A1* 4/2015 Hoffert ................ H04N 21/482 715/720
2015/0113455 A1 4/2015 Kang et al.
2015/0128042 A1 5/2015 Churchill et al.
2015/0145774 A1 5/2015 Ostberg et al.
2015/0154205 A1* 6/2015 Grano ................ G06Q 30/0214 705/26.8
2015/0169071 A1 6/2015 Jitkoff
2015/0169178 A1 6/2015 Wang et al.
2015/0227271 A1 8/2015 Kang et al.
2015/0227274 A1 8/2015 Lee et al.
2015/0234545 A1 8/2015 Churchill et al.
2015/0264292 A1* 9/2015 Greene ................. G06F 3/0488 386/248
2015/0293664 A1 10/2015 Burchell et al.
2015/0317062 A1 11/2015 Jarrett et al.
2015/0350005 A1 12/2015 Singh et al.
2015/0355817 A1 12/2015 Dai et al.
2015/0363066 A1 12/2015 Lemay et al.
2015/0365306 A1 12/2015 Chaudhri et al.
2016/0189328 A1 6/2016 Vranjes et al.
2016/0209973 A1 7/2016 Kaufthal et al.
2016/0210027 A1 7/2016 LeVee et al.
2016/0302008 A1 10/2016 Oishi
2017/0046317 A1 2/2017 Geva et al.
2017/0192621 A1* 7/2017 Leem .................. H04N 23/631
2017/0242538 A1 8/2017 Chaudhri et al.
2017/0245017 A1 8/2017 Chaudhri et al.
2018/0032228 A1 2/2018 Lemay et al.
2018/0052369 A1 2/2018 Ko et al.
2018/0150216 A1 5/2018 Choi et al.
2018/0249083 A1 8/2018 Chi et al.
2018/0284948 A1 10/2018 Hao et al.
2019/0369862 A1 12/2019 de Vries
2020/0241746 A1 7/2020 Chen et al.
2020/0310615 A1 10/2020 Lemay et al.
2020/0387257 A1 12/2020 Chaudhri et al.
2024/0264738 A1 8/2024 de Vries

FOREIGN PATENT DOCUMENTS

CN 103562839 A 2/2014
CN 103593009 A 2/2014
CN 103677627 A 3/2014
EP 2 241 963 A1 10/2010
EP 2 662 761 A1 11/2013
EP 2 741 201 A2 6/2014
JP 2003-209609 7/2003
TW 201342235 A 10/2013
WO WO 2012/174706 A1 12/2012

OTHER PUBLICATIONS

XDA, “Picture-in-Picture Mode in Android O—What You Need to Know”, https://www.youtube.com/watch?v=1_7faixnGlo, Sep. 4, 2017, 10 pages.
Office Action, dated Feb. 17, 2016, received in U.S. Appl. No. 14/732,618, 13 pages.
Notice of Allowance, dated Aug. 23, 2016, received in U.S. Appl. No. 14/732,618, 9 pages.
Notice of Allowance, dated Mar. 6, 2017, received in U.S. Appl. No. 14/732,618, 6 pages.
Office Action, dated Mar. 28, 2017, received in Australian Patent Application No. 2015274341, which corresponds with U.S. Appl. No. 14/732,618, 2 pages.
Office Action, dated Feb. 15, 2018, received in Australian Patent Application No. 2015274341, which corresponds with U.S. Appl. No. 14/732,618, 3 pages.
Grant, dated Jun. 14, 2018, received in Australian Patent Application No. 2015274341, which corresponds with U.S. Appl. No. 14/732,618, 1 page.
Office Action, dated May 23, 2019, received in Australian Patent Application No. 2018203847, which corresponds with U.S. Appl. No. 14/732,618, 3 pages.
Notice of Acceptance, dated Nov. 15, 2019, received in Australian Patent Application No. 2018203847, which corresponds with U.S. Appl. No. 14/732,618, 3 pages.
Certificate of Grant, dated Mar. 19, 2020, received in Australian Patent Application No. 2018203847, which corresponds with U.S. Appl. No. 14/732,618, 4 pages.

(56) References Cited

OTHER PUBLICATIONS

Office Action, dated Jul. 29, 2020, received in Australian Patent Application No. 2019283870, which corresponds with U.S. Appl. No. 14/732,618, 3 pages.
Notice of Acceptance, dated Apr. 27, 2021, received in Australian Patent Application No. 2019283870, which corresponds with U.S. Appl. No. 14/732,618, 3 pages.
Office Action, dated May 12, 2022, received in Australian Patent Application No. 2019212150, which corresponds with U.S. Appl. No. 14/732,618, 3 pages.
Office Action, dated Mar. 11, 2019, received in Chinese Patent Application No. 201580029010.0, which corresponds with U.S. Appl. No. 14/732,618, 4 pages.
Office Action, dated May 24, 2019, received in Chinese Patent Application No. 201580029010.0, which corresponds with U.S. Appl. No. 14/732,618, 3 pages.
Office Action, dated Aug. 22, 2019, received in Chinese Patent Application No. 201580029010.0, which corresponds with U.S. Appl. No. 14/732,618, 3 pages.
Office Action, dated Jan. 17, 2020, received in Chinese Patent Application No. 201580029010.0, which corresponds with U.S. Appl. No. 14/732,618, 3 pages.
Office Action, dated Jun. 6, 2018, received in European Patent Application No. 15732140.7, which corresponds with U.S. Appl. No. 14/732,618, 12 pages.
Office Action, dated Oct. 27, 2016, received in Taiwanese Patent Application No. 104119192, which corresponds with U.S. Appl. No. 14/732,618, 2 pages.
Notice of Allowance, dated May 22, 2017, received in Taiwanese Patent Application No. 104119192, which corresponds with U.S. Appl. No. 14/732,618, 5 pages.
Patent, dated Sep. 1, 2017, received in Taiwanese Patent Application No. 104119192, which corresponds with U.S. Appl. No. 14/732,618, 5 pages.
Office Action, dated Sep. 9, 2016, received in U.S. Appl. No. 14/738,672, 19 pages.
Notice of Allowance, dated Jun. 7, 2017, received in U.S. Appl. No. 14/738,672, 9 pages.
Office Action, dated Oct. 26, 2018, received in U.S. Appl. No. 15/589,894, 14 pages.
Notice of Allowance, dated Jun. 6, 2019, received in U.S. Appl. No. 15/589,894, 7 pages.
Office Action, dated Nov. 23, 2018, received in U.S. Appl. No. 15/589,900, 11 pages.
Final Office Action, dated Jul. 8, 2019, received in U.S. Appl. No. 15/589,900, 11 pages.
Office Action, dated Dec. 12, 2019, received in U.S. Appl. No. 15/589,900, 12 pages.
Notice of Allowance, dated Jun. 2, 2020, received in U.S. Appl. No. 15/589,900, 7 pages.
Office Action, dated Mar. 21, 2019, received in U.S. Appl. No. 15/729,407, 16 pages.
Final Office Action, dated Oct. 28, 2019, received in U.S. Appl. No. 15/729,407, 20 pages.
Notice of Allowance, dated Mar. 31, 2020, received in U.S. Appl. No. 15/729,407, 10 pages.
Office Action, dated Aug. 18, 2020, received in U.S. Appl. No. 16/414,676, 22 pages.
Final Office Action, dated Feb. 26, 2021, received in U.S. Appl. No. 16/414,676, 24 pages.
Final Office Action, dated Feb. 3, 2022, received in U.S. Appl. No. 16/414,676, 22 pages.
Office Action, dated Aug. 18, 2021, received in U.S. Appl. No. 16/903,265, 14 pages.
Final Office Action, dated Apr. 4, 2022, received in U.S. Appl. No. 16/903,265, 16 pages.
Final Office Action, dated Apr. 4, 2022, received from U.S. Appl. No. 17/001,600, 13 pages.
Final Office Action, dated Dec. 2, 2021, received from U.S. Appl. No. 17/001,600, 16 pages.
Office Action, dated Mar. 25, 2022, received from U.S. Appl. No. 17/001,600, 18 pages.
Notice of Allowance, dated Oct. 24, 2022, received from U.S. Appl. No. 17/001,600, 6 pages.
Extended European Search Report, dated Feb. 18, 2022, received in European Patent Application No. 20192716.7, which corresponds with U.S. Appl. No. 14/732,618, 13 pages.
International Search Report and Written Opinion, dated Jan. 15, 2016, received in International Patent Application No. PCT/US2015/035672, which corresponds with U.S. Appl. No. 14/732,618, 17 pages.
Search Report and Written Opinion, dated Oct. 27, 2015, received in International Patent Application No. PCT/US2015/035675, which corresponds with U.S. Appl. No. 14/738,672, 9 pages.
Notice of Allowance, dated Dec. 2, 2022, received in Australian Patent Application No. 2019212150, which corresponds with U.S. Appl. No. 14/732,618, 3 pages.
Office Action, dated Nov. 10, 2022, received in U.S. Appl. No. 16/414,676, 20 pages.
Office Action, dated Nov. 14, 2022, received in U.S. Appl. No. 16/903,265, 18 pages.
Final Office Action, dated Mar. 2, 2023, received in U.S. Appl. No. 16/903,265, 18 pages.
Knight, "How to Use the New Picture-in-Picture Mode in Android O", https://android.gadgethacks.com/how-to/use-new-picture-mode-android-o-0178324/, Jun. 23, 2017, 6 pages.
Certificate of Grant, dated Apr. 6, 2023, received in Australian Patent Application No. 2019212150, which corresponds with U.S. Appl. No. 14/732,618, 4 pages.
Notice of Allowance, dated Mar. 31, 2023, received in Australian Patent Application No. 2023201551, 3 pages.
Final Office Action, dated May 1, 2023, received in U.S. Appl. No. 16/414,676, 23 pages.
Notice of Allowance, dated Dec. 4, 2023, received in U.S. Appl. No. 16/414,676, 5 pages.
U.S. Appl. No. 10/013,227 B2 filed Jul. 3, 2018, Hyun et al.
Wahab, "How to use picture in picture mode for videos on Facebook", https://www.addistivetips.com/ios/picture-in-picture-mode-for-videos-on-facebook/, 2017, 3 pages.
Notice of Allowance, dated Oct. 23, 2024, received in U.S. Appl. No. 16/903,265, 9 pages.
Notice of Allowance, dated Jan. 13, 2025, received in U.S. Appl. No. 16/903,265, 9 pages.
Office Action, dated Nov. 6, 2024, received in U.S. Appl. No. 18/641,236, 8 pages.
Office Action, dated May 19, 2023, received in Chinese Patent Application No. 202210893659.9, which corresponds with U.S. Appl. No. 17/001,600, 4 pages.
Office Action, dated Aug. 30, 2024, received in Australian Patent Application No. 2023206154, 2 pages.
Office Action, dated Aug. 22, 2025, received in Australian Patent Application No. 2023206154, 3 pages.

* cited by examiner

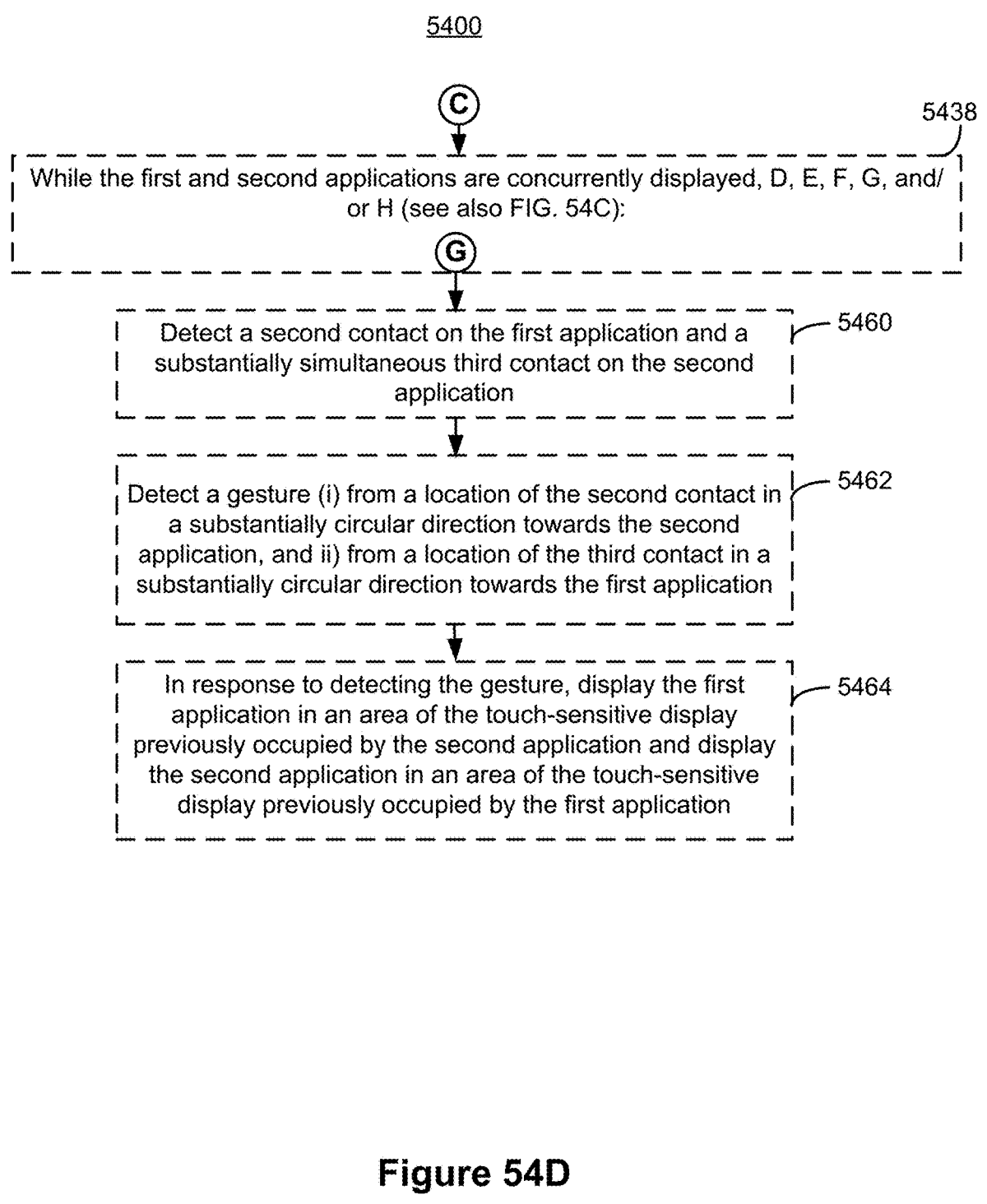

5400

(C)

5438: While the first and second applications are concurrently displayed, D, E, F, G, and/or H (see also FIG. 54C):

(G)

5460: Detect a second contact on the first application and a substantially simultaneous third contact on the second application 5462: Detect a gesture (i) from a location of the second contact in a substantially circular direction towards the second application, and ii) from a location of the third contact in a substantially circular direction towards the first application 5464: In response to detecting the gesture, display the first application in an area of the touch-sensitive display previously occupied by the second application and display the second application in an area of the touch-sensitive display previously occupied by the first application

Figure 54D

SYSTEMS AND METHODS FOR RESIZING APPLICATIONS IN A MULTITASKING VIEW ON AN ELECTRONIC DEVICE WITH A TOUCH-SENSITIVE DISPLAY

RELATED APPLICATIONS

This application is a continuation of U.S. patent application Ser. No. 17/001,600, filed Aug. 24, 2020, which is a continuation of U.S. patent application Ser. No. 15/589,900, filed May 8, 2017, now U.S. Pat. No. 10,795,490, which is a continuation of U.S. patent application Ser. No. 14/732,618, filed Jun. 5, 2015, now U.S. Pat. No. 9,648,062, which claims priority to U.S. Provisional Application No. 62/165,171, filed May 21, 2015, U.S. Provisional Application No. 62/108,990, filed Jan. 28, 2015, and U.S. Provisional Application No. 62/011,531, filed Jun. 12, 2014, each of which is hereby incorporated by reference in its entirety.

This application also relates to U.S. patent application Ser. No. 14/814,420, filed Jul. 30, 2015, now U.S. Pat. No. 10,101,879, which is hereby incorporated by reference herein in its entirety.

TECHNICAL FIELD

The embodiments herein generally relate to electronic devices with touch-sensitive displays and, more specifically, to systems and methods for multitasking on an electronic device with a touch-sensitive display (e.g., a portable multifunction device with a touch-sensitive display).

BACKGROUND

Handheld electronic devices with touch-sensitive displays are ubiquitous. While these devices were originally designed for information consumption (e.g., web-browsing) and communication (e.g., email), they are rapidly replacing desktop and laptop computers as users' primary computing devices. Users of desktop or laptop computers, however, routinely multitask by swapping between running applications (e.g., cutting-and-pasting text from a document into an email). While there has been tremendous growth in the scope of new features and applications for handheld electronic devices, the ability to multitask and swap between applications on handheld electronic devices requires entirely different input mechanisms than those of desktop or laptop computers.

Moreover, the need for multitasking is particularly acute on handheld electronic devices, as they have smaller screens than traditional desktop and laptop computers. Some conventional handheld electronic devices attempt to address this need by recreating the desktop computer interface on the handheld electronic device. These attempted solutions, however, fail to take into account: (i) the significant differences in screen size between desktop computers and handled electronic devices, and (ii) the significant differences between keyboard and mouse interaction of desktop computers and those of touch and gesture inputs of handled electronic devices with touch-sensitive displays. Other attempted solutions require complex input sequences and menu hierarchies that are even less user-friendly than those provided on desktop or laptop computers. As such, it is desirable to provide an intuitive and easy-to-use system and method for simultaneously accessing multiple functions or applications on handheld electronic devices.

SUMMARY

The embodiments described herein address the need for systems, methods, and graphical user interfaces that provide intuitive and seamless interactions for multitasking on a handheld electronic device. Such methods and systems optionally complement or replace conventional touch inputs or gestures.

(A1) In accordance with some embodiments, a method is performed at an electronic device (e.g., portable multifunction device 100, FIG. 1A) with a touch-sensitive display (e.g., touch screen 112, FIG. 1C). The method includes displaying a first application on the touch-sensitive display and detecting a first contact, on the touch-sensitive display, at an affordance corresponding to a second application. In response to detecting the first contact, temporarily displaying the second application overlaying at least a portion of the displayed first application. In some embodiments, the method further includes: determining whether the first application is compatible with a shared screen mode. In accordance with a determination that the first application is compatible with the shared screen mode: (i) resizing the first application and displaying the resized first application on the touch-sensitive display and (ii) concurrently displaying the second application on the touch-sensitive display such that the resized first application and the concurrently displayed second application occupy substantially all of the touch-sensitive display.

(A2) In some embodiments of the method of A1, the method further includes: while the first application and the second application are concurrently displayed: (i) detecting a second contact on the first application and a substantially simultaneous third contact on the second application and (ii) detecting a gesture (a) from a location of the second contact in a substantially circular direction towards the second application, and (b) from a location of the third contact in a substantially circular direction towards the first application. In response to detecting the gesture, the method further includes displaying the first application in an area of the touch-sensitive display previously occupied by the second application and displaying the second application in an area of the touch-sensitive display previously occupied by the first application.

(A3) In some embodiments of the method of A1, the concurrently displayed second application is displayed with a predefined area that is less than an area of the resized first application.

(A4) In some embodiments of the method of any one of A1-A3, the method further includes: while the first application and the second application are concurrently displayed, receiving a first request to display a home screen. In response to receiving the first request, the method further includes: ceasing to display the first and second applications and displaying the home screen. In some embodiments, the method also includes: receiving a second request to open a third application. In response to receiving the second request, the method further includes: ceasing to display the home screen and concurrently displaying the third application and the second application. In some embodiments, the third application is displayed in a portion of the touch-sensitive display previously occupied by the first application.

(A5) In some embodiments of the method of any one of A1-A4, the method further includes: while the first application and the second application are concurrently displayed, detecting a change in an orientation of the electronic device. In response to detecting the change in the orientation, the method further includes determining whether the change in the orientation was from portrait to landscape. Upon determining that the change in the orientation was from portrait to landscape, the method further includes continuing to concurrently display the second application.

(A6) In some embodiments of the method of any one of A1-A5, the method further includes: while the first application and the second application are concurrently displayed, detecting a change in an orientation of the electronic device. In response to detecting the change in the orientation, the method further includes determining whether the change in the orientation was from landscape to portrait. Upon determining that the change in the orientation was from landscape to portrait, the method further includes ceasing to concurrently display the second application and displaying the first application on substantially all of the touch-sensitive display.

(A7) In some embodiments of the method of A1, the method further includes: in accordance with a determination that the first application is not compatible with the shared screen mode, continuing to display the second application overlaying at least the portion of the displayed first application.

(A8) In some embodiments of the method of A1, the method further includes: in accordance with a determination that the first application is not compatible with the shared screen mode, ceasing to display the first application and displaying the second application on substantially all of the touch-sensitive display.

(A9) In some embodiments of the method of any one of A1-A8, detecting the first contact includes determining that the first contact requests display of the second application.

(A10) In some embodiments of the method of any one of A1-A9, the method further includes: while temporarily displaying the second application overlaying at least a first portion of the displayed first application, reducing a brightness associated with a second portion of the touch-sensitive display displaying the first application.

(A11) In some embodiments of the method of A10, reducing the brightness includes dimming the second portion of the touch-sensitive display displaying the first application.

(A12) In some embodiments of the method of A10, the method further includes: after reducing the brightness associated with the second portion of the touch-sensitive display displaying the first application, receiving a second contact on the second portion. In response to receiving the second contact, the method further includes ceasing to concurrently display the second application and displaying the first application on substantially all of the touch-sensitive display.

(A13) In some embodiments of the method of A12, the method further includes: detecting a first gesture over the displayed first application, the first gesture comprising at least three contacts on the touch-sensitive display. In some embodiments, the first gesture moves in a first direction towards an edge of the touch-sensitive display. In response to detecting a liftoff event associated with the first gesture, the method further includes ceasing to display the first application and displaying the second application on substantially all of the touch-sensitive display.

(A14) In some embodiments of the method of A13, the method further includes: detecting a second gesture over the displayed second application, the second gesture comprising at least three contacts on the touch-sensitive display. In some embodiments, the second gesture moves in a second direction, opposite the first direction, that is away from the edge of the touch-sensitive display. In response to detecting a liftoff event associated with the second gesture, the method further includes ceasing to display the second application and displaying the first application on substantially all of the touch-sensitive display.

(A15) In some embodiments of the method of A1, determining whether the first application is compatible with the shared screen mode is performed in response to detecting a second contact at an affordance.

(A16) In some embodiments of the method of A15, the affordance is a pin affordance displayed on top of the first application.

(A17) In some embodiments of the method of any one of A1-A16, the method further includes: while the first application and the second application are concurrently displayed, detecting a gesture comprising a second contact over the first application and a third contact over the second application. In response to detecting the gesture, the method further includes resizing the first and second applications in accordance with movement of the gesture.

(A18) In some embodiments of the method of A17, the method further includes: determining whether movement of the gesture is towards the first application or towards the second application.

(A19) In some embodiments of the method of A18, the method further includes: upon determining that movement of the gesture is towards the first application, increasing an area of the touch-sensitive display for the second application and decreasing an area of the touch-sensitive display for the first application.

(A20) In some embodiments of the method of A18, the method further includes: upon determining that movement of the gesture is towards the second application, increasing an area of the touch-sensitive display for the first application and decreasing an area of the touch-sensitive display for the second application.

(A21) In some embodiments of the method of A19, the method further includes: determining whether the gesture has moved to within a predetermined distance of an edge of the touch-sensitive display adjacent to the first application. Upon determining that the gesture has moved to within the predetermined distance of the edge, the method further includes ceasing to display the first application and displaying the second application on substantially all of the touch-sensitive display.

(A22) In some embodiments of the method of A20, the method further includes: determining whether the gesture has moved to within a predetermined distance of an edge of the touch-sensitive display adjacent to the second application. Upon determining that the gesture has moved to within the predetermined distance of the edge, the method further includes ceasing to display the second application and displaying the first application on substantially all of the touch-sensitive display.

(A23) In accordance with some embodiments, a method is performed at an electronic device (e.g., portable multifunction device 100, FIG. 1A) with a touch-sensitive display (e.g., touch screen 112, FIG. 1C). The method includes: concurrently displaying a first application and a second application on the touch-sensitive display and detecting a first contact at a border between the concurrently displayed first and second applications. Immediately following detecting the first contact, the method further includes: detecting a gesture from a location of the first contact towards an edge of the touch-sensitive display adjacent to the displayed first application. Upon detecting the gesture, the method further includes: (i) selecting a fixed display area from a plurality of predefined fixed display areas for the second application; (ii) automatically resizing the second application to the selected fixed display area; and (iii) automatically resizing the first application to occupy substantially all of a remaining area of the touch-sensitive display.

(A24) In some embodiments of the method of A23, substantially all of the remaining area is determined by subtracting the selected fixed display area from a total display area of the touch-sensitive display.

(A25) In some embodiments of the method of any one of A23-A24, automatically resizing the second application includes: (i) determining whether a current position of the gesture has moved to within a predefined threshold distance (away) from the edge; and (ii) upon determining that the current position of the gesture has moved to within the predefined threshold distance from the edge, automatically resizing the second application by snapping to the selected fixed display area (in other words, the second application is not resized until the current position of the gesture has moved to within the predefined threshold distance from the edge and, thus, when the current position is determined to be within the predefined threshold from the edge, the second application appears to jump to a larger size (e.g., the selected fixed display area)).

(A26) In some embodiments of the method of any one of A23-A25, the plurality of predefined fixed display areas for the second application includes 25%, 33%, and 50% of the (available screen real estate on the) touch-sensitive display.

(A27) In accordance with some embodiments, a method is performed at an electronic device (e.g., portable multi-function device 100, FIG. 1A) with a touch-sensitive display (e.g., touch screen 112, FIG. 1C). The method includes: concurrently displaying a first application and a second application on the touch-sensitive display and displaying a notification associated with a third application on the touch-sensitive display. In some embodiments, the method further includes: detecting a first contact at a first location on the touch-sensitive display over the displayed notification. Upon detecting the first contact: (i) detecting a gesture from the first location to a second location on the touch-sensitive display over the displayed second application and (ii) detecting a liftoff event at the second location. In response to detecting the liftoff event, the method further includes: (i) ceasing to display the notification; and (ii) replacing the displayed second application with the third application.

(A28) In some embodiments of the method of A27, replacing the displayed second application with the third application includes displaying the third application in an entirety of a portion of the touch-sensitive display previously occupied by the second application.

(A29) In some embodiments of the method of any one of A27-A28, the notification associated with the third application is displayed overlaying at least a portion of the concurrent display of the first and second applications.

(A30) In yet another aspect, an electronic device is provided and the electronic device includes a touch-sensitive display, one or more processors, and memory storing one or more programs, which when executed by the one or more processors cause the electronic device to perform the method described in any one of A1-A29.

(A31) In an additional aspect, an electronic device is provided, the electronic device including: a touch-sensitive display and means for performing the method described in any one of A1-A29.

(A32) In still one more aspect, a non-transitory computer-readable storage medium is provided. The non-transitory computer-readable storage medium stores executable instructions that, when executed by an electronic device with a touch-sensitive display, cause the electronic device to perform the method described in any one of A1-A29.

(A33) In another aspect, a graphical user interface on an electronic device with a touch-sensitive display is provided. The graphical user interface includes user interfaces displayed in accordance with the method described in any one of A1-A29.

(A34) In one additional aspect, an electronic device is provided that includes a display unit (e.g., display unit 6300, FIG. 63) configured to display information, a touch-sensitive surface unit (e.g., touch-sensitive surface unit 6303, FIG. 63) configured to receive contacts on the display unit, and a processing unit (e.g., processing unit 6305, FIG. 63) coupled with the display unit and the touch-sensitive surface unit. In some embodiments, the processing unit includes a displaying unit (e.g., displaying unit 6307, FIG. 63), a detecting unit (e.g., detecting unit 6309, FIG. 63), determining unit (e.g., determining unit 6311, FIG. 63), a resizing unit (e.g., resizing unit 6315, FIG. 63), a ceasing unit (e.g., ceasing unit 6317, FIG. 63), a determining unit (e.g., determining unit 6319, FIG. 63), a continuing unit (e.g., continuing unit 6321, FIG. 63), and/or a brightness reducing unit (e.g., brightness reducing unit 6323, FIG. 63). The displaying unit is configured to: display a first application on the display unit. The detecting unit is configured to: detect a first contact, on the touch-sensitive surface unit, at an affordance corresponding to a second application. In response to detecting the first contact, the displaying unit is configured to: temporarily display the second application overlaying at least a portion of the displayed first application and the determining unit is configured to: determine whether the first application is compatible with a shared screen mode. Upon determining that the first application is compatible with the shared screen mode: (i) the resizing unit is configured to resize the first application and the displaying unit is configured to display the resized first application on the display unit; and (ii) the displaying unit is configured to concurrently display the second application on the touch-sensitive display such that the resized first application and the concurrently displayed second application occupy substantially all of the display unit.

(A35) In some embodiments of the electronic device of A34, the processing unit is further configured to while the first application and the second application are concurrently displayed: (i) detect (e.g., with the detecting unit 6309) a second contact on the first application and a substantially simultaneous third contact on the second application and (ii) detect (e.g., with the detecting unit 6309) a gesture (a) from a location of the second contact in a substantially circular direction towards the second application, and (b) from a location of the third contact in a substantially circular direction towards the first application. In response to detecting the gesture, the processing unit is configured to: display (e.g., with the displaying unit 6307 and/or the display unit 6301) the first application in an area of the touch-sensitive display previously occupied by the second application and display (e.g., with the displaying unit 6307 and/or the display unit 6301) the second application in an area of the touch-sensitive display previously occupied by the first application.

(A36) In some embodiments of the electronic device of A34, the concurrently displayed second application is displayed with a predefined area that is less than an area of the resized first application.

(A37) In some embodiments of the electronic device of any one of A34-A36, the processing unit is further configured to: while the first application and the second application are concurrently displayed, receiving (e.g., with the receiving unit 6315) a first request to display a home screen. In response to receiving the first request, the processing unit is configured to: cease to display (e.g., with the ceasing unit 6317) the first and second applications and display (e.g., with the displaying unit 6307 and/or the display unit 6301) the home screen. In some embodiments, the processing unit is also configured to: receive (e.g., with the receiving unit 6315) a second request to open a third application. In response to receiving the second request, the processing unit is configured to: cease to display (e.g., with the ceasing unit 6317) the home screen and concurrently display (e.g., with the displaying unit 6307 and/or the display unit 6301) the third application and the second application. In some embodiments, the third application is displayed in a portion of the touch-sensitive display previously occupied by the first application.

(A38) In some embodiments of the electronic device of any one of A34-A37, the processing unit is further configured to: while the first application and the second application are concurrently displayed, detect (e.g., with the detecting unit 6309) a change in an orientation of the electronic device. In response to detecting the change in the orientation, the processing unit is configured to determine (e.g., with the determining unit 6319) whether the change in the orientation was from portrait to landscape. Upon determining that the change in the orientation was from portrait to landscape, the processing unit is configured to continue (e.g., with the continuing unit 6321) to concurrently display the second application.

(A39) In some embodiments of the electronic device of any one of A34-A38, the processing unit is further configured to: while the first application and the second application are concurrently displayed, detect (e.g., with the detecting unit 6309) a change in an orientation of the electronic device. In response to detecting the change in the orientation, the processing unit is configured to: determine (e.g., with the determining unit 6319) whether the change in the orientation was from landscape to portrait. Upon determining that the change in the orientation was from landscape to portrait, the processing unit is configured to: cease (e.g., with the ceasing unit 6317) to concurrently display the second application and display (e.g., with the displaying unit 6307 and/or the display unit 6301) the first application on substantially all of the touch-sensitive display.

(A40) In some embodiments of the electronic device of A34, the processing unit is further configured to: in accordance with a determination that the first application is not compatible with the shared screen mode, continue (e.g., with the continuing unit 6321) to display the second application overlaying at least the portion of the displayed first application.

(A41) In some embodiments of the electronic device of A34, the processing unit is further configured to: in accordance with a determination that the first application is not compatible with the shared screen mode, cease (e.g., with the ceasing unit 6317) to display the first application and display (e.g., with the displaying unit 6307 and/or the display unit 6301) the second application on substantially all of the touch-sensitive display.

(A42) In some embodiments of the electronic device of any one of A34-A41, detecting the first contact includes determining (e.g., with the determining unit 6319) that the first contact requests display of the second application.

(A43) In some embodiments of the electronic device of any one of A34-A42, the processing unit is further configured to: while temporarily displaying the second application overlaying at least a first portion of the displayed first application, reduce a brightness (e.g., with the brightness reducing unit 6323) associated with a second portion of the touch-sensitive display displaying the first application.

(A44) In some embodiments of the electronic device of A43, reducing the brightness includes dimming (e.g., with the brightness reducing unit 6323) the second portion of the touch-sensitive display displaying the first application.

(A45) In some embodiments of the electronic device of A43, the processing unit is further configured to: after reducing the brightness associated with the second portion of the touch-sensitive display displaying the first application, receive (e.g., with the receiving unit 6315) a second contact on the second portion. In response to receiving the second contact, the processing unit is configured to: cease (e.g., with the ceasing unit 6317) to concurrently display the second application and display (e.g., with the displaying unit 6307 and/or the display unit 6301) the first application on substantially all of the touch-sensitive display.

(A46) In some embodiments of the electronic device of A45, the processing unit is further configured to: detect (e.g., with the detecting unit 6309) a first gesture over the displayed first application, the first gesture comprising at least three contacts on the touch-sensitive display. In some embodiments, the first gesture moves in a first direction towards an edge of the touch-sensitive display. In response to detecting a liftoff event associated with the first gesture, the processing unit is configured to: cease (e.g., with the ceasing unit 6317) to display the first application and display (e.g., with the displaying unit 6307 and/or the display unit 6301) the second application on substantially all of the touch-sensitive display.

(A47) In some embodiments of the electronic device of A46, the processing unit is further configured to: detect (e.g., with the detecting unit 6309) a second gesture over the displayed second application, the second gesture comprising at least three contacts on the touch-sensitive display. In some embodiments, the second gesture moves in a second direction, opposite the first direction, that is away from the edge of the touch-sensitive display. In response to detecting a liftoff event associated with the second gesture, the processing unit is configured to: cease (e.g., with the ceasing unit 6317) to display the second application and display (e.g., with the displaying unit 6307 and/or the display unit 6301) the first application on substantially all of the touch-sensitive display.

(A48) In some embodiments of the electronic device of A34, determining whether the first application is compatible with the shared screen mode is performed in response to detecting (e.g., with the detecting unit 6309) a second contact at an affordance.

(A49) In some embodiments of the electronic device of A48, the affordance is a pin affordance displayed on top of the first application.

(A50) In some embodiments of the electronic device of any one of A34-A49, the processing unit is further configured to: while the first application and the second application are concurrently displayed, detect (e.g., with the detecting unit 6309) a gesture comprising a second contact over the first application and a third contact over the second application. In response to detecting the gesture, the processing unit is configured to: resize (e.g., with the resizing unit 6313) the first and second applications in accordance with movement of the gesture.

(A51) In some embodiments of the electronic device of A50, the processing unit is further configured to: determine (e.g., with the determining unit 6311) whether movement of the gesture is towards the first application or towards the second application.

(A52) In some embodiments of the electronic device of A51, the processing unit is further configured to: upon determining that movement of the gesture is towards the first application, increase (e.g., with the displaying unit 6307 and/or the display unit 6301) an area of the touch-sensitive display for the second application and decrease (e.g., with the displaying unit 6307 and/or the display unit 6301) an area of the touch-sensitive display for the first application.

(A53) In some embodiments of the electronic device of A51, the processing unit is further configured to: upon determining that movement of the gesture is towards the second application, increase (e.g., with the displaying unit 6307 and/or the display unit 6301) an area of the touch-sensitive display for the first application and decrease (e.g., with the displaying unit 6307 and/or the display unit 6301) an area of the touch-sensitive display for the second application.

(A54) In some embodiments of the electronic device of A52, the processing unit is further configured to: determine (e.g., with the determining unit 6311) whether the gesture has moved to within a predetermined distance of an edge of the touch-sensitive display adjacent to the first application. Upon determining that the gesture has moved to within the predetermined distance of the edge, the processing unit is configured to: cease (e.g., with the ceasing unit 6317) to display the first application and display (e.g., with the displaying unit 6307 and/or the display unit 6301) the second application on substantially all of the touch-sensitive display.

(A55) In some embodiments of the electronic device of A53, the processing unit is further configured to: determine (e.g., with the determining unit 6311) whether the gesture has moved to within a predetermined distance of an edge of the touch-sensitive display adjacent to the second application. Upon determining that the gesture has moved to within the predetermined distance of the edge, the processing unit is configured to: cease (e.g., with the ceasing unit 6317) to display the second application and display (e.g., with the displaying unit 6307 and/or the display unit 6301) the first application on substantially all of the touch-sensitive display.

(A56) In one additional aspect, an electronic device is provided that includes a display unit (e.g., display unit 6401, FIG. 64) configured to display information, a touch-sensitive surface unit (e.g., touch-sensitive surface unit 6403, FIG. 64) configured to receive contacts on the display unit, and a processing unit (e.g., processing unit 6405, FIG. 64) coupled with the display unit and the touch-sensitive surface unit. In some embodiments, the processing unit includes a displaying unit (e.g., displaying unit 6407, FIG. 64), a detecting unit (e.g., detecting unit 6409, FIG. 64), a selecting unit (e.g., selecting unit 6411, FIG. 64), a resizing unit (e.g., resizing unit 6413, FIG. 64), a determining unit (e.g., determining unit 6415, FIG. 64), a ceasing unit (e.g., ceasing unit 6417, FIG. 64), and/or a replacing unit (e.g., replacing unit 6419, FIG. 64). The displaying unit is configured to: concurrently display a first application and a second application on the display unit. The detecting unit is configured to: detect a first contact at a border between the concurrently displayed first and second applications. Immediately following detecting the first contact, the detecting unit is further configured to: detect a gesture from a location of the first contact towards an edge of the display unit (or the touch-sensitive surface unit) adjacent to the displayed first application. The displaying unit is further configured to: temporarily display the second application overlaying at least a portion of the displayed first application. Upon detecting the gesture: (i) the selecting unit is configured to: select a fixed display area from a plurality of predefined fixed display areas for the second application, (ii) the resizing unit is configured to: automatically resize the second application to the selected fixed display area, and (iii) the resizing unit is further configured to: automatically resize the first application to occupy substantially all of a remaining area of the display unit.

(A57) In some embodiments of the electronic device of A56, substantially all of the remaining area is determined by subtracting the selected fixed display area from a total display area of the touch-sensitive display.

(A58) In some embodiments of the electronic device of any one of A56-A57, automatically resizing the second application includes: (i) determining (e.g., with the determining unit 6415) whether a current position of the gesture has moved to within a predefined threshold distance (away) from the edge; and (ii) upon determining that the current position of the gesture has moved to within the predefined threshold distance from the edge, automatically resizing (e.g., with the resizing unit 6413) the second application by snapping to the selected fixed display area (in other words, the second application is not resized until the current position of the gesture has moved to within the predefined threshold distance from the edge and, thus, when the current position is determined to be within the predefined threshold from the edge, the second application appears to jump to a larger size (e.g., the selected fixed display area)).

(A59) In some embodiments of the electronic device of any one of A56-A58, the plurality of predefined fixed display areas for the second application includes 25%, 33%, and 50% of the (available screen real estate on the) touch-sensitive display.

(A60) In one additional aspect, an electronic device is provided that includes a display unit (e.g., display unit 6501, FIG. 65) configured to display information, a touch-sensitive surface unit (e.g., touch-sensitive surface unit 6503, FIG. 65) configured to receive contacts on the display unit, and a processing unit (e.g., processing unit 6505, FIG. 65) coupled with the display unit and the touch-sensitive surface unit. In some embodiments, the processing unit includes a displaying unit (e.g., displaying unit 6507, FIG. 65), a detecting unit (e.g., detecting unit 6509, FIG. 65), a ceasing unit (e.g., ceasing unit 6511, FIG. 65), a replacing unit (e.g., replacing unit 6513, FIG. 65), and/or a revealing unit (e.g., revealing unit 6515, FIG. 65). The displaying unit is configured to: concurrently display a first application and a second application on the display unit and display a notification associated with a third application on the display unit. The detecting unit is configured to: detect a first contact at a first location on the touch-sensitive surface unit over the displayed notification and, upon detecting the first contact: (i) detect a gesture from the first location to a second location on the touch-sensitive surface unit over the displayed second application and (ii) detect a liftoff event at the second location. In response to detecting the liftoff event: (i) the ceasing unit is configured to cease to display the notification and (ii) the replacing unit is configured to: replace the displayed second application with the third application.

(A61) In some embodiments of the electronic device of A60, replacing the displayed second application with the third application includes displaying (e.g., with the displaying unit 6507 and/or the display unit 6501) the third application in an entirety of a portion of the touch-sensitive display previously occupied by the second application.

(A62) In some embodiments of the electronic device of any one of A60-A61, the notification associated with the third application is displayed overlaying (e.g., with the displaying unit 6507 and/or the display unit 6501) at least a portion of the concurrent display of the first and second applications.

(B1) In accordance with some embodiments, a method is performed at an electronic device (e.g., portable multifunction device 100, FIG. 1A) with a touch-sensitive display (e.g., touch screen 112, FIG. 1C). The method includes: displaying a first application on the touch-sensitive display and receiving a first contact on the touch-sensitive display. In response to receiving the first contact, the method further includes displaying an application selector on the touch-sensitive display. In some embodiments, the displayed application selector overlays at least a portion of the displayed first application. In some embodiments, the method further includes detecting a second contact at an affordance displayed within the application selector. In response to detecting the second contact at the affordance, the method further includes: (i) ceasing to display the application selector; and (ii) displaying a second application corresponding to the selected affordance in an area of the touch-sensitive display previously occupied by the application selector.

(B2) In some embodiments of the method of B1, displaying the application selector on the touch-sensitive display comprises revealing a first portion of the application selector and revealing additional portions of the application selector in accordance with movement of the first contact on the touch-sensitive display.

(B3) In some embodiments of the method of B1, the method further includes: while displaying the application selector on the touch-sensitive display, displaying a first set of affordances within the application selector and detecting a gesture substantially within the application selector. In response to detecting the gesture, the method further includes: (i) determining whether the application selector is associated with additional affordances not contained within the first set of affordances; (ii) in accordance with a determination that the application selector is associated with additional affordances, displaying one or more of the additional affordances; and (iii) in accordance with a determination that the application selector is not associated with additional affordances, continuing to display the first set of affordances.

(B4) In some embodiments of the method of any one of B1-B3, the method further includes: before receiving the first contact, (i) detecting a gesture on the touch-sensitive display and (ii) in response to detecting the gesture, displaying an affordance used to launch the application selector.

(B5) In some embodiments of the method of B4, the first contact on the touch-sensitive is at the displayed affordance used to launch the application selector.

(B6) In some embodiments of the method of B1, displaying the application selector includes populating the application selector with a plurality of default affordances.

(B7) In some embodiments of the method of B6, the method further includes: monitoring an application usage history associated with a user of the electronic device and replacing the plurality of default affordances with affordances corresponding to applications selected in accordance with the application usage history.

(B8) In some embodiments of the method of any one of B1-B6, detecting the second contact at the affordance displayed within the application selector includes determining whether an intensity associated with the second contact satisfies an intensity threshold.

(B9) In some embodiments of the method of any one of B1-B6, the method further includes: displaying content within the first application or the second application and detecting a gesture on the touch-sensitive display, at a location of the displayed content, the gesture moving towards an edge of the touch-sensitive display. In response to detecting the gesture, the method further includes: determining whether the gesture has moved to within a predetermined distance of an edge of the touch-sensitive display. Upon determining that the gesture has moved to within the predetermined distance of the edge, the method further includes: temporarily displaying the application selector with a plurality of affordances.

(B10) In some embodiments of the method of B9, the method further includes: detecting movement of the gesture towards a displayed affordance of the plurality of affordances within the application selector. In some embodiments, the displayed affordance corresponds to a third application. In some embodiments, the method further includes: (i) detecting a liftoff of the gesture from the touch-sensitive display and (ii) in response to detecting the liftoff, opening the third application and displaying the content within the third application.

(B11) In some embodiments of the method of B9, the plurality of affordances is filtered to display affordances corresponding only to applications capable of displaying the content.

(B12) In some embodiments of the method of any one of B1-B9, the method further includes: detecting a third contact at an affordance displayed within the application selector. In some embodiments, the third contact lasts for an amount of time. In some embodiments, the method further includes: determining whether the amount of time satisfies a threshold amount of time. Upon determining that the amount of time satisfies the threshold amount of time, the method further includes: displaying a remove affordance (e.g., an x-symbol) within the application selector and detecting a fourth contact at the remove affordance. In response to detecting the fourth contact, the method further includes: removing an affordance from the application selector.

(B13) In another aspect, an electronic device is provided, the electronic device including: a touch-sensitive display, one or more processors, and memory storing one or more programs, which when executed by the one or more processors cause the electronic device to perform the method described in any one of B1-B12.

(B14) In still another aspect, an electronic device is provided, the electronic device including: a touch-sensitive display and means for performing the method described in any one of B1-B12.

(B15) In still one more aspect, a non-transitory computer-readable storage medium is provided. The non-transitory computer-readable storage medium stores executable instructions that, when executed by an electronic device with a touch-sensitive display, cause the electronic device to perform the method described in any one of B1-B12.

(B16) In yet another aspect, a graphical user interface on an electronic device with a touch-sensitive display is provided, the graphical user interface including user interfaces in accordance with the method described in any one of B1-B12.

(B17) In one additional aspect (and with reference to FIG. 66), an electronic device is provided that includes a display unit (e.g., display unit 6601) configured to display information, a touch-sensitive surface unit (e.g., touch-sensitive surface unit 6603) configured to receive contacts on the display unit, and a processing unit (e.g., processing unit 6605) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a display unit (e.g., displaying unit 6607), a detecting unit (e.g., detecting unit 6609), a receiving unit (e.g., receiving unit 6611), a ceasing unit (e.g., ceasing unit 6613), a determining unit (e.g., determining unit 6617), a continuing unit (e.g., continuing unit 6619), a populating unit (e.g., populating unit 6621), a monitoring unit (e.g., monitoring unit 6623), an opening unit (e.g., opening unit 6625), a filtering unit (e.g., filtering unit 6627), and/or a removing unit (e.g., removing unit 6629). The processing unit (or one or more components thereof, such as units 6607-6629) is configured to cause the electronic device to: display a first application on the touch-sensitive display; receive a first contact on the touch-sensitive display; in response to receiving the first contact, display an application selector on the touch-sensitive display, wherein the displayed application selector overlays at least a portion of the displayed first application; detect a second contact at an affordance displayed within the application selector; in response to detecting the second contact at the affordance: (i) cease to display the application selector and (ii) display a second application corresponding to the selected affordance in an area of the touch-sensitive display previously occupied by the application selector.

(B18) In some embodiments of the electronic device of B17, displaying the application selector on the touch-sensitive display comprises revealing (e.g., with the displaying unit 6607 and/or the display unit 6601) a first portion of the application selector and revealing additional portions of the application selector in accordance with movement of the first contact on the touch-sensitive display.

(B19) In some embodiments of the electronic device of B17, the processing unit is further configured to: while displaying the application selector on the touch-sensitive display, display (e.g., with the displaying unit 6607 and/or the display unit 6601) a first set of affordances within the application selector and detect (e.g., with the detecting unit 6609) a gesture substantially within the application selector. In response to detecting the gesture, the processing unit is configured to: (i) determine (e.g., with the determining unit 6617) whether the application selector is associated with additional affordances not contained within the first set of affordances; (ii) in accordance with a determination that the application selector is associated with additional affordances, display (e.g., with the displaying unit 6607 and/or the display unit 6601) one or more of the additional affordances; and (iii) in accordance with a determination that the application selector is not associated with additional affordances, continue (e.g., with the continuing unit 6619) to display the first set of affordances.

(B20) In some embodiments of the electronic device of any one of B17-B19, the processing unit is further configured to: before receiving the first contact, (i) detect (e.g., with the detecting unit 6609) a gesture on the touch-sensitive display and (ii) in response to detecting the gesture, display (e.g., with the displaying unit 6607 and/or the display unit 6601) an affordance used to launch the application selector.

(B21) In some embodiments of the electronic device of B20, the first contact on the touch-sensitive is at the displayed affordance used to launch the application selector.

(B22) In some embodiments of the electronic device of B17, displaying the application selector includes populating (e.g., with the populating unit 6621) the application selector with a plurality of default affordances.

(B23) In some embodiments of the electronic device of B22, the processing unit is further configured to: monitor (e.g., with the monitoring unit 6623) an application usage history associated with a user of the electronic device and replacing the plurality of default affordances with affordances corresponding to applications selected in accordance with the application usage history.

(B24) In some embodiments of the electronic device of any one of B17-B22, detecting the second contact at the affordance displayed within the application selector includes determining (e.g., with the determining unit 6617) whether an intensity associated with the second contact satisfies an intensity threshold.

(B25) In some embodiments of the electronic device of any one of B17-B22, the processing unit is further configured to: display (e.g., with the displaying unit 6607 and/or the display unit 6601) content within the first application or the second application and detect (e.g., with the detecting unit 6609) a gesture on the touch-sensitive display, at a location of the displayed content, the gesture moving towards an edge of the touch-sensitive display. In response to detecting the gesture, the processing unit is configured to: determine (e.g., with the determining unit 6617) whether the gesture has moved to within a predetermined distance of an edge of the touch-sensitive display. Upon determining that the gesture has moved to within the predetermined distance of the edge, the processing unit is configured to: temporarily display (e.g., with the displaying unit 6607 and/or the display unit 6601) the application selector with a plurality of affordances.

(B26) In some embodiments of the electronic device of B25, the processing unit is configured to: detect (e.g., with the detecting unit 6609) movement of the gesture towards a displayed affordance of the plurality of affordances within the application selector. In some embodiments, the displayed affordance corresponds to a third application. In some embodiments, the processing unit is further configured to: (i) detect (e.g., with the detecting unit 6609) a liftoff of the gesture from the touch-sensitive display and (ii) in response to detecting the liftoff, open (e.g., with the opening unit 6625) the third application and display (e.g., with the displaying unit 6607 and/or the display unit 6601) the content within the third application.

(B27) In some embodiments of the electronic device of B25, the plurality of affordances is filtered (e.g., with the filtering unit 6627) to display affordances corresponding only to applications capable of displaying the content.

(B28) In some embodiments of the electronic device of any one of B17-B25, the processing unit is further configured to: detect (e.g., with the detecting unit 6609) a third contact at an affordance displayed within the application selector. In some embodiments, the third contact lasts for an amount of time. In some embodiments, the processing unit is further configured to: determine (e.g., with the determining unit 6617) whether the amount of time satisfies a threshold amount of time. Upon determining that the amount of time satisfies the threshold amount of time, the processing unit is configured to: display (e.g., with the displaying unit 6607 and/or the display unit 6601) a remove affordance (e.g., an x-symbol) within the application selector and detect (e.g., with the detecting unit 6609) a fourth contact at the remove affordance. In response to detecting the fourth contact, the processing unit is configured to: remove (e.g., with the removing unit 6629) an affordance from the application selector.

(C1) In accordance with some embodiments, a method is performed at an electronic device (e.g., portable multifunction device 100, FIG. 1A) with a touch-sensitive display (e.g., touch screen 112, FIG. 1C). The method includes: playing video content in a full-screen mode on the touch-sensitive display and while playing the video content in the full-screen mode, detecting a selection of a hardware button of the electronic device. In response to detecting the selection, the method further includes: (i) resizing the video content to fit within a reduced area of the touch-sensitive display and (ii) displaying the resized video content overlaying a screen associated with the hardware button.

(C2) In some embodiments of the method of C1, the screen associated with the hardware button is a home screen.

(C3) In some embodiments of the method of any one of C1-C2, the method further includes: detecting a contact on the resized video content. In response to detecting the contact, the method further includes: moving the resized video content in accordance with movement of the contact on the touch-sensitive display.

(C4) In some embodiments of the method of C2, the method further includes: detecting a first contact on the home screen at a location that corresponds to an affordance associated with a first application and ceasing to display the home screen and displaying the first application. In some embodiments, the method further includes: determining whether the first application contains any content of a predetermined content type. Upon determining that the first application contains content of the predetermined content type: (i) determining one or more locations on the touch-sensitive display that correspond to the content of the predetermined content type and (ii) resizing or moving the video content to avoid the one or more locations on the touch-sensitive display that correspond to the content of the predetermined content type.

(C5) In some embodiments of the method of C4, the predetermined content type is identified by the first application.

(C6) In some embodiments of the method of C4, the predetermined content type is identified by a user of the electronic device.

(C7) In accordance with some embodiments, a method is performed at an electronic device (e.g., portable multifunction device 100, FIG. 1A) with a touch-sensitive display (e.g., touch screen 112, FIG. 1C). The method includes: playing video content in a full-screen mode on the touch-sensitive display. In some embodiments, the video content is associated with a first application. While playing the video content in the full-screen mode, the method further includes: receiving a pinch gesture at the displayed video content. In response to receiving the pinch gesture, the method further includes: (i) resizing the video content to a reduced display size and (ii) displaying the video content having the reduced display size overlaying a portion of the first application.

(C8) In some embodiments of the method of C7, the reduced display size is determined in accordance with a characteristic of the pinch gesture.

(C9) In some embodiments of the method of any one of C1-C7, the method further includes: detecting a de-pinch gesture on the resized video content and in response to detecting the de-pinch gesture, determining whether a characteristic of the de-pinch gesture satisfies a threshold. Upon determining that the characteristic of the de-pinch gesture satisfies the threshold, the method further includes: automatically displaying the resized video content in a full-screen mode.

(C10) In some embodiments of the method of any one of C8 or C9, the characteristic of the pinch gesture and the characteristic of the de-pinch gesture are selected from the group consisting of: velocity, distance travelled, and location of a liftoff event.

(C11) In some embodiments of the method of any one of C1-C8, the method further includes: detecting a gesture on the resized video content and determining whether the gesture is of a predetermined type. Upon determining that the gesture is of a predetermined type, the method further includes: transmitting the video content to a video playback device separate and apart from the electronic device.

(C12) In some embodiments of the method of C11, the predetermined type is selected from the group consisting of (i) a flick gesture having a velocity exceeding a predefined velocity and (ii) a flick gesture travelling more than a predefined distance.

(C13) In some embodiments of the method of C11, the predetermined type is a custom gesture configured by a user of the electronic device.

(C14) In another aspect, an electronic device is provided. In some embodiments, the electronic device includes: a touch-sensitive display, one or more processors, and memory storing one or more programs, which when executed by the one or more processors cause the electronic device to perform the method described in any one of C1-C13.

(C15) In yet another aspect, an electronic device is provided and the electronic device includes: a touch-sensitive display and means for performing the method described in any one of C1-C13.

(C16) In still one more aspect, a non-transitory computer-readable storage medium is provided. The non-transitory computer-readable storage medium stores executable instructions that, when executed by an electronic device with a touch-sensitive display, cause the electronic device to perform the method described in any one of C1-C13.

(C17) In still one more aspect, a graphical user interface on an electronic device with a touch-sensitive display is provided. In some embodiments, the graphical user interface includes user interfaces displayed in accordance with the method described in any one of C1-C13.

(C18) In one additional aspect (and with reference to FIG. 67), an electronic device is provided that includes a display unit (e.g., display unit 6701) configured to display information, a touch-sensitive surface unit (e.g., touch-sensitive surface unit 6703) configured to receive contacts on the display unit, and a processing unit (e.g., processing unit 6705) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a playing unit (e.g., playing unit 6707), a detecting unit (e.g., detecting unit 6709), a resizing unit (e.g., resizing unit 6711), a displaying unit (e.g., displaying unit 6713), a moving unit (e.g., moving unit 6715), a determining unit (e.g., determining unit 6717), and/or an identifying unit (e.g., identifying unit 6719). The processing unit is configured to cause the electronic device to: play video content in a full-screen mode on the touch-sensitive display; while playing the video content in the full-screen mode, detect a selection of a hardware button of the electronic; in response to detecting the selection: (i) resize the video content to fit within a reduced area of the touch-sensitive display and (ii) display the resized video content overlaying a screen associated with the hardware button.

(C19) In some embodiments of the electronic device of C18, the screen associated with the hardware button is a home screen.

(C20) In some embodiments of the electronic device of any one of C18-C19, the processing unit is further configured to: detect (e.g., with the detecting unit 6709) a contact on the resized video content. In response to detecting the contact, the processing unit is configured to: move (e.g., with the moving unit 6715) the resized video content in accordance with movement of the contact on the touch-sensitive display.

(C21) In some embodiments of the electronic device of C19, the processing unit is further configured to: detect (e.g., with the detecting unit 6709) a first contact on the home screen at a location that corresponds to an affordance associated with a first application and cease to display (e.g., with the displaying unit 6713 and/or the display unit 6701) the home screen and display (e.g., with the displaying unit 6713 and/or the display unit 6701) the first application. In some embodiments, the processing unit is further configured to: determine (e.g., with the determining unit 6717) whether the first application contains any content of a predetermined content type. Upon determining that the first application contains content of the predetermined content type: (i) determine (e.g., with the determining unit 6717) one or more locations on the touch-sensitive display that correspond to the content of the predetermined content type and (ii) resize or move (e.g., with the resizing unit 6711 and/or the moving unit 6715) the video content to avoid the one or more locations on the touch-sensitive display that correspond to the content of the predetermined content type.

(C22) In some embodiments of the electronic device of C21, the predetermined content type is identified by the first application.

(C23) In some embodiments of the electronic device of C21, the predetermined content type is identified by a user of the electronic device.

(C24) In one additional aspect (and with reference to FIG. 68), an electronic device is provided that includes a display unit (e.g., display unit 6801) configured to display information, a touch-sensitive surface unit (e.g., touch-sensitive surface unit 6803) configured to receive contacts on the touch-sensitive surface unit, and a processing unit (e.g., processing unit 6805) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a playing unit (e.g., playing unit 6807), a receiving unit (e.g., receiving unit 6809), a resizing unit (e.g., resizing unit 6811), a displaying unit (e.g., displaying unit 6813), a determining unit (e.g., determining unit 6815), a selecting unit (e.g., selecting unit 6817), and/or a transmitting unit (e.g., transmitting unit 6819). The processing unit (or one or more components thereof, such as units 6807-6819) is configured to cause the electronic device to: play video content in a full-screen mode on the touch-sensitive display, the video content being associated with a first application; while playing the video content in the full-screen mode, receive a pinch gesture at the displayed video content; in response to receiving the pinch gesture: (i) resize the video content to a reduced display size and (ii) display the video content having the reduced display size overlaying a portion of the first application.

(C25) In some embodiments of the electronic device of C24, the reduced display size is determined (e.g., by the determining unit 6815) in accordance with a characteristic of the pinch gesture.

(C26) In some embodiments of the electronic device of any one of C18-C24, the processing unit is further configured to: detect (e.g., with the touch-sensitive surface unit 6803) a de-pinch gesture on the resized video content and in response to detecting the de-pinch gesture, determine (e.g., with the determining unit 6815) whether a characteristic of the de-pinch gesture satisfies a threshold. Upon determining that the characteristic of the de-pinch gesture satisfies the threshold, the processing unit is configured to: automatically display (e.g., with the displaying unit 6813 and/or the display unit 6801) the resized video content in a full-screen mode.

(C27) In some embodiments of the electronic device of any one of C25 or C26, the characteristic of the pinch gesture and the characteristic of the de-pinch gesture are selected (e.g., with the selecting unit 6817) from the group consisting of: velocity, distance travelled, and location of a liftoff event.

(C28) In some embodiments of the electronic device of any one of C18-C25, the processing unit is further configured to: detect (e.g., with the touch-sensitive surface unit 6803) a gesture on the resized video content and determine (e.g., with determining unit 6815) whether the gesture is of a predetermined type. Upon determining that the gesture is of a predetermined type, the processing unit is configured to: transmit (e.g., with the transmitting unit 6819) the video content to a video playback device separate and apart from the electronic device.

(C29) In some embodiments of the electronic device of C28, the predetermined type is selected (e.g., with the selecting unit 6817) from the group consisting of (i) a flick gesture having a velocity exceeding a predefined velocity and (ii) a flick gesture travelling more than a predefined distance.

(C30) In some embodiments of the electronic device of C28, the predetermined type is a custom gesture configured by a user of the electronic device.

(D1) In accordance with some embodiments, a method is performed at an electronic device (e.g., portable multifunction device 100, FIG. 1A) with a touch-sensitive display (e.g., touch screen 112, FIG. 1C). The method includes: displaying, on the touch-sensitive display, a first application and a second application, such that the first and second applications occupy substantially all of the touch-sensitive display and are separated at a border between the first and second applications. The method further includes, detecting a swipe gesture at the second application, the swipe gesture moving in a direction that is substantially parallel to the border. In response to detecting the swipe gesture, the method includes determining whether the swipe gesture satisfies a threshold. Upon determining that the swipe gesture satisfies the threshold, the method also includes replacing the second application with an application selector that includes a plurality of selectable affordances corresponding to applications available on the electronic device. The application selector is displayed in an area of the touch-sensitive display previously occupied by the second application.

(D2) In some embodiments of the method of D1, replacing the second application with an application selector includes scaling down content displayed within the second application to successively smaller sizes and revealing more of the application selector as the swipe gesture moves in the direction that is substantially parallel to the border.

(D3) In some embodiments of the method of D2, the scaling down includes determining whether the content displayed within the second application has reached a predefined size and, upon determining that the content has reached the predefined size, ceasing to scale down the content.

(D4) In some embodiments of the method of D3, the content having the predefined size is displayed within a particular selectable affordance, corresponding to the second application, of the plurality of selectable affordances within the application selector.

(D5) In some embodiments of the method of D4, the particular selectable affordance further includes an icon corresponding to the second application that transparently overlays the content having the predefined size.

(D6) In some embodiments of the method of any one of D4 or D5, the method further includes detecting selection of the particular selectable affordance corresponding to the second application. Upon detecting the selection of the particular selectable affordance, the method includes scaling up the content having the predefined size until the content replaces the application selection and the second application is again displayed in the space originally-occupied by the second application prior to displaying the application selector.

(D7) In some embodiments of the method of any one of D1-D6, the threshold is a threshold distance travelled, by the swipe gesture, on the touch-sensitive display.

(D8) In some embodiments of the method of any one of D1-D7, the method further includes before detecting the swipe gesture at the second application, displaying an affordance on the touch-sensitive display that overlays the second application. The affordance indicates that the application selector is accessible (e.g., the affordance is a translucent horizontal bar overlaying a top portion of the second application or text indicating availability of the application selector).

(D9) In some embodiments of the method of any one of D1-D8, the border runs from a first edge (e.g., a top portion) of the touch-sensitive display to a second edge (e.g., a bottom portion), the second edge being opposite the first edge, of the touch-sensitive display. In some embodiments, the border is a vertical border that spans the length of the touch-sensitive display. In some embodiments, the vertical border is not visible to a user of the electronic device.

(D10) In another aspect, a non-transitory computer-readable storage medium is provided. The non-transitory computer-readable storage medium stores executable instructions that, when executed by an electronic device with a touch-sensitive display, cause the electronic device to perform the method of any one of D1-D9 described above.

(D11) In yet another aspect, an electronic device that includes a touch-sensitive display, one or more processors, and memory storing one or more programs is provided. The one or more programs, when executed by the one or more processors, cause the electronic device to perform the method of any one of D1-D9 described above.

(D12) In yet another aspect, an electronic device that includes a touch-sensitive display is provided. The electronic device further includes means for performing the method of any one of D1-D9 described above.

(D13) In yet one more aspect, a graphical user interface on an electronic device with a touch-sensitive display is provided. The graphical user interface includes user interfaces in accordance with the method of any one of D1-D9 described above.

(D14) In one additional aspect (and with reference to FIG. 69), an electronic device is provided that includes a display unit (e.g., display unit 6901) configured to display information, a touch-sensitive surface unit (e.g., touch-sensitive surface unit 6903) configured to receive contacts on the touch-sensitive surface unit, and a processing unit (e.g., processing unit 6905) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a displaying unit (e.g., displaying unit 6907), a detecting unit (e.g., detecting unit 6909), a determining unit (e.g., determining unit 6911), a replacing unit (e.g., replacing unit 6913), and/or a selecting unit (e.g., selecting unit 6915). The processing unit (or one or more components thereof, such as units 6907-6915) is configured to cause the electronic device to: display, on the touch-sensitive display, a first application and a second application, such that the first and second applications occupy substantially all of the touch-sensitive display and are separated at a border between the first and second applications; detecting a swipe gesture at the second application, the swipe gesture moving in a direction that is substantially parallel to the border; in response to detecting the swipe gesture, determining whether the swipe gesture satisfies a threshold; upon determining that the swipe gesture satisfies the threshold, replacing the second application with an application selector that includes a plurality of selectable affordances corresponding to applications available on the electronic device. The application selector is displayed in an area of the touch-sensitive display previously occupied by the second application.

(D15) In some embodiments of the electronic device of D14, replacing the second application with an application selector includes scaling down (e.g., with the scaling unit 6915) content displayed within the second application to successively smaller sizes and revealing more of the application selector as the swipe gesture moves in the direction that is substantially parallel to the border.

(D16) In some embodiments of the electronic device of D15, the scaling down includes determining (e.g., with the determining unit 6911) whether the content displayed within the second application has reached a predefined size and, upon determining that the content has reached the predefined size, ceasing to scale down (e.g., with the scaling unit 6915) the content.

(D17) In some embodiments of the electronic device of D16, the content having the predefined size is displayed (e.g., with the displaying unit 6907 and/or the display unit 6901) within a particular selectable affordance, corresponding to the second application, of the plurality of selectable affordances within the application selector.

(D18) In some embodiments of the electronic device of D17, the particular selectable affordance further includes an icon corresponding to the second application that transparently overlays the content having the predefined size.

(D19) In some embodiments of the electronic device of any one of D17 or D18, the processing unit is further configured to: detect (e.g., with the detecting unit 6909) selection of the particular selectable affordance corresponding to the second application. Upon detecting the selection of the particular selectable affordance, the processing unit is configured to: scale up (e.g., with the scaling unit 6915) the content having the predefined size until the content replaces the application selection and the second application is again displayed in the space originally-occupied by the second application prior to displaying the application selector.

(D20) In some embodiments of the electronic device of any one of D14-D19, the threshold is a threshold distance travelled, by the swipe gesture, on the touch-sensitive display.

(D21) In some embodiments of the electronic device of any one of D14-D20, the processing unit is further configured to: before detecting the swipe gesture at the second application, display (e.g., with the displaying unit 6907 and/or the display unit 6901) an affordance on the touch-sensitive display that overlays the second application. The affordance indicates that the application selector is accessible (e.g., the affordance is a translucent horizontal bar overlaying a top portion of the second application or text indicating availability of the application selector).

(D22) In some embodiments of the electronic device of any one of D14-D21, the border runs from a first edge (e.g., a top portion) of the touch-sensitive display to a second edge (e.g., a bottom portion), the second edge being opposite the first edge, of the touch-sensitive display. In some embodiments, the border is a vertical border that spans the length of the touch-sensitive display. In some embodiments, the vertical border is not visible to a user of the electronic device.

(E1) In accordance with some embodiments, a method is performed at an electronic device (e.g., portable multifunction device 100, FIG. 1A) with a touch-sensitive display (e.g., touch screen 112, FIG. 1C). The method includes: displaying, on the touch-sensitive display, a first application and a second application, such that the first and second applications occupy substantially all of the touch-sensitive display and are separated at a border between the first and second applications. The method also includes detecting a gesture on the touch-sensitive display corresponding to movement of the border in a first direction that is substantially perpendicular to the border (e.g., a contact at a border between the first and second applications and movement of the contact in a first direction or two substantially simultaneous contacts, including a first contact at the first application and a second contact at the second application, and movement of the contacts in the first direction). While detecting the gesture, the method includes: (i) resizing the first and second applications in accordance with the movement of the border and (ii) determining whether the movement of the border satisfies a first threshold. Upon determining that the movement of the border satisfies the first threshold (or upon determining that a width corresponding to the first or the second application satisfies a threshold (width is greater than a predefined maximum width or below a predefined minimum width)), the method includes splitting the first and second applications at the border to expose a new user interface portion (e.g., a background portion of a home screen) between the first and second applications.

(E2) In some embodiments of the method of E1, the first direction is towards the second application and the resizing includes decreasing a width of the second application in conjunction with increasing a width of the first application.

(E3) In some embodiments of the method of E2, the splitting the first and second applications at the border includes ceasing to increase the width of the first application and continuing to decrease the width of the second application, such that more of the new user interface portion is exposed between the first and second applications as the width of the second application continues to decrease.

(E4) In some embodiments of the method of E3, the method further includes: while continuing to decrease the width of the second application, determining whether a second threshold has been satisfied. Upon determining that the second threshold has been satisfied, the method includes increasing the width of the first application until the first application occupies substantially all of the touch-sensitive display in conjunction with decreasing the width of the second application until the second application and the new user interface portion are no longer visible on the touch-sensitive display.

(E5) In some embodiments of the method of E1, the first direction is towards the first application and the resizing includes decreasing a width of the first application in conjunction with increasing a width of the second application.

(E6) In some embodiments of the method of E5, the splitting the first and second applications at the border includes ceasing to increase the width of the second application and continuing to decrease the width of the first application, such that more of the new user interface portion is exposed between the first and second applications as the width of the first application continues to decrease.

(E7) In some embodiments of the method of E6, the method further includes: while continuing to decrease the width of the first application, determining whether a second threshold has been satisfied. Upon determining that the second threshold has been satisfied, the method includes increasing the width of the second application until the second application occupies substantially all of the touch-sensitive display in conjunction with decreasing the width of the first application until the first application and the new user interface portion are no longer visible on the touch-sensitive display.

(E8) In some embodiments of the method of any one of E1-E7, resizing the first and second applications includes blurring content displayed within the first and second applications during the resizing.

(E9) In some embodiments of the method of any one of E1-E8, the new user interface portion corresponds to a wallpaper graphic that appears on the home screen.

(E10) In some embodiments of the method of any one of E1-E9, when the first direction is towards the second application, the first threshold has a first value and, when the first direction is towards the first application, the first threshold has a second value that is greater than the first value. In some embodiments, when the first direction is towards the second application, the first threshold has a first value that corresponds to a first distance away from an edge of the touch-sensitive display and, when the first direction is towards the first application, the first threshold has a second value that corresponds to a second distance away from the edge of the touch-sensitive display, wherein the second distance is a greater distance away from the edge than the first distance.

(E11) In some embodiments of the method of any one of E1-E10, resizing the first and second applications in accordance with the movement of the border includes resizing display widths for the first and second applications and the first and second applications continue to occupy substantially all of the touch-sensitive display during the resizing.

(E12) In some embodiments of the method of any one of E1-E11, the first and second applications are displayed in a side-by-side display format such that each application has substantially the same height.

(E13) In some embodiments of the method of any one of E1-E12, the border runs from a first edge (e.g., a top portion/edge) of the touch-sensitive display to a second edge (e.g., a bottom portion/edge), opposite the first edge, of the touch-sensitive display.

(E14) In another aspect, a non-transitory computer-readable storage medium is provided. The non-transitory computer-readable storage medium stores executable instructions that, when executed by an electronic device with a touch-sensitive display, cause the electronic device to perform the method of any one of E1-E13 described above.

(E15) In yet another aspect, an electronic device that includes a touch-sensitive display, one or more processors, and memory storing one or more programs is provided. The one or more programs, when executed by the one or more processors, cause the electronic device to perform the method of any one of E1-E13 described above.

(E16) In yet another aspect, an electronic device that includes a touch-sensitive display is provided. The electronic device further includes means for performing the method of any one of E1-E13 described above.

(E17) In yet one more aspect, a graphical user interface on an electronic device with a touch-sensitive display is provided. The graphical user interface includes user interfaces in accordance with the method of any one of E1-E13 described above.

(E18) In one additional aspect (and with reference to FIG. 70), an electronic device is provided that includes a display unit (e.g., display unit 7001) configured to display information, a touch-sensitive surface unit (e.g., touch-sensitive surface unit 7003) configured to receive contacts on the touch-sensitive surface unit, and a processing unit (e.g., processing unit 7005) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a displaying unit (e.g., displaying unit 7007), a detecting unit (e.g., detecting unit 7009), a resizing unit (e.g., resizing unit 7011), a determining unit (e.g., determining unit 7013), a splitting unit (e.g., splitting unit 7015), a decreasing unit (e.g., decreasing unit 7017), an increasing unit (e.g., increasing unit 7019), a ceasing unit (e.g., ceasing unit 7021), and a continuing unit (e.g., continuing unit 7023). The processing unit (or one or more components thereof, such as units 7007-7023) is configured to cause the electronic device to: display, on the touch-sensitive display, a first application and a second application, such that the first and second applications occupy substantially all of the touch-sensitive display and are separated at a border between the first and second applications; detect a swipe gesture at the second application, the swipe gesture moving in a direction that is substantially parallel to the border; in response to detecting the swipe gesture, determine whether the swipe gesture satisfies a threshold; and upon determining that the swipe gesture satisfies the threshold, replace the second application with an application selector that includes a plurality of selectable affordances corresponding to applications available on the electronic device, the application selector being displayed in an area of the touch-sensitive display previously occupied by the second application.

(E19) In some embodiments of the electronic device of E18, the first direction is towards the second application and the resizing includes decreasing (e.g., with the decreasing unit 7017) a width of the second application in conjunction with increasing (e.g., with the increasing unit 7019) a width of the first application.

(E20) In some embodiments of the electronic device of E19, the splitting the first and second applications at the border includes ceasing (e.g., with the ceasing unit 7021) to increase the width of the first application and continuing to decrease (e.g., with the continuing unit 7023) the width of the second application, such that more of the new user interface portion is exposed between the first and second applications as the width of the second application continues to decrease.

(E21) In some embodiments of the electronic device of E20, the processing unit is further configured to: while continuing to decrease the width of the second application, determine (e.g., with the determining unit 7013) whether a second threshold has been satisfied. Upon determining that the second threshold has been satisfied, the processing unit is configured to: increase (e.g., with the increasing unit 7019) the width of the first application until the first application occupies substantially all of the touch-sensitive display in conjunction with decreasing (e.g., with the decreasing unit 7017) the width of the second application until the second application and the new user interface portion are no longer visible on the touch-sensitive display.

(E22) In some embodiments of the electronic device of E18, the first direction is towards the first application and the resizing includes decreasing (e.g., with the decreasing unit 7017) a width of the first application in conjunction with increasing (e.g., with the increasing unit 7019) a width of the second application.

(E23) In some embodiments of the electronic device of E22, the splitting the first and second applications at the border includes ceasing (e.g., with the ceasing unit 7021) to increase the width of the second application and continuing to decrease (e.g., with the continuing unit 7023) the width of the first application, such that more of the new user interface portion is exposed between the first and second applications as the width of the first application continues to decrease.

(E24) In some embodiments of the electronic device of E23, the processing unit is further configured to: while continuing to decrease the width of the first application, determine (e.g., with the determining unit 7013) whether a second threshold has been satisfied. Upon determining that the second threshold has been satisfied, the processing unit is configured to: increase (e.g., with the increasing unit 7019) the width of the second application until the second application occupies substantially all of the touch-sensitive display in conjunction with decreasing (e.g., with the decreasing unit 7017) the width of the first application until the first application and the new user interface portion are no longer visible on the touch-sensitive display.

(E25) In some embodiments of the electronic device of any one of E18-E24, resizing the first and second applications includes blurring (e.g., with the resizing unit 7011, the displaying unit 7007, and/or the display unit 7001) content displayed within the first and second applications during the resizing.

(E26) In some embodiments of the electronic device of any one of E18-E25, the new user interface portion corresponds to a wallpaper graphic that appears on the home screen.

(E27) In some embodiments of the electronic device of any one of E18-E26, when the first direction is towards the second application, the first threshold has a first value and, when the first direction is towards the first application, the first threshold has a second value that is greater than the first value. In some embodiments, when the first direction is towards the second application, the first threshold has a first value that corresponds to a first distance away from an edge of the touch-sensitive display and, when the first direction is towards the first application, the first threshold has a second value that corresponds to a second distance away from the edge of the touch-sensitive display, wherein the second distance is a greater distance away from the edge than the first distance.

(E28) In some embodiments of the electronic device of any one of E18-E27, resizing the first and second applications in accordance with the movement of the border includes resizing (e.g., with the resizing unit 7011) display widths for the first and second applications and the first and second applications continue to occupy substantially all of the touch-sensitive display during the resizing.

(E29) In some embodiments of the electronic device of any one of E18-E28, the first and second applications are displayed in a side-by-side display format such that each application has substantially the same height.

(E30) In some embodiments of the electronic device of any one of E18-E29, the border runs from a first edge (e.g., a top portion/edge) of the touch-sensitive display to a second edge (e.g., a bottom portion/edge), opposite the first edge, of the touch-sensitive display.

(F1) In accordance with some embodiments, a method is performed at an electronic device (e.g., portable multifunction device 100, FIG. 1A) with a touch-sensitive display (e.g., touch screen 112, FIG. 1C). The method includes: displaying a first application in a full-screen mode on the touch-sensitive display and detecting a contact over the first application within a predetermined distance of an edge of the touch-sensitive display. The method includes determining an intensity of the contact on the touch-sensitive display (in some embodiments, determining the intensity of the contact is performed in response to detecting the contact within the predetermining distance of the edge of the touch-sensitive display). Upon determining that the intensity of the contact exceeds an intensity threshold, the method includes presenting, at or near the edge of the touch-sensitive display, a plurality of additional portions, each additional portion of the plurality of additional portions corresponding to a recently-used application.

(F2) In some embodiments of the method of F1, presenting the plurality of additional portions includes overlaying the plurality of additional portions on top of the first application, such that a portion of the first application remains visible on the touch-sensitive display (e.g., the portion of the first application remains visible beneath the plurality of additional portions, remains visible next to the additional portions (to the right of), or both).

(F3) In some embodiments of the method of F1, presenting the plurality of additional portions includes moving the first application towards a different edge of the touch-sensitive display, opposite to the edge, such that a smaller portion, as compared to a larger portion that is visible while the first application is displayed in full-screen mode, of the first application remains visible on the touch-sensitive display.

(F4) In some embodiments of the method of any one of F1-F3, presenting the plurality of additional portions further includes sliding each successive additional portion out from the edge and on to the touch-sensitive display.

(F5) In some embodiments of the method of any one of F1-F4, the plurality of additional portions are ordered such that a first additional portion appearing closest to the first application corresponds to a most recently-used application and a last additional portion appearing furthest away from the first application, and closest to the edge of the touch-sensitive display, corresponds to a least recently-used application.

(F6) In some embodiments of the method of F1-F3, the plurality of additional portions are ordered such that a first additional portion appearing closest to the first application corresponds to a least recently-used application and a last additional portion appearing furthest away from the first application, and closest to the edge of the touch-sensitive display, corresponds to a most recently-used application.

(F7) In some embodiments of the method of any one of F1-F6, a respective additional portion of the plurality of additional portions includes an active view of the recently-used application that corresponds to the respective additional portion.

(F8) In some embodiments of the method of any one of F1-F7, the plurality of additional portions includes a predetermined number of additional portions. In some embodiments, the predetermined number is based on preferences associated with a user of the electronic device.

(F9) In some embodiments of the method of any one of F1-F8, the method further includes: while continuing to detect the contact on the touch-sensitive display, detecting an increase in the intensity of the contact. In response to detecting the increase in the intensity of the contact, the method includes: displaying at least one new additional portion, distinct from each additional portion in the plurality of additional portions, on the touch-sensitive display.

(F10) In some embodiments of the method of F9, the at least one new additional portion corresponds to an application that was last used before the recently-used applications corresponding to the plurality of additional portions.

(F11) In some embodiments of the method of any one of F1-F8, the method further includes: while continuing to detect the contact on the touch-sensitive display, detecting an increase in the intensity of the contact. In response to detecting the increase in the intensity of the contact, the method includes: increasing a display size, on the touch-sensitive display, for each additional portion of the plurality of additional portions.

(F12) In some embodiments of the method of any one of F1-F11, the method further includes: while continuing to detect the contact on the touch-sensitive display, detecting movement of the contact towards a first additional portion of the plurality of additional portions, the first additional portion corresponding to a second application. The method also includes: detecting liftoff of the contact, from the touch-sensitive display, over the first additional portion. In response to detecting liftoff of the contact over the first additional portion, the method includes: (i) ceasing to display the plurality of additional portions, (ii) ceasing to display the first application, and (iii) displaying the second application in the full-screen mode on the touch-sensitive display.

(F13) In some embodiments of the method of any one of F1-F12, the method further includes: after presenting the plurality of additional portions, detecting liftoff of the contact from the touch-sensitive display. The method also includes: continuing to display the plurality of additional portions and the first application.

(F14) In some embodiments of the method of F13, the method further includes: detecting a touch input at a first additional portion of the plurality of additional portions, the first additional portion corresponding to a second application. In response to detecting the touch input at the first additional portion, the method includes: (i) ceasing to display the first application, (ii) ceasing to display the plurality of additional portions, and (iii) displaying the second application in the full-screen mode on the touch-sensitive display.

(F15) In another aspect, a non-transitory computer-readable storage medium is provided. The non-transitory computer-readable storage medium stores executable instructions that, when executed by an electronic device with a touch-sensitive display, cause the electronic device to perform the method of any one of F1-F14 described above.

(F16) In yet another aspect, an electronic device that includes a touch-sensitive display, one or more processors, and memory storing one or more programs is provided. The one or more programs, when executed by the one or more processors, cause the electronic device to perform the method of any one of F1-F14 described above.

(F17) In yet another aspect, an electronic device that includes a touch-sensitive display is provided. The electronic device further includes means for performing the method of any one of F1-F14 described above.

(F18) In yet one more aspect, a graphical user interface on an electronic device with a touch-sensitive display is provided. The graphical user interface includes user interfaces in accordance with the method of any one of F1-F14 described above.

(F19) In one additional aspect (and with reference to FIG. 71), an electronic device is provided that includes a display unit (e.g., display unit 7101) configured to display information, a touch-sensitive surface unit (e.g., touch-sensitive surface unit 7103) configured to receive contacts on the touch-sensitive surface unit, and a processing unit (e.g., processing unit 7105) coupled with the display unit and the touch-sensitive surface unit. In some embodiments, the display unit and the touch-sensitive surface unit comprise an integrated unit, referred to as a touch-sensitive display of the electronic device. In some embodiments, the processing unit includes a displaying unit (e.g., displaying unit 7107), a detecting unit (e.g., detecting unit 7109), a determining unit (e.g., determining unit 7111), a presenting unit (e.g., presenting unit 7113), an overlaying unit (e.g., overlaying unit 7115), a moving unit (e.g., moving unit 7117), a sliding unit (e.g., sliding unit 7119), and an ordering unit (e.g., ordering unit 7121). The processing unit (or one or more components thereof, such as units 7107-7121) is configured to cause the electronic device to: display a first application in a full-screen mode on the touch-sensitive display; detect a contact over the first application within a predetermined distance of an edge of the touch-sensitive display; determine an intensity of the contact on the touch-sensitive display (in some embodiments, determining the intensity of the contact is performed in response to detecting the contact within the predetermining distance of the edge of the touch-sensitive display); and upon determining that the intensity of the contact exceeds an intensity threshold, present, at or near the edge of the touch-sensitive display, a plurality of additional portions, each additional portion of the plurality of additional portions corresponding to a recently-used application.

(F20) In some embodiments of the electronic device of F19, presenting the plurality of additional portions includes overlaying (e.g., with the overlaying unit 7115) the plurality of additional portions on top of the first application, such that a portion of the first application remains visible on the touch-sensitive display (e.g., the portion of the first application remains visible beneath the plurality of additional portions, remains visible next to the additional portions (to the right of), or both).

(F21) In some embodiments of the electronic device of F19, presenting the plurality of additional portions includes moving (e.g., with the moving unit 7117) the first application towards a different edge of the touch-sensitive display, opposite to the edge, such that a smaller portion, as compared to a larger portion that is visible while the first application is displayed in full-screen mode, of the first application remains visible on the touch-sensitive display.

(F22) In some embodiments of the electronic device of any one of F19-F21, presenting the plurality of additional portions further includes sliding (e.g., with the sliding unit 7119) each successive additional portion out from the edge and on to the touch-sensitive display.

(F23) In some embodiments of the electronic device of any one of F19-F22, the plurality of additional portions are ordered (e.g., with the ordering unit 7121) such that a first additional portion appearing closest to the first application corresponds to a most recently-used application and a last additional portion appearing furthest away from the first application, and closest to the edge of the touch-sensitive display, corresponds to a least recently-used application.

(F24) In some embodiments of the electronic device of F19-F21, the plurality of additional portions are ordered (e.g., with the ordering unit 7121) such that a first additional portion appearing closest to the first application corresponds to a least recently-used application and a last additional portion appearing furthest away from the first application, and closest to the edge of the touch-sensitive display, corresponds to a most recently-used application.

(F25) In some embodiments of the electronic device of any one of F19-F24, a respective additional portion of the plurality of additional portions includes an active view of the recently-used application that corresponds to the respective additional portion.

(F26) In some embodiments of the electronic device of any one of F19-F25, the plurality of additional portions includes a predetermined number of additional portions. In some embodiments, the predetermined number is based on preferences associated with a user of the electronic device.

(F27) In some embodiments of the electronic device of any one of F19-F26, the processing unit is further configured to: while continuing to detect the contact on the touch-sensitive display, detect (e.g., with the detecting unit 7109) an increase in the intensity of the contact. In response to detecting the increase in the intensity of the contact, processing unit is configured to: display (e.g., with the displaying unit 7107 and/or the display unit 7101) at least one new additional portion, distinct from each additional portion in the plurality of additional portions, on the touch-sensitive display.

(F28) In some embodiments of the electronic device of F27, the at least one new additional portion corresponds to an application that was last used before the recently-used applications corresponding to the plurality of additional portions.

(F29) In some embodiments of the electronic device of any one of F19-F26, the processing unit is further configured to: while continuing to detect the contact on the touch-sensitive display, detect (e.g., with the detecting unit 7109) an increase in the intensity of the contact. In response to detecting the increase in the intensity of the contact, the processing unit is configured to: increase (e.g., with the displaying unit 7107 and/or the display unit 7101) a display size, on the touch-sensitive display, for each additional portion of the plurality of additional portions.

(F30) In some embodiments of the electronic device of any one of F19-F29, the processing unit is further configure to: while continuing to detect the contact on the touch-sensitive display, detect (e.g., with the detecting unit 7109) movement of the contact towards a first additional portion of the plurality of additional portions, the first additional portion corresponding to a second application. The processing unit is also configured to: detect (e.g., with the detecting unit 7109) liftoff of the contact, from the touch-sensitive display, over the first additional portion. In response to detecting liftoff of the contact over the first additional portion, the processing unit is configured to: (i) cease to display the plurality of additional portions, (ii) cease to display the first application, and (iii) display the second application in the full-screen mode on the touch-sensitive display (e.g., with the displaying unit 7107 and/or the display unit 7101).

(F31) In some embodiments of the electronic device of any one of F19-F30, the processing unit is further configured to: after presenting the plurality of additional portions, detect (e.g., with the detecting unit 7109) liftoff of the contact from the touch-sensitive display. The processing unit is also configured to: continue to display the plurality of additional portions and the first application (e.g., with the displaying unit 7107 and/or the display unit 7101).

(F32) In some embodiments of the electronic device of F31, the processing unit is further configured to: detect (e.g., with the detecting unit 7109) a touch input at a first additional portion of the plurality of additional portions, the first additional portion corresponding to a second application. In response to detecting the touch input at the first additional portion, the processing unit is configured to: (i) cease to display the first application, (ii) cease to display the plurality of additional portions, and (iii) display the second application in the full-screen mode on the touch-sensitive display (e.g., with the displaying unit 7107 and/or the display unit 7101).

(G1) In some embodiments, a computer-implemented method is performed at an electronic device with a touch-sensitive display. The method includes: displaying a first application on the touch-sensitive display. While the first application is displayed, the method further includes detecting an input to display an application selector. Responsive to detecting the input, the method also includes (i) displaying the first application in a first portion of the touch-sensitive display, (ii) displaying the application selector in a second portion of the touch-sensitive display, the application selector including a plurality of icons, each icon associated with a corresponding application, and (iii) detecting a selection of an icon from the plurality of icons included in the application selector. Responsive to detecting a selection of the icon: (i) ceasing to display the application selector in the second portion of the touch-sensitive display; and (ii) displaying a second application associated with the selected icon in an entirety of the second portion of the touch-sensitive display concurrently with the display of the first application in the first portion of the touch-sensitive display.

(G2) In some embodiments of the computer-implemented method of G1, detecting the input to display the application selector includes: (i) detecting a contact at a first location on the touch-sensitive display adjacent to a vertical edge of the touch-sensitive display; and (ii) detecting a continuous movement of the contact to a second location on the touch-sensitive display, the continuous movement having a lateral component without the contact breaking contact with the touch-sensitive display.

(G3) In some embodiments of the computer-implemented method of any one of G1-G2, the second portion of the touch-sensitive display is narrower than the first portion.

(G4) In some embodiments of the computer-implemented method of any one of G1-G3, the method further includes: detecting a contact at a first location on the touch-sensitive display selecting both the first application in the first portion of the touch-sensitive display and the second application in the second portion of the touch-sensitive display. The method also includes detecting a continuous movement of the contact to a second location toward a vertical edge of the touch-sensitive display bordering the second application, the continuous movement having a lateral component without the contact breaking contact with the touch-sensitive display. Responsive to detecting the continuous movement: (i) ceasing to display the second application in the second portion of the touch-sensitive display and (ii) displaying the first application in an entirety of the touch-sensitive display.

(G5) In some embodiments of the computer-implemented method of any one of G1-G3, the method further includes: detecting a contact at a first location on the touch-sensitive display, the contact selecting both the first application in the first portion of the touch-sensitive display and the second application in the second portion of the touch-sensitive display. The method also includes detecting a continuous movement of the contact to a second location toward a vertical edge of the touch-sensitive display bordering the first application, the continuous movement having a lateral component without the contact breaking contact with the touch-sensitive display. Responsive to detecting the continuous movement (i) ceasing to display the first application in the first portion of the touch-sensitive display and (ii) displaying the second application in an entirety of the touch-sensitive display.

(G6) In some embodiments of the computer-implemented method of any one of G1-G3, the method further includes: while the first application and the second application are concurrently displayed: (i) detecting a first contact on the first application displayed in the first portion and a concurrent second contact on the second application displayed in the second portion; (ii) detecting movement of both the first contact and the second contact; and (iii) displaying the first application in a third portion and a the second application a fourth portion in accordance with the movement of the first contact and the second contact.

(G7) In some embodiments of the computer-implemented method of G6, detecting the first contact and the concurrent second contact includes: (i) detecting a lateral component of movement of the first contact and the second contact without breaking contact with the touch-sensitive display and (ii) determining whether the lateral component of movement is in a first direction or a second direction. Responsive to the lateral component being in a first direction, reducing the width of the first portion and increasing the width of the second portion and displaying the first application in the first portion with the reduced width and displaying the second application in the second portion with the increased width. Responsive to the lateral component being in a second direction, increasing the width of the first portion and decreasing the width of the second portion and displaying the first application in the first portion with the increased width and displaying the second application in the second portion with the reduced width.

(G8) In some embodiments of the computer-implemented method of any one of G1, G2, G3, G6, and G7, the method further includes: while the first application and the second application are concurrently displayed: (i) detecting a first contact on the first application displayed in the first portion and a concurrent second contact on the second application displayed in the second portion; (ii) detecting a gesture to display the second application in the first portion and the first application in the second portion based on movement of the first contact and the second contact; and (iii) displaying the second application in the first portion and the first application in the second portion in accordance with the detected gesture.

(G9) In some embodiments of the computer-implemented method of G8, detecting the gesture to display the second application in the first portion and the first application in the second portion includes detecting movement of the first contact in a first semi-circular direction and the second contact in a second semi-circular direction opposite the first arch direction without the first contact and the second contact breaking contact with the touch-sensitive display.

(G10) In some embodiments of the computer-implemented method of any one of G1-G3 and G6-G9, the method further includes detecting an input to display an icon view including a plurality of icons, each icon associated with a corresponding application. Responsive to detecting the input: (i) ceasing to display the first application in the first portion and the second application in the second portion and (ii) displaying the icon view including the plurality of icons. The method also includes: (i) receiving a selection of an icon from the plurality of icons, the icon corresponding to the first application and (ii) responsive to the selection, displaying the first application in the first portion and the second application in the second portion.

(G11) In some embodiments of the computer-implemented method of any one of G1-G3 and G6-G10, the second application is displayed in the second portion concurrently with the display of the first application in the first portion while the electronic device is oriented in a landscape orientation, and the method further includes: detecting rotation of the electronic device from the landscape orientation to a portrait orientation. Responsive to detecting the rotation of the electronic device from the landscape orientation to the portrait orientation: (i) ceasing to display the second application; and (ii) displaying the first application in an entirety of the touch-sensitive display while in the portrait orientation. While the first application is displayed in the entirety of the touch-sensitive display in the portrait orientation, detecting an input to re-display the second application. Responsive to detecting the input and while the electronic device is in the portrait orientation, concurrently displaying the first application in a third portion of the touch-sensitive display and displaying the second application in a fourth portion of the touch-sensitive display.

(G12) In some embodiments of the computer-implemented method of any one of G1-G3 and G6-G11, the second application is displayed in the second portion concurrently with the display of the first application in the first portion while the electronic device is oriented in a landscape orientation, and the method further includes detecting rotation of the electronic device from the landscape orientation to a portrait orientation. Responsive to detecting the rotation of the electronic device from the landscape orientation to the portrait orientation: (i) ceasing to display the second application; and (ii) displaying the first application in an entirety of the touch-sensitive display while in the portrait orientation. The method also includes detecting rotation of the electronic device from the portrait orientation to the landscape orientation. Responsive to detecting the rotation of the electronic device from the portrait orientation to the landscape orientation, concurrently displaying the first application in the first portion of the touch-sensitive display and displaying the second application in the second portion of the touch-sensitive display.

(G13) In some embodiments of the computer-implemented method of G1, displaying the second application includes overlaying the second application over a portion of the first application corresponding to the second portion of the touch-sensitive display.

(G14) In some embodiments of the computer-implemented method of G1, displaying the second application includes: (i) resizing the first application to fit in the first portion of the touch-sensitive display; and (ii) displaying the second application in the second portion of the touch-sensitive display and the resized first application in the first portion of the touch-sensitive display.

(G15) In some embodiments of the computer-implemented method of any one of G1-G3 and G6-G14, displaying the second application includes: (i) displaying content in the second application; (ii) detecting a request to display the content in the first application; and (iii) responsive to detecting the request, displaying the content object in the first application.

(G16) In one additional aspect, an electronic device that includes a display unit (e.g., a touch-sensitive display), a touch-sensitive surface unit, and a processing unit. The processing unit is configured to cause the electronic device to: display an application in a full-screen move on the touch-sensitive display; detect a contact over the application within a predetermined distance of an edge of the touch-sensitive display; in response to detecting the contact, monitor an intensity of the contact on the touch-sensitive display; and upon determining that the intensity of the contact exceeds an intensity threshold, present, at or near the edge of the touch-sensitive display, a plurality of additional portions, each additional portion of the plurality of additional portions corresponding to a recently-display application.

(H1) In another aspect, some embodiments include a computer-implemented method that is performed at an electronic device with a touch-sensitive display. The method includes: (i) displaying a first application in a full-screen mode and (ii) detecting a request to display an icon view including a plurality of icons. Responsive to detecting the request, the method further includes dismissing the first application from being displayed on the touch-sensitive display and displaying the icon view including the plurality of icons. The method continues by detecting, at the touch-sensitive display, a first contact at a first location on the icon view, the first location corresponding to an icon of the plurality of icons. The method also includes detecting continuous movement of the first contact on the touch-sensitive display from the first location to a second location on the icon view without the first contact breaking contact on the touch-sensitive display. Responsive to determining that the continuous movement of the first contact from the first location to the second location exceeds a predefined threshold distance: (i) dismissing the icon view from being displayed on the touch-sensitive display and (ii) displaying the first application and a second application corresponding to the icon in a shared screen view.

(H2) In some embodiments of the computer-implemented method of H1, displaying the first application and the second application in the shared screen view includes concurrently displaying the first application in a first portion of the touch-sensitive display and the second application in a second portion of the touch-sensitive display. In some embodiments, the first portion and the second portion are non-overlapping.

(H3) In some embodiments of the method of any one of H1-H2, the second application is displayed in the second portion of the touch-sensitive display with a default width and the first application is displayed in the first portion of the touch-sensitive display with a width corresponding to a remaining width of the touch-sensitive display that is not occupied by the second application.

(H4) In some embodiments of the method of any one of H1-H3, the second application is displayed in the first portion of the touch-sensitive display with a default width and the first application is displayed in the second portion of the touch-sensitive display with a width corresponding to a remaining width of the touch-sensitive display that is not occupied by the second application.

(H5) In some embodiments of the method of any one of H1-H4, the first portion is horizontally adjacent to the second portion.

(H6) In some embodiments of the method of H1-H5, the method further includes while the first application and the second application is displayed in the shared screen view: (i) detecting a first contact on the first application displayed in the first portion and a concurrent second contact on the second application displayed in the second portion and (ii) detecting a gesture to change a width of the first application and a width of the second application based on movement of the first contact and the second contact. Responsive to the gesture being in a first direction, reducing the width of the first application and increasing the width of the second application and displaying the first application in the first portion with the reduced width and displaying the second application in the second portion with the increased width. Responsive to the gesture being in a second direction, increasing the width of the first application and decreasing the width of the second application and displaying the first application in the first portion with the increased width and displaying the second application in the second portion with the reduced width.

(H7) In some embodiments of the method of any one of H1-H6, detecting the gesture to change the width of the first application and the width of the second application includes (i) detecting a lateral component of movement of the first contact and the second contact without breaking contact with the touch-sensitive display and (ii) determining whether the lateral component of movement is in the first direction or the second direction.

(H8) In some embodiments of the method of any one of H1-H7, the method further includes determining whether at least one of the width of the first application or the width of the second application is resizable. Responsive to determining that the width of the first application and the width of the second application are both resizable, determining whether the width of the first application and the width of the second application is continuously resizable or is resizable to one or more predetermined widths. In some embodiments, reducing the width of the first application and increasing the width of the second application includes (i) responsive to the width of the first application and the width of the second application both being continuously resizable, reducing the width of the first application and increasing the width of the second application in proportion with a magnitude of the lateral component of movement in the first direction, (ii) responsive to the width of the first application being resizable to one or more predetermined widths and the width of the second application being continuously resizable, reducing the width of the first application to one of the predetermined widths and increasing the width of the second application to a remaining width of the touch-sensitive display that is not occupied by the reduced width of the first application, and (iii) responsive to the width of the first application being continuously resizable and the width of the second application being resizable to one or more predetermined widths, increasing the width of the second application to one of the predetermined widths and reducing the width of the first application to a remaining width of the touch-sensitive display that is not occupied by the increased width of the second application. In some embodiments, increasing the width of the first application and decreasing the width of the second application includes (i) responsive to the width of the first application and the width of the second application both being continuously resizable, increasing the width of the first application and decreasing the width of the second application in proportion with a magnitude of the lateral component of movement in the second direction, (ii) responsive to the width of the first application being resizable to one or more predetermined widths and the width of the second application being continuously resizable, increasing the width of the first application to one of the predetermined widths and decreasing the width of the second application to a remaining width of the touch-sensitive display that is not occupied by the increased width of the first application, and (iii) responsive to the width of the first application being continuously resizable and the width of the second application being resizable to one or more predetermined widths, decreasing the width of the second application to one of the predetermined widths and increasing the width of the first application to a remaining width of the touch-sensitive display that is not occupied by the decreased width of the second application.

(H9) In some embodiments of the method of any one of H1-H8, the method further includes determining that at least one of the width of the first application and the width of the second application is fixed. While the first application and the second application is displayed in the shared screen view, the method also includes: (i) detecting a first contact on the first application displayed in the first portion and a concurrent second contact on the second application displayed in the second portion and (ii) detecting a gesture to change a width of the first application and a width of the second application. Responsive to detecting the gesture, concurrently displaying the first application in the second portion of the touch display screen and displaying the second application in the first portion of the touch display screen.

(H10) In some embodiments of the method of any one of H1-H9, the method further includes detecting that the first contact and the second contact are within a predetermined distance of a vertical edge of the touch-sensitive display bordering the first application while detecting the lateral component of movement of the first contact and the second contact in the first direction. Responsive to the detection: (i) dismissing the first application from being displayed in the first portion of the touch-sensitive display and (ii) displaying the second application in the full-screen mode.

(H11) In some embodiments of the method of any one of H1-H10, the method further includes detecting that the first contact and the second contact are within a predetermined distance of a vertical edge of the touch-sensitive display bordering the second application while detecting the lateral component of movement of the first contact and the second contact in the second direction. Responsive to the detection: (i) dismissing the second application from being displayed in the second portion of the touch-sensitive display and (ii) displaying the first application in the full-screen mode.

(H12) In some embodiments of the method of any one of H1-H11, the method further includes detecting a second request to display the icon view including the plurality of icons. Responsive to the second request, dismissing the shared screen view from being displayed and displaying the icon view including the plurality of icons. In some embodiments, the method also includes (i) detecting, at the touch-sensitive display, a second contact at a third location on the icon view, the third location corresponding to a third icon of the plurality of icons and (ii) detecting continuous movement of the second contact on the touch-sensitive display from the third location to a fourth location on the icon view without the second contact breaking contact on the touch-sensitive display. Responsive to determining that the continuous movement of the second contact from the second location to the third location exceeds the predefined threshold distance: (i) dismissing the icon view from being displayed on the touch-sensitive display and (ii) displaying the first application, the second application, and a third application corresponding to the third icon in the shared screen view. In some embodiments, the shared screen view includes the first application displayed in the first portion of the touch-sensitive display, the second application displayed in the second portion of the touch-sensitive display, and the third application displayed in a third portion of the touch-sensitive display, wherein the first portion, the second portion, and the third portion are non-overlapping.

(H13) In some embodiments of the method of any one of H1-H12, displaying the first application, the second application, and the third application includes (i) displaying an image of the third application on the touch-sensitive display, wherein a portion of the image is coupled to the second contact at the fourth location and (ii) detecting continuous movement of the second contact on the touch-sensitive display from the fourth location to a fifth location without the second contact breaking contact on the touch-sensitive display, the fifth location within the third portion of the touch-sensitive display. Responsive to the second contact breaking contact at the fifth location, the method also includes displaying the third application in the third portion of the touch-sensitive display.

(H14) In some embodiments of the method of any one of H1-H13, the method further includes detecting a third request to display the icon view including the plurality of icons. Responsive to detecting the third request, the method includes dismissing the shared screen view from being displayed and displaying the icon view including the plurality of icons. In some embodiments, the method further includes (i) detecting, at the touch-sensitive display, a third contact at a sixth location on the icon view, the sixth location corresponding to an additional icon of the plurality of icons and (ii) detecting continuous movement of the sixth contact on the touch-sensitive display from the fourth location to a seventh location on the icon view without the third contact breaking contact on the touch-sensitive display. Responsive to determining that the continuous movement of the third contact from the sixth location to the seventh location exceeds the predefined threshold distance, the method includes: (i) determining a total number of applications that would be displayed in the shared screen view if an application corresponding to the additional icon were added to the shared screen view and (ii) responsive to the total number of applications exceeding a predetermined threshold, dismissing one of the applications from being displayed in the shared screen view and displaying remaining applications in the shared screen view, the remaining applications including the application corresponding to the additional icon.

(H15) In some embodiments of the method of any one of H1-H14, dismissing one of the applications from being displayed in the shared screen view includes: (i) determining an application from the applications that would be displayed in the shared screen view that was least recently activated and (ii) removing the determined application from being displayed in the shared screen view.

(H16) In some embodiments of the method of any one of H1-H15, the plurality of icons are application icons, each icon associated with a corresponding application that is activated responsive to user selection of the icon.

(H17) In some embodiments of the method of any one of H1-H16, the method further includes (i) dismissing the shared screen view and (ii) displaying the icon view. In some embodiments, the icon view includes the icon displayed at a location corresponding to the first location.

(H18) In some embodiments of the method of any one of H1-H17, the first application continues to execute in a background of the electronic device responsive to dismissing the first application.

(H19) In one other aspect, a non-transitory computer-readable storage medium is provided. The non-transitory computer-readable storage medium storages executable instruction that when executed by one or more processor of an electronic device cause the electronic device to perform the method of any of H1-H18.

(H20) In yet another aspect, a device including memory, one or more processors, and one or more programs is provided. The one or more programs are stored in the memory of the electronic device and the one or more programs are configured for execution by the one or more processors, the one or more programs including instructions to perform the method of any one of H1-H18.

(H21) In these other embodiments, another computer-implemented method that is executed at an electronic device with a touch-sensitive display is provided. In some embodiments, the method includes: displaying a first application and a second application in a shared screen view, the shared screen view including the first application displayed in a first portion of the touch-sensitive display and the second application displayed in a second portion of the touch-sensitive display, wherein the first portion and the second portion are non-overlapping. In some embodiments, the method also includes (i) detecting, at the touch-sensitive display, a first contact on the first application displayed in the first portion and a concurrent second contact on the second application displayed in the second portion and (ii) detecting a continuous movement of the first contact and the second contact, the continuous movement having a lateral component of movement without the first contact and the second contact breaking contact with the touch-sensitive display. Responsive to the continuous movement, the method additional includes displaying the first application in the first portion of the touch-sensitive display and the second application in the second portion each with a revised width.

(H22) In some embodiments of the method of H21, detecting the continuous movement of the first contact and the second contact and displaying the first application in the first portion of the touch-sensitive display and the second application in the second portion each with the revised width includes: (i) determining whether the lateral component of movement is in a first direction or a second direction, (ii) responsive to the lateral component of movement in the first direction, displaying the first application in the shared screen view with a reduced width and displaying the second application in the shared screen view with an increased width, and (iii) responsive to the lateral component of movement in the second direction, displaying the first application in the shared screen view with an increased width and displaying the second application in the shared screen view with a reduced width.

(H23) In some embodiments of the method of any one of H21-H22, the continuous movement having the lateral component of movement is along a width of the touch-sensitive display.

(H24) In some embodiments of the method of any one of H21-H23, displaying the first application in the shared screen view with the reduced width and displaying the second application in the shared screen view with the increased width includes: (i) responsive to a width of the first application and a width of the second application both being continuously resizable, reducing the width of the first application and increasing the width of the second application in proportion with a magnitude of the lateral component of movement in the first direction; (ii) responsive to the width of the first application being resizable to one or more predetermined widths and the width of the second application being continuously resizable, reducing the width of the first application to one of the predetermined widths and increasing the width of the second application to a remaining width of the touch-sensitive display that is not occupied by the reduced width of the first application; and (iii) responsive to the width of the first application being continuously resizable and the width of the second application being resizable to one or more predetermined widths, increasing the width of the second application to one of the predetermined widths and reducing the width of the first application to a remaining width of the touch-sensitive display that is not occupied by the increased width of the second application.

(H25) In some embodiments of the method of any one of H21-H24, displaying the first application in the shared screen view with the increased width and displaying the second application in the shared screen view with the reduced width includes: (i) responsive to a width of the first application and a width of the second application both being continuously resizable, increasing the width of the first application and decreasing the width of the second application in proportion with a magnitude of the lateral component of movement in the second direction; (ii) responsive to the width of the first application being resizable to one or more predetermined widths and the width of the second application being continuously resizable, increasing the width of the first application to one of the predetermined widths and decreasing the width of the second application to a remaining width of the touch-sensitive display that is not occupied by the increased width of the first application; and (iii) responsive to the width of the first application being continuously resizable and the width of the second application being resizable to one or more predetermined widths, decreasing the width of the second application to one of the predetermined widths and increasing the width of the first application to a remaining width of the touch-sensitive display that is not occupied by the decreased width of the second application.

(H26) In some embodiments of the method of any one of H21-H25, the method further includes detecting that the first contact and the second contact are within a predetermined distance of an edge of the touch-sensitive display bordering the first application while detecting the continuous movement of the first contact and the second contact in the first direction. Responsive to the detection, the method also includes: (i) dismissing the first application from being displayed in the first portion of the touch-sensitive display and (ii) displaying the second application in the full-screen mode.

(H27) In some embodiments of the method of any one of H21-H26, the method further includes detecting that the first contact and the second contact are within a predetermined distance of an edge of the touch-sensitive display bordering the second application while detecting the continuous movement of the first contact and the second contact in the second direction. Responsive to the detection: (i) dismissing the second application from being displayed in the second portion of the touch-sensitive display and (ii) displaying the first application in the full-screen mode.

(H28) In some embodiments of the method of any one of H21-H27, at least one of the dismissed first application and the dismissed second application remain executing on the electronic device after dismissal.

(H29) In some embodiments of the method of any one of H21-H28, the method further includes: (i) detecting a third contact on the first application displayed in the first portion of the shared screen view and a concurrent fourth contact on the second application displayed in the second portion of the shared screen view; (ii) detecting continuous movement of the third contact and the fourth contact in a circular motion without the third contact and the fourth contact breaking contact with the touch-sensitive display; and (iii) responsive to the third contact and the fourth contact breaking contact with the touch-sensitive display following the continuous movement, displaying the first application in the second portion of the shared screen view and the second application in the first portion of the shared screen view.

(H30) In some embodiments of the method of any one of H21-H29, the method further includes: (i) detecting a plurality of concurrent contacts on the touch-sensitive display, the plurality of concurrent contacts formed around a location on the touch-sensitive display central to the plurality of concurrent contacts; (ii) detecting continuous movement of the plurality of concurrent contacts towards the location without breaking contact with the touch-sensitive display; and (iii) responsive to the plurality of contacts breaking contact with the touch-sensitive display within a locality of the location, dismissing the shared screen view from being displayed on the touch-sensitive display and displaying the icon view in a full-screen mode.

(H31) In some embodiments of the method of any one of H21-H30, the method further includes: (i) detecting, at the touch-sensitive display, a third contact at a first location on the first application displayed in the first portion and a concurrent fourth contact at a second location on the second application displayed in the second portion; (ii) while the third contact maintains position at the first location on the first application, detecting movement of the second contact accelerating in a vertical direction and the second contact breaking contact with the touch-sensitive display; and (iii) responsive to the second contact breaking contact with the touch-sensitive display, dismissing the second application from being displayed on the touch-sensitive display and displaying the first application in the full-screen mode.

(H32) In some embodiments of the method of any one of H21-H31, dismissing the second application from being displayed on the touch-sensitive display includes displaying an animation illustrating an image of the second application moving in the vertical direction until the image of the second application is no longer displayed on the touch-sensitive display.

(H33) In another aspect, a non-transitory computer-readable storage medium is provided. The non-transitory computer-readable storage medium stores executable instructions that when executed cause an electronic device to perform the method of any one of H21-H32.

(H34) In yet another aspect, a device including memory, one or more processors, and one or more programs stored in the memory for execution by the one or more processors is provided. The one or more programs include instructions for performing the method of any one of H21-H32.

(H35) In these other embodiments, another computer-implemented method that is executed at an electronic device with a touch-sensitive display is provided. The method includes: (i) displaying an icon view in a full-screen mode, the icon view displaying a plurality of icons each associated with an associated application on the electronic device; (ii) displaying a notification overlaying at least a portion of the icon view, the notification indicative of an activity associated with a first application; (iii) detecting a contact on the notification at a first location; (iv) detecting a continuous movement of the contact from the first location to a second location, the continuous movement having a vertical component of movement without the contact breaking contact with the touch-sensitive display; and (v) responsive to detecting the continuous movement, dismissing the icon view and the notification and displaying a shared screen view, the shared screen view including the first application displayed in a first portion of the touch-sensitive display and a second application displayed in a second portion of the touch-sensitive display, wherein the first portion and the second portion are non-overlapping.

(H36) In these other embodiments, another computer-implemented method that is executed at an electronic device with a touch-sensitive display is provided. The method includes: (i) displaying a first application in a full-screen mode; (ii) displaying a notification overlaying at least a portion of the first application, the notification indicative of an activity associated with a second application; (iii) detecting a contact on the notification at a first location; (iv) detecting a continuous movement of the contact from the first location to a second location, the continuous movement having a vertical component of movement without the contact breaking contact with the touch-sensitive display; and (v) responsive to detecting the continuous movement, dismissing the first application displayed in the full-screen mode and the notification and displaying a shared screen view, the shared screen view including the first application displayed in a first portion of the touch-sensitive display and the second application displayed in a second portion of the touch-sensitive display. In some embodiments, the first portion and the second portion are non-overlapping.

(H37) In some embodiments of the method of any one of H35-H36, the notification is a banner displayed along a width of the touch-sensitive display.

(H38) In some embodiments of the method of any one of H35-H37, the notification includes an image representing the second application and a summary describing the activity.

(H39) In some embodiments of the method of any one of H35-H38, information included in the summary is based on a type of application associated with the activity.

(H40) In some embodiments of the method of any one of H35-H39, the method further includes responsive to not detecting the contact on the notification within a predetermined amount of time from displaying the notification, dismissing the notification from being displayed on the touch-sensitive display.

(H41) In another aspect, a non-transitory computer-readable storage medium is provided. The non-transitory computer-readable storage medium stores executable instruction that when executed cause an electronic device to perform the method of any one of H35-H40.

(H42) In yet another aspect, a device including memory, one or more processors, and one or more programs stored in the memory for execution by the one or more processors is provided. The one or more programs include instructions to perform the method of any one of H35-H40.

(H43) In these other embodiments, another computer-implemented method that is executed at an electronic device with a touch-sensitive display is provided. The method includes displaying a first application and a second application in a shared screen view, the shared screen view including the first application displayed in a first portion of the touch-sensitive display with a perspective effect and the second application displayed in a second portion of the touch-sensitive display with the perspective effect. In some embodiments, the first portion and the second portion are non-overlapping. The method further includes: (i) detecting, at the touch-sensitive display, a first contact on the first application displayed in the first portion and a concurrent second contact on the second application displayed in the second portion; (ii) responsive to the detection, displaying a user interface (UI) element across at least a portion of the shared screen view, the UI element including a measurement of the touch-sensitive display occupied by each of the first application and the second application; (iii) detecting a continuous movement of the first contact and the second contact, the continuous movement having a lateral component of movement without the first contact and the second contact breaking contact with the touch-sensitive display; (iv) responsive to the continuous movement, displaying the first application in the first portion of the touch-sensitive display with the perspective effect and the second application in the second portion with the perspective effect each with a revised width and updating the UI element to indicate an updated measurement of the touch-sensitive display currently occupied by the revised width of each of the first application and the second application.

(H44) In some embodiments of the method of H43, the UI element is a rectangular UI element that spans across the shared screen view.

(H45) In some embodiments of the method of any one of H43-H44, the UI element is translucent.

(H46) In some embodiments of the method of any one of H43-H45, the UI element is opaque.

(H47) In some embodiments of the method of any one of H43-H46, the measurement indicates a first percentage of a width of the touch-sensitive display occupied by the first application and a second percentage of the width of the touch-sensitive display occupied by the second application.

(H48) In some embodiments of the method of any one of H43-H47, the measurement indicates a first width option describing a predetermined width for the first application in which the first application can be displayed and a second width option describing a predetermined width for the second application in which the second application can be displayed based on the continuous movement.

(H49) In another aspect, a non-transitory computer-readable storage medium is provided. The non-transitory computer-readable storage medium stores executable instructions that when executed cause an electronic device to perform the method of any one of H43-H47.

(H50) In yet another aspect, a device including memory, one or more processors, and one or more programs stored in the memory for execution by the one or more processors is provided. The one or more programs include instructions to perform the method of any one of H43-H47.

(H51) In these other embodiments, another computer-implemented method that is executed at a computing device is provided. The method includes displaying, on a display screen of the computing device, an array view of the computing device, the array view comprising a first application displayed as a first discrete mini application and a second application displayed as a second discrete mini application. The array view further includes a user interface element between the first discrete mini application and the second discrete mini application, the user interface element including a visual indication that the first and second discrete mini applications can be joined. In some embodiments, the method also includes detecting a first contact on the user interface element. Responsive to detecting the first contact on the user interface element, the method includes displaying an updated array view of the computing device that includes: (i) the first discrete mini application adjacent to the second discrete mini application and (ii) an updated user interface element displayed over a shared edge between the first and second mini applications and providing a visual indication the mini applications can be unjoined.

(H52) In some embodiments of the method of H51, the method further includes: (i) detecting a second contact on the updated user interface element and (ii) responsive to detecting the second contact on the updated user interface element, displaying the array view of the computing device.

(H53) In some embodiments of the method of any one of H51-H52, the method further includes: (i) detecting a second contact on the first discrete mini application, (ii) detecting a gesture moving the second contact in a first direction, and (iii) responsive to detecting the gesture in the first direction, displaying a second updated array view of the computing device, the second updated array view including the first discrete mini application, the second discrete mini application, and the user interface element. In some embodiments, the first discrete mini application is horizontally aligned with the second discrete mini application, the user interface element is located between the first discrete mini application and the second discrete mini application, the user interface is horizontally aligned with the first and second discrete mini applications, a first arrow of the user interface element is pointing to the second discrete mini application, and a second arrow of the user interface element is pointing to the first discrete mini application.

(H54) In some embodiments of the method of any one of H51-H53, the method further includes (i) detecting a third contact and a concurrent fourth contact on the computing device, wherein the third contact and the concurrent fourth contact are vertically aligned, (ii) detecting a gesture decreasing distance between the third contact and the fourth contact on the computing device, and (iii) displaying the array view of the computing device, the array view including additional discrete mini applications and additional user interface elements, the additional discrete mini applications horizontally aligned with the first discrete mini application and the second discrete mini application and the additional user interface elements between each pair of additional discrete mini applications.

(H55) In some embodiments of the method of any one of H51-H54, the first application and the second application were previously opened on the computing device.

(H56) In another aspect, a non-transitory computer-readable storage medium is provided. The non-transitory computer-readable storage medium stores executable instructions that when executed cause an electronic device to perform the method of any one of H51-H55.

(H57) In yet another aspect, a device that includes memory, one or more processors, and one or more programs stored in the memory for execution by the one or more processors is provided. The one or more programs include instructions to perform the method of any one of H51-H55.

(H58) In these other embodiments, another computer-implemented method that is executed at a computing device is provided. The method includes displaying, on a display screen of a computing device, an array view of the computing device, the array view including a first application displayed as a first discrete mini application and a second application displayed as a second discrete mini application. The first discrete mini app is horizontally aligned with the second discrete mini application. The method also includes (i) detecting a first contact on the first discrete mini application and a concurrent second contact on the second discrete mini application and (ii) responsive to detecting a decrease in a distance between the first contact and the second contact, displaying an updated array view of the computing device, the updated array view including the first discrete mini application and the second discrete mini application. The first discrete mini application is horizontally aligned with, adjacent to, and sharing an edge with the second discrete mini application.

(H59) In some embodiments of the method of H58, the method further includes: (i) detecting a third contact on the first discrete mini application and a concurrent fourth contact on the second discrete mini application and (ii) responsive to detecting distance between the third contact and the fourth contact increasing, displaying the array view of the computing device.

(H60) In some embodiments of the method of any one of H58-H59, the method further includes (i) detecting a third contact on the first discrete mini application, (ii) detecting a gesture moving the third contact in a first direction, and (iii) responsive to detecting the gesture in the first direction, displaying a second updated array view of the computing device, the second updated array view including the first discrete mini application and the second discrete mini application. The first discrete mini application is horizontally aligned with the second discrete mini application and the order of the first discrete mini application and the second discrete mini application is reversed.

(H61) In some embodiments of the method of any one of H58-H60, the method further includes: (i) detecting a third contact and a concurrent fourth contact on the computing device, wherein the third contact and the concurrent fourth contact are vertically aligned, (ii) detecting a gesture decreasing distance between the third contact and the fourth contact on the computing device, and (iii) responsive to detecting the gesture, displaying the array view of the computing device, the array view including additional discrete mini applications, the additional discrete mini applications horizontally aligned with the first discrete mini application and the second discrete mini application.

(H62) In some embodiments of the method of any one of H58-H61, the first application and the second application were previously opened on the computing device.

(H63) In another aspect, a non-transitory computer-readable storage medium is provided. The non-transitory computer-readable storage medium stores executable instruction that when executed cause an electronic device to perform the method of any one of H58-H62.

(H64) In yet another aspect, a device that includes memory, one or more processors, and one or more programs stored in the memory for execution by the one or more processors is provided. The one or more programs include instructions to perform the method of any one of H58-H62.

(H65) In these other embodiments, another computer-implemented method that is executed at a computing device is provided. The method includes displaying, on a display screen of a computing device, the shared screen view of the computing device, the shared screen view including a first application displayed at a first width in a first portion of the display screen and a second application displayed at a second width in a second portion of the display screen, the first application comprising a keyboard object in a first sub portion of the first portion at the first width of the display screen. In some embodiments, the method also includes: (i) detecting a first contact and a second contact in the first sub portion and (ii) detecting a gesture increasing distance between the first contact and the second contact, the gesture indicating a request to change width of the keyboard object in the first sub portion from the first width to a third width, the third width greater than or equal to the first width plus the second width. Responsive to detecting the gesture, the method further includes displaying an updated shared screen view in which the keyboard object is displayed in a second sub portion of the content region.

(H66) In some embodiments of the method of H65, the method further includes (i) detecting a third contact and a fourth contact in the third sub portion of the display screen, (ii) detecting a gesture decreasing distance between the third contact and the fourth contact, the gesture indicating a request to change width of the keyboard object in the third sub portion from the third width to a fourth width, the fourth width less than the third width, and (iii) responsive to detecting the gesture, displaying an updated shared screen view, wherein the keyboard object is displayed at the fourth width.

(H67) In some embodiments of the method of any one of H65-H66, the fourth width is the first width and the keyboard object is displayed in the first sub portion.

(H68) In some embodiments of the method of any one of H65-H67, the fourth width is the second width and the keyboard object is displayed in the fourth sub portion.

(H69) In another aspect, a non-transitory computer-readable storage medium is provided. The non-transitory computer-readable storage medium stores executable instructions that when executed cause an electronic device to perform the method of any one of H64-H68.

(H70) In yet another aspect, a device that includes memory, one or more processors, and one or more programs stored in the memory for execution by the one or more processors is provided. The one or more programs include instructions to perform the method of any one of H65-H68.

(H71) In these other embodiments, another computer-implemented method that is executed at a computing device is provided. The method includes: (i) displaying, on a display screen of a computing device, an opened application view of the computing device, the opened application view including a first application displayed at a first width in a first portion of the display screen; (ii) detecting a four-point contact on the display screen; (iii) detecting a gesture moving the four-point contact, the gesture indicating a request to change a first layout of the first application in the first portion of the display screen to a picture-in-picture (PIP) layout; and (iv) responsive to detecting the gesture, displaying an overlaid screen view in which the first application is displayed as a PIP layout in a sub portion of the display screen.

(H72) In some embodiments of the method of H71, the method further includes: (i) detecting a second four-point contact on the display screen; (ii) detecting a gesture moving the second four-point contact, the gesture indicating a request to change the PIP layout of the first application in the sub portion of the content region to the first layout; and (iii) responsive to detecting the gesture, displaying the overlaid screen view.

(H73) Additionally, in some embodiments, another method of displaying a picture-in-picture (PIP) configuration of PIP-type applications is provided. The method includes: (i) receiving, at a computing device, a first gesture dragging an application icon a threshold distance from an initial position of the application icon in an icon view that displays a plurality of application icons that are each associated with a corresponding application, the first gesture indicative of a request to display the application associated with the application icon; (ii) determining if the application associated with the application icon is compatible with a picture-in-picture (PIP) configuration; and (iii) responsive to determining the application is compatible with the PIP configuration, displaying the application associated with the application icon in a PIP layout.

(H74) In some embodiments of the method of H73, the method further includes responsive to determining the application is not compatible with the PIP layout, displaying the shared screen view displaying the application corresponding to the application icon with a width less than a width of a display screen of the computing device.

(H75) In some embodiments of the method of any one of H73-H74, the application displayed in PIP layout is displayed on top of a second application previously opened on the computing device, the second application and the application in PIP layout displayed in the shared screen view.

(H76) In another aspect, a non-transitory computer-readable storage medium is provided. The non-transitory computer-readable storage medium stores executable instructions that when executed cause an electronic device to perform the method of any one of H71-H75.

(H77) In yet another aspect, a device that includes memory, one or more processors, and one or more programs stored in the memory for execution by the one or more processors is provided. The one or more programs include instructions to perform the method of any one of H71-H75.

(H78) Additionally, in some embodiments, a computer-implemented method of displaying a default application is provided. The method includes: (i) displaying, on a display screen of a computing device, a shared screen view of the computing device, the shared screen view including a first application displayed at a first width in a first portion of the display screen and a second application displayed at a second width in a second portion of the display screen; (ii) detecting a five-point contact slide gesture on the display screen indicating a request to display a default application in the shared screen view; and (iii) responsive to detecting the gesture in a first lateral direction, displaying an updated shared screen view, the updated shared screen view including the first application displayed in the shared screen view and the default application displayed in the shared screen view.

(H79) In some embodiments of the method of H78, the method further includes: (i) detecting a second five-point contact on the display screen; (ii) detecting movement of the second five-point contact in a second lateral direction, the gesture indicating a request to remove from display the default application in the shared screen view; and (iii) responsive to detecting the gesture in the second lateral direction, displaying the shared screen view.

(H80) In another aspect, a non-transitory computer-readable storage medium is provided. The non-transitory computer-readable storage medium stores executable instructions that when executed cause an electronic device to perform the method of any of the foregoing claims H78-H79.

(H81) In yet another aspect, a device that includes memory, one or more processors, and one or more programs stored in the memory for execution by the one or more processors is provided. The one or more programs include instructions to perform the method of any one of H78-H79.

(H82) Additionally, a computer-implemented method for selecting text is provided. The method includes: (i) displaying, on a display screen of a computing device, text displayed in a first portion of a content region of the display screen; (ii) detecting a first contact in a sub portion of the first portion of the content region; (iii) responsive to detecting the input, displaying a front marker and an end marker at the beginning and end of a portion of the text corresponding to the sub portion; (iv) detecting a second contact and a finger contact on the display screen; (v) detecting a gesture moving the second contact and the third contact in a lateral direction; and (vi) shifting the front marker and the end marker in the lateral direction.

(H83) In some embodiments of the method of H82, the method further includes (i) detecting movement of the first contact in a lateral direction and (ii) shifting the front marker in the lateral direction.

(H84) In some embodiments of the method of any one of H82-H83, the method further includes (i) detecting movement of the second contact in a lateral direction and (ii) shifting the end marker in the lateral direction.

(H85) In another aspect, a non-transitory computer-readable storage medium is provided. The non-transitory computer-readable storage medium stores executable instructions that when executed cause an electronic device to perform the method of any one of H82-H84.

(H86) In yet another aspect, a device that includes memory, one or more processors, and one or more programs stored in the memory for execution by the one or more processors is provided. The one or more programs include instructions to perform the method of any one of H82-H84.

(H87) Additionally, one more method for selecting text is provided. The method includes: (i) displaying, on a display screen of a computing device, text displayed in a first portion of a content region of the display screen; (ii) detecting a first contact in a sub portion of the first portion of the content region; (iii) responsive to detecting the first contact, displaying a front marker and an end marker at the beginning and end of a portion of the text corresponding to the sub portion; (iv) detecting a second contact and a third contact on the display screen; (v) detecting a gesture moving the first contact in lateral direction; and (vi) shifting the front marker in the lateral direction.

(H88) In some embodiments of the method of H87, the method further includes (i) detecting movement of the third contact in a lateral direction and (ii) shifting the end marker in the lateral direction.

(H89) In some embodiments of the method of any one of H87-H88, the method further includes (i) detecting movement of the second contact and the third finger contact in a lateral direction and (ii) shifting the front marker and the end marker in the lateral direction.

(H90) In another aspect, a non-transitory computer-readable storage medium is provided. The non-transitory computer-readable storage medium stores executable instructions that when executed cause an electronic device to perform the method of any one of H87-H89.

(H91) In yet another aspect, a device that includes memory, one or more processors, and one or more programs stored in the memory for execution by the one or more processors is provided. The one or more programs include instructions to perform the method of any one of H87-H89.

(H92) Additionally, yet one more computer-implemented method for selecting text is provided. The method includes (i) displaying, on a display screen of a computing device, text displayed in a first portion of a content region of the display screen; (ii) detecting a contact in a sub portion of the first portion of the content region for at least a threshold duration; (iii) detecting movement of the contact, the movement indicative of selecting text in the direction of the movement; and (iv) selecting text in the direction of the movement.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

For a better understanding of the various described embodiments, reference should be made to the Description of Embodiments section below, in conjunction with the following drawings in which like reference numerals refer to corresponding parts throughout the drawings.

FIGS. 16A and 16B are schematics of a touch-sensitive display used to illustrate a keyboard before and after a de-pinch gesture, in accordance with some embodiments. FIGS. 16C and 16D are schematics of a touch-sensitive display used to illustrate the keyboard before and after a pinch gesture, in accordance with some embodiments. FIG. 16E is a schematic of a touch-sensitive display used to illustrate the use of a keyboard object within a shared screen view, in accordance with some embodiments.

FIGS. 54A-54E, 55, and 56 are flowcharts depicting methods of activating and interacting with a shared screen mode, in accordance with some embodiments.

DESCRIPTION OF EMBODIMENTS

Figure 26:
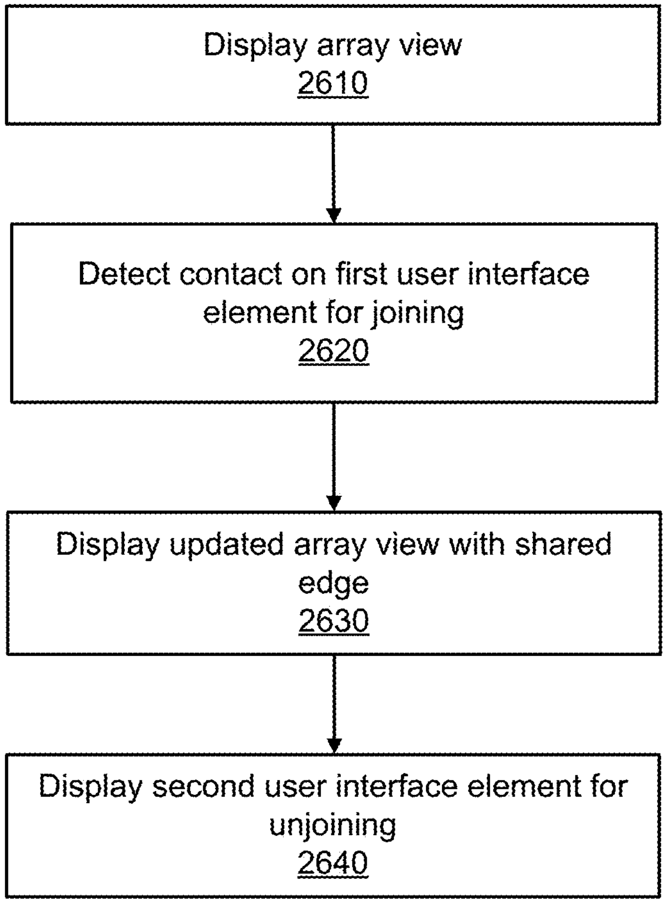
FIG. 26 is a flowchart depicting a method for joining applications in an array view, in accordance with some embodiments.
Figure 27:
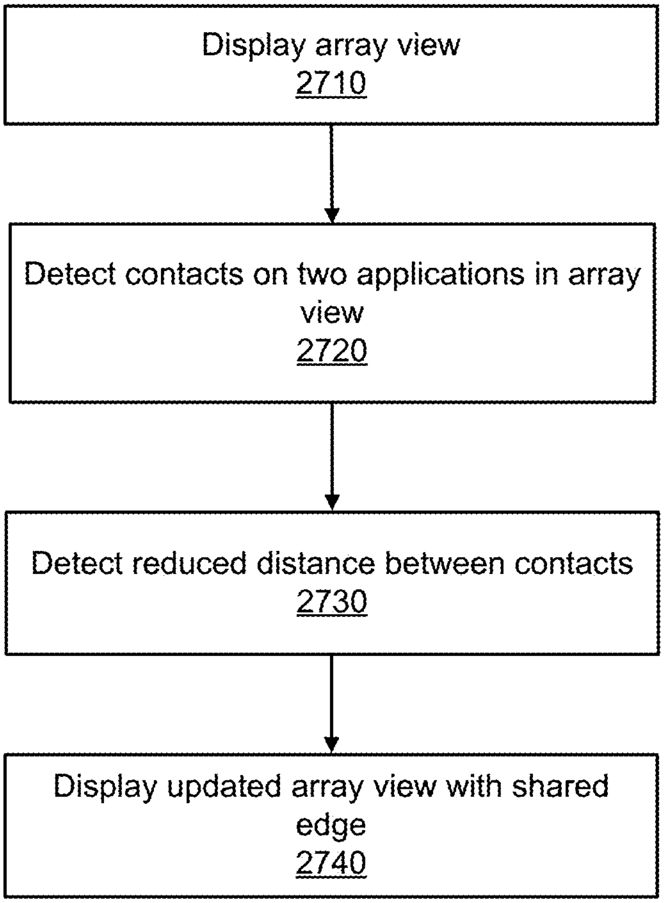
FIG. 27 is a flowchart depicting a method for joining applications in an array view, in accordance with some embodiments.
Figure 28:
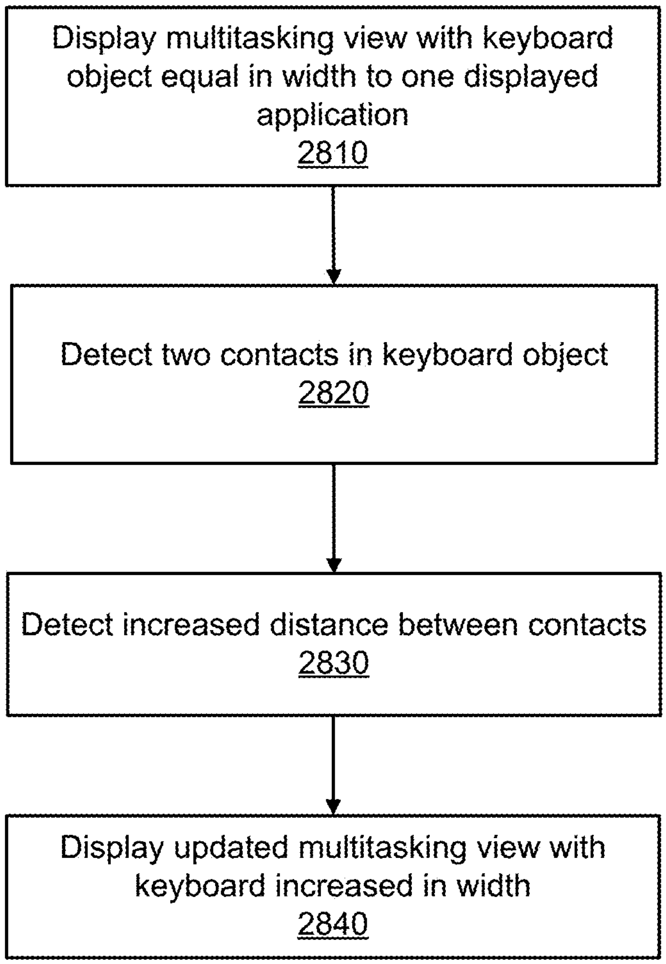
FIG. 28 is a flowchart depicting a method for resizing a keyboard in a multitasking view according, in accordance with some embodiments.
Figure 29:
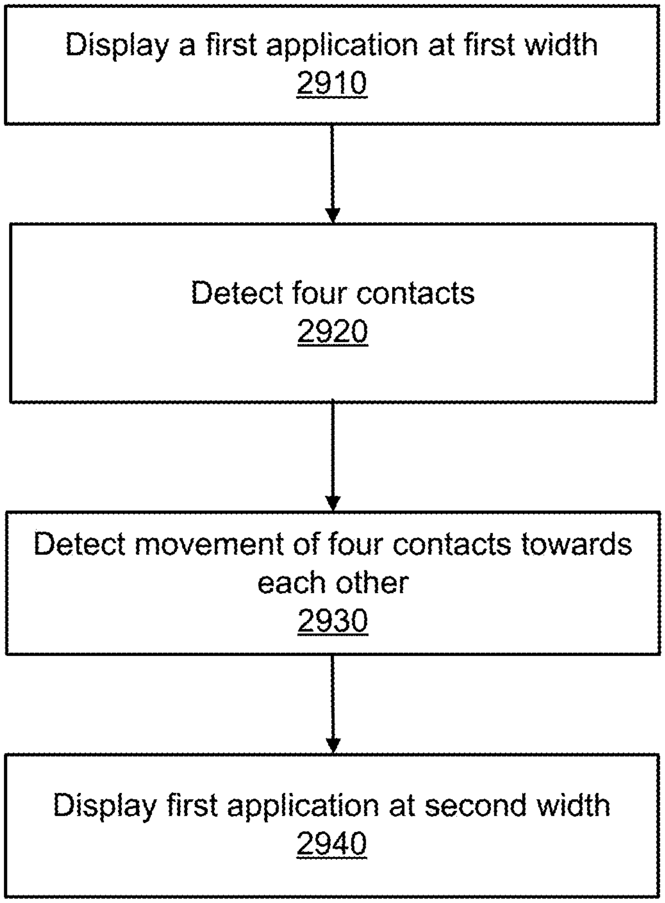
FIG. 29 is a flowchart depicting a method for creating PIP windows in a multitasking view according to some embodiments, in accordance with some embodiments.
Figure 30:
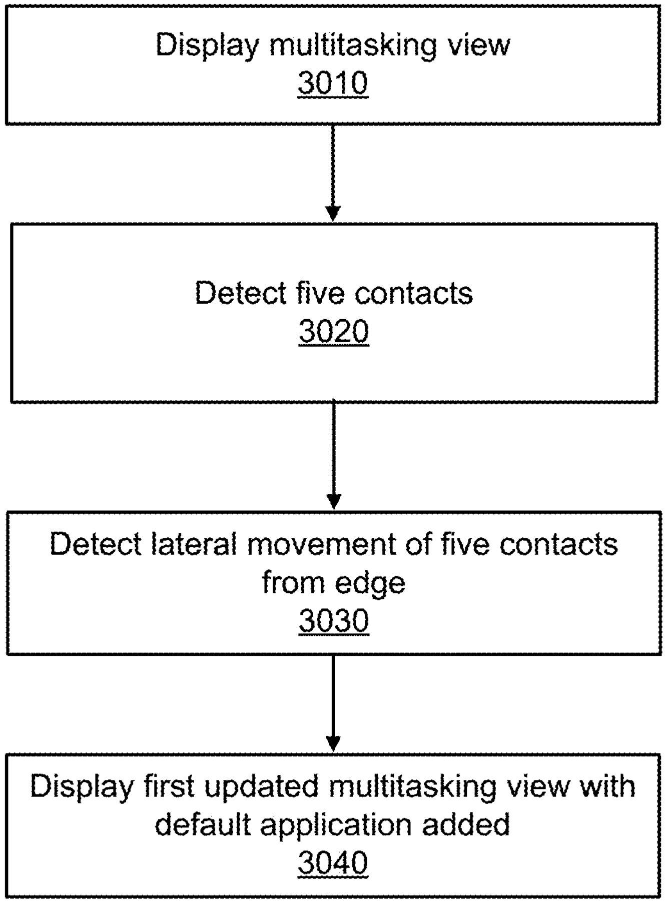
FIG. 30 is a flowchart depicting a method for sliding out a default application in a multitasking view, in accordance with some embodiments.
Figure 31:
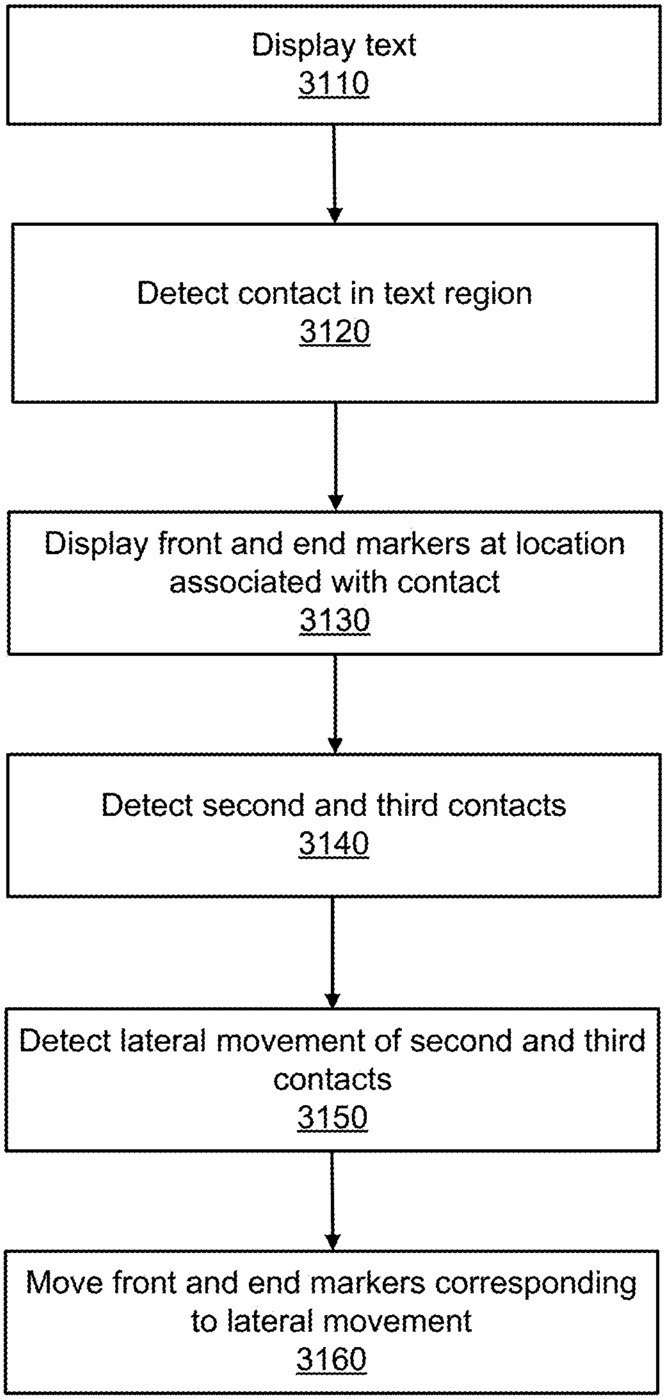
FIGS. 31 and 32 are flowcharts depicting methods for text editing, in accordance with some embodiments.
Figure 32:
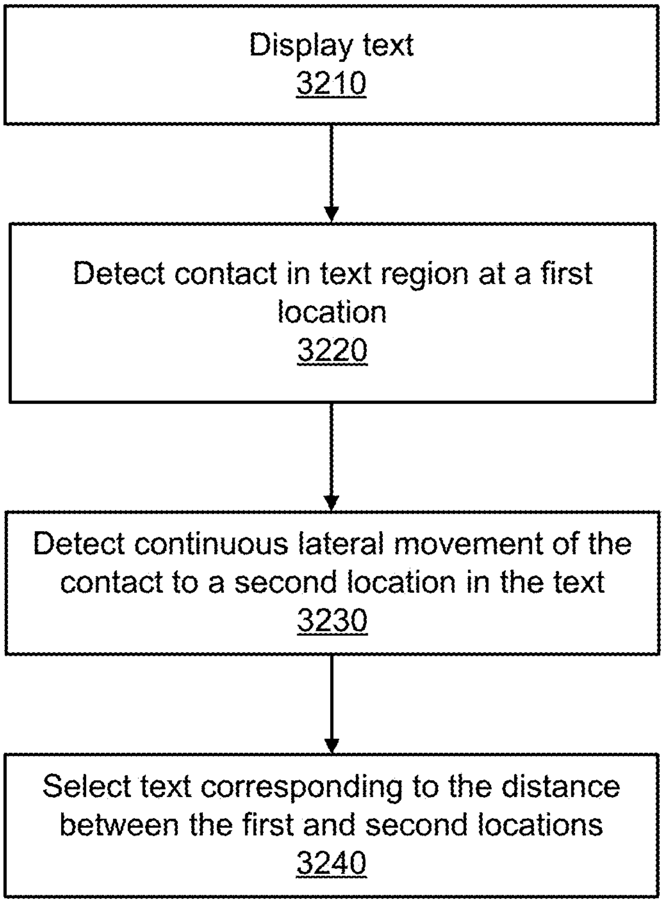

FIGS. 1A-1D, 2, 3, and 4 provide a description of example devices. FIGS. 5A-5B, 6A-6J, 7A-7C, 8A-8C, 9A-9B, 10A-10H, 11A-11C, 12A-12C, 13A-13E, and 19A-19D are schematics of a touch-sensitive display used to illustrate example user interfaces and gestures for interacting with a shared screen view. FIGS. 14A-14C and 15A-15B are schematics of a touch-sensitive display used to illustrate example user interfaces and gestures for interacting with an array view and a zoomed out array view. FIGS. 16A-16E are schematics of a touch-sensitive display used to illustrate the use of a keyboard object within a shared screen view, in accordance with some embodiments. FIGS. 17A-17F and 18A-18B are schematics of a touch-sensitive display used to illustrate example user interfaces and gestures for interacting with a picture-in-picture view. FIGS. 20A-21D are schematics of a touch-sensitive display used to illustrate example gestures related to editing text. FIGS. 22-25 are method flow diagrams for displaying a shared screen view. FIGS. 26 and 27 are method flow diagrams for joining applications in an array view. The user interfaces in FIGS. 13A-15B illustrate the methods and/or processes in FIGS. 26 and 27. FIG. 28 is a flowchart depicting a method for resizing a keyboard in a multitasking view. The user interfaces in FIGS. 16A-16D illustrate the methods and/or processes in FIG. 28. FIG. 29 is a flowchart depicting a method for creating picture-in-picture applications. The user interfaces in FIGS. 17A-18B illustrate the methods and/or processes in FIG. 29. FIG. 30 is a flowchart depicting a method for interacting with a default application. The user interfaces in FIGS. 19A-19D illustrate the methods and/or processes in FIG. 30. FIGS. 31 and 32 are flowcharts depicting methods for editing text. The user interfaces in FIGS. 20A-21D illustrate the methods and/or processes in FIGS. 31 and 32.

Figure 57A:
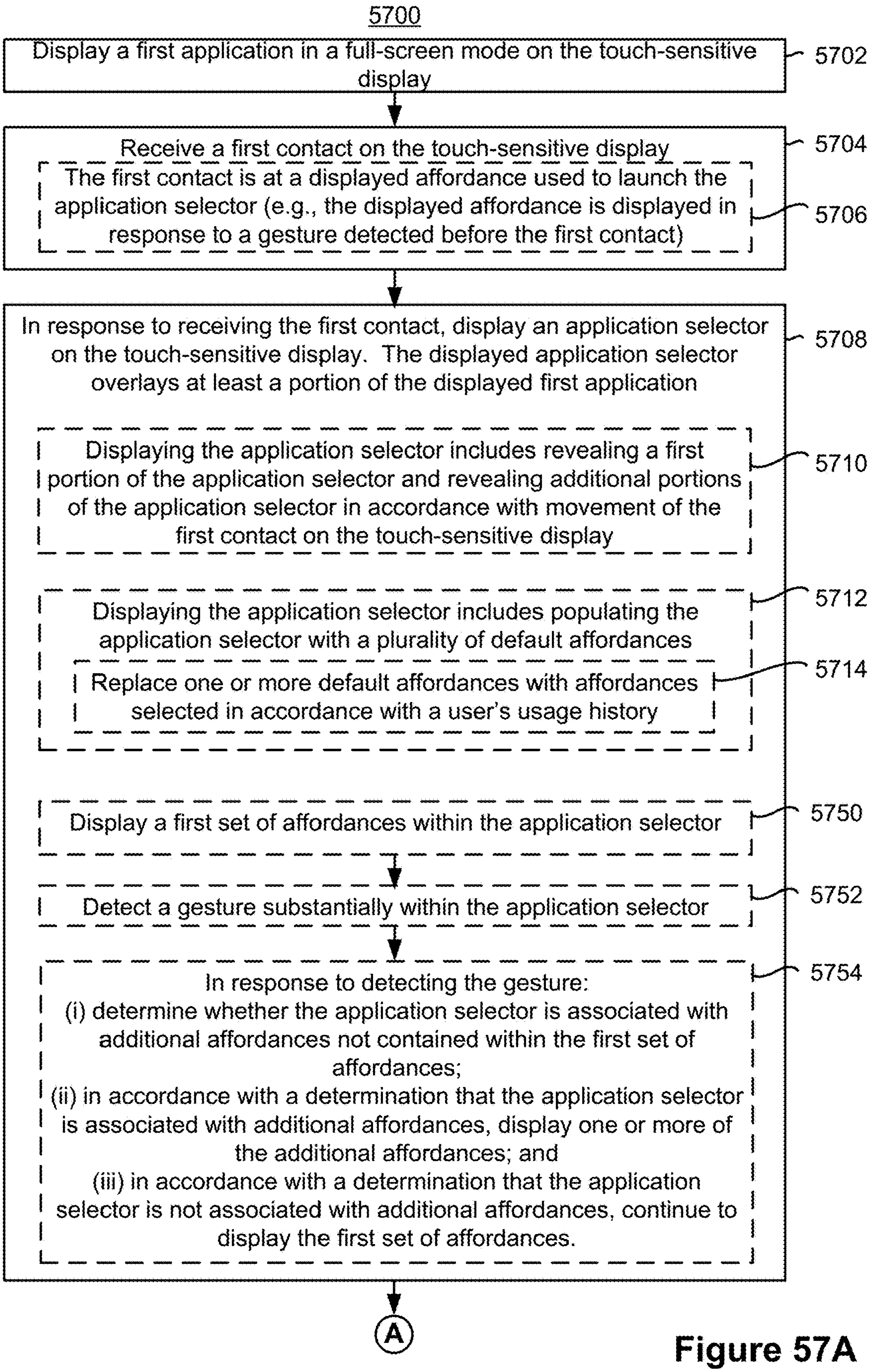
FIGS. 57A-57C are flowcharts depicting a method of activating and interacting with an application selector, in accordance with some embodiments.
Figure 57B:
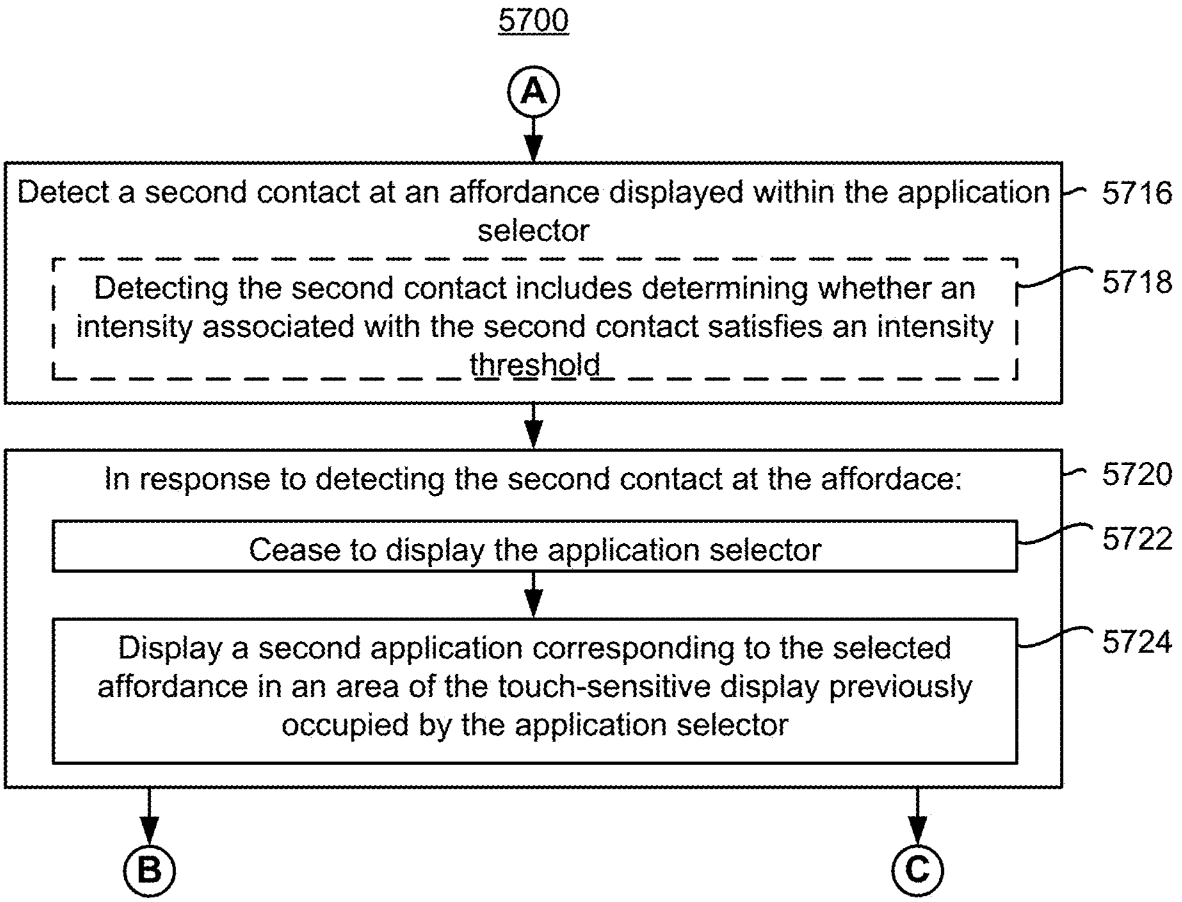
Figure 57C:
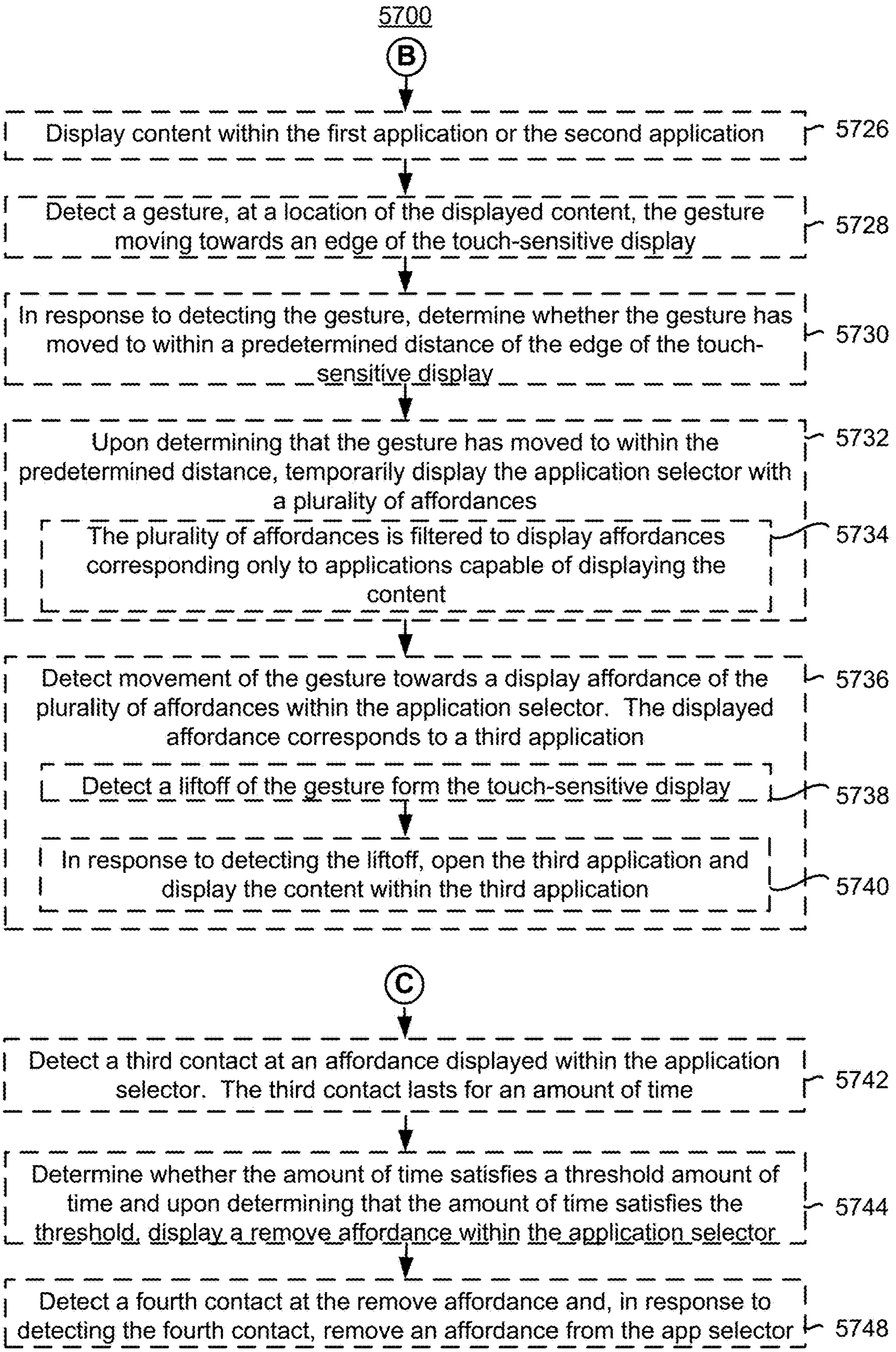
Figure 58:
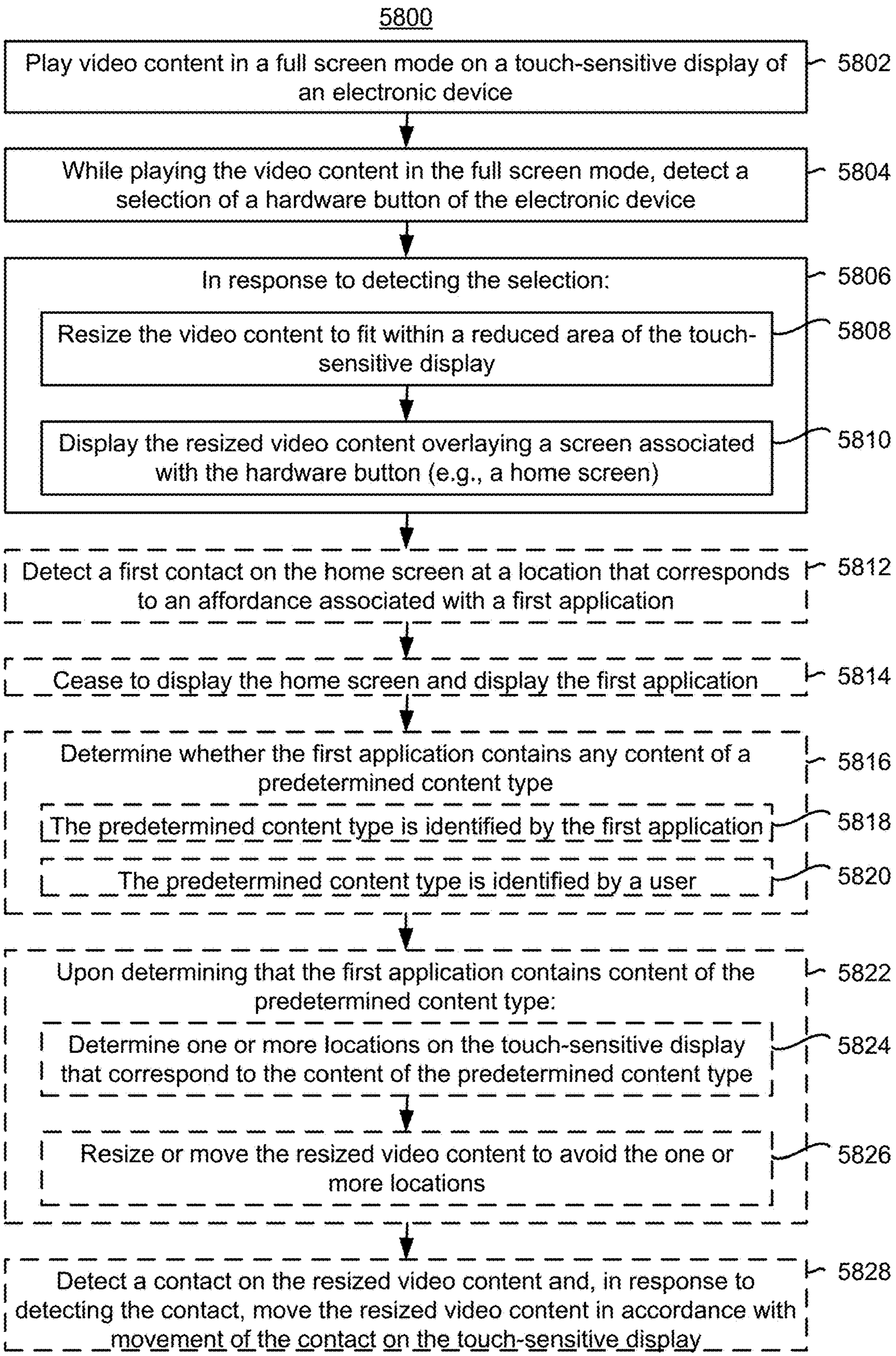
FIGS. 58 and 59A-59B are flowcharts depicting methods of activating and interacting with full-screen and reduced size (e.g. picture-in-picture) video content, in accordance with some embodiments.
Figure 59A:
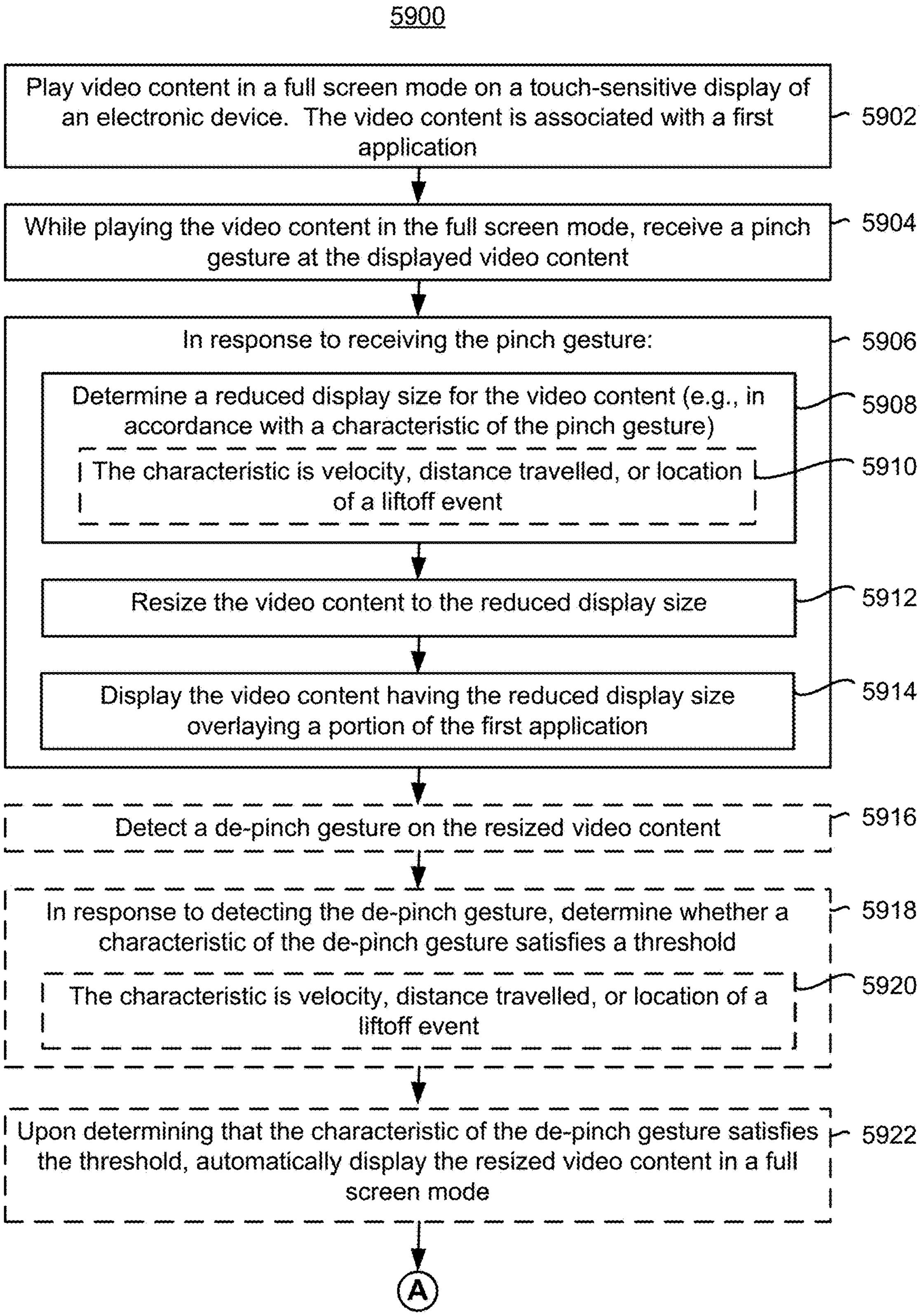
Figure 59B:
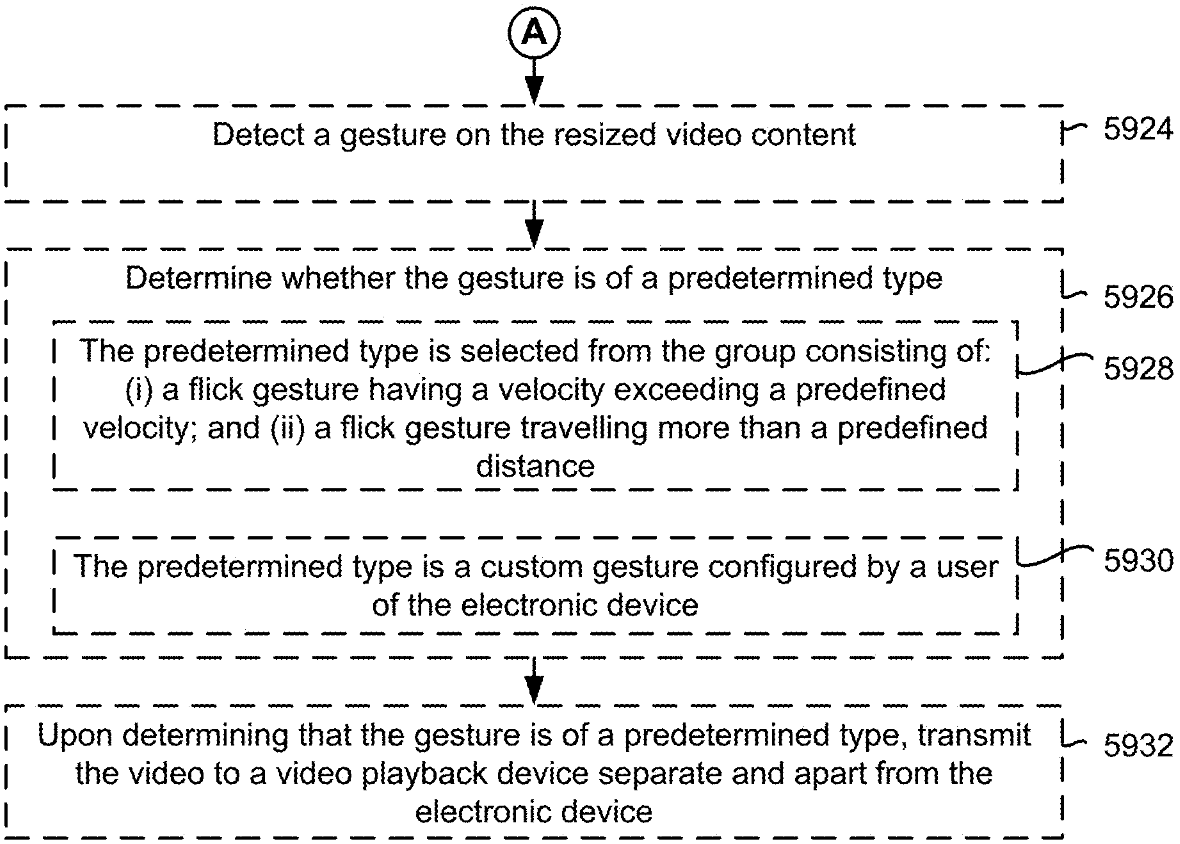

Additionally, FIGS. 33A-36D and 38A-39D are schematics of a touch-sensitive display used to illustrate example user interfaces and gestures for interacting with an application selector. FIGS. 37A-37G and 40A-41E are schematics of a touch-sensitive display used to illustrate other user interfaces and gestures for interacting with a shared screen mode. FIGS. 42A-42E are schematics of a touch-sensitive display used to illustrate example user interfaces and gestures for dragging content between applications while in a shared screen view. FIGS. 43A-45C are schematics of a touch-sensitive display used to illustrate stateful behavior of a side application. FIGS. 46A-47C are schematics of a touch-sensitive display used to illustrate example user interfaces and gestures for interacting with a notification while in a shared screen mode. FIGS. 48A-52D are schematics of a touch-sensitive display used to illustrate example user interfaces and gestures related to a picture-in-picture display mode. FIGS. 53A-53E are schematics of a touch-sensitive display used to illustrate example user interfaces and gestures for navigating between a previous and a next application. FIGS. 54A-54D, 55, and 56 are flowcharts depicting methods 5400, 5500, and 5600, respectively, of activating and interacting with a shared screen mode. FIGS. 37A-37G, 40A-41E, 42A-42E, 43A-45C, 46A-47C, and 53A-53E are used to illustrate the methods and/or processes in FIGS. 54A-54D, 55, and 56. FIGS. 57A-57C are flowcharts depicting a method 5700 of activating and interacting with an application selector. FIGS. 33A-36D and 38A-39D are used to illustrate the methods and/or processes in FIGS. 57A-57C. FIGS. 58 and 59A-59B are flowcharts depicting methods 5800 and 5900, respectively, of activating and interacting with full-screen and picture-in-picture video content. FIGS. 48A-52D are used to illustrate the methods and/or processes in FIGS. 58 and 59A-59B. FIGS. 36E-36H are used to illustrate the methods and/or processes in FIGS. 60A-60B. FIGS. 37H-37M are used to illustrate the methods and/or processes in FIGS. 61A-61B. FIGS. 53H-53L are used to illustrate the methods and/or processes in FIGS. 62A-62C. FIGS. 63-71 are functional block diagrams of an electronic device.

DETAILED DESCRIPTION

Exemplary Devices

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

The disclosure herein interchangeably refers to detecting a touch input on, at, over, on top of, or substantially within a particular user interface element or a particular portion of a touch-sensitive display. As used herein, a touch input that is detected "at" a particular user interface element could also be detected "on," "over," "on top of," or "substantially within" that same user interface element, depending on the context. In some embodiments and as discussed in more detail below, desired sensitivity levels for detecting touch inputs are configured by a user of an electronic device (e.g., the user could decide (and configure the electronic device to operate) that a touch input should only be detected when the touch input is completely within a user interface element).

Embodiments of electronic devices, user interfaces for such devices, and associated processes for using such devices are described. In some embodiments, the device is a portable communications device, such as a mobile telephone, that also contains other functions, such as PDA and/or music player functions. Exemplary embodiments of portable multifunction devices include, without limitation, the IPHONE®, IPOD TOUCH®, and IPAD® devices from APPLE Inc. of Cupertino, California. Other portable electronic devices, such as laptops or tablet computers with touch-sensitive surfaces (e.g., touch-sensitive displays and/or touch pads), are, optionally, used. It should also be understood that, in some embodiments, the device is not a portable communications device, but is a desktop computer with a touch-sensitive surface (e.g., a touch-sensitive display and/or a touch pad).

In the discussion that follows, an electronic device that includes a display and a touch-sensitive surface is described. It should be understood, however, that the electronic device optionally includes one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a fitness application, a photo management application, a digital camera application, a digital video camera application, a web browsing application, a digital music player application, and/or a digital video player application.

The various applications that are executed on the device optionally use at least one common physical user-interface device, such as the touch-sensitive surface. One or more functions of the touch-sensitive surface as well as corresponding information displayed on the device are, optionally, adjusted and/or varied from one application to the next and/or within a respective application. In this way, a common physical architecture (such as the touch-sensitive surface) of the device optionally supports the variety of applications with user interfaces that are intuitive and transparent to the user.

Figure 1A:
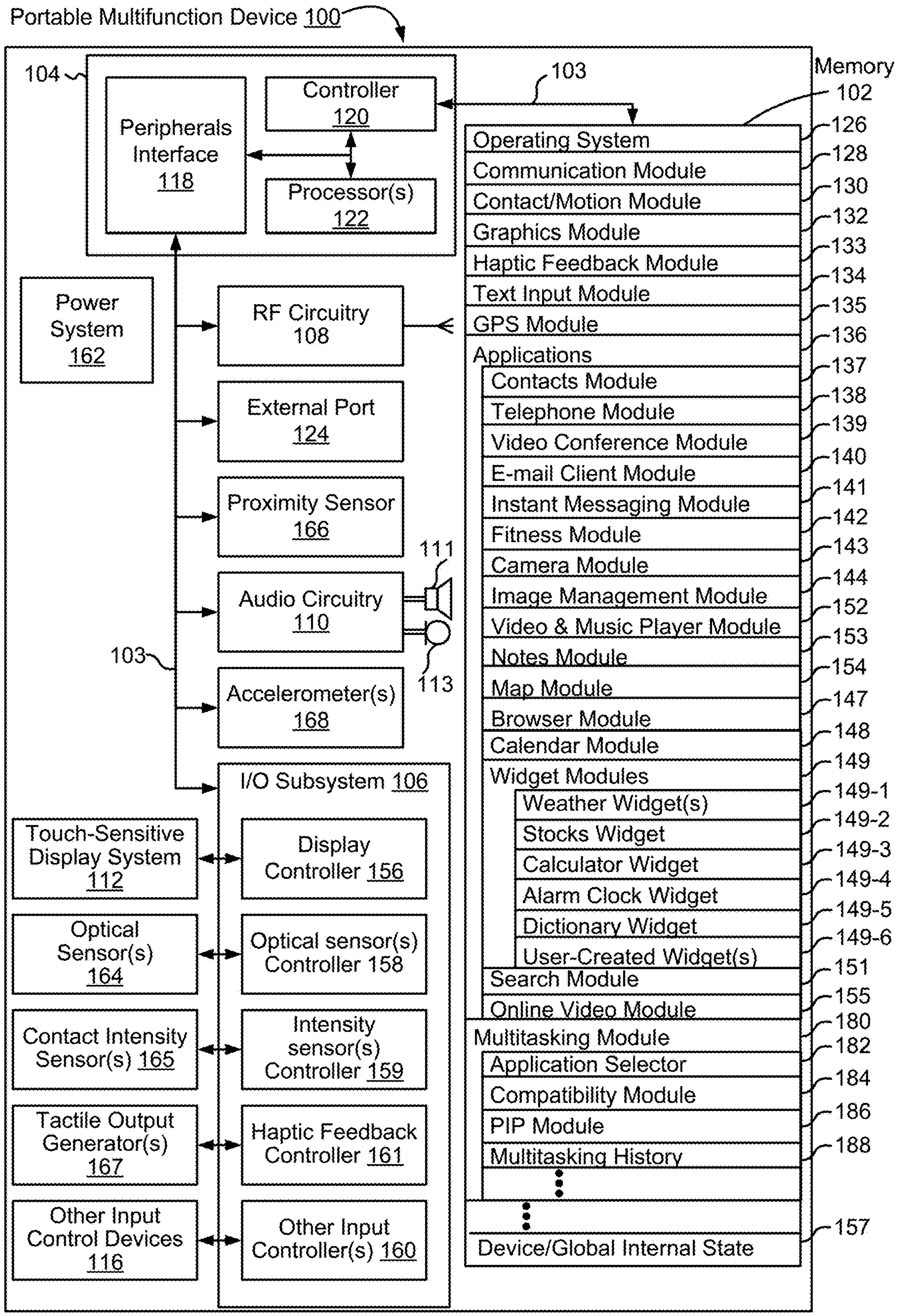
FIG. 1A is a high-level block diagram of a computing device with a touch-sensitive display, in accordance with some embodiments.

Attention is now directed toward embodiments of portable electronic devices with touch-sensitive displays. FIG. 1A is a block diagram illustrating portable multifunction device 100 (also referred to interchangeably herein as electronic device 100 or device 100) with touch-sensitive display 112 in accordance with some embodiments. Touch-sensitive display 112 is sometimes called a "touch screen" for convenience, and is sometimes known as or called a touch-sensitive display system. Device 100 includes memory 102 (which optionally includes one or more computer-readable storage mediums), controller 120, one or more processing units (CPU's) 122, peripherals interface 118, RF circuitry 108, audio circuitry 110, speaker 111, microphone 113, input/output (I/O) subsystem 106, other input or control devices 116, and external port 124. Device 100 optionally includes one or more optical sensors 164. Device 100 optionally includes one or more intensity sensors 165 for detecting intensity of contacts on device 100 (e.g., a touch-sensitive surface such as touch-sensitive display system 112 of device 100). Device 100 optionally includes one or more tactile output generators 167 for generating tactile outputs on device 100 (e.g., generating tactile outputs on a touch-sensitive surface such as touch-sensitive display system 112 of device 100 or a touchpad of device 100). These components optionally communicate over one or more communication buses or signal lines 103.

As used in the specification and claims, the term "intensity" of a contact on a touch-sensitive surface refers to the force or pressure (force per unit area) of a contact (e.g., a finger contact) on the touch sensitive surface, or to a substitute (proxy) for the force or pressure of a contact on the touch sensitive surface. The intensity of a contact has a range of values that includes at least four distinct values and more typically includes hundreds of distinct values (e.g., at least 256). Intensity of a contact is, optionally, determined (or measured) using various approaches and various sensors or combinations of sensors. For example, one or more force sensors underneath or adjacent to the touch-sensitive surface are, optionally, used to measure force at various points on the touch-sensitive surface. In some implementations, force measurements from multiple force sensors are combined (e.g., a weighted average) to determine an estimated force of a contact. Similarly, a pressure-sensitive tip of a stylus is, optionally, used to determine a pressure of the stylus on the touch-sensitive surface. Alternatively, the size of the contact area detected on the touch-sensitive surface and/or changes thereto, the capacitance of the touch-sensitive surface proximate to the contact and/or changes thereto, and/or the resistance of the touch-sensitive surface proximate to the contact and/or changes thereto are, optionally, used as a substitute for the force or pressure of the contact on the touch-sensitive surface. In some implementations, the substitute measurements for contact force or pressure are used directly to determine whether an intensity threshold has been exceeded (e.g., the intensity threshold is described in units corresponding to the substitute measurements). In some implementations, the substitute measurements for contact force or pressure are converted to an estimated force or pressure and the estimated force or pressure is used to determine whether an intensity threshold has been exceeded (e.g., the intensity threshold is a pressure threshold measured in units of pressure).

As used in the specification and claims, the term "tactile output" refers to physical displacement of a device relative to a previous position of the device, physical displacement of a component (e.g., a touch-sensitive surface) of a device relative to another component (e.g., housing) of the device, or displacement of the component relative to a center of mass of the device that will be detected by a user with the user's sense of touch. For example, in situations where the device or the component of the device is in contact with a surface of a user that is sensitive to touch (e.g., a finger, palm, or other part of a user's hand), the tactile output generated by the physical displacement will be interpreted by the user as a tactile sensation corresponding to a perceived change in physical characteristics of the device or the component of the device. For example, movement of a touch-sensitive surface (e.g., a touch-sensitive display or trackpad) is, optionally, interpreted by the user as a "down click" or "up click" of a physical actuator button. In some cases, a user will feel a tactile sensation such as a "down click" or "up click" even when there is no movement of a physical actuator button associated with the touch-sensitive surface that is physically pressed (e.g., displaced) by the user's movements. As another example, movement of the touch-sensitive surface is, optionally, interpreted or sensed by the user as "roughness" of the touch-sensitive surface, even when there is no change in smoothness of the touch-sensitive surface. While such interpretations of touch by a user will be subject to the individualized sensory perceptions of the user, there are many sensory perceptions of touch that are common to a large majority of users. Thus, when a tactile output is described as corresponding to a particular sensory perception of a user (e.g., an "up click," a "down click," "roughness"), unless otherwise stated, the generated tactile output corresponds to physical displacement of the device or a component thereof that will generate the described sensory perception for a typical (or average) user.

It should be appreciated that device 100 is only one example of a portable multifunction device, and that device 100 optionally has more or fewer components than shown, optionally combines two or more components, or optionally has a different configuration or arrangement of the components. The various components shown in FIG. 1A are implemented in hardware, software, or a combination of both hardware and software, including one or more signal processing and/or application specific integrated circuits.

Memory 102 optionally includes high-speed random access memory (e.g., DRAM, SRAM, DDR RAM or other random access solid state memory devices) and optionally also includes non-volatile memory, such as one or more magnetic disk storage devices, flash memory devices, or other non-volatile solid-state memory devices. Memory 102 optionally includes one or more storage devices remotely located from processor(s) 122. Access to memory 102 by other components of device 100, such as CPU 122 and the peripherals interface 118, is, optionally, controlled by controller 120.

Peripherals interface 118 can be used to couple input and output peripherals of the device to CPU 122 and memory 102. The one or more processors 122 run or execute various software programs and/or sets of instructions stored in memory 102 to perform various functions for device 100 and to process data.

In some embodiments, peripherals interface 118, CPU 122, and controller 120 are, optionally, implemented on a single chip, such as chip 104. In some other embodiments, they are, optionally, implemented on separate chips.

RF (radio frequency) circuitry 108 receives and sends RF signals, also called electromagnetic signals. RF circuitry 108 converts electrical signals to/from electromagnetic signals and communicates with communications networks and other communications devices via the electromagnetic signals. RF circuitry 108 optionally includes well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 108 optionally communicates with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication optionally uses any of a plurality of communications standards, protocols and technologies, including but not limited to Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), near field communication (NFC), wideband code division multiple access (W-CDMA), code division multiple access (CDMA), time division multiple access (TDMA), Bluetooth, and/or Wireless Fidelity (Wi-Fi) (e.g., IEEE 802.1 1 a, IEEE 802.1 lb, IEEE 802.11 g and/or IEEE 802.1 ln).

Audio circuitry 110, speaker 111, and microphone 113 provide an audio interface between a user and device 100. Audio circuitry 110 receives audio data from peripherals interface 118, converts the audio data to an electrical signal, and transmits the electrical signal to speaker 111. Speaker 111 converts the electrical signal to human-audible sound waves. Audio circuitry 110 also receives electrical signals converted by microphone 113 from sound waves. Audio circuitry 110 converts the electrical signal to audio data and transmits the audio data to peripherals interface 118 for processing. Audio data is, optionally, retrieved from and/or transmitted to memory 102 and/or RF circuitry 108 by peripherals interface 118. In some embodiments, audio circuitry 110 also includes a headset jack. The headset jack provides an interface between audio circuitry 110 and removable audio input/output peripherals, such as output-only headphones or a headset with both output (e.g., a headphone for one or both ears) and input (e.g., a microphone).

I/O subsystem 106 connects input/output peripherals on device 100, such as touch screen 112 and other input control devices 116, to peripherals interface 118. I/O subsystem 106 optionally includes display controller 156, optical sensor controller 158, intensity sensor controller 159, haptic feedback controller 161, and one or more input controllers 160 for other input or control devices. The one or more input controllers 160 receive/send electrical signals from/to other input or control devices 116. The other input control devices 116 optionally include physical buttons (e.g., push buttons, rocker buttons, etc.), dials, slider switches, joysticks, click wheels, and so forth. In some alternate embodiments, input controller(s) 160 are, optionally, coupled to any (or none) of the following: a keyboard, infrared port, USB port, and a pointer device such as a mouse. The one or more buttons optionally include an up/down button for volume control of speaker 111 and/or microphone 113. The one or more buttons optionally include a push button.

Touch-sensitive display 112 provides an input interface and an output interface between the device and a user. Display controller 156 receives and/or sends electrical signals from/to touch screen 112. Touch screen 112 displays visual output to the user. The visual output optionally includes graphics, text, icons, video, and any combination thereof (collectively termed "graphics"). In some embodiments, some or all of the visual output corresponds to user-interface objects.

Touch screen 112 has a touch-sensitive surface, a sensor or a set of sensors that accepts input from the user based on haptic and/or tactile contact. Touch screen 112 and display controller 156 (along with any associated modules and/or sets of instructions in memory 102) detect contact (and any movement or breaking of the contact) on touch screen 112 and convert the detected contact into interaction with user-interface objects (e.g., one or more soft keys, icons, web pages or images) that are displayed on touch screen 112. In an exemplary embodiment, a point of contact between touch screen 112 and the user corresponds to an area under a finger of the user.

Touch screen 112 optionally uses LCD (liquid crystal display) technology, LPD (light emitting polymer display) technology, or LED (light emitting diode) technology, or OLED (organic light emitting diode) technology, although other display technologies are used in other embodiments. Touch screen 112 and display controller 156 optionally detect contact and any movement or breaking thereof using any of a plurality of touch sensing technologies now known or later developed, including but not limited to capacitive, resistive, infrared, and surface acoustic wave technologies, as well as other proximity sensor arrays or other elements for determining one or more points of contact with touch screen 112. In an exemplary embodiment, projected mutual capacitance sensing technology is used, such as that found in the IPHONE®, IPOD TOUCH®, and IPAD® from APPLE Inc. of Cupertino, California.

Touch screen 112 optionally has a video resolution in excess of 400 dpi. In some embodiments, touch screen 112 has a video resolution of at least 600 dpi. In other embodiments, touch screen 112 has a video resolution of at least 1000 dpi. The user optionally makes contact with touch screen 112 using any suitable object or digit, such as a stylus or a finger. In some embodiments, the user interface is designed to work primarily with finger-based contacts and gestures. In some embodiments, the device translates the finger-based input into a precise pointer/cursor position or command for performing the actions desired by the user.

In some embodiments, in addition to the touch screen, device 100 optionally includes a touchpad (not shown) for activating or deactivating particular functions. In some embodiments, the touchpad is a touch-sensitive area of the device that, unlike the touch screen, does not display visual output. The touchpad is, optionally, a touch-sensitive surface that is separate from touch screen 112 or an extension of the touch-sensitive surface formed by the touch screen.

Device 100 also includes power system 162 for powering the various components. Power system 162 optionally includes a power management system, one or more power sources (e.g., battery, alternating current (AC)), a recharging system, a power failure detection circuit, a power converter or inverter, a power status indicator (e.g., a light-emitting diode (LED)), and any other components associated with the generation, management and distribution of power in portable devices.

Device 100 optionally also includes one or more optical sensors 164. FIG. 1A shows an optical sensor coupled to optical sensor controller 158 in I/O subsystem 106. Optical sensor 164 optionally includes charge-coupled device (CCD) or complementary metal-oxide semiconductor (CMOS) phototransistors. Optical sensor 164 receives light from the environment, projected through one or more lenses, and converts the light to data representing an image. In conjunction with imaging module 143 (also called a camera module), optical sensor 164 optionally captures still images or video. In some embodiments, an optical sensor is located on the back of device 100, opposite touch screen 112 on the front of the device, so that the touch-sensitive display is enabled for use as a viewfinder for still and/or video image acquisition. In some embodiments, another optical sensor is located on the front of the device so that the user's image is, optionally, obtained for videoconferencing while the user views the other video conference participants on the touch-sensitive display.

Device 100 optionally also includes one or more contact intensity sensors 165. FIG. 1A shows a contact intensity sensor coupled to intensity sensor controller 159 in I/O subsystem 106. Contact intensity sensor 165 optionally includes one or more piezoresistive strain gauges, capacitive force sensors, electric force sensors, piezoelectric force sensors, optical force sensors, capacitive touch-sensitive surfaces, or other intensity sensors (e.g., sensors used to measure the force (or pressure) of a contact on a touch-sensitive surface). Contact intensity sensor 165 receives contact intensity information (e.g., pressure information or a proxy for pressure information) from the environment. In some embodiments, at least one contact intensity sensor is collocated with, or proximate to, a touch-sensitive surface (e.g., touch-sensitive display system 112). In some embodiments, at least one contact intensity sensor is located on the back of device 100, opposite touch screen 112 which is located on the front of device 100.

Device 100 optionally also includes one or more proximity sensors 166. FIG. 1A shows proximity sensor 166 coupled to peripherals interface 118. Alternately, proximity sensor 166 is coupled to input controller 160 in I/O subsystem 106. In some embodiments, the proximity sensor turns off and disables touch screen 112 when the multifunction device is placed near the user's ear (e.g., when the user is making a phone call).

Device 100 optionally also includes one or more tactile output generators 167. FIG. 1A shows a tactile output generator coupled to haptic feedback controller 161 in I/O subsystem 106. Tactile output generator 167 optionally includes one or more electroacoustic devices such as speakers or other audio components and/or electromechanical devices that convert energy into linear motion such as a motor, solenoid, electroactive polymer, piezoelectric actuator, electrostatic actuator, or other tactile output generating component (e.g., a component that converts electrical signals into tactile outputs on the device). Contact intensity sensor 165 receives tactile feedback generation instructions from haptic feedback module 133 and generates tactile outputs on device 100 that are capable of being sensed by a user of device 100. In some embodiments, at least one tactile output generator is collocated with, or proximate to, a touch-sensitive surface (e.g., touch-sensitive display system 112) and, optionally, generates a tactile output by moving the touch-sensitive surface vertically (e.g., in/out of a surface of device 100) or laterally (e.g., back and forth in the same plane as a surface of device 100). In some embodiments, at least one tactile output generator sensor is located on the back of device 100, opposite touch-sensitive display 112 which is located on the front of device 100.

Device 100 optionally also includes one or more accelerometers 168. FIG. 1A shows accelerometer 168 coupled to peripherals interface 118. Alternately, accelerometer 168 is, optionally, coupled to an input controller 160 in I/O subsystem 106. In some embodiments, information is displayed on the touch-sensitive display in a portrait view or a landscape view based on an analysis of data received from the one or more accelerometers. Device 100 optionally includes, in addition to accelerometer(s) 168, a magnetometer (not shown) and a GPS (or GLONASS or other global navigation system) receiver (not shown) for obtaining information concerning the location and orientation (e.g., portrait or landscape) of device 100.

In some embodiments, the software components stored in memory 102 include operating system 126, communication module (or set of instructions) 128, contact/motion module (or set of instructions) 130, graphics module (or set of instructions) 132, text input module (or set of instructions) 134, Global Positioning System (GPS) module (or set of instructions) 135, and applications (or sets of instructions) 136. Furthermore, in some embodiments memory 102 stores device/global internal state 157, as shown in FIG. 1A. Device/global internal state 157 includes one or more of: active application state, indicating which applications, if any, are currently active; display state, indicating what applications, views or other information occupy various regions of touch-sensitive display 112; sensor state, including information obtained from the device's various sensors and input control devices 116; and location information concerning the device's location and/or attitude (i.e., orientation of the device). In some embodiments, device/global internal state 157 communicates with multitasking module 180 to keep track of applications activated in a multitasking mode (also referred to as a shared screen view, shared screen mode, or multitask mode). In this way, if device 100 is rotated from portrait to landscape display mode, multitasking module 180 is able to retrieve multitasking state information (e.g., display areas for each application in the multitasking mode) from device/global internal state 157, in order to reactivate the multitasking mode after switching from portrait to landscape. Additional embodiments of stateful application behavior in multitasking mode are discussed in reference to FIGS. 43A-45C below.

Operating system 126 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 128 facilitates communication with other devices over one or more external ports 124 and also includes various software components for handling data received by RF circuitry 108 and/or external port 124. External port 124 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector that is the same as, or similar to and/or compatible with the 30-pin connector used on some embodiments of IPOD devices from APPLE Inc. In other embodiments, the external port is a multi-pin (e.g., 8-pin) connector that is the same as, or similar to and/or compatible with the 8-pin connector used in LIGHTNING connectors from APPLE Inc.

Contact/motion module 130 optionally detects contact with touch screen 112 (in conjunction with display controller 156) and other touch sensitive devices (e.g., a touchpad or physical click wheel). Contact/motion module 130 includes various software components for performing various operations related to detection of contact, such as determining if contact has occurred (e.g., detecting a finger-down event), determining an intensity of the contact (e.g., the force or pressure of the contact or a substitute for the force or pressure of the contact), determining if there is movement of the contact and tracking the movement across the touch-sensitive surface (e.g., detecting one or more finger-dragging events), and determining if the contact has ceased (e.g., detecting a finger-up event or a break in contact). Contact/motion module 130 receives contact data from the touch-sensitive surface. Determining movement of the point of contact, which is represented by a series of contact data, optionally includes determining speed (magnitude), velocity (magnitude and direction), and/or an acceleration (a change in magnitude and/or direction) of the point of contact. These operations are, optionally, applied to single contacts (e.g., one finger contacts) or to multiple simultaneous contacts (e.g., "multitouch"/multiple finger contacts). In some embodiments, contact/motion module 130 and display controller 156 detect contact on a touchpad.

In some embodiments, contact/motion module 130 uses a set of one or more intensity thresholds to determine whether an operation has been performed by a user (e.g., to determine whether a user has selected or "clicked" on an affordance). In some embodiments at least a subset of the intensity thresholds are determined in accordance with software parameters (e.g., the intensity thresholds are not determined by the activation thresholds of particular physical actuators and can be adjusted without changing the physical hardware of device 100). For example, a mouse "click" threshold of a trackpad or touch-sensitive display can be set to any of a large range of predefined thresholds values without changing the trackpad or touch-sensitive display hardware. Additionally, in some implementations a user of the device is provided with software settings for adjusting one or more of the set of intensity thresholds (e.g., by adjusting individual intensity thresholds and/or by adjusting a plurality of intensity thresholds at once with a system-level click "intensity" parameter).

Contact/motion module 130 optionally detects a gesture input by a user. Different gestures on the touch-sensitive surface have different contact patterns (e.g., different motions, timings, and/or intensities of detected contacts). Thus, a gesture is, optionally, detected by detecting a particular contact pattern. For example, detecting a finger tap gesture includes detecting a finger-down event followed by detecting a finger-up (liftoff) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and, in some embodiments, subsequently followed by detecting a finger-up (liftoff) event.

Graphics module 132 includes various known software components for rendering and displaying graphics on touch screen 112 or other display, including components for changing the visual impact (e.g., brightness, transparency, saturation, contrast, or other visual property) of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 132 stores data representing graphics to be used. Each graphic is, optionally, assigned a corresponding code. Graphics module 132 receives, from applications etc., one or more codes specifying graphics to be displayed along with, if necessary, coordinating data and other graphic property data, and then generates screen image data to output to display controller 156. In some embodiments, graphics module 132 retrieves graphics stored with multitasking data 176 of each application 136 (FIG. 1). In some embodiments, multitasking data 176 stores multiple graphics of different sizes, so that an application is capable of quickly resizing while in a shared screen mode (resizing applications is discussed in more detail below with reference to FIGS. 6A-6J, 37A-37G, and 40A-40D).

Haptic feedback module 133 includes various software components for generating instructions used by tactile output generator(s) 167 to produce tactile outputs at one or more locations on device 100 in response to user interactions with device 100.

Text input module 134, which is, optionally, a component of graphics module 132, provides soft keyboards for entering text in various applications (e.g., contacts module 137, e-mail client module 140, IM module 141, browser module 147, and any other application that needs text input).

GPS module 135 determines the location of the device and provides this information for use in various applications (e.g., to telephone module 138 for use in location-based dialing, to camera module 143 as picture/video metadata, and to applications that provide location-based services such as weather widgets, local yellow page widgets, and map/navigation widgets).

Applications ("apps") 136 optionally include the following modules (or sets of instructions), or a subset or superset thereof:

- contacts module 137 (sometimes called an address book or contact list);
- telephone module 138;
- video conferencing module 139;
- e-mail client module 140;
- instant messaging (IM) module 141;
- fitness module 142;
- camera module 143 for still and/or video images;
- image management module 144;
- browser module 147;
- calendar module 148;
- widget modules 149, which optionally include one or more of: weather widget 149-1, stocks widget 149-2, calculator widget 149-3, alarm clock widget 149-4, dictionary widget 149-5, and other widgets obtained by the user, as well as user-created widgets 149-6;
- search module 151;
- video and music player module 152, which is, optionally, made up of a video player module and a music player module;
- notes module 153;
- map module 154; and/or
- online video module 155.

Examples of other applications 136 that are, optionally, stored in memory 102 include other word processing applications, other image editing applications, drawing applications, presentation applications, website creation applications, disk authoring applications, spreadsheet applications, JAVA-enabled applications, encryption, digital rights management, voice recognition, widget creator module for making user-created widgets 149-6, and voice replication.

In conjunction with touch screen 112, display controller 156, contact module 130, graphics module 132, and text input module 134, contacts module 137 is, optionally, used to manage an address book or contact list (e.g., stored in contacts module 137 in memory 102 or memory 370), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone module 138, video conference module 139, e-mail client module 140, or IM module 141; and so forth.

In conjunction with RF circuitry 108, audio circuitry 110, speaker 111, microphone 113, touch screen 112, display controller 156, contact module 130, graphics module 132, and text input module 134, telephone module 138 is, optionally, used to enter a sequence of characters corresponding to a telephone number, access one or more telephone numbers in address book 137, modify a telephone number that has been entered, dial a respective telephone number, conduct a conversation and disconnect or hang up when the conversation is completed. As noted above, the wireless communication optionally uses any of a plurality of communications standards, protocols and technologies.

In conjunction with RF circuitry 108, audio circuitry 110, speaker 111, microphone 113, touch screen 112, display controller 156, optical sensor 164, optical sensor controller 158, contact module 130, graphics module 132, text input module 134, contact list 137, and telephone module 138, videoconferencing module 139 includes executable instructions to initiate, conduct, and terminate a video conference between a user and one or more other participants in accordance with user instructions.

In conjunction with RF circuitry 108, touch screen 112, display controller 156, contact module 130, graphics module 132, and text input module 134, e-mail client module 140 includes executable instructions to create, send, receive, and manage e-mail in response to user instructions. In conjunction with image management module 144, e-mail client module 140 makes it very easy to create and send e-mails with still or video images taken with camera module 143.

In conjunction with RF circuitry 108, touch screen 112, display controller 156, contact module 130, graphics module 132, and text input module 134, the instant messaging module 141 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages optionally include graphics, photos, audio files, video files, and/or other attachments as are supported in an MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 108, touch screen 112, display controller 156, contact module 130, graphics module 132, text input module 134, GPS module 135, map module 154, and video and music player module 146, fitness module 142 includes executable instructions to create workouts (e.g., with time, distance, and/or calorie burning goals), communicate with workout sensors (sports devices such as a watch or a pedometer), receive workout sensor data, calibrate sensors used to monitor a workout, select and play music for a workout, and display, store and transmit workout data.

In conjunction with touch screen 112, display controller 156, optical sensor(s) 164, optical sensor controller 158, contact module 130, graphics module 132, and image management module 144, camera module 143 includes executable instructions to capture still images or video (including a video stream) and store them into memory 102, modify characteristics of a still image or video, or delete a still image or video from memory 102.

In conjunction with touch screen 112, display controller 156, contact module 130, graphics module 132, text input module 134, and camera module 143, image management module 144 includes executable instructions to arrange, modify (e.g., edit), or otherwise manipulate, label, delete, present (e.g., in a digital slide show or album), and store still and/or video images.

In conjunction with RF circuitry 108, touch screen 112, display system controller 156, contact module 130, graphics module 132, and text input module 134, browser module 147 includes executable instructions to browse the Internet in accordance with user instructions, including searching, linking to, receiving, and displaying web pages or portions thereof, as well as attachments and other files linked to web pages.

In conjunction with RF circuitry 108, touch screen 112, display system controller 156, contact module 130, graphics module 132, text input module 134, e-mail client module 140, and browser module 147, calendar module 148 includes executable instructions to create, display, modify, and store calendars and data associated with calendars (e.g., calendar entries, to do lists, etc.) in accordance with user instructions.

In conjunction with RF circuitry 108, touch screen 112, display system controller 156, contact module 130, graphics module 132, text input module 134, and browser module 147, widget modules 149 are mini-applications that are, optionally, downloaded and used by a user (e.g., weather widget 149-1, stocks widget 149-2, calculator widget 149-3, alarm clock widget 149-4, and dictionary widget 149-5) or created by the user (e.g., user-created widget 149-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 108, touch screen 112, display system controller 156, contact module 130, graphics module 132, text input module 134, and browser module 147, a widget creator module (not pictured) is, optionally, used by a user to create widgets (e.g., turning a user-specified portion of a web page into a widget).

In conjunction with touch screen 112, display system controller 156, contact module 130, graphics module 132, and text input module 134, search module 151 includes executable instructions to search for text, music, sound, image, video, and/or other files in memory 102 that match one or more search criteria (e.g., one or more user-specified search terms) in accordance with user instructions.

In conjunction with touch screen 112, display system controller 156, contact module 130, graphics module 132, audio circuitry 110, speaker 111, RF circuitry 108, and browser module 147, video and music player module 152 includes executable instructions that allow the user to download and play back recorded music and other sound files stored in one or more file formats, such as MP3 or AAC files, and executable instructions to display, present or otherwise play back videos (e.g., on touch screen 112 or on an external, connected display via external port 124). In some embodiments, device 100 optionally includes the functionality of an MP3 player, such as an IPOD from APPLE Inc.

In conjunction with touch screen 112, display controller 156, contact module 130, graphics module 132, and text input module 134, notes module 153 includes executable instructions to create and manage notes, to do lists, and the like in accordance with user instructions.

In conjunction with RF circuitry 108, touch screen 112, display system controller 156, contact module 130, graphics module 132, text input module 134, GPS module 135, and browser module 147, map module 154 is, optionally, used to receive, display, modify, and store maps and data associated with maps (e.g., driving directions; data on stores and other points of interest at or near a particular location; and other location-based data) in accordance with user instructions.

In conjunction with touch screen 112, display system controller 156, contact module 130, graphics module 132, audio circuitry 110, speaker 111, RF circuitry 108, text input module 134, e-mail client module 140, and browser module 147, online video module 155 includes instructions that allow the user to access, browse, receive (e.g., by streaming and/or download), play back (e.g., on the touch screen or on an external, connected display via external port 124), send an e-mail with a link to a particular online video, and otherwise manage online videos in one or more file formats, such as H.264. In some embodiments, instant messaging module 141, rather than e-mail client module 140, is used to send a link to a particular online video.

As pictured in FIG. 1A, portable multifunction device 100 also includes a multitasking module 180 for managing multitasking operations on device 100 (e.g., communicating with graphics module 132 to determine appropriate display areas for concurrently displayed applications). Multitasking module 180 optionally includes the following modules (or sets of instructions), or a subset or superset thereof:

- application selector 182;
- compatibility module 184;
- picture-in-picture (PIP) module 186; and
- multitasking history 188 for storing information about a user's multitasking history (e.g., commonly-used applications in multitasking mode, recent display areas for applications while in the multitasking mode, etc.).

In conjunction with touch screen 112, display controller 156, contact module 130, graphics module 132, and contact intensity sensor(s) 165, application selector includes executable instructions to display affordances corresponding to applications (e.g., one or more of applications 136) and allow users of device 100 to select affordances for use in a multitasking mode (e.g., a mode in which more than one application is displayed and active on touch screen 112 at the same time).

Figure 1B:
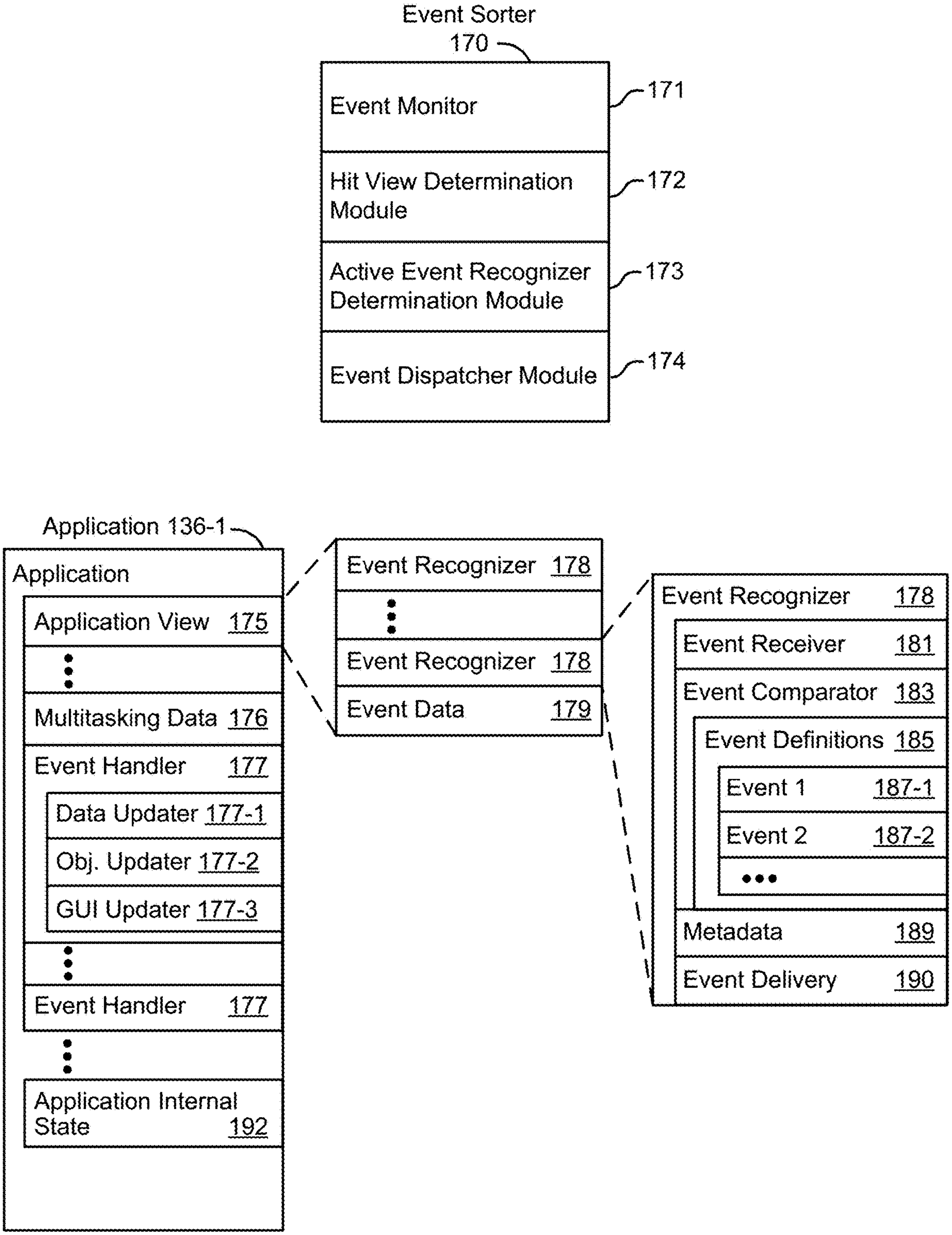
FIG. 1B is a block diagram of exemplary components for event handling, in accordance with some embodiments.

In conjunction with touch screen 112, display controller 156, contact module 130, graphics module 132, and application selector 182, compatibility module 184 includes executable instructions to determine whether a particular application is compatible with a multitasking mode (e.g., by checking a flag, such as a flag stored with multitasking data 176 for each application 136, as pictured in FIG. 1B) and to determine whether video content is compatible with a PIP mode (e.g., a mode in which video content can be displayed with a reduced size overlaying an active application or other background content).

In conjunction with touch screen 112, display controller 156, contact module 130, graphics module 132, and contact intensity sensor(s) 165, PIP module 186 includes executable instructions to determine reduced sizes for video content and to determine an appropriate location on touch screen 112 for displaying the reduced size video content (e.g., a location that avoids important content within an active application that is overlaid by the reduced size video content).

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules are, optionally, combined or otherwise re-arranged in various embodiments. In some embodiments, memory 102 optionally stores a subset of the modules and data structures identified above. Furthermore, memory 102 optionally stores additional modules and data structures not described above.

In some embodiments, device 100 is a device where operation of a predefined set of functions on the device is performed exclusively through a touch screen and/or a touchpad. By using a touch screen and/or a touchpad as the primary input control device for operation of device 100, the number of physical input control devices (such as push buttons, dials, and the like) on device 100 is, optionally, reduced.

The predefined set of functions that are performed exclusively through a touch screen and/or a touchpad optionally include navigation between user interfaces. In some embodiments, the touchpad, when touched by the user, navigates device 100 to a main, home, or root menu from any user interface that is displayed on device 100. In such embodiments, a "menu button" is implemented using a touchpad. In some other embodiments, the menu button is a physical push button or other physical input control device instead of a touchpad.

FIG. 1B is a block diagram illustrating exemplary components for event handling in accordance with some embodiments. In some embodiments, memory 102 (in FIG. 1A) includes event sorter 170 (e.g., in operating system 126) and a respective application 136-1 selected from among the applications 136 of portable multifunction device 100 (FIG. 1A) (e.g., any of the aforementioned applications stored in memory 102 with applications 136).

Event sorter 170 receives event information and determines the application 136-1 and application view 175 of application 136-1 to which to deliver the event information. Event sorter 170 includes event monitor 171 and event dispatcher module 174. In some embodiments, application 136-1 includes application internal state 192, which indicates the current application view(s) displayed on touch sensitive display 112 when the application is active or executing. In some embodiments, device/global internal state 157 is used by event sorter 170 to determine which application(s) is (are) currently active, and application internal state 192 is used by event sorter 170 to determine application views 175 to which to deliver event information.

In some embodiments, application internal state 192 includes additional information, such as one or more of: resume information to be used when application 136-1 resumes execution, user interface state information that indicates information being displayed or that is ready for display by application 136-1, a state queue for enabling the user to go back to a prior state or view of application 136-1, and a redo/undo queue of previous actions taken by the user. In some embodiments, application internal state 192 is used by multitasking module 180 to help facilitate multitasking operations (e.g., multitasking module 180 retrieves resume information from application internal state 192 in order to re-display a previously dismissed side application).

In some embodiments, each application 136-1 stores multitasking data 176. In some embodiments, multitasking data 176 includes a compatibility flag (e.g., a flag accessed by compatibility module 184 to determine whether a particular application is compatible with multitasking mode), a list of compatible sizes for displaying the application 136-1 in the multitasking mode (e.g., ¼, ⅓, ½, or full-screen), and various sizes of graphics (e.g., different graphics for each size within the list of compatible sizes).

Event monitor 171 receives event information from peripherals interface 118. Event information includes information about a sub-event (e.g., a user touch on touch-sensitive display 112, as part of a multi-touch gesture). Peripherals interface 118 transmits information it receives from I/O subsystem 106 or a sensor, such as proximity sensor 166, accelerometer(s) 168, and/or microphone 113 (through audio circuitry 110). Information that peripherals interface 118 receives from I/O subsystem 106 includes information from touch-sensitive display 112 or a touch-sensitive surface.

In some embodiments, event monitor 171 sends requests to the peripherals interface 118 at predetermined intervals. In response, peripherals interface 118 transmits event information. In other embodiments, peripherals interface 118 transmits event information only when there is a significant event (e.g., receiving an input above a predetermined noise threshold and/or for more than a predetermined duration).

In some embodiments, event sorter 170 also includes a hit view determination module 172 and/or an active event recognizer determination module 173.

Hit view determination module 172 provides software procedures for determining where a sub-event has taken place within one or more views, when touch sensitive display 112 displays more than one view. Views are made up of controls and other elements that a user can see on the display.

Another aspect of the user interface associated with an application is a set of views, sometimes herein called application views or user interface windows, in which information is displayed and touch-based gestures occur. The application views (of a respective application) in which a touch is detected optionally correspond to programmatic levels within a programmatic or view hierarchy of the application. For example, the lowest level view in which a touch is detected is, optionally, called the hit view, and the set of events that are recognized as proper inputs are, optionally, determined based, at least in part, on the hit view of the initial touch that begins a touch-based gesture.

Hit view determination module 172 receives information related to sub-events of a touch-based gesture. When an application has multiple views organized in a hierarchy, hit view determination module 172 identifies a hit view as the lowest view in the hierarchy which should handle the sub-event. In most circumstances, the hit view is the lowest level view in which an initiating sub-event occurs (i.e., the first sub-event in the sequence of sub-events that form an event or potential event). Once the hit view is identified by the hit view determination module, the hit view typically receives all sub-events related to the same touch or input source for which it was identified as the hit view.

Active event recognizer determination module 173 determines which view or views within a view hierarchy should receive a particular sequence of sub-events. In some embodiments, active event recognizer determination module 173 determines that only the hit view should receive a particular sequence of sub-events. In other embodiments, active event recognizer determination module 173 determines that all views that include the physical location of a sub-event are actively involved views, and therefore determines that all actively involved views should receive a particular sequence of sub-events. In other embodiments, even if touch sub-events were entirely confined to the area associated with one particular view, views higher in the hierarchy would still remain as actively involved views.

Event dispatcher module 174 dispatches the event information to an event recognizer (e.g., event recognizer 178). In embodiments including active event recognizer determination module 173, event dispatcher module 174 delivers the event information to an event recognizer determined by active event recognizer determination module 173. In some embodiments, event dispatcher module 174 stores in an event queue the event information, which is retrieved by a respective event receiver 181.

In some embodiments, operating system 126 includes event sorter 170. Alternatively, application 136-1 includes event sorter 170. In yet other embodiments, event sorter 170 is a stand-alone module, or a part of another module stored in memory 102, such as contact/motion module 130.

In some embodiments, application 136-1 includes a plurality of event handlers 177 and one or more application views 175, each of which includes instructions for handling touch events that occur within a respective view of the application's user interface. Each application view 175 of the application 136-1 includes one or more event recognizers 180. Typically, a respective application view 175 includes a plurality of event recognizers 180. In other embodiments, one or more of event recognizers 180 are part of a separate module, such as a user interface kit (not shown) or a higher level object from which application 136-1 inherits methods and other properties. In some embodiments, a respective event handler 177 includes one or more of: data updater 177-1, object updater 177-2, GUI updater 177-3, and/or event data 179 received from event sorter 170. Event handler 177 optionally utilizes or calls data updater 177-1, object updater 177-2 or GUI updater 177-3 to update the application internal state 192. Alternatively, one or more of the application views 175 includes one or more respective event handlers 177. Also, in some embodiments, one or more of data updater 177-1, object updater 177-2, and GUI updater 177-3 are included in a respective application view 175.

A respective event recognizer 178 receives event information (e.g., event data 179) from event sorter 170, and identifies an event from the event information. Event recognizer 178 includes event receiver 181 and event comparator 183. In some embodiments, event recognizer 178 also includes at least a subset of: metadata 189, and event delivery instructions 190 (which optionally include sub-event delivery instructions).

Event receiver 181 receives event information from event sorter 170. The event information includes information about a sub-event, for example, a touch or a touch movement. Depending on the sub-event, the event information also includes additional information, such as location of the sub-event. When the sub-event concerns motion of a touch, the event information optionally also includes speed and direction of the sub-event. In some embodiments, events include rotation of the device from one orientation to another (e.g., from portrait to landscape, or vice versa), and the event information includes corresponding information about the current orientation (also called device attitude) of the device.

Event comparator 183 compares the event information to predefined event or sub-event definitions and, based on the comparison, determines an event or sub-event, or determines or updates the state of an event or sub-event. In some embodiments, event comparator 183 includes event definitions 185. Event definitions 185 contain definitions of events (e.g., predefined sequences of sub-events), for example, event 1 (187-1), event 2 (187-2), and others. In some embodiments, sub-events in an event 187 include, for example, touch begin, touch end, touch movement, touch cancellation, and multiple touching. In one example, the definition for event 1 (187-1) is a double tap on a displayed object. The double tap, for example, comprises a first touch (touch begin) on the displayed object for a predetermined phase, a first lift-off (touch end) for a predetermined phase, a second touch (touch begin) on the displayed object for a predetermined phase, and a second lift-off (touch end) for a predetermined phase. In another example, the definition for event 2 (187-2) is a dragging on a displayed object. The dragging, for example, comprises a touch (or contact) on the displayed object for a predetermined phase, a movement of the touch across touch-sensitive display 112, and lift-off of the touch (touch end). In some embodiments, the event also includes information for one or more associated event handlers 177.

In some embodiments, event definition 185 includes a definition of an event for a respective user-interface object. In some embodiments, event comparator 183 performs a hit test to determine which user-interface object is associated with a sub-event. For example, in an application view in which three user-interface objects are displayed on touch-sensitive display 112, when a touch is detected on touch-sensitive display 112, event comparator 183 performs a hit test to determine which of the three user-interface objects is associated with the touch (sub-event). If each displayed object is associated with a respective event handler 177, the event comparator uses the result of the hit test to determine which event handler 177 should be activated. For example, event comparator 183 selects an event handler associated with the sub-event and the object triggering the hit test.

In some embodiments, the definition for a respective event 187 also includes delayed actions that delay delivery of the event information until after it has been determined whether the sequence of sub-events does or does not correspond to the event recognizer's event type.

When a respective event recognizer 178 determines that the series of sub-events do not match any of the events in event definitions 185, the respective event recognizer 178 enters an event impossible, event failed, or event ended state, after which it disregards subsequent sub-events of the touch-based gesture. In this situation, other event recognizers, if any remain active for the hit view, continue to track and process sub-events of an ongoing touch-based gesture.

In some embodiments, a respective event recognizer 178 includes metadata 189 with configurable properties, flags, and/or lists that indicate how the event delivery system should perform sub-event delivery to actively involved event recognizers. In some embodiments, metadata 189 includes configurable properties, flags, and/or lists that indicate how event recognizers interact, or are enabled to interact, with one another. In some embodiments, metadata 189 includes configurable properties, flags, and/or lists that indicate whether sub-events are delivered to varying levels in the view or programmatic hierarchy.

In some embodiments, a respective event recognizer 178 activates event handler 177 associated with an event when one or more particular sub-events of an event are recognized. In some embodiments, a respective event recognizer 178 delivers event information associated with the event to event handler 177. Activating an event handler 177 is distinct from sending (and deferred sending) sub-events to a respective hit view. In some embodiments, event recognizer 178 throws a flag associated with the recognized event, and event handler 177 associated with the flag catches the flag and performs a predefined process.

In some embodiments, event delivery instructions 190 include sub-event delivery instructions that deliver event information about a sub-event without activating an event handler. Instead, the sub-event delivery instructions deliver event information to event handlers associated with the series of sub-events or to actively involved views. Event handlers associated with the series of sub-events or with actively involved views receive the event information and perform a predetermined process.

In some embodiments, data updater 177-1 creates and updates data used in application 136-1. For example, data updater 177-1 updates the telephone number used in contacts module 137, or stores a video file used in video and music player module 145. In some embodiments, object updater 177-2 creates and updates objects used in application 136-1. For example, object updater 177-2 creates a new user-interface object or updates the position of a user-interface object. GUI updater 177-3 updates the GUI. For example, GUI updater 177-3 prepares display information and sends it to graphics module 132 for display on a touch-sensitive display. In some embodiments, GUI updater 177-3 communicates with multitasking module 180 in order to facilitate resizing of various applications displayed in a multitasking mode.

In some embodiments, event handler(s) 177 includes or has access to data updater 177-1, object updater 177-2, and GUI updater 177-3. In some embodiments, data updater 177-1, object updater 177-2, and GUI updater 177-3 are included in a single module of a respective application 136-1 or application view 175. In other embodiments, they are included in two or more software modules.

It shall be understood that the foregoing discussion regarding event handling of user touches on touch-sensitive displays also applies to other forms of user inputs to operate multifunction devices 100 with input-devices, not all of which are initiated on touch screens. For example, mouse movement and mouse button presses, optionally coordinated with single or multiple keyboard presses or holds; contact movements such as taps, drags, scrolls, etc., on touch-pads; pen stylus inputs; movement of the device; oral instructions; detected eye movements; biometric inputs; and/or any combination thereof is optionally utilized as inputs corresponding to sub-events which define an event to be recognized.

Figure 1C:
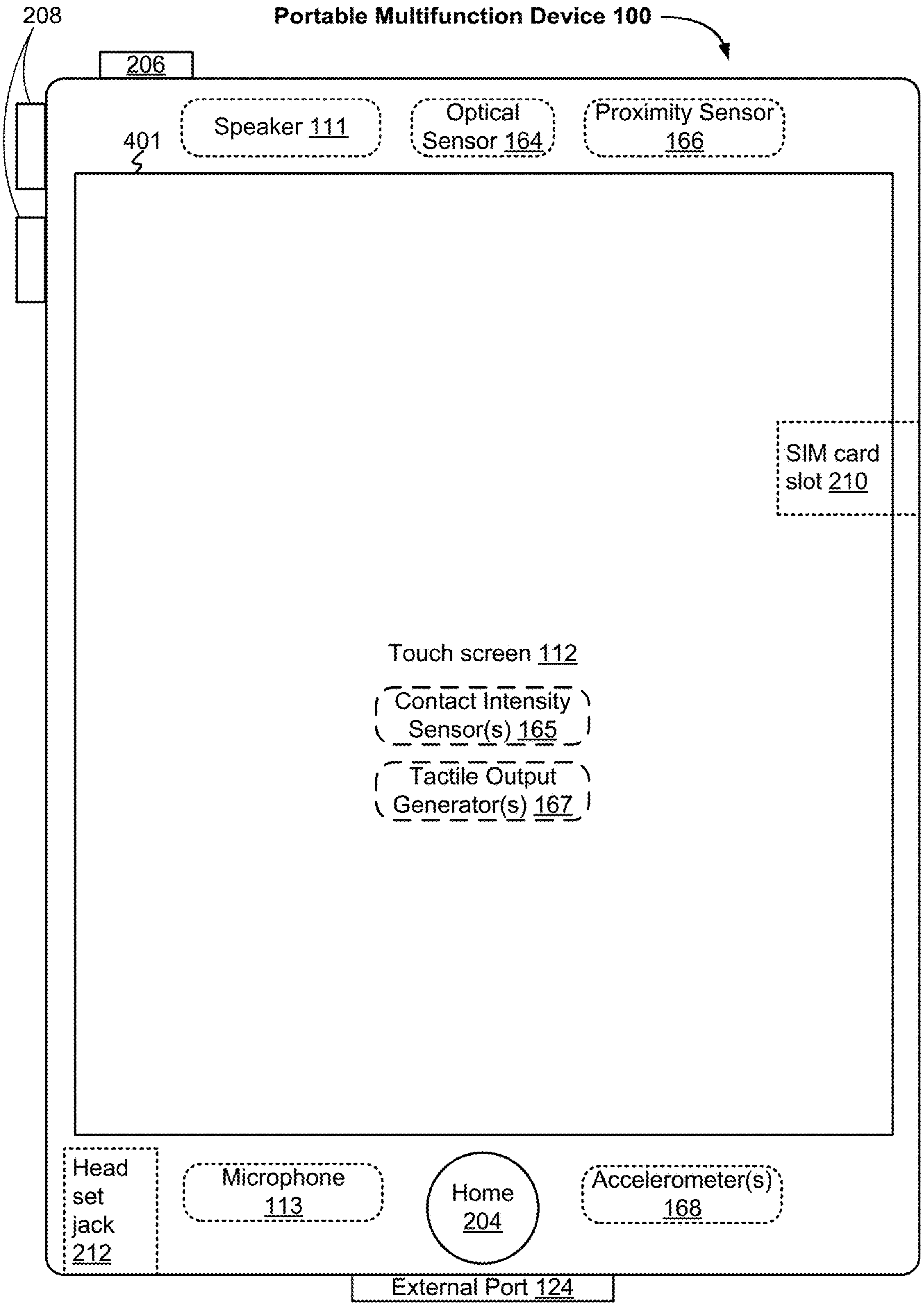
FIG. 1C is a schematic of a portable multifunction device having a touch-sensitive display, in accordance with some embodiments.

FIG. 1C is a schematic of a portable multifunction device (e.g., portable multifunction device 100) having a touch-sensitive display (e.g., touch screen 112) in accordance with some embodiments. The touch-sensitive display optionally displays one or more graphics within user interface (UI) 401. In this embodiment, as well as others described below, a user can select one or more of the graphics by making a gesture on the screen, for example, with one or more fingers or one or more styluses. In some embodiments, selection of one or more graphics occurs when the user breaks contact with the one or more graphics (e.g., by lifting a finger off of the screen). In some embodiments, the gesture optionally includes one or more tap gestures (e.g., a sequence of touches on the screen followed by liftoffs), one or more swipe gestures (continuous contact during the gesture along the surface of the screen, e.g., from left to right, right to left, upward and/or downward), and/or a rolling of a finger (e.g., from right to left, left to right, upward and/or downward) that has made contact with device 100. In some implementations or circumstances, inadvertent contact with a graphic does not select the graphic. For example, a swipe gesture that sweeps over an application affordance (e.g., an icon) optionally does not launch (e.g., open) the corresponding application when the gesture for launching the application is a tap gesture.

Device 100 optionally also includes one or more physical buttons, such as a "home" or menu button 204. As described previously, menu button 204 is, optionally, used to navigate to any application 136 in a set of applications that are, optionally executed on device 100. Alternatively, in some embodiments, the menu button is implemented as a soft key in a GUI displayed on touch screen 112.

In one embodiment, device 100 includes touch screen 112, menu button 204, push button 206 for powering the device on/off and locking the device, volume adjustment button(s) 208, Subscriber Identity Module (SIM) card slot 210, head set jack 212, and docking/charging external port 124. Push button 206 is, optionally, used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 also, optionally, includes one or more contact intensity sensors 165 for detecting intensity of contacts on touch screen 112 and/or one or more tactile output generators 167 for generating tactile outputs for a user of device 100.

Figure 1D:
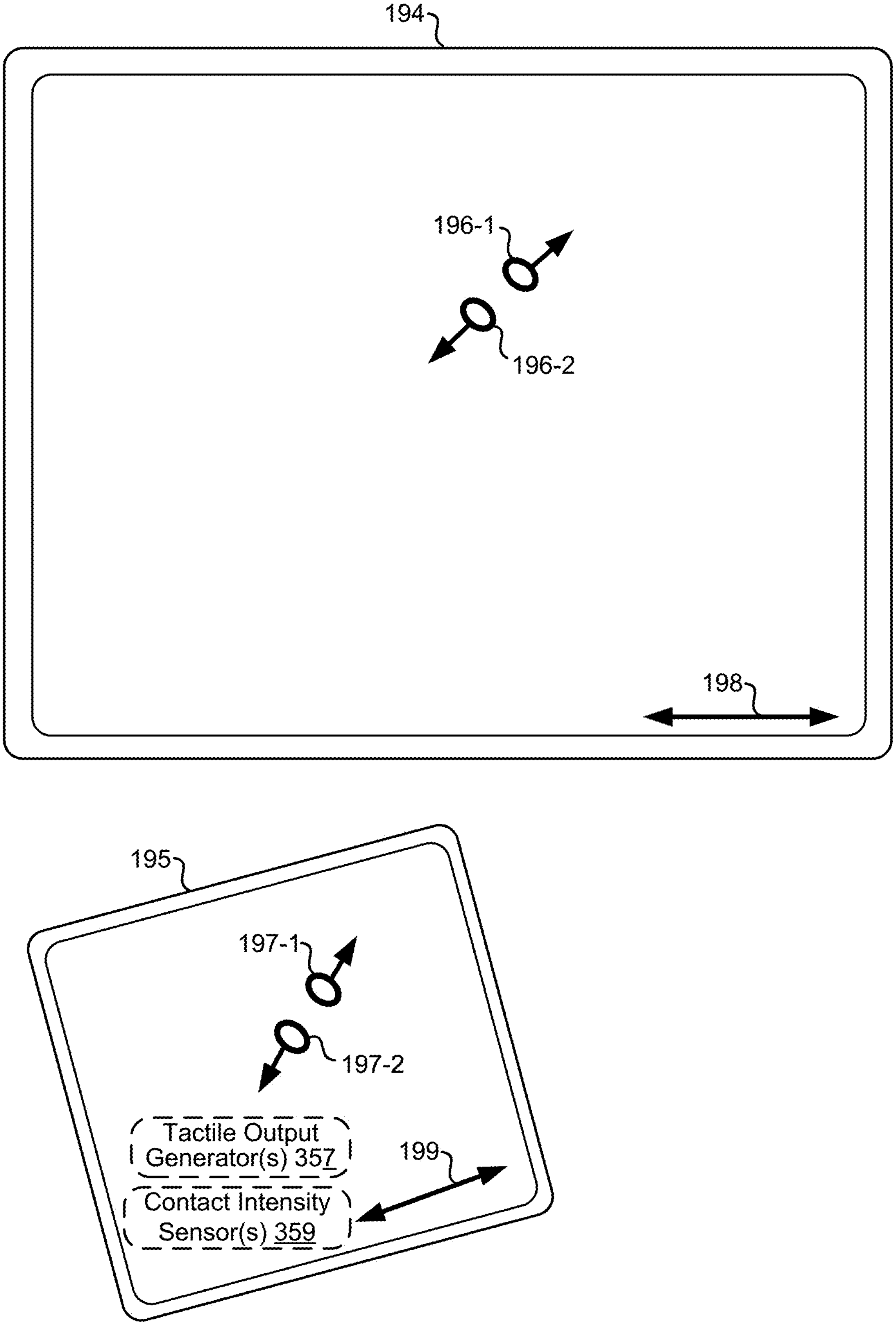
FIG. 1D is a schematic used to illustrate a computing device with a touch-sensitive surface that is separate from the display, in accordance with some embodiments.

FIG. 1D is a schematic used to illustrate a user interface on a device (e.g., device 100, FIG. 1A) with a touch-sensitive surface 195 (e.g., a tablet or touchpad) that is separate from the display 194 (e.g., touch screen 112). In some embodiments, touch-sensitive surface 195 includes one or more contact intensity sensors (e.g., one or more of contact intensity sensor(s) 359) for detecting intensity of contacts on touch-sensitive surface 195 and/or one or more tactile output generator(s) 357 for generating tactile outputs for a user of touch-sensitive surface 195.

Although some of the examples which follow will be given with reference to inputs on touch screen 112 (where the touch sensitive surface and the display are combined), in some embodiments, the device detects inputs on a touch-sensitive surface that is separate from the display, as shown in FIG. 1D. In some embodiments the touch sensitive surface (e.g., 195 in FIG. 1D) has a primary axis (e.g., 199 in FIG. 1D) that corresponds to a primary axis (e.g., 198 in FIG. 1D) on the display (e.g., 194). In accordance with these embodiments, the device detects contacts (e.g., 197-1 and 197-2 in FIG. 1D) with the touch-sensitive surface 195 at locations that correspond to respective locations on the display (e.g., in FIG. 1D, 197-1 corresponds to 196-1 and 197-2 corresponds to 196-2). In this way, user inputs (e.g., contacts 197-1 and 197-2, and movements thereof) detected by the device on the touch-sensitive surface (e.g., 195 in FIG. 1D) are used by the device to manipulate the user interface on the display (e.g., 194 in FIG. 1D) of the multifunction device when the touch-sensitive surface is separate from the display. It should be understood that similar methods are, optionally, used for other user interfaces described herein.

Additionally, while the following examples are given primarily with reference to finger inputs (e.g., finger contacts, finger tap gestures, finger swipe gestures), it should be understood that, in some embodiments, one or more of the finger inputs are replaced with input from another input device (e.g., a mouse based input or stylus input). For example, a swipe gesture is, optionally, replaced with a mouse click (e.g., instead of a contact) followed by movement of the cursor along the path of the swipe (e.g., instead of movement of the contact). As another example, a tap gesture is, optionally, replaced with a mouse click while the cursor is located over the location of the tap gesture (e.g., instead of detection of the contact followed by ceasing to detect the contact). Similarly, when multiple user inputs are simultaneously detected, it should be understood that multiple computer mice are, optionally, used simultaneously, or mouse and finger contacts are, optionally, used simultaneously.

As used herein, the term “focus selector” refers to an input element that indicates a current part of a user interface with which a user is interacting. In some implementations that include a cursor or other location marker, the cursor acts as a “focus selector,” so that when an input (e.g., a press input) is detected on a touch-sensitive surface (e.g., touch-sensitive surface 195 in FIG. 1D (touch-sensitive surface 195, in some embodiments, is a touchpad)) while the cursor is over a particular user interface element (e.g., a button, window, slider or other user interface element), the particular user interface element is adjusted in accordance with the detected input. In some implementations that include a touch-screen display (e.g., touch-sensitive display system 112 in FIG. 1A or touch screen 112) that enables direct interaction with user interface elements on the touch-screen display, a detected contact on the touch-screen acts as a “focus selector,” so that when an input (e.g., a press input by the contact) is detected on the touch-screen display at a location of a particular user interface element (e.g., a button, window, slider or other user interface element), the particular user interface element is adjusted in accordance with the detected input. In some implementations focus is moved from one region of a user interface to another region of the user interface without corresponding movement of a cursor or movement of a contact on a touch-screen display (e.g., by using a tab key or arrow keys to move focus from one button to another button); in these implementations, the focus selector moves in accordance with movement of focus between different regions of the user interface. Without regard to the specific form taken by the focus selector, the focus selector is generally the user interface element (or contact on a touch-screen display) that is controlled by the user so as to communicate the user’s intended interaction with the user interface (e.g., by indicating, to the device, the element of the user interface with which the user is intending to interact). For example, the location of a focus selector (e.g., a cursor, a contact or a selection box) over a respective button while a press input is detected on the touch-sensitive surface (e.g., a touchpad or touch-sensitive display) will indicate that the user is intending to activate the respective button (as opposed to other user interface elements shown on a display of the device).

Exemplary User Interfaces and Associated Processes

Attention is now directed towards embodiments of user interfaces (“UI”) and associated processes that may be implemented on an electronic device with a display and a touch-sensitive surface, such as device 100.

Figure 2:
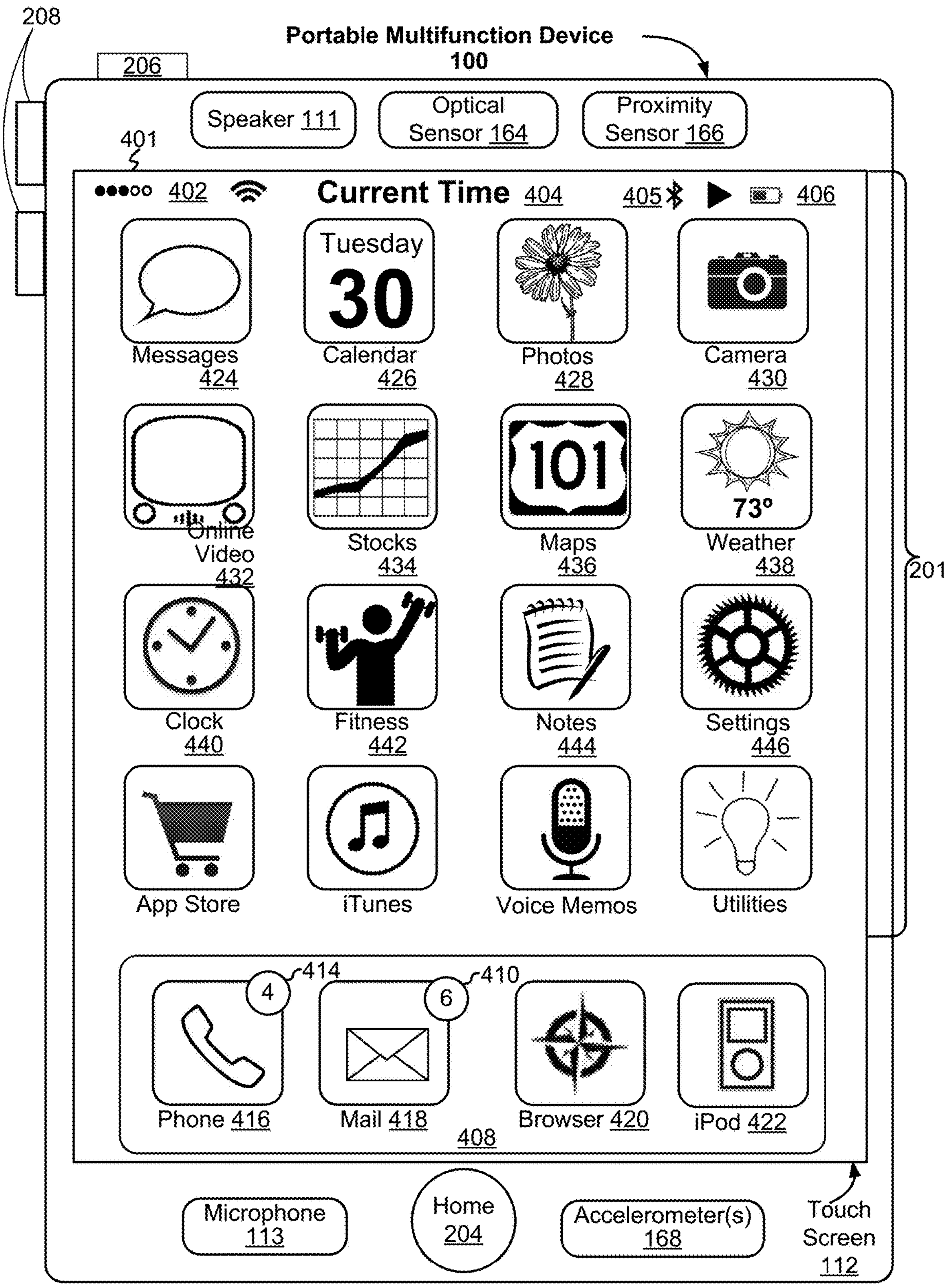
FIG. 2 is a schematic of a touch-sensitive display used to illustrate a user interface for a menu of applications, in accordance with some embodiments.

FIG. 2 is a schematic of a touch-sensitive display used to illustrate a user interface for a menu of applications, in accordance with some embodiments. Similar user interfaces are, optionally, implemented on device 100 (FIG. 1A). In some embodiments, user interface 401 includes the following elements, or a subset or superset thereof:

- Signal strength indicator(s) 402 for wireless communication(s), such as cellular and Wi-Fi signals;
- Time 404;
- Bluetooth indicator 405;
- Battery status indicator 406;
- Tray 408 with icons for frequently used applications, such as:
  - Icon 416 for telephone module 138, labeled “Phone,” which optionally includes an indicator 414 of the number of missed calls or voicemail messages;
  - Icon 418 for e-mail client module 140, labeled “Mail,” which optionally includes an indicator 410 of the number of unread e-mails;
  - Icon 420 for browser module 147, labeled “Browser;” and
  - Icon 422 for video and music player module 152, also referred to as IPOD (trademark of APPLE Inc.) module 152, labeled “iPod;” and
- Icons for other applications, such as:
  - Icon 424 for IM module 141, labeled “Messages;”
  - Icon 426 for calendar module 148, labeled “Calendar;”
  - Icon 428 for image management module 144, labeled “Photos;”
  - Icon 430 for camera module 143, labeled “Camera;”
  - Icon 432 for online video module 155, labeled “Online Video”
  - Icon 434 for stocks widget 149-2, labeled “Stocks;”
  - Icon 436 for map module 154, labeled “Maps;”
  - Icon 438 for weather widget 149-1, labeled “Weather;”
  - Icon 440 for alarm clock widget 149-4, labeled “Clock;”
  - Icon 442 for fitness module 142, labeled “Fitness;”
  - Icon 444 for notes module 153, labeled “Notes;”
  - Icon 446 for a settings application or module, which provides access to settings for device 100 and its various applications; and
  - Other icons for additional applications, such as App Store, iTunes, Voice Memos, and Utilities.

It should be noted that the icon labels illustrated in FIG. 2 are merely exemplary. Other labels are, optionally, used for various application icons. For example, icon 442 for fitness module 142 is alternatively labeled “Fitness Support,” “Workout,” “Workout Support,” “Exercise,” “Exercise Support,” or “Health.” In some embodiments, a label for a respective application icon includes a name of an application corresponding to the respective application icon. In some embodiments, a label for a particular application icon is distinct from a name of an application corresponding to the particular application icon.

In some embodiments, the home screen includes two regions: a tray 408 and an icon region 201. As shown in FIG. 2, the icon region 201 is displayed above the tray 408. However, the icon region 201 and the tray 408 are optionally displayed in positions other than those described herein.

The tray 408 optionally includes icons of the user’s favorite applications on the computing device 100. Initially, the tray 408 may include a set of default icons. The user may customize the tray 408 to include other icons than the default icons. In some embodiments, the user customizes the tray 408 by selecting an icon from the icon region 201 and dragging and dropping the selected icon into the tray 408 to add the icon to the tray 408. To remove an icon from the tray 408, the user selects an icon displayed in the favorites region for a threshold amount of time which causes the computing device 100 to display a control to remove the icon. User selection of the control causes the computing device 100 to remove the icon from the tray 408.

Figure 3:
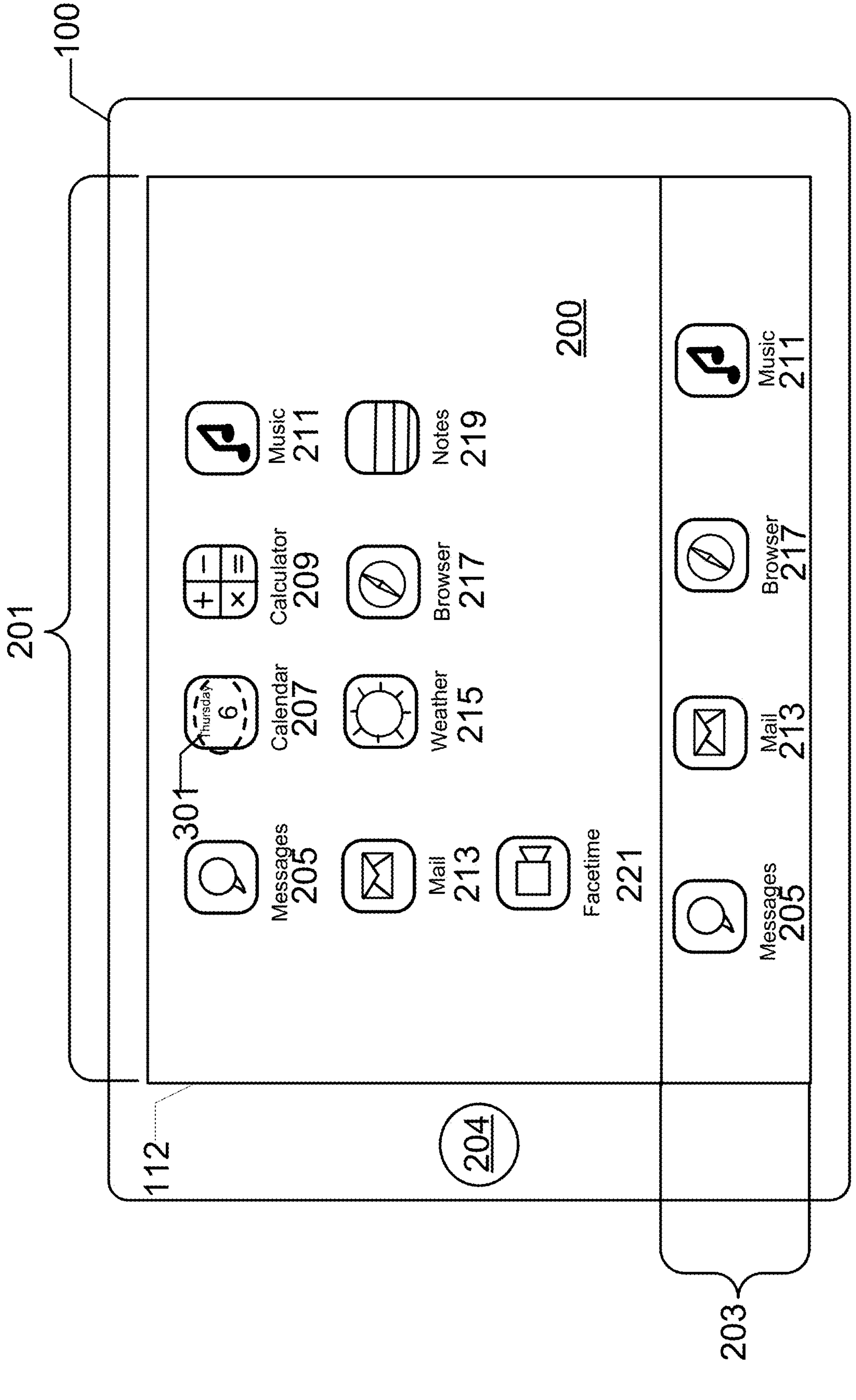
FIG. 3 is a schematic of a touch-sensitive display used to illustrate a landscape view of an icon view (e.g., a home screen) of the portable multifunction device, in accordance with some embodiments.

FIG. 3 is a schematic of a touch-sensitive display used to illustrate the home screen (e.g., icon view 200 and also referred to herein as a springboard or home screen) of the computing device 100 in a landscape view, in accordance with some embodiments. Furthermore, FIG. 3 is a schematic of a touch-sensitive display used to illustrate a gesture to launch an application. The launch gesture (e.g., illustrate by reference numeral 301) is directed towards the calendar icon 207 indicative of a user request to execute the calendar application represented by the calendar icon 207. Although the launch gesture is described with respect to the landscape view of the icon view 200, the launch gesture is optionally received in the portrait view of the icon view 200.

Figure 4:
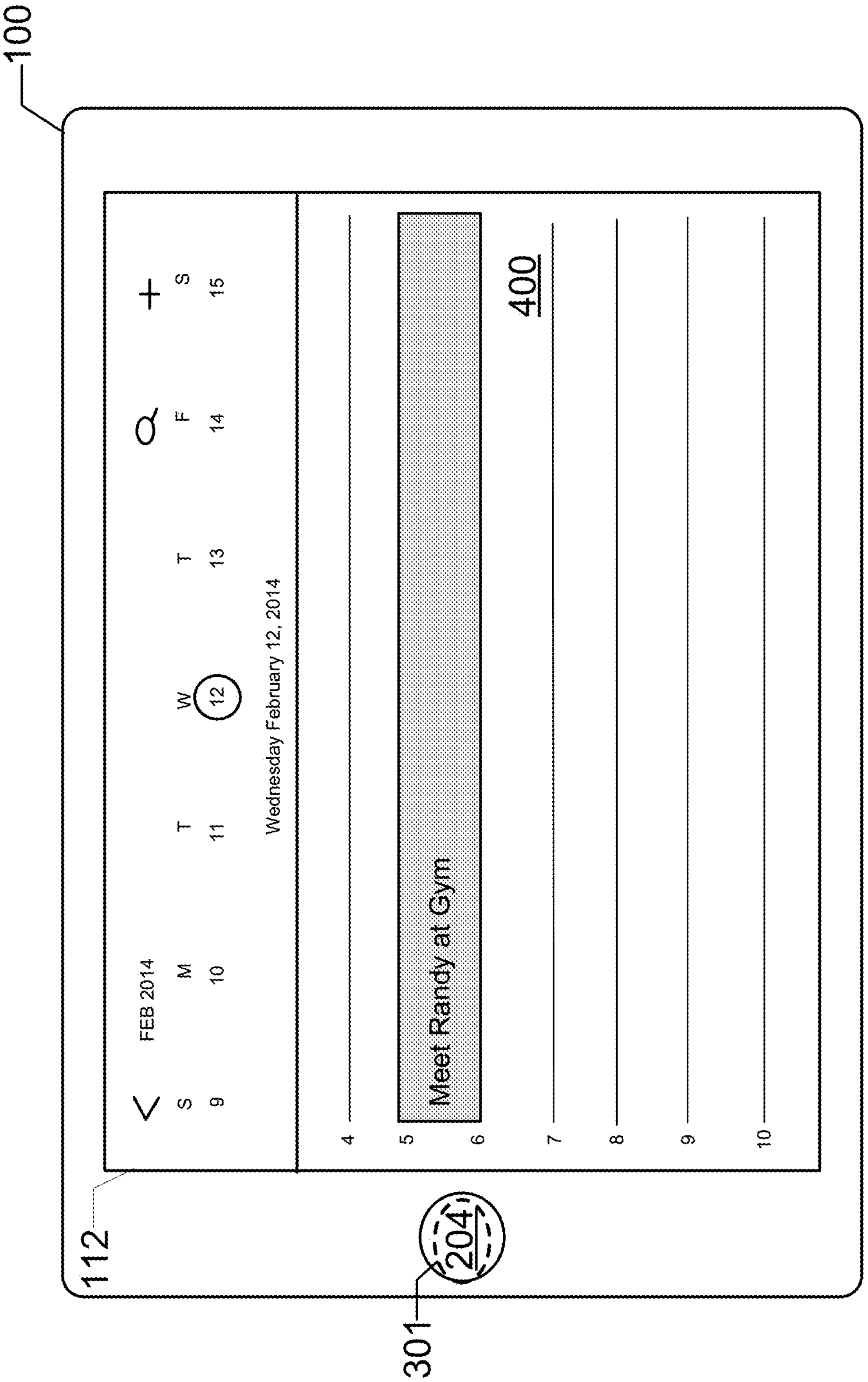
FIG. 4 is a schematic of a touch-sensitive display used to illustrate an application view of a calendar application displayed in a full-screen mode, in accordance with some embodiments.

In some embodiments, the launch gesture includes a contact, e.g., a finger or stylus tap, on an icon displayed in the icon view 200. In general, a gesture is considered to be "on" an icon if the contact touches at least a portion of the icon displayed on the touch screen 112. In FIG. 3, the launch gesture is represented by the contact 301 on the calendar icon 207. In response to the launch gesture, the computing device 100 dismisses (i.e., removes) the icon view 200 from display on the touch screen 112 and displays an application view 400 of the calendar application in a full-screen mode as shown in FIG. 4. The application view 400 of the calendar application is the user interface of the calendar application. The application view 400 shown in FIG. 4 includes events scheduled on the user's calendar application.

Figure 5A:
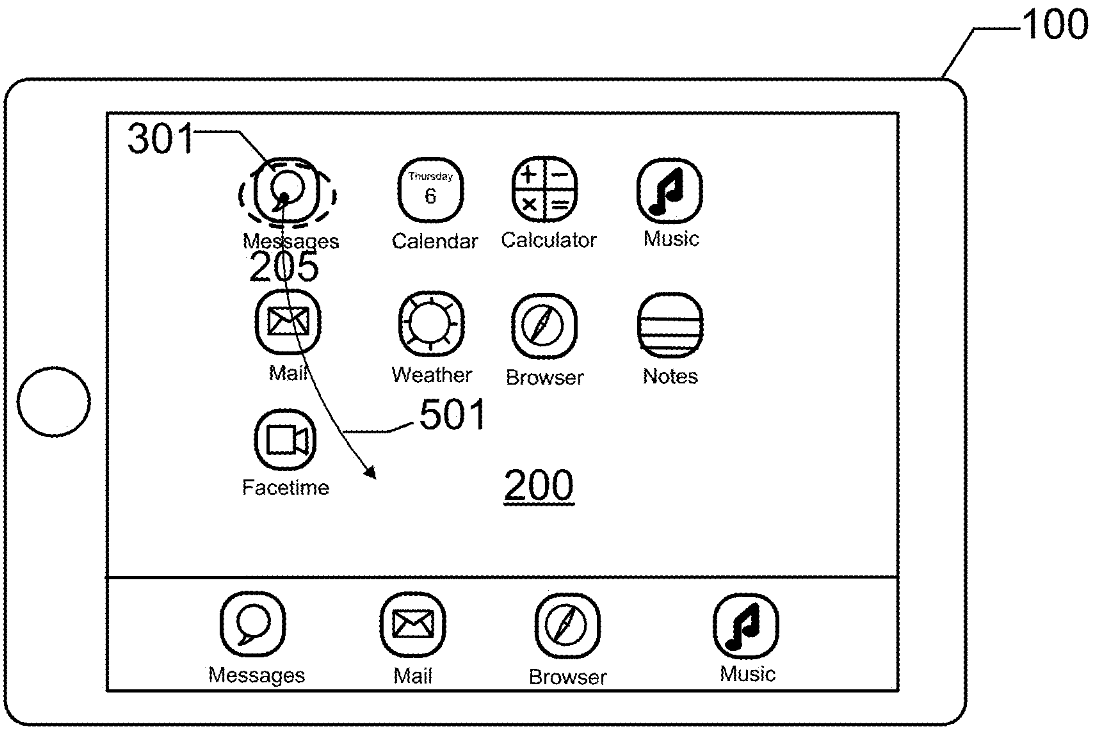
FIGS. 5A and 5B are schematics of a touch-sensitive display used to illustrate a gesture to activate an application in a shared screen view, in accordance with some embodiments.

Responsive to user selection of the home button 204 as indicated by contact 301 of the home button 204, the computing device 100 dismisses the application view 400 of the calendar application from the touch screen 112 and displays the icon view 200 as shown in FIG. 5A. In some embodiments, dismissal of an application merely removes the application view from being displayed on the touch screen 112. The dismissed application is still executing in a background process of the computing device 100 even though the application view of the application is no longer displayed on the touch screen 112. Thus, the calendar application shown in FIG. 4 is still executing in the background of the computing device 100 even though the application view 400 of the calendar application has been dismissed.

Figure 5B:
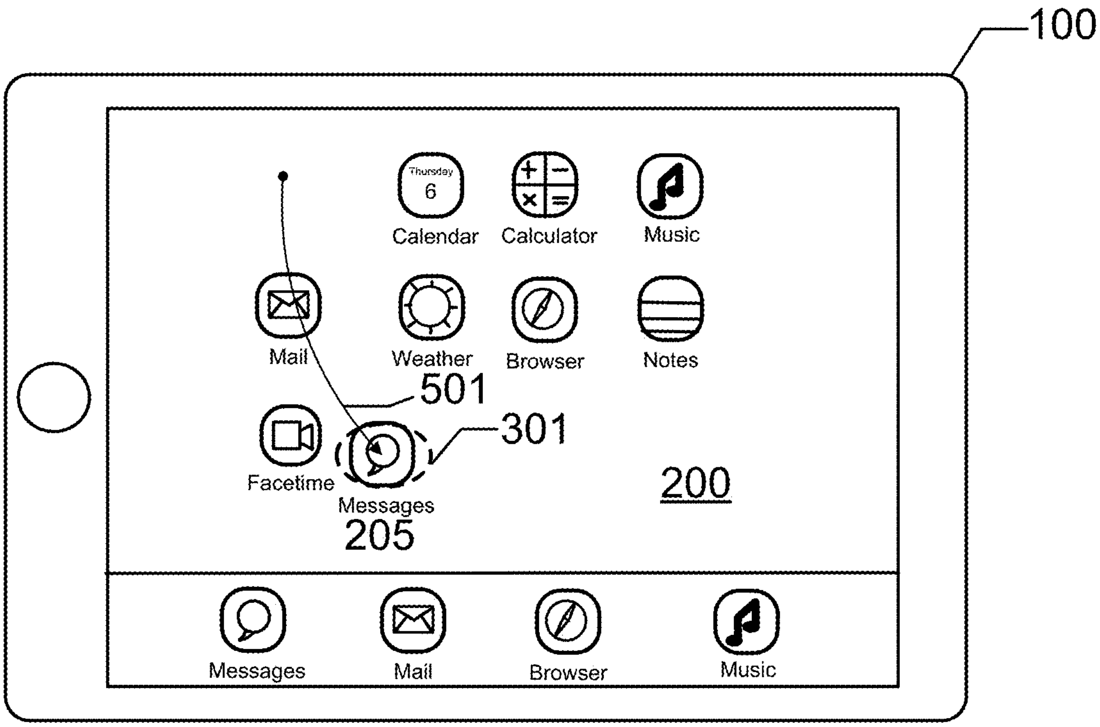

FIGS. 5A and 5B are schematics of a touch-sensitive display used to illustrate a gesture for entering a shared screen view (referred to as a shared view gesture), in accordance with some embodiments. The shared view gesture is indicative of a user request to display a shared screen view (also referred to herein as multitask mode, multitasking mode, multitask view, multitasking view, and shared screen mode) of multiple applications. A shared screen view is a view in which two or more applications are displayed on device 100 at the same time and the two or more applications are displayed as occupying substantially all of the display area of device 100. In some embodiments, the shared screen view can only be activated while the computing device 100 is oriented in the landscape position and when one or more applications are already executing in the background of the computing device 100. Thus, in some embodiments, the shared screen view cannot be activated with only a single application. Alternatively, the shared screen view can also be activated while the computing device 100 is oriented in the portrait position and when one or more applications are already executing in the background of the computing device 100.

In some embodiments, the shared view gesture includes the selection of an icon from the icon view 200 and dragging the icon a threshold distance from its initial (i.e., first) position in the icon view 200 to a second position within the icon view 200. For example, the icon is dragged a threshold distance of five pixels of the touch screen 112 from the icon's initial position to signify a request to display an associated application in a shared screen view. In FIG. 5A, the shared view gesture includes a contact 301 of the messages icon 205 at its initial position in the icon view 200 and dragging the messages icon 205 from its initial position a threshold distance to a second position in the icon view 200 shown in FIG. 5B in a continuous movement without breaking contact with the touch screen 112. After completion of the shared view gesture, the selected icon is redisplayed at the location corresponding to the initial position of the icon in the icon view 200. The selected icon is optionally displayed at a location adjacent to or a predefined distance away from the initial position of the icon.

In some embodiments, a shared screen view is activated using an application selector (also referred to as an application launcher, application selector, multitasking selector, application selector, etc.). An application selector is a user interface element that allows for selection of one or more applications for display in a shared screen view. In some embodiments, activation of the shared screen view using an application selector replaces the use of the shared view gesture, while in other embodiments, the shared screen view may be activated using either the application selector or the shared view gesture. In some embodiments, the shared view gesture is used to activate a shared screen view from the home screen, while the application selector is used to activated a shared screen view from any other screen (e.g., while an application is currently displayed). Application selectors and additional details regarding activating and interacting with a shared screen view are discussed below in reference to FIGS. 33A-41E.

Figure 6A:
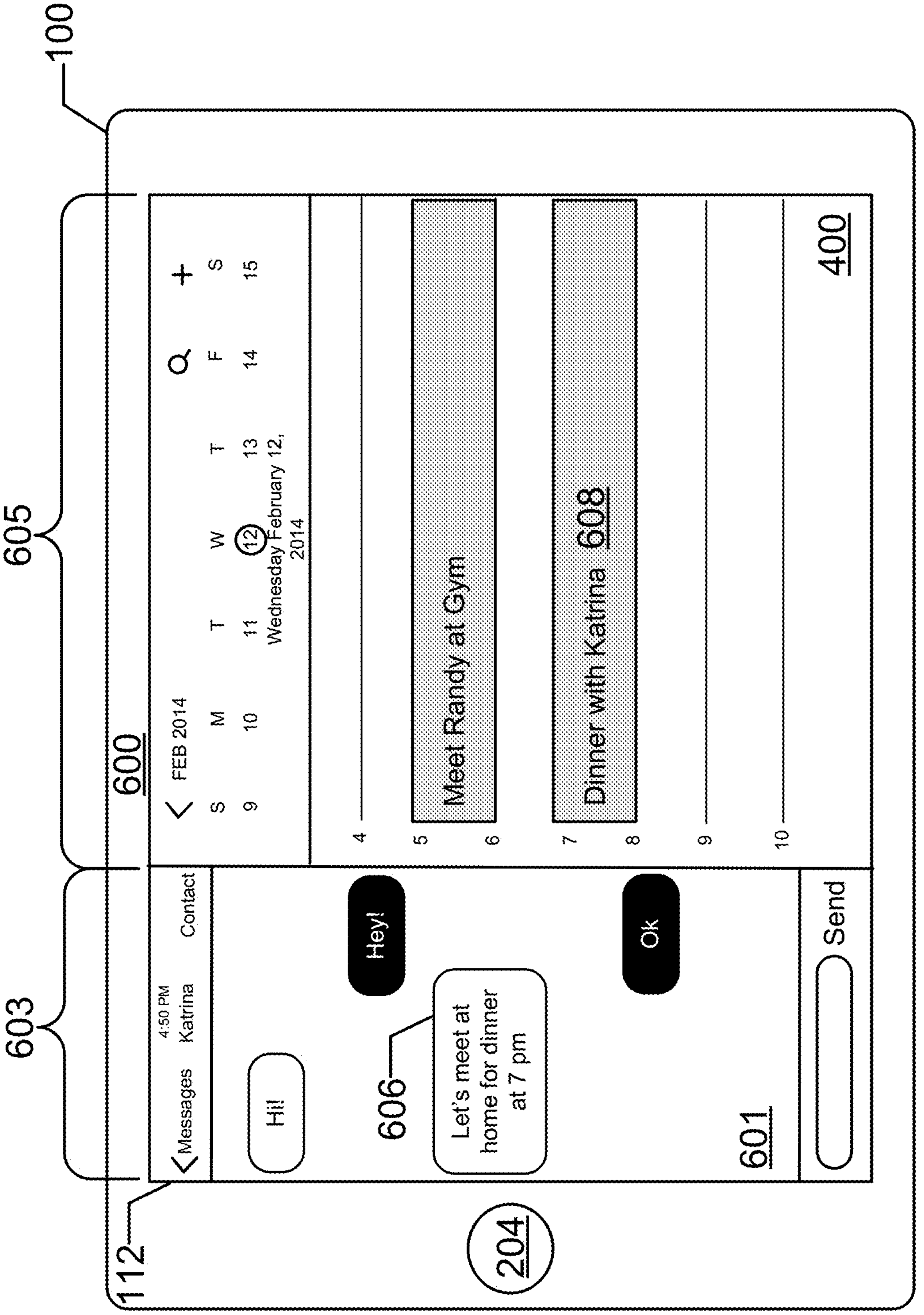
FIG. 6A is a schematic of a touch-sensitive display used to illustrate a shared screen view of the computing device, in accordance with some embodiments.

FIG. 6A is schematic of a touch-sensitive display used to illustrate a shared screen view 600 of the computing device 100, in accordance with some embodiments. In the illustrated embodiment, the shared screen view simultaneously displays multiple applications to allow for multitasking on the computing device 100. The applications displayed in the shared screen view include the application that the user requested to view in the shared screen view and one or more other applications executing in the background of the computing device 100. As illustrated, an application executing in the background of the computing device 100 is displayed in a first portion of the touch screen 112 (i.e., a right portion 605, sometimes referred to as a side application or a side portion) and the application requested to be displayed in the shared screen view is displayed in a second portion 603 of the touch screen 112 (i.e., a left portion, sometimes referred to as a main application or a main portion) by default as will be described below. Alternatively, the application requested to be displayed in the shared screen view is displayed in the portion 605 of the touch screen 112 by default and an application executing in the background of the computing device is displayed in the second portion 603 of the touch screen 112.

The shared screen view 600 shown in FIG. 6A includes an application view 601 of the messages application as a result of the shared screen view gesture directed towards the messages icon 205 as described with respect to FIGS. 5A and 5B (alternatively, as discussed above, an application selector can be utilized to activate the shared screen view with the messages application). Furthermore, the shared screen view 600 includes an application view 400 of the calendar application. As mentioned previously with respect to FIG. 4, the calendar application was dismissed, but is still executing in a background process of the computing device 100. Thus, the shared screen view 600 includes both the application view 601 of the messages application and the application view 400 of the calendar application 400. While in the shared screen view 600, the user can interact with both the messages and the calendar application. For example, application view 601 indicates a message 606 to meet at home for dinner at 7 pm which prompts the user to add a calendar entry 608 in the application view 400 of the calendar application indicating "Dinner with Katrina" from 7 pm to 8 pm on Wednesday Feb. 12, 2014.

In the shared screen view 600, the computing device 100 displays the application view 400 of the calendar application in a first portion 605 (i.e., a right portion) of the touch screen 112 and displays the application view 601 of the messaging application in a second portion 603 (i.e., a left portion) of the touch screen 112. As shown in FIG. 6A, the first portion 605 is horizontally adjacent to the second portion 603 and does not overlap the second portion 603. Generally, applications displayed in the shared screen view each occupy a portion of the touch screen 112, but collectively the applications occupy the entire area of the touch screen 112 allocated for displaying applications except for any portions of the touch screen 112 allocated for the display of a status bar and/or control regions of the computing device 100.

In some embodiments, the computing device 100 automatically displays an application requested for activation in a shared screen view in the second portion 603 of the shared screen view 600 with a default width. The default width is optionally ¼ of the width of the touch screen 112. One or more other applications executing in the background of the device 100 are displayed in the shared screen view 600 in the remaining ¾ of the width of the touch screen 112. For example, the second portion 603 displaying the messages application has a width substantially equivalent to ¼ of the width of the touch screen 112 and the first portion 605 displaying the calendar application has a width substantially equivalent to ¾ of the width of the touch screen 112. Alternatively, the second portion 603 has a default width of ½ or ⅓ of the width of the touch screen 112 or a default size that is configured by a user of device 100.

In some embodiments, responsive to the computing device 100 detecting a shared screen view gesture directed towards an icon (or detecting input at an affordance within an application selector), the computing device 100 determines whether the selected application corresponding to the icon is resizable. The computing device 100 determines whether the application is resizable responsive to detecting the shared screen view gesture to avoid having to make the determination at the time when a request is received to change the width of the application. The prior determination allows the computing device 100 to resize the width of the application without any added delay when the request to resize the width of the application is received. However, in other embodiments the computing device 100 determines whether the application is resizable responsive to receiving a request to change the width of the application. In some embodiments, determining whether the selected application is resizable is performed by multitasking module 180 (or a component thereof, such as compatibility module 184, FIG. 1A) by checking a multitasking compatibility flag stored with multitasking data 176 (FIG. 1B) corresponding to the selected application.

If the application is resizable, the computing device 100 determines if the width of the application is continuously resizable or if the width of the application is only resizable to one or more predetermined widths (as described in more detail below). If the width of the application is continuously resizable, the user can change the width of the application to any desired width. If the width of the application is only resizable to predetermined widths, the user can only change the width of the application to one of the predetermined widths.

If the computing device 100 determines that the width of the application is fixed (i.e., the width cannot be resized), the computing device 100 determines the default width with which the application can be displayed on the touch screen 112. The default width, in some embodiments, is ¼ of the width of the touch screen 112. Alternatively, the default width is, in some embodiments, ⅓ of the width of the touch screen 112, ½ of the width of the touch screen 112, or a width configured by a user of device 100. The computing device 100 also determines, in some embodiments whether any other active applications, such as those executing in the background of the computing device 100, are resizable as described above.

Furthermore, in some embodiments multiple applications up to a maximum number of applications (e.g., three applications) can be displayed in the shared screen view. Responsive to a shared screen view gesture to add an application to the shared screen view, the computing device 100 determines a total number of activated applications that would be displayed in the shared screen view as a result of adding the requested application to the shared screen view. If adding the application causes the total number of applications for display in the shared screen view to exceed the maximum number (i.e. a threshold number), the computing device 100 removes one of the applications from the shared screen view, as will be further described below. For example, the computing device 100 removes the oldest (i.e., least recently activated) application from the shared screen view.

Figure 6B:
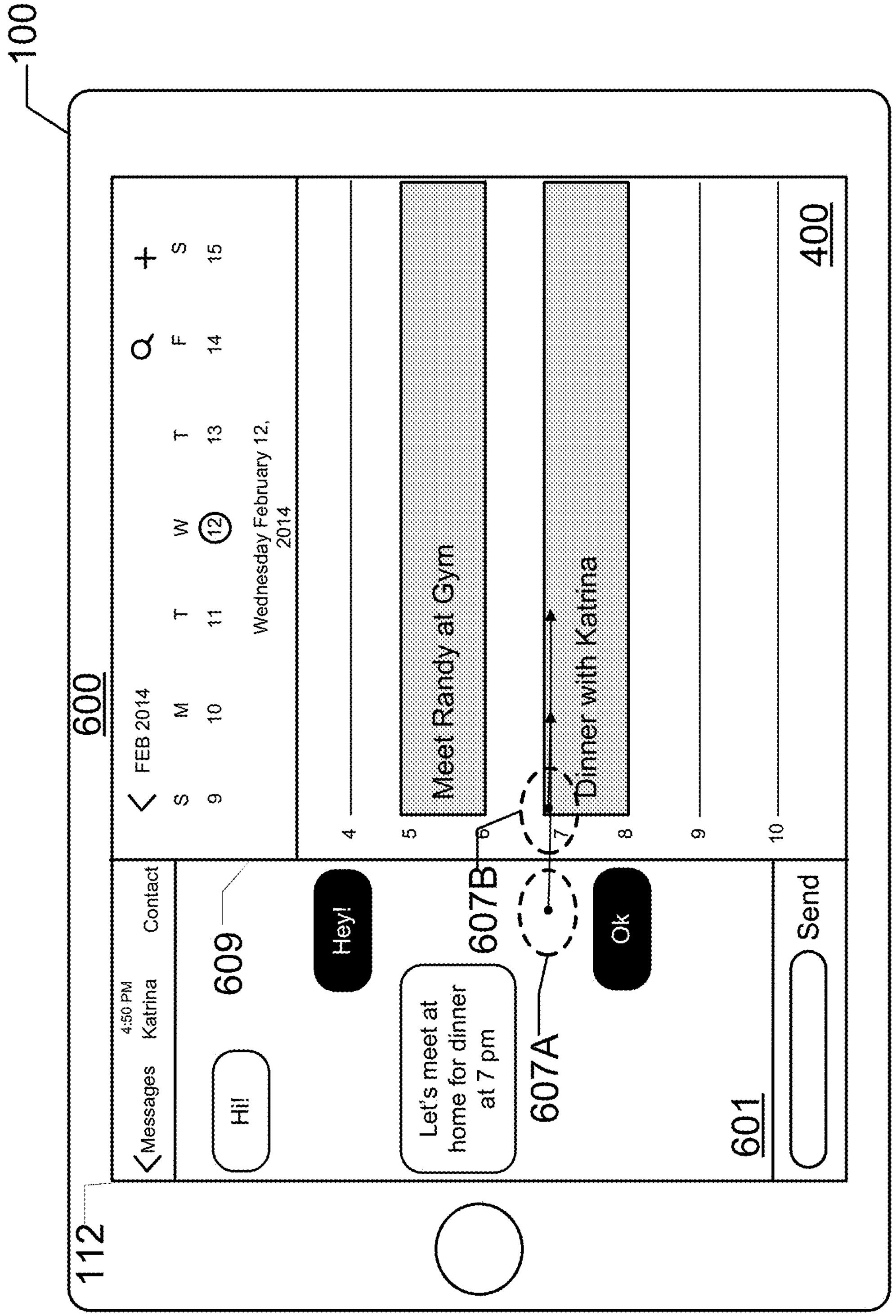
FIGS. 6B-6J are schematics of a touch-sensitive display used to illustrate a gesture for resizing applications displayed in the shared screen view, in accordance with some embodiments.
Figure 6C:
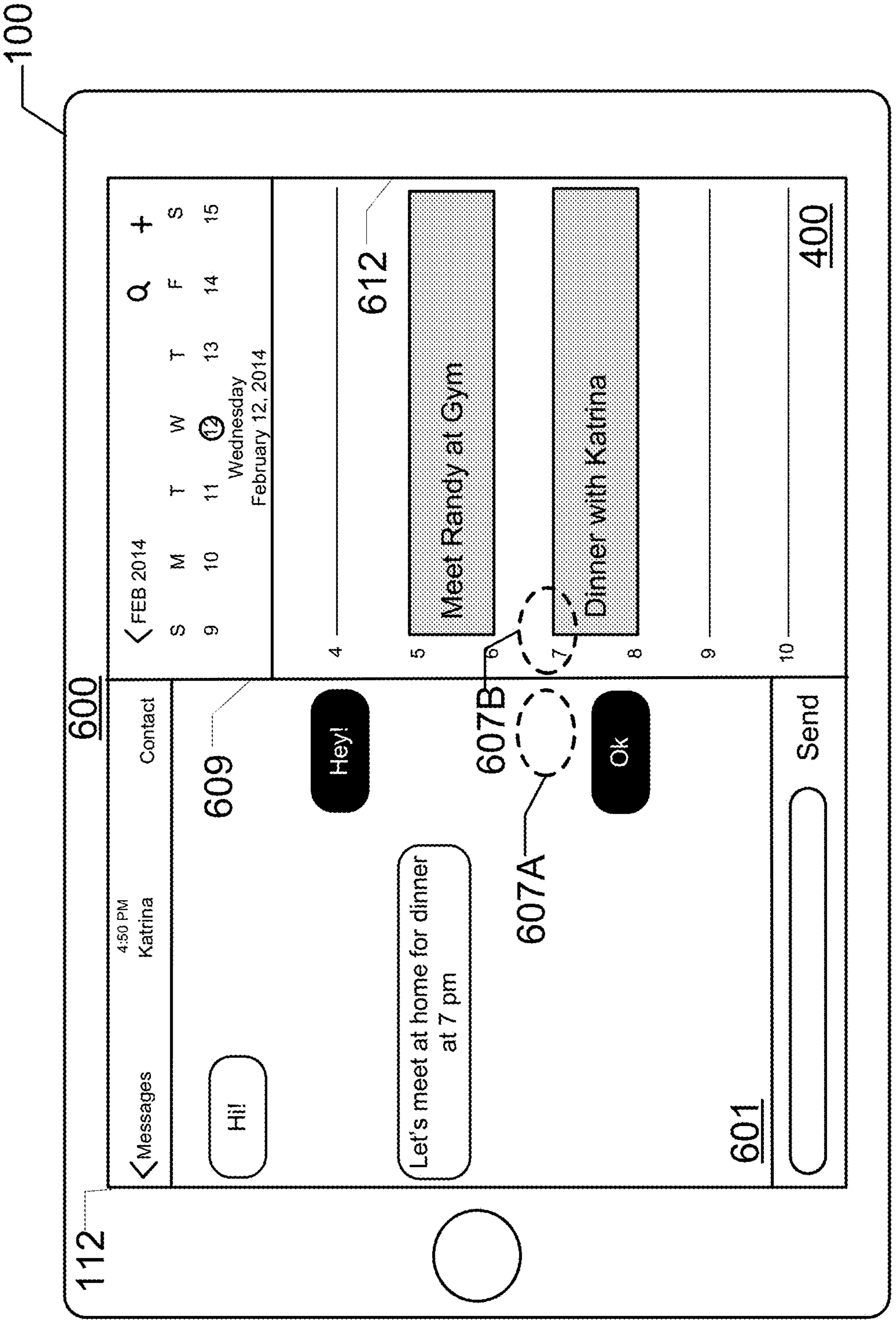
Figure 6D:
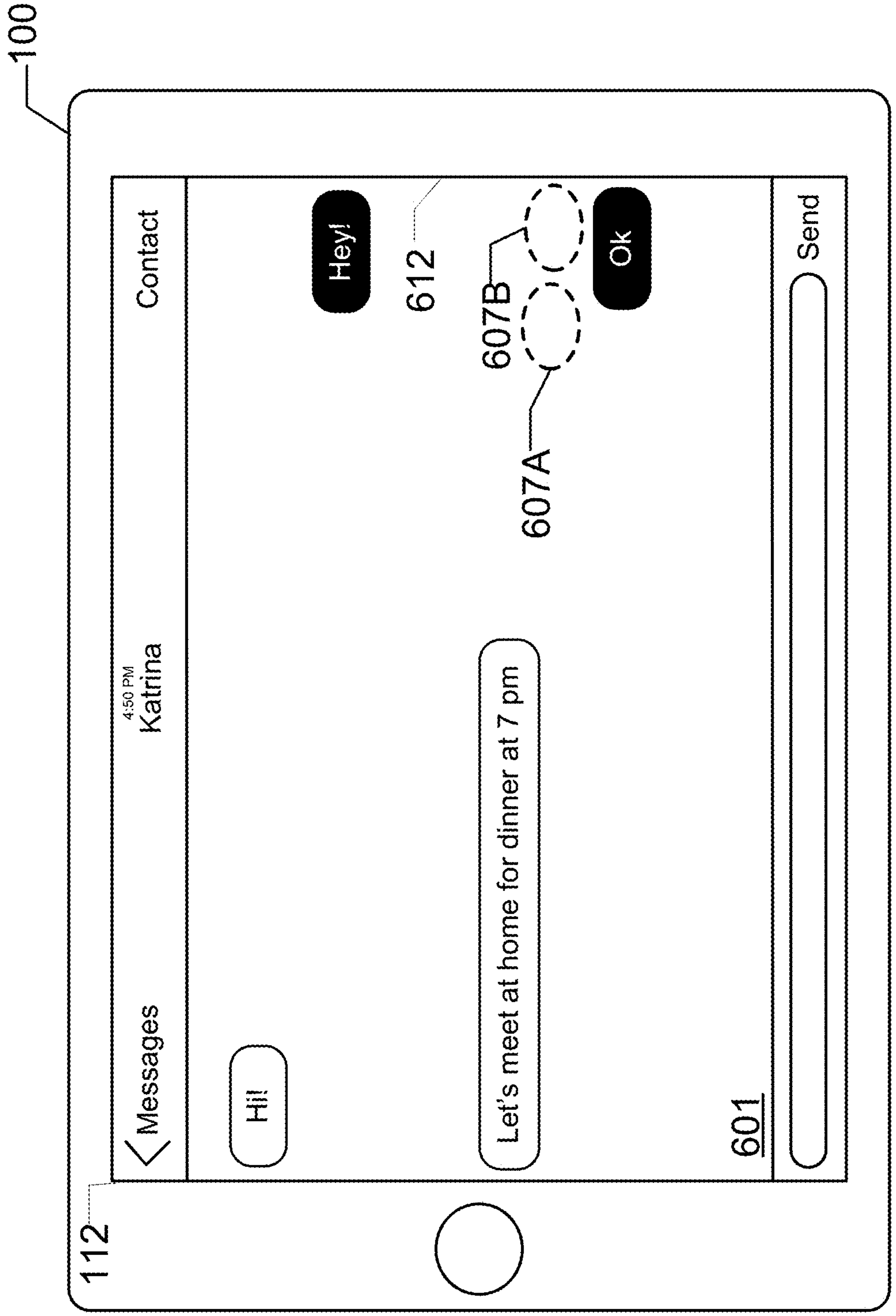

As mentioned previously, the user optionally resizes the width of the applications displayed in the shared screen view. The computing device 100 detects a gesture provided by the user that is indicative of a user request to resize, e.g., change the width of the applications displayed in the shared screen view. FIGS. 6B, 6C, and 6D illustrate one embodiment of a resize gesture to increase the width of application view 601 (the messages application) and reduce the width of application view 400 (the calendars application).

The resize gesture includes the user making contact with two fingers (in some embodiments, the two fingers make contact in a substantially simultaneous manner) on the touch screen 112 with the first finger contacting an application view of a first application displayed in the shared screen view and the second finger contacting another application view of a second application displayed in the shared screen view. As shown in FIG. 6B, contact 607A on application view 601 represents the user's first finger contacting the touch screen 112 and contact 607B on application view 400 represents the user's second finger contacting the touch screen 112. In particular contact, 607A is left of a dividing line 609 (i.e., a border) between the displayed applications and contact 607B is right of the dividing line 609. The dividing line 609 represents the boundary (also referred to as an app divider) between the two applications displayed in the shared screen view 600.

In the example user interface shown in FIG. 6B, the resize gesture indicates a request to increase the width of application view 601 and decrease the width of application view 400 as indicated by the direction of the gesture to the right (i.e., a first direction). The resize gesture further includes the user continuously moving both fingers that are in contact with the touch screen 112 to the right. As the user's fingers move, the computing device 100 detects a lateral component of movement of contact 607A and 607B and determines the direction of the movement. As both contact 607A and 607B move across the touch screen 112 to the right, the dividing line 609 moves in accordance with the movement of contact 607A and 607B and the width of application view 601 (messages application) increases while the width of application view 400 (calendars application) decreases as shown in FIG. 6C, assuming both applications are continuously resizable. In some embodiments, the resize gesture is completed once the user lifts both fingers (e.g., contact 607A and 607B) so as to no longer contact the touch screen 112. In some embodiments, a liftoff event is detected when either finger (i.e., one of contact 607A or 607B) ceases to contact the touch screen 112 and the resize gesture terminates upon detection of the liftoff event. In some embodiments, in accordance with a determination that either finger (i.e., one of the two fingers comprising the resize gesture) has crossed over the dividing line 609, the resize gesture is terminated. In some embodiments, determining that either finger has crossed over the dividing line 609 includes determining that either finger is a threshold distance beyond the dividing line 609 (e.g., 0.5 pixels, 1 pixel, 1.5 pixels, 2 pixels, etc.). Upon termination of the resize gesture, in some embodiments, the first and second applications remain at their current widths (i.e., widths established in accordance with the resize gesture) while, in other embodiments, the first and second applications return to their widths immediately prior to the beginning of the resize gesture.

As mentioned previously, if the width of an application is resizable, the width is either continuously resizable or resizable to one or more predetermined widths. Assuming that both the messages application and the calendar application are continuously resizable, the width of application view 601 (messages application, e.g., instant messaging module 141) increases in proportion with the movement of contact 607A and contact 607B to the right. Similarly, the width of application view 400 (calendars application, e.g., calendar module 148) simultaneously decreases in proportion with the movement of contact 607A and contact 607B to the right.

If the width of a first application displayed in the shared screen view is only resizable to one or more predetermined widths and the second application is continuously resizable, the predetermined width for the first application controls the width for the second application. That is, responsive to detecting the resize gesture, the computing device 100 automatically displays the first application at one of the predetermined widths and displays the second application at a width corresponding to a width of the remaining portion of the touch screen 112 that is not occupied by the first application.

For example, assume that the messages application shown in FIGS. 6B and 6C is only resizable to a predetermined width and the calendar application is continuously resizable. As the user's fingers move to the right, the computing device 100 determines a predetermined width of the messages application (e.g., by retrieving information from multitasking data 176 corresponding to the messages application) that is larger than the current width of the application view 601. The computing device 100 automatically displays application view 601 at the predetermined width as the user's fingers move towards the right and the application view 400 is displayed at a width corresponding to a remaining width of the touch screen 112 that is not occupied by application view 601. Application view 601 and application view 400 thus appear to snap (or jump) to their respective widths.

If the user moves the two fingers contacting the touch screen 112 within a threshold distance (e.g., five pixels or some other value configured by a user of the device 100) of a vertical edge of the touch screen 112, the computing device 100 detects that the contact 607A and contact 607B are within the threshold distance of the vertical edge and dismisses the application bordered by the vertical edge from the shared screen view. In FIG. 6D, the user's fingers continued to move from the position shown in FIG. 6C to the position shown in FIG. 6D such that contact 607A and contact 607B are adjacent to vertical edge 612 of the touch screen 112. Responsive to at least one of the contacts 607A and 607B being within a threshold distance of the vertical edge 612, the computing device 100 dismisses the application bordered by vertical edge 612. In the example shown in FIG. 6D, application view 400 of the calendar application is dismissed and application view 601 (messages application) is displayed in the full-screen mode.

Figure 6E:
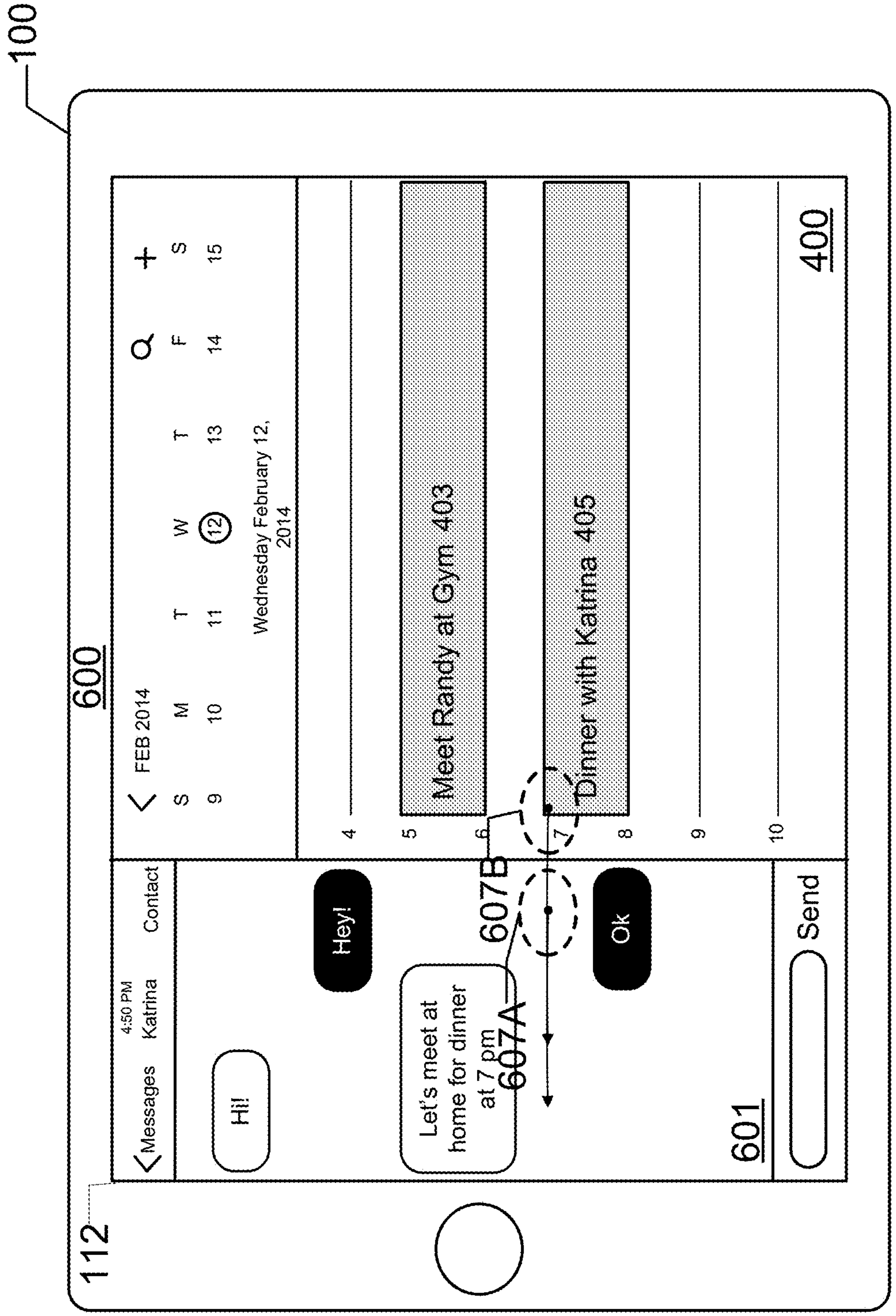
Figure 6F:
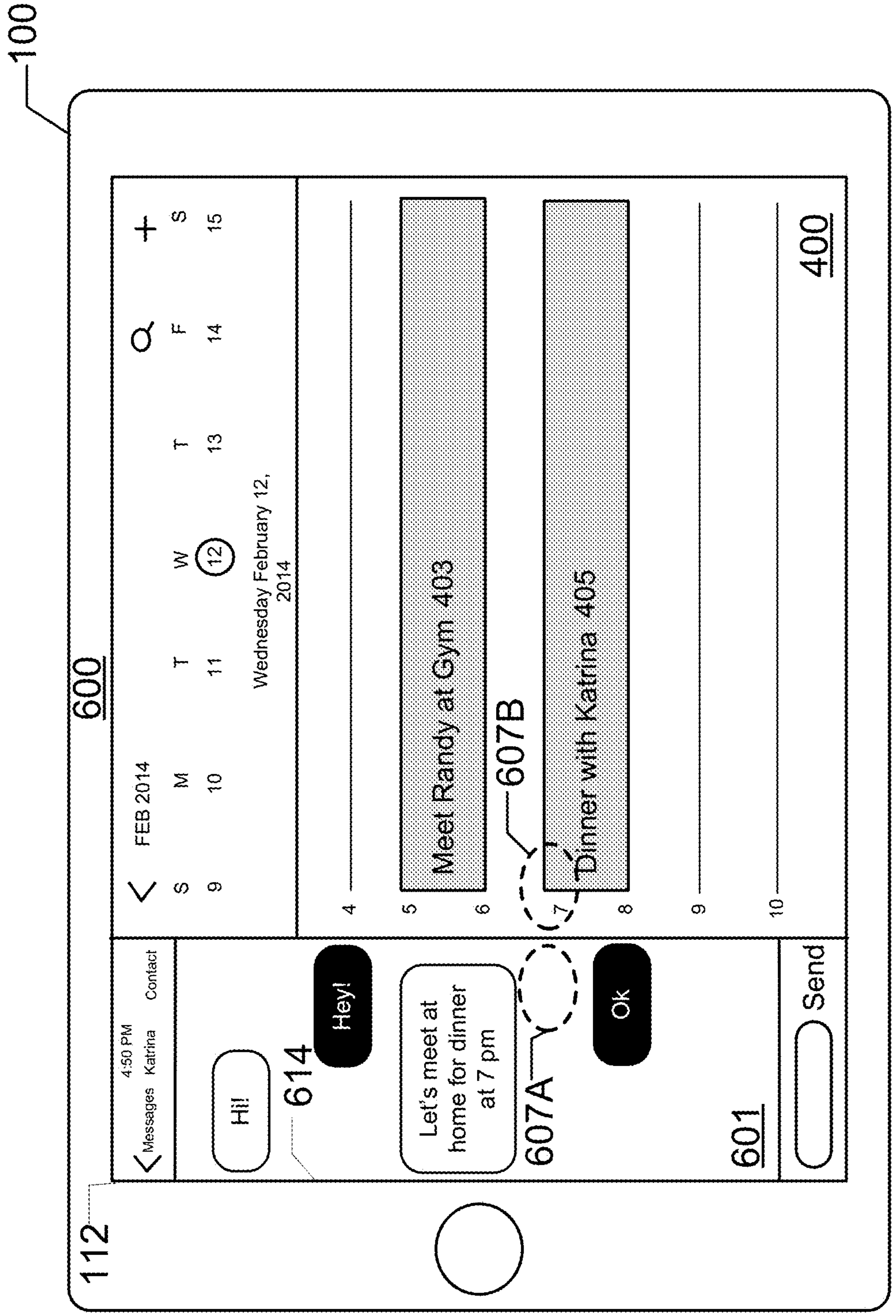
Figure 6G:
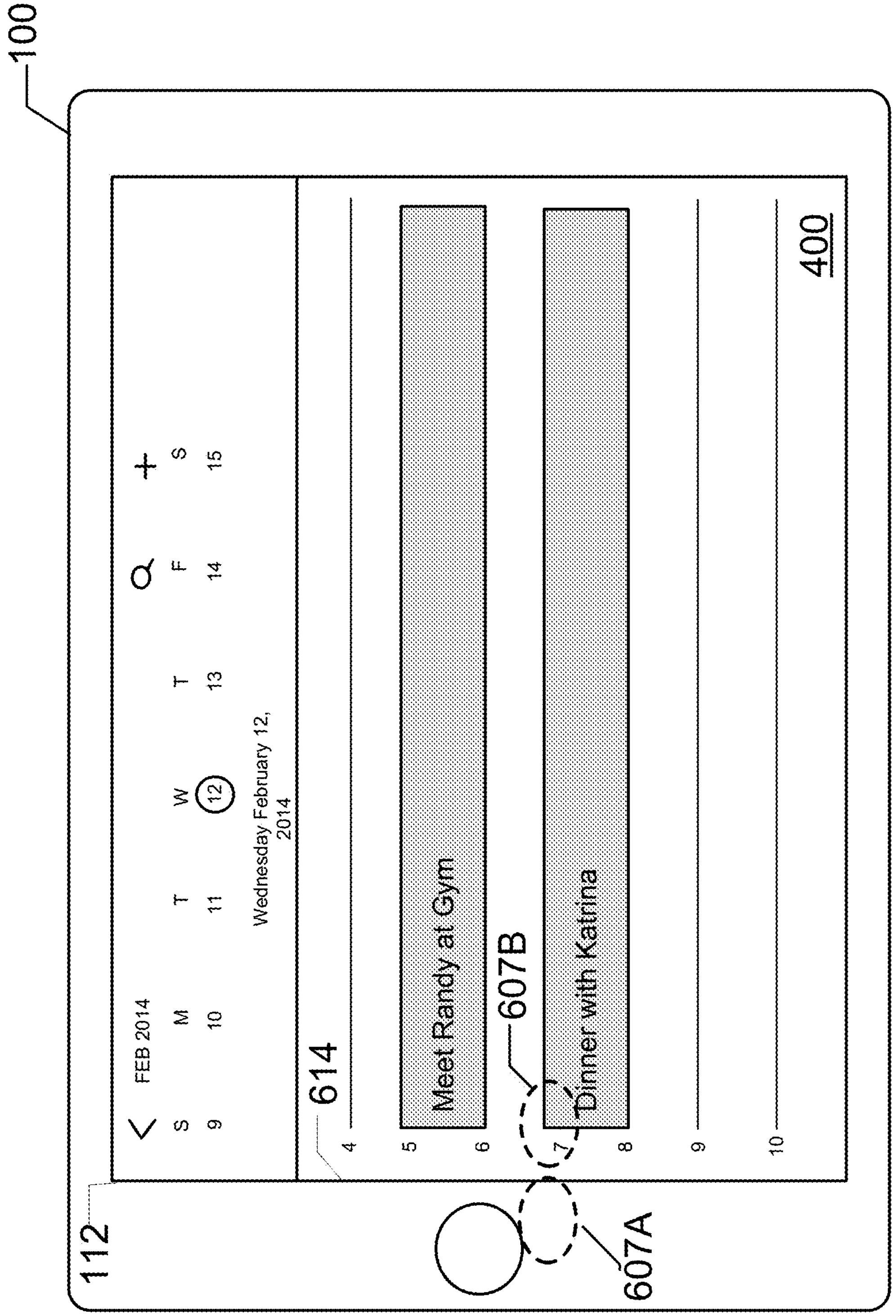

FIGS. 6E, 6F, and 6G are schematics of a touch-sensitive display used to illustrate a resize gesture similar to the resize gesture described above with respect to FIGS. 6B, 6C, and 6D, in accordance with some embodiments. However, in the examples shown in FIGS. 6E, 6F, and 6G, the resize gesture indicates a request to decrease the width of the messages application and increase the width of the calendar application.

As shown in FIG. 6E, contact 607A on application view 601 represents the user's first finger contacting the touch screen 112 and contact 607B on application view 400 represents the user's second finger contacting the touch screen 112. The user continuously moves both fingers that are in contact with the touch screen 112 to the left (i.e., a second direction) represented by the direction of the arrows of contact 607A and contact 607B. As both contact 607A and 607B move across the touch screen 112 to the left, the width of application view 601 decreases and the width of application view 400 increases as shown in FIG. 6F assuming both applications are continuously resizable.

If the user moves the two fingers contacting the touch screen 112 within a threshold distance of the vertical edge of the touch screen 112, the application bordered by the vertical edge (e.g., messages application in this example) is dismissed from the shared screen view 600. In FIG. 6G, the user's fingers continued to move from the position shown in FIG. 6F to the position shown in FIG. 6G such that contact 607A and contact 607B are adjacent to vertical edge of the touch screen 112. Responsive to at least one of the contacts 607A and 607B being within a threshold distance of the vertical edge, the computing device 100 dismisses the application bordered by the vertical edge. In the example shown in FIG. 6G, application view 601 (messages app) is dismissed and application view 400 (calendar app) is displayed in the full-screen mode.

Figure 6H:
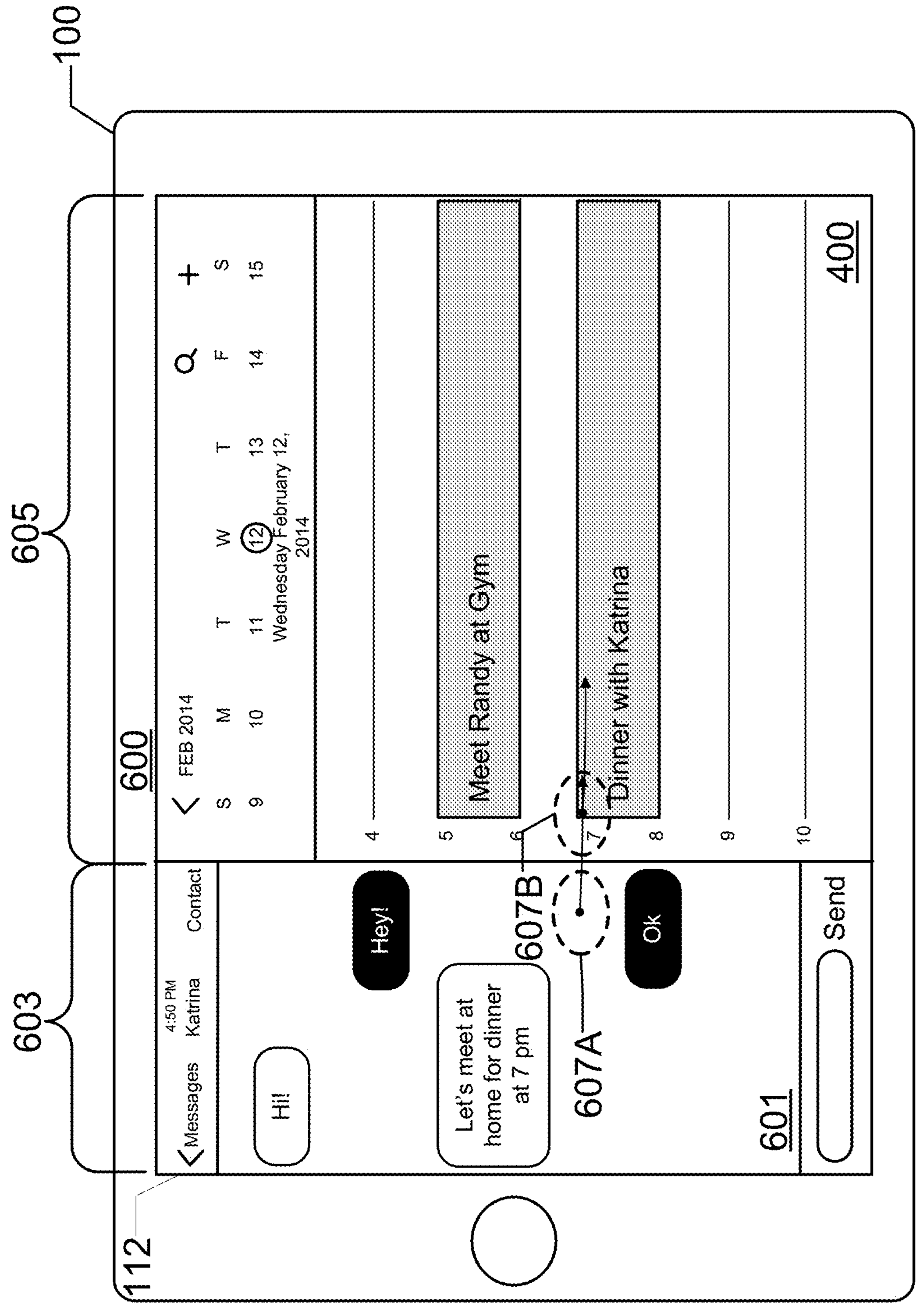
Figure 6I:
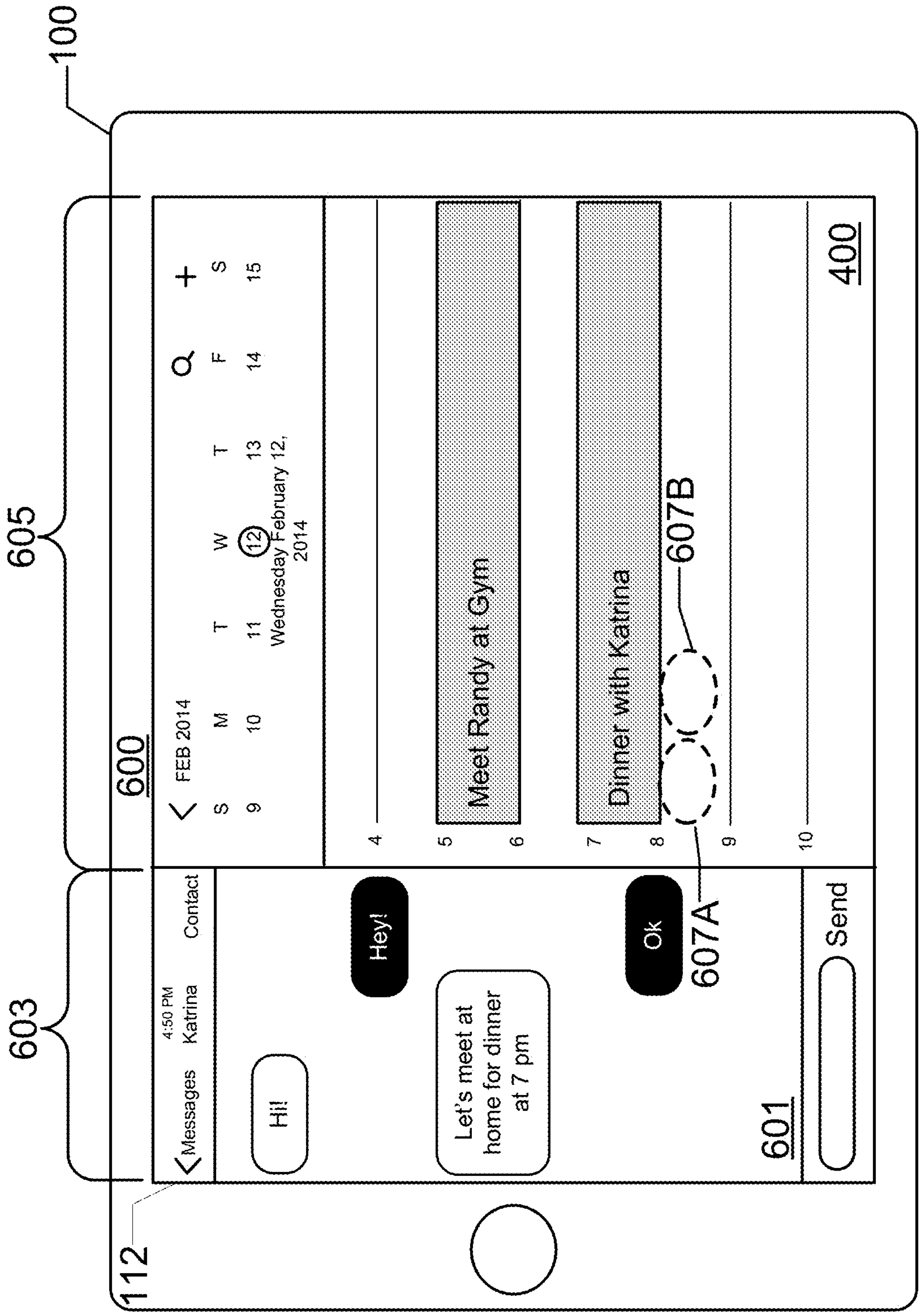
Figure 6J:
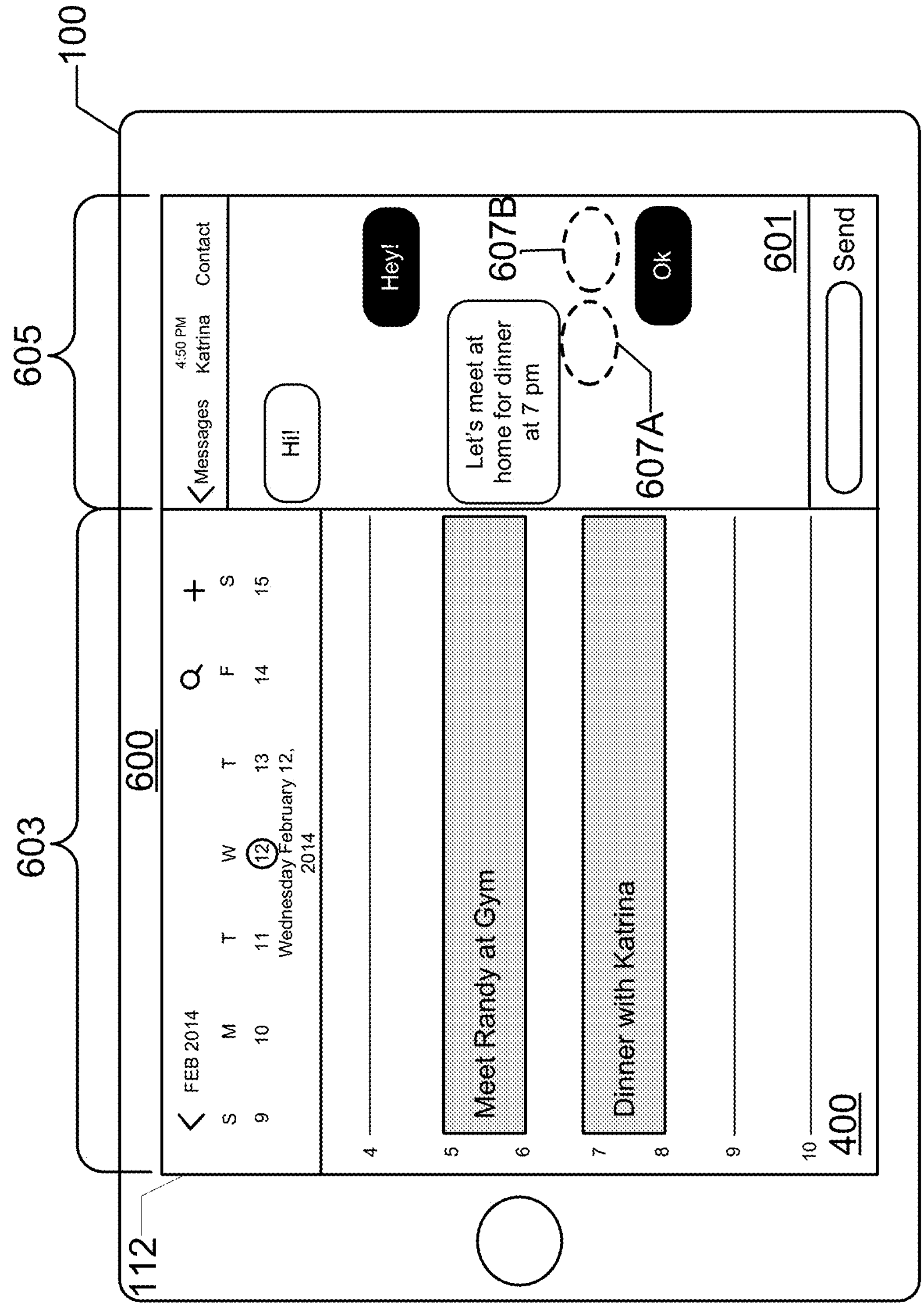

FIGS. 6H, 6I, and 6J are schematics used to illustrate a resize gesture directed towards an application that can only be displayed at predefined fixed widths, in accordance with some embodiments. The following description of FIGS. 6H, 6I, and 6J assumes that the messages application can only be displayed at predefined fixed widths. As shown in FIG. 6H, application view 601 of the messages application is displayed in the second portion 603 of the touch screen 112 and application view 400 of the calendar application is displayed in the first portion 605 of the touch screen 112. Furthermore, a resize gesture including contact 607A on application view 601 and contact 607B on application view 400 is detected by device 100 (or a component thereof, such as contact/motion module 130). The user moves both fingers that are in contact with the touch screen 112 to the right represented by the direction of the arrows of contact 607A and contact 607B.

However, as mentioned previously, the messages application can only be displayed with predefined fixed widths. As contact 607A and contact 607B move towards the right as shown in FIG. 6I, the width of application view 601 and the width of application view 400 stay the same because the messages application can only be displayed at the predefined fixed widths. Responsive to contact 607A and contact 607B moving a threshold distance from their initial position, the computing device 100 displays application view 400 of the calendar application in the second portion 603 of the touch screen 112 and displays application view 601 of the messages application in the first portion 605 of the touch screen 112 as shown in FIG. 6J. Thus, application view 400 and application view 601 switch positions on the touch screen 112.

Additional details regarding resizing applications in the shared screen view are discussed below in reference to FIGS. 40A-40D.

Figure 7A:
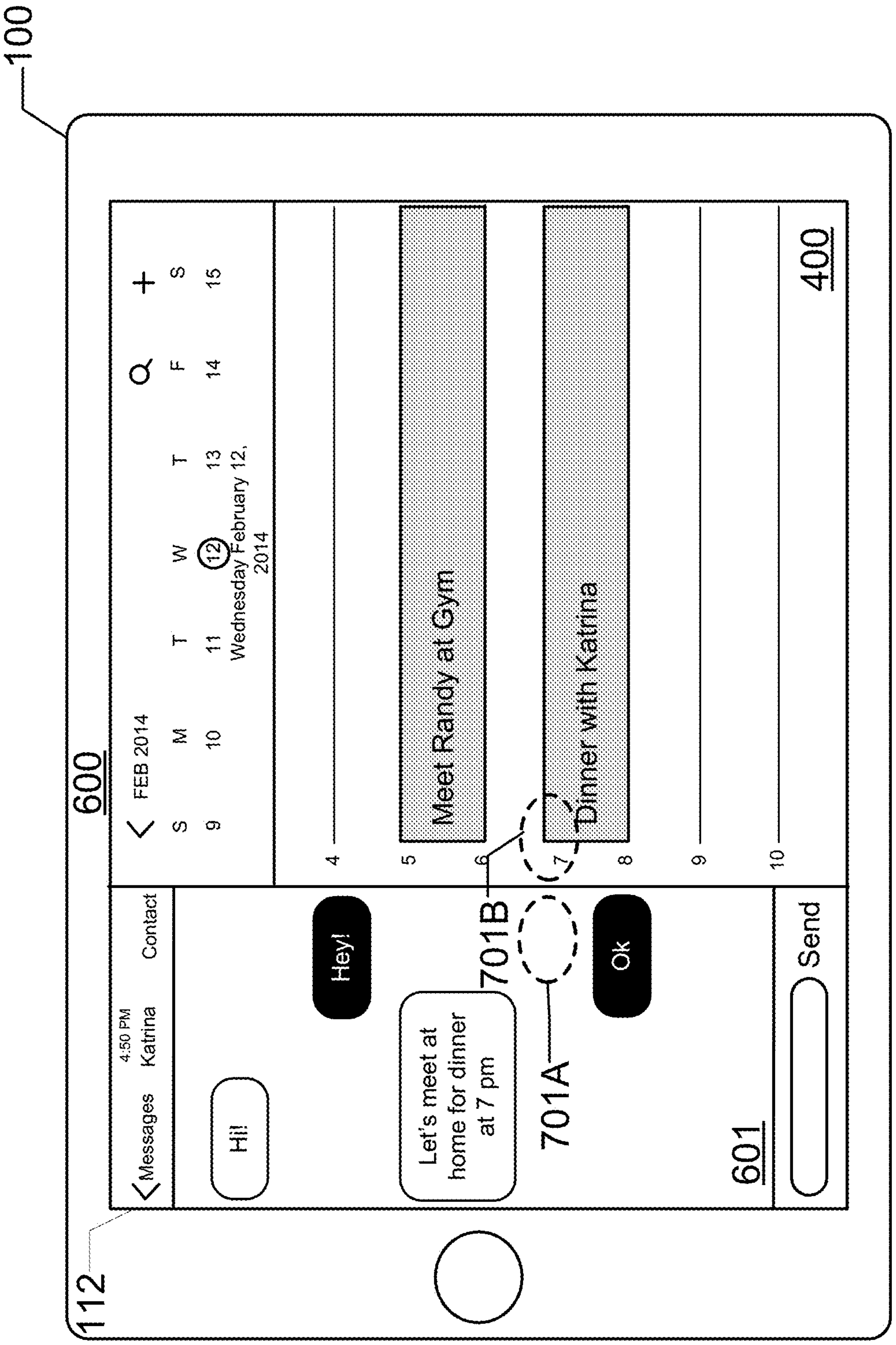
FIGS. 7A-7C are schematics of a touch-sensitive display used to illustrate a gesture for dismissing an application displayed in the shared screen view, in accordance with some embodiments.
Figure 7B:
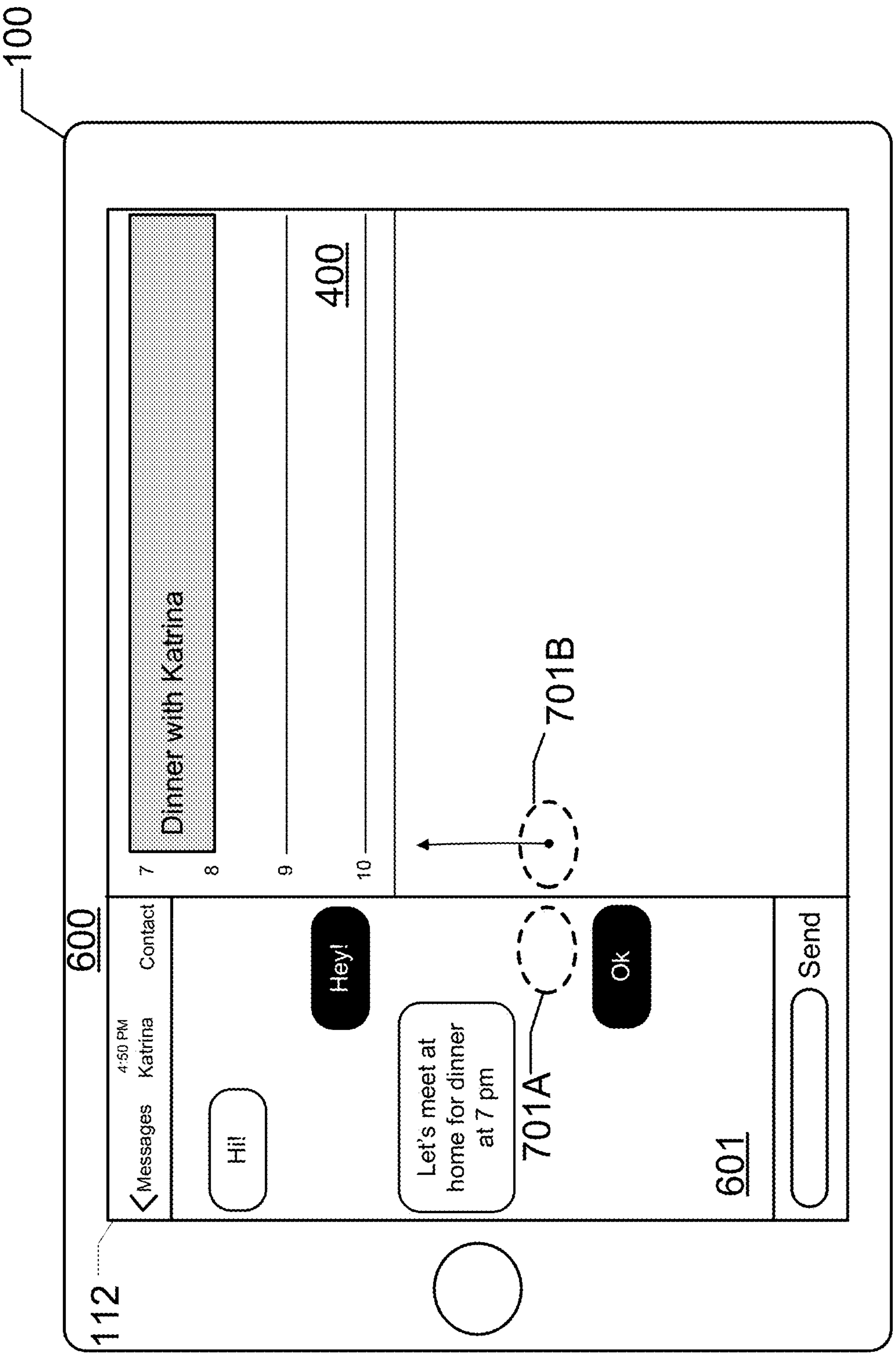

In some embodiments, the user inputs a "flick" gesture to dismiss one of the applications displayed in the shared screen view. The flick gesture includes the user making substantially simultaneous contact with two fingers on the touch screen 112 with the first finger contacting an application view of the first application displayed in the shared screen view and the second finger contacting the second application view of a second application displayed in the shared screen view. As shown in FIG. 7A, contact 701A on application view 601 represents the user's first finger contacting the touch screen 112 and contact 701B on application view 400 represents the user's second finger contacting the touch screen 112.

Figure 7C:
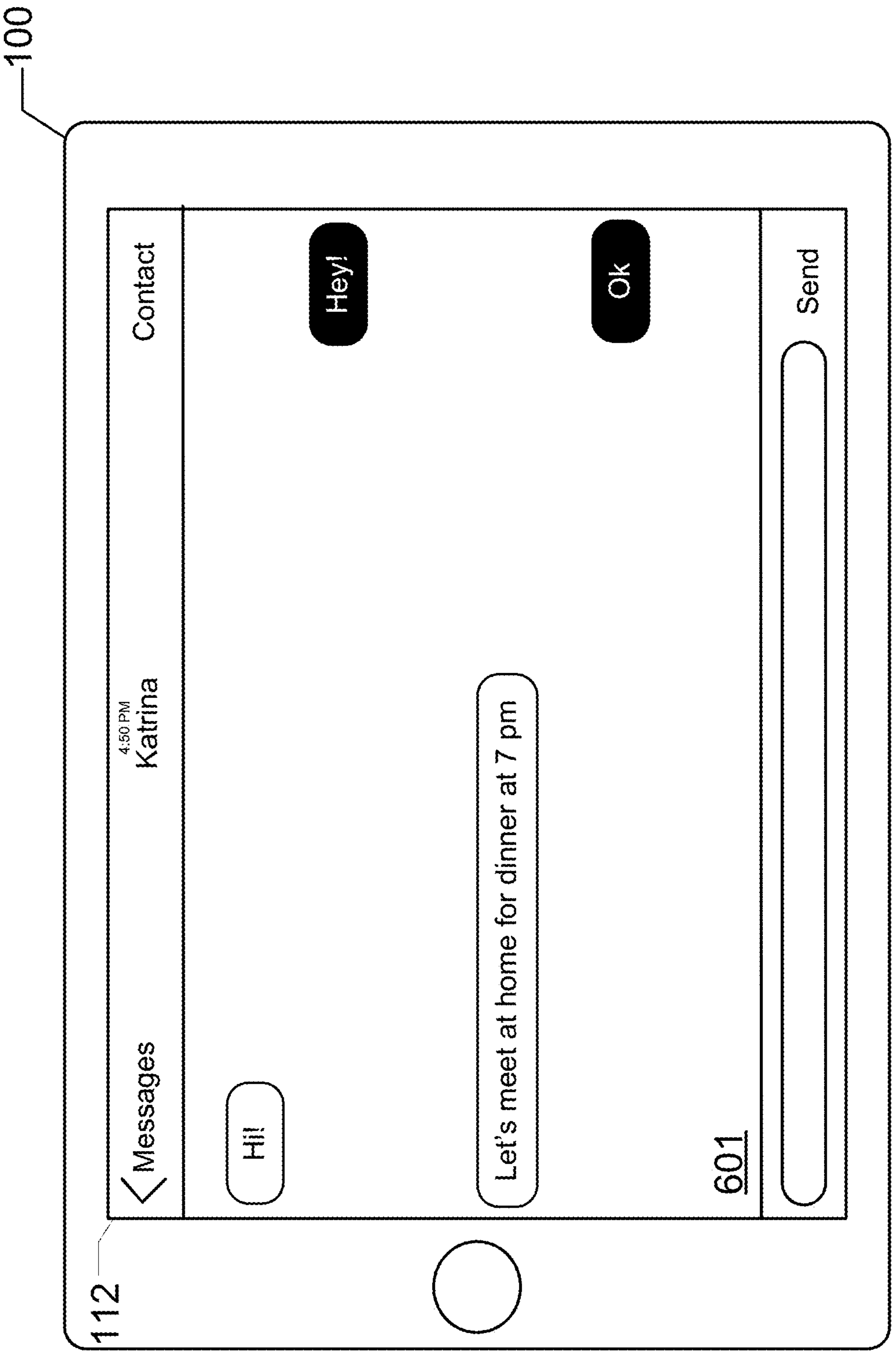

The flick gesture also includes a quick vertical movement of the finger placed on the application that the user wants to dismiss while the other finger maintains its position on the touch screen 112. For example, the flick gesture includes a quick vertical movement of contact 701B in the direction of the arrow shown in FIG. 7B while contact 701A is maintained at the same position. The quick vertical movement of contact 701B is such that contact 701B accelerates in the vertical direction and breaks contact with the touch screen 112. In response to the flick gesture shown in FIG. 7B, an animation is displayed illustrating application view 400 being dismissed. For example, the animation displays the application view 400 moving in the direction of the flick gesture until the application view 400 is no longer displayed on the touch screen 112 as shown in FIG. 7C. In FIG. 7C, application view 601 of the messages application is displayed in the full-screen mode.

Additional details regarding dismissing and promoting applications displayed in the shared screen view are discussed below in reference to FIGS. 37A-37G.

Some embodiments also allow users to quickly swap locations of concurrently displayed applications in a shared screen view. For example, in some embodiments, the user inputs a rotate gesture indicative of a request for the applications displayed in the shared screen view to switch positions on the touch screen 112. In the shared screen view 600 illustrated in FIG. 8A, the computing device 100 displays the application view 601 of the messaging application in a first portion 605 of the touch screen 112 and the application view 400 of the calendar application is displayed in a second portion 603 of the touch screen 112.

Figure 8A:
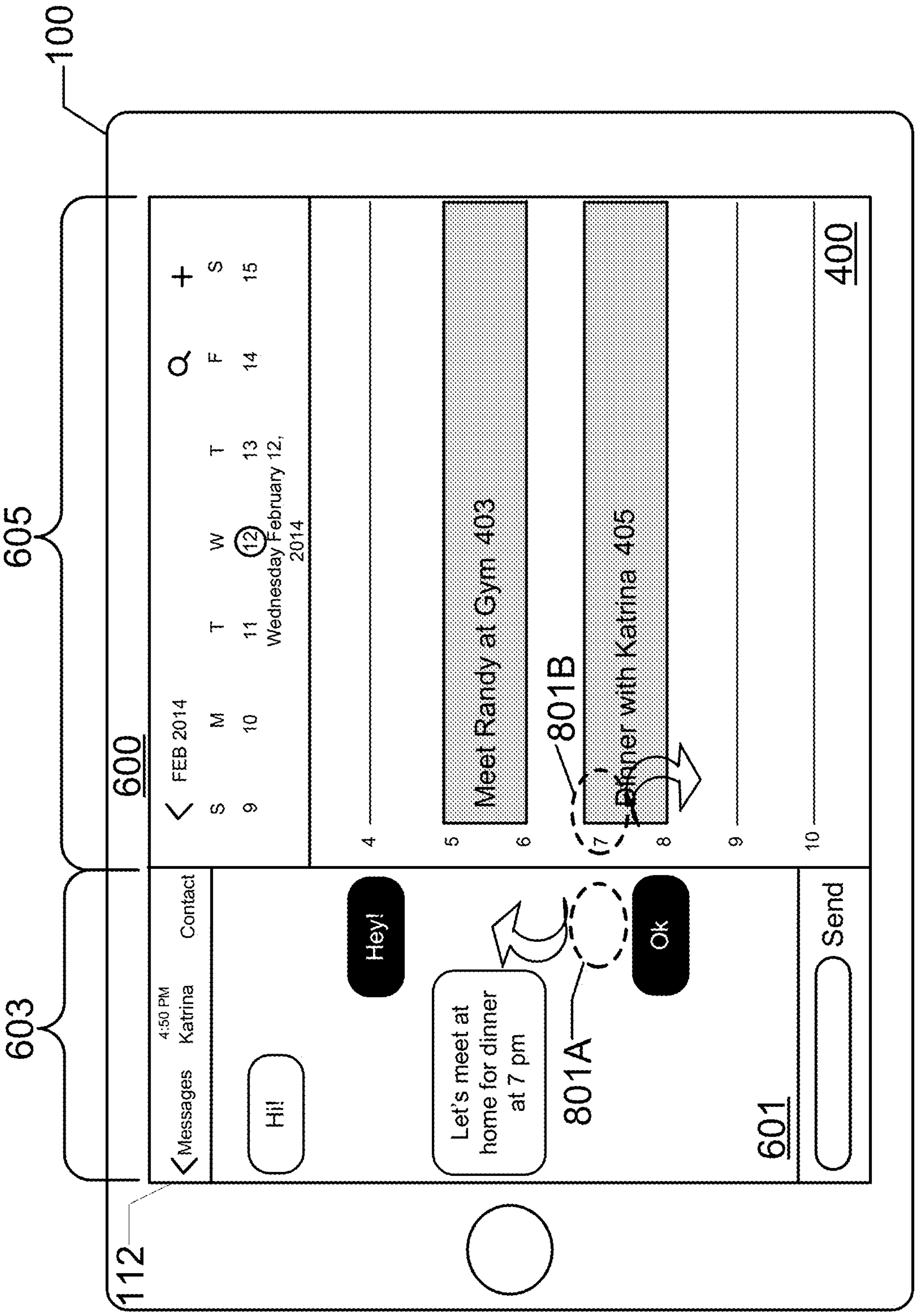
FIGS. 8A-8C are schematics of a touch-sensitive display used to illustrate a gesture for rotating positions of applications displayed in the shared screen view, in accordance with some embodiments.
Figure 8B:
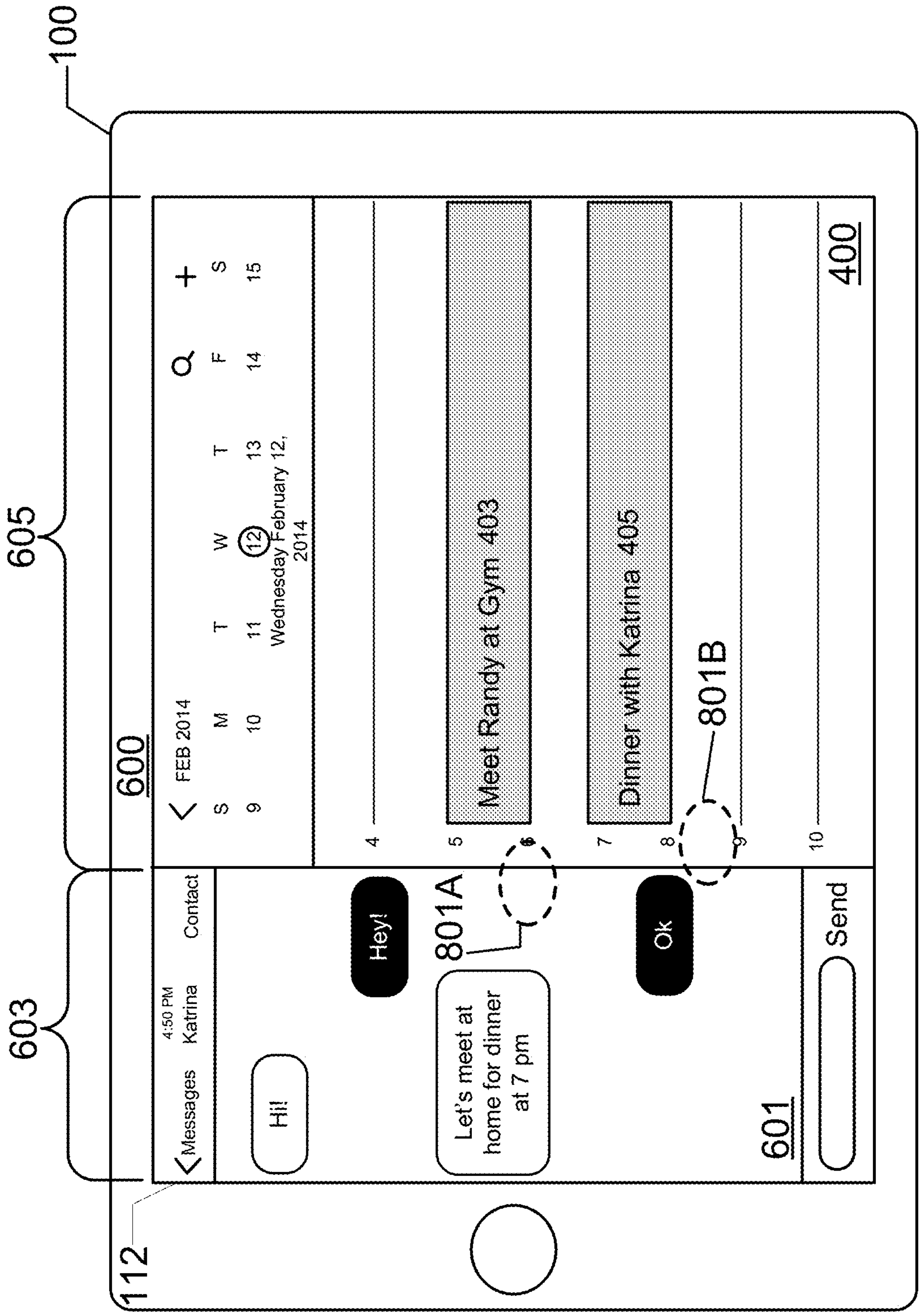

The rotate gesture includes the user initially making contact (in some embodiments, substantially simultaneous or concurrent contact) with two fingers (e.g., a first finger and a thumb or a first finger and a second finger) on the touch screen 112 with the first finger contacting an application view of a first application displayed in the shared screen view and the second finger contacting another application view of a second application displayed in the shared screen view. As shown in FIG. 8A, the computing device 100 detects contact 801A on application view 601 that represents the user's first finger contacting the touch screen 112 and contact 801B on application view 400 that represents the user's second finger contacting the touch screen 112. The rotate gesture further includes the user rotating the first finger and second finger in a substantially circular direction as indicated by the direction of the arrows shown in FIG. 8A thereby moving contact 801A and contact 801B to a second position shown in FIG. 8B without breaking contact with the touch screen 112.

Figure 8C:
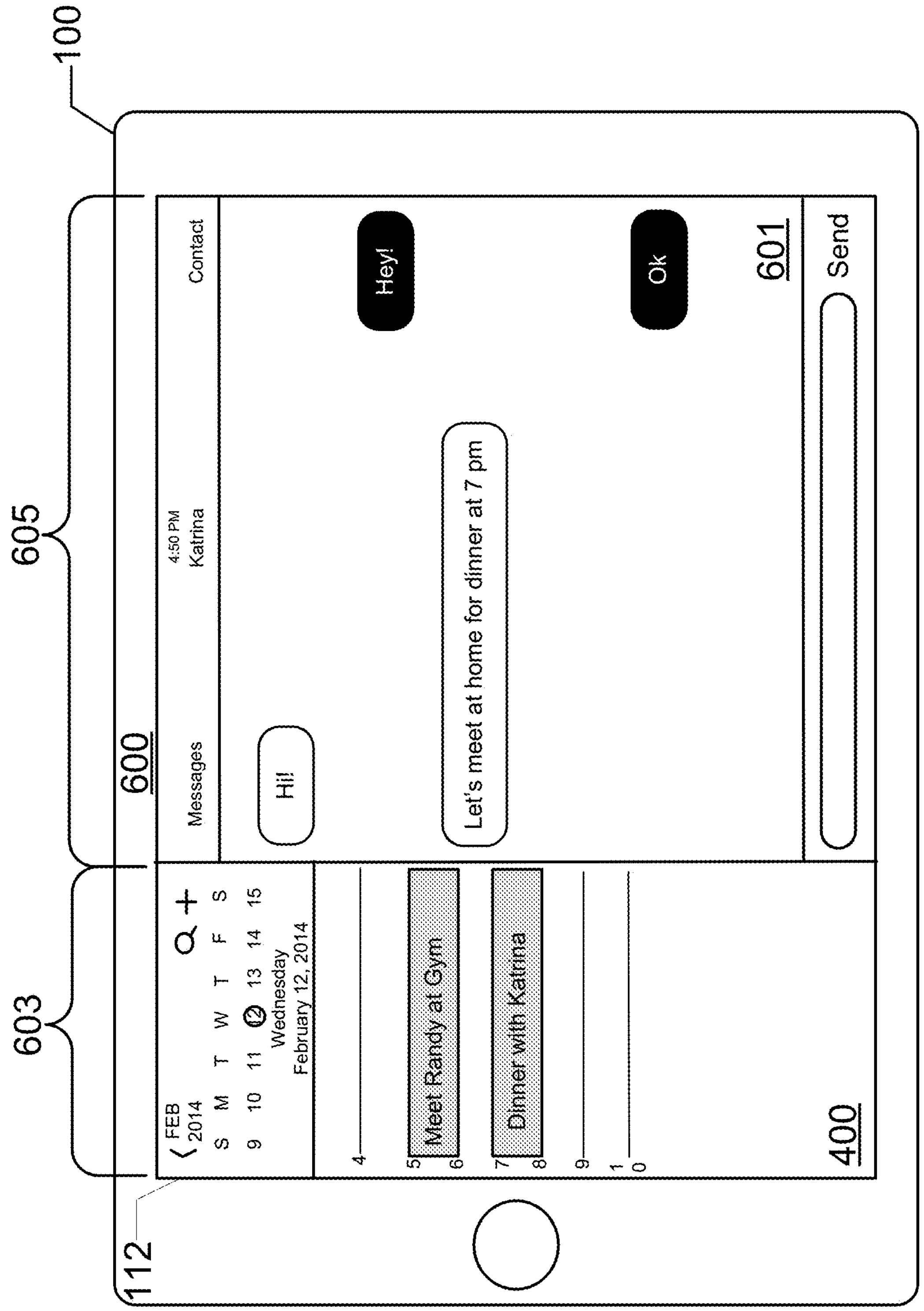

Once the user's first finger and/or second finger are no longer contacting the touch screen 112, the computing device 100 detects completion of the rotate gesture and displays the application view 601 and application view 400 such that they have switched places on the touch screen 112. In particular, the computing device 100 displays application view 400 of the calendar application in the first portion 605 which was previously occupied by application view 601 of the messages application (FIG. 8C). Similarly, the computing device 100 displays the application view 601 of the messages application in the first portion 605 which was previously occupied by application view 400 of the calendar application (FIG. 8C).

An additional gesture for swapping the locations of concurrently displayed applications is discussed below in reference to FIGS. 37F-37G.

As mentioned previously, user selection of home button 204 causes the computing device 100 to dismiss the shared screen view from being displayed on the touch screen 112 and to instead display the icon view 200 on the touch screen 112. Although the shared screen view is no longer displayed on the touch screen 112, any applications displayed in the shared screen view are still executing as background processes on the computing device 100.

Figure 9A:
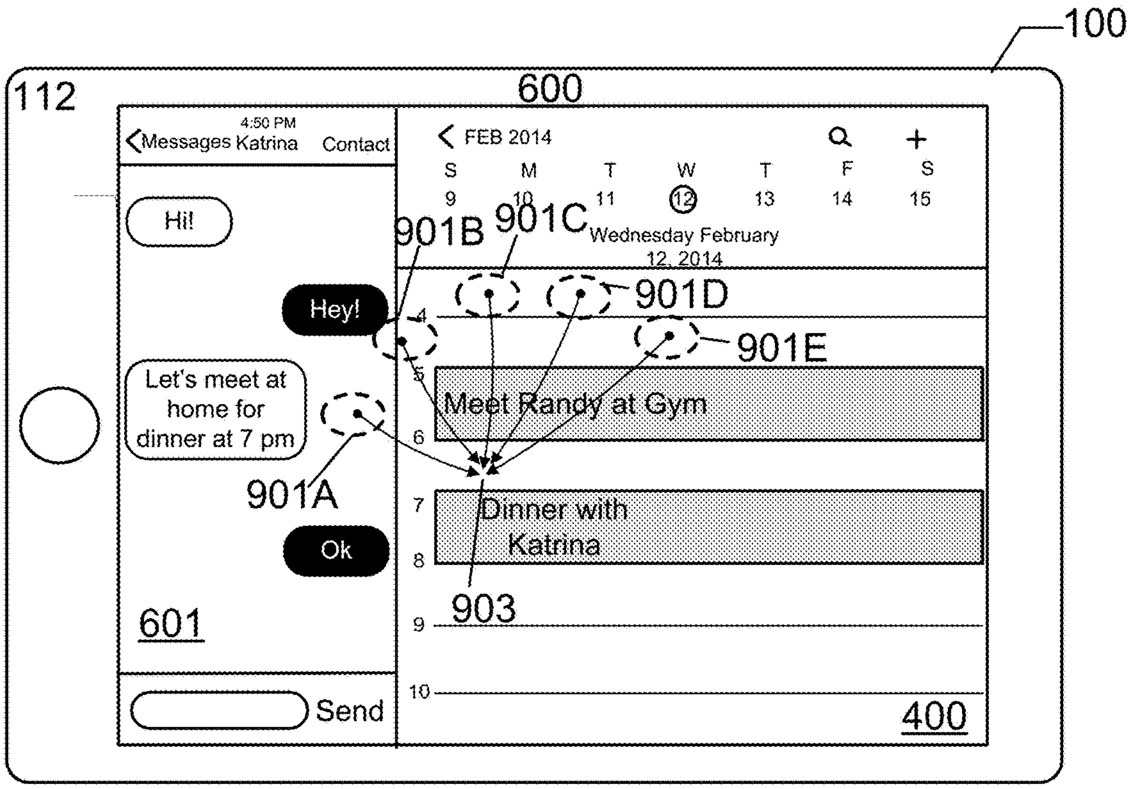
FIGS. 9A and 9B are schematics of a touch-sensitive display used to illustrate a gesture for dismissing the shared screen view, in accordance with some embodiments.
Figure 9B:
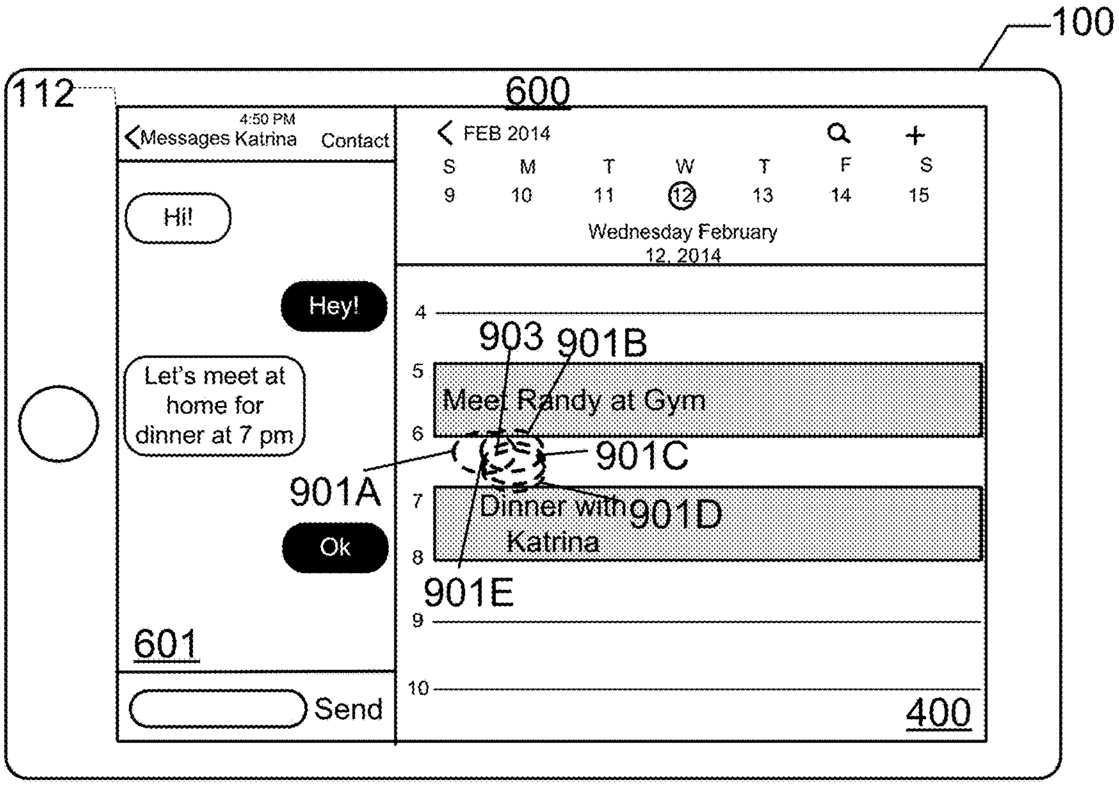

Alternatively, the computing device 100, in some embodiments, receives a close gesture from the user to dismiss the shared screen view, as shown in FIGS. 9A and 9B. In some embodiments, the close gesture includes five substantially simultaneous contacts of the user's fingers around a point 903 of the touch screen 112 as shown in FIG. 9A. Each contact 901A, 901B, 901C, 901D, and 901E with the touch screen 112 is made by one of the user's fingers. The computing device 100 detects substantially continuous movement of the contacts 901 towards the point 903 on the touch screen 112 without breaking contact with the touch screen 112 as illustrated by the direction of the arrows in FIG. 9A. Once the contacts 901 are within a locality (e.g., a threshold distance) of the point 903 as shown in FIG. 9B, the user lifts one or more of his or her fingers to signify the end of the close gesture. In response to detecting the close gesture, the computing device 100 dismisses the shared screen view 600 and displays the icon view 200 shown in FIG. 10A.

Figure 10A:
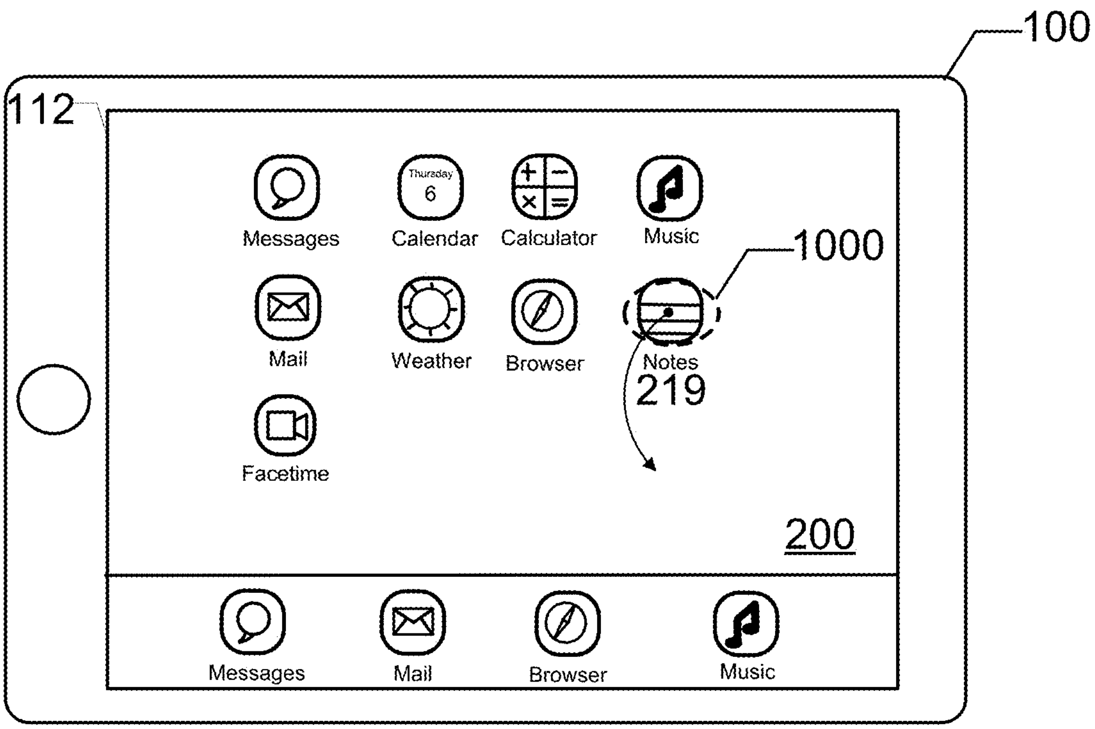
FIGS. 10A and 10B are schematics of a touch-sensitive display used to illustrate a gesture to activate a third application in the shared screen view, in accordance with some embodiments.
Figure 10B:
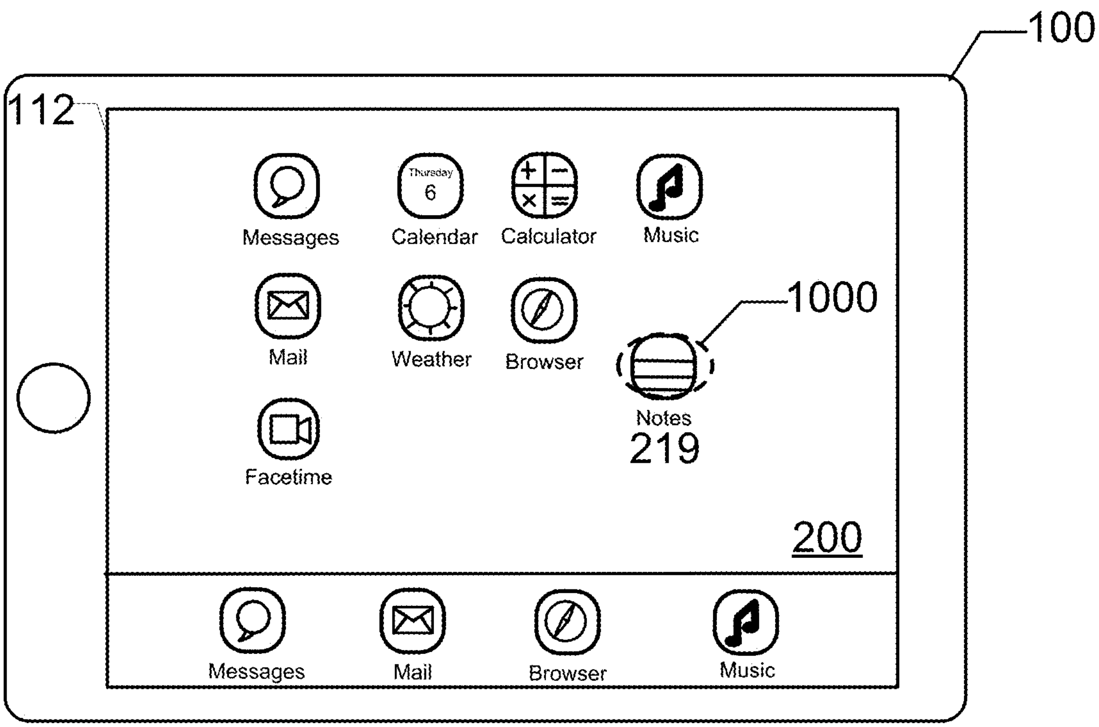

Also, FIG. 10A is a schematic of a touch-sensitive display used to illustrate the shared screen view gesture previously described above, in accordance with some embodiments. In FIG. 10A, the shared screen view gesture is directed towards the notes icon 219. The shared screen view gesture includes the selection of the notes icon 219 from the icon view 200 using the user's finger as indicated by contact 1000. The computing device 100 detects a gesture of the user dragging the notes icon 219 a threshold distance from the initial position of the icon in the icon view 200 to a second position within the icon view 200 shown in FIG. 10B in a continuous movement without contact 1000 breaking contact with the touch screen 112.

Figure 10C:
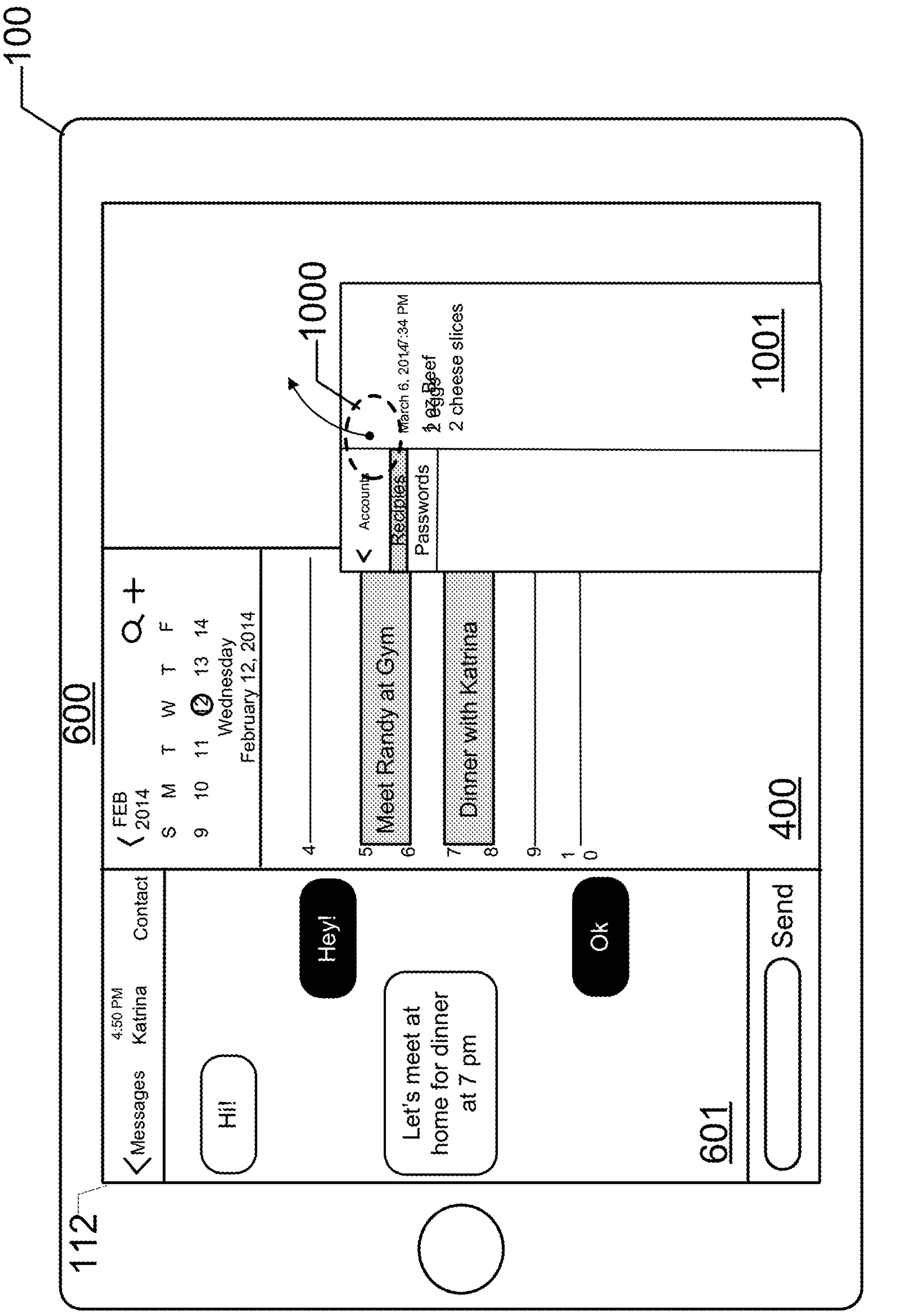
FIGS. 10C and 10D are schematics of a touch-sensitive display used to illustrate adding an additional application to the shared screen view, in accordance with some embodiments.
Figure 10D:
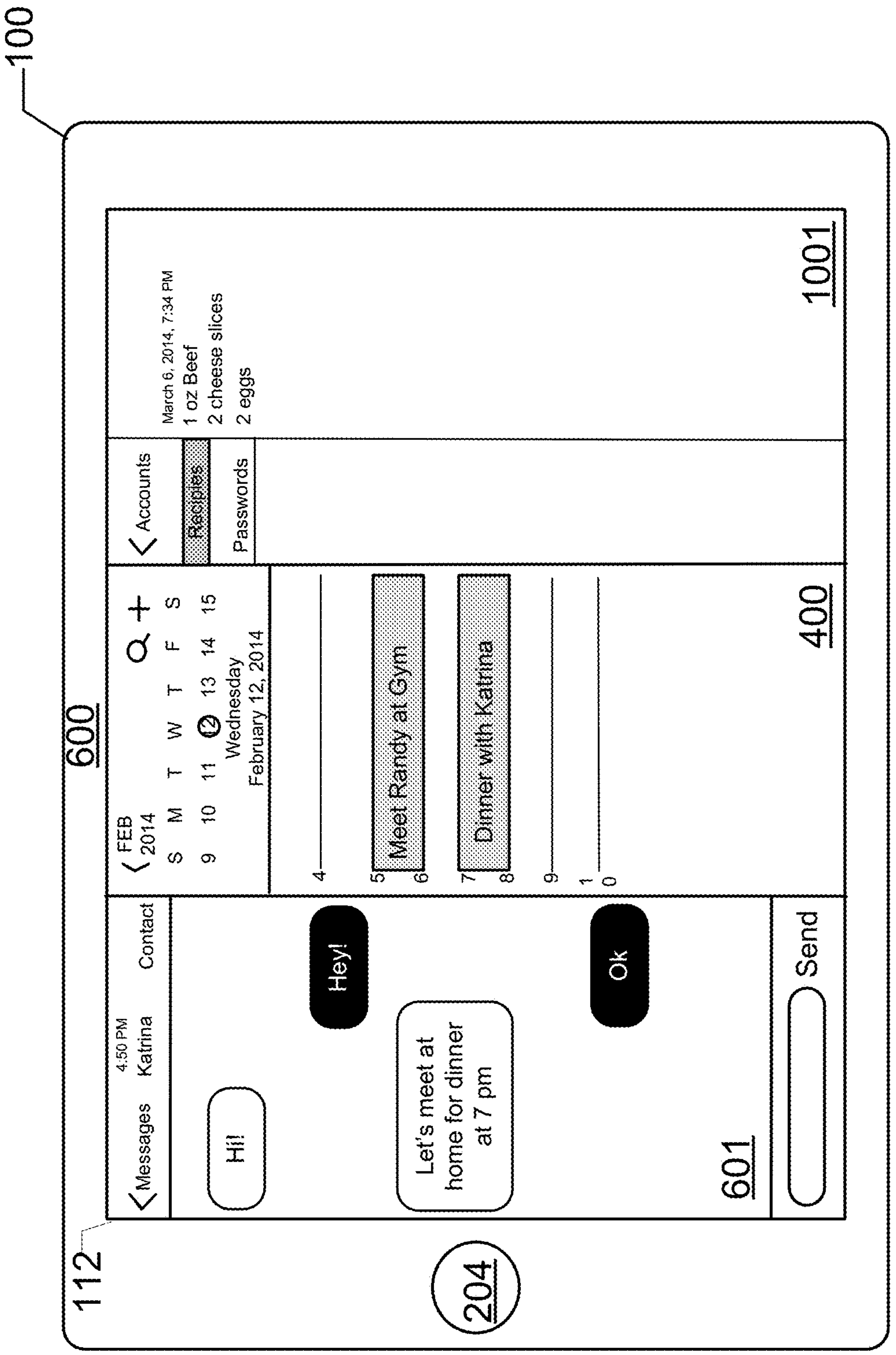

If multiple applications are already executing in the background of the computing device 100 at the time a shared screen view gesture is received, the computing device 100 displays the application view of the application being requested to be displayed in the shared screen view such that the application view is locked to the position of the user's finger on the touch screen 112. For example, responsive to the shared screen view gesture at the notes icon 219, the computing device 100 displays the shared screen view 600 as shown in FIG. 10C. The shared screen view 600 includes an image of the application view 1001 of the notes application displayed such that the top portion of the image of application view 1001 is associated with (i.e., following) the user's finger represented by contact 1000 in FIG. 10C. The user then drags and drops the application view 1001 to a desired location in the shared screen view 600. For example, the user positions the application view 1001 to the right of the application view 400 of the calendar application as shown in FIG. 10D. However, the user optionally positions the application view 1001 of the notes application anywhere in the shared screen view 600.

Figure 10E:
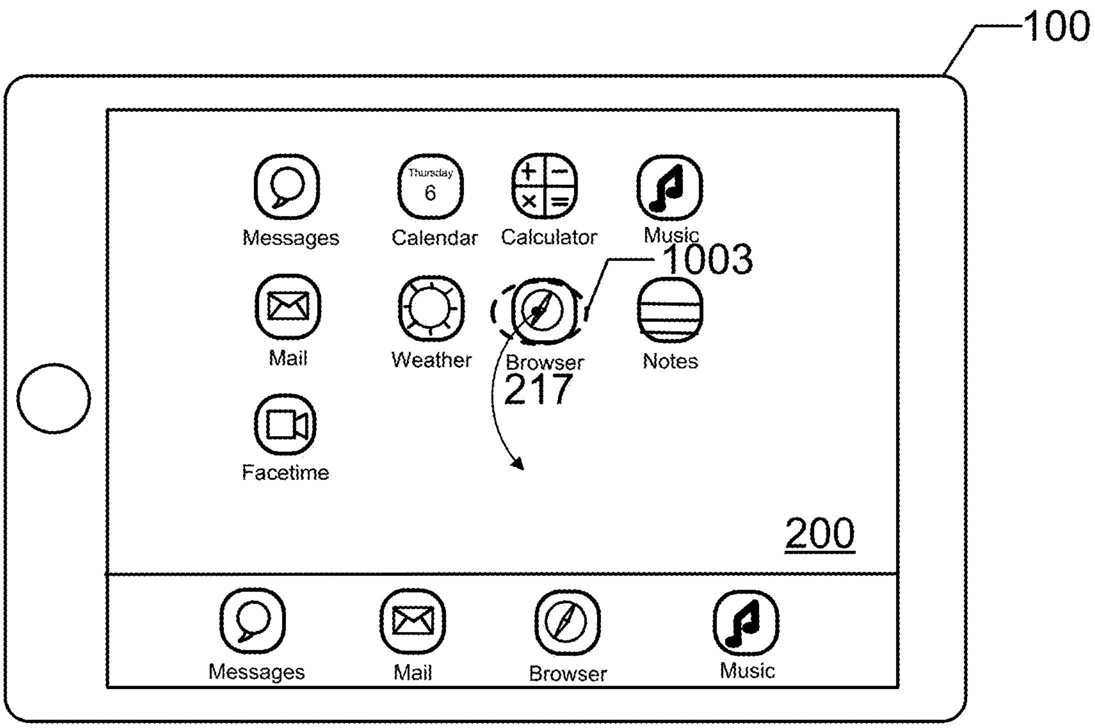
FIGS. 10E and 10F are schematics of a touch-sensitive display used to illustrate a gesture for adding a fourth application to the shared screen view, in accordance with some embodiments.
Figure 10F:
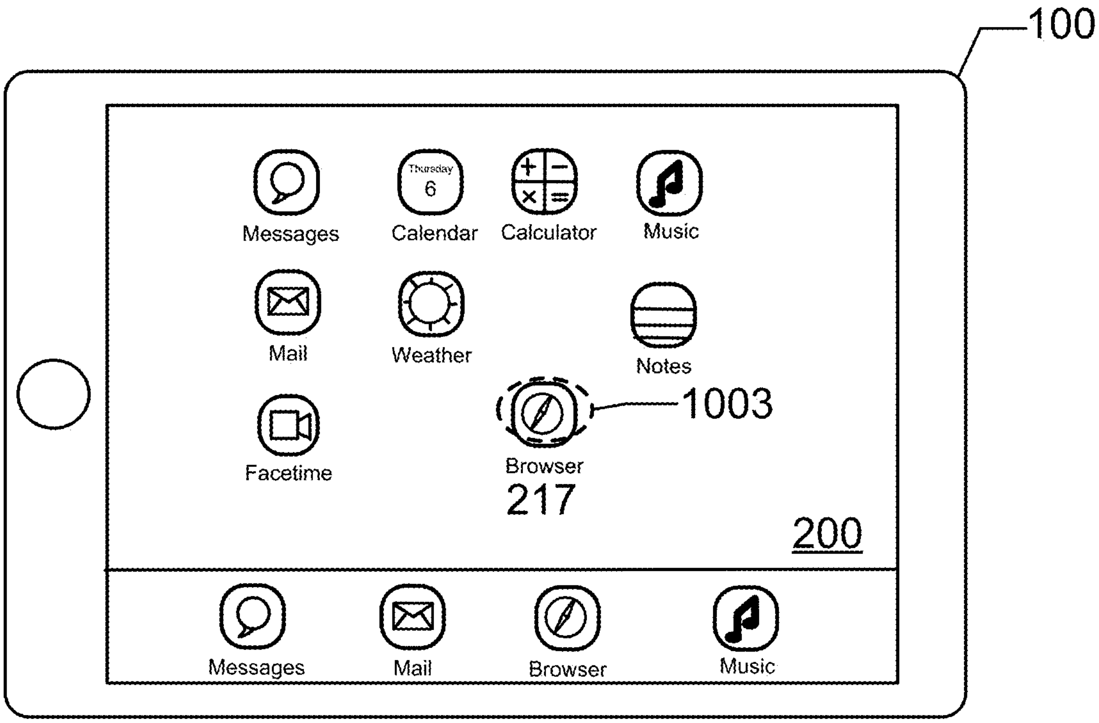

If the user selects the home button 204 in FIG. 10D, the shared screen view 600 is dismissed and the icon view 200 is displayed as shown in FIG. 10E. In FIG. 10E, the computing device 100 detects the shared screen view gesture directed towards the browser icon 217. The shared screen view gesture includes the selection of the browser icon 217 from the icon view 200 using the user's finger as indicated by contact 1003. The computing device 100 detects the user dragging the browser icon 217 a threshold distance from the initial position of the icon in the icon view 200 to a second position within the icon view 200 shown in FIG. 10F in a continuous movement without contact 1003 breaking contact with the touch screen 112.

Figure 10G:
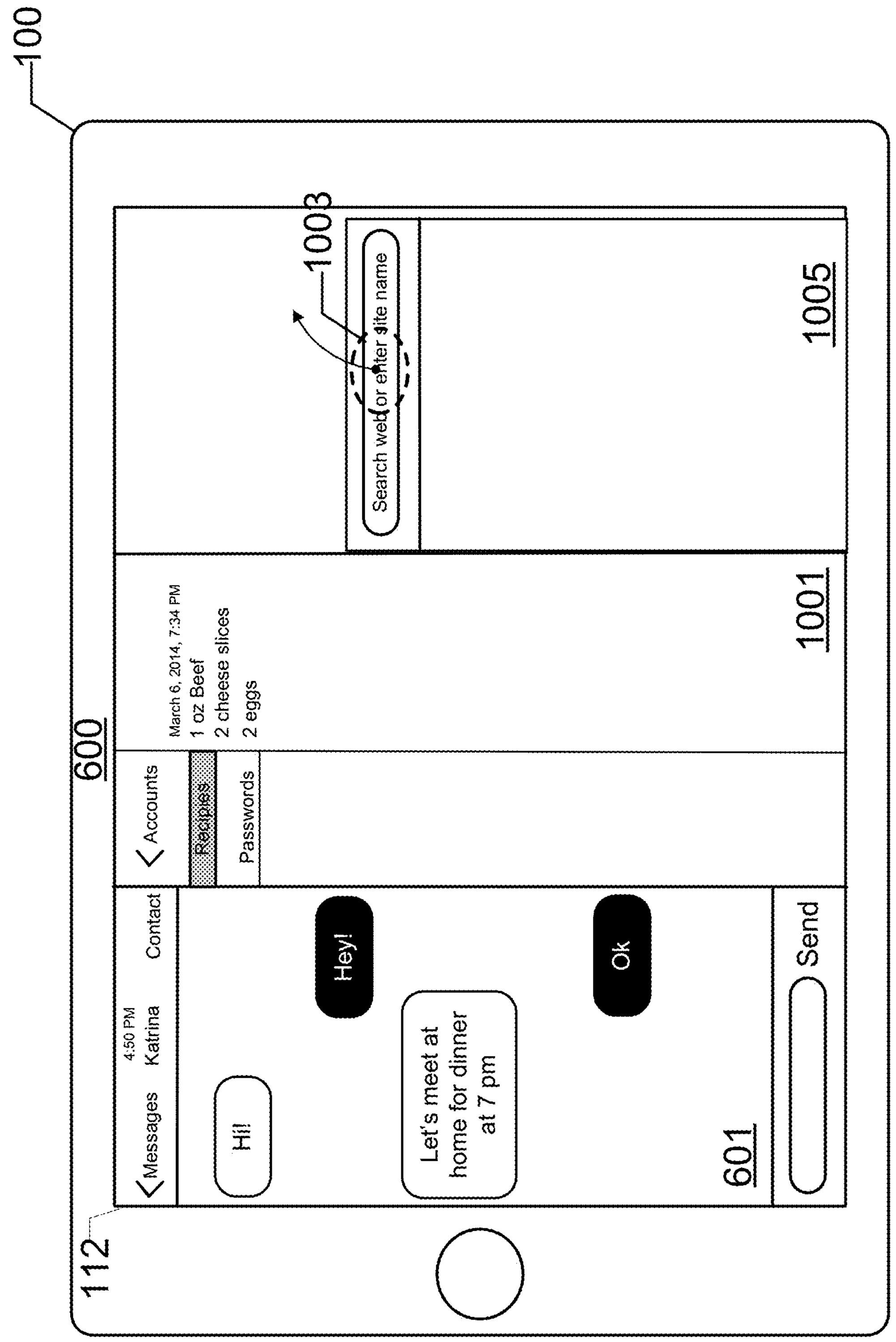
FIGS. 10G and 10H are schematics of a touch-sensitive display used to illustrate the fourth application added to the shared screen view and dismissal of the third application from the shared screen view, in accordance with some embodiments.

In FIG. 10D, three applications are displayed in the shared screen view 600. As mentioned previously, in some embodiments, the computing device 100 only displays multiple applications up to a maximum number of applications (e.g., three applications or, in other embodiments, two applications) in the shared screen view. Because the computing device 100 detected a request to add the browser application to the shared screen view 600, the number of applications in the shared screen view exceeds the maximum number. Accordingly, the computing device 100 removes one of the applications from the shared screen view 600 to allow for the text and graphics of each application to be shown in a visually pleasing and organized manner as shown in FIG. 10G. In some embodiments, the computing device 100 removes the application that the user interacted with the longest time ago from the shared screen view 600 (e.g., the calendar application). In other embodiments, a user of device 100 configures and determines the maximum number of applications capable of display within a shared screen view at the same time.

Figure 10H:
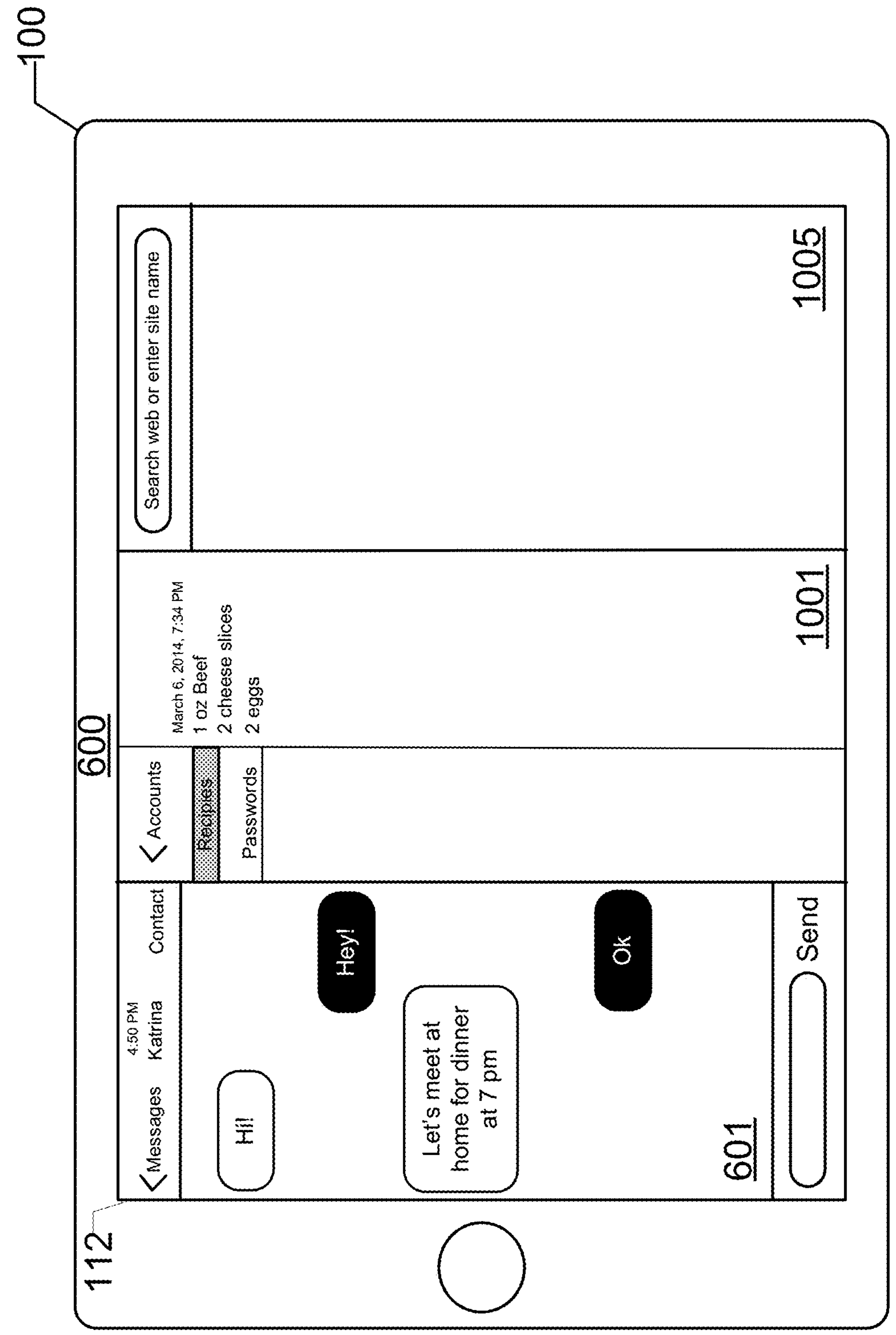

When the shared screen view 600 is displayed as shown in FIG. 10G, the application view 1005 of the browser application is displayed such that the top portion of the application view 1005 is locked to (i.e., following or tracking) the user's finger represented by contact 1003. The user then drags and drops the application view 1005 of the browser application to a desired location in the shared screen view 600. For example, the user positions the application view 1005 to the right of the application view 1001 of the notes application as shown in FIG. 10H. Thus, the shared screen view 600 now includes the application view 601 of the messages application, the application view 10001 of the notes application, and the application view 1005 of the browser application.

Figure 11A:
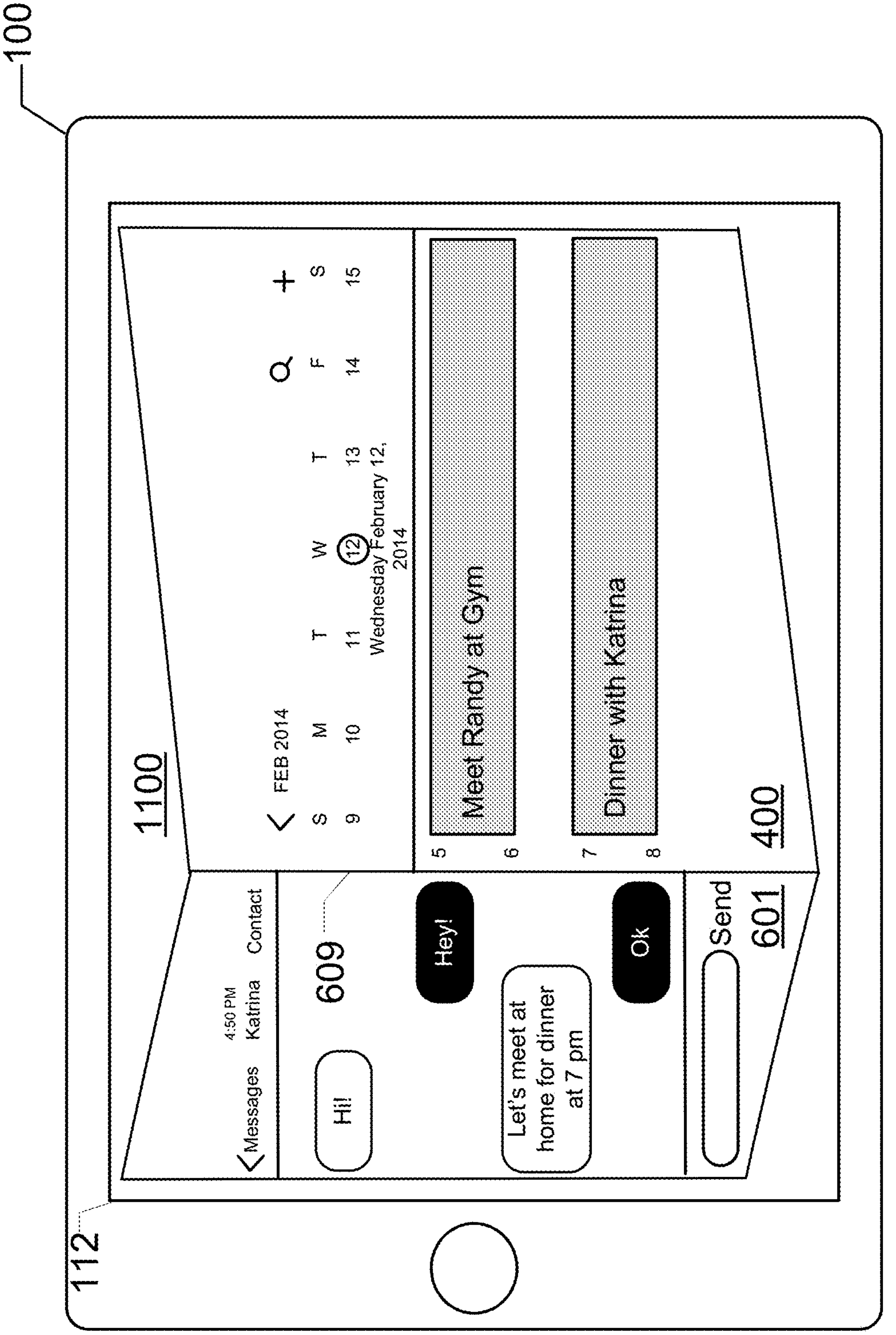
FIGS. 11A-11C are schematics of a touch-sensitive display used to illustrate an alternative implementation of a shared screen view, in accordance with some embodiments.

FIG. 11A is a schematic of a touch-sensitive display used to illustrate a shared screen view 1100, in accordance with some alternative embodiments. The shared screen view 1100 shown in FIG. 11A is displayed in a three-dimensional (3D) "bent" appearance. In some embodiments, the shared screen view 600 is always displayed in the bent appearance. Alternatively, the bent appearance of the shared screen view 600 is displayed only when the widths of the application views are being adjusted. In the 3D bent appearance, application views (e.g., application view 601 and 400) displayed in the shared screen view 1100 are each displayed on the touch screen 112 with a perspective effect such that each of the application views are angled or in a tubular carousel with respect to the dividing line 609 of the applications as shown in FIG. 11A.

Figure 11B:
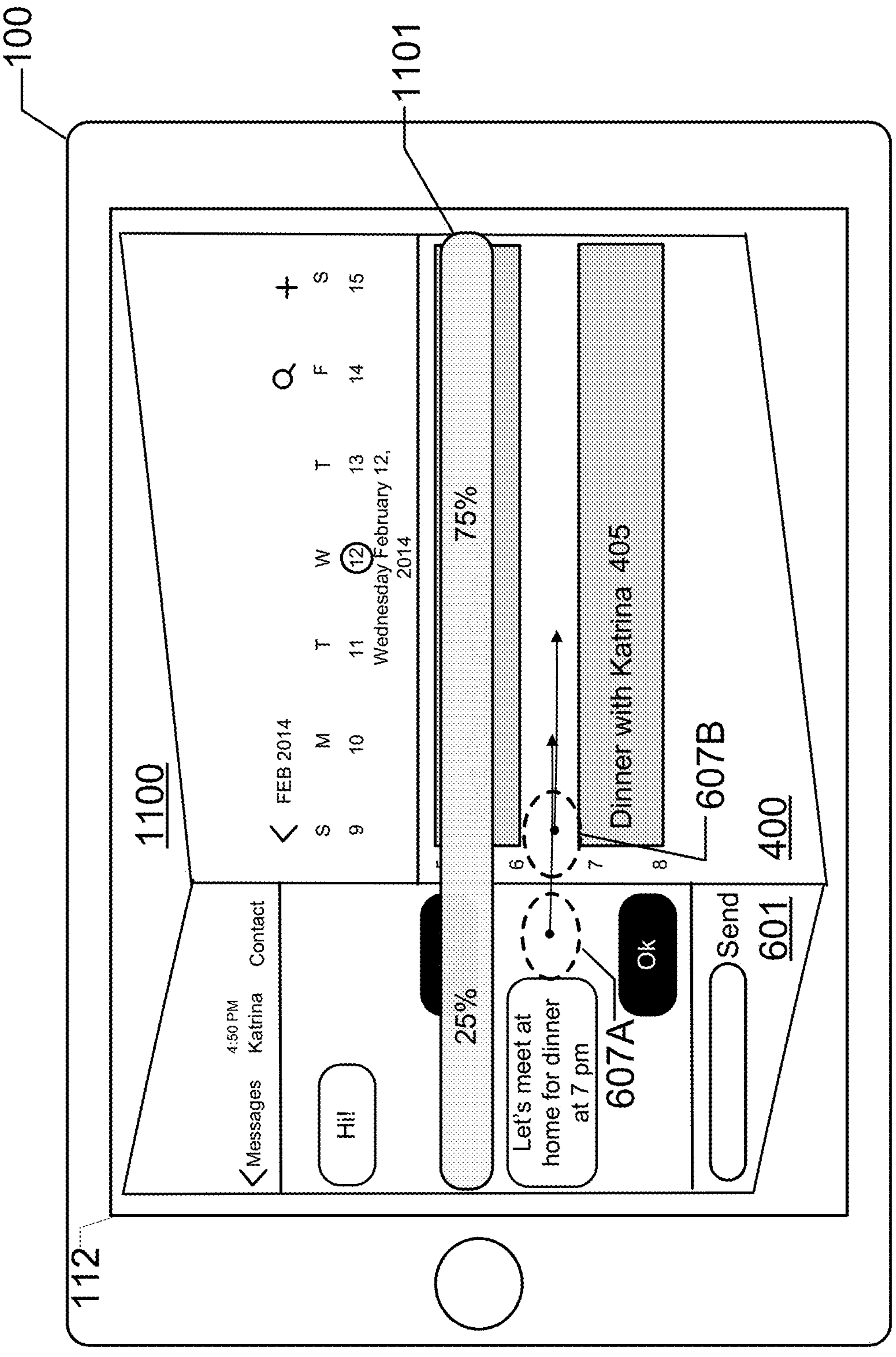

FIG. 11B is a schematic of a touch-sensitive display used to illustrate a resize gesture, in accordance with the alternative embodiments described above. As shown in FIG. 11B, contact 607A on application view 601 represents the user's first finger contacting the touch screen 112 and contact 607B on application view 400 represents the user's second finger contacting the touch screen 112. In response to detecting contact 607A and contact 607B, the computing device 100 displays a visually distinguished UI element 1101 that indicates measurements of the total area (or width or some other appropriate metric) of touch screen 112 occupied by each of the applications displayed in the shared screen view 1100. In the example shown in FIG. 11B, the UI element 1101 is a translucent horizontal bar displayed across at least a portion of the shared screen view. In alternative embodiments, the UI element 1101 is opaque or solid.

In some embodiments, the measurement indicated by the UI element 1101 is a percentage of the touch screen 112 occupied by each of the applications displayed in the shared screen view 1100. For example, the UI element 1101 indicates that the application view 601 occupies 25% of the touch screen 112 whereas the application view 400 occupies 75% of the touch screen 112. Alternatively, the measurement is a pixel width of the touch screen 112 occupied by each of the applications displayed in the shared screen view 1100. In another example, the measurement indicates at least one of a first width option describing a predetermined width for the first application in which the first application can be displayed and a second width option describing a predetermined width for the second application in which the second application can be displayed if one or more of the applications can only be resized to predetermined widths. Note that the UI element 1101 is optionally displayed in the shared screen view 600 shown in FIG. 6B responsive to the computing device 100 detecting contact 607A and contact 607B.

Figure 11C:
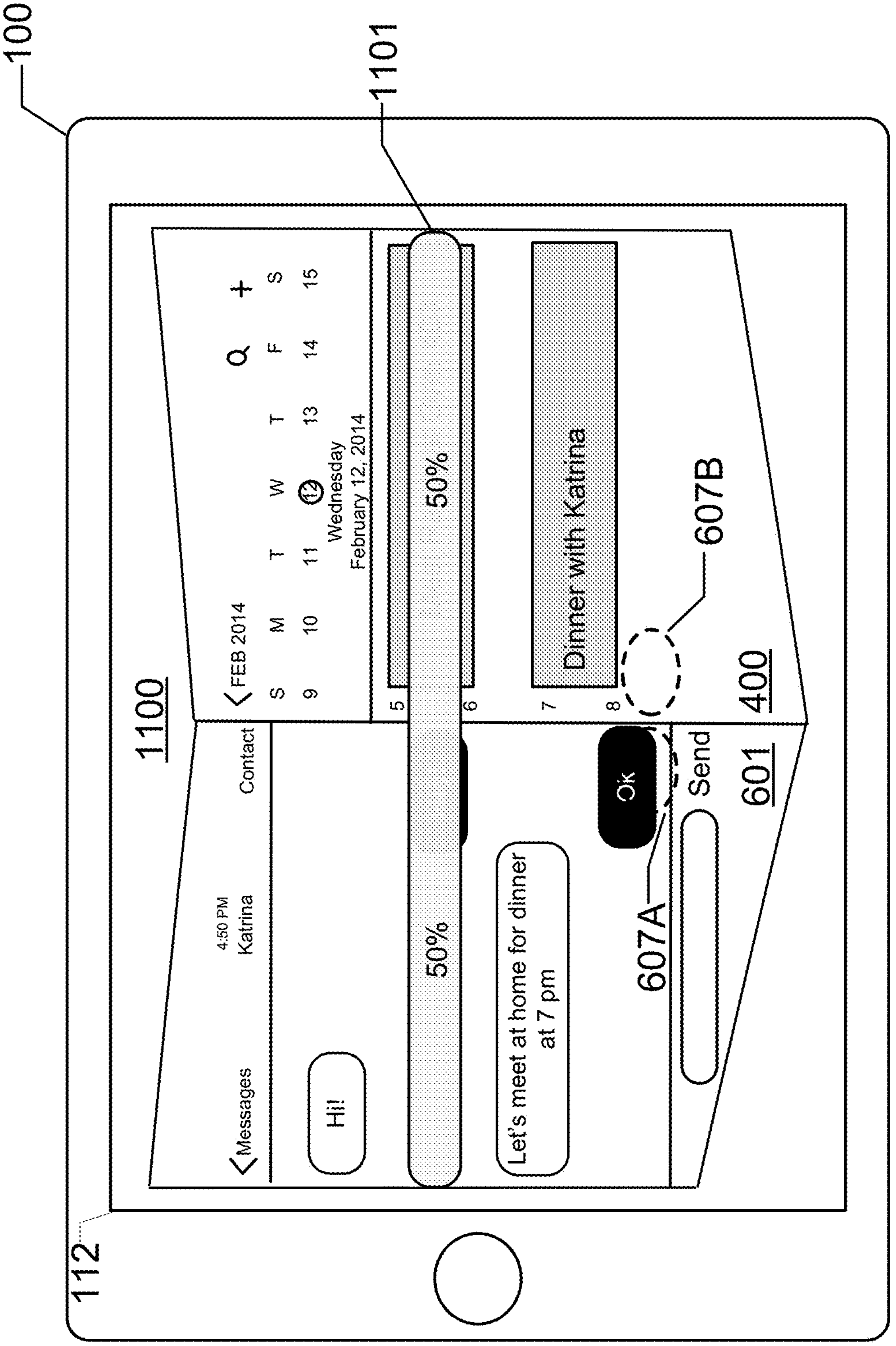

Similar to FIG. 6B, the resize gesture shown in FIG. 11A indicates a request to increase the width of application view 601 and decrease the width of application view 400 as indicated by the direction of the arrows to the right. As contact 607A and 607B move to the right, the width of application view 601 increases and the width of application view 400 decreases. Furthermore, as contact 607A and 607B move to resize the applications, the UI element 1101 is updated to indicate the current measurements of width of the applications displayed in the shared screen view 1100. For example, FIG. 11C is a schematic of a touch-sensitive display used to illustrate that the UI element 1101 is updated to indicate that the application view 601 now occupies 50% of the touch screen 112 and application view 400 now occupies 50% of the touch screen 112 as a result of the resize gesture.

In some embodiments, the computing device 100 displays notifications indicating activities or events associated with applications on computing device 100. When an activity or an event occurs, the computing device 100 displays a notification informing the user of the activity. An activity includes receiving a text message in the messages application from another computing device 100, displaying a reminder of an upcoming event indicated in the calendar application, receiving an e-mail in the mail application, receiving a request for a video chat in the video chat application, or any other type of activity.

Figure 12A:
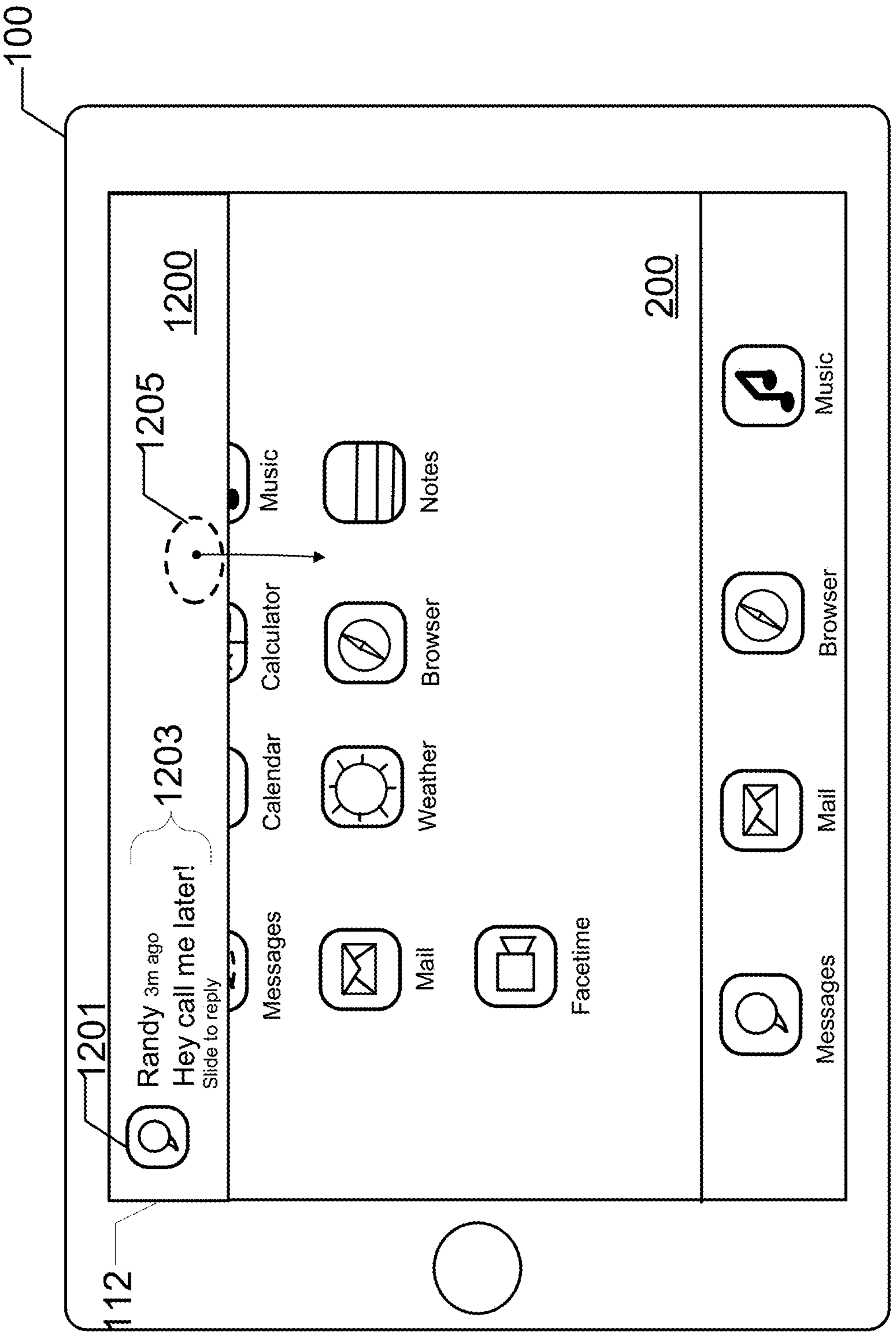
FIGS. 12A-12C are schematics of a touch-sensitive display used to illustrate activating the shared screen view via a notification, in accordance with some embodiments.
Figure 12B:
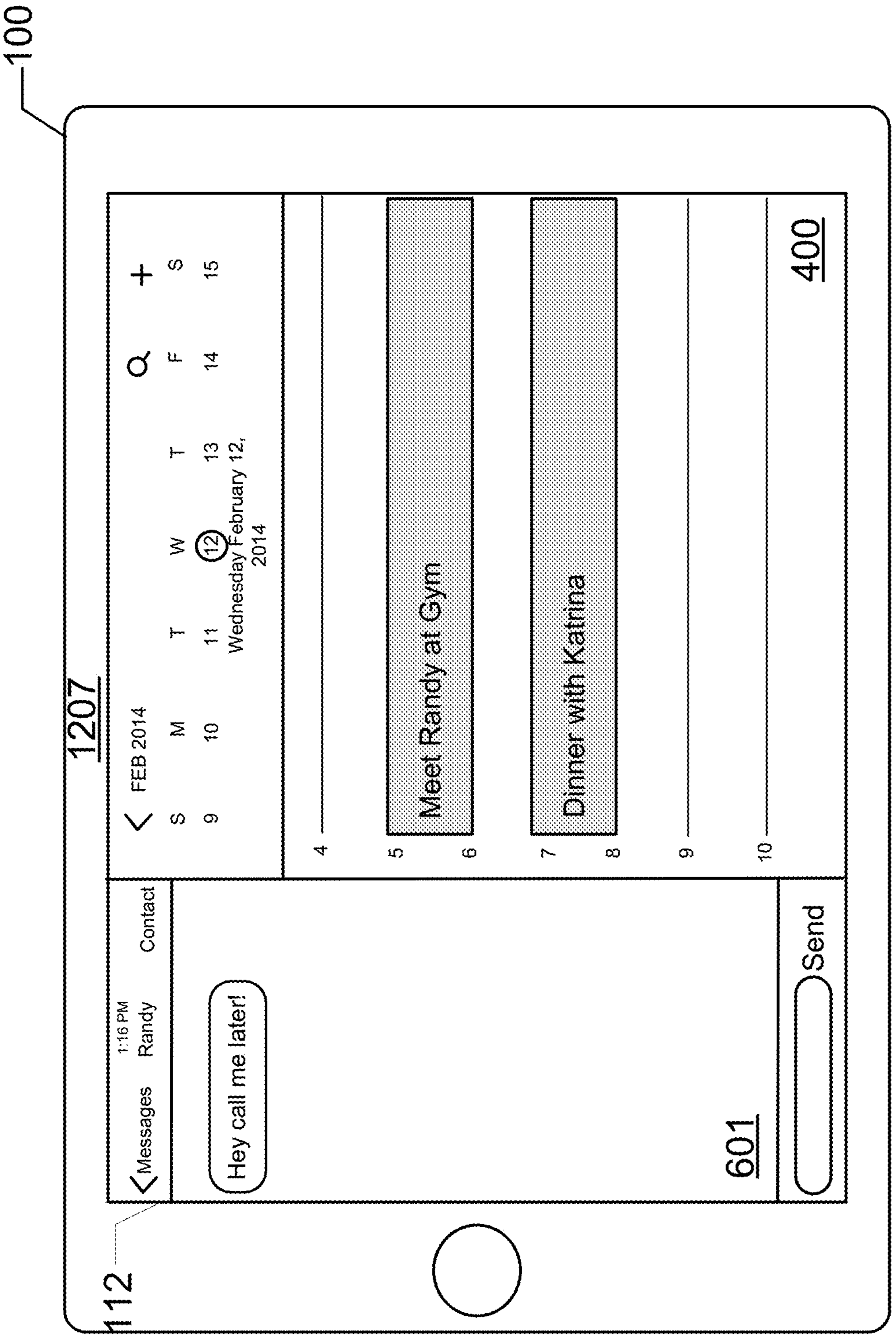

FIG. 12A is a schematic of a touch-sensitive display used to illustrate the home screen (e.g., icon view 200) of computing device 100 displayed with a notification 1200. As shown in FIG. 12A, in some embodiments the notification 1200 is a banner or an alert overlaying at least a portion of the icon view 200. The notification 1200 optionally includes an image 1201 representing the application associated with the activity and a summary 1203 of the activity. The type of information included in the summary 1203 is dependent on the type of application associated with the activity. Each type of application optionally includes a default set of information to include in the summary 1203 of an activity. For example, the notification 1200 shown in FIG. 12A is associated with the messages application. The summary for the messages application includes the name of the person who sent the text message, a time stamp indicating when the message was sent, and a portion of the text message.

In some embodiments, the user activates the application associated with the notification in the shared screen view via a shared screen view gesture on the notification. Note that the shared view gesture shown in FIG. 12A is different than the shared screen view gesture described above with respect to FIGS. 5A and 5B.

The shared screen view gesture shown in FIG. 12A includes a single finger touch of the notification 1200 represented by contact 1205 followed by a downward swipe or gesture on the notification 1200 as indicated by the arrow in FIG. 12A without contact 1205 breaking contact with the touch screen 112. The shared screen view 1207 shown in FIG. 12B includes an application view 601 of the messages application and an application view 400 of the calendar application as described above.

Figure 12C:
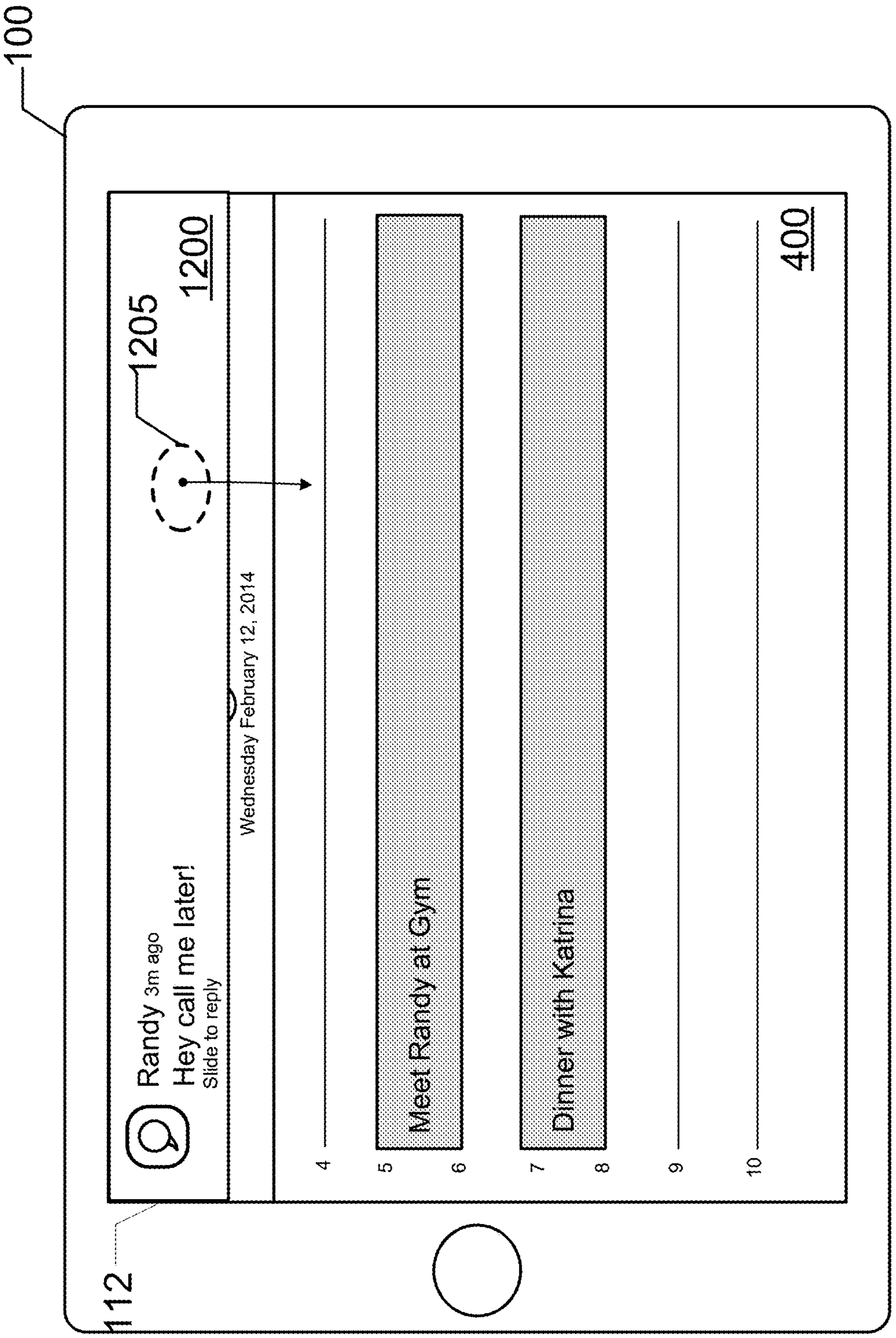

Notifications can also be displayed while an application view of an application is displayed on the touch screen 112 as shown in FIG. 12C. Notification 1200 is displayed in response to an activity or occurrence of an event (e.g., receiving a new text message) while the application view 400 of the calendar application is displayed on the touch screen 112. Similar to FIG. 12A, the notification 1200 is associated with the messages application (e.g., instant message module 141). The computing device 100 detects the shared screen view gesture as described above with respect to FIG. 12A and the computing device 100 displays the messages application in the shared screen view.

Additional details regarding gestures for interacting with a notification while in the shared screen view are discussed below in reference to FIGS. 46A-47C.

Figure 13A:
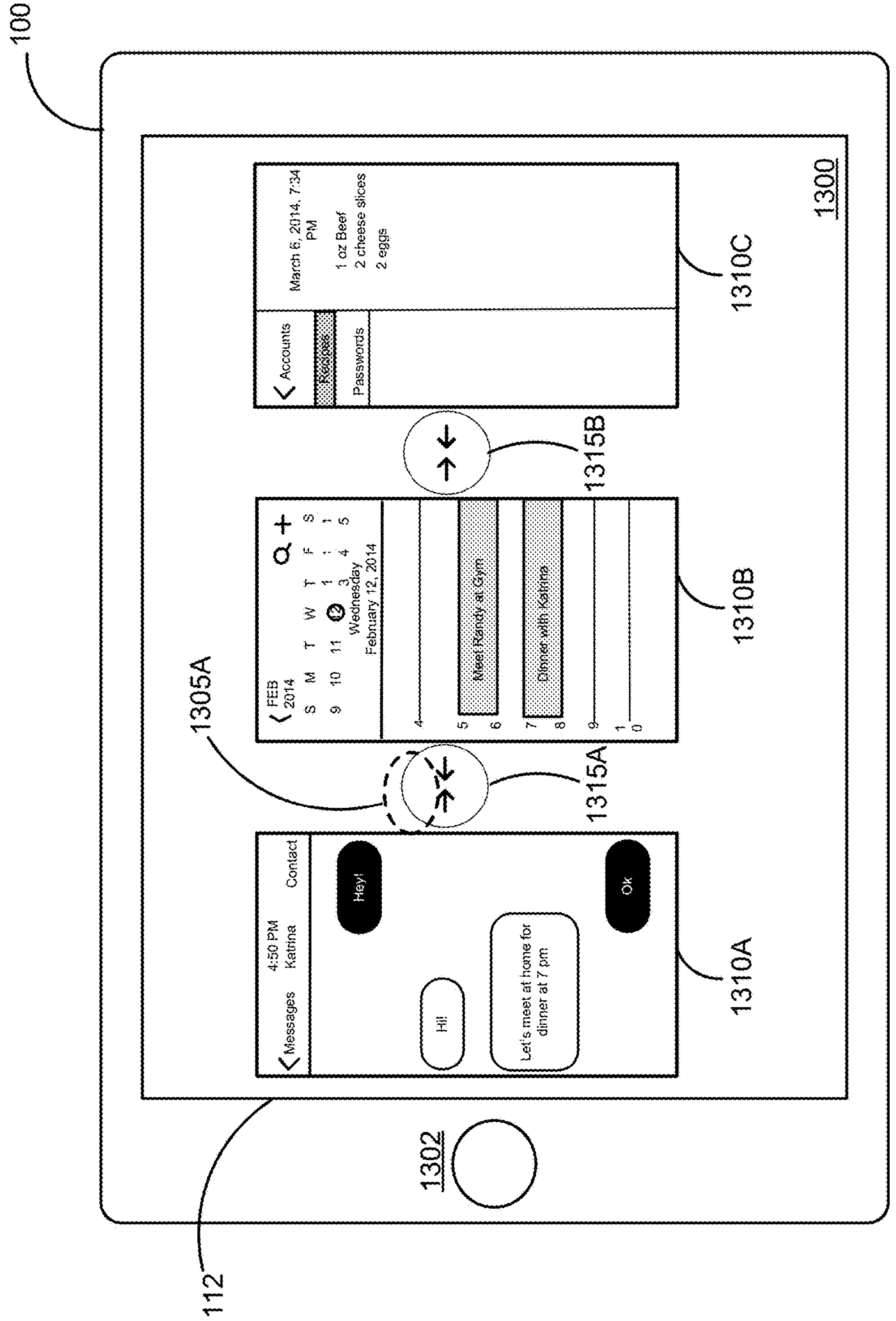
FIGS. 13A and 13B are schematics of a touch-sensitive display used to illustrate joining applications while in an array view of applications, in accordance with some embodiments.
Figure 13B:
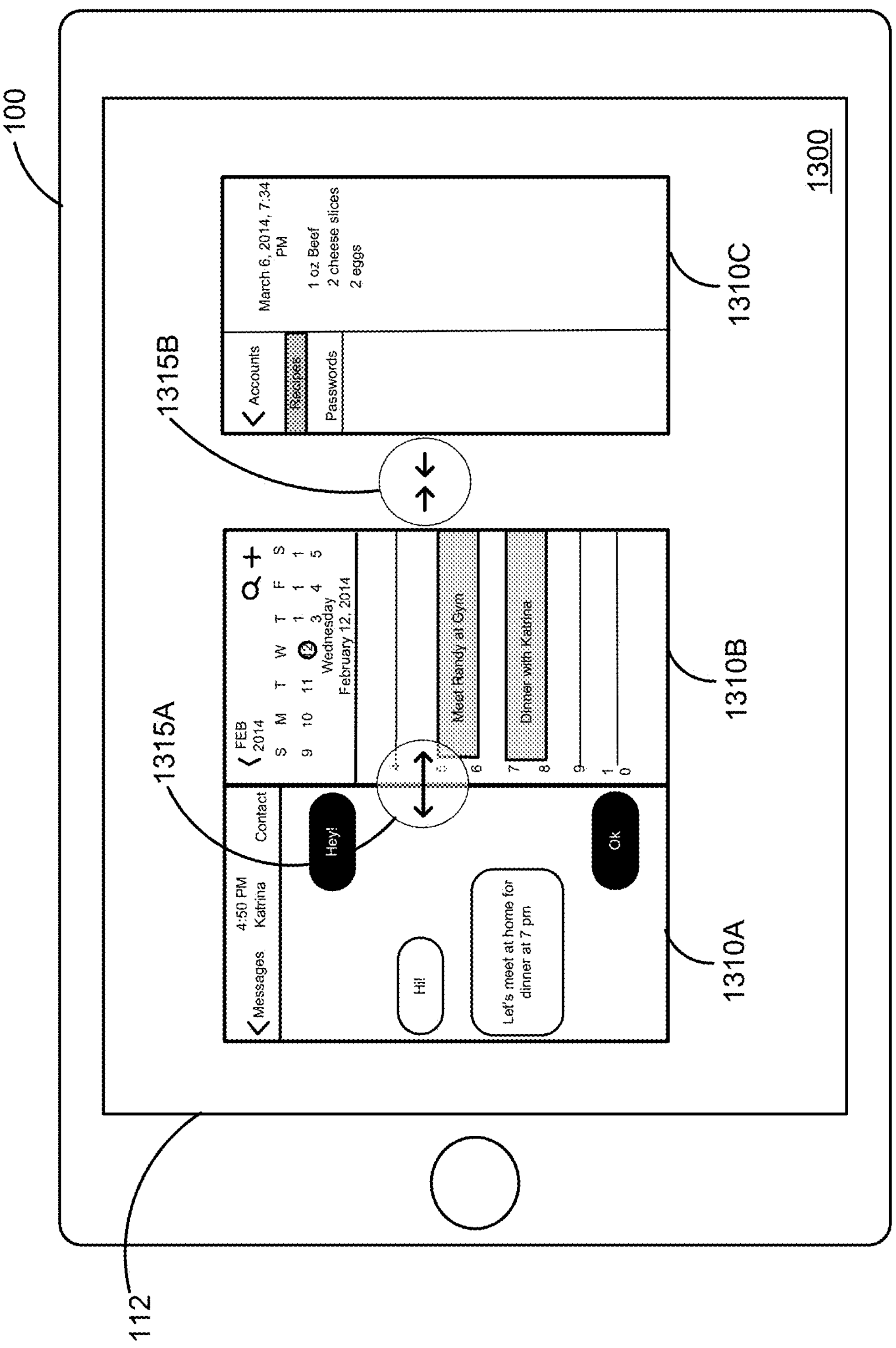
Figure 13C:
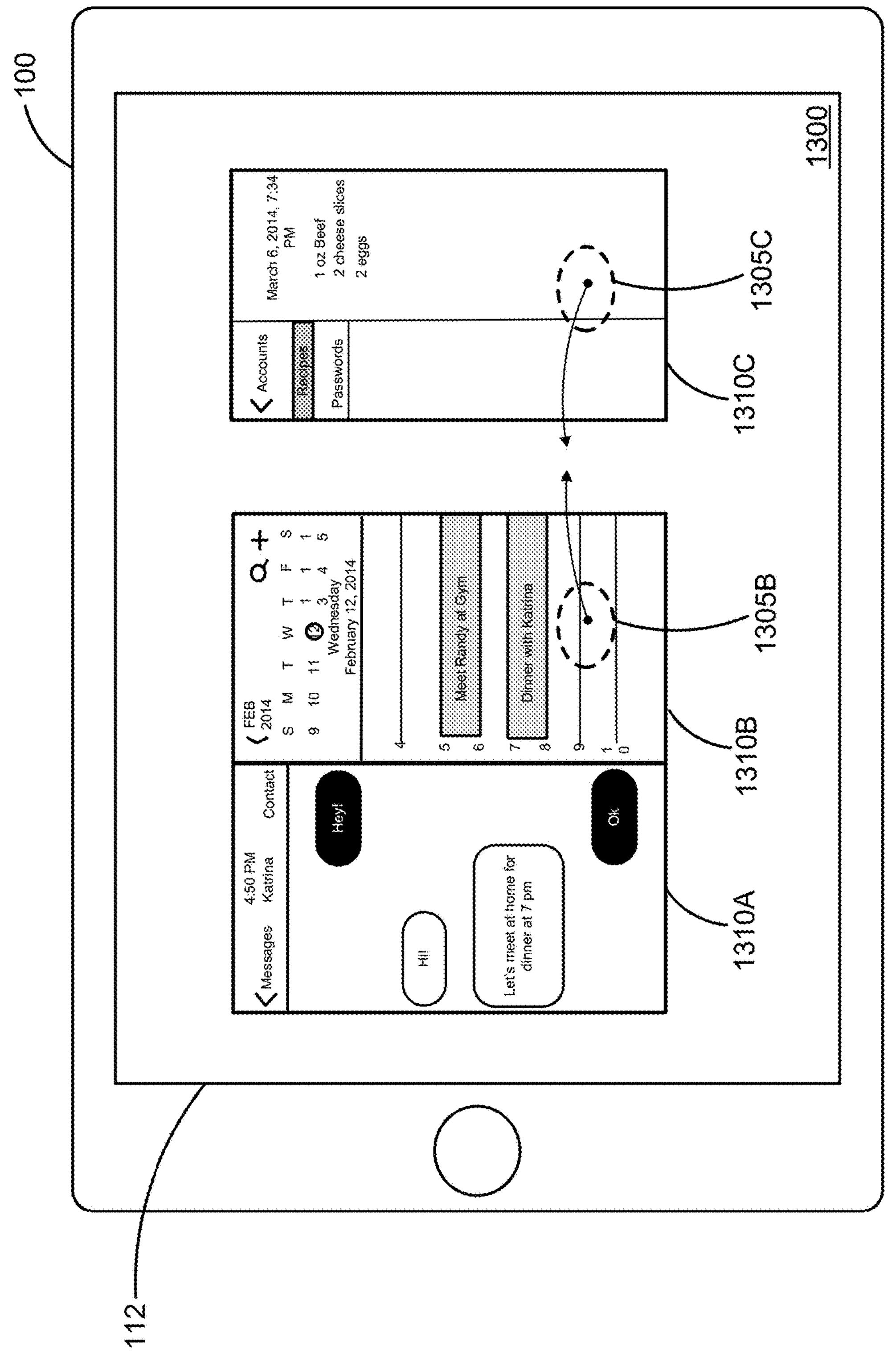
FIGS. 13C-13E are schematics of a touch-sensitive display used to illustrate additional gestures for joining applications while in an array view of applications, in accordance with some embodiments.

FIGS. 13A, 13B, and 13C are schematics of a touch-sensitive display used to illustrate joining applications in a array view of the computing device, in accordance with some embodiments. An array view allows a user to customize the user's multitasking environment (e.g., make modifications to configurations of a shared screen view). The array view can be accessed, for example, by double clicking any hardware button, such as a menu button 1302. Specifically, applications presented in the shared screen view of the user can be reordered or modified (e.g., remove an application, add an application). When reordering applications, a user can join or unjoin discrete mini apps in the array view where joining and unjoining a discrete mini app corresponding to an application is indicative of adding the application to and removing the application from, respectively, the shared screen view.

In some embodiments, the applications in the array view are applications currently running on the computing device 100 and, in some other embodiments, the applications in the array view can be all applications installed on the computing device 100. The applications are presented as discrete miniature (mini) applications (apps) and the discrete mini apps display application views (i.e., active or cached views) of the corresponding applications. However, the displayed application views cannot be interacted with by a user of the computing device 100. In some embodiments, user interface elements are displayed between each pair of discrete mini apps in the array view.

FIG. 13A is a schematic of a touch-sensitive display used to illustrate an array view 1300 of the computing device 100, in accordance with some embodiments. As shown in FIG. 13A, the array view displays multiple applications as discrete mini apps 1310 that are unjoined. The displayed multiple discrete mini apps include applications that are executing in the background of the computing device 100. In some embodiments, the displayed multiple discrete mini apps also include all applications installed on the computing device 100. In these embodiments, the discrete mini apps of applications executing in the background are presented before (e.g., towards the left) the other applications installed but not executing in the background of the computing device 100. The discrete mini apps are presented in a horizontal array in some embodiments.

In some embodiments, a user can use user interface elements 1315 to reorder or modify the applications presented in the shared screen view. A user interface element 1315 is, in some embodiments, displayed between each or one or more pairs of discrete mini apps in the array view. The user interface element 1315 can include visual indicators that indicate the pair of discrete mini apps can be joined. For example, the visual indicators can include arrows, patterns, colors, animations, or any other suitable indicator of joining discrete mini apps to display in a shared screen view. For example, if the user interface element is between two unjoined discrete mini apps, such as user interface element 1315A in FIG. 13A between unjoined discrete mini apps 1310A and 1310B, the visual indicators are arrows pointing inwards from the two discrete mini apps 1310A and 1310B.

To join two unjoined discrete mini apps, such as 1310A and 1310B, a user can use a gesture to select a user interface element 1315A between the discrete mini apps 1310A and 1310B. The gesture can be a contact 1305A at a location corresponding to the user interface element 1315A displayed on the computing device 100. Responsive to detection of the contact 1305A, the discrete mini apps 1310A and 1310B are placed substantially adjacent to each other, as shown in FIG. 13B. For example, the discrete mini apps 1310A and 1310B can be placed closer together as shown in FIG. 13A, can share an edge as shown in FIG. 13B, or can be presented visually distinguished from when the discrete mini apps 1310A and 1310B were unjoined in FIG. 13A.

Additionally, responsive to detection of the contact 1305A, the user interface element 1315A can be visually distinguished to include visual indicators that indicate the pair of discrete mini apps 1310A and 1310B can be unjoined, as shown in FIG. 13B. For example, if the visual indicators to indicate that a pair of discrete mini apps could be joined were arrows pointing inwards from the pair of discrete mini apps towards each other, then the visual indicators to indicate that the pair could be unjoined can be arrows pointing outwards towards the pair of discrete mini apps away from each other, as shown in FIG. 13B. As also shown in FIG. 13B, the user interface element 1315A can be displayed over the shared edge between the discrete mini apps 1310A and 1310B. In a similar manner as described previously in FIG. 13A, selection of the user interface element 1315A in FIG. 13B will unjoin the discrete mini apps 1310A and 1310B and revert to a display similar to that in FIG. 13A.

Figure 13D:
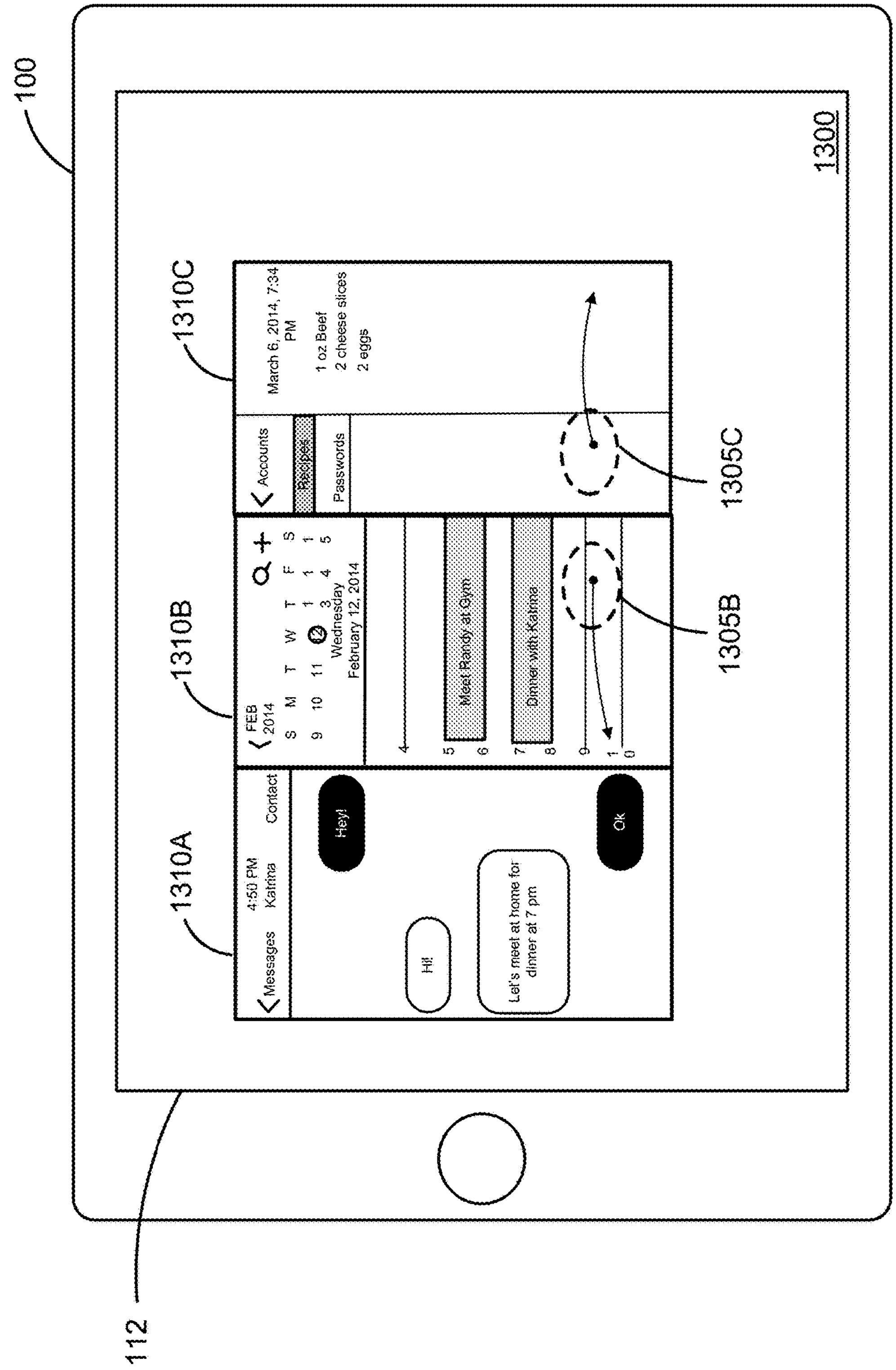

In some embodiments, discrete mini apps can be joined to be displayed in a shared screen view based on a gesture, as shown in FIGS. 13C and 13D. Thus, in these embodiments, instead of user interface elements 1315, a user can use a gesture to join two discrete mini apps together. For example, as shown in FIG. 13C, the join gesture can include a first contact 1305B and a substantially simultaneous second contact 1305C. As the first contact 1305B and second contact 1305C move across the touch screen 112, the computing device 100 determines a distance between the first contact 1305B and second contact 1305C. In some embodiments, the discrete mini apps 1310B and 1310C are joined together, as shown in FIG. 13D, if the distance decreases to less than a threshold distance. For example, the distance can decrease in a substantially horizontal direction. In some other embodiments, the discrete mini apps 1310B and 1310C slide closer together until they are joined based on the distance between the first contact 1305B and the second contact 1305C. For example, the discrete mini apps 1310B and 1310C slide closer together proportional to the distance between the first and second contacts.

Figure 13E:
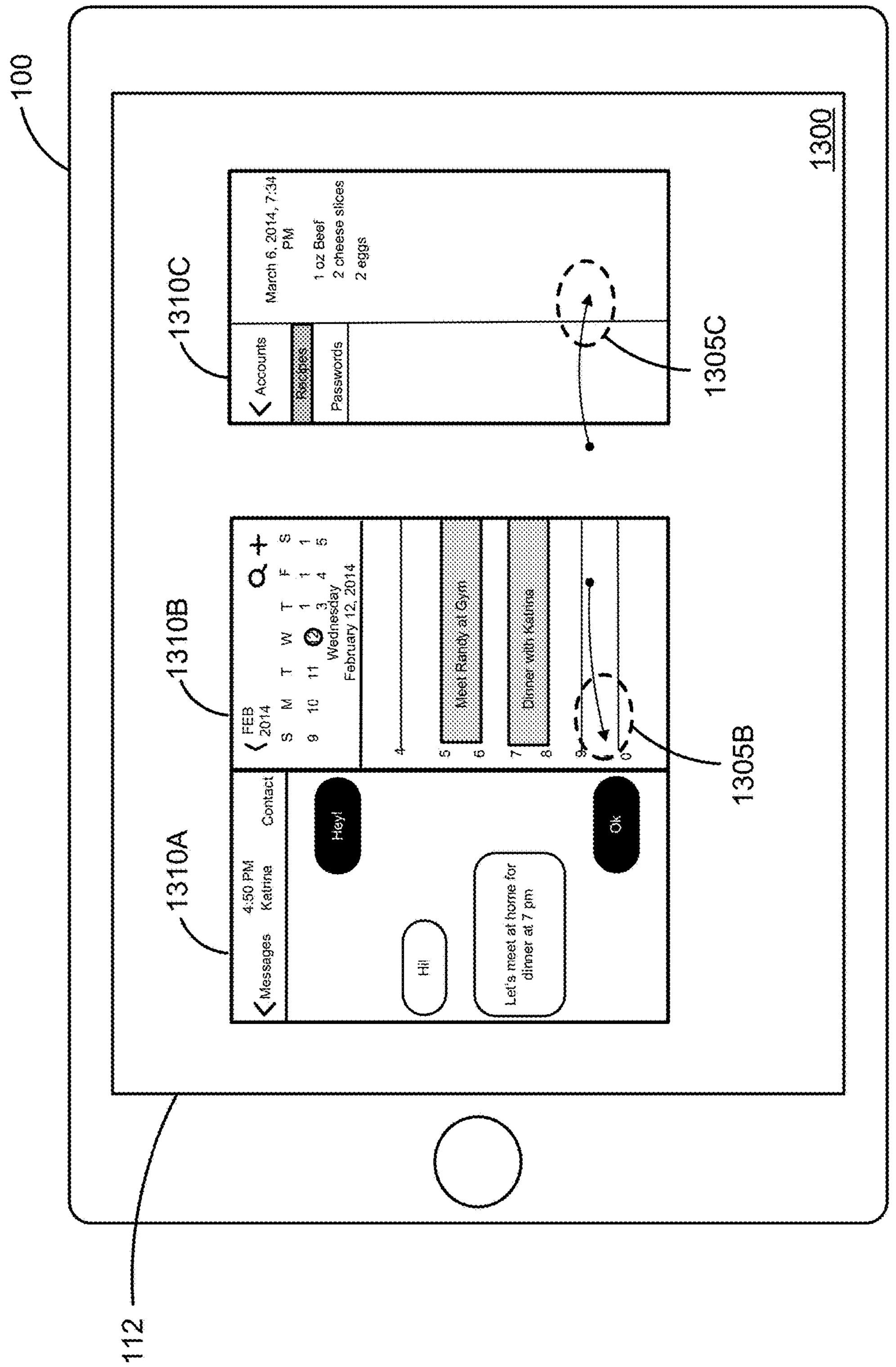

FIGS. 13D and 13E are schematics of a touch-sensitive display used to illustrate separating or unjoining applications in an array view of the computing device, in accordance with some embodiments. In a similar manner as the join gesture described in conjunction with FIGS. 13C and 13D, a gesture can be used to unjoin two discrete mini apps joined together, as shown in FIG. 13D. The unjoin gesture can include a first contact 1305B and a concurrent second contact 1305C. As the first contact 1305B and second contact 1305C move across the touch screen 112, the computing device 100 determines a distance between the first contact 1305B and second contact 1305C.

In some embodiments, the discrete mini apps 1310B and 1310C are unjoined, as shown in FIG. 13E, if the distance exceeds a threshold distance. For example, the distance can increase in a substantially horizontal direction. In some other embodiments, the discrete mini apps 1310B and 1310C slide apart from each other until they are unjoined based on the distance between the first contact 1305B and the second contact 1305C. For example, the discrete mini apps 1310B and 1310C slide apart from each other proportional to the distance. The discrete mini apps 1310B and 1310C can slide apart until a predetermined separation distance is met where the predetermined separation distance is a set distance between two discrete mini apps unjoined in the array view 1300. Further examples described herein are described with the user interface elements but the join/unjoin functionality, in some embodiments, can also be accessed by using the join and unjoin gestures instead.

Figure 14A:
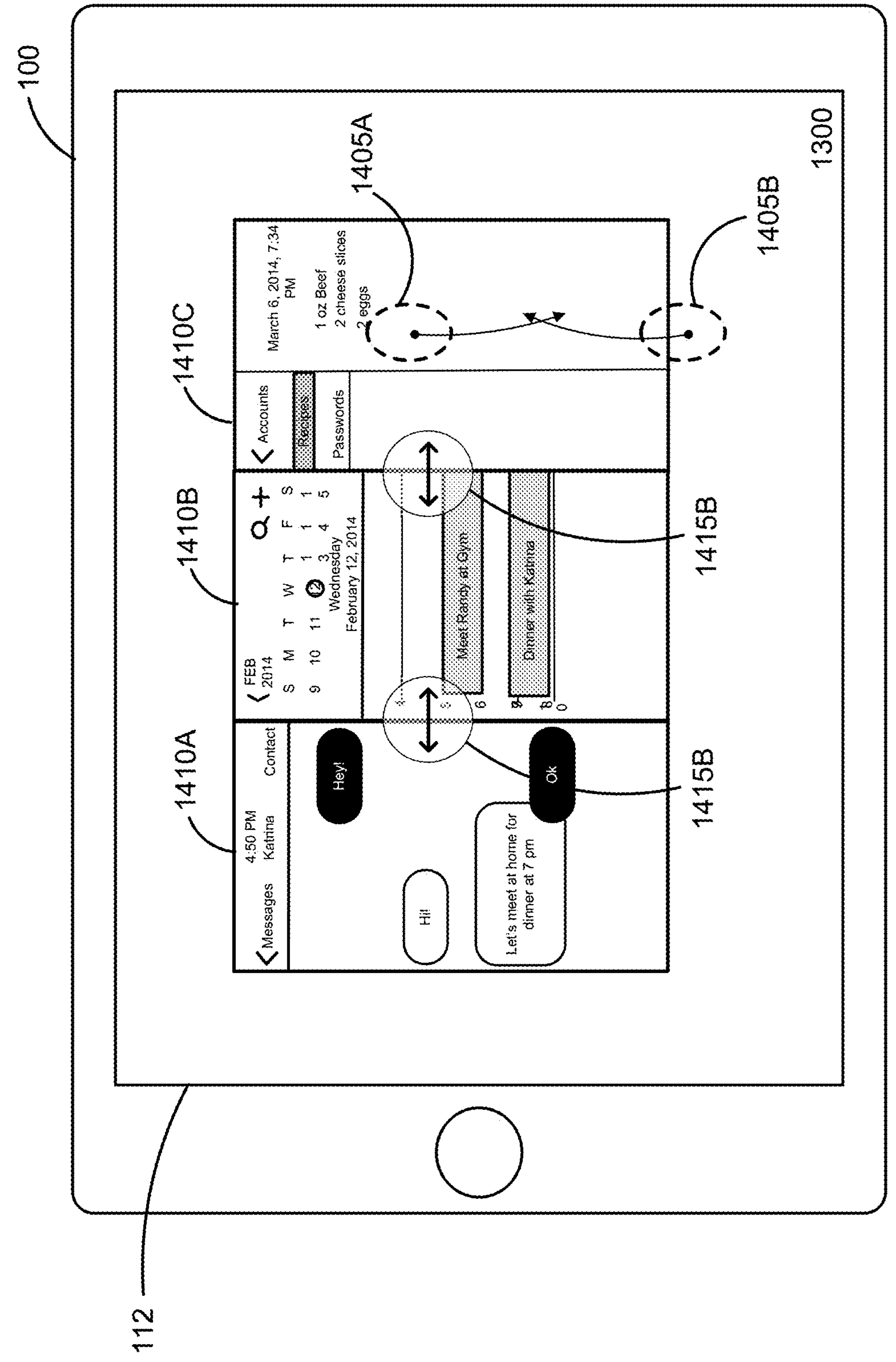
FIGS. 14A-14C are schematics of a touch-sensitive display used to illustrate gestures to display additional applications in a zoomed out array view, in accordance with some embodiments.
Figure 14B:
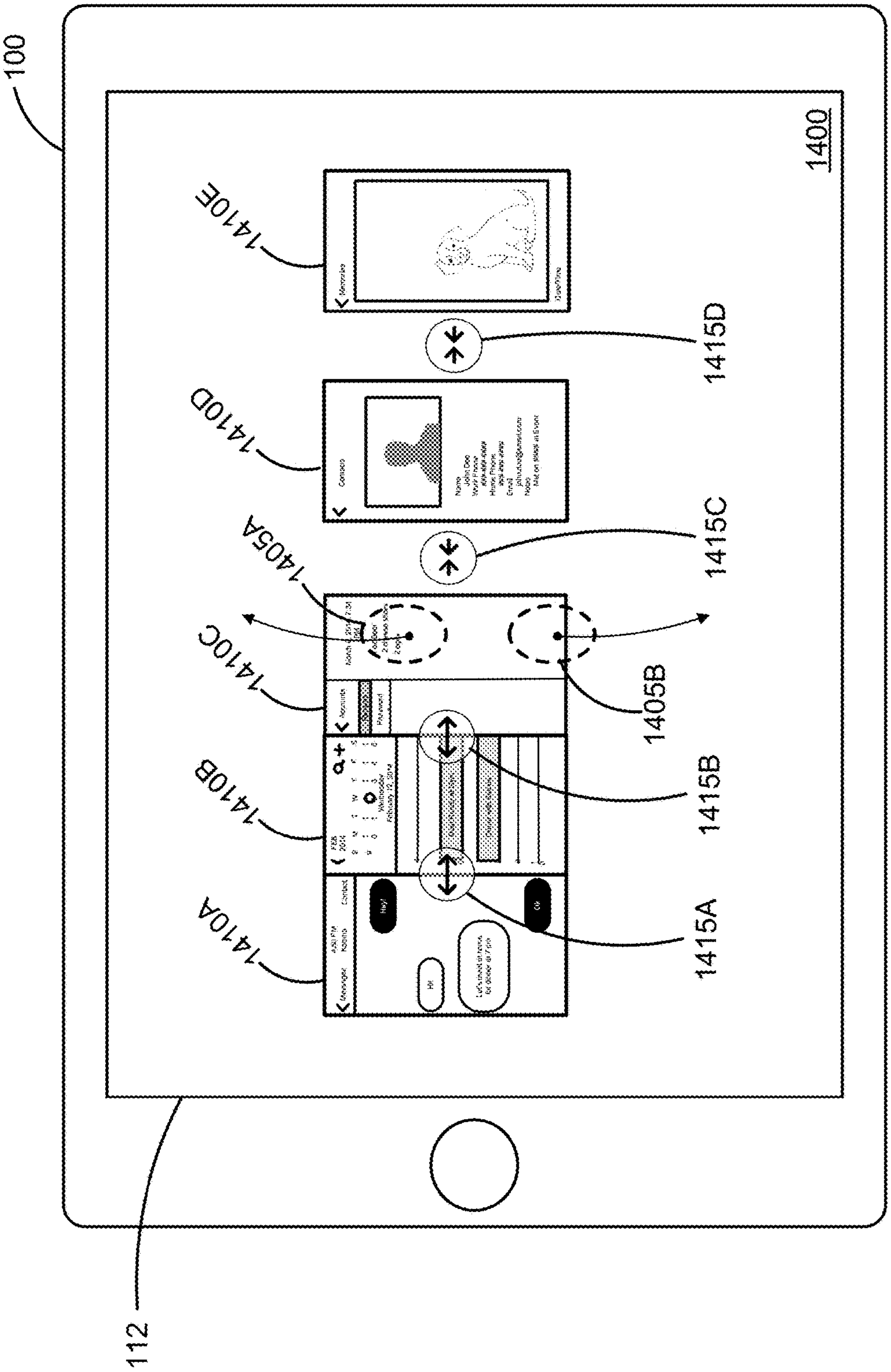
Figure 14C:
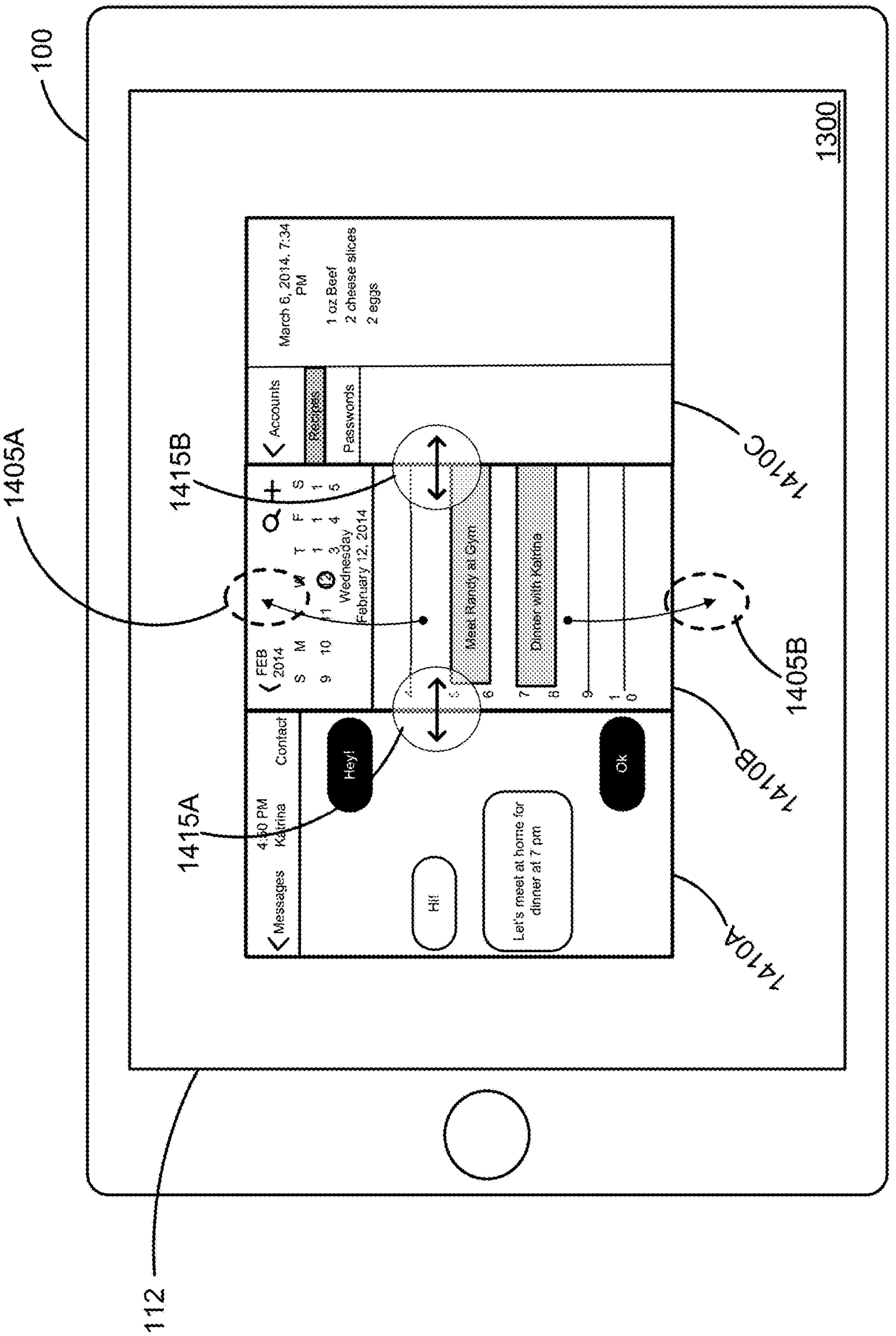

FIGS. 14A, 14B and 14C are schematics of a touch-sensitive display used to illustrate zoomed out array view of the computing device, in accordance with some embodiments. A zoomed out array view is an alternative representation similar to the array view 1300 but is minimized to present additional discrete mini apps representative of additional applications. For example, in some embodiments, the array view 1300 can display only discrete mini apps of applications executing in the background of the computing device 100 and the zoomed out array view 1400 can display the executing applications, as well as all installed applications on the computing device 100.

In some embodiments, the zoomed out array view 1400 can be accessed from the array view 1300, as shown in FIG. 14A, through a gesture. The array gesture can include a first contact 1405A and a concurrent second contact 1405B in the array view 1300. As the first contact 1405A and the second contact 1405B move across the touch screen 112, the computing device 100 determines a distance between the first contact 1405A and the second contact 1405B. The movement can be a continuous maintained movement of the contacts 1405A and 1405B and, in some embodiments, is in a substantially vertical direction. The zoomed out array view 1400 is presented, as shown in FIG. 14B, if the distance between the contacts 1405A and 1405B exceeds a threshold distance in a substantially vertical direction. In some other embodiments, the array view 1300 in FIG. 14A shrinks or minimizes (i.e., zooms out) proportionally to the distance between contacts 1405A and 1405B. The array view 1300 can minimize until a predetermined minimized discrete mini app size is met by the discrete mini apps 1410 presented in the array view. Additional discrete mini apps 1410D and 1410E corresponding to additional applications are presented in the zoomed out array view 1400 as shown in FIG. 14B.

In a similar manner as the array gesture described in 14A and 14B, a gesture can be used to return to the array view from the zoomed out array view 1400. The array-to-multi gesture can include a first contact 1405A and a concurrent second contact 1405B in the array view 1400, as shown in FIG. 14B. As the first contact 1405A and the second contact 1405B move across the touch screen 112, the computing device 100 determines a distance between the first contact 1405A and the second contact 1405B. The movement can be a continuous maintained movement of the contacts 1405A and 1405B and, in some embodiments, is in a substantially vertical direction. The substantially vertical direction for the array-to-multi gesture can be opposite of the substantial vertical direction of the zoomed out array gesture. The array view 1300 is presented, as shown in FIG. 14C, if the distance between the contacts 1405A and 1405B decreases to less than a threshold distance in the substantially vertical direction. In some other embodiments, the zoomed out array view 1400 in FIG. 14B expands or grows proportionally to the distance between contacts 1405A and 1405B. The array view 1300 can expand until a predetermined maximized discrete mini app size is met by the discrete mini apps 1410 presented in the array view. In the array view 1300 in FIG. 14C, the additional discrete mini apps 1410D and 1410E corresponding to additional applications are not presented.

Functionality of the zoomed out array view includes all functionality present in the array view 1300. For example, discrete mini apps 1410 can be joined and unjoined by user interface elements 1415 or through the join and unjoin gesture as described previously in conjunction with FIGS. 13A-13E. The join and unjoin gesture, as described previously, can be based on a threshold distance reached or not reached or proportionally join or unjoin discrete mini apps.

Figure 15A:
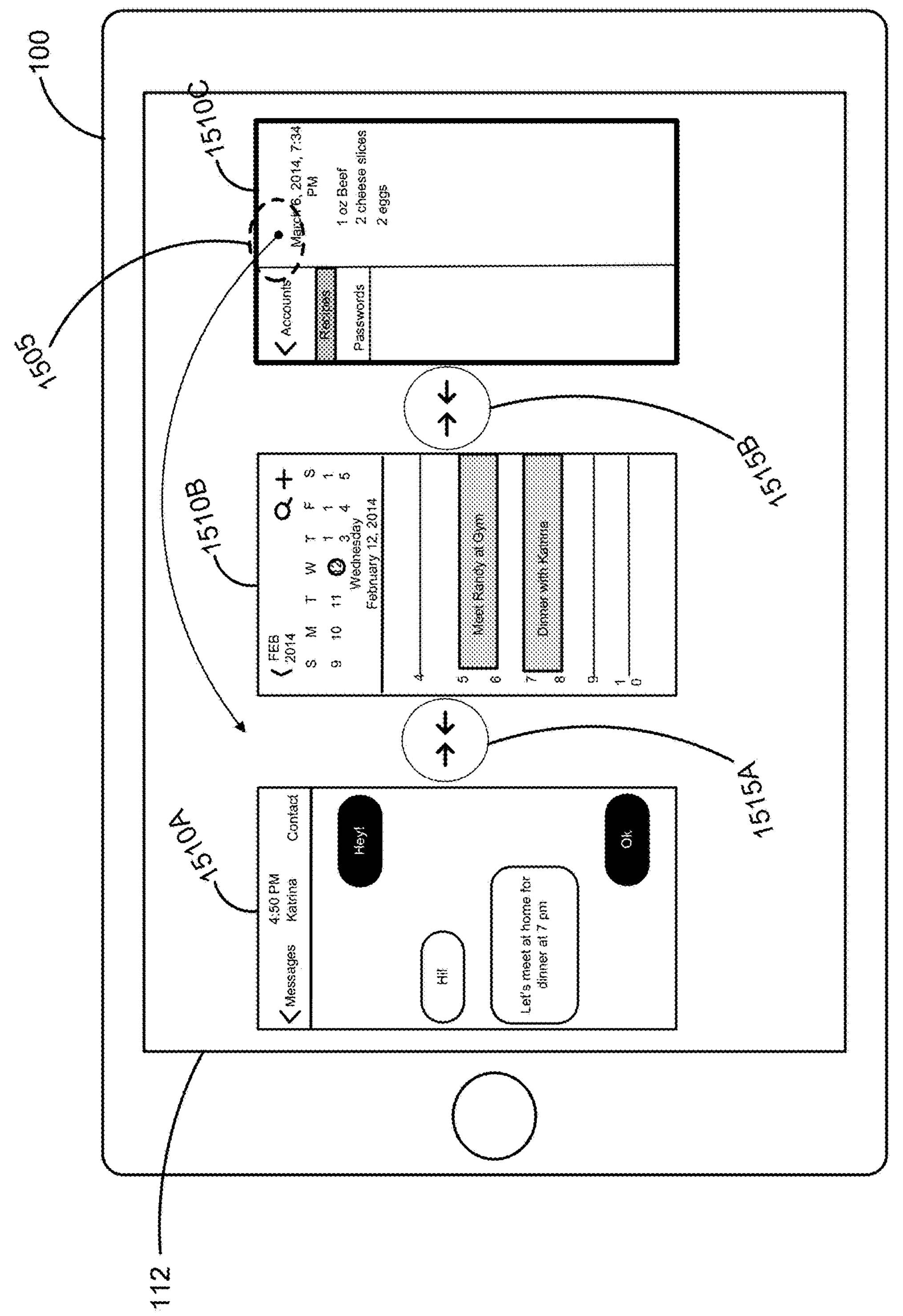
FIGS. 15A-15B are schematics of a touch-sensitive display used to illustrate re-ordering of applications in the array view, in accordance with some embodiments.
Figure 15B:
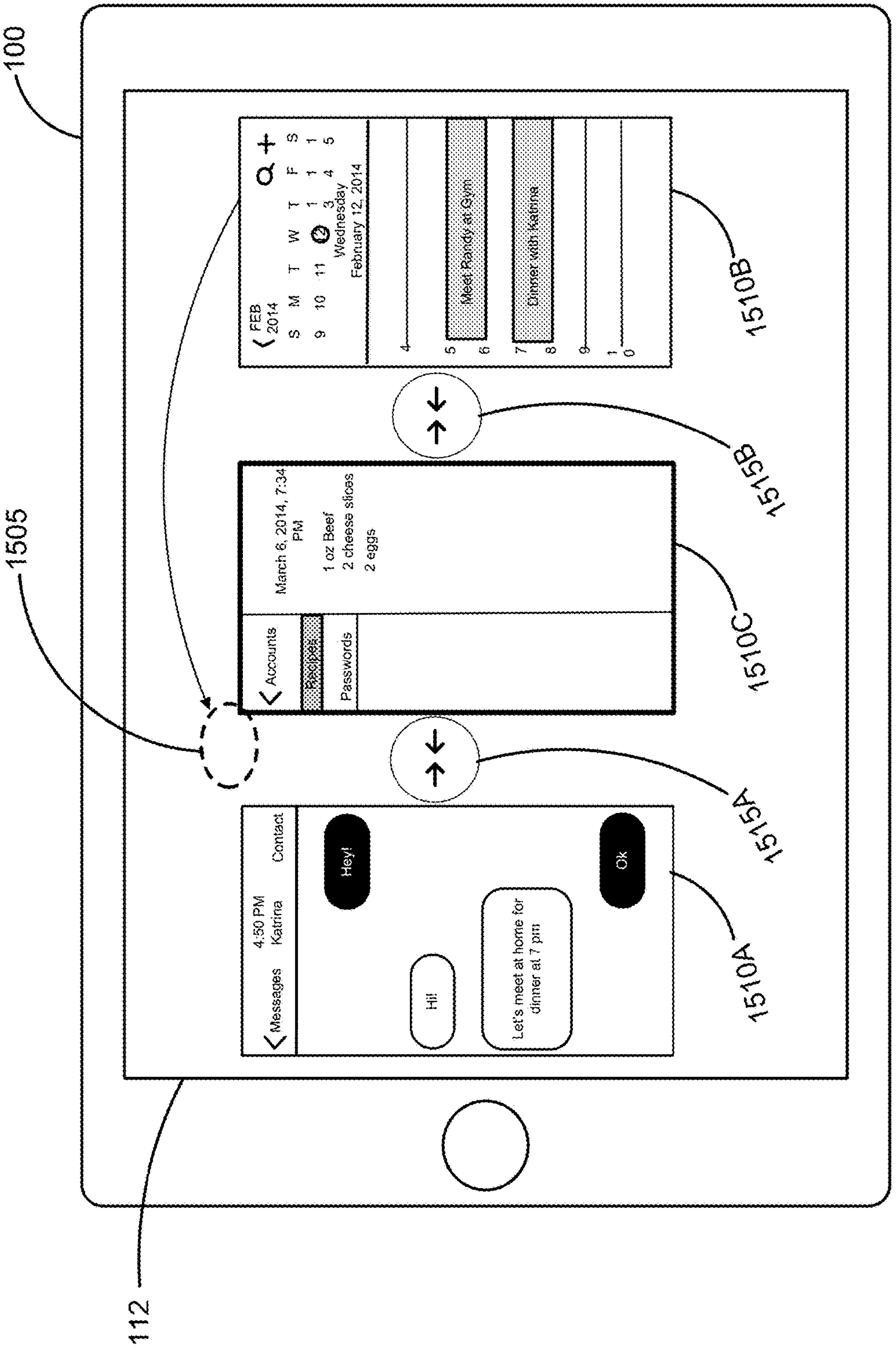

FIGS. 15A and 15B are schematics of a touch-sensitive display used to illustrate modifying order of discrete mini applications in an array view of the computing device, in accordance with some embodiments. A user can join applications or unjoin applications to be presented in a shared screen view through the array view. The user can also modify the order of the applications presented in the shared screen view and this can be done through the array view or through the zoomed out array view. The applications can be reordered when joined or unjoined as described further below.

Applications can be reordered in the array view through a gesture. The reorder gesture can include a contact 1505 at a location corresponding to a discrete mini app such as 1510C, as shown in FIG. 15A. As the contact 1505 moves across the touch screen 112, the computing device 100 locks the discrete mini app 1510C to the contact's 1505 location on the touch screen 112, allowing the discrete mini app 1510C to be dragged by the contact 1505. Once the contact 1505 is broken at a second location, the discrete mini app 1510C is unlocked and placed between the two discrete mini apps closest to the second location, such as 1510A and 1510B, as shown in FIG. 15B.

In the example shown in FIG. 15B, the two discrete mini apps 1510A and 1510B were unjoined as was the discrete mini app 1510C. The reorder gesture can still reorder joined discrete mini apps, unjoined discrete mini apps, or any combination thereof. For example, if the discrete mini app 1510C was unjoined and the contact 1505 was broken between two joined discrete mini apps, the discrete mini app 1510C can be placed between the joined discrete mini apps and the two previously joined discrete mini apps can be unjoined or the discrete mini app 1510C can be joined to the two joined discrete mini apps. If the discrete mini app 1510C was joined and the contact 1505 was broken between two joined discrete mini apps, the discrete mini app 1510C can be joined between the two previously joined discrete mini apps. If the discrete mini app 1510C was joined and the contact 1505 was broken between two unjoined discrete mini apps, the discrete mini app 1510C can be placed between the two unjoined discrete mini apps and not joined to the two unjoined discrete mini apps.

Figure 16A:
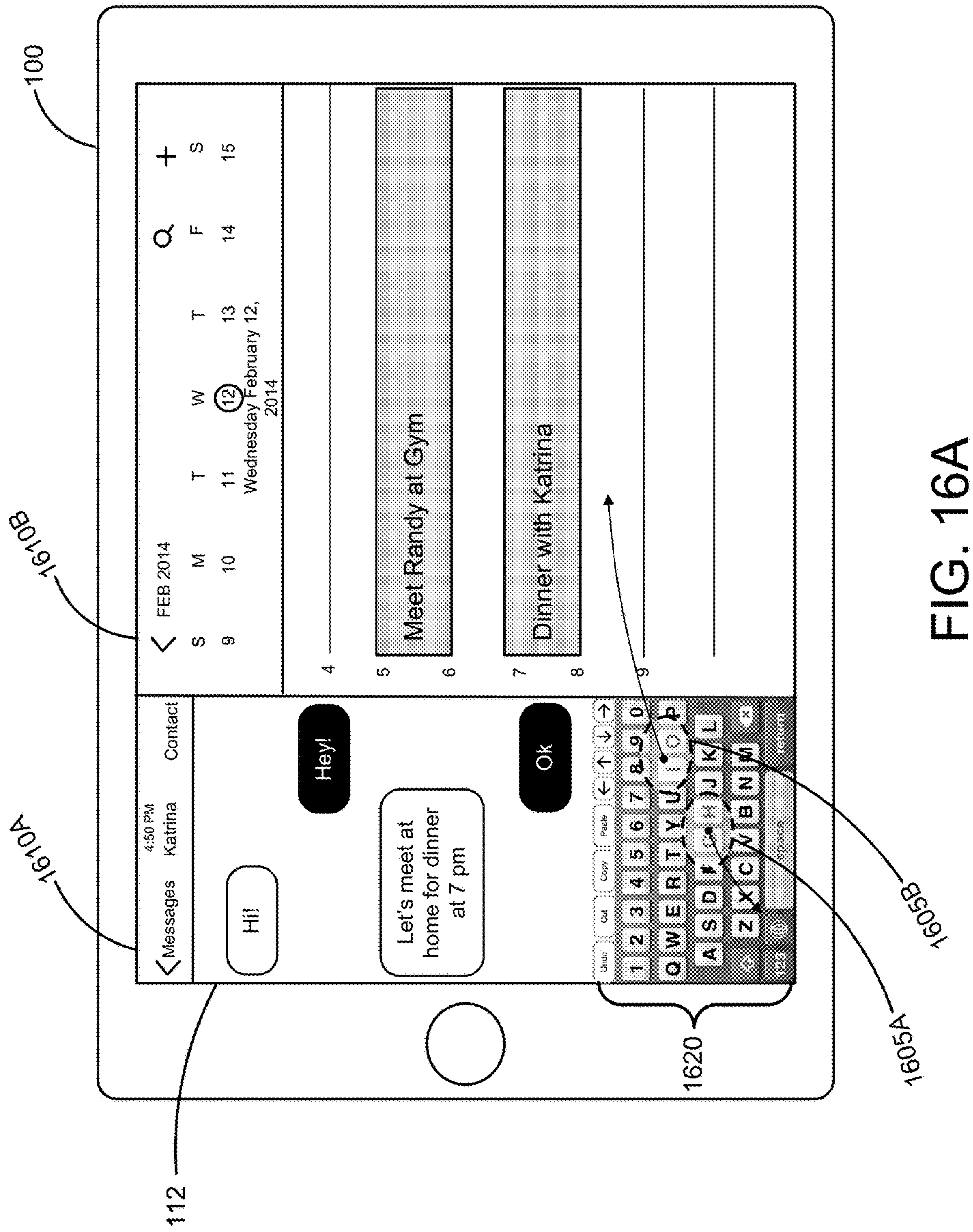
FIGS. 16A-16E are schematics of a touch-sensitive display used to illustrate user interfaces for sharing objects in a shared screen view, in accordance with some embodiments.
Figure 16B:
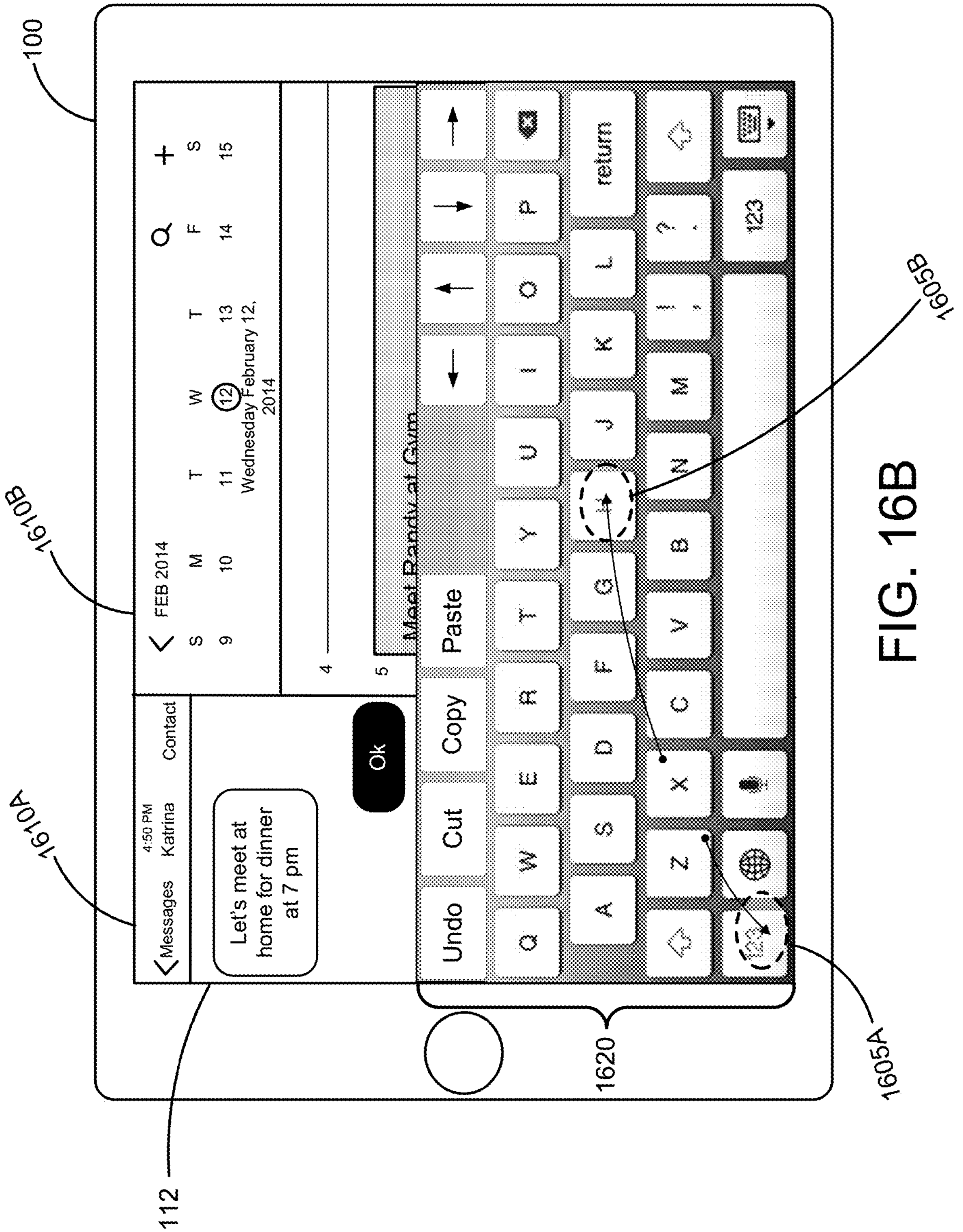

FIGS. 16A and 16B are schematics of a touch-sensitive display used to illustrate expanding a shared object in a shared screen view of the computing device 100, in accordance with some embodiments. As previously described, a shared screen view displays multiple application views of multiple applications concurrently. The shared screen view can also share an object among the concurrently displayed applications. The shared object can be displayed in a predetermined portion of the shared screen view (e.g., adjacent to top, bottom, right, or left), or in a portion designated by a user of the shared screen view. The shared object is accessible when interacting with any of the multiple applications and does not disappear or lose functionality when switching focus from application to application in the shared screen view. The shared object can be a keyboard, a scroll bar (e.g., for apps, for video scrubbing), a player (e.g., music player), or any other suitable object that can improve user experience if available (i.e., accessible) to multiple applications simultaneously. For explanation purposes, the shared object will be a keyboard in the following examples.

FIG. 16A is a schematic of a touch-sensitive display used to illustrate a shared screen view of a messages application 1610A and a calendar application 1610B, in accordance with some embodiments. The applications 1610A and 1610B are displayed at a first width in a first portion of the display screen and a second width in a second portion of the display screen, respectively. In some embodiments, the first and second portions occupy substantially all of the display screen (e.g., excluding a status bar). The shared object 1620 is a keyboard in the messages application 1610A. As shown in FIG. 16A, the shared object 1620 is displayed in a first sub portion of the first portion at the first width. A gesture can be used to access the shared object 1620 in any application in the shared screen view and the gesture can indicate a request to change the width of the shared object 1620 in the first sub portion from the first width to a third width. For example, the third width is greater than or equal to the first width plus the second width. For example, the share gesture can include a first contact 1605A and a concurrent second contact 1605B in the first sub portion, as shown in FIG. 16B. As the contacts 1605A and 1605B move across the touch screen 112, the computing device 100 determines a distance between the contacts 1605A and 1605B. In some embodiments, the shared object 1620 is expanded to a predetermined width based on a threshold distance exceeded by the distance. The predetermined width can be the width of the touch display 112, width of a plurality of application views in the shared screen view, or any other suitable width predetermined by the computing device 100. In some other embodiments, the shared object 1620 is expanded proportionally to the distance between the contacts 1605A and 1605B. For example, the width and/or height of the shared object expand(s) as the distance between the contacts 1605A and 160B increases. In some embodiments, the width and height are individually adjustable by a user. For example, the user can expand the shared object 1620 in width or height only through a contact at an edge of the shared object 1620 and a gesture including movement of the contact. Completion of the share gesture results in display of the shared object in a second sub portion of the display screen.

Figure 16C:
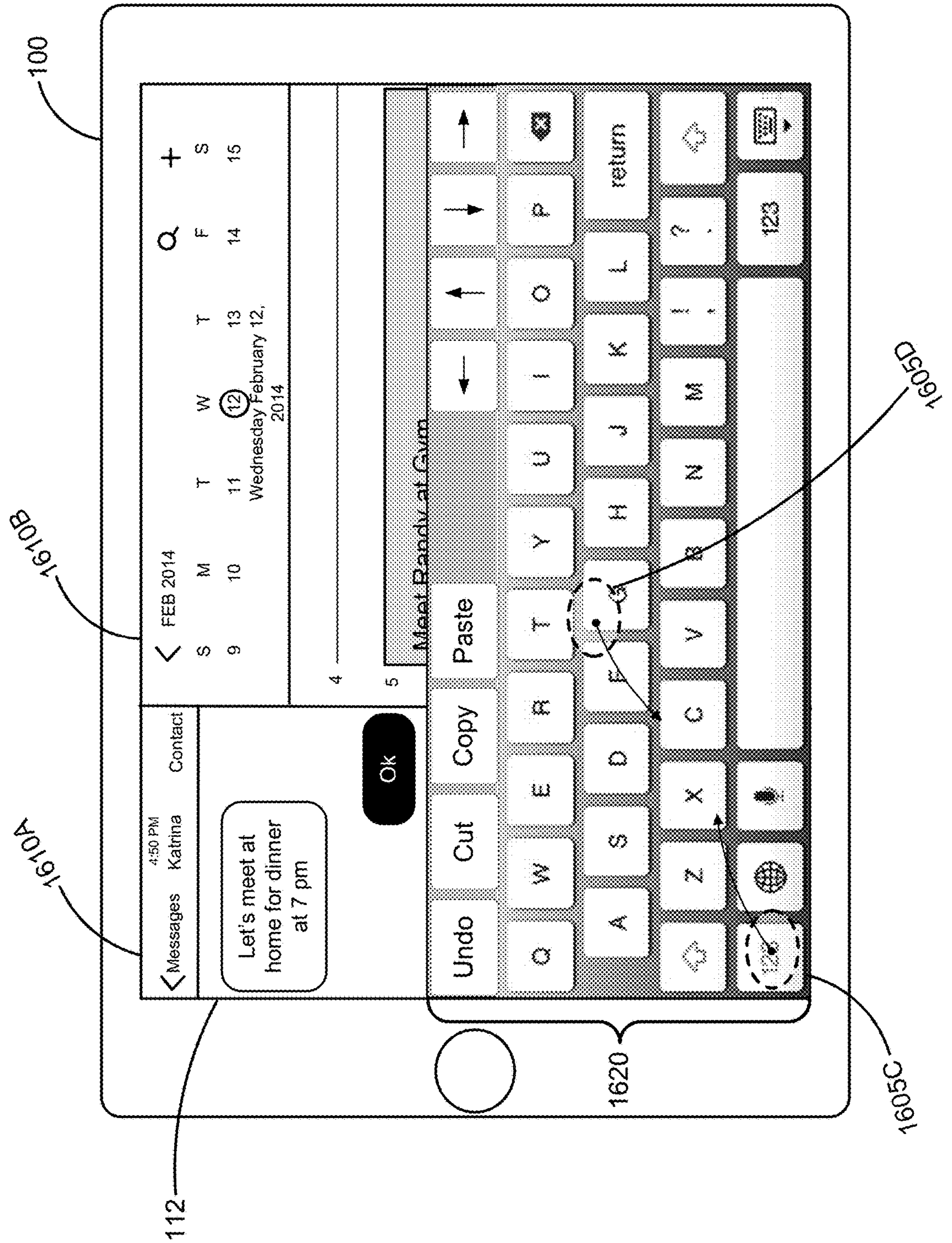
Figure 16D:
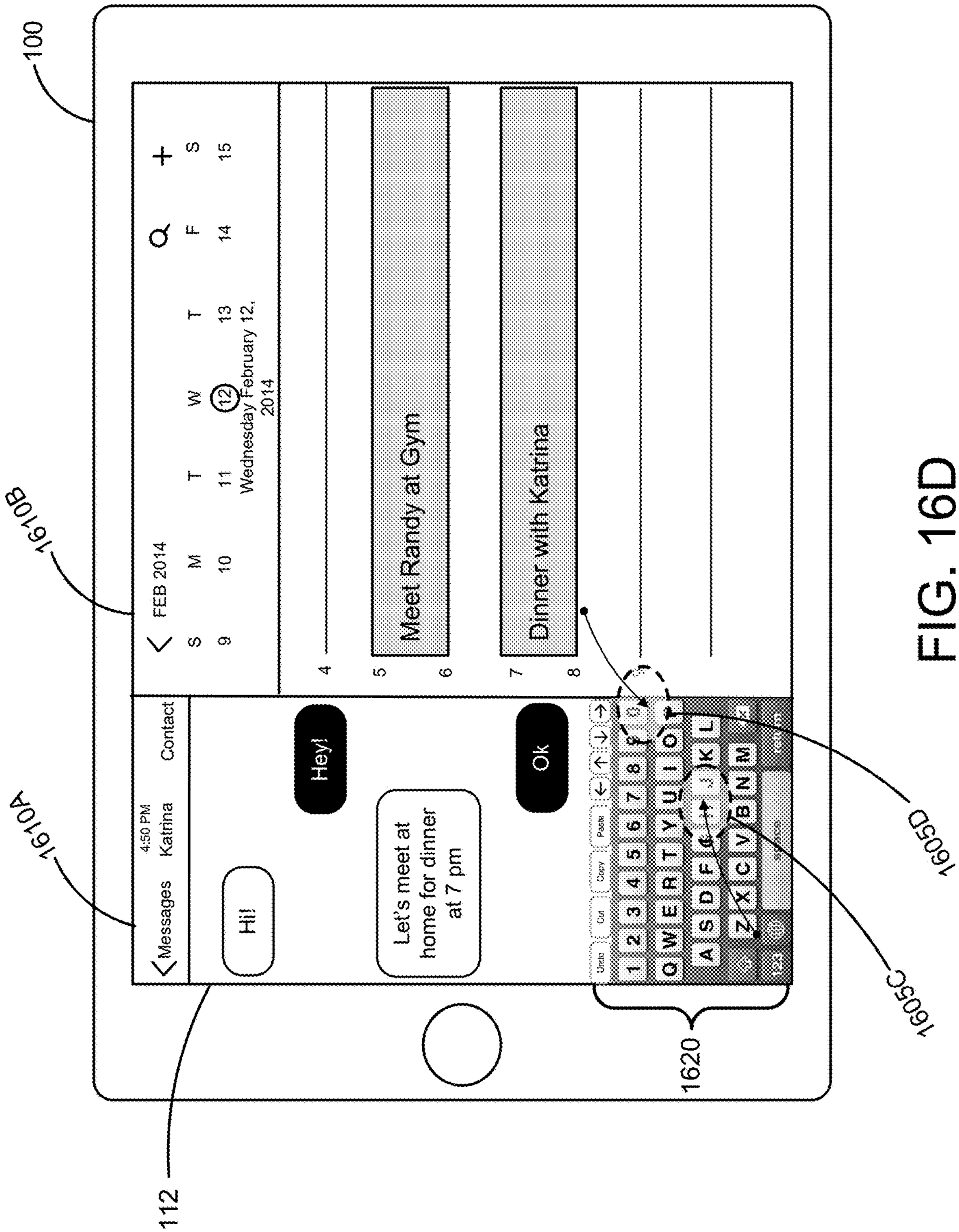

FIGS. 16C and 16D are schematics of a touch-sensitive display used to illustrate minimizing a shared object in a shared screen view of the computing device, in accordance with some embodiments. Following the example from FIGS. 16A and 16B, the shared object is displayed at the third width in the second sub portion of the display screen. In a similar manner as the share gesture described previously in FIGS. 16A and 16B, a gesture can be used to shrink a shared object 1620 expanded from an original application, such as 1610A, for example, back into the shared object's original application 1610A. For example, a shrink gesture can include a first contact 1605C and a concurrent second contact 1605D in the second sub portion, as shown in FIG. 16C. As the contacts 1605C and 1605D move across the touch screen 112, the computing device 100 determines a distance between the contacts 1605C and 1605D. In some embodiments, the shared object 1620 shrinks to an original width or the first width when in the original application 1610A based on the distance decreasing to less than a threshold distance. Thus, the original width can be the width of the original application 1610A in the shared screen view. In some other embodiments, the shared object 1620 shrinks proportionally to the distance between the contacts 1605C and 1605D. For example, the width and/or height of the shared object shrinks as the distance between the contacts 1605C and 1605D decreases. The new width of the shared object is less than the third width.

Figure 16E:
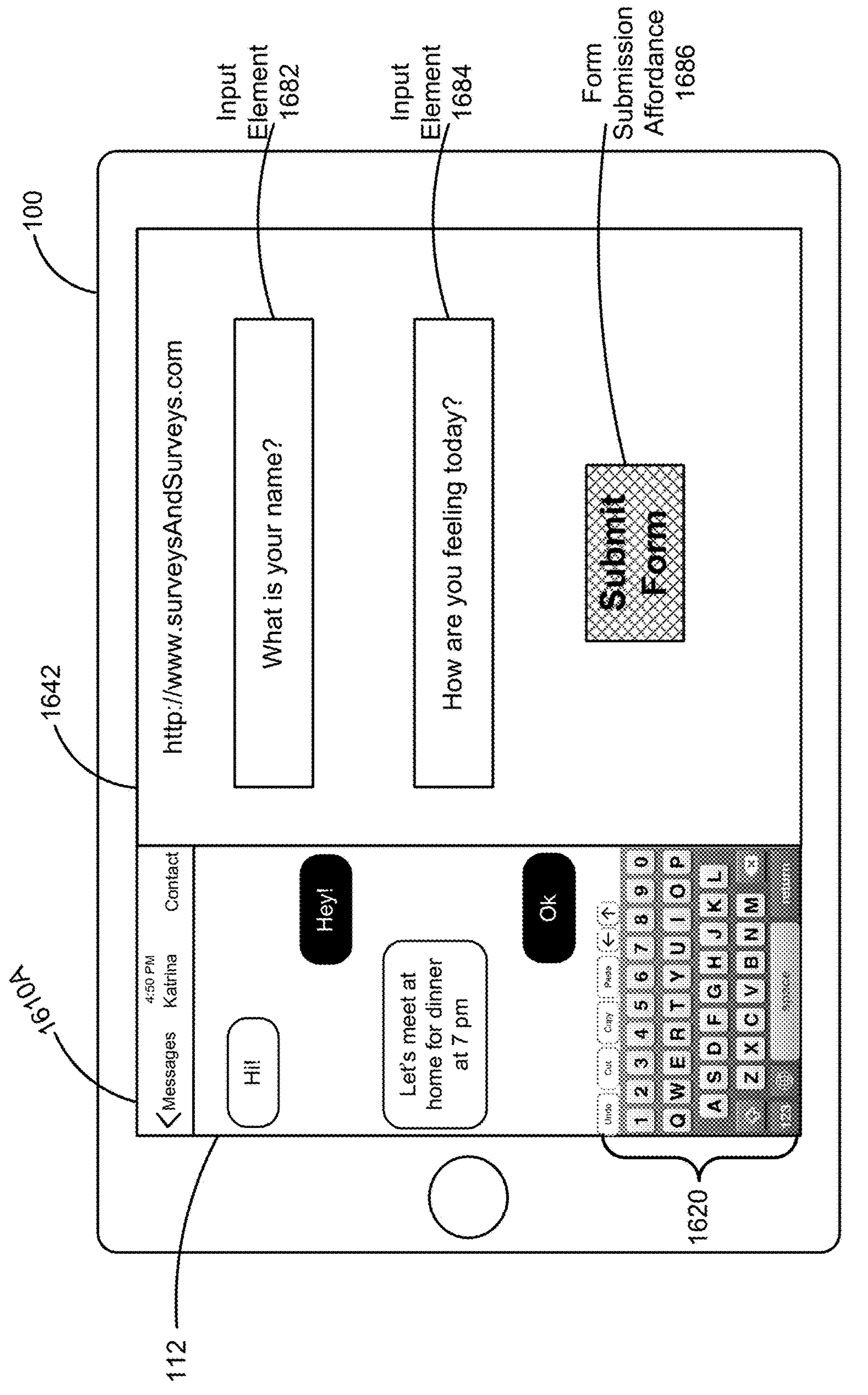

FIG. 16E is a schematic of a touch-sensitive display used to illustrate the use of a keyboard object within a shared screen view of a messages application 1610A and a web browser application 1642, in accordance with some embodiments. Messages application 1610A initially has the focus (i.e., is the currently-focused application that a user of the device 100 is interacting with) and any input from the user at the keyboard 1620 is output to the messages application 1610A. For example, if the user taps on the "A" key on the keyboard 1620, then the messages application 1610A will be updated to display an "A." In some embodiments, the user is able to scroll within the non-focused application (e.g., web browser application 1642), without affecting the display of the keyboard 1620 (e.g., a user can scroll up or down within the web browser application 1642 to reveal non-displayed portions of the application 1642 and the keyboard 1620 will continue to be displayed within messages application 1610A). In other words, scrolling within a non-focused application in a shared screen view does not affect the display of a keyboard within a currently-focused application (the display of the keyboard 1620 is persistent within the currently-focused application while scroll input is received within the non-focused application). In some embodiments, tapping within buttons and/or affordances displayed within the non-focused application causes the device to dismiss the keyboard 1620. For example, if the user contacts form submission affordance 1686, then the device dismisses keyboard 1620 (i.e., ceases to display keyboard 1620).

In some embodiments, tapping within an input field within the non-focused application changes the application to which keyboard output is sent. For example, the device 100 displays a first application (an application that is the currently-focused application and is also displaying a keyboard, such as messages application 1610A in the above example) and a second application (a non-focused application, such as web browser application 1642 in the above example) in a shared screen view. The device then detects a first contact within an input field (e.g., input element 1682) of the non-focused application. In response to detecting the first contact within the input field of the non-focused application, the device determines whether an input mode of the keyboard matches an input type accepted by the input field. In accordance with a determination that the input type accepted by the input field does not match the input mode of the keyboard, the device changes the input mode of the keyboard. For example, in accordance with a determination that input element 1684 only accepts emoticons (also referred to herein as emoji) as input, then in response to the first contact being within the input element 1684, the device changes the input mode of the keyboard from a first input mode (e.g., U.S. English mode) to a second input mode (e.g., U.S. emoji). In accordance with a determination that the input type accepted by the input field does match the input mode of the keyboard, the device maintains the input mode of the keyboard and outputs input received at the keyboard to the non-focused application. In some embodiments, in response to detecting the first contact at the input field, the device also changes the currently-focused application (e.g., the device updates the first application to be the non-focused application and updates the second application to be the currently-focused application).

In some embodiments, changing the input mode includes changing the keyboard to operate as a different keyboard (e.g., if the input field only accepts Japanese characters, then the device updates the keyboard to operate as a Japanese keyboard and to cease operating as a U.S. English keyboard).

Although the keyboard 1620 is pictured in FIG. 16E as occupying space within messages application 1610A, in some embodiments, the keyboard 1620 is instead displayed on top of both messages application 1610A and web browser application 1642 (e.g., as pictured in FIG. 16C). The above descriptions apply to embodiments in which the keyboard 1620 is displayed within a single application in the shared screen view and/or embodiments in which the keyboard 1620 is displayed on top of two or more applications displayed within the shared screen view.

Additional details relating to sharing objects within a shared screen view and, more specifically, to dragging content between applications while in a shared screen view are discussed below in reference to FIGS. 42A-42E.

Figure 17A:
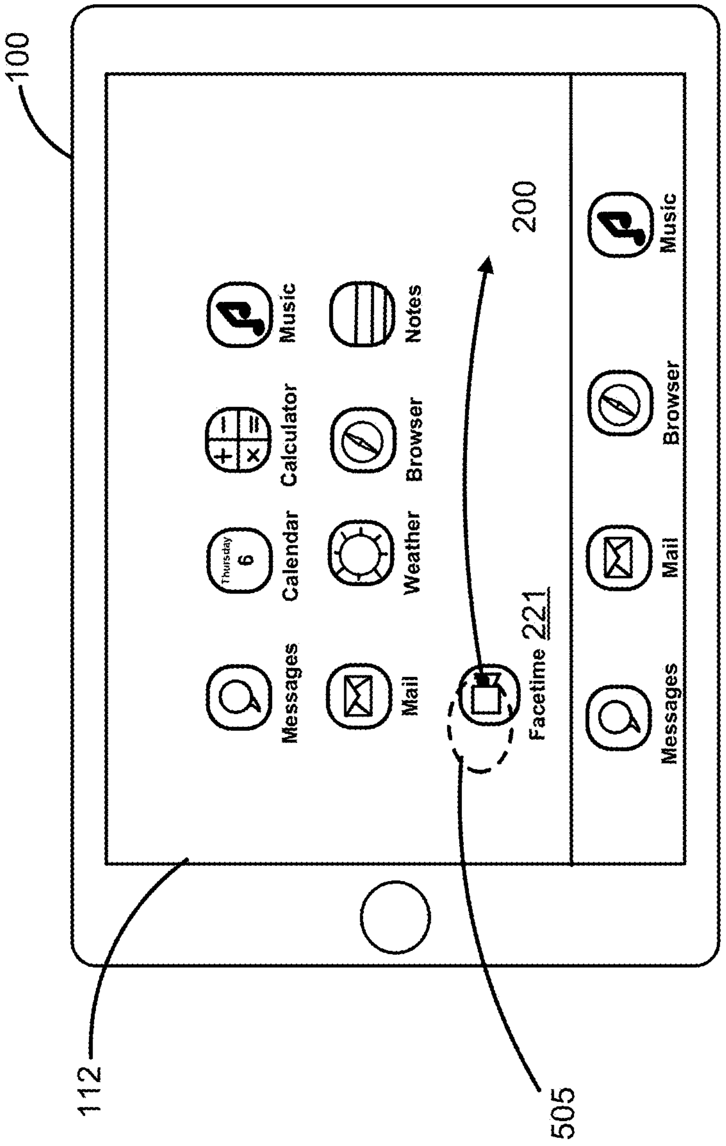
FIGS. 17A-17F and 18A-18B are schematics of a touch-sensitive display used to illustrate gestures for interacting with a picture-in-picture view, in accordance with some embodiments.
Figure 17B:
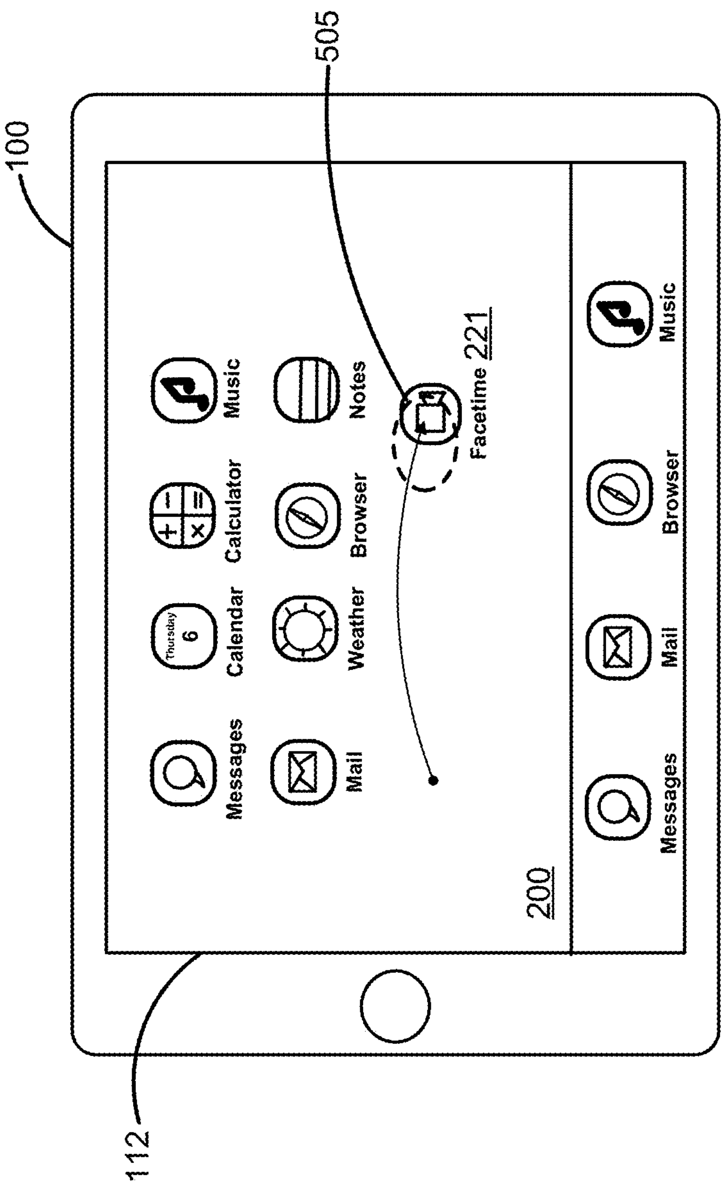

FIGS. 17A and 17B are schematics of a touch-sensitive display used to illustrate a gesture for presenting an application in a PIP layout, in accordance with some embodiments. A PIP layout, in some embodiments, is a minimized representation of an application view. An application in a PIP layout can be moveable, changed in size, placed on top of other views (e.g., application view, shared screen view, icon view), or any combination thereof. The PIP gesture is indicative of a user request to display an application in a PIP layout. The PIP gesture, in some embodiments, can be identical or similar to the shared view gesture as described previously in conjunction with FIGS. 5A and 5B. For example, in some embodiments, an icon is dragged a threshold distance of five pixels of the touch screen 112 from the icon's initial position to signify a request to display an associated application in a PIP layout. In FIG. 17A, the PIP gesture includes a contact 505 of the FaceTime icon 221 at its initial position in the icon view 200 and dragging the FaceTime icon 221 from its initial position a threshold distance to a second position in the icon view 200 shown in FIG. 17B in a continuous movement without breaking contact with the touch screen 112.

The computing device 100 determines if the application associated with the icon is compatible with PIP configuration (e.g., by communicating with PIP module 186, FIG. 1A) and, responsive to determining the application is compatible, the selected icon is displayed in the PIP configuration or PIP layout. In other embodiments, after completion of the shared view gesture and determination that the application is associated with the icon is compatible with PIP configuration, the selected icon is redisplayed at the location corresponding to the initial position of the icon in the icon view 200. The selected icon is optionally displayed at a location adjacent to or a predefined distance from the initial position of the icon. If the application associated with the icon is not compatible with PIP configuration, the application is displayed in the shared screen view as described previously in conjunction with FIGS. 5A and 5B.

Figure 17C:
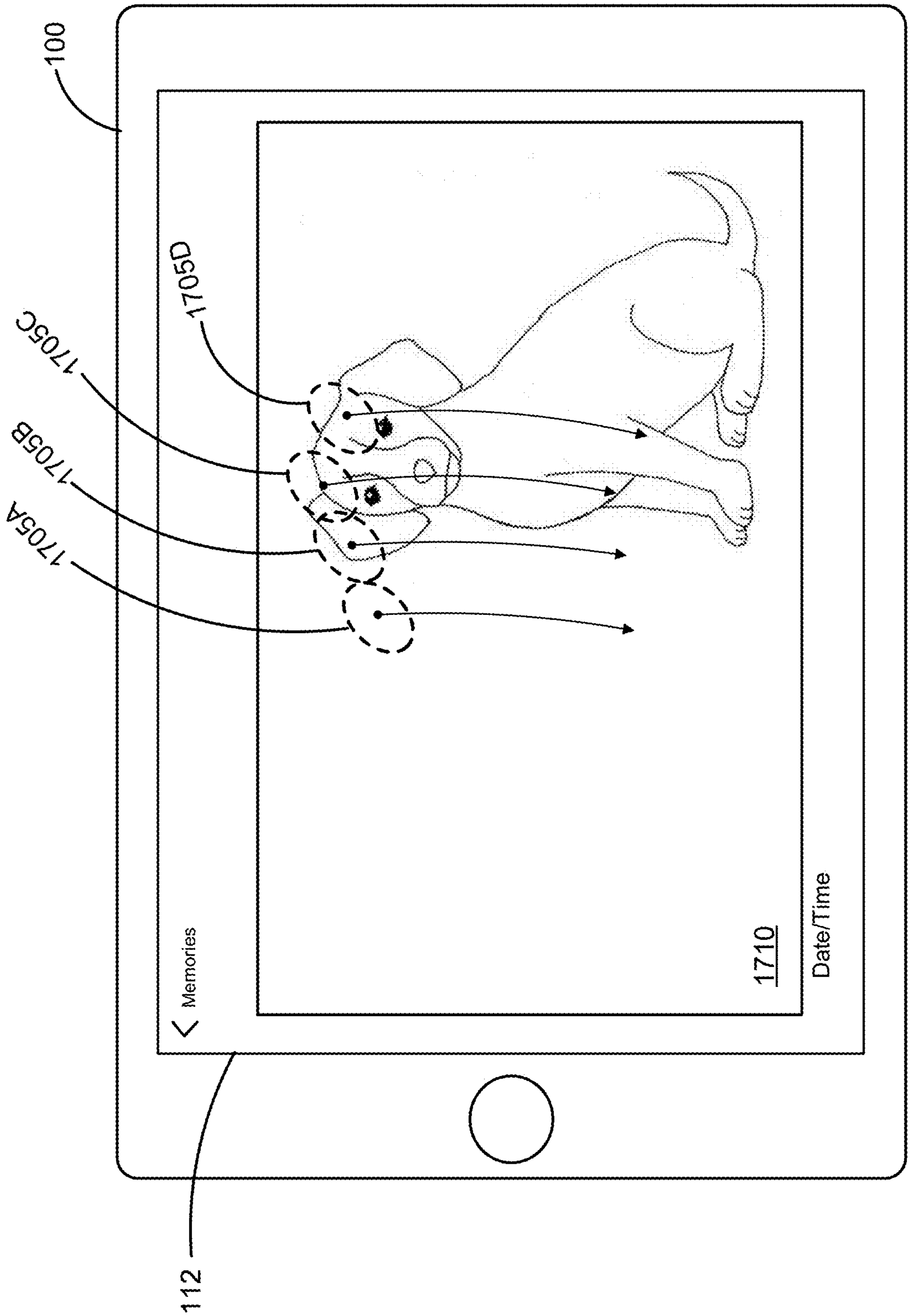
Figure 17D:
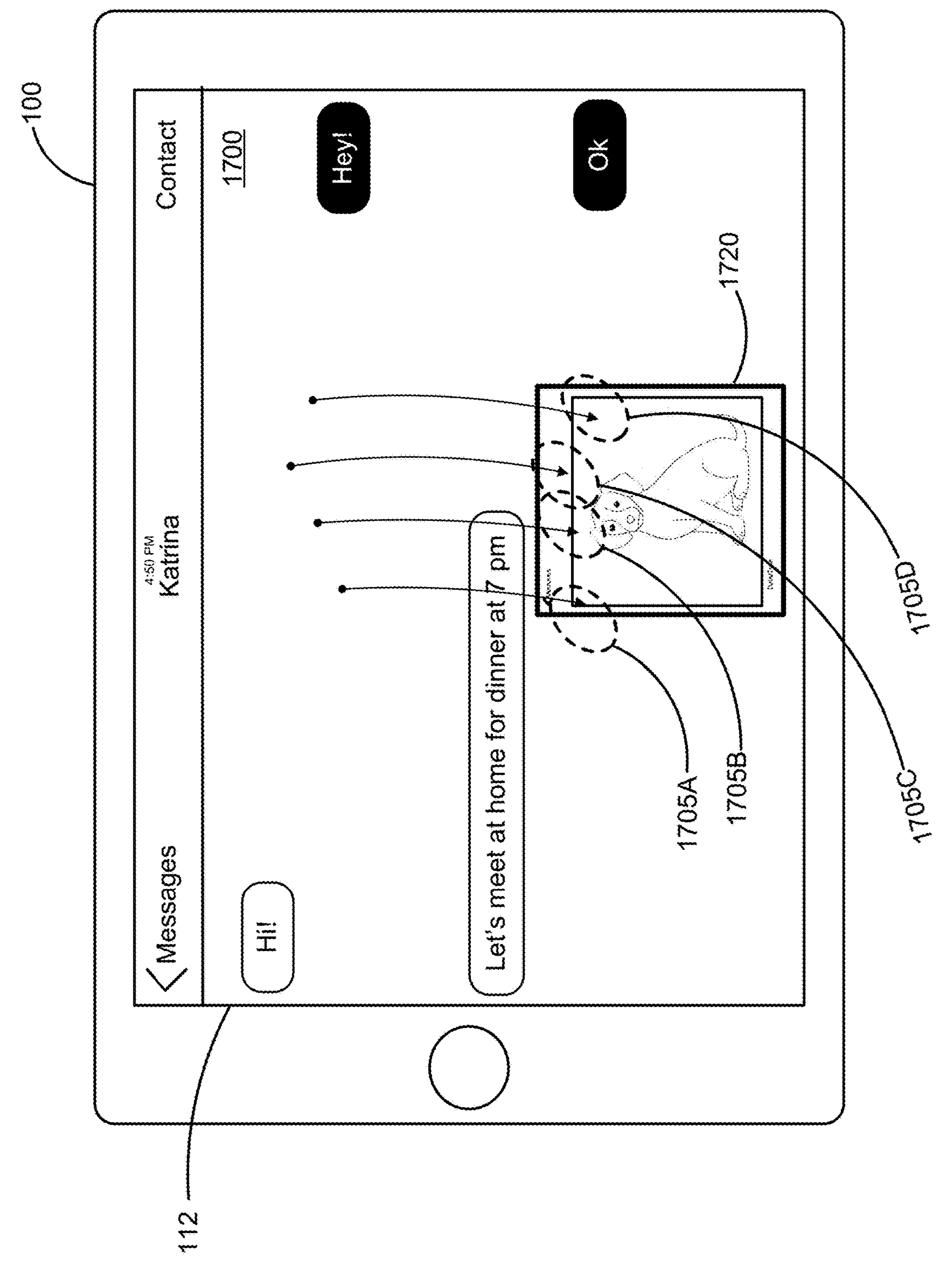

An application can also be presented in a PIP layout through a second gesture in an application view 1710 of the application. The application view for example displays an application at a first width in a first portion of the display screen. FIGS. 17C and 17D are schematics of a touch-sensitive display used to illustrate displaying an application in a picture-in-picture (PIP) layout, in accordance with some embodiments. For example, the second PIP gesture can include a four-point contact including a first contact 1705A, a concurrent second contact 1705B, a third concurrent contact 1705C, and a concurrent fourth contact 1705D and can indicate a request to change a first layout of the application (e.g., the application view of the application) in the first portion of the display screen to a PIP layout. As the four-point contact 1705A-D moves across the touch screen 112 to a final portion, the computing device 100 determines a characteristic of the movement. For example, the characteristic can be a duration of contact, a direction of the movement, a distance traversed by the movement, a distance traversed by at least one of the contacts in the four-point contact 1705A-D, an average distance traversed by a plurality of the contacts in the four-point contact 1705A-D, or any combination thereof. Based on a threshold characteristic reached by the characteristic, the application can be presented in a PIP layout in an overlaid screen view, as shown in FIG. 17B. For example, the threshold characteristic can be a threshold duration, a specified direction (e.g., down), a threshold distance, or any combination thereof.

Upon completion of the second PIP gesture, the application is presented as a PIP 1720 at a location associated with the final location as shown in FIG. 17D. In some embodiments, the PIP 1720 is presented at a default position (e.g., a corner of the touch screen 112) or at a predefined distance from an initial location of the second PIP gesture. The PIP 1720 can be presented in the icon view, in an application view 1700 of a second application executing in the background of the computing device 100, or in a shared screen view.

Figure 17E:
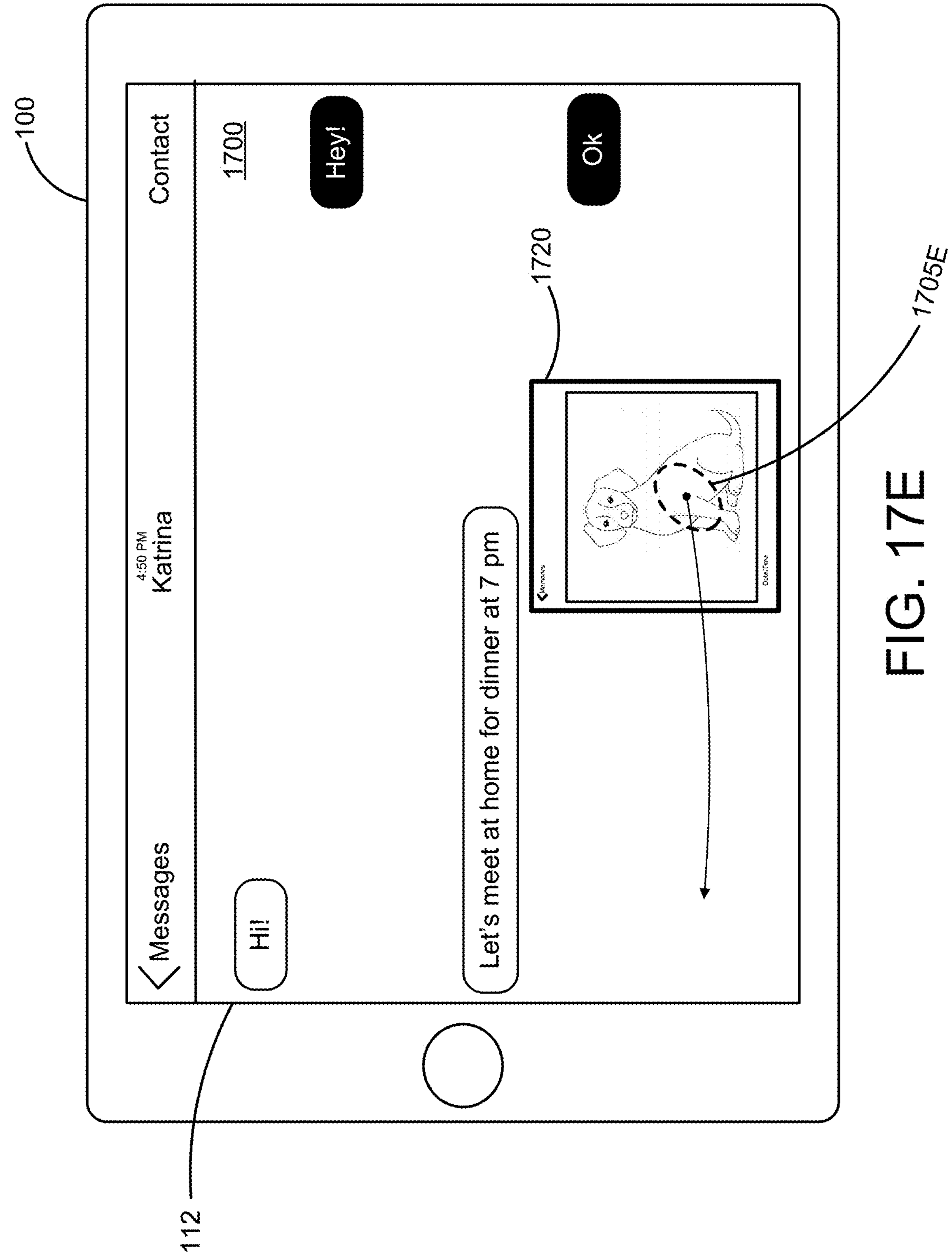
Figure 17F:
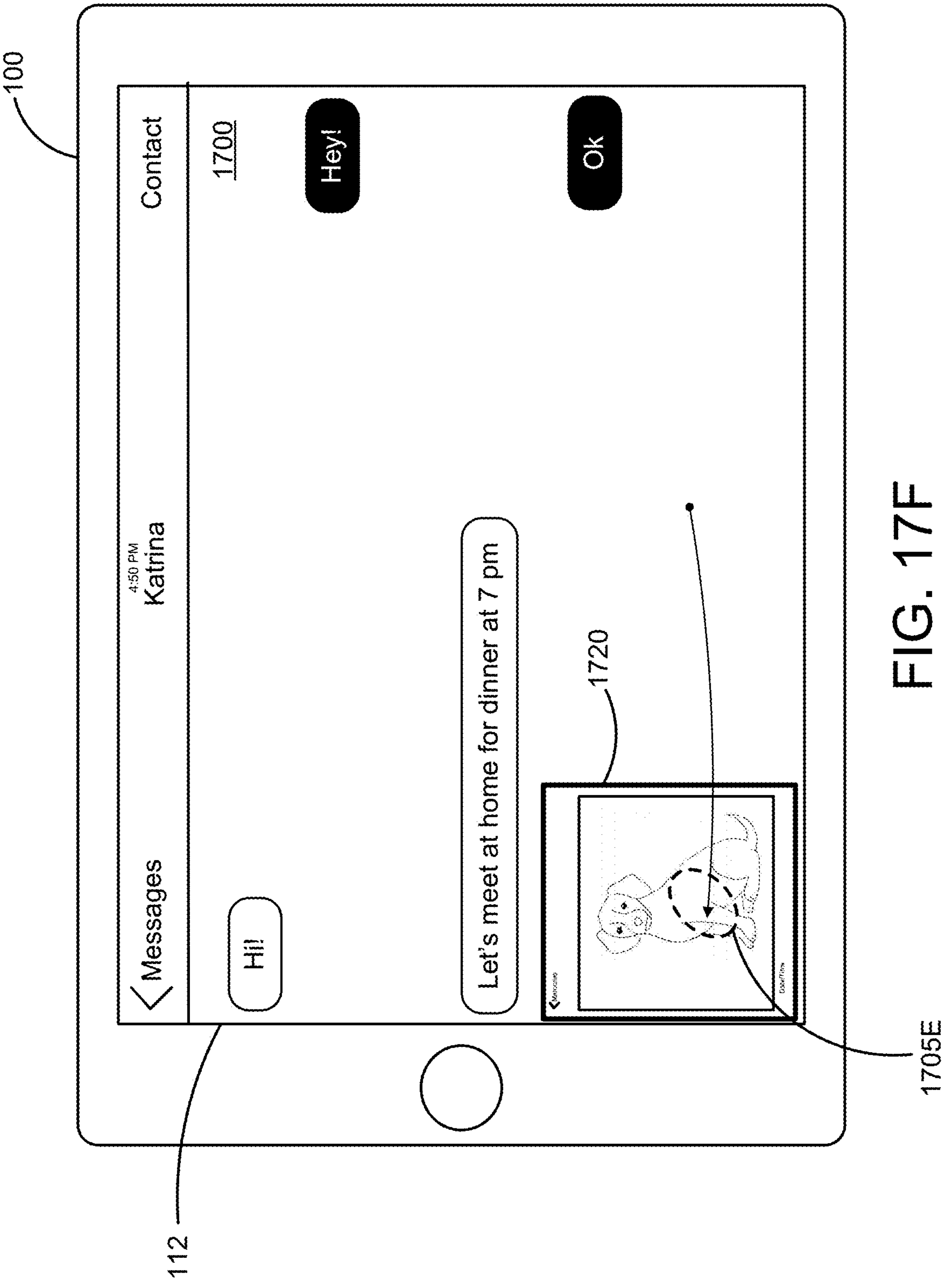

FIGS. 17E and 17F are schematics of a touch-sensitive display used to illustrate moving an application that is in a PIP layout, in accordance with some embodiments. The PIP 1720 can be moved using a gesture, in some embodiments. For example, the PIP-move gesture can include a contact 1705E at a location corresponding to the location of the PIP 1720, as shown in FIG. 17E. As the contact 1705E moves across the touch screen 112, the computing device 100 locks the PIP 1720 to the contact's 1705E location on the touch screen 112, allowing the PIP 1720 to be dragged by the contact 1705E. Once the contact 1705E is broken at a final location, the PIP 1720 is unlocked and placed at the final location, as shown in FIG. 17F.

Figure 18A:
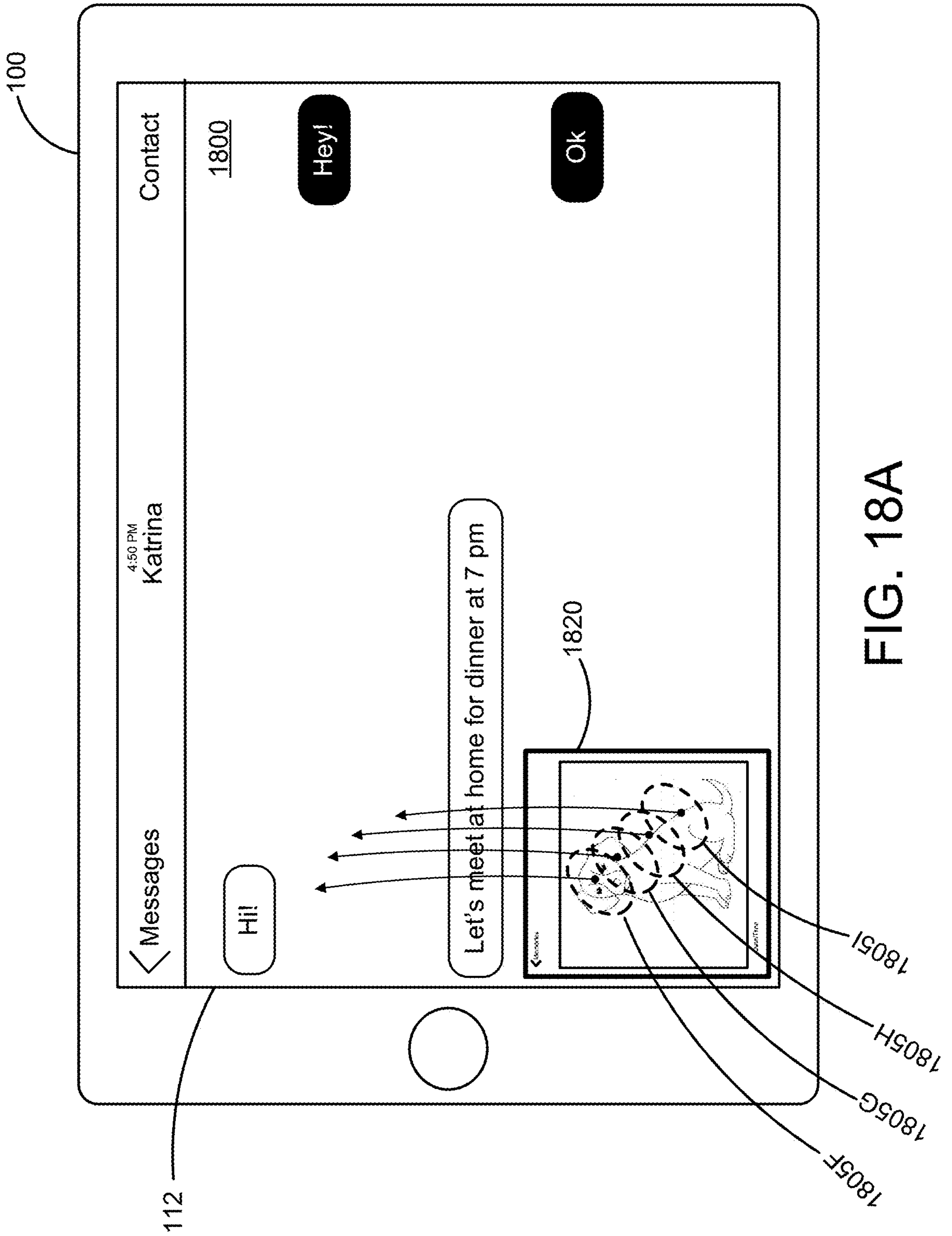
Figure 18B:
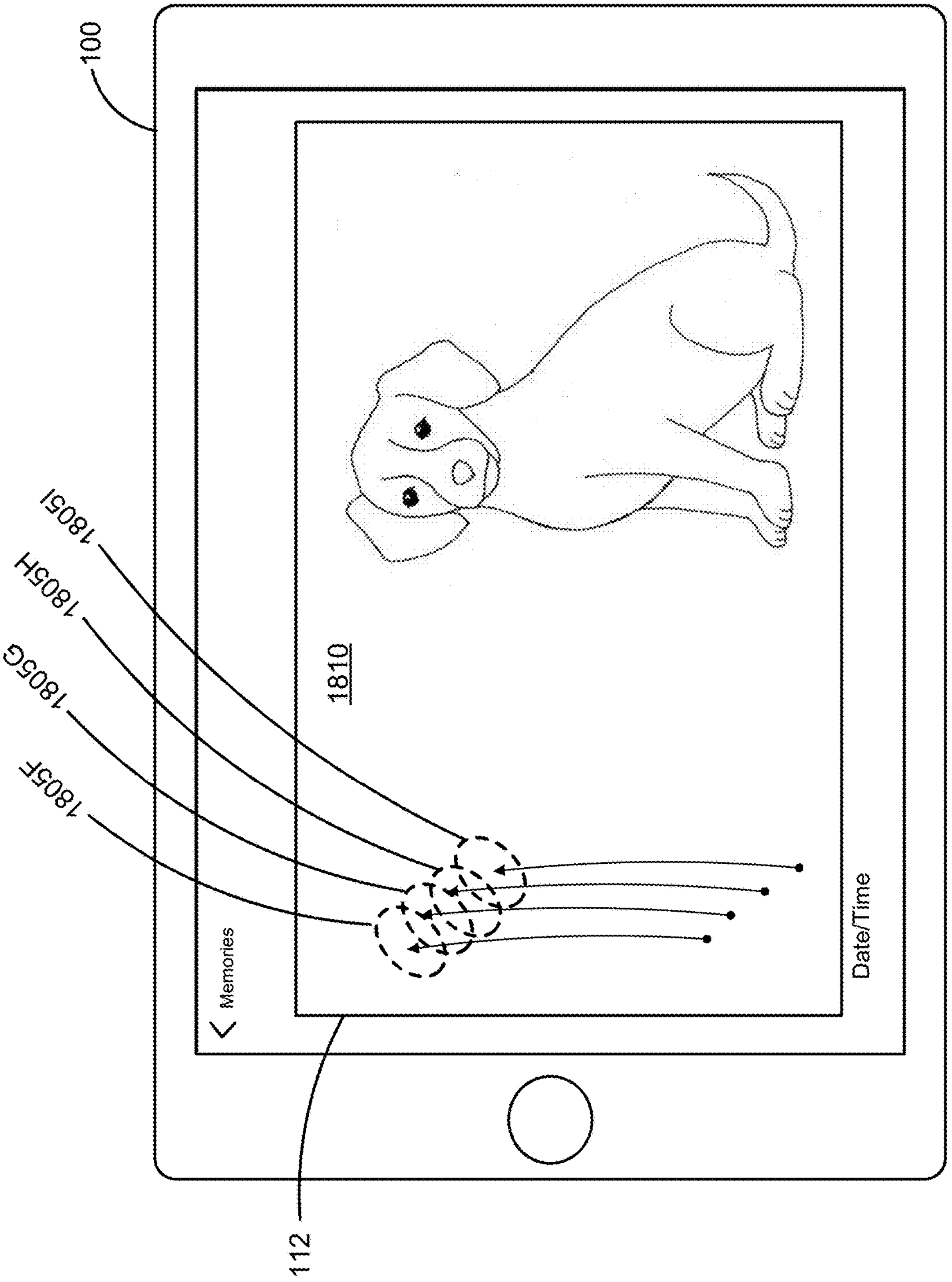

FIGS. 18A and 18B are schematics of a touch-sensitive display used to illustrate displaying an application that is in a PIP layout into an application view (i.e., full-screen view/mode) of the application, in accordance with some embodiments. The application can be presented in an application view from a PIP layout based on a gesture where the gesture indicates a request to change the PIP layout of the application in the sub portion of the display screen to the first layout (e.g., application view). For example, the PIP-to-app gesture can include a second four-point contact including a first contact 1805F, a concurrent second contact 1805G, a third concurrent contact 1805H, and a concurrent fourth contact 1805I. As the second four-point contact 1805F-I moves across the touch screen 112 to a final portion, the computing device 100 determines a characteristic of the movement. For example, the characteristic can be a duration of contact, a direction of the movement, a distance traversed by the movement, a distance traversed by at least one of the contacts in the second four-point contact 1805F-I, an average distance traversed by a plurality of the contacts in the second four-point contact 1805F-I, or any combination thereof. Based on a threshold characteristic reached by the characteristic, the application can be presented in an application view 1810, as shown in FIG. 18B. For example, the threshold characteristic can be a threshold duration, a specified direction (e.g., up, opposite of specified duration of the second PIP gesture), a threshold distance, or any combination thereof.

Additional details relating to a picture-in-picture display mode are discussed below in reference to FIGS. 48A-52D.

Figure 19A:
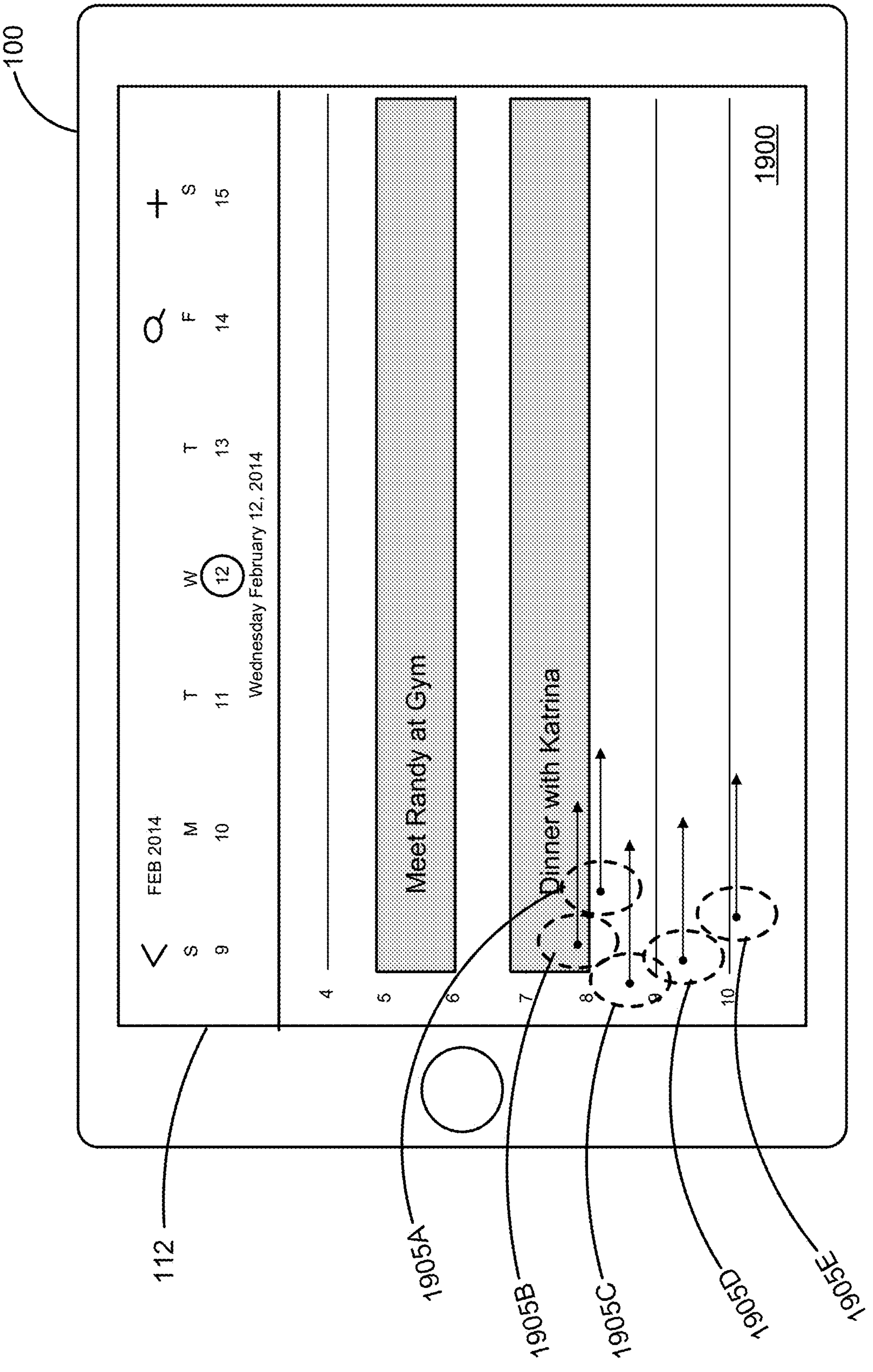
FIGS. 19A-19B are schematics of a touch-sensitive display used to illustrate user interfaces before and after a slide gesture to open a default application, in accordance with some embodiments.
Figure 19B:
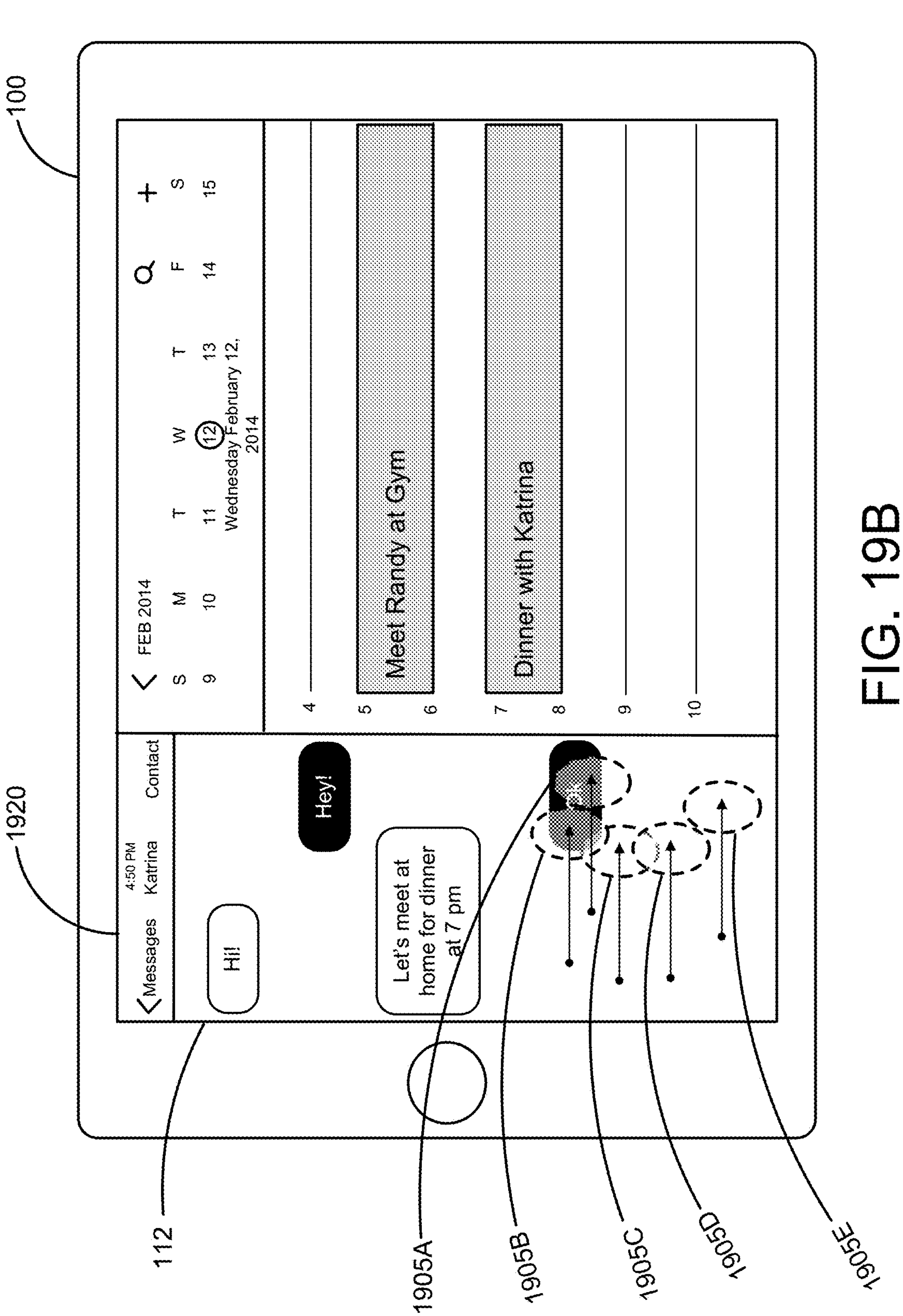

FIGS. 19A and 19B are schematics of a touch-sensitive display used to illustrate displaying a default application on the computing device, in accordance with some embodiments. The default application can be predesignated in the computing device 100, designated by a user through a preference setting, or any combination thereof. The default application can be displayed in a shared screen view or in an application view 1900 through a gesture indicating a request to display a default application in the shared screen view. For example, the default gesture (also referred to as slide gesture herein) includes a five-point contact including a first contact 1905A, a concurrent second contact 1905B, a concurrent third contact 1905C, a concurrent fourth contact 1905D, and a concurrent fifth contact 1905E as shown in FIG. 19A. As the five-point contact 1905A-E moves or slides across the touch screen 112, the computing device 100 determines a characteristic of the movement. For example, the characteristic can be a direction of the movement, a distance traversed by the movement, a distance traversed by at least one of the contacts 1905A-E, an average distance traversed by a plurality of the contacts 1905A-E, or any combination thereof. Based on a threshold characteristic reached by the characteristic, a default application 1920 slides out or is presented at a side, as shown in FIG. 19B. For example, the threshold characteristic can be a threshold duration, a specified direction (e.g., substantially horizontal away from a side, left, right), a threshold distance, or any combination thereof. The default application 1920 can slide out proportionally to a distance traversed by the movement and can be presented on the left side of the touch screen 112 or at the side opposite of a direction of the movement.

Figure 19C:
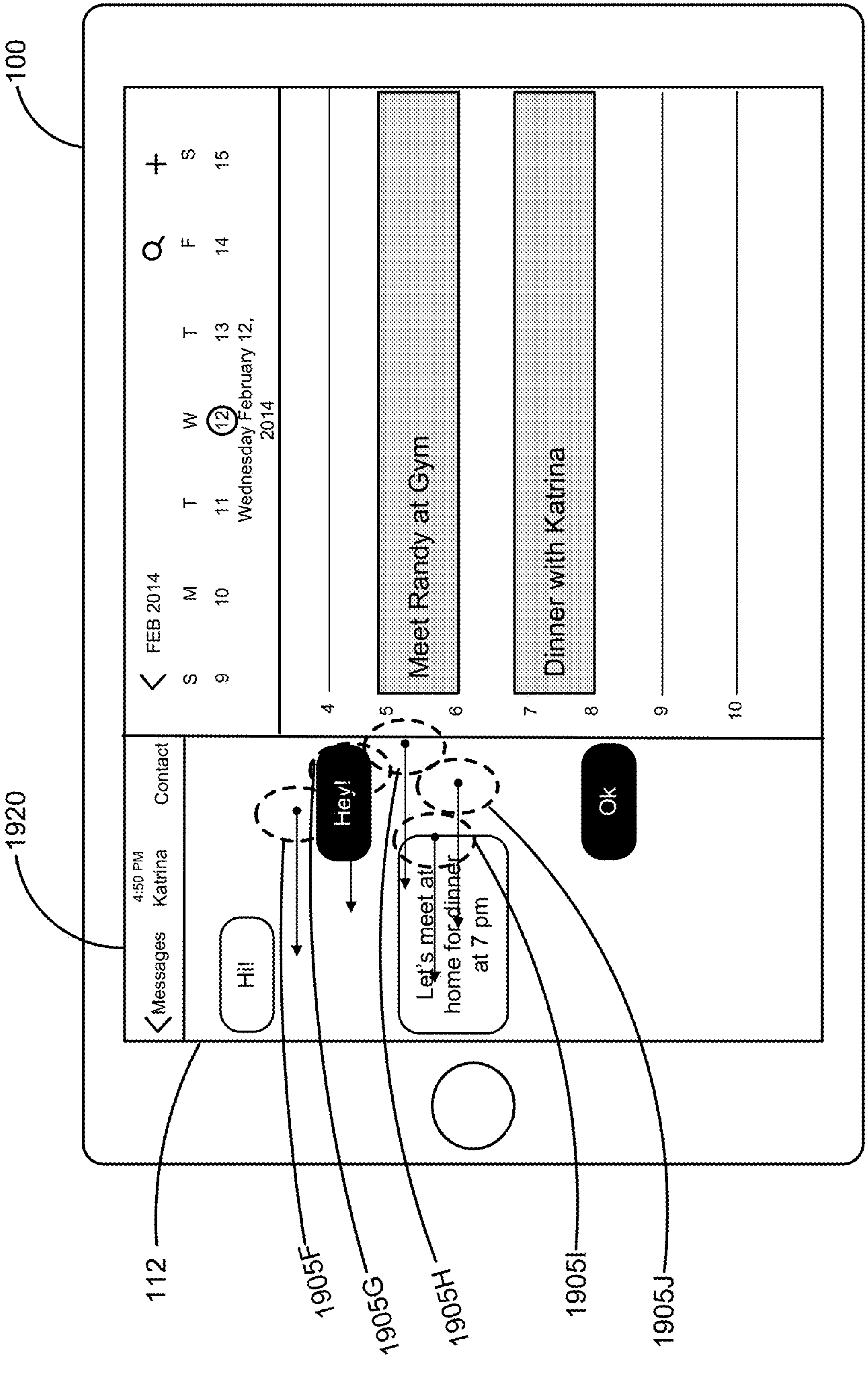
FIGS. 19C-19D are schematics of a touch-sensitive display used to illustrate user interfaces before and after the slide gesture to close the default application, in accordance with some embodiments.
Figure 19D:
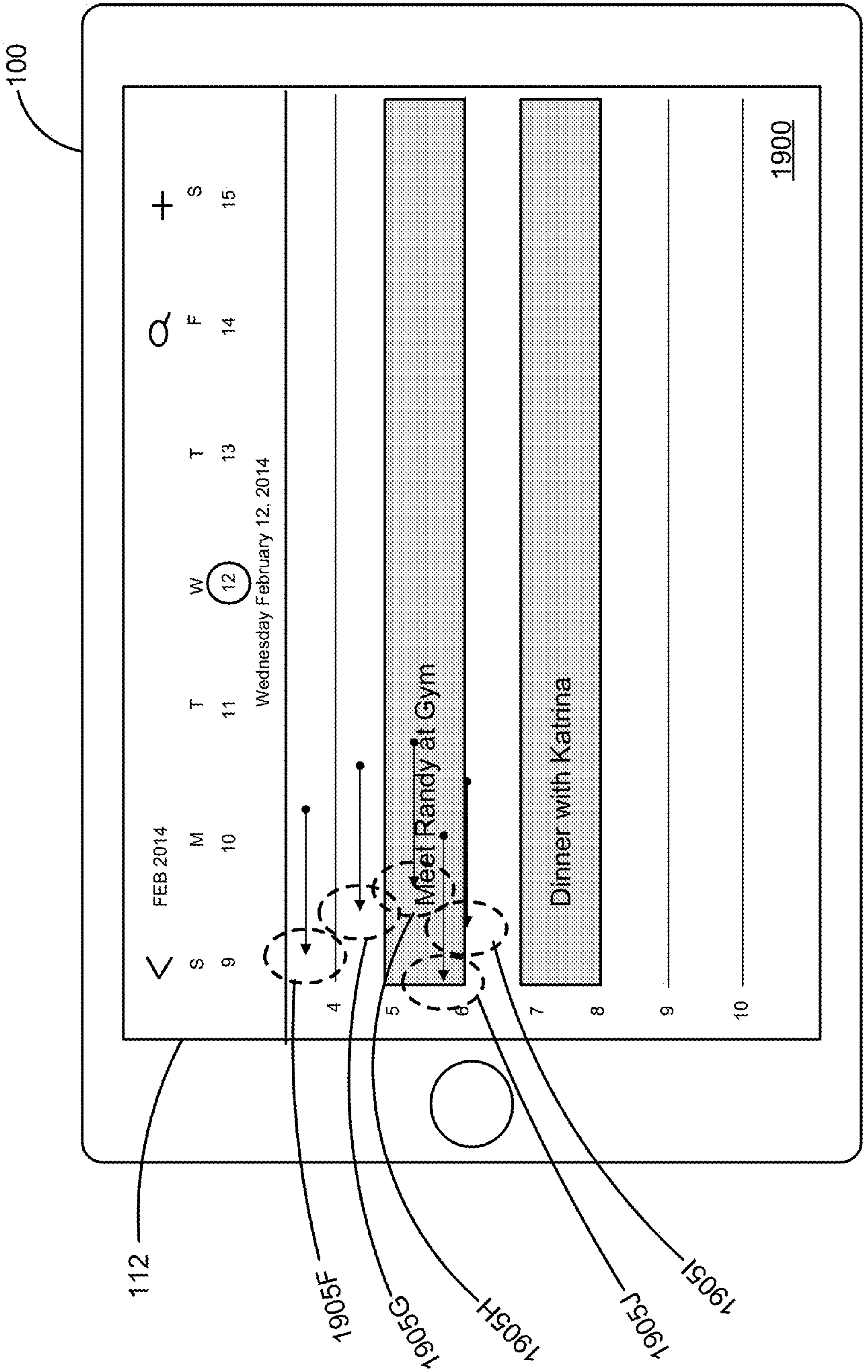

FIGS. 19C and 19D are schematics of a touch-sensitive display used to illustrate closing a default application on the computing device, in accordance with some embodiments. In a similar manner as the default gesture, the default application can be hidden in a shared screen view, as shown in FIG. 19C, or in an application view through a gesture indicating a request to remove from display the default application in the shared screen view. For example, the close-default gesture includes a second five-point contact including a first contact 1905F, a concurrent second contact 1905G, a concurrent third contact 1905H, a concurrent fourth contact 1905I, and a concurrent fifth contact 1905J as shown in FIG. 19C. As the second five-point contact 1905F-I moves across the touch screen 112, the computing device 100 determines a characteristic of the movement. For example, the characteristic can be a direction of the movement, a distance traversed by the movement, a distance traversed by at least one of the contacts in the second five-point contact 1905F-I, an average distance traversed by a plurality of the contacts in the second five-point contact 1905F-I, or any combination thereof. Based on a threshold characteristic reached by the characteristic, a default application 1920 slides in and is hidden from view at a side (e.g., same side from where the default application 1920 slid out in FIGS. 19A and 19B), as shown in FIG. 19D. For example, the threshold characteristic can be a threshold duration, a specified direction (e.g., substantially horizontal towards a side, left, right, opposite of specified direction of FIGS. 19A and 19B), a threshold distance, or any combination thereof. The default application 1920 can slide in or out of view proportionally to a distance traversed by the movement and can slide towards the left side and out of view of the touch screen 112 or at the side opposite of a direction of the movement.

Figure 20A:
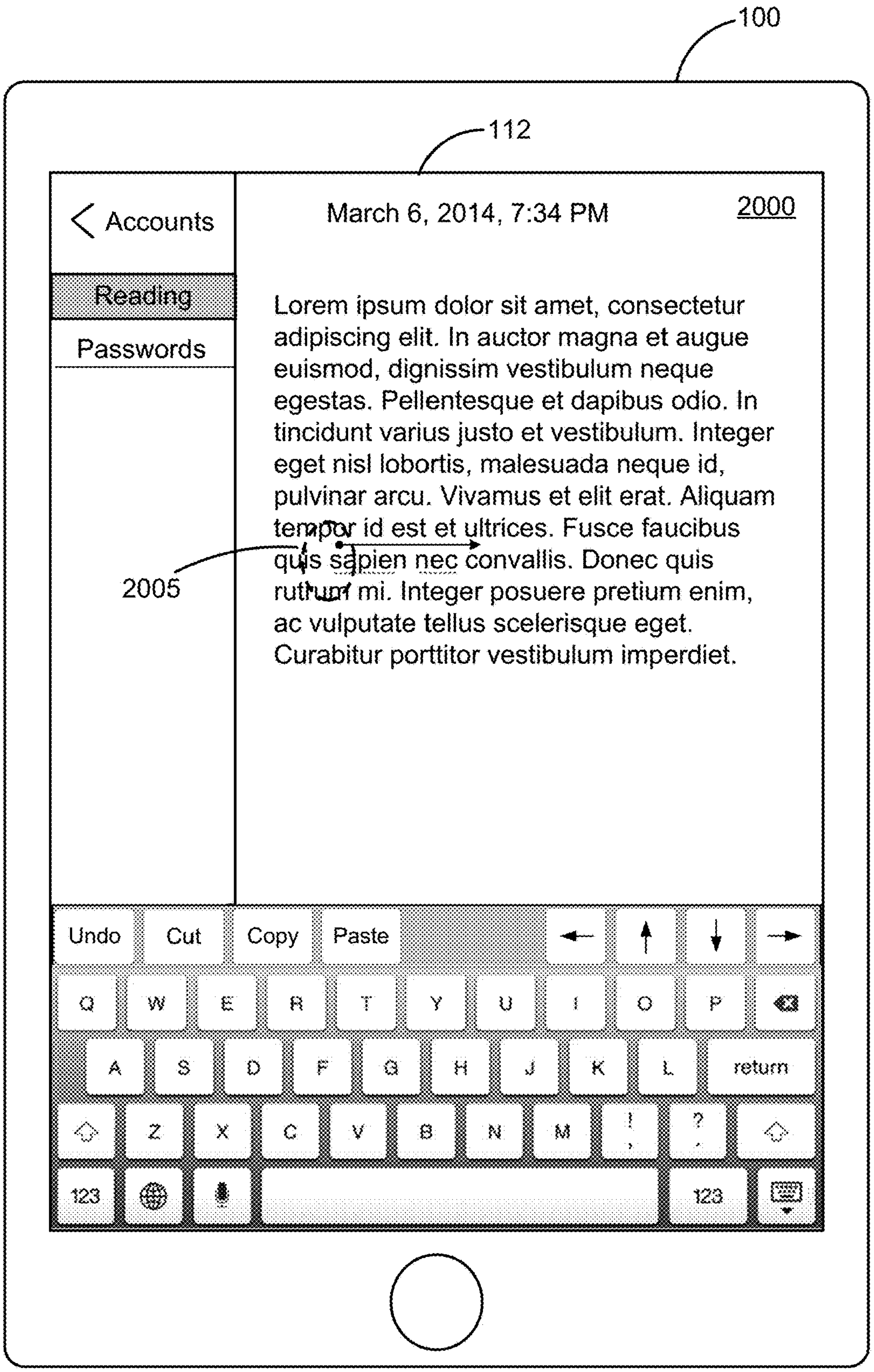
FIGS. 20A-21D are schematics of a touch-sensitive display used to illustrate gestures related to editing text, in accordance with some embodiments.
Figure 20B:
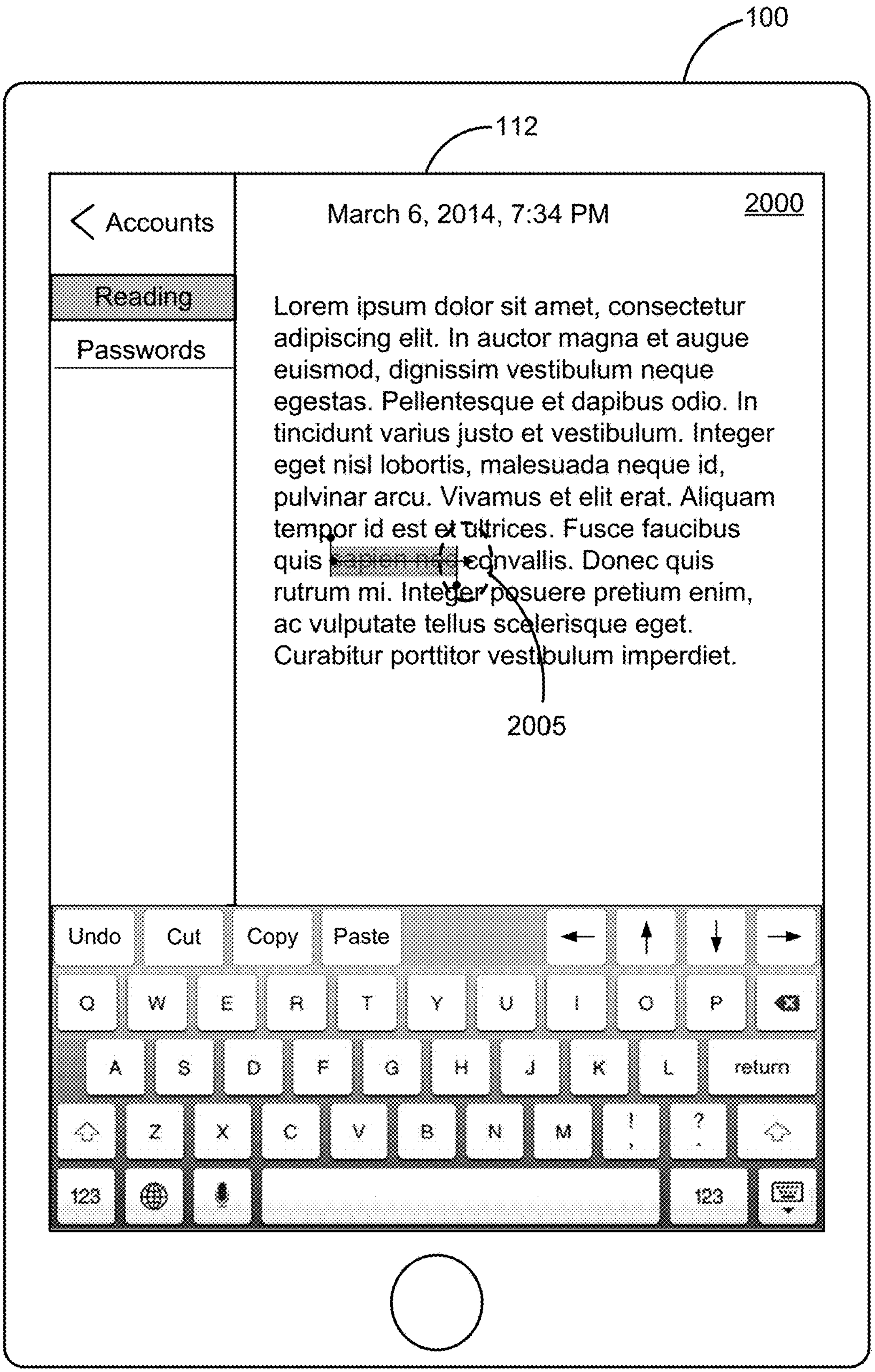

Additional text-selection gestures are provided in some embodiments. More specifically, FIGS. 20A and 20B are schematics of a touch-sensitive display used to illustrate a gesture to select text in an application view 2000 of the computing device 100, in accordance with some embodiments. The gesture to select text can also be used in a shared screen view in some embodiments. Text can be displayed in a first portion of a content region of the display screen. The content region, for example, is a region in an application view of an application such as the notes application associated with the notes icon 219 in FIG. 3 (e.g., notes module 153, FIG. 1A). For example, the text-select gesture includes a contact 2005 as shown in FIG. 20A. The contact 2005 is at a first location in an application view 2000. The computing device 100 detects the contact 2005 and, based on a characteristic of the contact 2005, initiates the text-select gesture. For example, the characteristic can be a duration of the contact 2005 and the computing device 100 initiates the text-select gesture if a threshold duration is exceeded by the contact 2005. An indication can be provided if the characteristic exceeds a threshold. For example, the indication can be appearance of a cursor, a cursor visually distinguished from a typical cursor (e.g., in color, in animation, in frequency of blinking). As the contact 2005 moves across the touch screen 112 to a final location, text is selected from the first location to the final location, as shown in FIG. 20B. The final location can be to the right, to the left, above, or below the first location. Once contact is broken at the final location, no more text is selected.

Figure 21A:
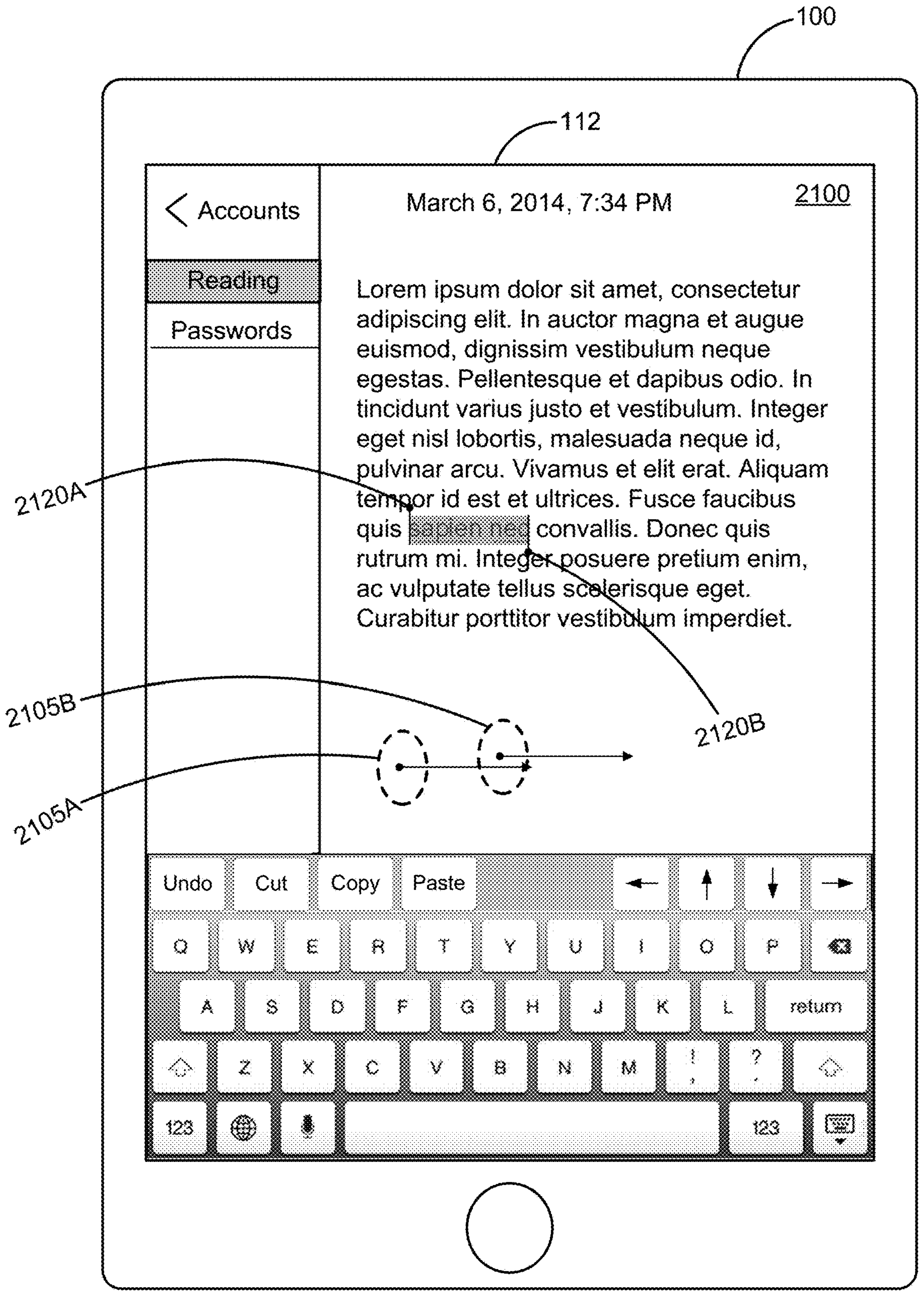
Figure 21B:
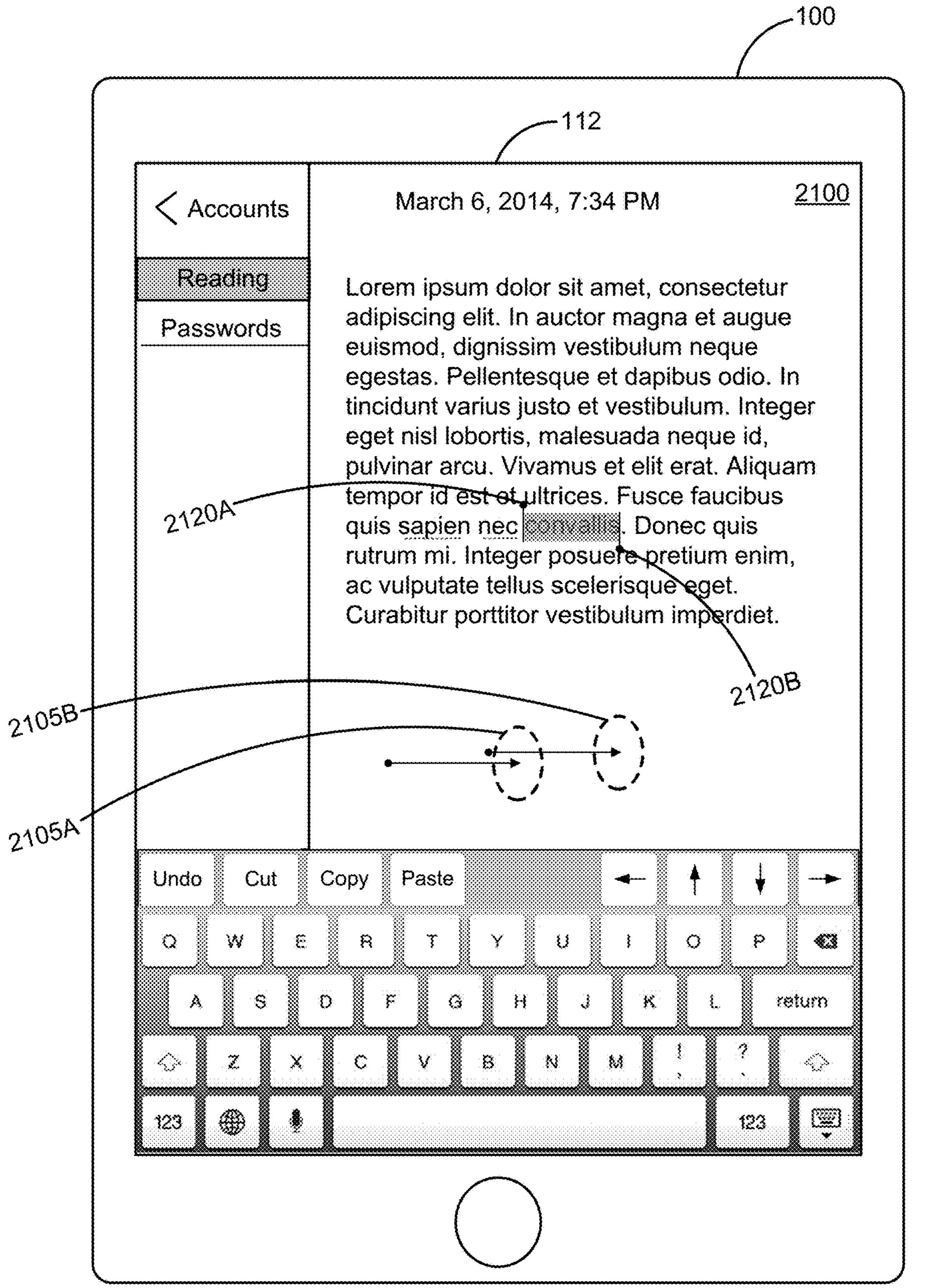

FIGS. 21A and 21B are schematics of a touch-sensitive display used to illustrate a gesture to shift front and end markers of selected text in an application view 2100 of the computing device 100, in accordance with some embodiments. A portion of selected text can include a front marker 2120A and an end marker 2120B, as shown in FIG. 21A. The gesture to shift text selection can also be used in a shared screen view in some embodiments. For example, the text-shift gesture includes a first contact 2105A and a concurrent second contact 2105B, as shown in FIG. 21A. After text has been selected and the contacts 2105A and 2105B are detected by the computing device 100, the computing device 100 detects movement of the first and second contacts 2105A and 2105B in a first direction. Based on the detected movement, the front and end markers 2120A and 2120B are shifted in the direction of the movement. In some embodiments, the front and end markers 2120A and 2120B shift the same distance and, in some other embodiments, the front and end markers 2120A and 2120B shift individually from each other. Thus, the front marker 2120A can shift 10 pixels in the direction of the movement and the end marker 2120B can shift 5 pixels in the direction of the movement. Direction of the movement can be up, down, left, right, diagonal, or any combination thereof. Based on the text-shift gesture, text in the direction of the movement is selected, as shown in FIG. 21B.

Figure 21C:
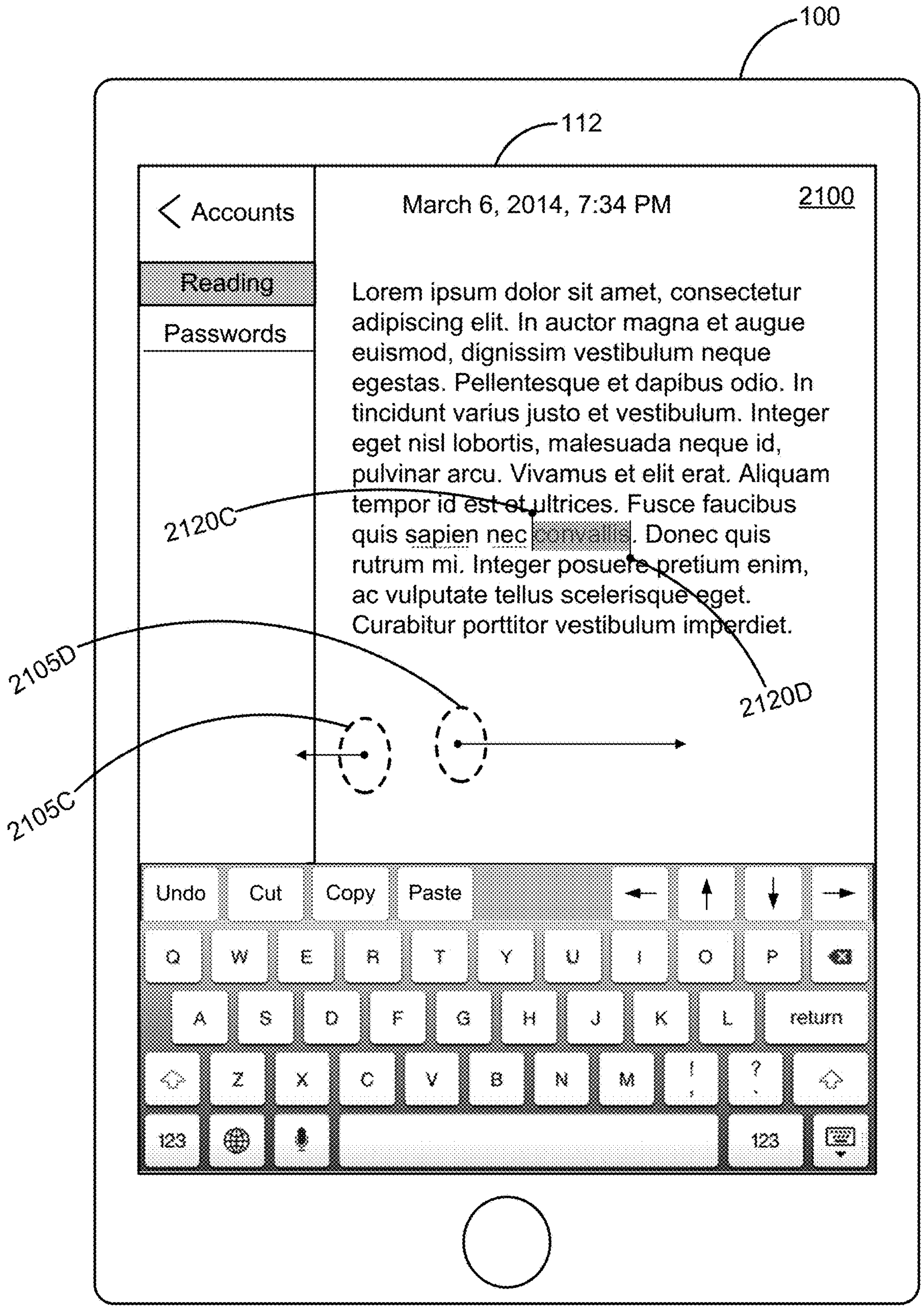
Figure 21D:
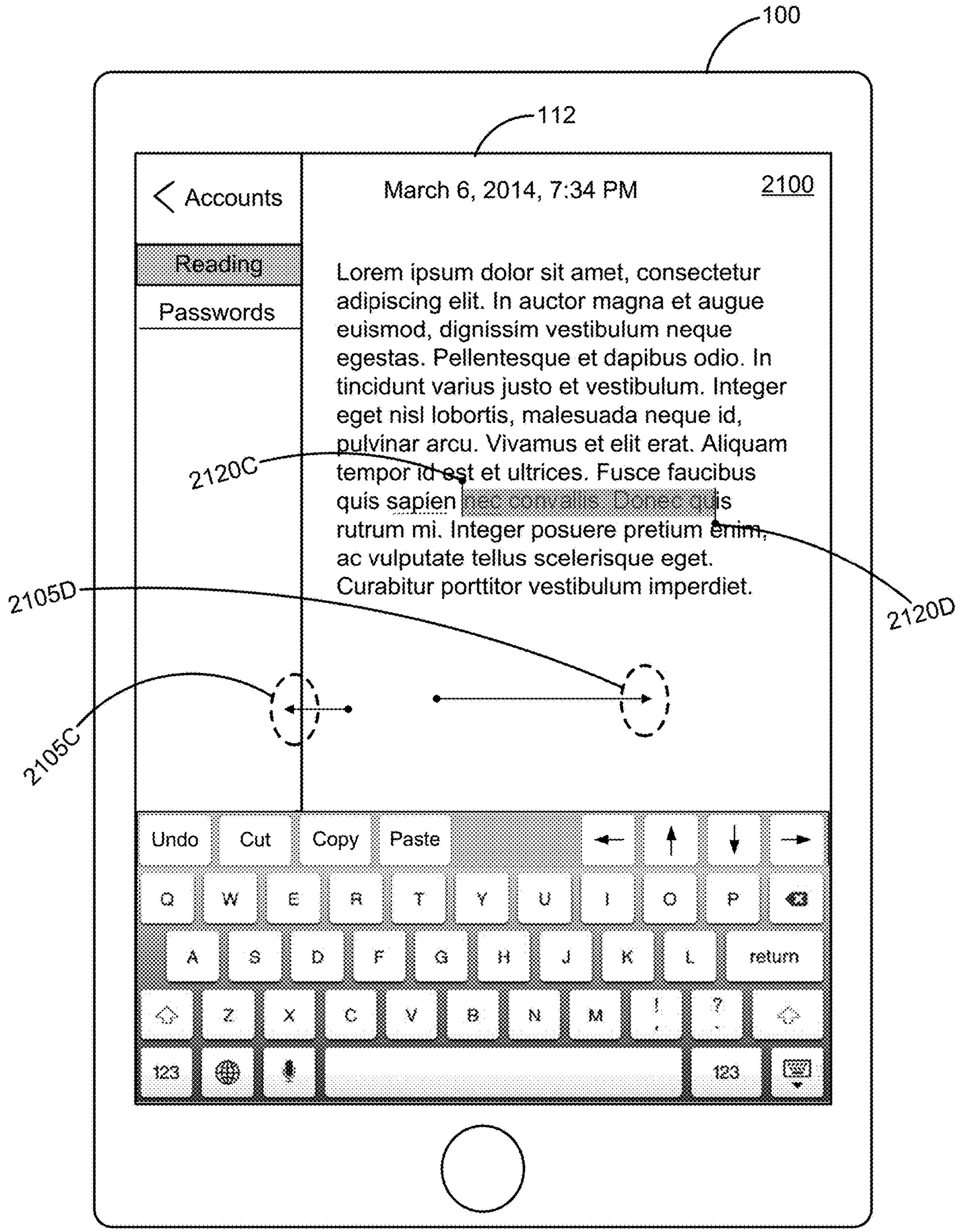

FIGS. 21C and 21D are schematics of a touch-sensitive display used to illustrate a gesture to shift front and/or end markers of selected text in an application view 2100 of the computing device 100, in accordance with some embodiments. In a similar manner as the text-shift gesture, the front and end markers can be shifted individually in a plurality of directions, as shown in FIGS. 21C and 21D. The selected text also includes a front marker 2120C and an end marker 2120D, as shown in FIG. 21C. The second gesture to shift text selection can also be used in a shared screen view in some embodiments. For example, the second text-shift gesture includes a first contact 2105C and a concurrent second contact 2105D, as shown in FIG. 21C. After text has been selected and the contacts 2105C and 2105D are detected by the computing device 100, the computing device 100 detects movement of the first and second contacts 2105C and 2105D in a plurality of directions. Based on the detected movements, the front and end markers 2120C and 2120D are shifted in the direction of the plurality of movements. For example, the front marker 2120C can shift based on the first contact 2105C and the second marker 2120D can shift based on the second contact 2105D. Thus, the front marker 2120A can shift 10 pixels in the direction of the movement of the first contact 2105C (e.g., left) and the end marker 2120D can shift 5 pixels in the direction of the movement of the second contact 2105D (e.g., right). Direction of the movement can be up, down, left, right, diagonal, or any combination thereof. Based on the second text-shift gesture, text in the direction of the movement is selected, as shown in FIG. 21D. Thus, text associated with 10 pixels to the left of the front marker 2120A and text associated with 5 pixels to the right of the end marker 2120B is selected.

Figure 22:
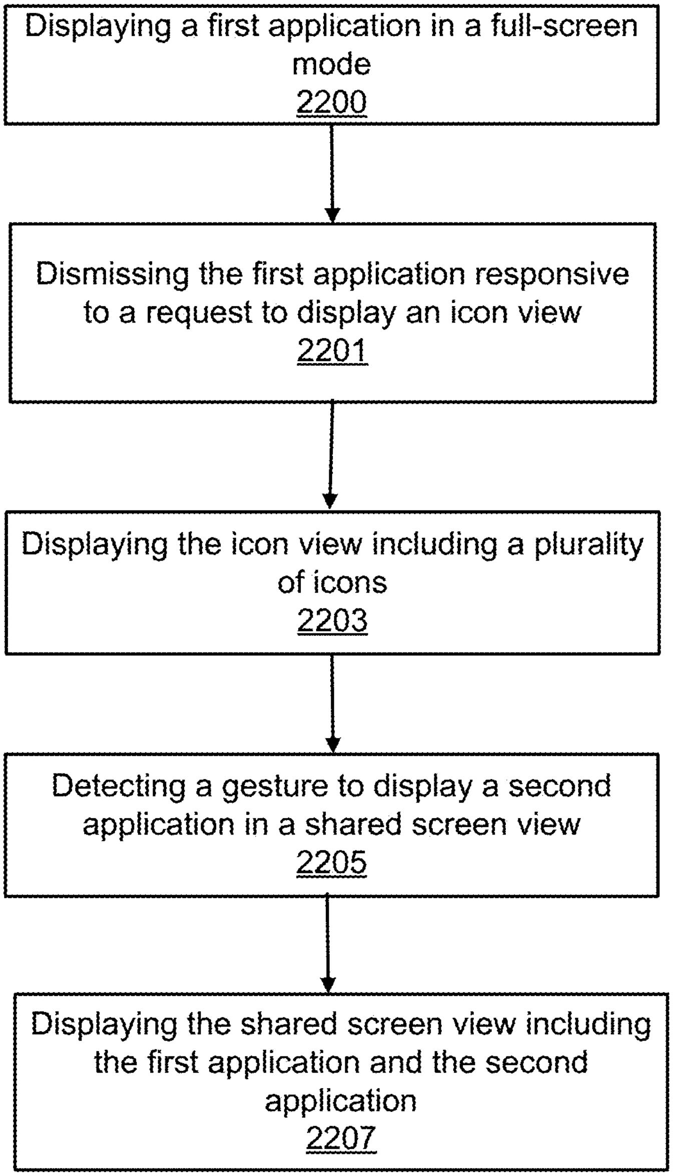
FIGS. 22-25 are method flow diagrams for displaying a shared screen view, in accordance with some embodiments.

Referring now to FIG. 22, a method flow diagram is shown that describes one embodiment of displaying a shared screen view. Other embodiments include steps other than those shown in FIG. 22.

The computing device 100 displays 2200 a first application. The first application is displayed on the computing device 100 in a full-screen mode such as the calendar application shown in FIG. 4. The computing device 100 receives a request to display an icon view of the computing device and dismisses 2201 the first application responsive to the request. One example of a request to display the icon view is the user selection of the home button 204 as indicated by contact 301 in FIG. 4. Although the first application is dismissed, the first application is still executing in the background of the computing device 100. The computing device 100 displays 2203 the icon view such as the icon view shown in FIG. 5A. The icon view includes a plurality of icons each associated with a corresponding application. Selection of an icon causes the computing device to execute an application corresponding to the icon.

The computing device detects 2205 a gesture to display a second application in a shared screen view. In some embodiments, the computing device 100 detects a contact on an icon corresponding to the second application and a continuous movement of the contact from a first location of the icon to a second location on the icon view without the contact breaking contact with the touch screen 112. For example, in FIG. 5A, the computing device 100 detects contact 301 on the messages icon 205 and a continuous movement of contact 301 from the first location of the messages icon 205 to the second location of the messages icon 205 shown in FIG. 5B. Responsive to the gesture, the computing device 100 displays 2207 the shared screen view including the first application and the second application. For example, FIG. 6A illustrates a shared screen view 600 of the calendar application and the messages application.

Figure 23:
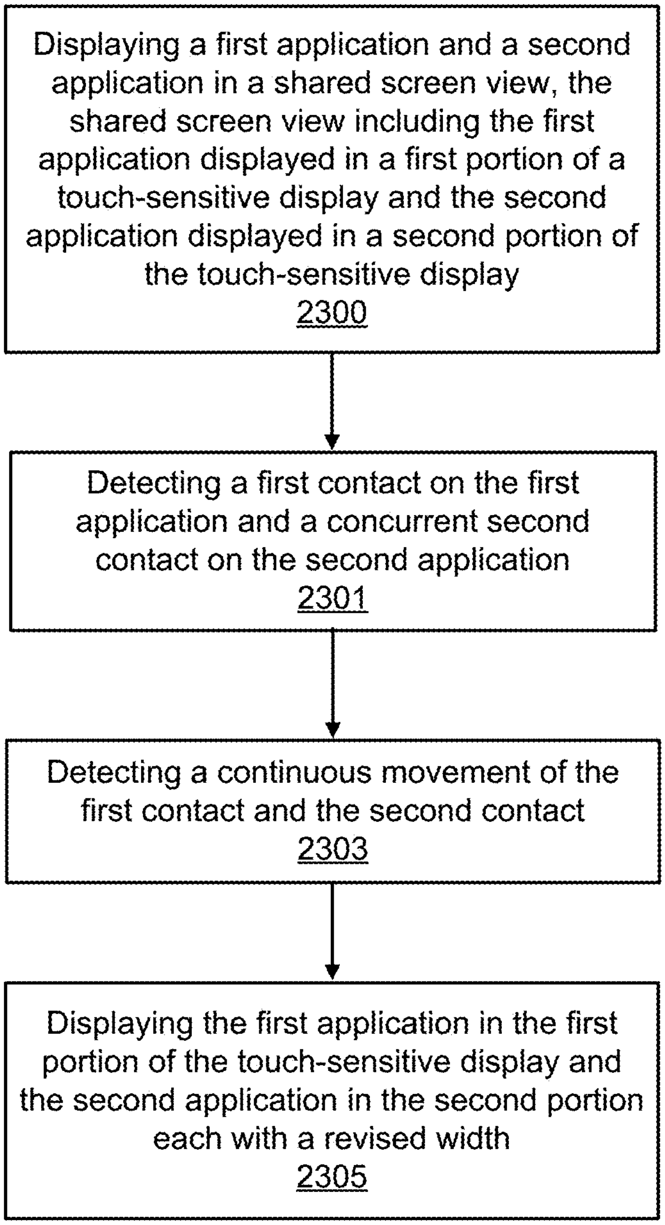

Referring now to FIG. 23, a method flow diagram is shown that describes another embodiment of displaying a shared screen view. Other embodiments include steps other than those shown in FIG. 23.

The computing device 100 displays 2300 a first application and a second application in a shared screen view. The shared screen view includes the first application displayed in a first portion of the touch-sensitive display and the second application displayed in a second portion of the touch-sensitive display where the first portion and the second portion are non-overlapping. The computing device 100 detects 2301 a first contact on the first application displayed in the first portion and a concurrent second contact on the second application displayed in the second portion. The computing device 100 detects 2303 continuous movement of the first contact and the second contact. The continuous movement has a lateral component of movement without the first contact and the second contact breaking contact with the touch-sensitive display. Responsive to the continuous movement, the computing device 100 displays 2305 the first application in the first portion of the touch-sensitive display and the second application in the second portion each with a revised width.

Figure 24:
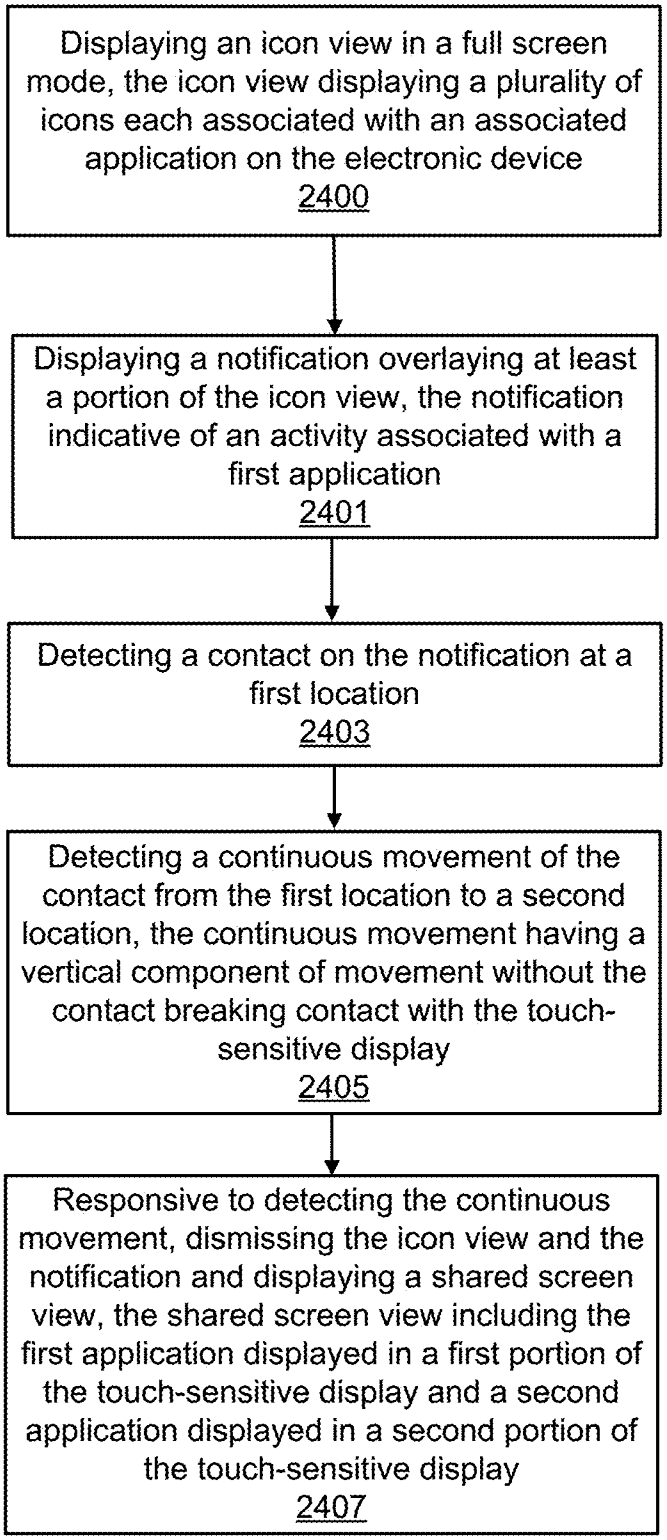

Referring now to FIG. 24, a method flow diagram is shown that describes another embodiment of displaying a shared screen view. Other embodiments include steps other than those shown in FIG. 24.

The computing device 100 displays 2400 an icon view in a full-screen mode, the icon view displaying a plurality of icons each associated with an application on the electronic device. The computing device 100 displays 2401 a notification overlaying at least a portion of the icon view, the notification indicative of an activity associated with a first application. The computing device 100 detects 2403 a contact on the notification at a first location. The computing device 100 detects 2405 continuous movement of the contact from the first location to a second location. The continuous movement has a vertical component of movement without the contact breaking contact with the touch-sensitive display. Responsive to detecting the continuous movement, the computing device 100 dismisses 2407 the icon view and the notification and displays a shared screen view. The shared screen view includes the first application displayed in a first portion of the touch-sensitive display and a second application displayed in a second portion of the touch-sensitive display, wherein the first portion and the second portion are non-overlapping.

Figure 25:
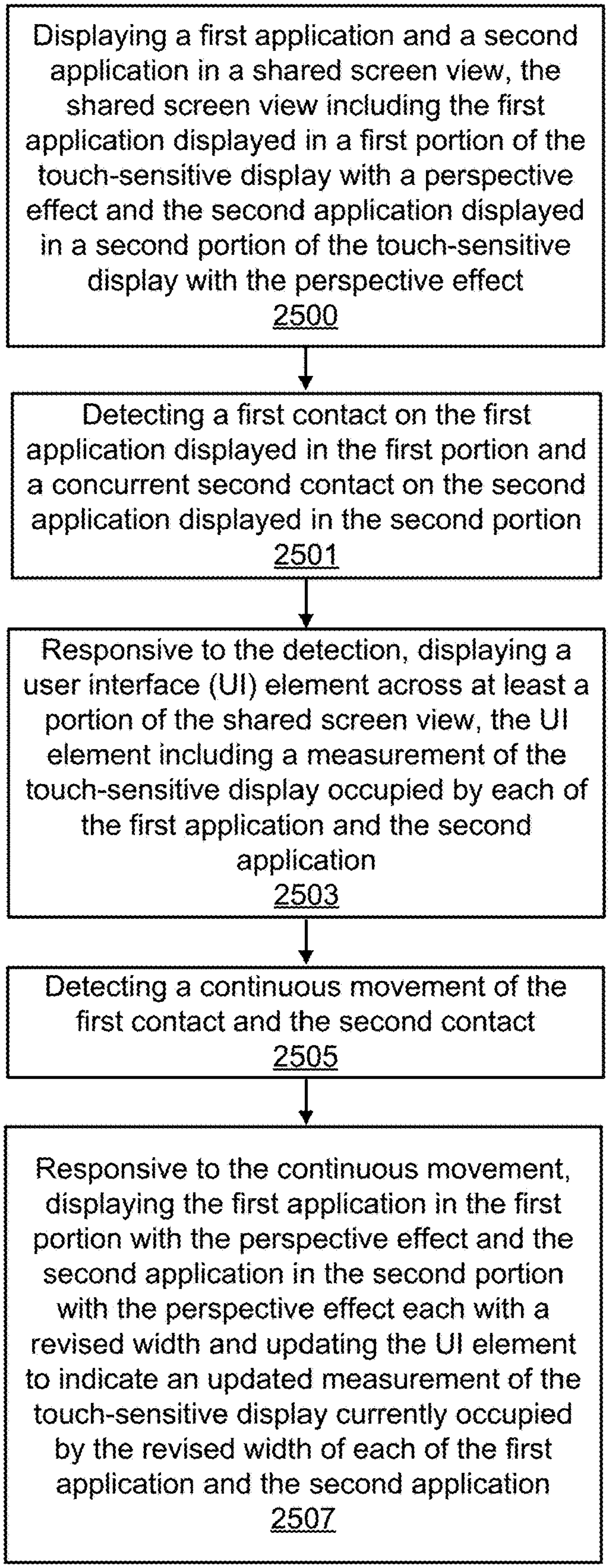

Referring now to FIG. 25, a method flow diagram is shown that describes another embodiment of displaying a shared screen view. Other embodiments include steps other than those shown in FIG. 25.

The computing device 100 displays 2500 a first application and a second application in a shared screen view. The shared screen view includes the first application displayed in a first portion of the touch-sensitive display with a perspective effect and the second application displayed in a second portion of the touch-sensitive display with the perspective effect, wherein the first portion and the second portion are non-overlapping. The computing device 100 detects a first contact on the first application displayed in the first portion and a concurrent second contact on the second application displayed in the second portion. Responsive to the detection, the computing device 100 displays 2503 a user interface element across at least a portion of the shared screen view. The user interface element includes a measurement of the touch-sensitive display occupied by each of the first application and the second application. The computing device 100 detects 2505 a continuous movement of the first contact and the second contact. The continuous movement has a lateral component of movement without the first contact and the second contact breaking contact with the touch-sensitive display. Responsive to the continuous movement, the computing device displays 2507 the first application in the first portion of the touch-sensitive display with the perspective effect and displays the second application in the second portion with the perspective effect each with a revised width. The user interface element is also updated to indicate an updated measurement of the touch-sensitive display currently occupied by the revised width of each of the first application and the second application.

FIG. 26 is a flowchart depicting a method for joining applications in an array view according to some embodiments.

The method begins by displaying 2610, on a display screen of a computing device, an array view of the computing device, the array view including a first application displayed as a first discrete mini application and a second application displayed as a second discrete mini application. The array view includes a user interface element between the first discrete mini application and the second discrete mini application that provides a visual indication the mini applications can be joined (e.g., arrows pointing inward toward each other). Next, a first contact is detected 2620 on the user interface element and, in response, an updated array view is displayed 2630, with the first discrete mini application adjacent to the second discrete mini application. The updated array view includes an updated user interface element displayed 2640 over a shared edge between the first and second mini applications that provides a visual indication the mini applications can be unjoined (e.g., arrows pointing outward away from each other). In some circumstances, the first application and the second application were previously opened on the computing device.

The method includes other steps in some embodiments, such as detecting a second finger contact on the updated user interface element and, in response, displaying the array view of the computing device in the prior state with the applications unjoined. In response to detecting a second finger contact on the first discrete mini application and a gesture moving the second finger contact in a first direction, displaying a second updated array view of the computing device, the second updated array view including the first discrete mini application, the second discrete mini application, and the user interface element, with the first discrete mini application horizontally aligned with the second discrete mini application, the user interface element located between the first discrete mini application and the second discrete mini application, the user interface horizontally aligned with the first and second discrete mini applications, the first arrow of the user interface element pointing to the second discrete mini application, and the second arrow of the user interface element pointing to the first discrete mini application.

In response to detecting a third finger contact and a concurrent fourth finger contact on the computing device that are vertically aligned and a gesture decreasing the distance between the third finger contact and the fourth finger contact on the computing device (e.g., a pinch gesture), displaying a zoomed out array view of the computing device including additional discrete mini applications and additional elements. The additional discrete mini applications are horizontally aligned with the first discrete mini application and the second discrete mini application and the additional elements between each pair of additional discrete mini applications in some embodiments.

FIG. 27 is a flowchart depicting a method for joining applications in an array view according to some embodiments.

The method begins by displaying 2710, on a display screen of a computing device, an array view of the computing device, the array view including a first application displayed as a first discrete mini application and a second application displayed as a second discrete mini application, wherein the first discrete mini app is horizontally aligned with the second discrete mini application. Next, detecting 2720 a first finger contact on the first discrete mini application and a concurrent second finger contact on the second discrete mini application, and responsive to detecting 2730 a decrease in a distance between the first finger contact and the second finger contact (e.g., a pinch), displaying 2740 an updated array view of the computing device, the updated array view including the first discrete mini application and the second discrete mini application, wherein the first discrete mini application is horizontally aligned with, adjacent to, and sharing an edge with the second discrete mini application. In some circumstances, the first application and the second application were previously opened on the computing device.

The method includes other steps in some embodiments, such as detecting a third finger contact on the first discrete mini application and a concurrent fourth finger contact on the second discrete mini application, responsive to detecting distance between the third finger contact and the fourth finger contact increasing, displaying the array view of the computing device. In response to detecting a third finger contact on the first discrete mini application and detecting a gesture moving the third finger contact in a first direction, displaying a second updated array view of the computing device, the second updated array view including the first discrete mini application and the second discrete mini application, wherein the first discrete mini application is horizontally aligned with the second discrete mini application and the order of the first discrete mini application and the second discrete mini application is reversed.

In response to detecting a third finger contact and a concurrent fourth finger contact on the computing device, wherein the third finger contact and the concurrent fourth finger contact are vertically aligned and detecting a gesture decreasing distance between the third finger contact and the fourth finger contact on the computing device, displaying a zoomed out array view of the computing device, the zoomed out array view including additional discrete mini applications, the additional discrete mini applications horizontally aligned with the first discrete mini application and the second discrete mini application.

Corresponding to the methods of FIGS. 26 and 27, FIGS. 13A-15B are schematics of a touch-sensitive display used to illustrate user interfaces for interacting with an array view of applications, in accordance with some embodiments. FIGS. 13A-15B are described in detail above.

FIG. 28 is a flowchart depicting a method for resizing a keyboard in a array view according to some embodiments.

The method begins with displaying 2810, on a display screen of a computing device, a shared screen view of the computing device, the shared screen view including a first application displayed at a first width in a first portion of the display screen and a second application displayed at a second width in a second portion of the display screen, the first application including a keyboard object in a first sub portion of the first portion at the first width of the display screen. Next, detecting 2820 a first finger contact and a second finger contact in the first sub portion, and detecting 2830 a gesture increasing distance between the first finger contact and the second finger contact, the gesture indicating a request to change width of the keyboard object in the first sub portion from the first width to a third width, the third width greater than or equal to the first width plus the second width. Then, responsive to detecting the gesture, displaying 2840 an updated shared screen view, wherein the keyboard object is displayed in a second sub portion of the content region.

The method includes other steps in some embodiments, such as detecting a third finger contact and a fourth finger contact in the third sub portion of the content region and detecting a gesture decreasing distance between the third finger contact and the fourth finger contact, the gesture indicating a request to change width of the keyboard object in the third sub portion from the third width to a fourth width, the fourth width less than the third width, and responsive to detecting the gesture, displaying an updated shared screen view, wherein the keyboard object is displayed at the fourth width. In some embodiments, the fourth width is the first width and the keyboard object is displayed in the first sub portion, or the fourth width is the second width and the keyboard object is displayed in the fourth sub portion.

Corresponding to the method of FIG. 28, FIGS. 16A-16D are schematics of a touch-sensitive display used to illustrate user interfaces for sharing objects while in a shared screen view, in accordance with some embodiments. FIGS. 16A-16D are described in detail above.

FIG. 29 is a flowchart depicting a method for creating smaller application windows within other windows in a multitask view according to some embodiments, e.g., picture-in-picture applications.

The method begins by displaying 2910, on a display screen of a computing device, an opened application view of the computing device, the opened application view including a first application displayed at a first width in a first portion of the display screen. Then, detecting 2920 a four-finger contact on the display screen and detecting 2930 a gesture moving the four-finger contact, the gesture indicating a request to change a first layout of the first application in the first portion of the content region to a picture-in-picture (PIP) layout. Next, responsive to detecting the gesture, displaying 2940 an overlaid screen view, wherein the first application is displayed as a PIP layout in a sub portion of the display screen.

The method includes other steps in some embodiments, such as detecting a second four-finger contact on the display screen and detecting a gesture moving the second four-finger contact, the gesture indicating a request to change the PIP layout of the first application in the sub portion of the content region to the first layout, responsive to detecting the gesture, displaying the overlaid screen view.

An alternative method for invoking a picture-in-picture view includes, according to some embodiments, receiving, at a computing device, a first gesture dragging an application icon a threshold distance from an initial position of the application icon in an icon view that displays a plurality of application icons that are each associated with a corresponding application, the first gesture indicative of a request to display the application associated with the application icon. Determining if the application associated with the application icon is compatible with a picture-in-picture (PIP) configuration. This is related to the gesture 2205 of FIG. 22 for applications that can be displayed in a PIP configuration. Responsive to determining the application is compatible with the PIP configuration, displaying the application associated with the application icon in the PIP configuration. Further, responsive to determining that the application is not compatible with the PIP layout, displaying the shared screen view and displaying the application corresponding to the application icon with a width less than a width of a display screen of the computing device. The application displayed in PIP layout is displayed on top of a second application previously opened by a user of the computing device. In some embodiments, the second application and the application in PIP layout are displayed in the shared screen view.

Corresponding to the method of FIG. 29, FIGS. 17A-18B are schematics of a touch-sensitive display used to illustrate user interfaces associated with a PIP view, in accordance with some embodiments. FIGS. 17A-18B are described in detail above.

FIG. 30 is a flowchart depicting a method for sliding out a default application in a multitask view according to some embodiments.

The method begins by displaying 3010, on a display screen of a computing device, a shared screen view of the computing device, the shared screen view including a first application displayed at a first width in a first portion of the display screen and a second application displayed at a second width in a second portion of the display screen. Then, detecting 3020 a five-finger contact and a five-finger slide gesture 3030 on the display screen indicating a request to display a default application in the shared screen view. Next, responsive to detecting the gesture in a first lateral direction, displaying 3040 an updated shared screen view, the updated shared screen view including the first application displayed in the shared screen view and the default application displayed in the shared screen view.

The method includes other steps in some embodiments, such as detecting a second five-finger contact on the display screen, detecting movement of the second five-finger contact in a second lateral direction, the gesture indicating a request to remove from display the default application in the shared screen view, and responsive to detecting the gesture in the second lateral direction, displaying the shared screen view.

Corresponding to the methods of FIG. 30, FIGS. 19A-19D are schematics of a touch-sensitive display used to illustrate gestures for interacting with a default application, in accordance with some embodiments. FIGS. 19A-19D are described in detail above.

FIGS. 31 and 32 are flowcharts depicting methods for text editing according to some embodiments.

The method of FIG. 31 begins by displaying 3110 a content region of the display screen, and then detecting 3120 a first contact in a sub portion of the first portion of the content region. Responsive to detecting the input, next displaying 3130 a front marker and an end marker at the beginning and end of a portion of the text corresponding to the sub portion. Then detecting 3140 a second finger contact and a third finger contact on the display screen, and detecting 3150 a gesture moving the second finger contact and the third finger contact in a lateral direction. Next shifting 3160 the front marker and the end marker in the lateral direction.

The method includes other steps in some embodiments, such as detecting lateral direction. Also, detecting movement of the second finger contact in a lateral direction and shifting the end marker in the lateral direction.

A similar method includes displaying, on a display screen of a computing device, text displayed in a first portion of a content region of the display screen, detecting a first contact in a sub portion of the first portion of the content region, and responsive to detecting the first finger contact, displaying a front marker and an end marker at the beginning and end of a portion of the text corresponding to the sub portion. Then detecting a second finger contact and a third finger contact on the display screen, detecting a gesture moving the first finger contact in lateral direction, and shifting the front marker in the lateral direction.

The method includes other steps in some embodiments, such as detecting movement of the third finger contact in a lateral direction and shifting the end marker in the lateral direction; and detecting movement of the second finger contact and the third finger contact in a lateral direction and shifting the front marker and the end marker in the lateral direction.

The method of FIG. 32 begins by displaying 3210, on a display screen of a computing device, text displayed in a first portion of a content region of the display screen and detecting 3220 a touch in a sub portion of the first portion of the content region for at least a threshold duration. Then detecting 3230 movement of the touch, the movement indicative of selecting text in the direction of the movement and selecting 3240 text in the direction of the movement.

Corresponding to the methods of FIGS. 31 and 32, FIGS. 20A-21D are schematics of a touch-sensitive display used to illustrate gestures related to editing text, in accordance with some embodiments. FIGS. 20A-21D are described in detail above.

Referring now to FIGS. 33A-33D, the process for activating an application selector is discussed in more detail, in accordance with some embodiments. In some embodiments, a shared screen view is activated using an application selector (also referred to as an application launcher, application selector, multitasking selector, multitasking launcher, etc.). An application selector is a user interface element that allows for selection of one or more applications for display in a shared screen view. In some embodiments, the application selector displays affordances corresponding to applications (referred to herein as application-specific affordances) that are compatible with the shared screen view (e.g., compatible applications are determined by multitasking module 180, or a component thereof such as compatibility module 184).

Figure 33A:
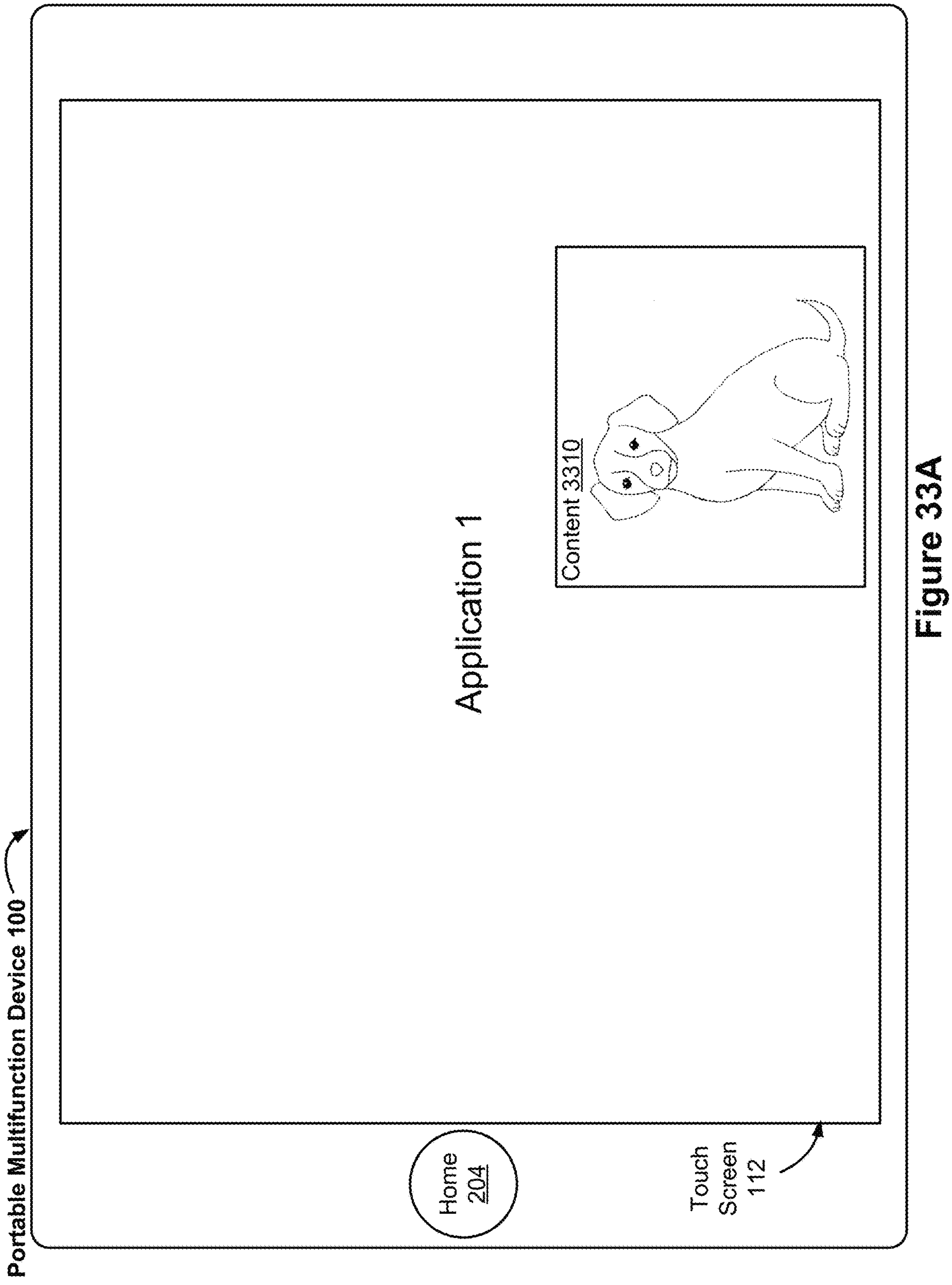
FIGS. 33A-33D are schematics of a touch-sensitive display used to illustrate activation of an application selector, in accordance with some embodiments.

FIG. 33A is a schematic of a touch-sensitive display used to illustrate portable multifunction device 100 displaying a single application (e.g., Application 1) on touch screen 112. As pictured in FIG. 33A, the displayed application (e.g., Application 1) is displayed with content 3310 (e.g., a picture of a dog or any other image accessible to portable multifunction device 100 through camera module 143 and/or image management module 144).

Figure 33B:
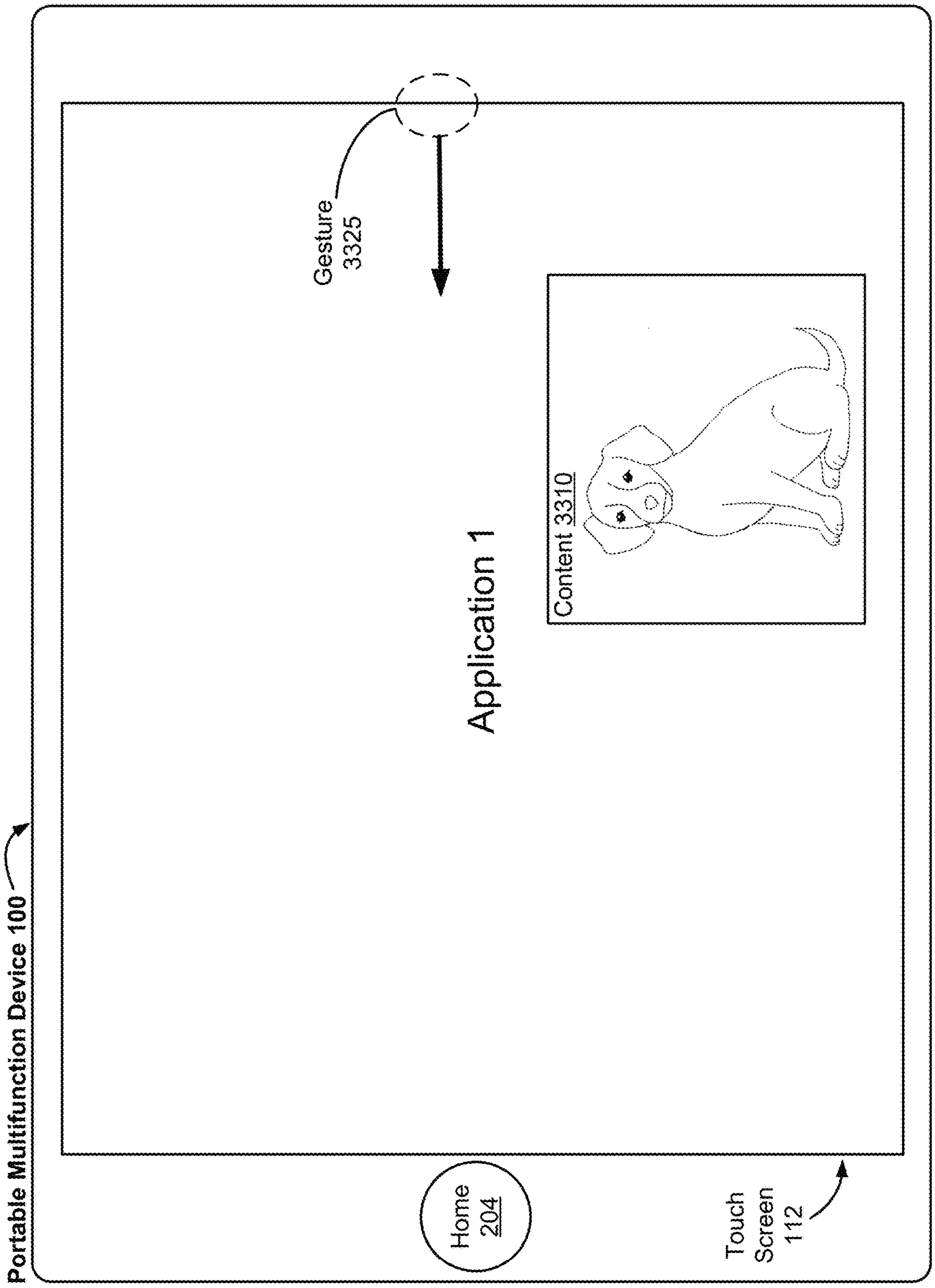
Figure 33C:
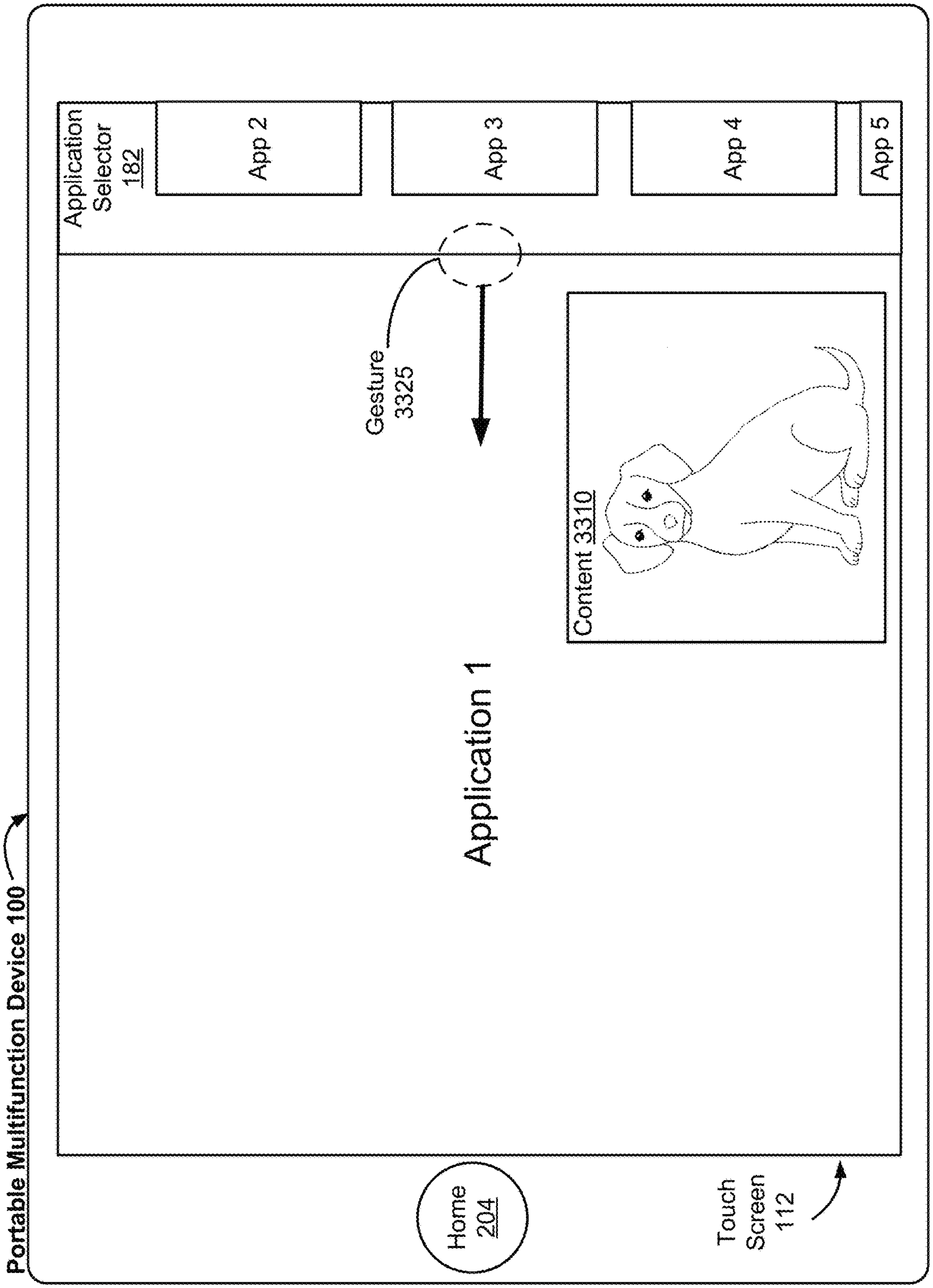

FIG. 33B illustrates a gesture 3325 for revealing the application selector (e.g., application selector 182 of FIG. 33C). In some embodiments, gesture 3325 is a single tap (e.g., using a finger, a stylus, or some other device capable of interacting with touch screen 112). In some embodiments, the single tap may be at or above a designated affordance for activating (i.e., invoking) the application selector. The use of a designated affordance for activating the application selector is described below with reference to FIGS. 39A-39D.

In other embodiments, gesture 3325 is a sliding gesture that moves in a right-to-left direction (in some other embodiments the sliding gesture is in a left-to-right, up-to-down, down-to-up, or diagonal direction, or some other gesture configured by a user of device 100) on the touch screen 112 of portable multifunction device 100. In these embodiments, the application selector is revealed in accordance with movement of the sliding gesture. For example, as pictured in FIG. 33C, gesture 3325 has moved across touch screen 112 to a new location (as compared to gesture 3325's location in FIG. 33B) and, in accordance with this movement, application selector 182 is partially revealed on touch screen 112. As shown in FIG. 33C, application selector 182 is partially displayed with partially displayed affordances corresponding to applications (e.g., app 2, app 3, app 4, and app 5).

Figure 33D:
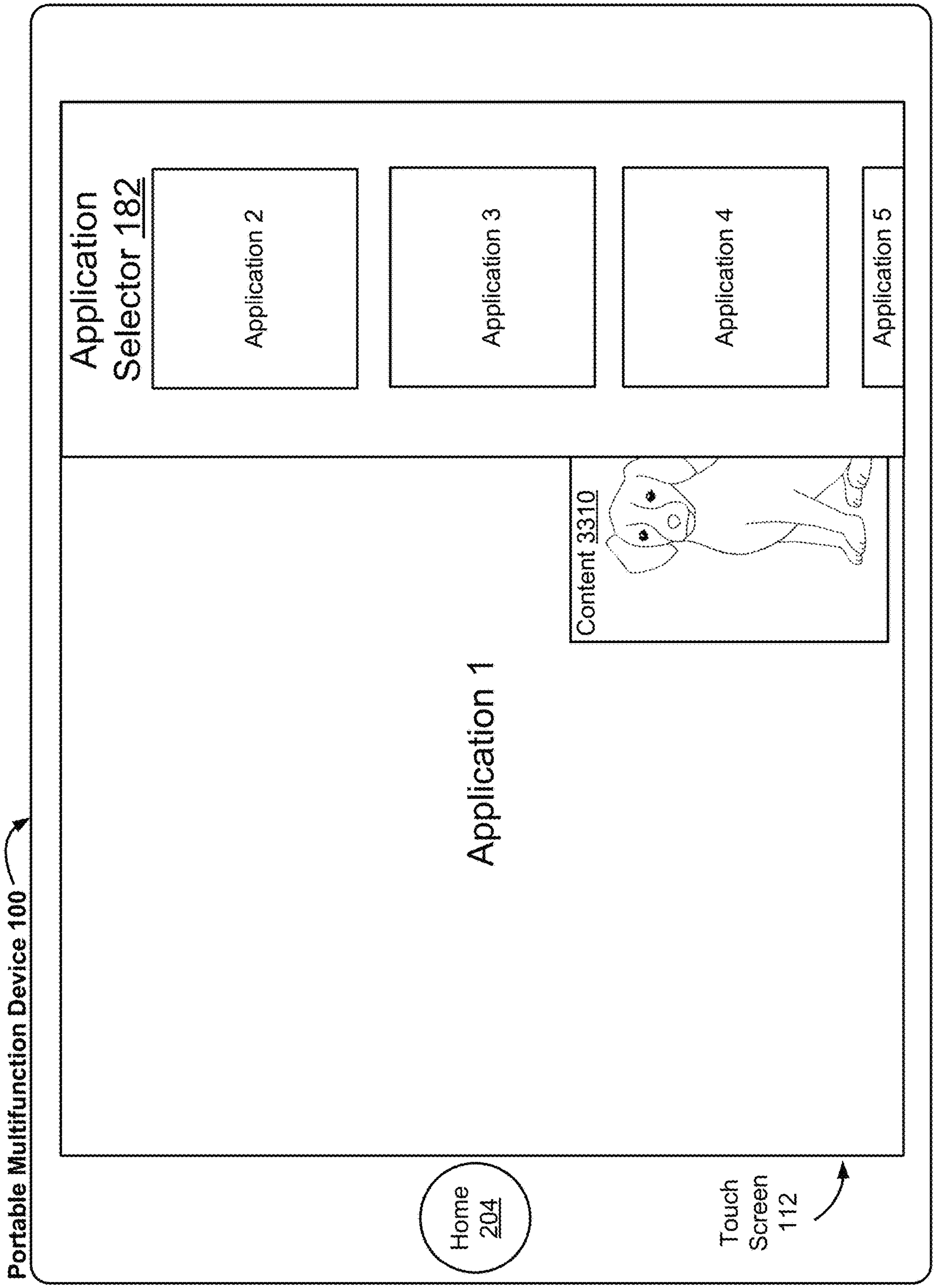

In some embodiments, a sliding gesture reveals all of the application selector and, thus, any movement of gesture 3325 across touch screen 112 reveals all of the application selector, as pictured in FIG. 33D. In these embodiments, display of the application selector may still be animated (e.g., application selector 182 appears to slide onto touch screen 112, even if the sliding is not, in these embodiments, in accordance with movement of the sliding gesture). In some embodiments, a sliding gesture partially reveals application selector 182 or reveals all of application selector 182 in accordance with a characteristic associated with gesture 3325. For example, if a velocity of gesture 3325 satisfies a threshold velocity, then all of application selector is revealed, whereas if gesture 3325 does not satisfy the threshold, then application selector is partially revealed in accordance with movement of the gesture. In some embodiments, a user of the device 100 is able to configure settings for revealing the application selector 182 (e.g., user can define the thresholds, adjust the thresholds, or define a custom animation for revealing the application selector).

As shown in FIG. 33D, in some embodiments, once the application selector is displayed (e.g., partially or fully displayed), application selector 182 overlays application 1 (or any other currently displayed application). Thus, FIG. 33D illustrates that content 3310 displayed within application 1 is partially obscured by the display of application selector 182. In other embodiments, application selector 182 overlays application 1, but the application selector 182 is displayed in a semi-transparent fashion, such that content 3310 would still be visible behind/beneath application selector 182.

Figure 34A:
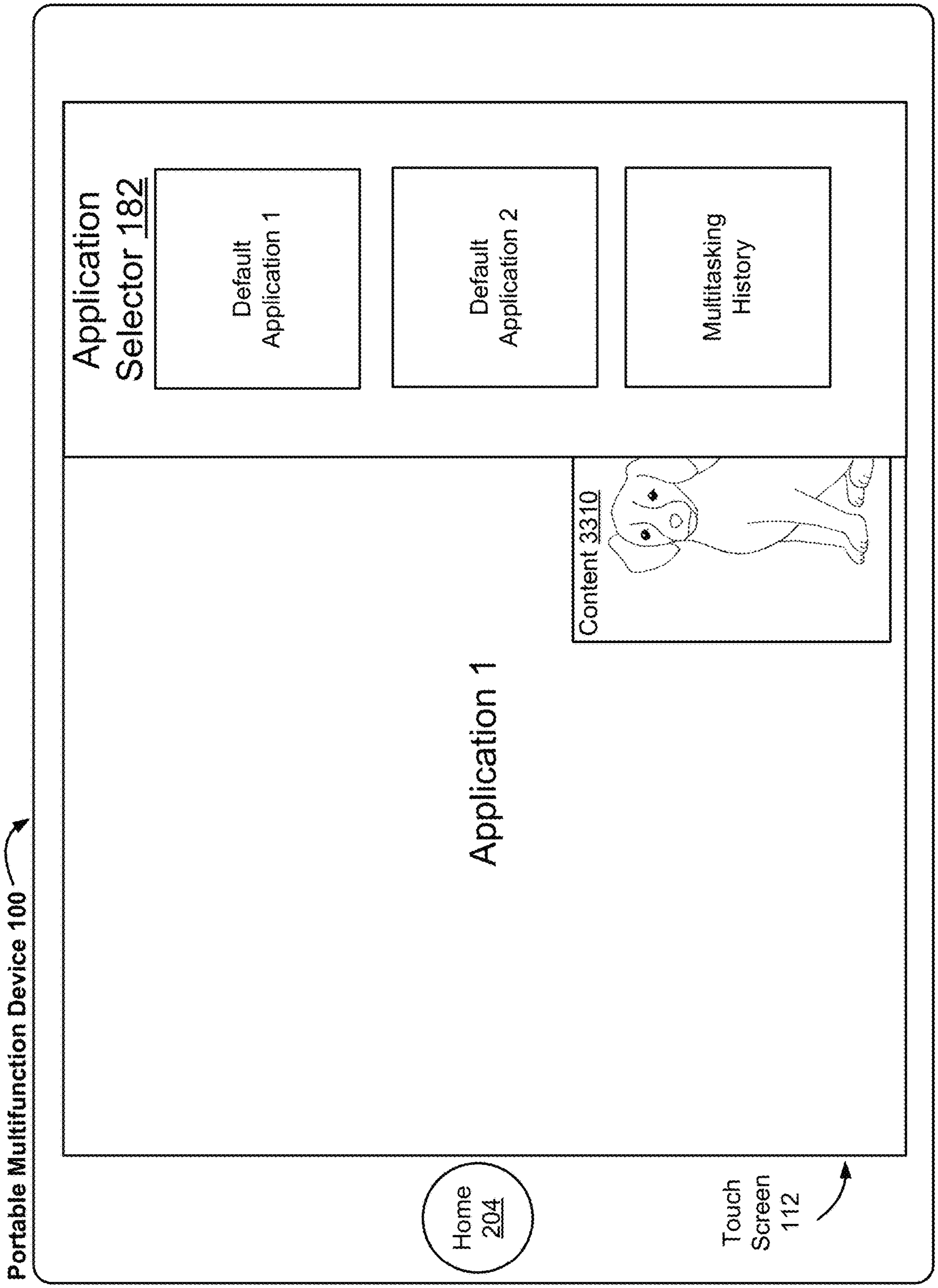
FIGS. 34A-34C are schematics of a touch-sensitive display used to illustrate contents of an application selector, in accordance with some embodiments.
Figure 34B:
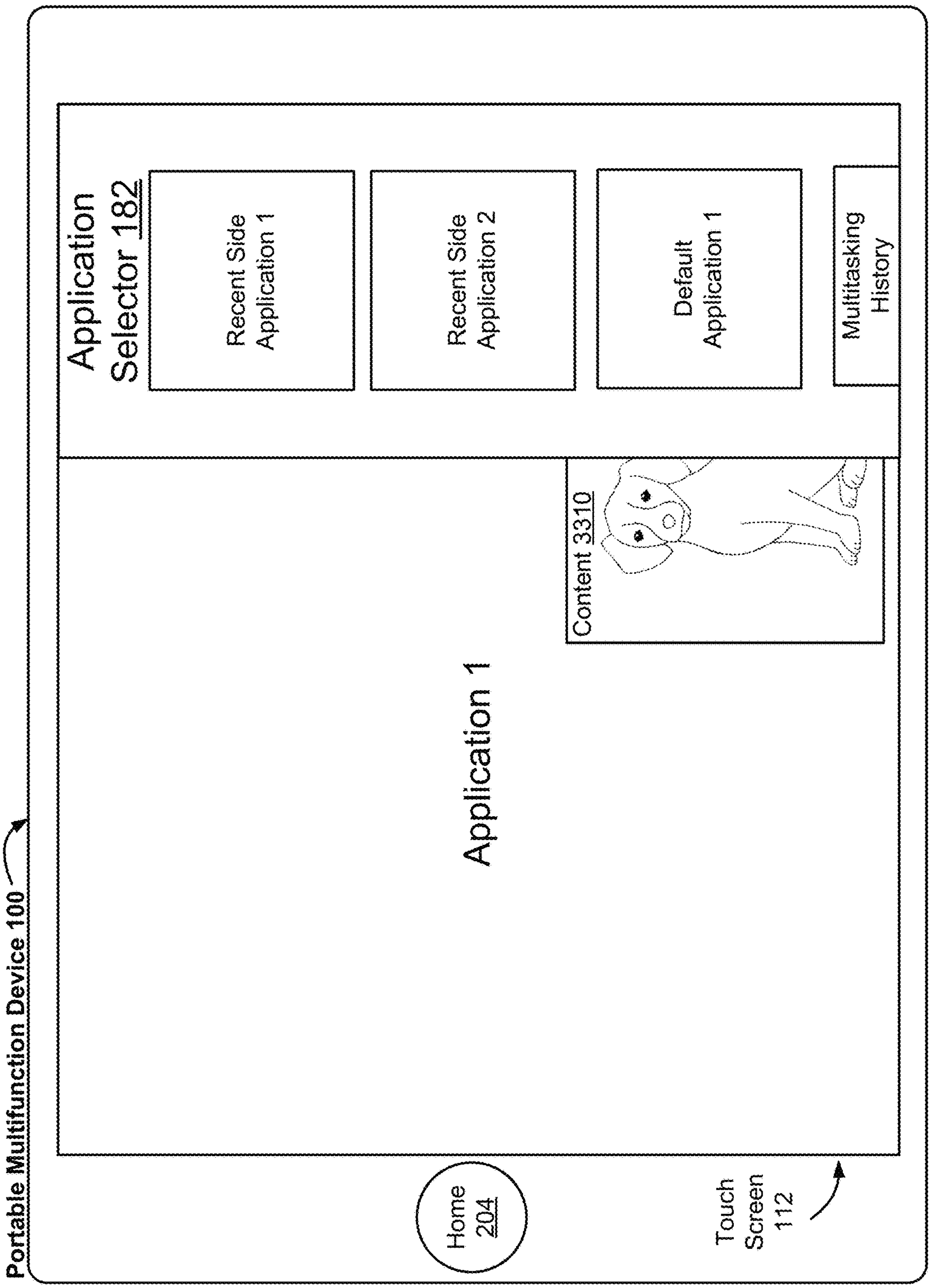
Figure 34C:
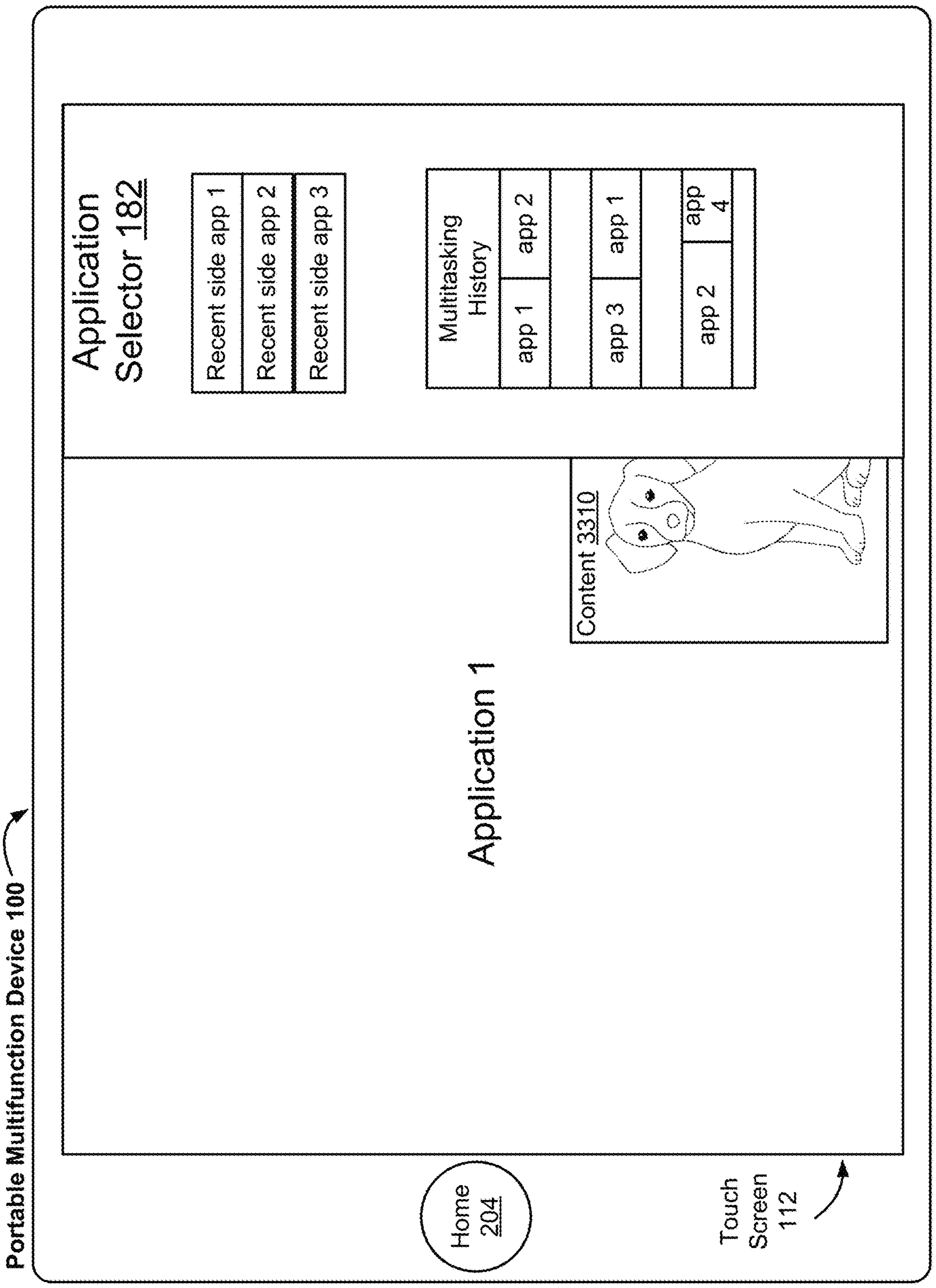

FIGS. 34A-34C are schematics of a touch-sensitive display used to illustrate contents of an application selector, in accordance with some embodiments. More specifically, FIG. 34A is a schematic of a touch-sensitive display used to illustrate default contents of an application selector, in accordance with some embodiments. As pictured in FIG. 34A, when an application selector (e.g., application selector 182) is utilized for the first time, the application selector is populated (e.g., by multitasking module 180) with a number of affordances. In some embodiments, the affordances correspond to an active (i.e., the application's current state) or cached (i.e. preloaded) view of an application. In some embodiments, the affordances further include an icon associated with the application (in addition to the active or cached view of the application, e.g., the icon overlays an active view of the application). In some embodiments, the active view affordance corresponding to an application continuously updates (e.g., as new messages are received within instant messaging module 141, the new messages are also displayed within the active view affordance).

In some embodiments, application selector 182 is initially populated with affordances corresponding to a default application 1, a default application 2, and a multitasking history (e.g., multitasking history 188, FIG. 1A). In some embodiments, the default applications are pre-canned applications selected by a manufacturer of device 100 (e.g., notes module 152 and map module 154, FIG. 1A). In some embodiments, multitasking history 188 includes a list of affordances corresponding to applications previously used in the multitasking mode. In some embodiments, the application selector is also initially populated with an affordance corresponding to a notification center. In some embodiments, the affordances currently associated with the application selector are stored in memory 102 with application selector 182 (FIG. 1A).

As shown in FIG. 34B, the affordances displayed within application selector 182 automatically update based on user behavior. For example, if a user of device 100 activates a multitasking mode for recent side application 2 and later for recent side application 1, then application selector 182, in some embodiments, is updated to include affordances for these recent side applications (as shown in FIG. 34B). In some embodiments, the affordances for recent side applications are displayed at the top of application selector 182, such that other affordances are pushed to a lower position within application selector 182. In some embodiments, recent side applications replace default applications (e.g., recent side application 2 replaces default application 2 between FIGS. 34A and 34B). As the user continues to use new applications in the multitasking mode, eventually the affordances corresponding to default applications will no longer be displayed (as shown in FIG. 34C). By automatically updating affordances within application selector 182, users are provided with an application selector that caters to their multitasking habits and allows for a quick and intuitive user experience with application selector 182. In some other embodiments, the affordances are displayed within the application selector such that the affordance corresponding to the most-recently-used application is displayed at the bottom of the application selector. For example, with reference to FIG. 33D, if a user has recently opened application 2, then application 3, then application 4, then application 5, and then the currently-displayed application 1, then in accordance with these other embodiments, the application selector displays the affordance for application 5 at the bottom of the application selector, followed by the affordance for application 4, and so on, up to the affordance for application 2 at the top of the application selector (i.e., the affordance corresponding to the most-recently-used application is displayed at the bottom of the application selector).

FIG. 34C also illustrates an alternative embodiment of displaying affordances within application selector 182. As pictured in FIG. 34C, affordances within application selector 182 are displayed in a stacked view (e.g., affordances for recent side applications 1, 2, and 3 are displayed on top of each other). In some embodiments, selecting an affordance that is displayed in the stacked view causes device 100 (or a component thereof, such as graphics module 132) to expand each affordance to display a current live view of the application associated with each affordance (e.g., tapping on the affordance for recent side app 1 while in the stacked view results in displaying larger affordances for each of recent side applications 1, 2, and 3 within application selector 182 and the larger affordances include a current live view of applications 1, 2, and 3, respectively). A subsequent touch input at any of the larger affordances would then result, in these embodiments, in displaying the selected application corresponding to the selected affordance as the side application (e.g., displaying the selected application in an area of touch screen 112 previously occupied by application selector 182).

FIG. 34C further illustrates an alternative embodiment of displaying affordances within the multitasking history portion of application selector 182. As shown in FIG. 34C, the multitasking history portion displays affordances together to represent recent applications used together in the multitasking mode (e.g., multitasking history displays (i) affordances for app 1 and app 2 together; (ii) affordances for app 3 and app 1 together; and (iii) affordances for app 2 and app 4 together). In some embodiments, the affordances are displayed in proportion to a portion of touch screen 112 occupied by the application while in the multitasking mode (e.g., affordance for app 2 occupies ⅔ and affordance for app 4 occupies ⅓ in accordance with a determination that when applications 2 and 4 were used in the multitasking mode, application 2 occupied ⅔ and application 4 occupied ⅓ of touch screen 112). In some embodiments selection of an affordance from multitasking history results in reactivating the multitasking mode associated with the selected affordance (e.g., if a touch input is received at the affordance for app 4, then the multitasking mode in which application 2 occupied ⅔ and application 4 occupied ⅓ of touch screen 112 is re-displayed).

Figure 35A:
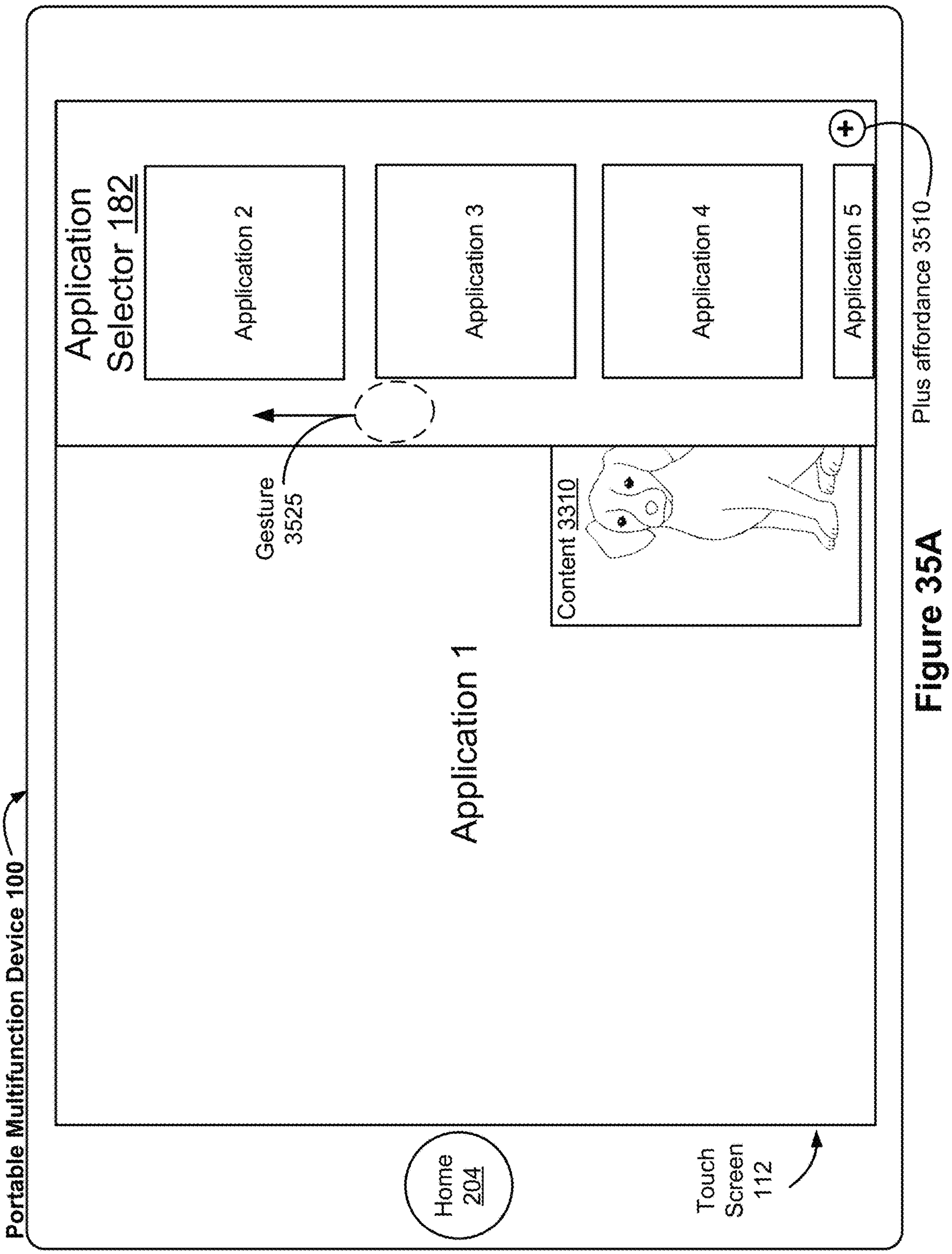
FIGS. 35A-35B are schematics of a touch-sensitive display used to illustrate a gesture to scroll through the contents of an application selector, in accordance with some embodiments.
Figure 35B:
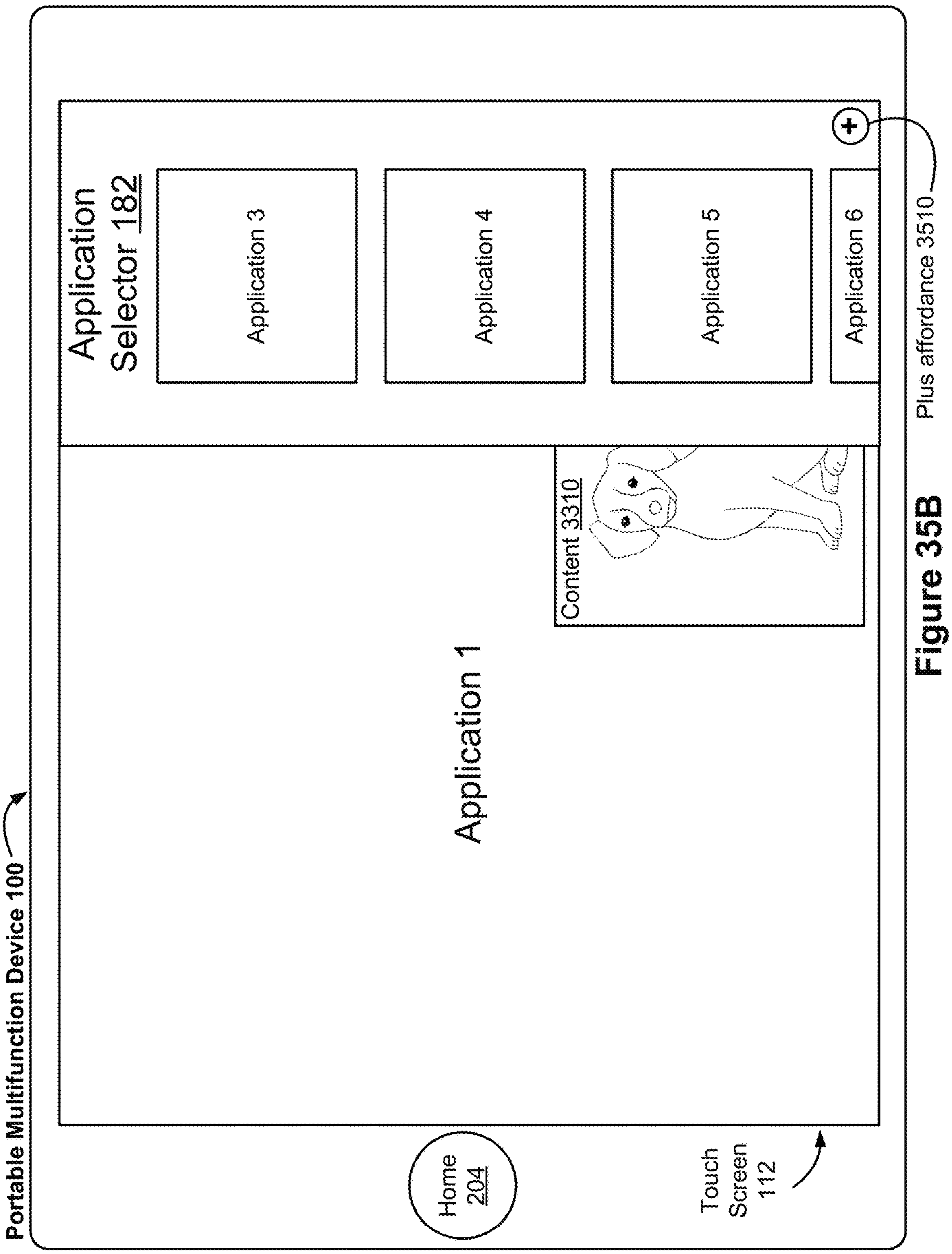

FIGS. 35A-35B are schematics of a touch-sensitive display used to illustrate a gesture (e.g., gesture 3525, FIG. 35A) to scroll through the contents of an application selector, in accordance with some embodiments. More specifically, gesture 3525 moves in a substantially vertical direction within application selector 182 and, in response to detecting the gesture, the affordances displayed within application selector 182 are updated (e.g., as pictured in FIG. 35B, the affordance for application 2 is no longer displayed and a new affordance for application 6 is now displayed). In some embodiments, a user is able to configure whether movement in an upward or a downward direction triggers scrolling of the contents of application selector 182.

In some embodiments, the scrolling gesture (e.g., gesture 3525) causes device 100 to determine whether application selector 182 contains additional affordances that are not currently displayed. In accordance with a determination that application selector 182 does contain additional affordances, application selector 182 is scrolled to display one or more of the additional affordances. In accordance with a determination that application selector 182 does not contain additional affordances, application selector 182 is not scrolled and continues to display the same set of affordances (in some embodiments, application selector 182 is still scrolled slightly to reveal an empty area below or above (depending on the direction of the scrolling) all of the currently-displayed affordances within the application selector, in order to provide a visual indication to users that no additional affordances are currently associated with application selector 182 (this visual effect is referred to as rubber-banding or bouncing back)).

In some embodiments, application selector 182 also displays a plus affordance (e.g., plus affordance 3510). If device 100 (or a component thereof, such as contact/motion module 130) detects a touch input at the plus affordance 3510, then a user of device 100 is presented with a list of applications that are compatible with the shared screen mode (e.g., as determined by compatibility module 184). The user is then able to select one or more applications from the list, in order to add affordances corresponding to the selected one or more applications to application selector 182. The contents of application selectors and, more specifically, manually removing affordances from application selector 182 is discussed in more detail below with reference to FIGS. 38A-38D.

FIGS. 36A-36D are schematics of a touch-sensitive display used to illustrate use of an application selector to enter a shared screen mode. As pictured in FIG. 36A, once the application selector is fully displayed (as discussed above with reference to FIGS. 33A-33D), then the affordances corresponding to applications displayed within the application selector (termed application-specific affordances, as discussed in more detail with reference to FIGS. 34A-34C) are selectable (i.e., available for a user to select). Contact 3630 shows an exemplary interaction with (i.e., an input at) the application-specific affordance corresponding to application 2. In some embodiments, contact 3630 is a single tap on (e.g., over, on top of, substantially within, or at) the application-specific affordance corresponding to application 2.

Figure 36A:
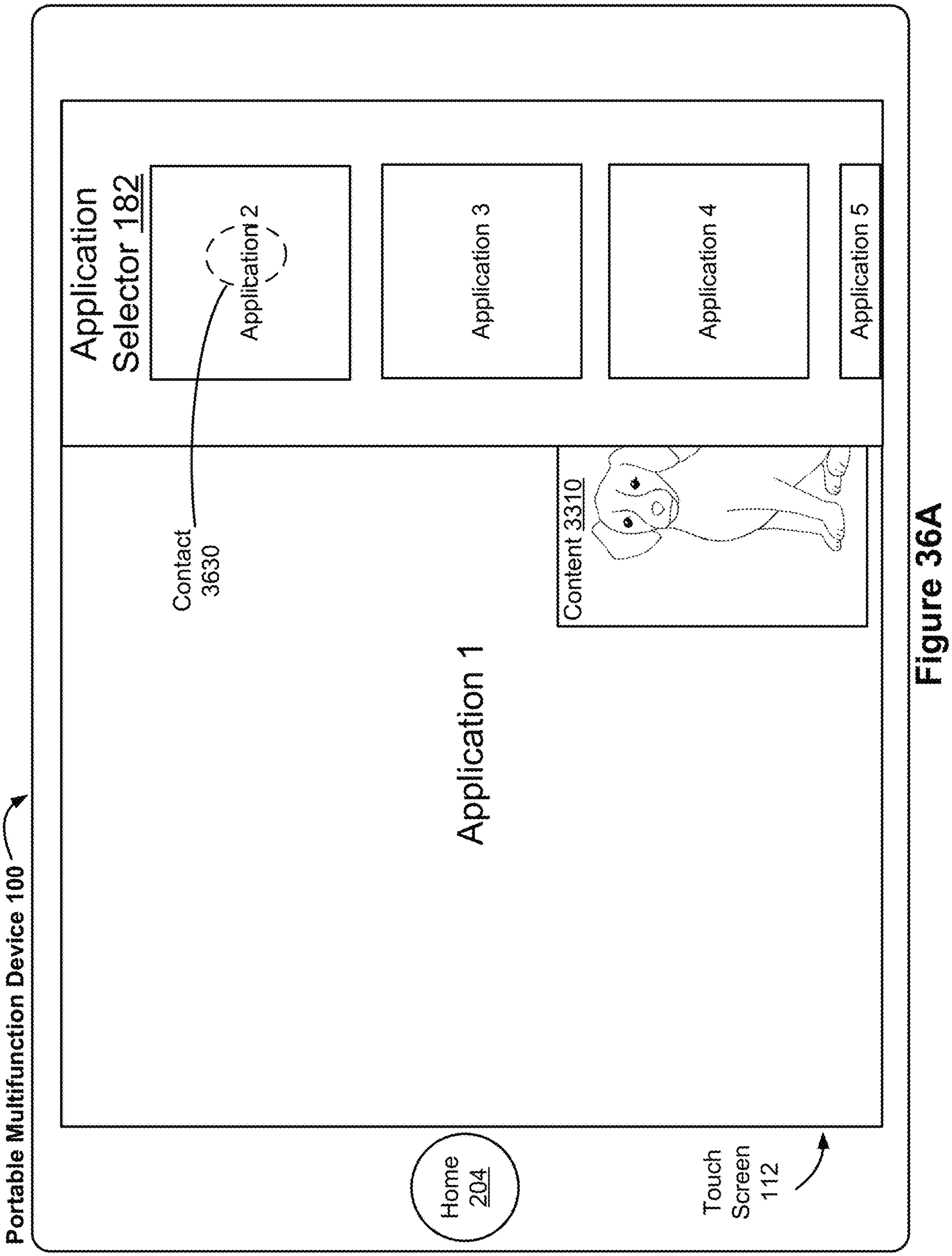
FIGS. 36A-36H are schematics of a touch-sensitive display used to illustrate activation of a multitasking mode (also referred to as a shared screen view or a shared screen mode) using an application selector, in accordance with some embodiments.
Figure 36B:
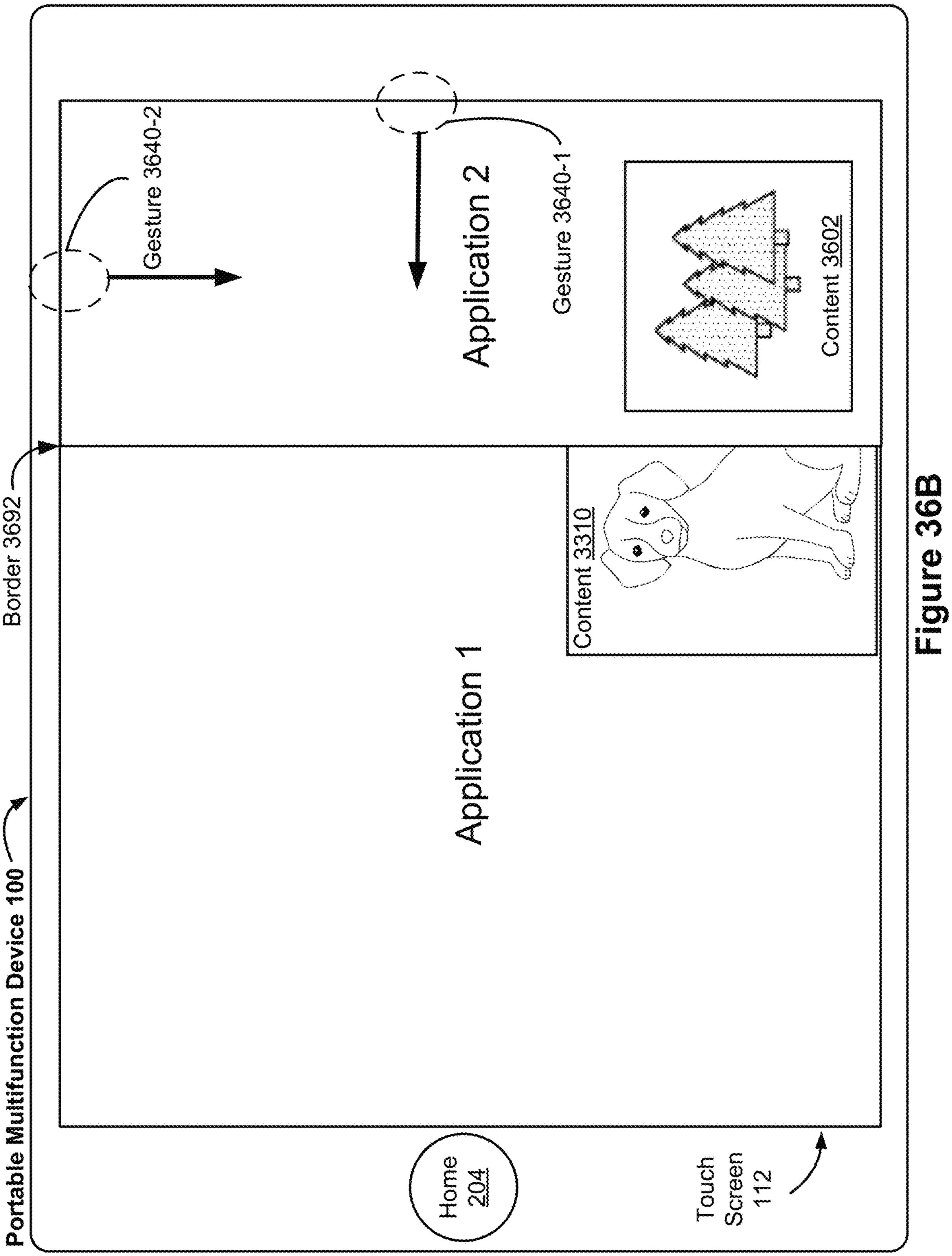

FIG. 36B is a schematic of a touch-sensitive display used to illustrate an exemplary user interface displayed after receiving input within the application selector (e.g., at the application-specific affordance corresponding to application 2). In some embodiments, in response to receiving input at the application-specific affordance corresponding to application 2, application 2 is displayed (e.g., by GUI updater 177-3, FIG. 1B and/or display controller 156, FIG. 1A) in a portion of the touch-sensitive display previously occupied by application selector 182. In other embodiments, graphics module 132 of memory 102 (or multitasking data 176 associated with each application, FIG. 1B) stores historical information about previously displayed areas (or, in some embodiments, widths) of application 2 while in the shared screen mode and application 2 is displayed in accordance with the stored historical information (e.g., at a half screen size).

As shown in FIG. 36B, in some embodiments, in response to receiving input at the application-specific affordance corresponding to application 2, application 2 (and associated content, such as content 3602) is displayed as overlaying application 1 (thus, content 3310 is partially obscured by the display of application 2). In some embodiments, a pin affordance (e.g., pin affordance 4110, FIG. 41A) is additionally displayed, allowing a user of portable multifunction device 100 to cease displaying application 2 as overlaying application 1, and cause application 1 to resize to fit within a smaller portion of touch screen 112 adjacent application 2. The use of a pin affordance is discussed in more detail with respect to FIGS. 41A-41E below.

After displaying application 2, a user may provide further input on touch screen 112 (e.g., gesture 3640-1 or gesture 3640-2), as also shown in FIG. 36B. Gestures 3640-1 and 3640-2 are alternative embodiments of a gesture used to re-display the application selector. In some embodiments, gesture 3640-2 is a first contact near a top portion of touch screen 112 followed by downward movement (relative to a user of the device 100) of the first contact and gesture 3640-2 is complete when a liftoff of the first contact is detected. In some embodiments, gesture 3640-1 is the same gesture (or a similar gesture) as gesture 3325 discussed above. In some embodiments, only gesture 3640-1 is available, while in other embodiments, only gesture 3640-2 is available, while in yet other embodiments, both gestures are available. In some embodiments, an affordance is displayed to indicate available gestures to re-display the application selector (e.g., a portion of touch screen 112 near the top and/or side of application 2 contains a highlighted region and may contain text stating "slide to re-display application selector").

In some embodiments, in response to detecting either gesture 3640-1 or gesture 3640-2, application selector 182 is again displayed (as pictured in FIG. 36C) and application 2 is no longer displayed (e.g., disappears or is obscured from view by the overlaid application selector 182) from touch screen 112. In some embodiments, application selector 182 is displayed in a portion of touch screen 112 previously occupied by application 2. In some embodiments, as discussed above, application selector 182, is displayed as opaquely overlaying application 1 (while in other embodiments, application selector 182 semi-transparently overlays application 1).

Figure 36C:
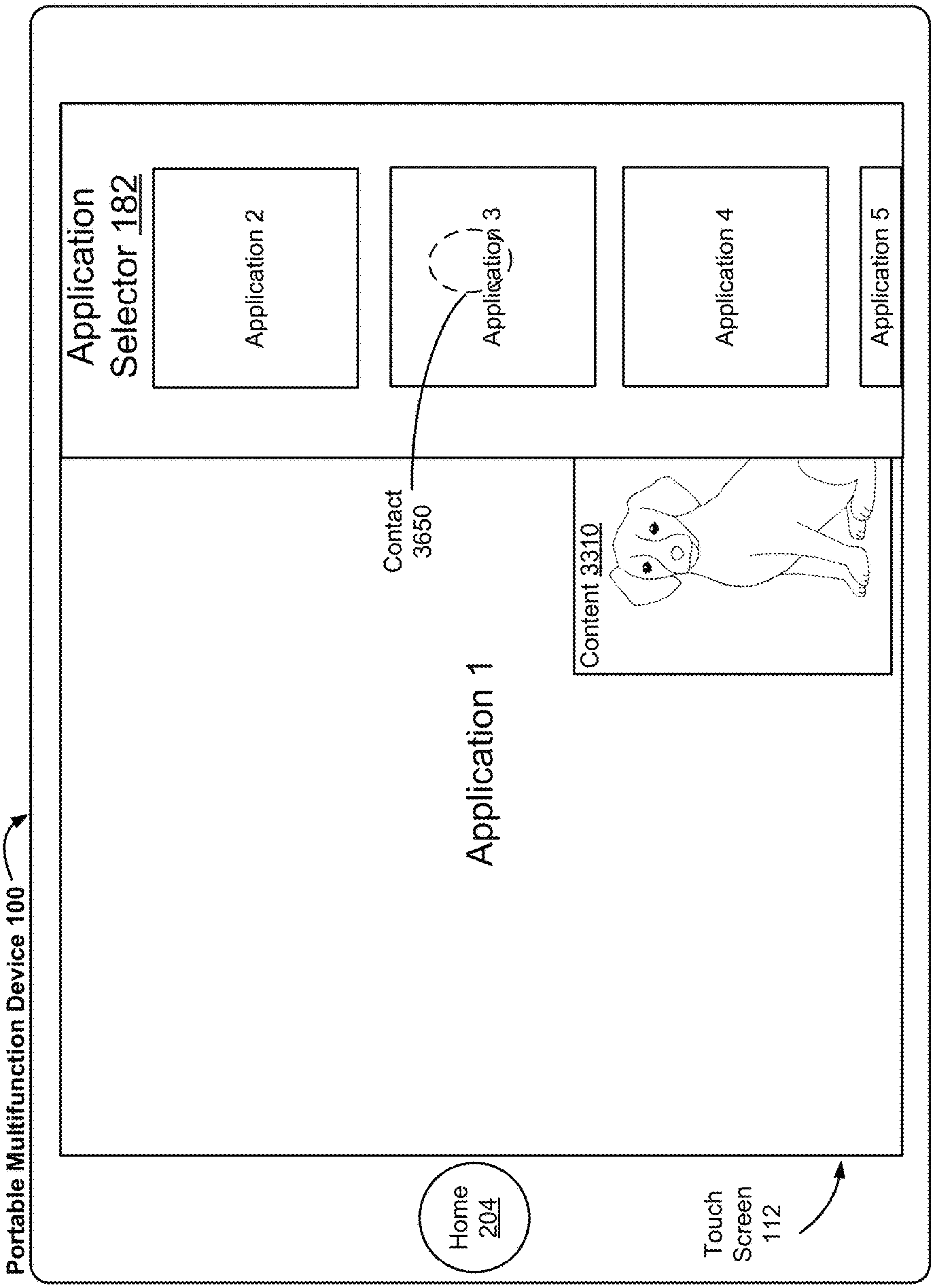
Figure 36D:
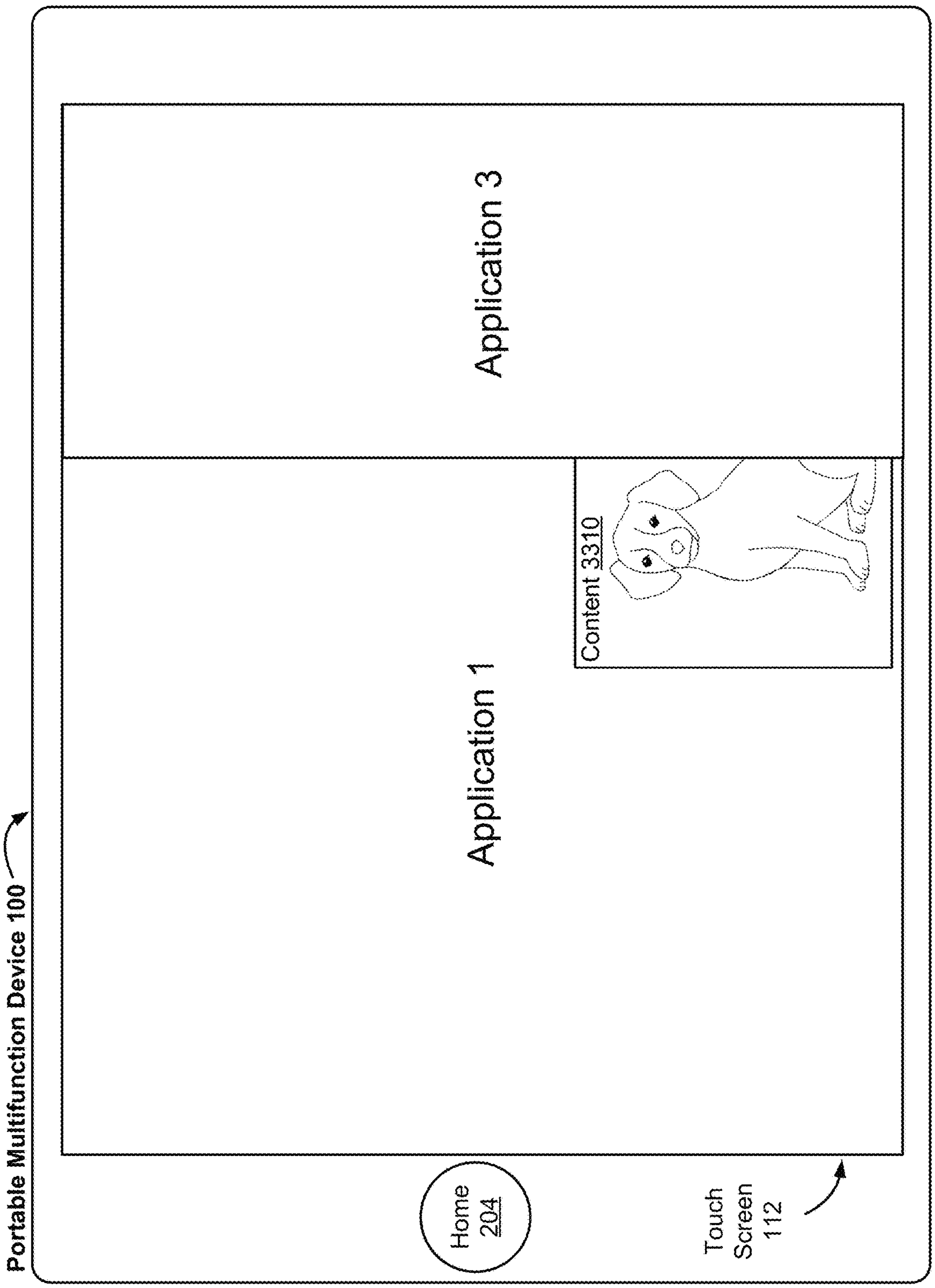

FIG. 36C further illustrates receiving input (e.g., by contact/motion module 130 and/or event handler 177) within application selector 182. As illustrated in FIG. 36C, contact 3650 is received on (e.g., at, over, on top of, or substantially within) an application-specific affordance corresponding to application 3. In response to receiving contact 3650 at the application-specific affordance corresponding to application 3, application 3 is displayed in a portion of touch screen 112 (e.g., a portion of touch screen 112 previously occupied by application selector 182, as pictured in FIG. 36D). In some embodiments, application 3 is initially displayed overlaying application 1.

In some embodiments, a pin affordance (e.g., pin affordance 4110, FIG. 41A) is displayed on touch screen 112 in order to allow a user to resize application 1 and activate a shared screen mode with concurrently displayed applications 1 and 3 (discussed in more detail with respect to FIGS. 41A-41E below). In other embodiments, application 1 is automatically resized after selection of the affordance corresponding to application 3 (i.e., selection of an affordance from the application selector automatically pins (e.g., persistently displays), in a non-overlaid manner, the selected application).

In some embodiments, to enhance usability, application selectors contain a configurable list of application-specific affordances. In some embodiments, an application selector is pre-populated with a default list of application-specific affordances (e.g., affordances that uniquely identify each application, such as an active view of the application overlaid by an icon corresponding to the application) selected in accordance with commonly-used applications that are compatible with the shared screen mode (compatible apps are determined by compatibility module 184, FIG. 1A). In some embodiments, device 100 (or a component thereof, such as memory 102) stores information about a user's multitasking history (e.g., multitasking history 188). For example, if the user often activates a shared screen mode with instant messaging module 141 and browser module 147, then, in some embodiments, device 100 (or a component, such as graphics module 132) can remove one or more of the default affordances and/or add affordances based on user behavior (e.g., add an application-specific affordance corresponding to the browser and IM modules to the application selector and/or re-organize the affordances so that the commonly-used affordances are closer to the top of application selector 182). Moreover, a user can, in some embodiments, make additional modifications to the list of application-specific affordances displayed within the application selector (e.g., manually adding or removing affordances, as discussed in more detail in reference to FIGS. 34A-34C and 35A-35B above and FIGS. 38A-38D below).

Figure 36E:
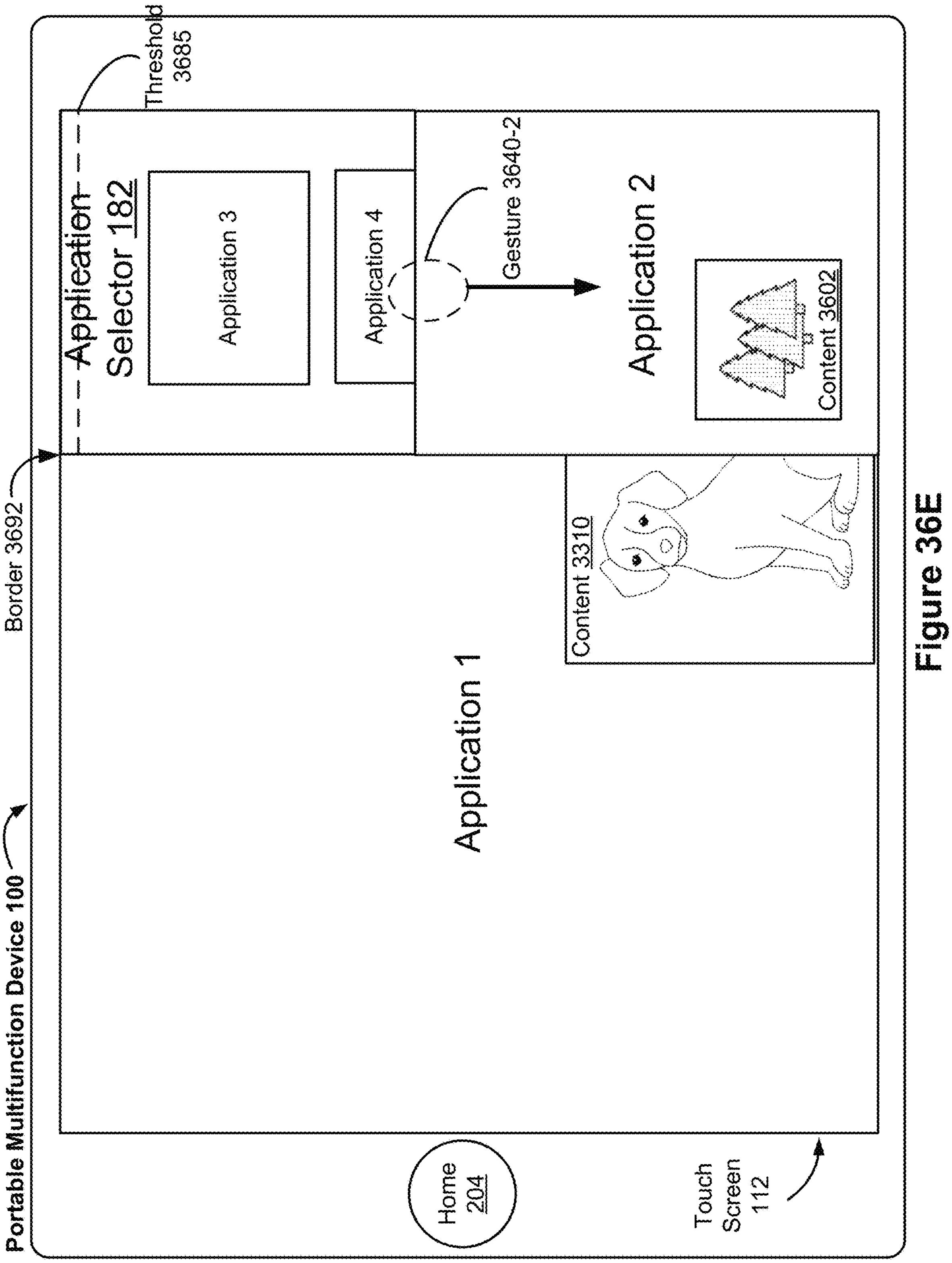

Returning to the description of gesture 3640-2 (FIG. 36B), FIGS. 36E-36H illustrate updates made to the touch screen 112 during the gesture 3640-2. With reference to FIG. 36E, in some embodiments, as the gesture 3640-2 moves on the touch screen 112, a current position of the gesture 3640-2 is compared to a threshold 3685 (i.e., a threshold position on the touch-sensitive display established by the device 100). In response to detecting (e.g., by device 100 or a component thereof, such as contact/motion module 130, FIG. 1A) that the gesture 3640-2 has moved beyond the threshold 3685 (e.g., as shown in FIG. 36E the gesture 3640-2 has moved in a downward direction such that the current position of the gesture 3640-2 is past the threshold 3685), the device 100 updates touch screen 112 to reveal the application selector 182 beneath application 2. As the gesture 3640-2 continues to move across the surface of the touch screen 112, the touch screen 112 continues to reveal more of the application selector 182 (as shown by the sequence of user interfaces (i.e., animation) presented on touch screen 112 between FIG. 36B (beginning of gesture), FIG. 36E (midpoint of gesture), and FIG. 36F (end of gesture)). In some embodiments, instead of (or in addition to) using a threshold position on the touch-sensitive display, a threshold speed is used to determine when to reveal the application selector (i.e., upon determining that a speed associated with movement of the gesture 3640-2 exceeds a threshold speed, the device reveals the application selector as described above).

Figure 36F:
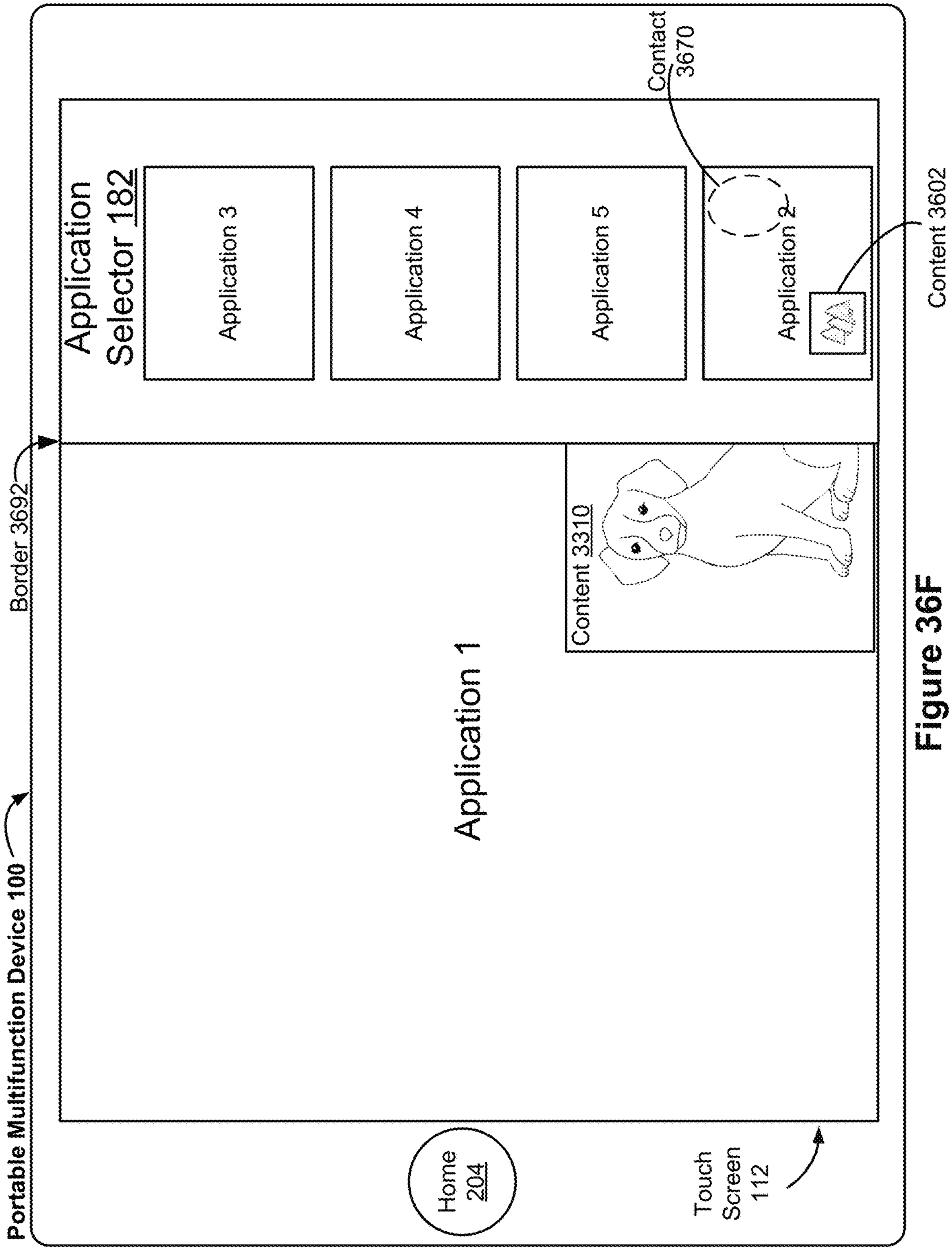

In some embodiments, as the gesture 3640-2 continues to move on the touch screen 112, application 2 (and content displayed therein) is resized in accordance with the movement. As shown in FIG. 36B, upon detecting gesture 3640-2, application 2 is displayed at a first size and, after detecting that the gesture 3640-2 has moved beyond the threshold 3685, the device 100 resizes application 2 in accordance with movement of the gesture (e.g., as shown in FIG. 36E, content 3602 has been scaled down to a second size of the content 3602 that is less than a first size of the content 3602, in accordance with the movement of gesture 3640-2). In some embodiments, scaling down is also referred to as reducing a magnification level associated with the content (e.g., from a first magnification level to a second magnification). In some embodiments, upon determining that the gesture 3640-2 has moved beyond a threshold position on the touch screen 112 (e.g., a second threshold, distinct from threshold 3685), application 2 (and the content displayed therein) is scaled down such that it fits within an application-specific affordance displayed within the application selector. As shown in FIG. 36F, application 2 (and the content 3602 displayed within application 2) is scaled down and displayed within an application-specific affordance for application 2 within the application selector 182. In some embodiments, an icon associated with application 2 is also displayed as transparently overlaying application 2's content within the application-specific affordance for application 2.

Figure 36G:
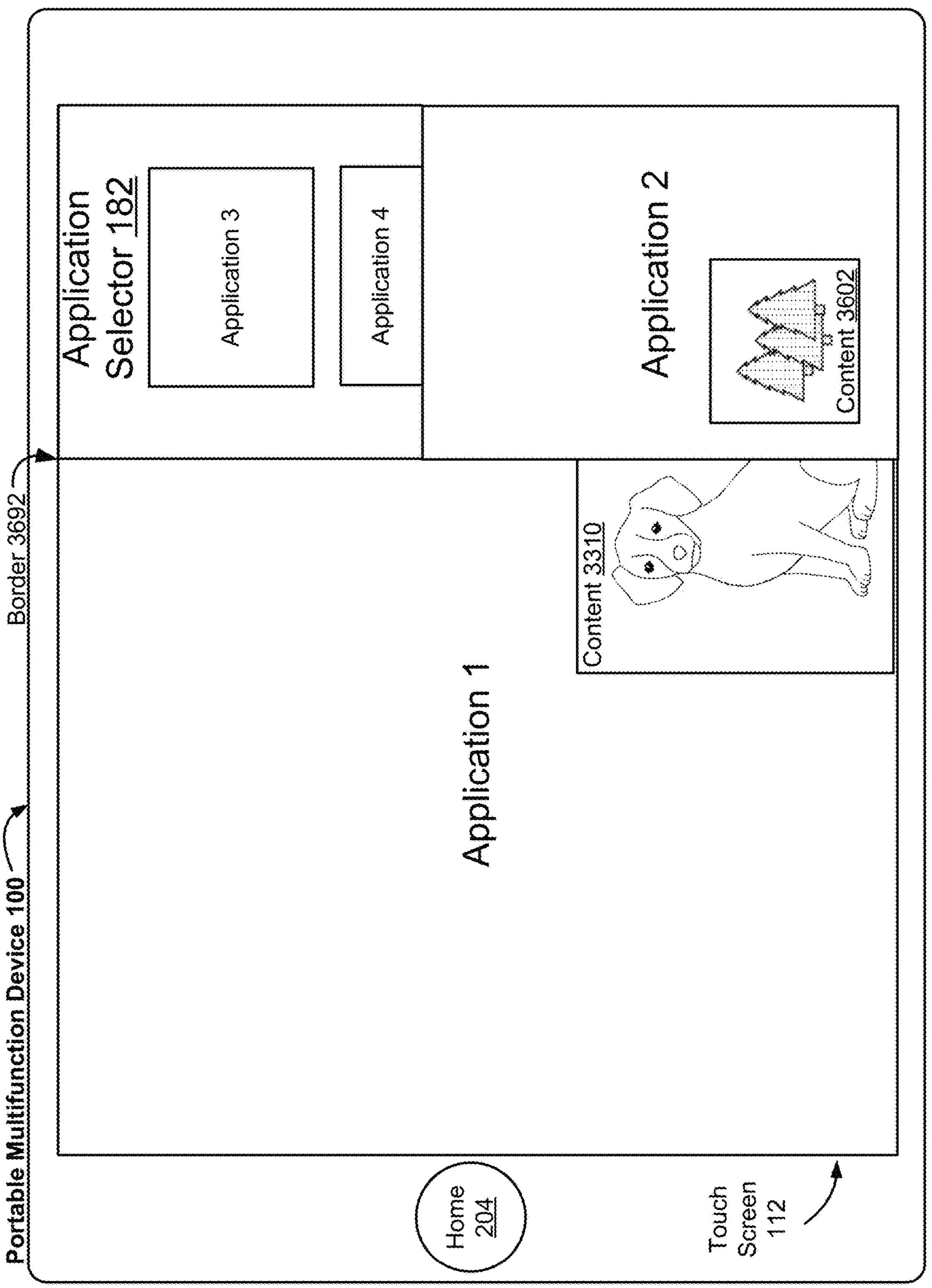
Figure 36H:
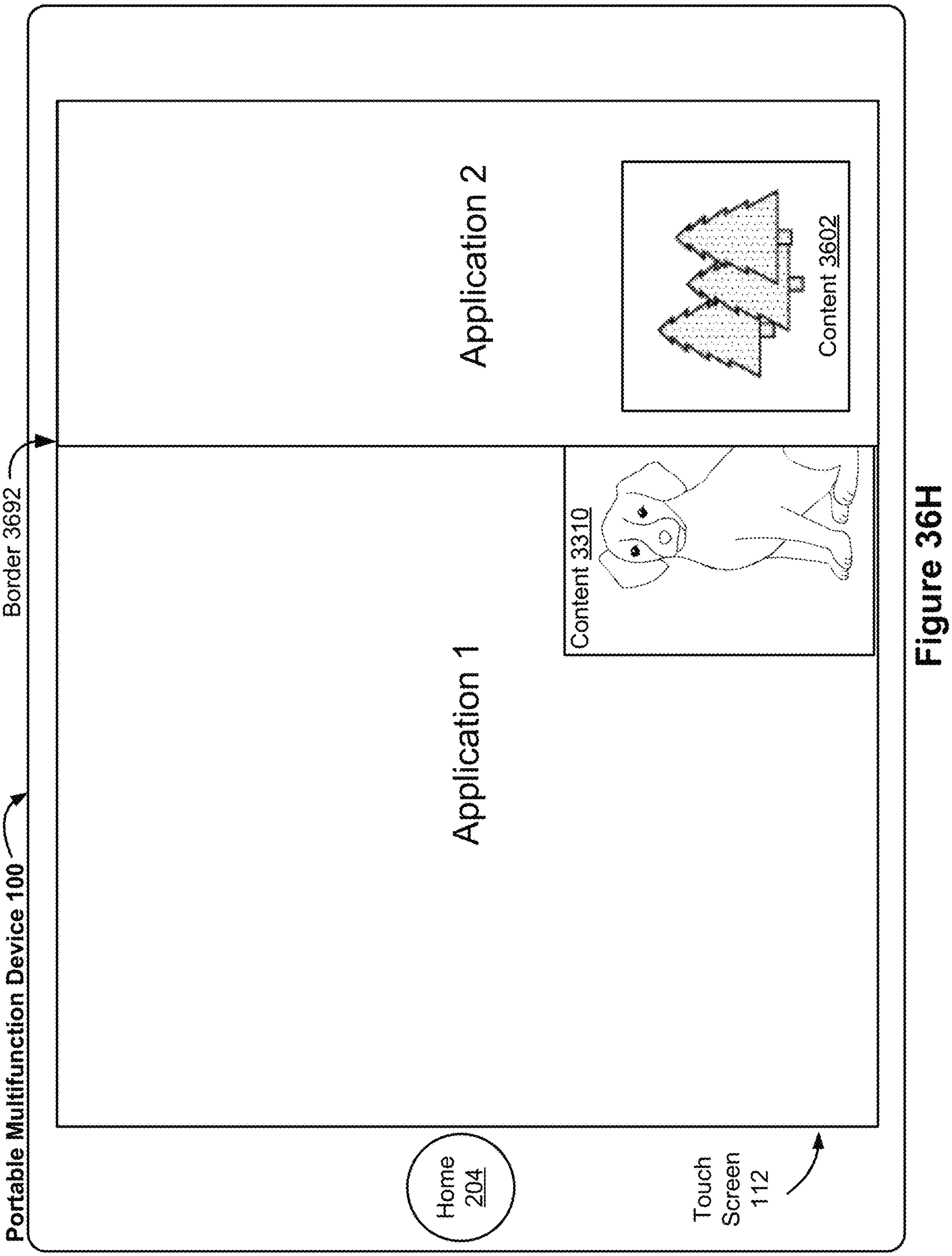

In some embodiments, as shown in FIGS. 36F-36H, selection of the application-specific affordance for application 2 causes device 100 to reverse the scale down animation described with reference to FIGS. 36B, 36E, and 36F above. For example, the device 100 receives a selection of the application-specific affordance for application 2 (e.g., contact 3670 on top of the affordance) and, in response to receiving the selection, the device 100 begins to scale up application 2's content (FIG. 36G) until application 2 is displayed within an area of the touch screen 112 that was previously occupied by the application selector 182 (FIG. 36H).

FIGS. 37A-37G are schematics of a touch-sensitive display used to illustrate additional gestures for promoting and dismissing applications displayed in a multitasking mode.

Figure 37A:
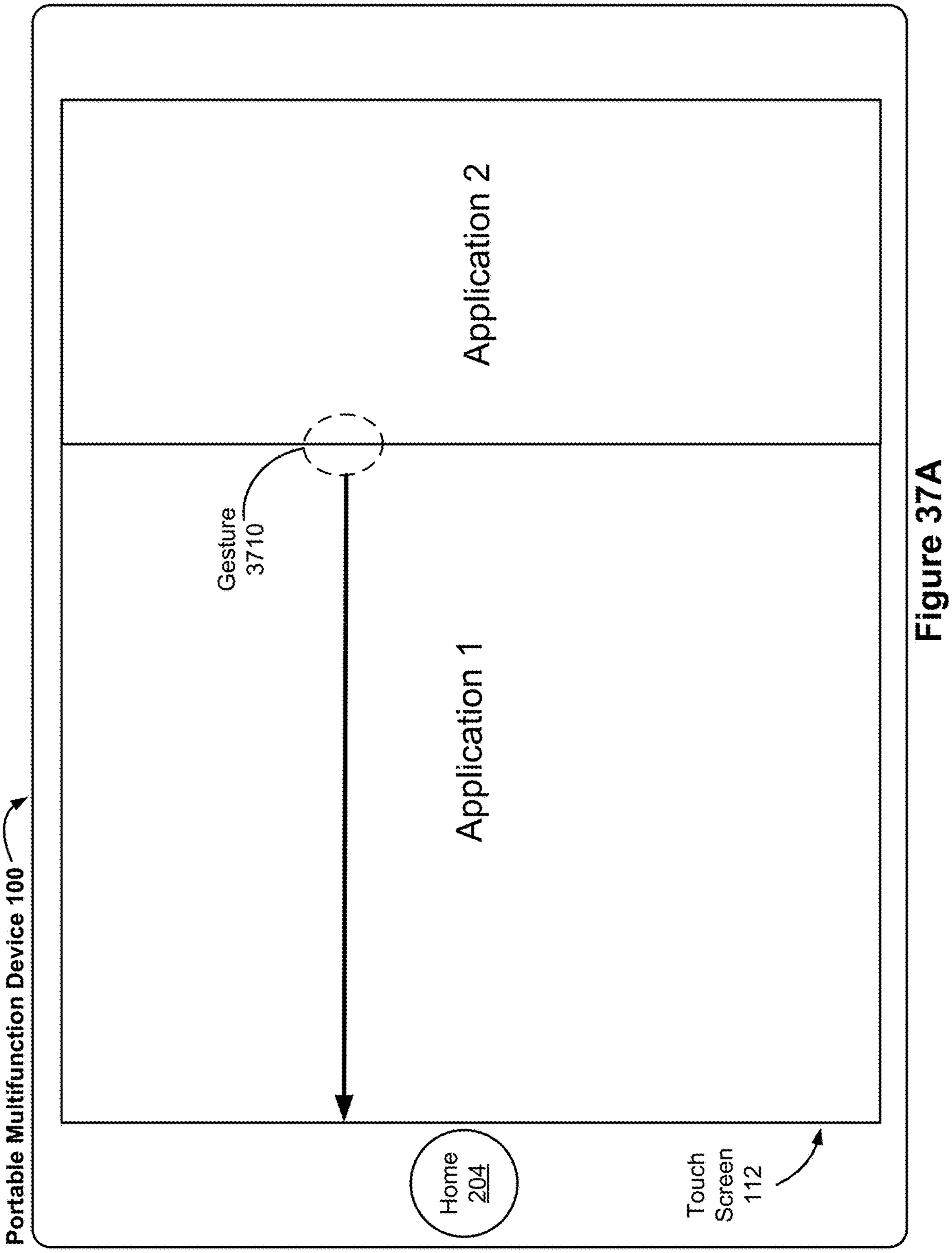
FIGS. 37A-37M are schematics of a touch-sensitive display used to illustrate gestures for promoting and dismissing applications displayed in a multitasking mode, in accordance with some embodiments.
Figure 37B:
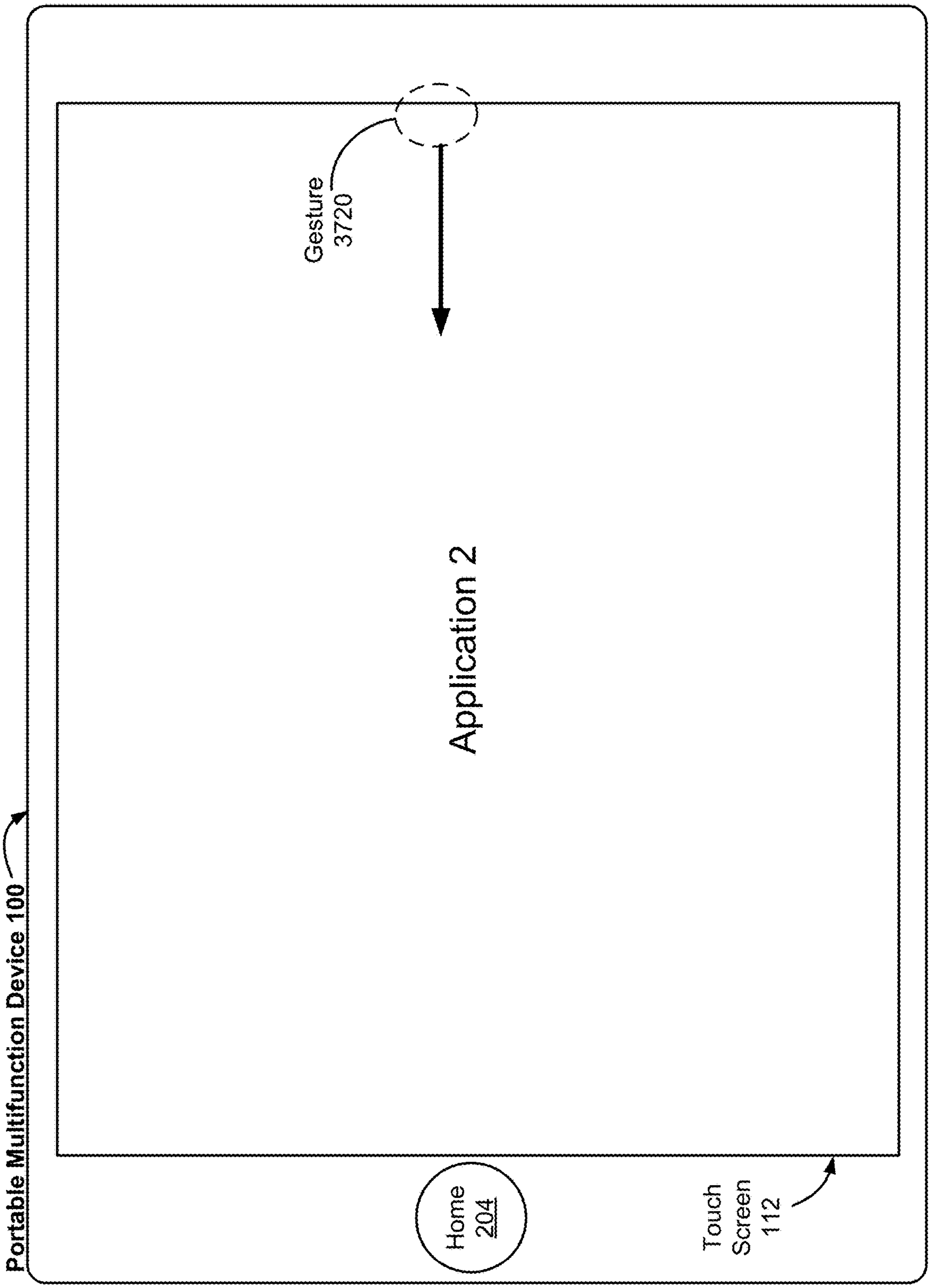
Figure 37C:
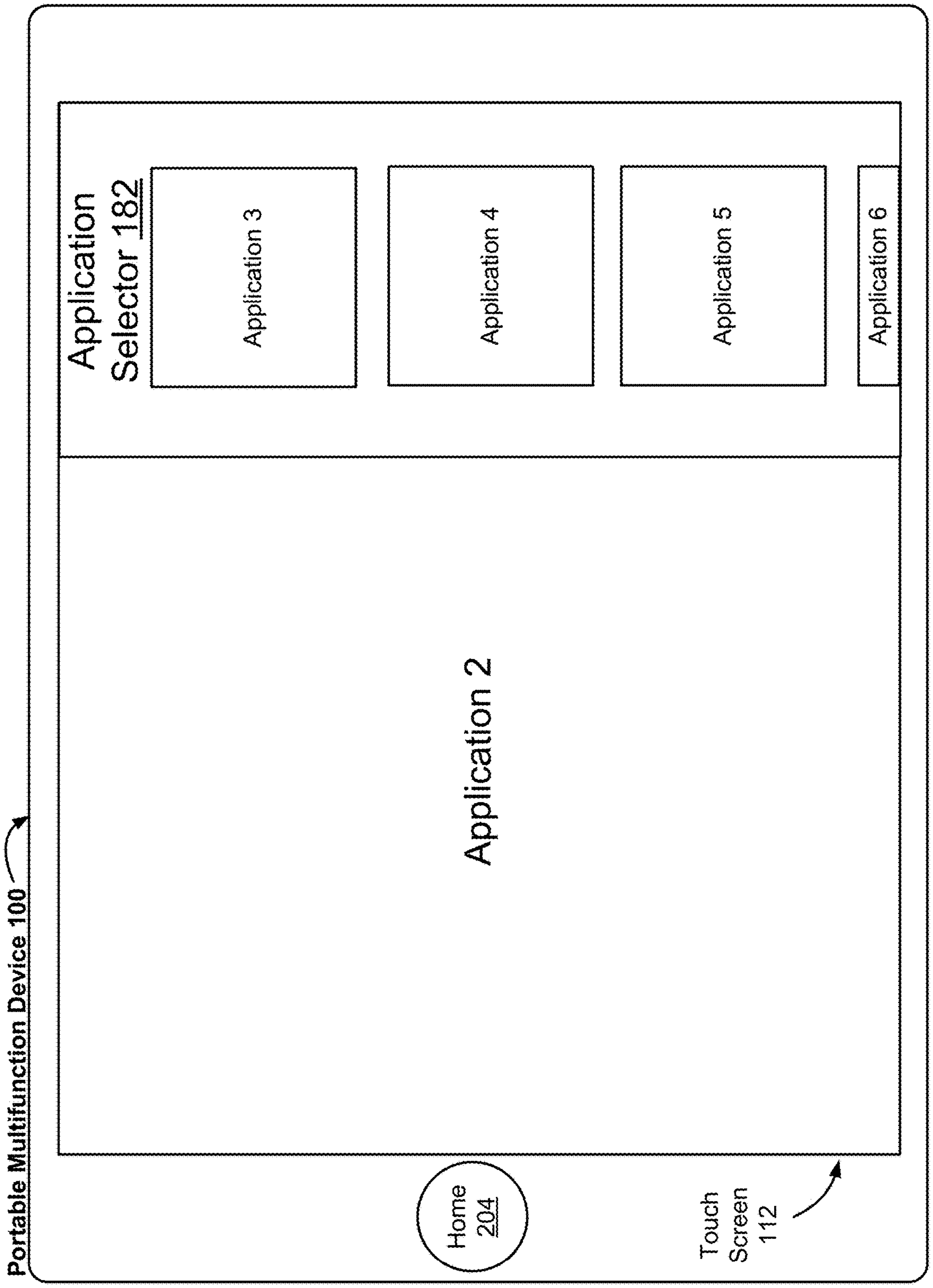

In particular, FIG. 37A illustrates a gesture (e.g., gesture 3710) for promoting a side application (e.g., application 2) to be the main application (e.g., application 1 as pictured in FIG. 37A). In some embodiments, gesture 3710 is detected substantially at a border between applications 1 and 2. Gesture 3710 moves (e.g., drags, slides, or swipes) towards application 1 (e.g., the main application) and proceeds across touch screen 112 until reaching a location within a predetermined distance (e.g., 0 cm, 1 cm, or 2 cm, or 2 pixels, 5 pixels, or 7 pixels) of an edge of touch screen 112. In accordance with a determination that gesture 3710 has reached the location within the predetermined distance of the edge (e.g., an edge horizontally adjacent to the main application), touch screen 112 ceases to display (or touch screen 112 receives a signal from graphics module 132 to cease displaying) the main application (e.g., application 1) and resizes application 2 to occupy substantially all of the display area of touch screen 112 (as pictured in FIG. 37B).

In other embodiments, gesture 3710 is compared to a threshold (e.g., a threshold velocity associated with movement of the gesture, a threshold distance travelled, a location of a liftoff event associated with the gesture, etc.), in order to determine whether to promote a side application to be the main application. For example, a velocity associated with movement of the gesture 3710 is compared to the threshold velocity in order to determine whether to resize application 2 to occupy substantially all of touch screen 112. Upon determining that gesture 3710 satisfies (e.g., is greater than or equal to) the threshold velocity, application 2 is promoted to be the main application (as pictured in FIG. 37B) and application 1 is dismissed from touch screen 112 (e.g., application 1 is no longer displayed, but may still be operating as a background process).

In some embodiments, after a side application (e.g., application 2 in the exemplary user interfaces of FIGS. 37A-37B) has been promoted to be the main application, a new gesture (e.g., gesture 3720) is received near an edge (or within a predetermined distance of the edge, such as 1 pixel or 2 pixels) of the display. Gesture 3720, in some embodiments, is the same as gesture 3325 of FIGS. 33B and 33C. In some embodiments, gesture 3720 is completed (e.g., a user slides one finger from an edge of the display and then ends the gesture by removing the finger from touch screen 112) and application selector 182 is displayed.

Figure 37D:
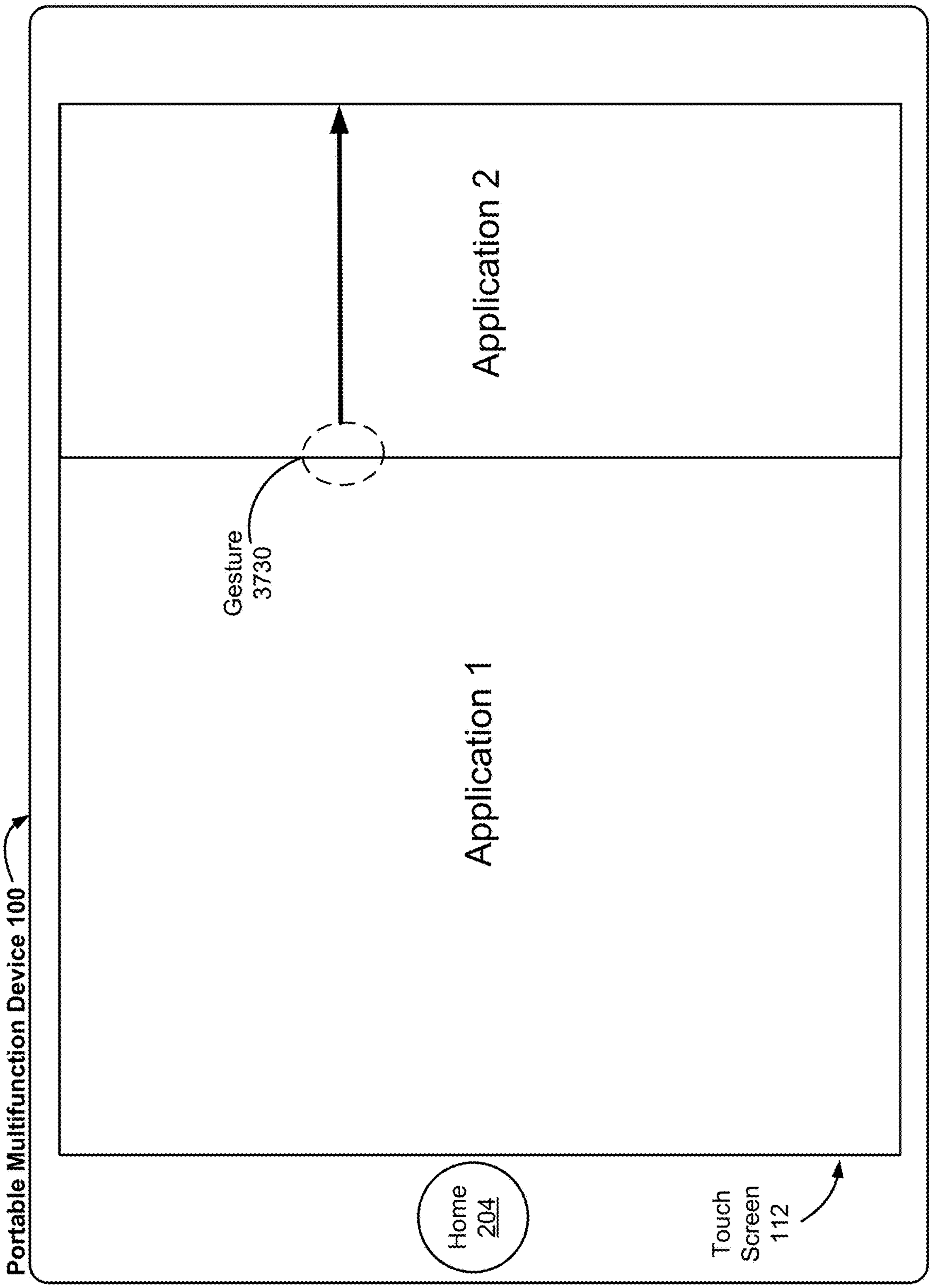
Figure 37E:
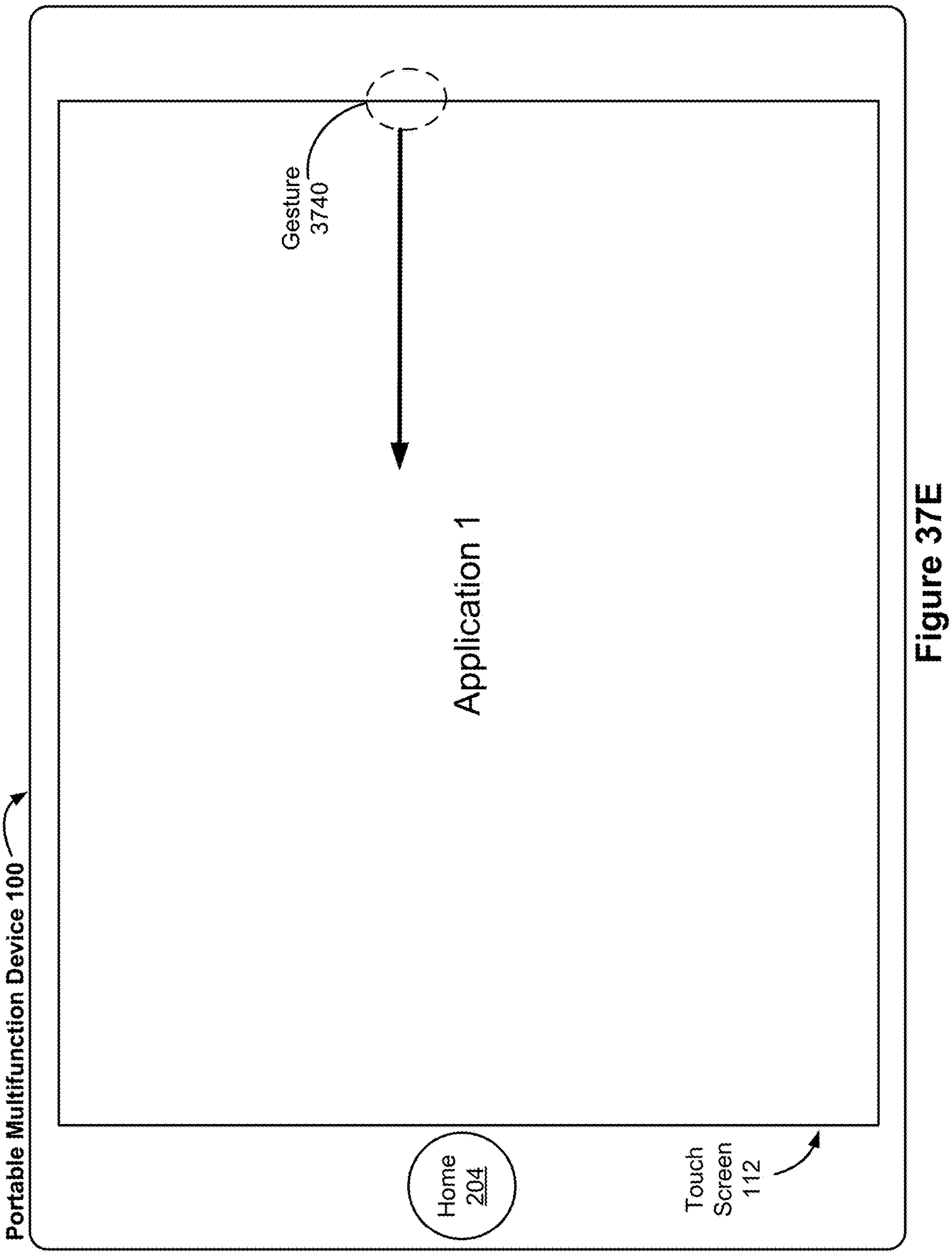
Figure 37F:
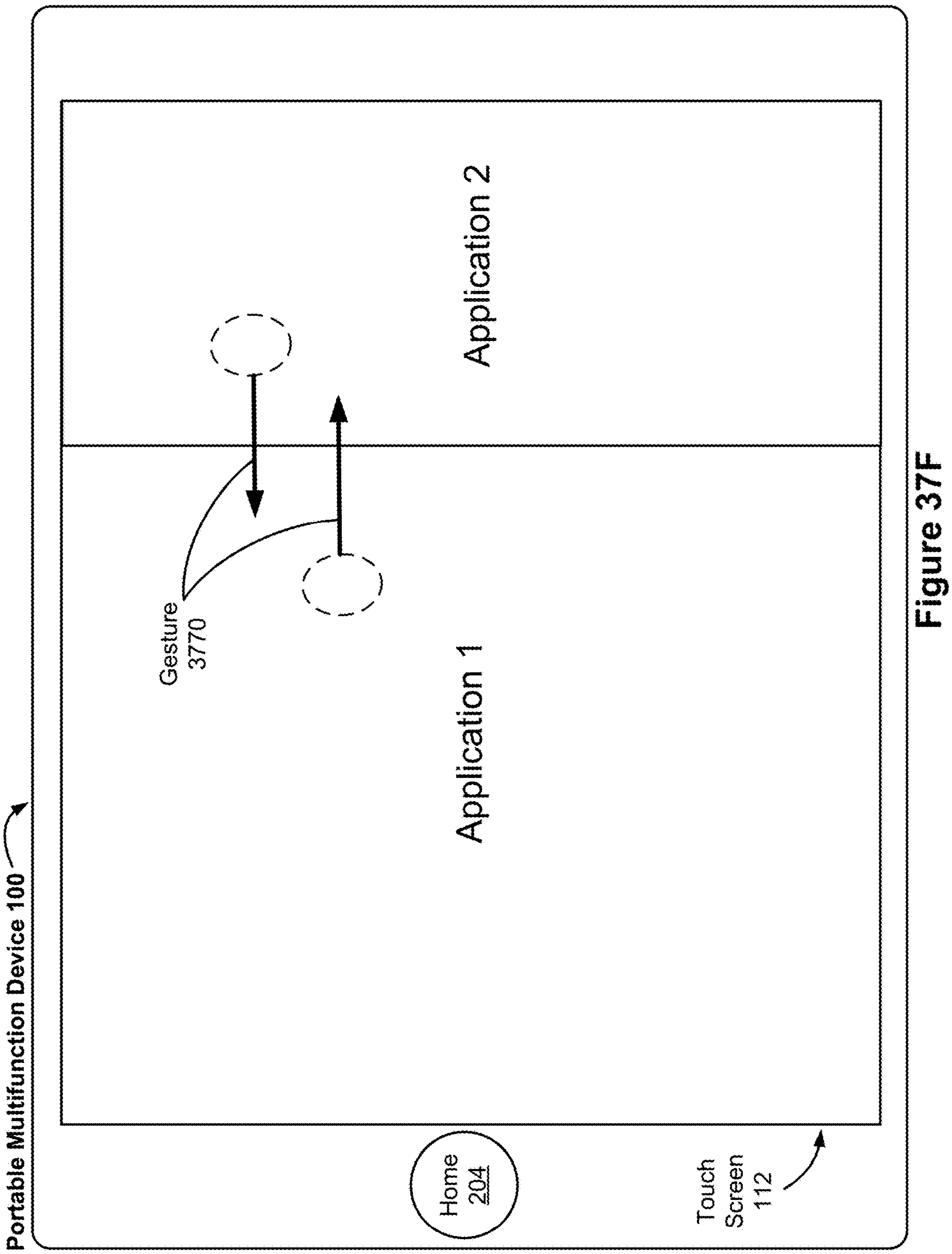
Figure 37G:
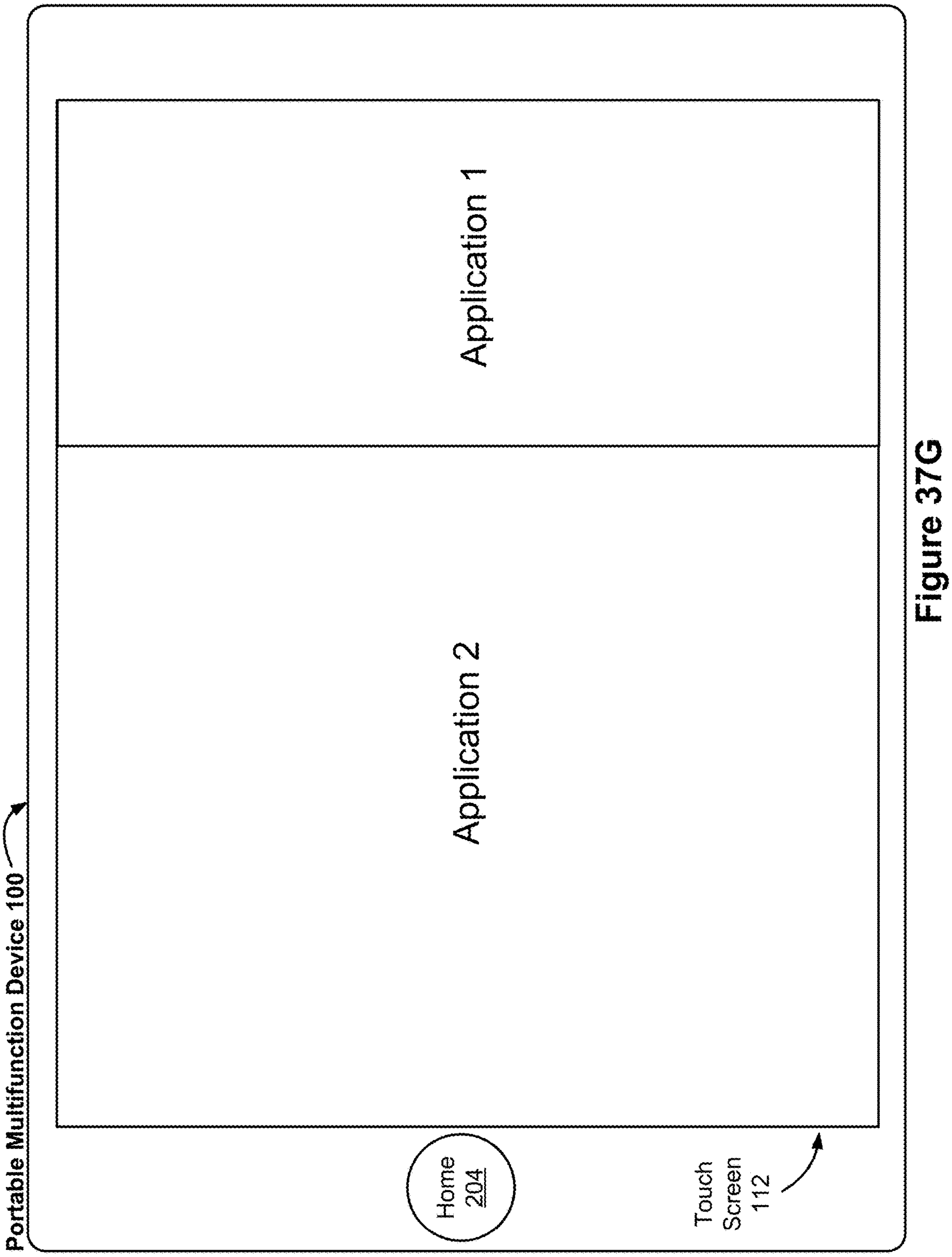

FIGS. 37D-37F are schematics of a touch-sensitive display used to illustrate a gesture (e.g., gesture 3730) used to dismiss a side application. In some embodiments, gesture 3730 is detected near (e.g., substantially at, on, over, etc.) a border between concurrently displayed applications 1 and 2 (as pictured in FIG. 37D) and moves in a direction towards the side application (e.g., application 2). In accordance with a determination that gesture 3730 has reached a location within a predetermined distance (e.g., 0 cm, 1 cm, 2 cm or 2 pixels, 5 pixels, or 7 pixels) of an edge of touch screen 112 (e.g., an edge of the display that is horizontally adjacent to application 2), application 2 is dismissed (e.g., no longer displayed on touch screen 112). Accordingly, in some embodiments, application 1 is resized to occupy substantially all of the display area of touch screen 112 (e.g., application is displayed in a full-screen mode) and application 2 is no longer displayed, but continues to execute as a background process on device 100.

In other embodiments (and as discussed above with respect to gesture 3710 of FIG. 37A), gesture 3730 does not travel to an edge of touch screen 112, but instead a determination is made as to whether gesture 3730 satisfies a predefined metric (e.g., a threshold velocity associated with movement of the gesture, a threshold distance travelled by the gesture, a location of a liftoff event associated with the gesture, etc.). Upon determining that gesture 3730 satisfies the predefined metric, application 2 is dismissed and application 1 is displayed in a full-screen mode. In some embodiments, the predefined metric is configurable by a user (e.g., based on desired sensitivity levels). In other embodiments, the predefined metric is dynamically computed by a component of device 100 (e.g., contact/motion module 130) based on historical multitasking data associated with a particular user (e.g., multitasking data 176, in some embodiments, stores information for each application 136 that describes velocity and distance characteristics of past gestures used to dismiss each application 136 when that application was a side application).

In some embodiments, after a side application (e.g., application 2 in the exemplary user interface of FIG. 37D) has been dismissed, a new gesture (e.g., gesture 3740, FIG. 37E) is received at an edge of the display. In some embodiments, gesture 3740, is the same as gestures 3325 and 3720 of FIGS. 33B-33C and 37B, respectively. In some embodiments, gesture 3740 is completed (e.g., a user slides one finger from an edge of the display and then ends the gesture by removing the finger from touch screen 112) and the dismissed side application (e.g., application 2) is again displayed (as pictured in FIG. 37F).

In some embodiments, the re-displayed side application occupies the same portion of the screen that the side application occupied before it was dismissed and the main application is resized accordingly (as pictured in FIG. 37F). In some embodiments, the size of the side application is only restored if the side application was pinned prior to dismissal (e.g., if the side application was overlaying application 1, as pictured in FIG. 36B, when it was dismissed), then gesture 3740 would reveal the side application as again overlaying the main application (i.e., the side applications previous state is maintained, referred to herein as stateful behavior). In some embodiments, application internal state 192 or multitasking data 176 (FIG. 1B) stores information regarding display area (e.g., ⅓ of the area of touch screen 112), display position (e.g., left or right side of touch screen 112), whether the application was pinned or overlaying, and other information about previous states for applications that are compatible with the shared screen mode. In this way, a user is able to conveniently maintain a multitasking workspace on touch screen 112 (e.g., when the user needs to momentarily use a main application in a full-screen mode, the user can quickly dismiss a side application, and, after completing a task that required full-screen mode for the main application, the user can quickly and conveniently re-display the side application in a stateful way).

In some embodiments, an additional gesture is available that allows users to quickly swap the locations of the main and side applications. As pictured in FIG. 37F, if a first contact is detected (e.g., by contact/motion module 130) at the side application and a substantially simultaneous second contact is detected at the main application and the first and second contacts are detected as moving towards each other (e.g., gesture 3770, FIG. 37F), then the main and side applications swap locations on touch screen 112 (e.g., as pictured in FIGS. 37F-37G). In some embodiments, the first and second contacts are not detected until an intensity threshold associated with the contacts is exceeded (e.g., as determined by contact intensity sensor(s) 165). In some embodiments, the locations of the main and side applications are not swapped until a liftoff of either the first or the second contact (or both) is detected. An additional gesture for swapping the locations of concurrently displayed applications is discussed above in reference to FIGS. 8A-8C.

Figure 37H:
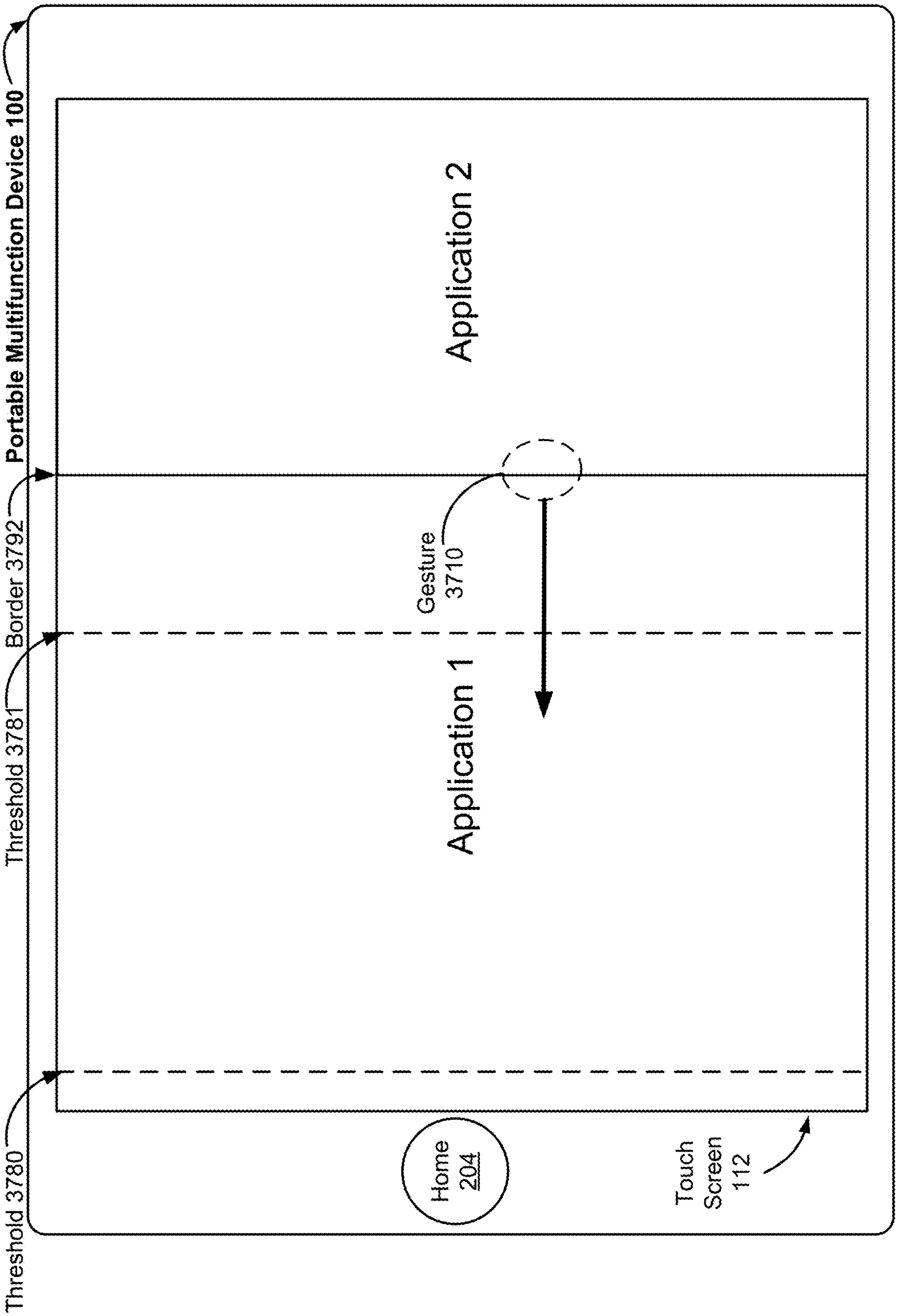
Figure 37I:
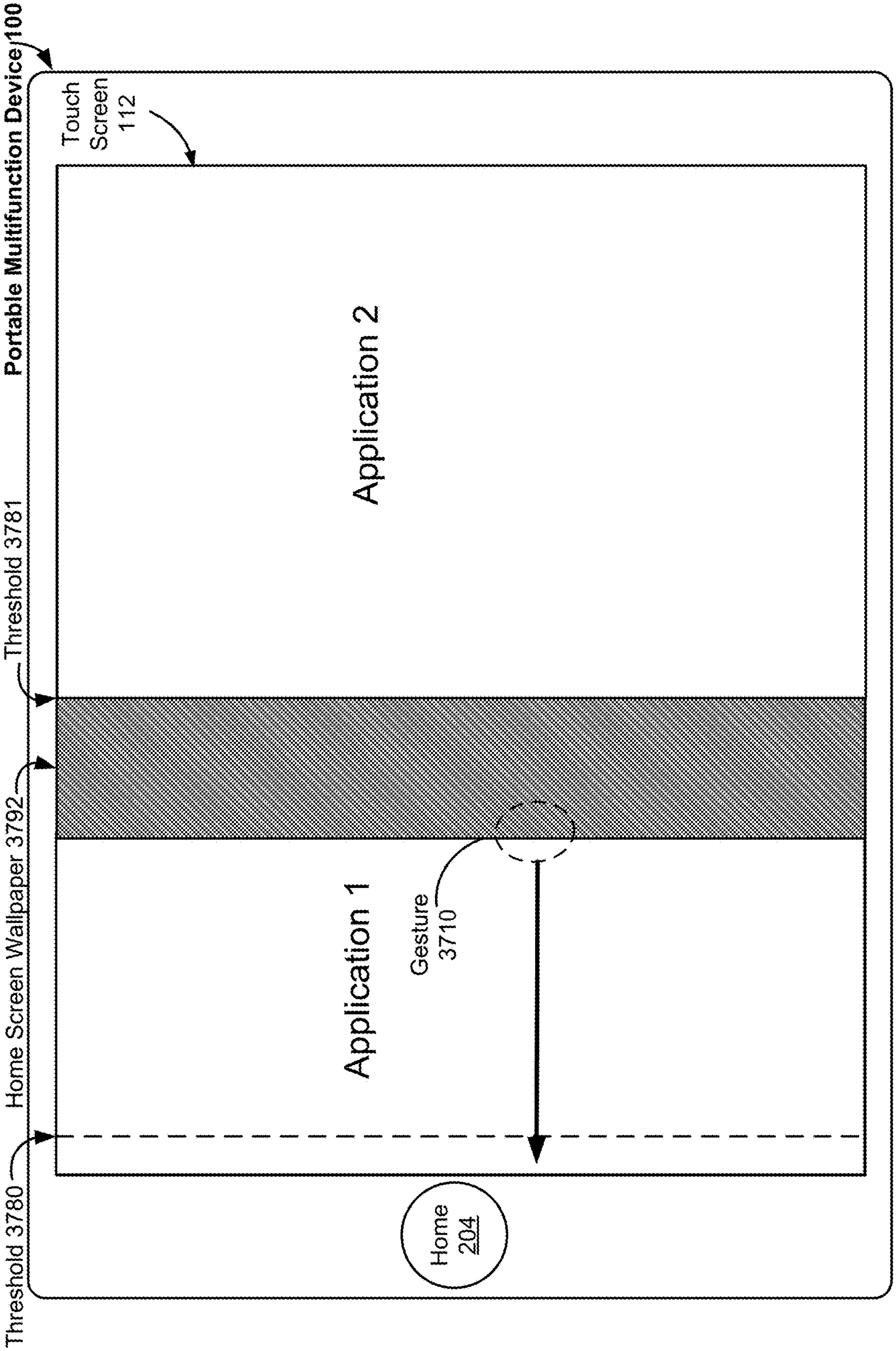
Figure 37J:
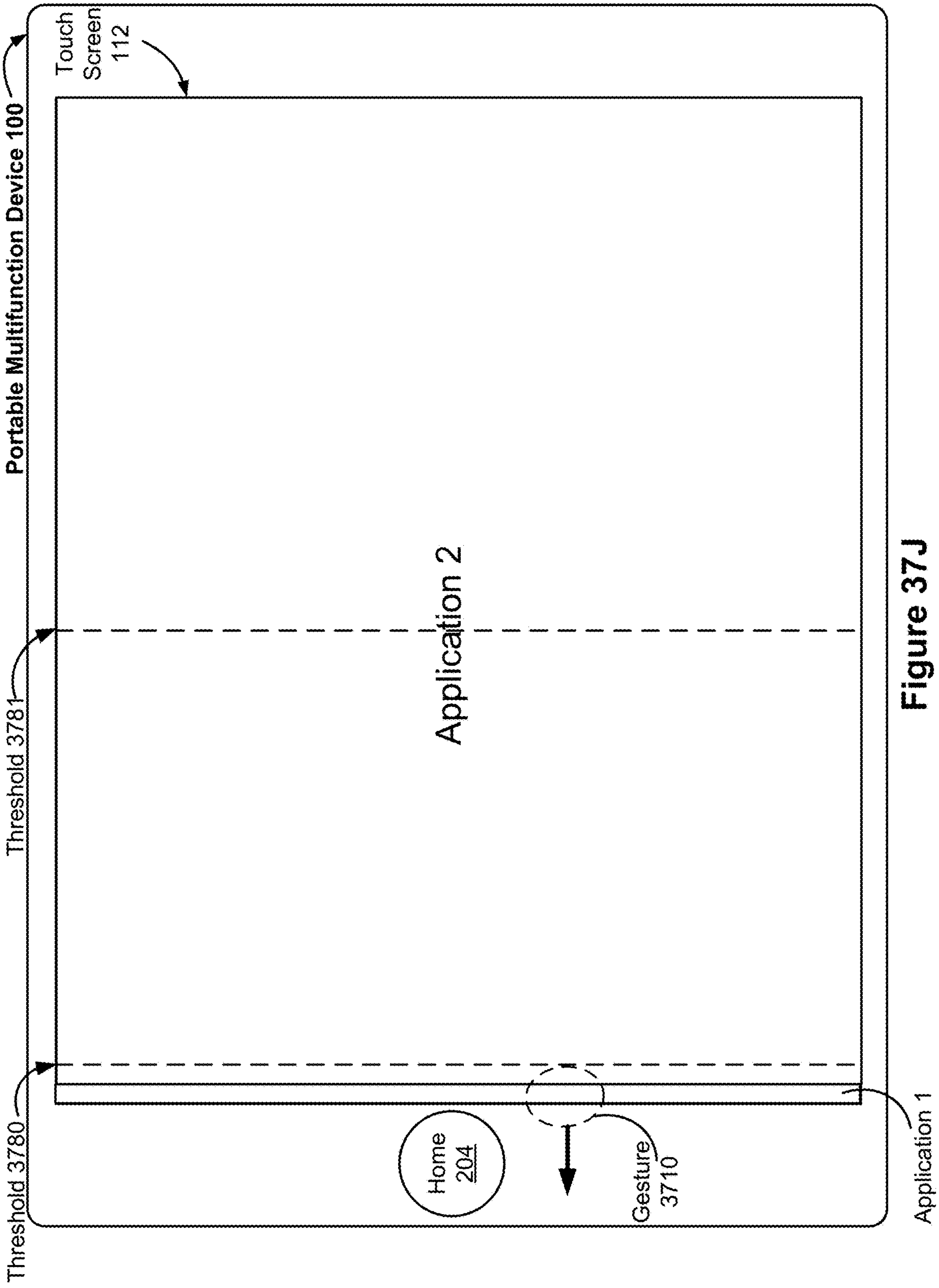
Figure 37K:
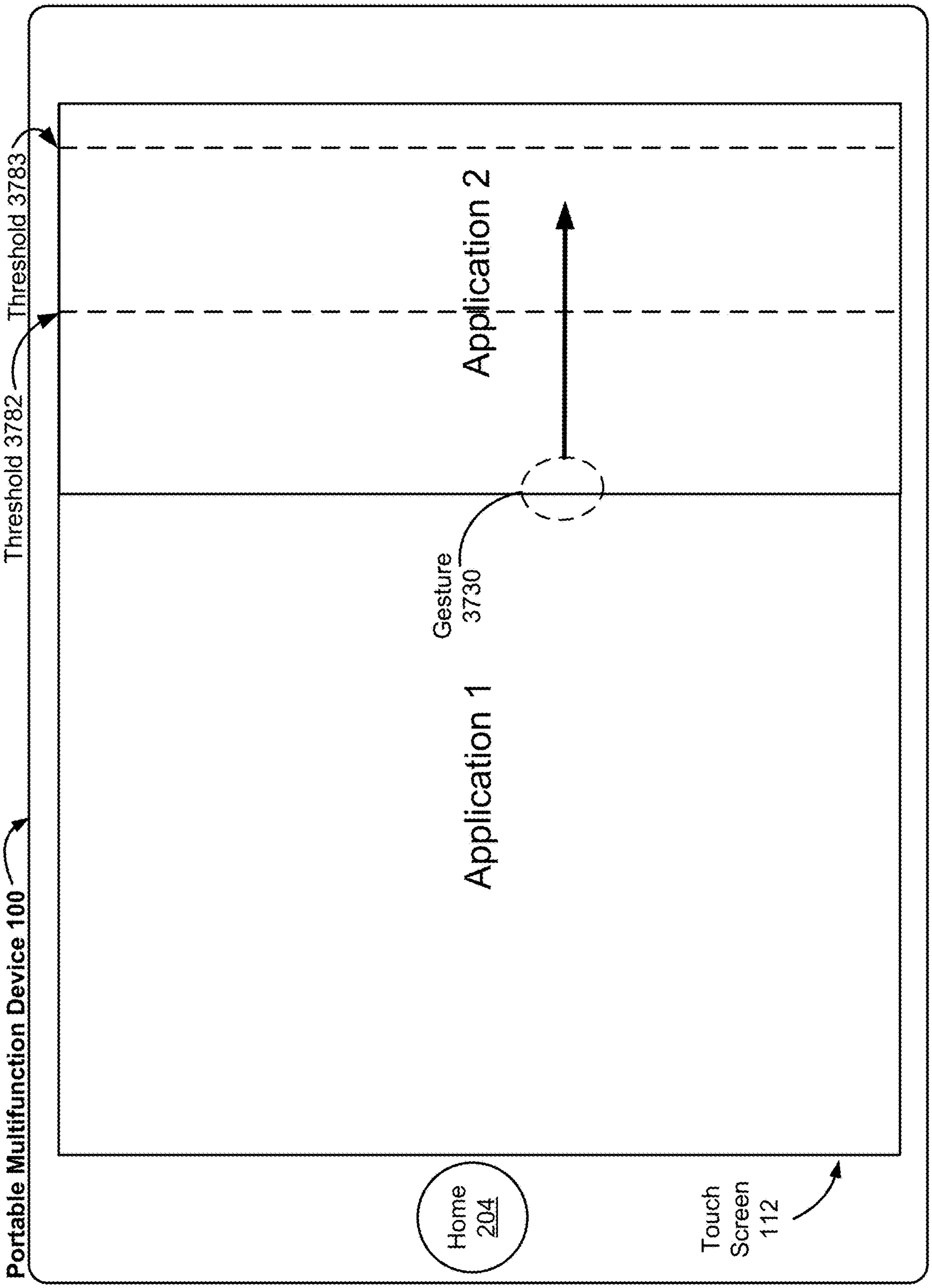
Figure 37L:
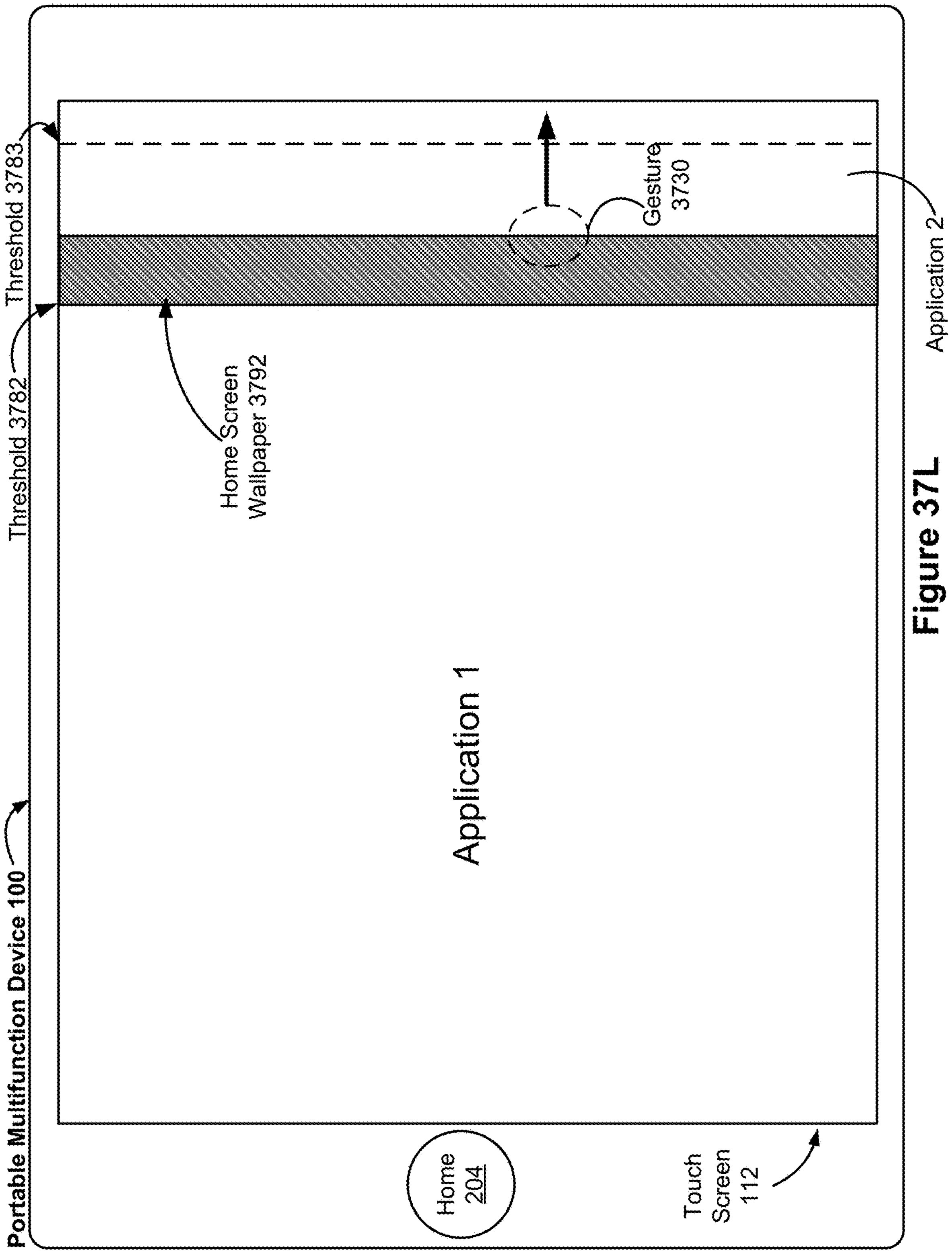
Figure 37M:
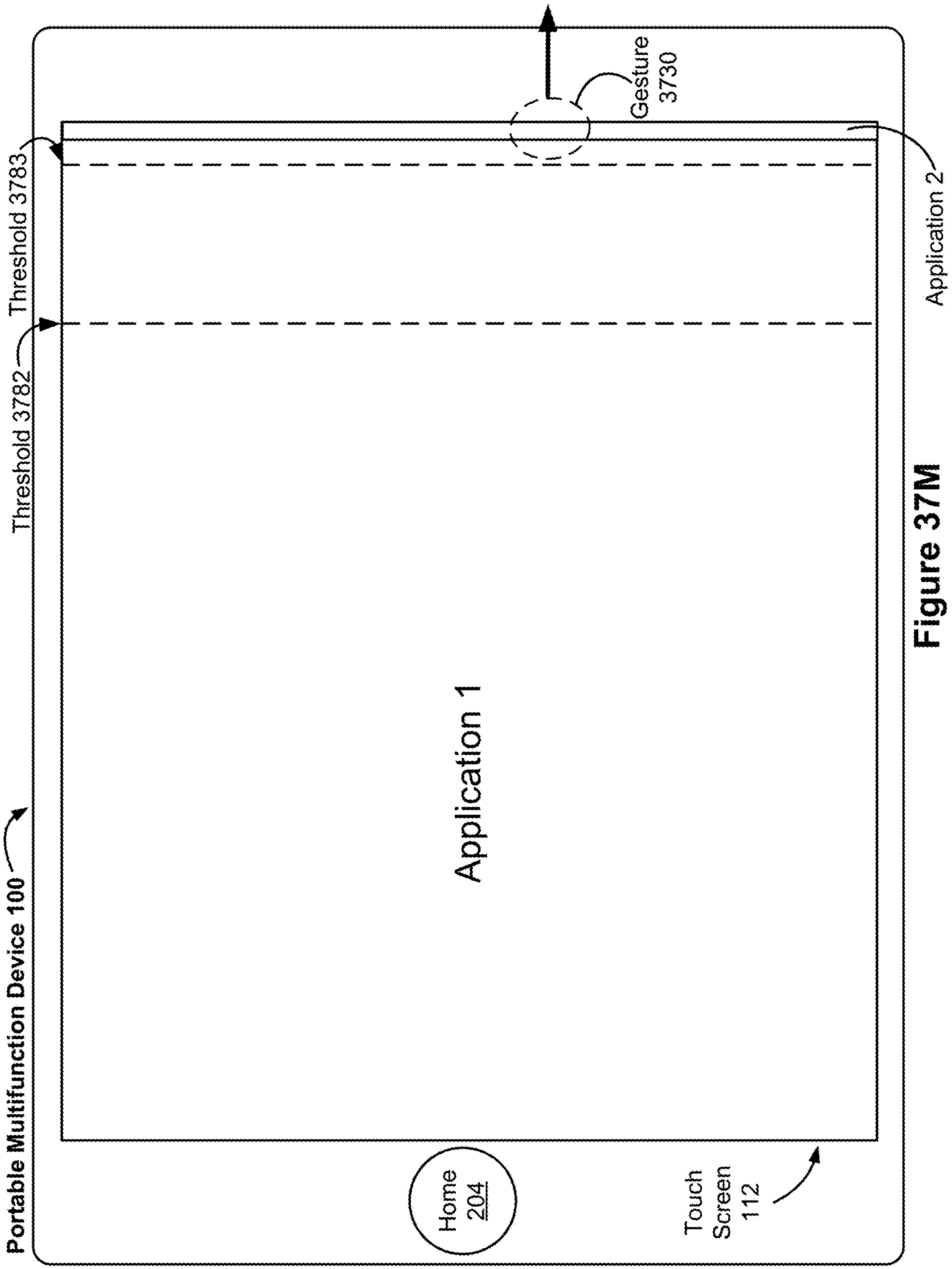

In some embodiments, during gestures used to resize applications displayed in a shared screen mode (e.g., gestures used to resize and then dismiss main and side applications, such as those discussed above in reference to FIGS. 37A-37E), the touch screen 112 is updated to provide visual indications of the dismissal of a main or a side application. FIGS. 37H-37J illustrate additional features related to gesture 3710 (i.e., gesture to dismiss a main application) and FIGS. 37K-37M illustrate additional features related to gesture 3730 (i.e., gestures used to dismiss a side application).

As shown in FIG. 37H, in some embodiments, in response to detecting a resize gesture while in the shared screen mode (e.g., gesture 3710, which includes a contact on the touch screen 112, followed by uninterrupted movement (e.g., the contact remains on the touch screen 112) of the contact towards a main application (e.g., application 1) displayed in a shared screen mode), the device 100 monitors one or more threshold positions on the touch screen 112 (e.g., threshold 3780 and threshold 3781). In some embodiments, a first threshold is located at a position that is in the center of the touch screen 112 (e.g., threshold 3781) and a second threshold is located at a position that is close to an edge of the touch screen 112 that borders the main application (e.g., threshold 3780). In some embodiments, the device 100 monitors a current position of the gesture 3710, in order to determine whether the current position of the gesture 3710 has moved past one of the established thresholds. While detecting movement of the gesture 3710 in a substantially horizontal direction towards the primary application, the device 100 resizes both the main and side applications. For example, as gesture 3710 moves from a first position shown in FIG. 37H to a second position shown in FIG. 37I, the device 100 resizes application 1 (to have a decreased size) and application 2 (to have an increased size).

In some embodiments, as the gesture 3710 moves from the first position to the second position, the device 100 determines whether the current position of gesture 3710 has moved to (i.e., the current position of the gesture 3710 is at the threshold) or past (or that the current position of gesture 3710 has moved within a predefined distance of) the first threshold (e.g., threshold 3781). In accordance with a determination that the current position of gesture 3710 has moved to or past the first threshold (e.g., threshold 3781), the device 100 ceases resizing application 2 and still continues to resize application 1, thus revealing a new user interface portion (e.g., home screen wallpaper 3792) between application 1 and application 2. In some embodiments, upon determining that the current position of gesture 3710 has moved to or past (i.e., once the current position has moved to or past the threshold, the threshold has been satisfied) the first threshold, the display of application 1 is modified so that application 1 appears to fall backwards within the touch screen 112 (i.e., application 1 appears to fall into the touch screen 112) as it separates from application 2 and/or the border between applications 1 and 2. In some embodiments, as the gesture 3710 continues to move towards application 1, the device 100 continues to decrease the size of application 1 and to reveal correspondingly more of the new user interface portion (e.g., more of the home screen wallpaper 3792).

In some embodiments, in accordance with a determination that the gesture 3710 has reached a current position that is past the threshold 3780, the device 100 presents an animation that shows application 2 rapidly resizing and catching up to application 1, as application 1 is dismissed from the touch screen 112. In some embodiments, while application 2 catches up to application 1, application 2 increases in size until it occupies substantially all of touch screen 112 and covers up the new user interface portion (e.g., home screen wall paper 3792, as shown in FIG. 37I).

In some embodiments, the features described above in reference to a resize gesture that moves in a substantially horizontal direction towards the main application (e.g. gesture 3710, FIGS. 37H-37J) are similarly implemented for a resize gesture that moves in the opposite direction (e.g., a substantially horizontal direction towards the side application (e.g., gesture 3730, FIGS. 37K-37M)). As shown in FIG. 37K, in some embodiments, in response to detecting a resize gesture while in the shared screen mode (e.g., gesture 3730, which includes a contact on the touch screen 112, followed by uninterrupted movement (e.g., the contact remains on the touch screen 112 and moves in a left-to-right direction on the touch screen 112) of the contact towards a side application (e.g., application 2) displayed in a shared screen mode), the device 100 monitors one or more threshold positions on the touch screen 112 (e.g., threshold 3782 and threshold 3783). In some embodiments, a first threshold is located at a position that corresponds to approximately 25% of the width of the touch screen 112 (e.g., threshold 3782) and a second threshold is located at a position that is close to an edge of the touch screen 112 that borders the side application (e.g., threshold 3783). In some embodiments, the device 100 monitors a current position of the gesture 3730, in order to determine whether the current position of the gesture 3730 has moved past one of the established thresholds. While detecting movement of the gesture 3730 in a substantially horizontal direction towards the side application, the device 100 resizes both the main and side applications. For example, as gesture 3730 moves from a first position shown in FIG. 37K to a second position shown in FIG. 37L, the device 100 resizes application 2 (to have a decreased size) and application 1 (to have an increased size).

In some embodiments, as the gesture 3730 moves from the first position to the second position, the device 100 determines whether the current position of gesture 3730 has moved to (i.e., the current position of the gesture 3730 is at the threshold) or past (or that the current position of gesture 3730 has moved within a predefined distance of) the first threshold (e.g., threshold 3781). In accordance with a determination that the current position of gesture 3730 has moved to or past the first threshold (e.g., threshold 3781), the device 100 ceases resizing application 1 and still continues to resize application 2, thus revealing a new user interface portion (e.g., home screen wallpaper 3792) between application 1 and application 2. In some embodiments, upon determining that the current position of gesture 3730 has moved to or past (i.e., once the current position has moved to or past the threshold, the threshold has been satisfied) the first threshold, the display of application 2 is modified so that application 2 appears to fall backwards within the touch screen 112 (i.e., away from a user of the device 100) as it separates from application 1 and/or the border between applications 1 and 2 (i.e., application 1 appears to fall into the touch screen 112). In some embodiments, as the gesture 3730 continues to move towards application 2, the device 100 continues to decrease the size of application 2 and to reveal correspondingly more of the new user interface portion (e.g., home screen wallpaper 3792).

In some embodiments, in accordance with a determination that the gesture 3730 has reached a current position that is past the threshold 3783, the device 100 presents an animation that shows application 1 rapidly resizing and catching up to application 2, as application 2 is dismissed from the touch screen 112. In some embodiments, while application 1 catches up to application 2 during the animation, application 1 increases in size until it occupies substantially all of touch screen 112 and covers up the new user interface portion (e.g., home screen wall paper 3792, as shown in FIG. 37M).

Figure 38A:
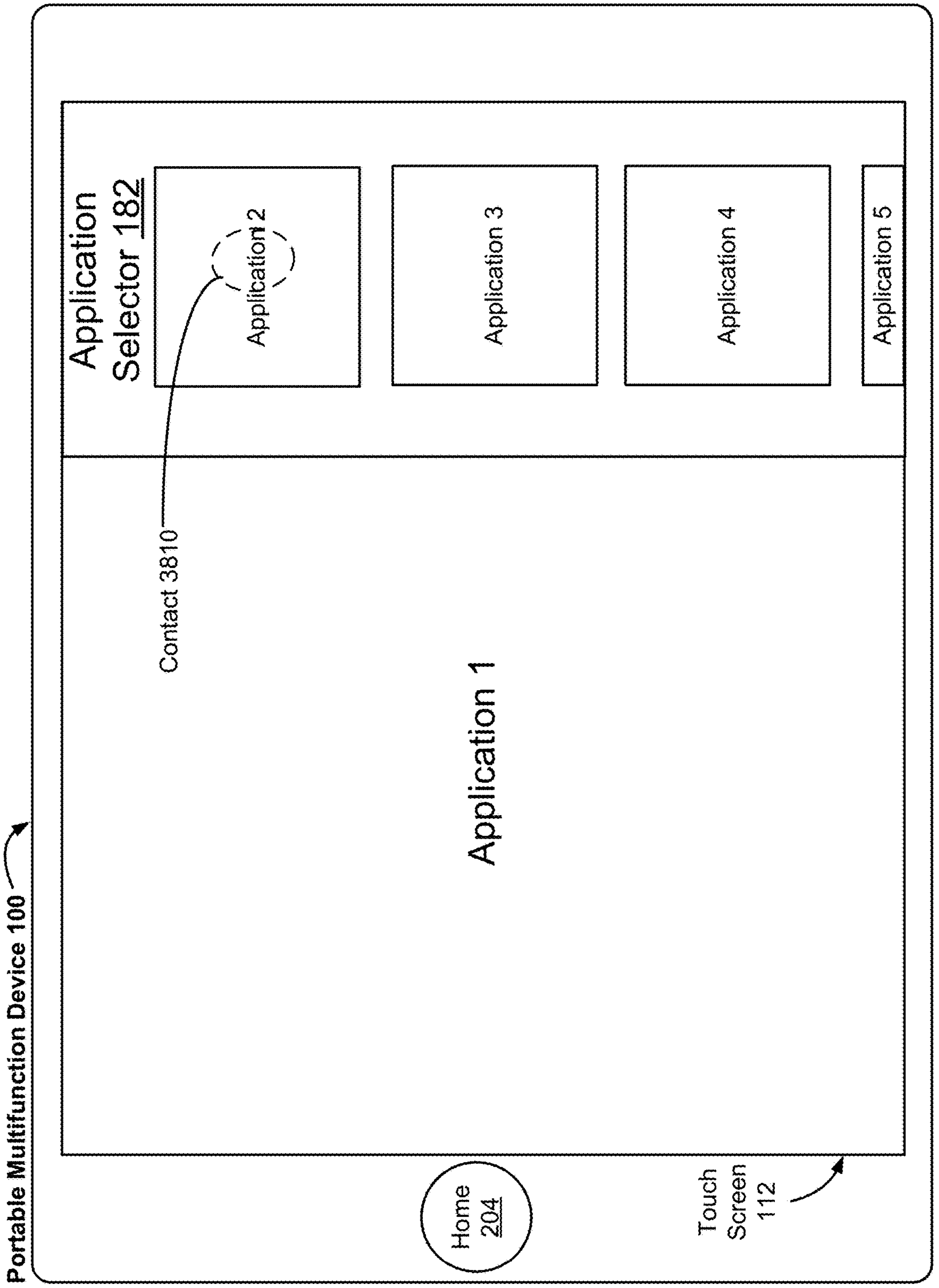
FIGS. 38A-38D are schematics of a touch-sensitive display used to illustrate gestures for removing affordances from an application selector, in accordance with some embodiments.

FIGS. 38A-38D are schematics of a touch-sensitive display used to illustrate gestures for removing affordances from an application selector, in accordance with some embodiments. FIG. 38A illustrates a contact 3810 at the affordance corresponding to application 2 within application selector 182. In some embodiments, contact 3810 is an extended press gesture (e.g., a user makes contact with touch screen 112 and, without removing the contact, continues to press down on touch screen 112 for a predetermined amount of time (e.g., two seconds or some other predefined or configurable period of time)).

After the extended press gesture (e.g., contact 3810) satisfies a threshold amount of time (e.g., the contact/motion module 130 determines that the press has lasted for more than two seconds), application selector 182 changes to a modification mode (e.g., by graphics module 132) in which affordances can be added, removed, or re-ordered. In the modification mode, application selector 182 displays an x-symbol 3820 (in some embodiments, an x-symbol is also referred to as a remove affordance) on top of each of the displayed application-specific affordances within application selector 182. In some embodiments, activation of the modification mode also reveals plus affordance 3510 (while in other embodiments, plus affordance 3510 is always displayed with application selector 182, e.g., as pictured in FIG. 35B). In some embodiments, the extended press gesture is also available while on the home screen of device 100 and, in these embodiments, activation of a modification mode for the home screen using the extended press gesture also results in displaying one or more plus affordance(s) 3510 on top of icons corresponding to applications that are compatible with the shared screen mode (e.g., as determined by compatibility module 184, FIG. 1A). In these embodiments, selection of the plus affordance that is displayed on top of a compatible application results in adding an affordance corresponding to the compatible application to application selector 182.

Figure 38B:
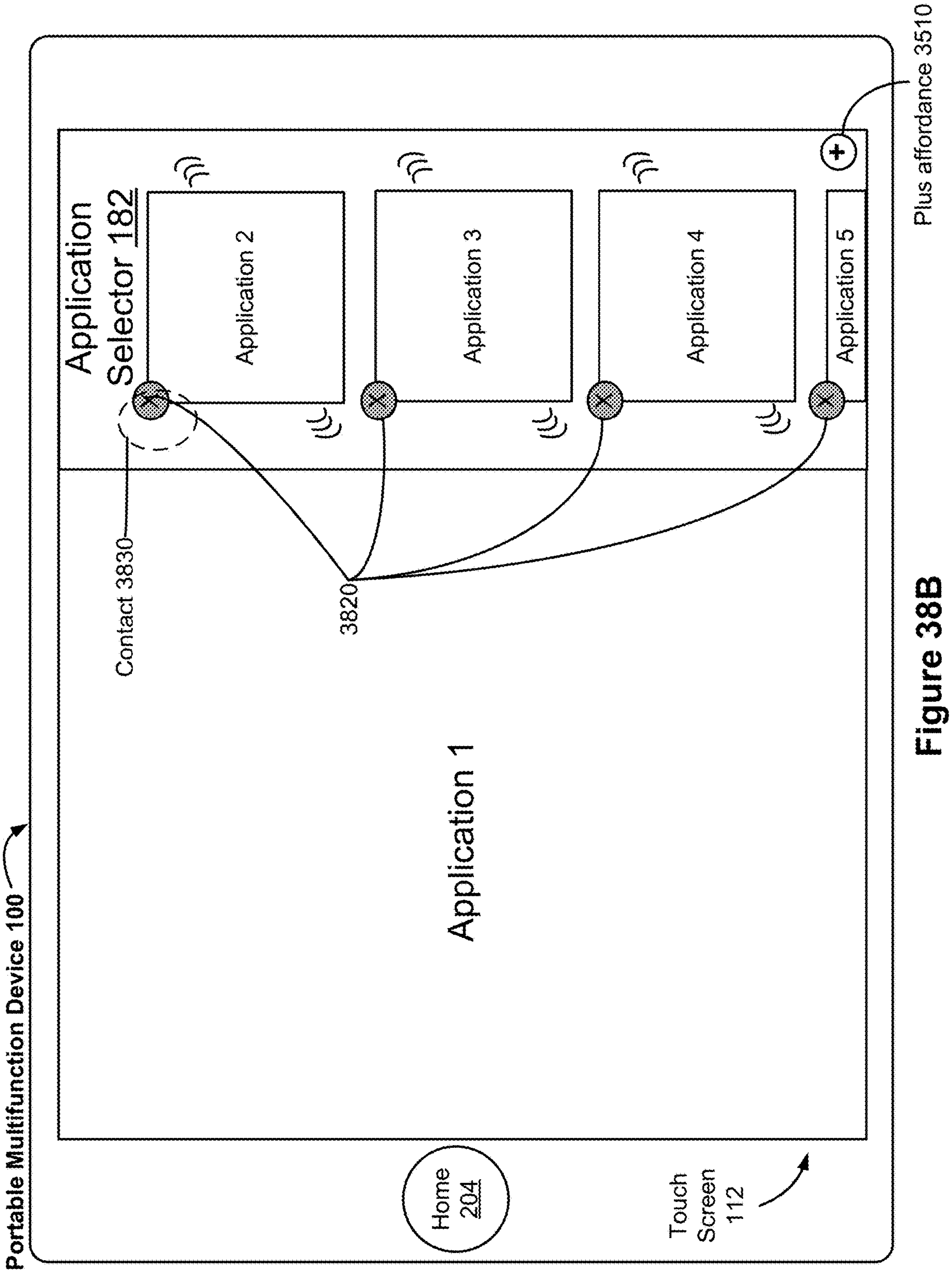

Continuing the example of the modification mode available for application selector 182, and as pictured in FIG. 38B, each application-specific affordance is configured to vibrate or jiggle from side-to-side within application selector 182 (as shown by the semi-circular indications next to each of the application-specific affordances) and an x-symbol (e.g., x-symbol 3820) is displayed in the top left corner of each affordance. In some embodiments, tapping (contacting, selecting, etc.) one of the x-symbols 3820 results in removal of the corresponding application-specific affordance from application selector 182 (but not from the device 100). For example, FIG. 38B illustrates contact 3830 at an x-symbol 3820 corresponding to application 2. In response to detecting the contact 3830 (in some embodiments, contact/motion module 130 performs the detection), application 2 is removed from application selector 182, as pictured in FIG. 38C. In some embodiments, additional gestures for removing affordances from the application selector while in the modification mode are provided. For example, a swipe gesture dragging an affordance out of the application selector (e.g., a user contacts one of the affordances and, without releasing the contact, drags the affordance to a location on touch screen 112 that is outside of the displayed boundary of application selector 182) results in removal of the affordance from the application selector (but not from the device 100).

In some embodiments, removal of an application-specific affordance causes device 100 to attempt to select or suggest a replacement application-specific affordance and to add the replacement application-specific affordance to application selector 182 (in some embodiments, device 100 suggests an application-specific affordance to a user of device 100 and the suggested affordance is not added to the application selector until approval is received from the user).

Figure 38C:
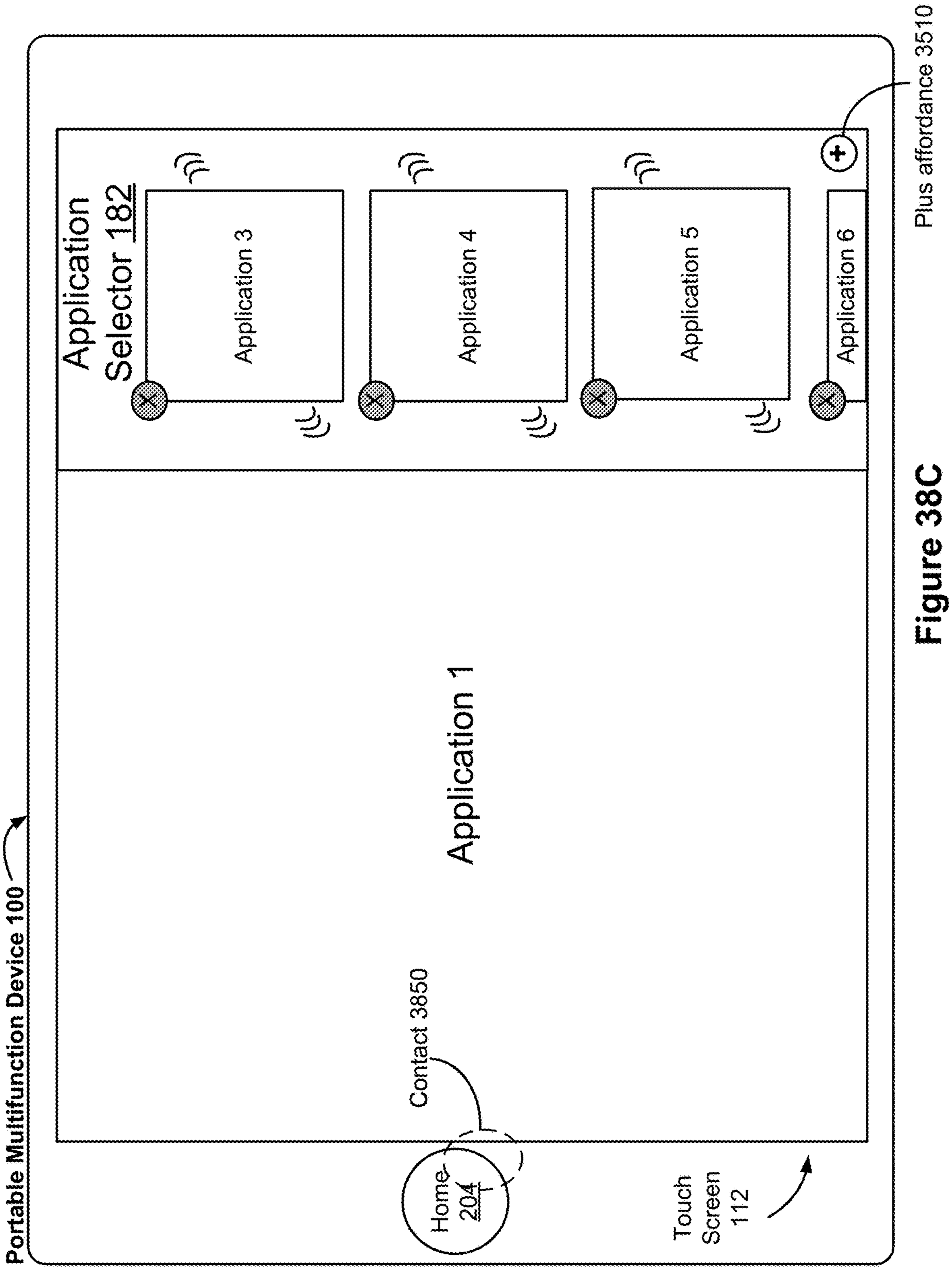
Figure 38D:
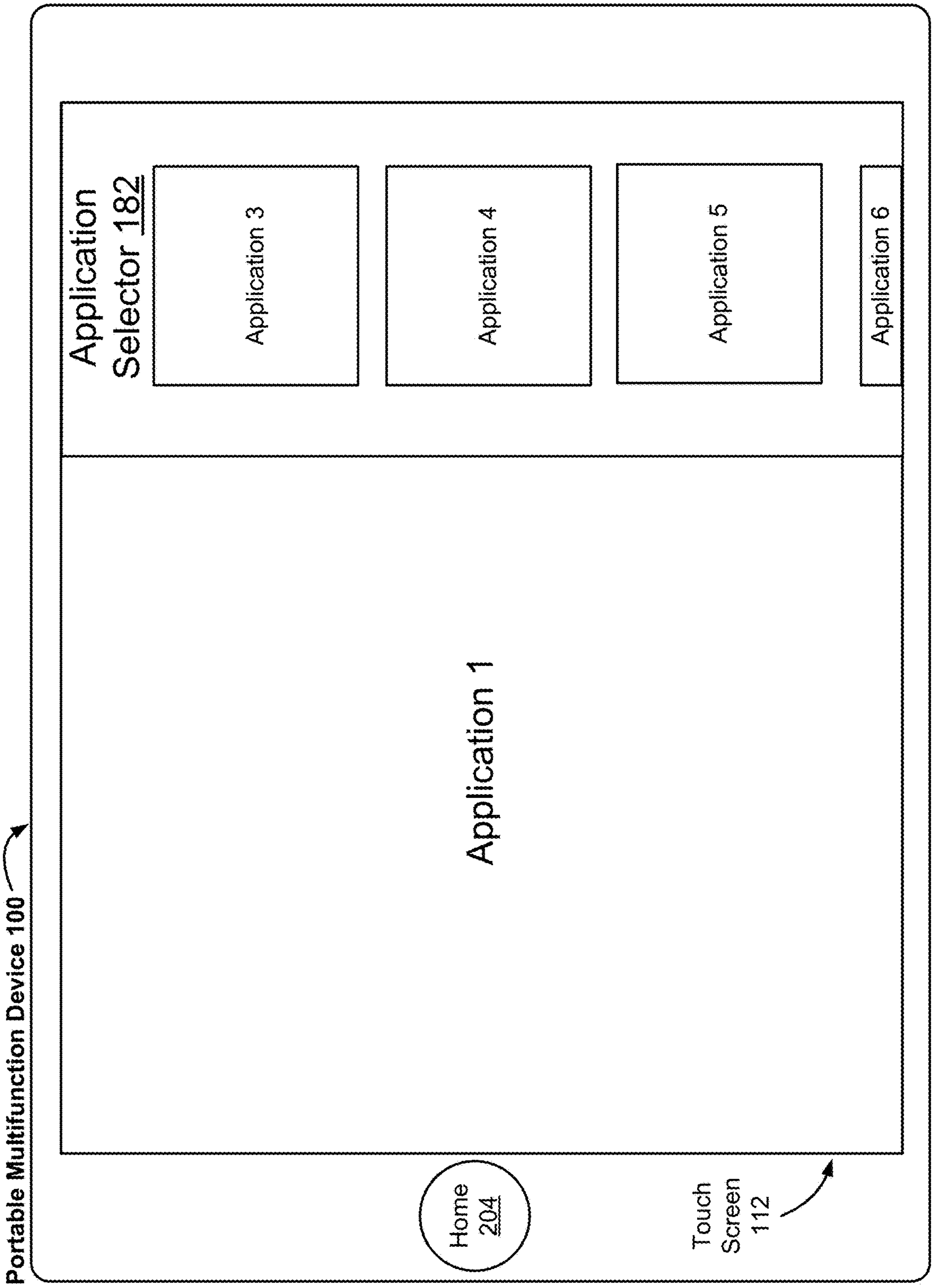

FIG. 38C also illustrates a gesture for indicating that a user has finished removing affordances from application selector 182. For example, FIG. 38C illustrates that in response to clicking on home button 204 (e.g., contact 3850) or, alternatively, tapping anywhere outside of the application selector, application selector 182 no longer displays the x-symbols and the application-specific affordances are no longer configured to vibrate from side-to-side within application selector 182 (as pictured in FIG. 38D). As pictured in FIG. 38D, application 2 has been removed from application selector 182 and each of the application-specific affordances contained therein has moved up slightly to occupy the space previously occupied by the affordance for application 2. In some embodiments, in accordance with a determination that additional application-specific affordances are associated with application selector 182 (e.g., in addition to the currently displayed affordances), then application selector 182 displays one of the additional affordances (e.g., an affordance for application 6, as pictured in FIG. 38D).

In some embodiments, the determination that additional application-specific affordances are associated with application selector 182 is performed by accessing information associated with a current user of device 100 (e.g., by accessing multitasking usage information (e.g., stored with multitasking data 176 for each application and aggregated for analysis by multitasking module 180) associated with the current user and generating a new application-specific affordance for an application that is commonly used by the current user). In this way, application selector 182 is populated with additional application-specific affordances based on usage information associated with the current user.

Figure 39A:
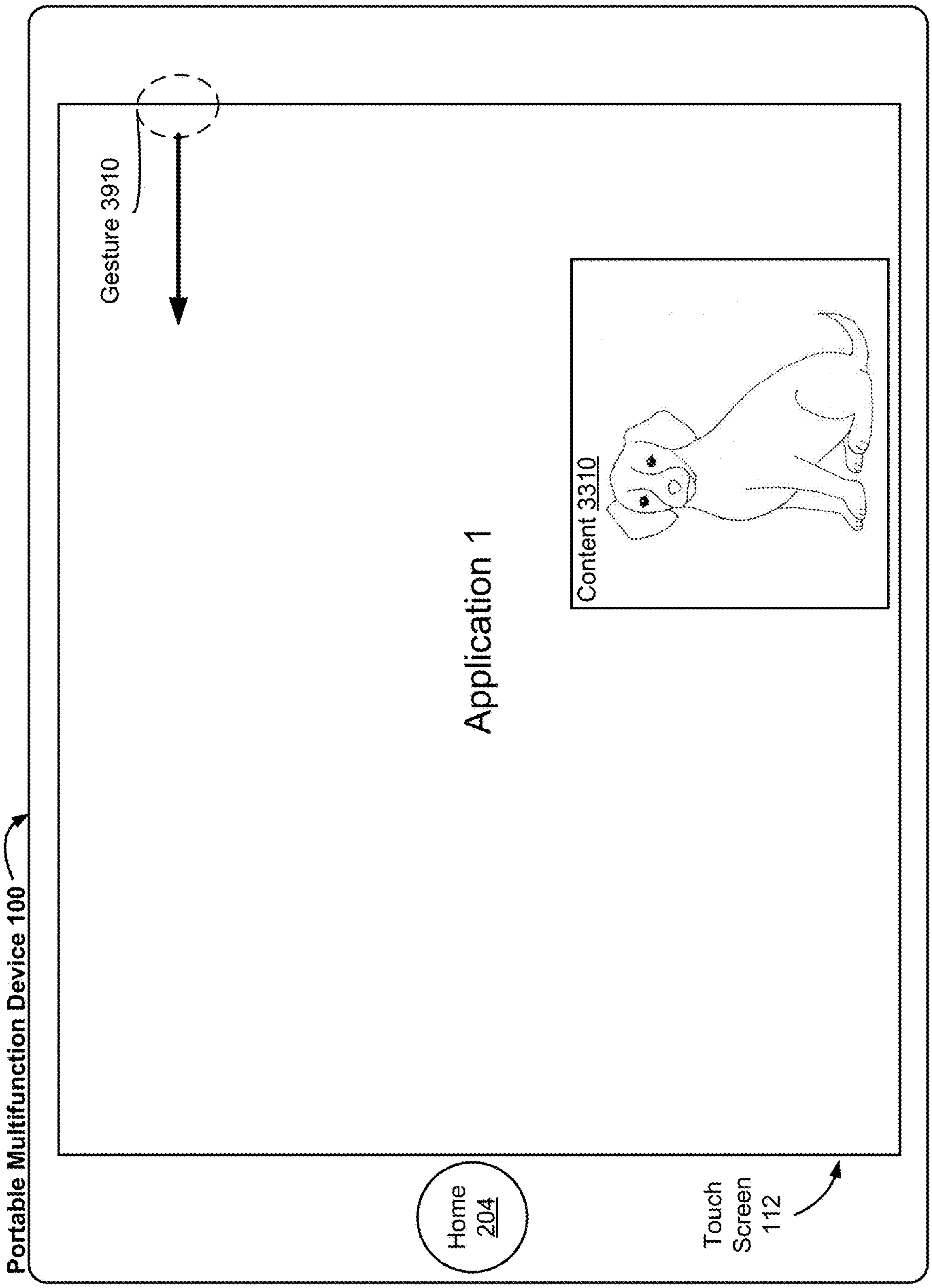
FIGS. 39A-39D are schematics of a touch-sensitive display used to illustrate an affordance for revealing an application selector, in accordance with some embodiments.

FIGS. 39A-39D are schematics of a touch-sensitive display used to illustrate use of an affordance to reveal an application selector, in accordance with some embodiments. FIG. 39A illustrates a single application (e.g., application 1) displayed in a full-screen mode on touch screen 112. In some embodiments, a gesture (e.g., gesture 3910) is received (e.g., by event handler 177 and/or contact/motion module 130) on touch screen 112 at a position that is not in the middle of touch screen 112 (e.g., gesture 3910 is near the top of touch screen 112, whereas gesture 3640 of FIG. 35E is substantially near the middle of touch screen 112). In some embodiments, gesture 3910 is a swipe gesture in a substantially horizontal (e.g., right-to-left) direction.

Figure 39B:
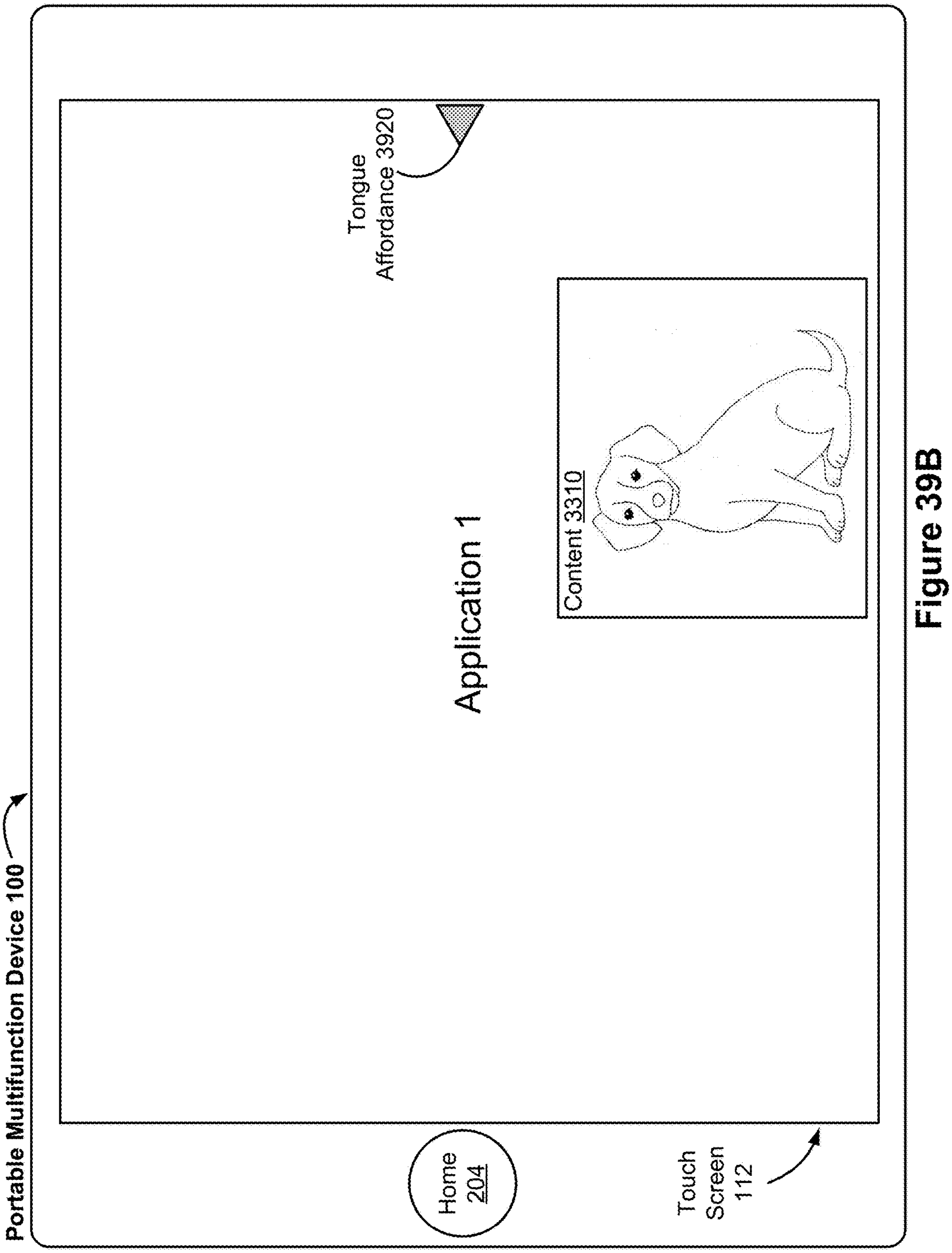

FIG. 39B is a schematic of a touch-sensitive display used to illustrate a user interface displayed in response to receiving gesture 3910, in accordance with some embodiments. As pictured in FIG. 39B, in some embodiments, a tongue affordance 3920 is displayed in response to receiving gesture 3910. Although pictured in FIG. 39B in accordance with some embodiments, tongue affordance 3920 could, in other embodiments, be any suitable user interface element for activating an application selector (e.g., text that says "slide to open application selector" or "click here to start multitasking").

Figure 39C:
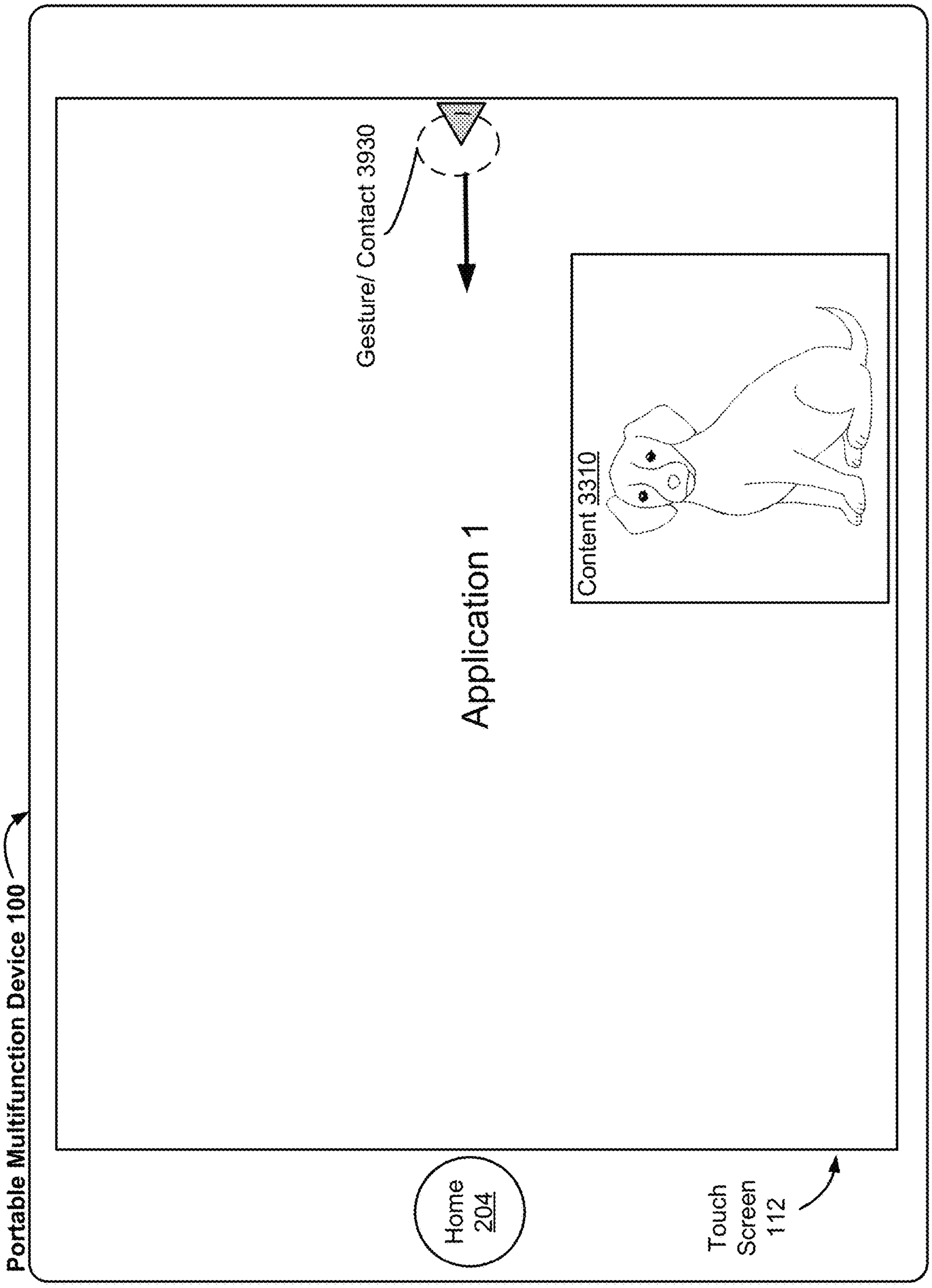

FIG. 39C illustrates a gesture/contact 3930 at tongue affordance 3920 for revealing an application selector. As pictured in FIG. 39C, in some embodiments, gesture/contact 3930 is a swipe gesture moving in a substantially horizontal (e.g., right-to-left) direction. In other embodiments, gesture/contact 3930 is a single tap on tongue affordance 3920. In response to receiving gesture/contact 3930 at tongue affordance 3920, application selector 182 is displayed.

Figure 39D:
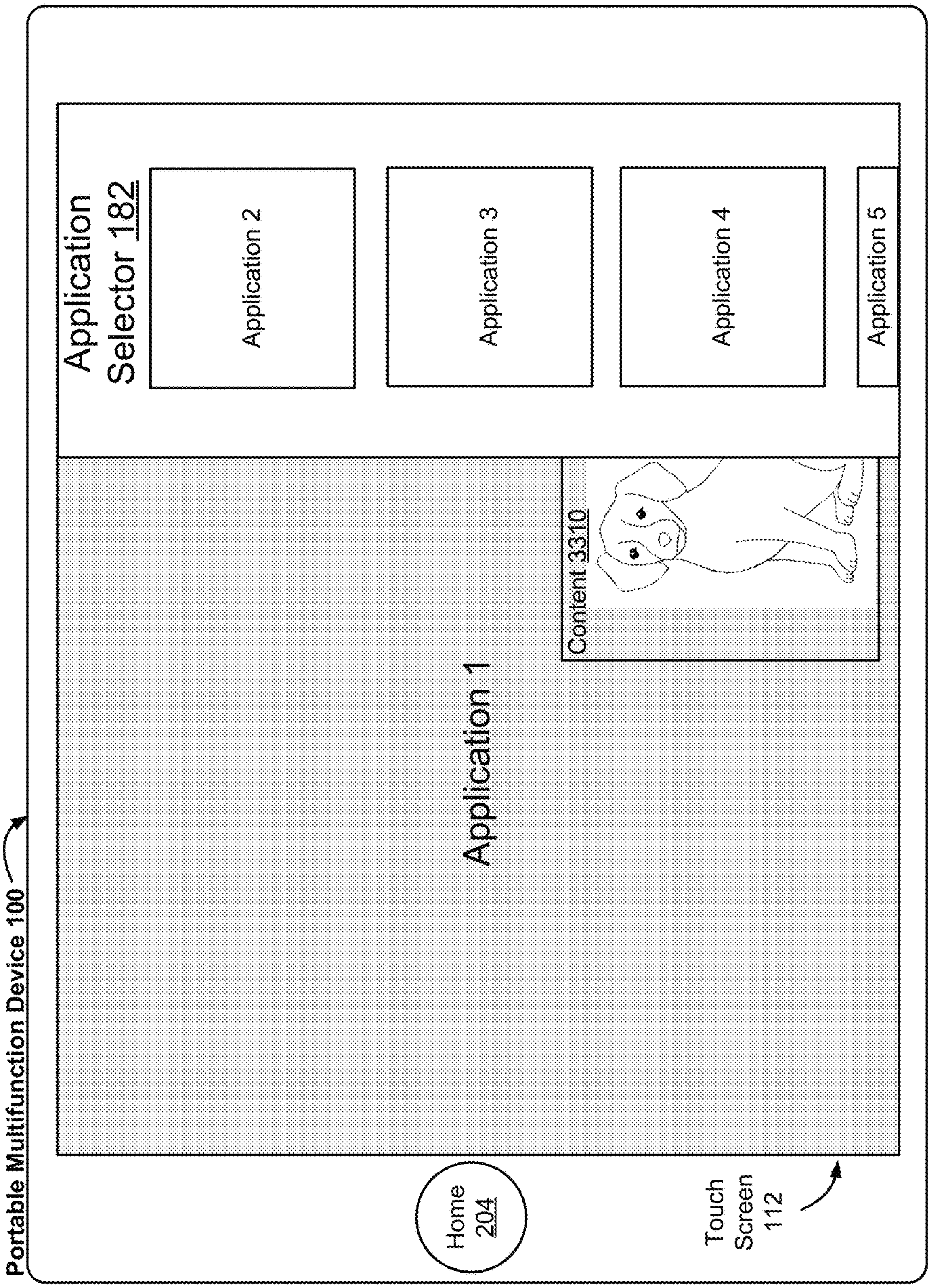

FIG. 39D illustrates an exemplary user interface displayed on touch screen 112 in response to receiving input at tongue affordance 3920. As pictured in FIG. 39D, application selector 182 is displayed as overlaying application 1

(see above discussion concerning overlaying for additional details of exemplary embodiments) and application 1 is optionally dimmed (e.g., a brightness level corresponding to the region of touch screen 112 used for the display of application 1 is reduced). In some embodiments, dimming of application 1 is used to indicate that application 1 is not currently active (e.g., a user cannot interact with application 1 while application selector 182 is displayed). Dimming of application 1 is discussed in more detail with respect to FIGS. 41A-41E below.

In this way, depending on the location of the swipe gesture that is detected near an edge of the touch-sensitive display (near the middle of the touch-sensitive display, such as gesture 3640, or away from the middle of the touch-sensitive display, such as gesture 3910), the touch-sensitive display is updated to either display an application selector or to display a tongue affordance for revealing an application selector. In some embodiments, the swipe gesture that is near the middle of the screen also passes over the home button 204 and, in accordance with a determination that the swipe gesture has passed over the home button 204, the device 100 reveals the application selector. In some embodiments, in accordance with a determination that the home button has not been passed over by the swipe gesture, the device 100 instead displays the tongue affordance.

Figure 40A:
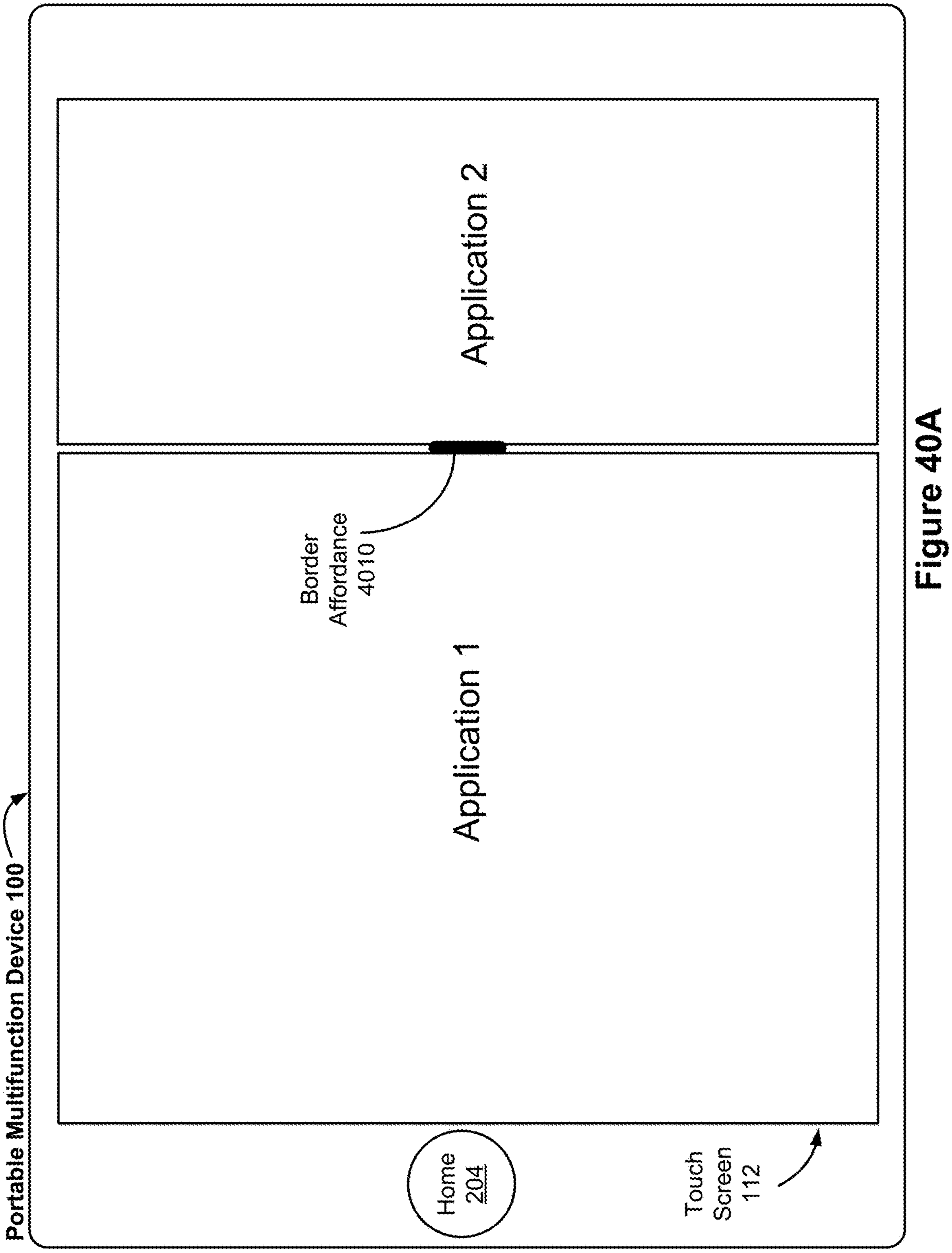
FIGS. 40A-40D are schematics of a touch-sensitive display used to illustrate a border affordance used for resizing applications in a shared screen mode, in accordance with some embodiments.

As illustrated in FIGS. 40A-40D, in some embodiments, an additional gesture for resizing applications displayed in a shared screen mode is also available. For example, FIG. 40A illustrates a border affordance for resizing applications in a shared screen mode, in accordance with some embodiments. As shown in FIG. 40A, a border affordance (e.g., border affordance 4010) is a user interface element displayed at a border between two concurrently displayed applications (e.g., concurrently displayed applications 1 and 2).

Figure 40B:
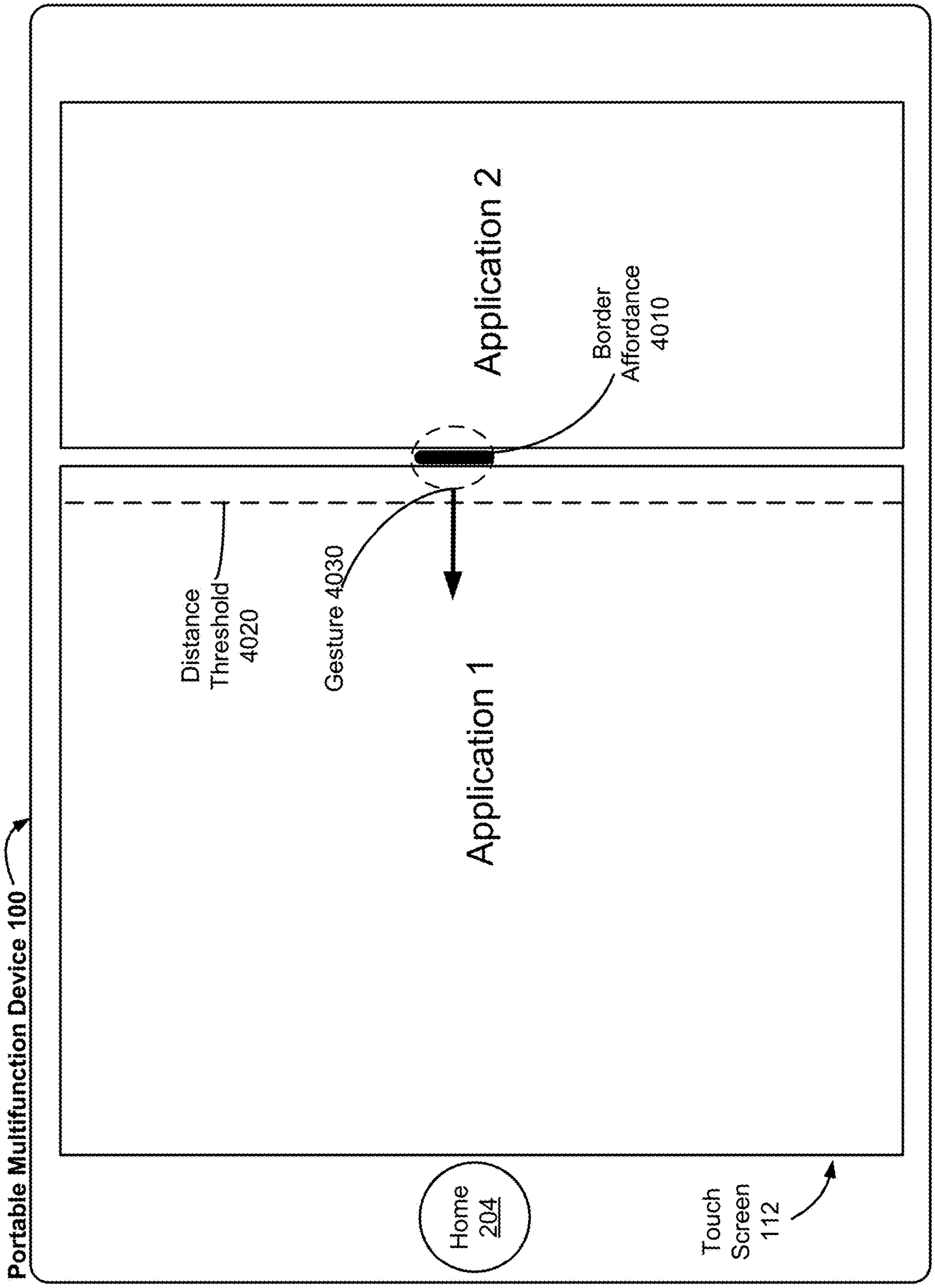
Figure 40C:
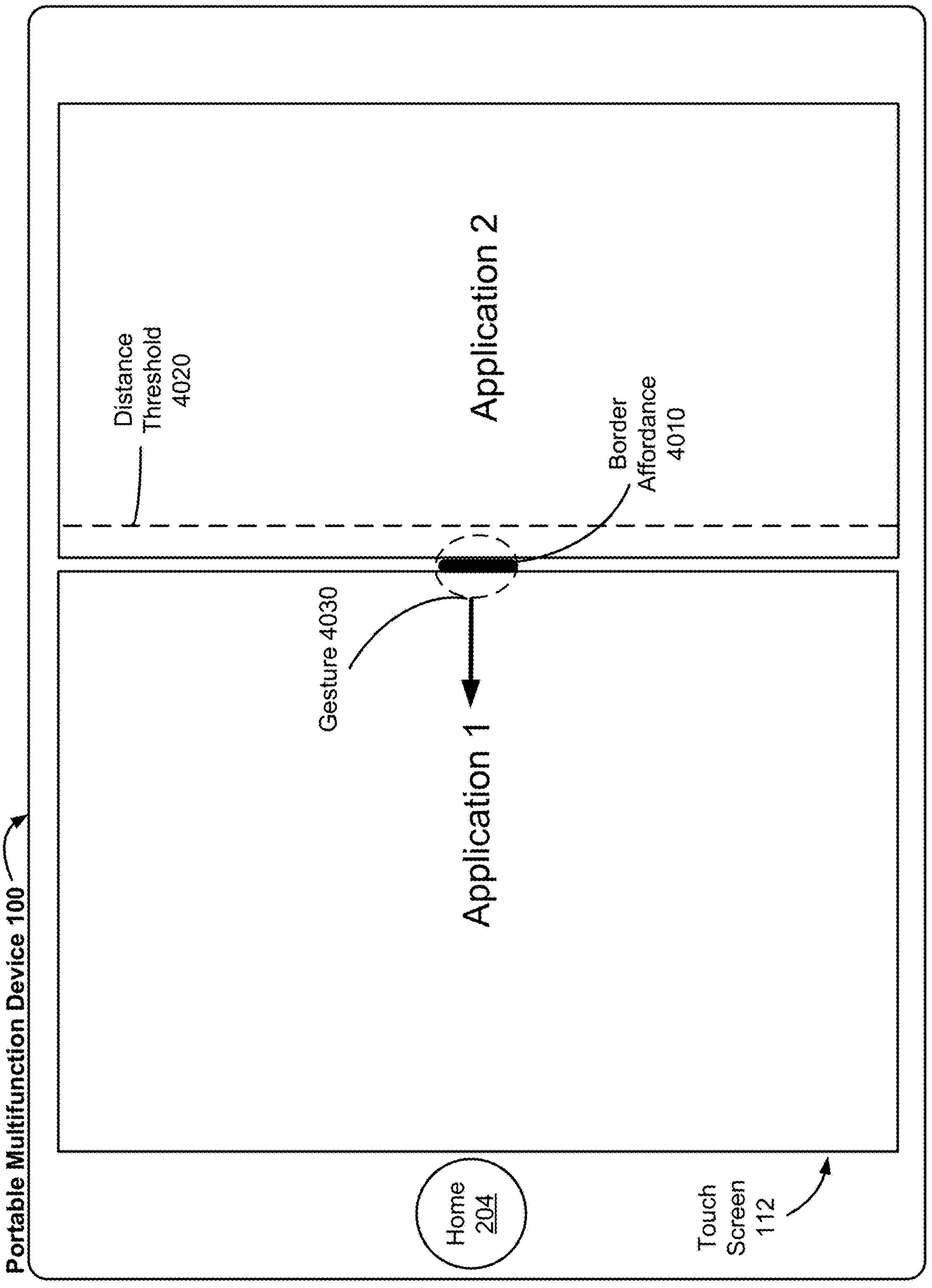

FIG. 40B is a schematic of a touch-sensitive display used to illustrate use of a border affordance to resize concurrently displayed applications (e.g., applications displayed in a shared screen view or a shared screen mode on touch screen 112 of device 100), in accordance with some embodiments. In some embodiments, and as illustrated in FIG. 40B, a gesture 4030 is received at border affordance 4010 moving the border affordance in a substantially horizontal direction (in other embodiments, e.g., if the concurrently displayed applications are stacked on top of each other instead of beside each other, then the gesture will move the border affordance in a substantially vertical direction). In response to receiving gesture 4030, applications 1 and 2 are resized (e.g., by graphics module 132, FIG. 1A).

For example, gesture 4030, in some embodiments, moves border affordance 4010 towards application 1 (e.g., in a leftward direction), in order to request an increase in the displayed area for application 2 and a corresponding decrease in the displayed area for application 1. In accordance with movement of gesture 4030 towards application 1, applications 1 and 2 are continuously resized (e.g., application 1 reduces in size and application 2 increases in size). In some embodiments, application 1 or 2 may only be resizable to fixed widths (e.g., ⅓, ½, or full-screen, as discussed in more detail above regarding FIGS. 6A-6I) and, thus, movement of gesture 4030 causes resizing only after the border affordance is moved beyond particular distance thresholds relative to an edge of the touch-sensitive display (e.g., distance threshold 4020, FIG. 40B).

Figure 40D:
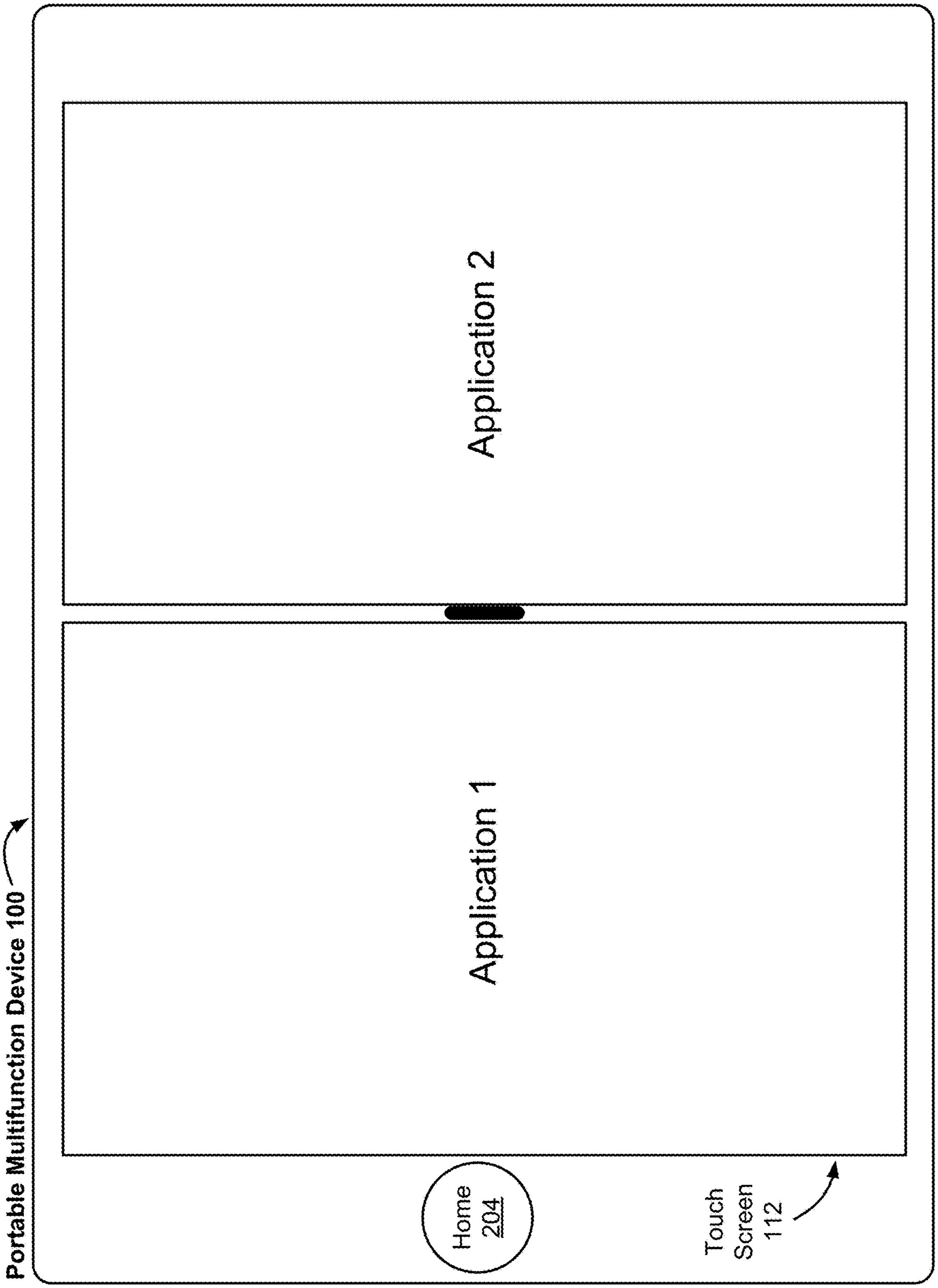

For example, if application 2 is only resizable to fixed widths (e.g., ⅓, ½, or full-screen) and gesture 4030 moves border affordance 4010 to a position on touch screen 112 beyond distance threshold 4020 (as pictured in FIG. 40C) from a fixed width position, then application 2 is resized to fit within one of the fixed widths and application 1 is resized to fit within a remainder of the display area of touch screen 112 (as pictured in FIG. 40D). Continuing the example, if application 2 is currently displayed on ⅓ of the available display area of touch screen 112 and gesture 4030 moves border affordance 4010 beyond distance threshold 4020, then resizing of application 2 appears, in some embodiments, to jump to occupying a newly selected fixed display area (e.g., 50%). In some embodiments, the fixed display widths corresponding to application 2 are used (e.g., by graphics module 132) to define distance thresholds (e.g., if application 2 is resizable to ½ or ⅓ of the display area, then graphics module 132, in some embodiments, defines two distance thresholds: (i) one located at ½ of the display area of touch screen 112 and (ii) one located at ⅓ of the display area of touch screen 112).

Attention is now directed to the use of a pin affordance to activate a shared screen mode, as illustrated in FIGS. 41A-41E.

Figure 41A:
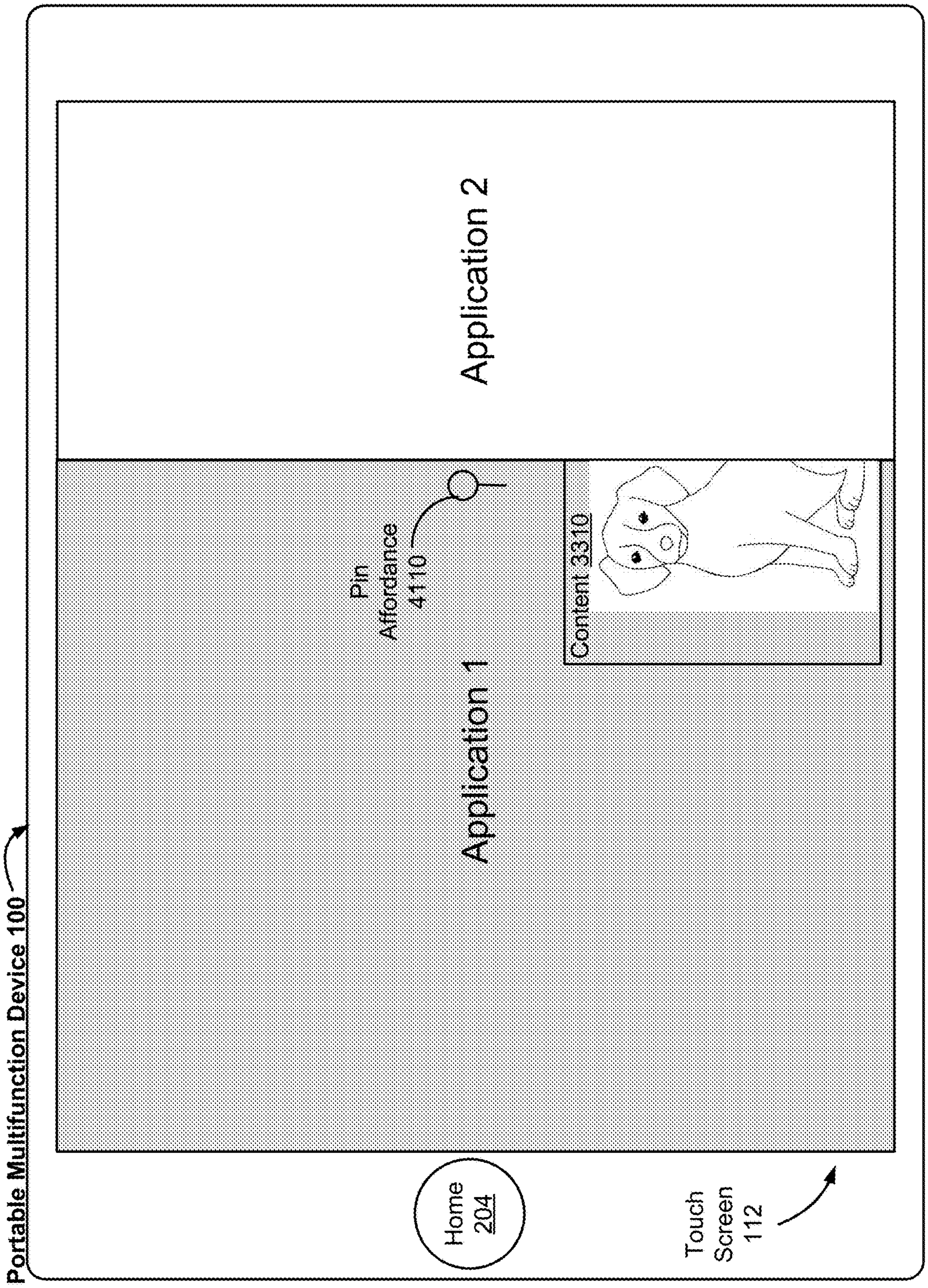
FIGS. 41A-41E are schematics of a touch-sensitive display used to illustrate use of a pin affordance to activate a shared screen mode, in accordance with some embodiments.

FIG. 41A is a schematic of a touch-sensitive display used to illustrate a pin affordance (e.g., pin affordance 4110), in accordance with some embodiments. In some embodiments, a pin affordance is displayed when a side application (e.g., application 2) overlays a main application (e.g., application 1) after a respective application-specific affordance is selected from within an application selector.

Figure 41B:
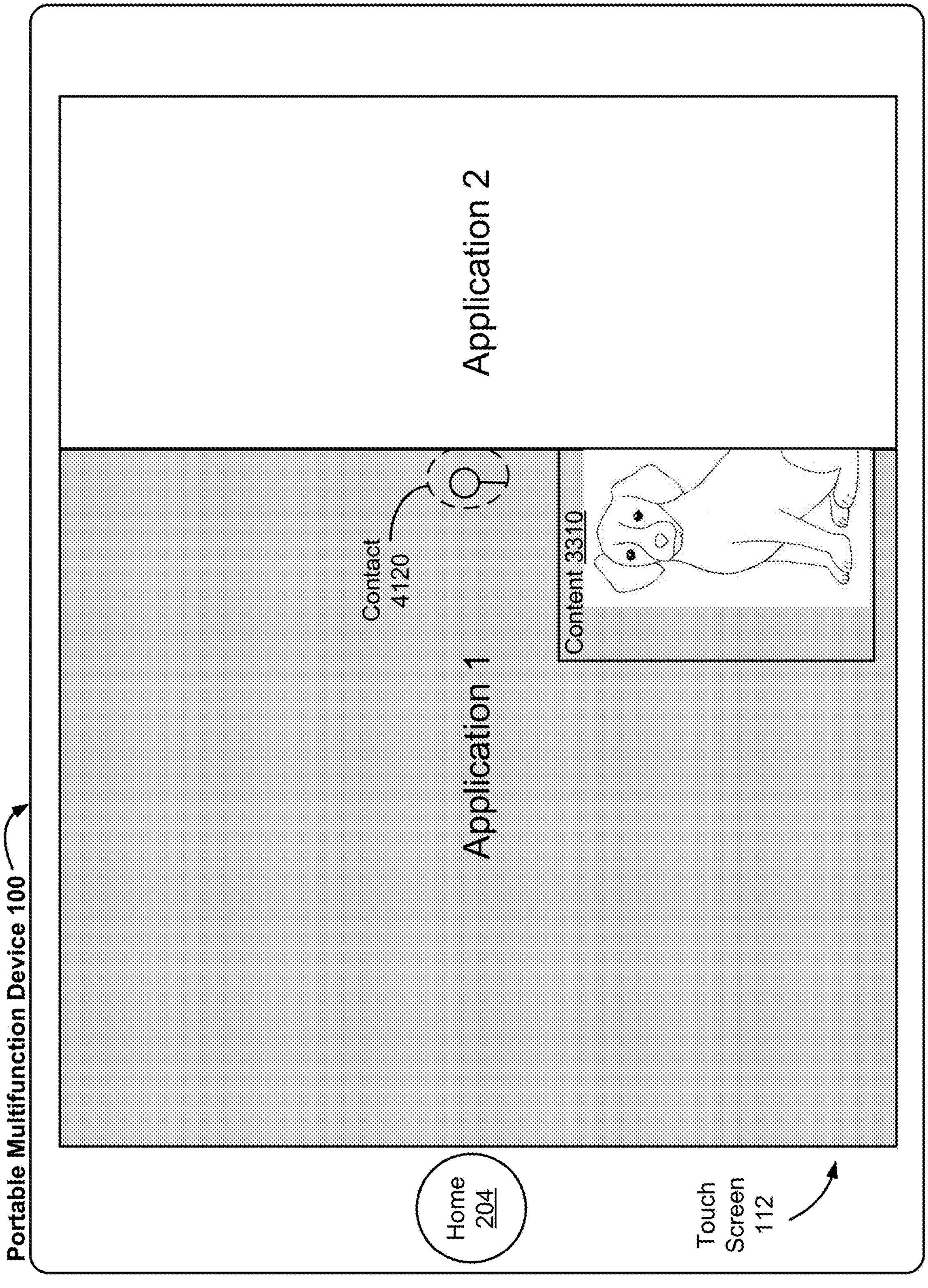
Figure 41C:
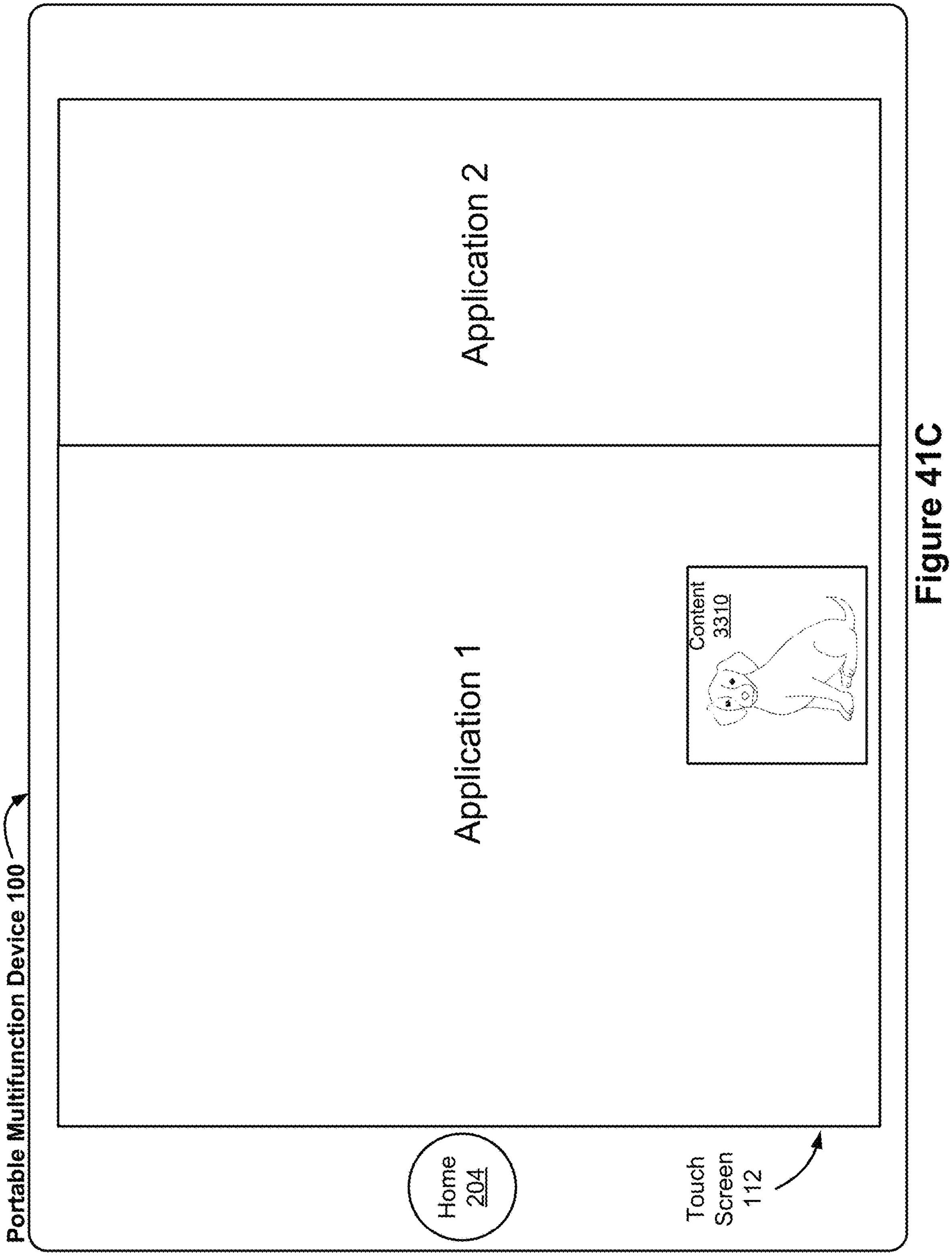

FIG. 41B is a schematic of a touch-sensitive display used to illustrate receiving input (e.g., contact 4120) at a displayed pin affordance (e.g., pin affordance 4110), in accordance with some embodiments. In response to receiving the input at the displayed pin affordance, FIG. 41C illustrates a shared screen view of concurrently displayed application 1 and application 2. As pictured in FIG. 41C, application 1 is no longer dimmed and has been resized to fit within a reduced portion of touch screen 112 (e.g., content 3310 and other content displayed in application 1 are resized to smaller sizes). Additionally, in response to receiving the input at the pin affordance 4110 (e.g., a tap on the pin affordance 4110), application 2 is now running side-by-side with application 1 and application 2 is now persistently displayed within a remaining portion of touch screen 112 not occupied by the resized application 1.

In some embodiments, pinning an application as a side application (application 2 in the above example) links the pinned side application to the currently-displayed main application (application 1 in the above example). In some embodiments, linking includes creating a record that indicates that application 2 is pinned as a side application whenever application 1 is launched (e.g., multitasking data 176 corresponding to application 1 is updated to include this record). As such, in these embodiments, until application 2 is dismissed or promoted (dismissal and promotion of side applications is discussed above in reference to FIGS. 37A-37F), every time application 1 is opened/launched, application 2 is also opened as a side application in a shared screen view that includes application 1 as the main application and application 2 as the side application.

In some other embodiments, side applications are pinned to the shared screen view (instead of being pinned to individual applications). In these other embodiments, pinning application 2 (discussed in the aforementioned example) results in pinning application 2 to the shared screen view, such that opening any new application that is compatible with the shared screen view results in displaying the new application in the shared screen view with application 2 as the side application (e.g., if a user pins application 2, exits to a home screen (by clicking physical home button 204), uses a gesture to launch the application selector (e.g., gesture 3325, FIGS. 33B-33D), and then selects a new application from within the application selector, then the selected new application will be displayed in the shared screen view with application 2).

In some embodiments, pinning an application also allows the application to be resized (e.g., before pinning, overlaid application 2 of FIG. 41B, in some embodiments, is only displayed with a predefined fixed area for overlaid applications (e.g., ¼ of the display area) and, after pinning, application 2 is, in some embodiments, now resizable to ⅓, ½, or all of the display area of touch screen 112). In some embodiments, multitasking data 176 (FIG. 1B) stores available sizes for before and after pinning an application selector 182 and multitasking module 180 (FIG. 1A) retrieves the available sizes after receiving a request to resize a side application. In some embodiments, the functionality described above with respect to pin affordance 4110 is associated instead with border affordance 4010 (FIG. 40A, e.g., clicking on border affordance 4010 results in pinning/persistent display of a side application). In some embodiments, after pinning a side application (either by clicking on the pin affordance 4110 or clicking on the border affordance 4010), in response to detecting a contact at the border affordance 4010 (i.e., a second contact that occurs after the first contact that initiated the pinning), the device 100 updates the touch screen 112 to again display the side application as overlaying the main application. Stated another way, selecting the border affordance while the side application is pinned causes the device 100 to cancel the pinning and revert to displaying the side application as overlaying the main application (e.g., the touch screen 112 progresses from FIG. 41B (the point at which the pinning is initiated) to FIG. 41C (displaying a pinned side application next to a main application) and finally back to FIG. 41B (displayed the side application as again overlaying the main application.

Figure 41D:
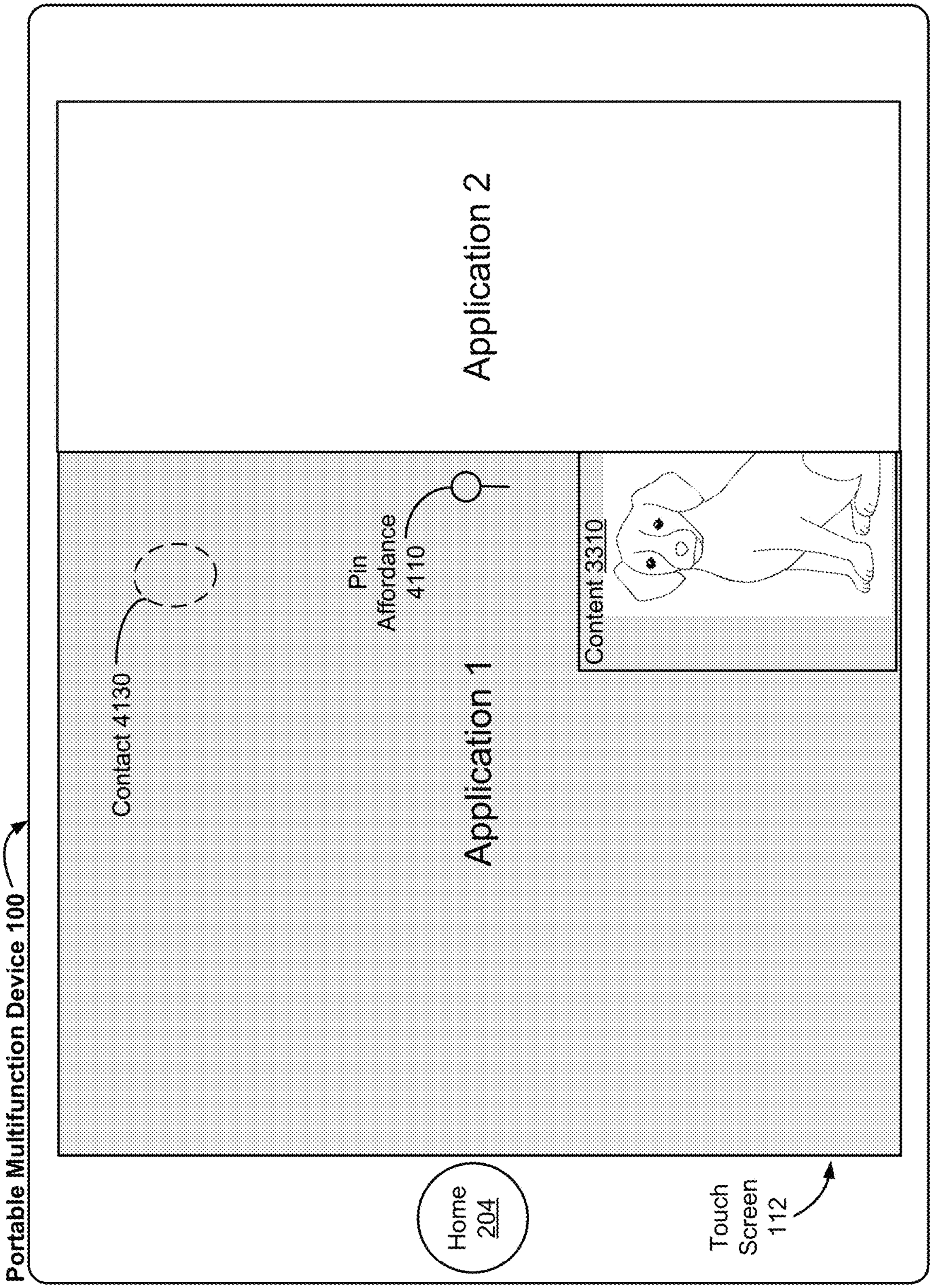
Figure 41E:
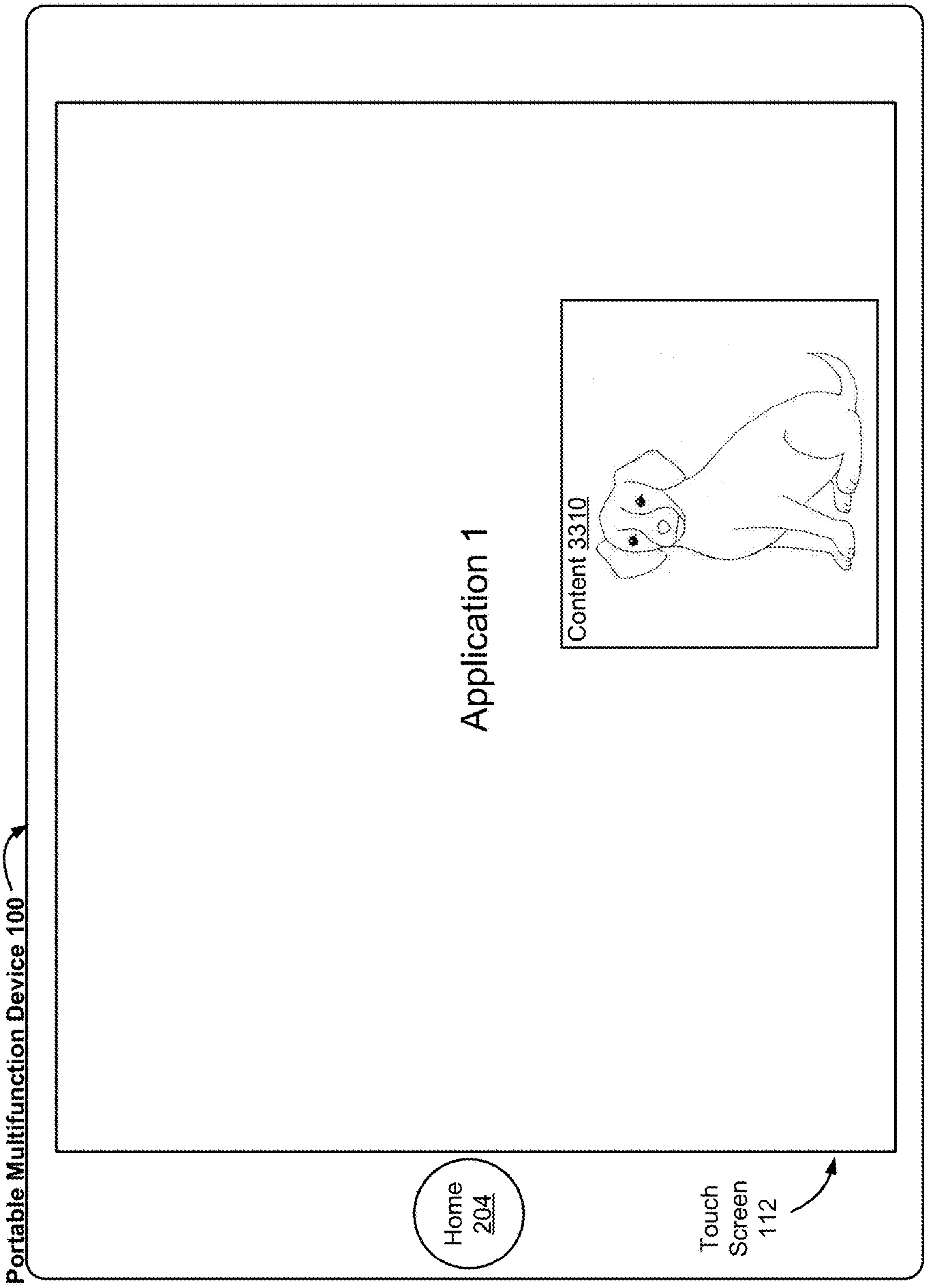

Instead of clicking (e.g., tapping on) pin affordance 4110 as pictured in FIG. 41B, FIG. 41D illustrates input (e.g., contact 4130) within dimmed application 1. In response to receiving contact 4130 within dimmed application 1, application 2 is no longer displayed (e.g., dismissed from touch screen 112, although application 2, in some embodiments, remains active as a background process) and application 1 is again displayed in a full-screen mode (as pictured in FIG. 41E). In some embodiments, the type of input received within the dimmed application determines whether or not application 1 is again displayed in the full-screen mode. For example, in accordance with a determination that the input received within the dimmed application is of a first predetermined type (e.g., contact 4130 is a single tap), then the dimmed application is again displayed in the full-screen mode. In accordance with the determination instead indicating that the input received within the dimmed application is of a second predetermined type (e.g., contact 4130 comprises scroll input such that the contact 4130 moves in an upward or downward direction on the touch screen 1121), then the dimmed application is updated in response to the input but is not displayed in the full-screen mode (in other words, the dimmed application is scrolled while application 2 is still displayed as overlaying the dimmed application 1).

In some embodiments, in response to receiving user input (e.g., contact 4130) within dimmed application, a determination is made as to whether the received user input is of a first predetermined or of a second predetermined type. For example, in accordance with a determination that the received user input is a tap input (e.g., contact 4130 momentarily makes contact with touch screen 112 and is then removed (or lifted off) from the touch screen 112), then application 2 is dismissed from touch screen 112. In accordance with a determination that the received user input is a scroll gesture (e.g., contact 4130 makes contact with the touch screen 112 and then moves in a direction that is parallel to a border between applications 1 and 2 (i.e., a downward or upward direction)), then the device 100 updates touch screen 112 (e.g., using graphics module 132) to scroll within the dimmed application 1. Thus, in these embodiments, users are able to scroll within dimmed applications using a scroll gesture and can quickly return to the dimmed application by tapping within the dimmed application.

FIGS. 42A-42E are schematics of a touch-sensitive display used to illustrate gestures related to sharing objects within a shared screen view and, more specifically, to dragging content between applications while in a shared screen mode, in accordance with some embodiments.

Figure 42A:
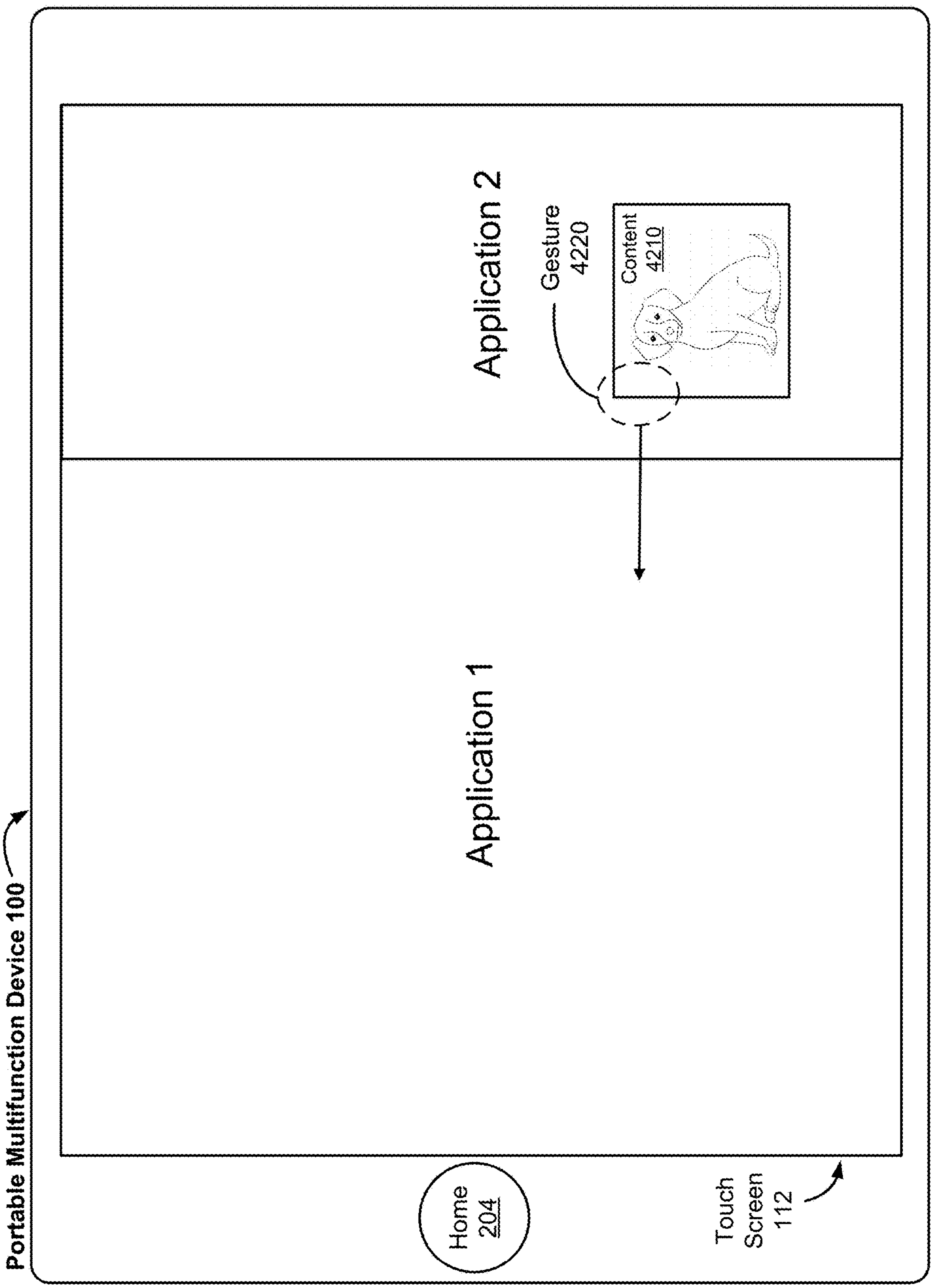
FIGS. 42A-42E are schematics of a touch-sensitive display used to illustrate gestures related to sharing objects within a shared screen view and, more specifically, dragging content between applications while in a shared screen view, in accordance with some embodiments.

FIG. 42A is a schematic of a touch-sensitive display used to illustrate a shared screen view of concurrently displayed applications 1 and 2, with content 4210 displayed within application 2, in accordance with some embodiments. In some embodiments, to improve multitasking capabilities, users are able to drag content between concurrently displayed applications in a shared screen mode. For example, a gesture (e.g., gesture 4220) is detected at a portion of a displayed application corresponding to content within the displayed application (e.g., an image of a dog displayed within image management module 144, such as content 4210). Gesture 4220 is detected moving content 4210 in a direction towards application 1 (in some embodiments, content 4210 moves across touch screen 112 in accordance with/following movement of the gesture). After detecting a liftoff event (e.g., by contact/motion module 130 or event handler 177) associated with gesture 4220, a determination is made as to whether content 4210 should be displayed within application 1.

Figure 42B:
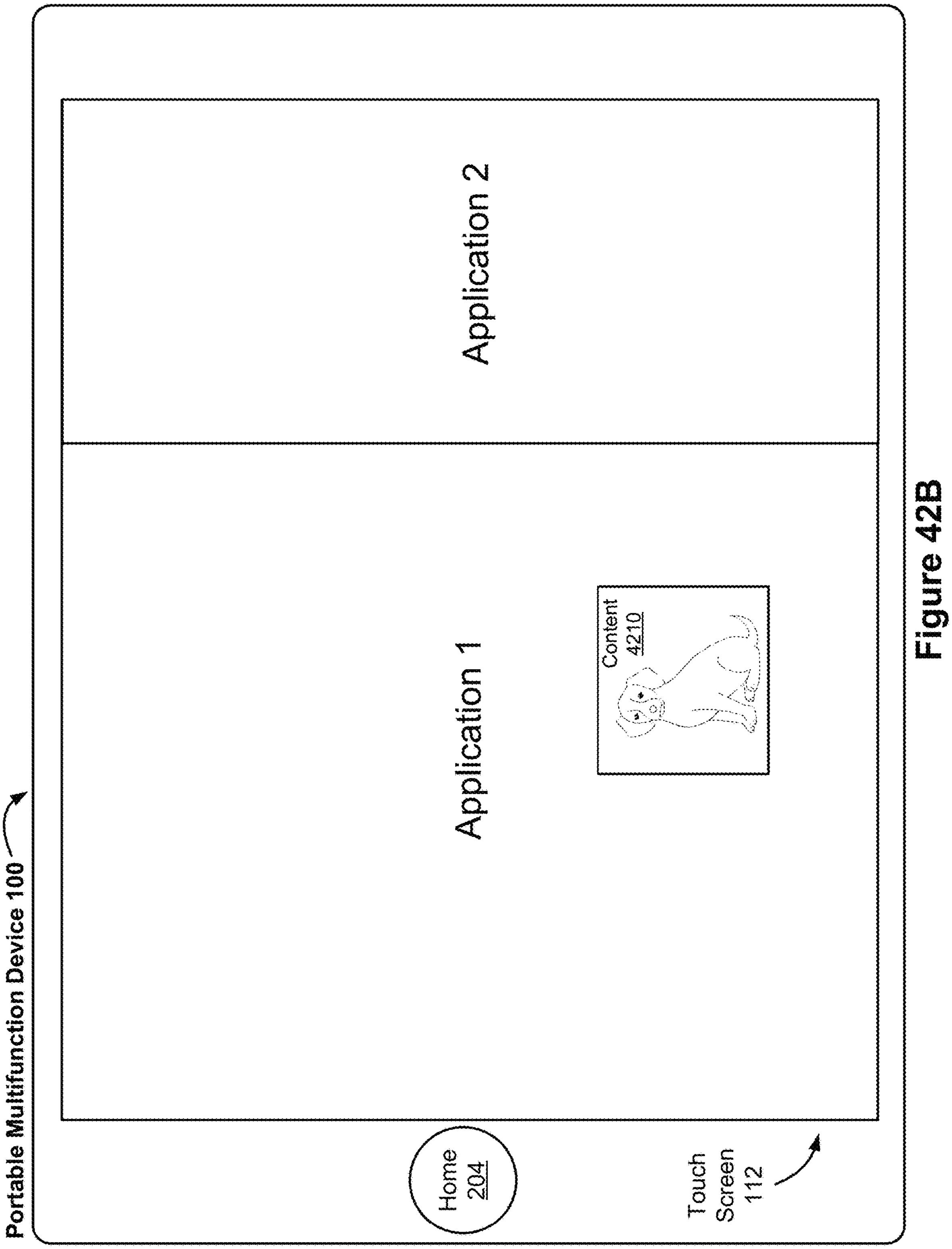

Upon determining that a characteristic of gesture 4220 satisfies a threshold (e.g., velocity, distance travelled, location of liftoff event, etc.), content 4210 is then displayed within application 1 (as pictured in FIG. 42B). In some embodiments, content 4210 is no longer displayed within application 2 (as pictured in FIG. 42B), while in alternative embodiments, content 4210 is displayed within both applications 1 and 2 (e.g., if content 4210 is a photo within image management module 144 (e.g., application 2) and gesture 4220 moves the photo to instant messaging module 141 (e.g., application 1), then the photo is displayed in both the image management module 144 and the instant messaging module 141). In some embodiments a first gesture is used to move content to a new application (e.g., a two-finger gesture dragging content 4210) and a second gesture is used to copy content to a new application (e.g., a one-finger gesture dragging content 4210).

Figure 42C:
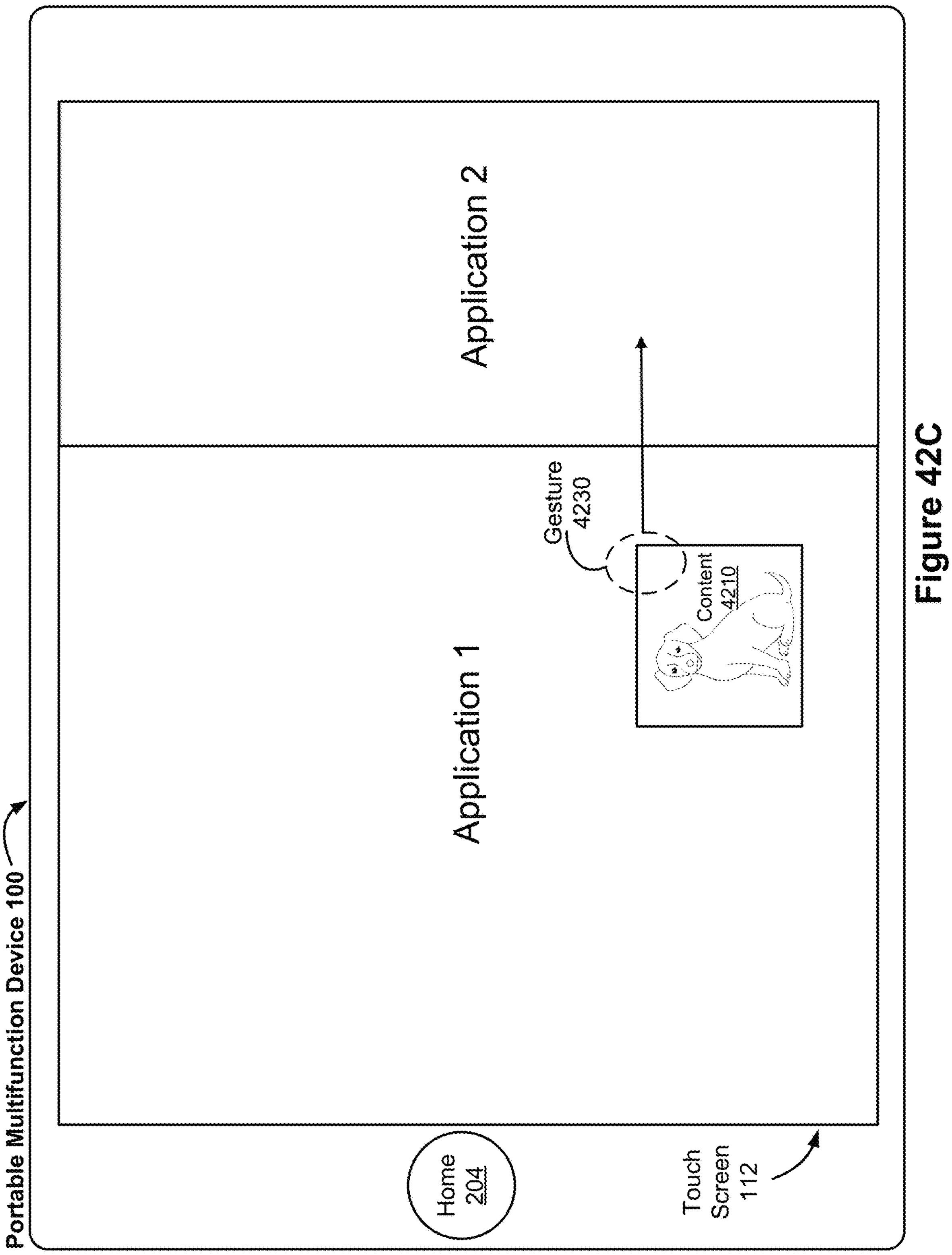

FIG. 42C is a schematic of a touch-sensitive display used to illustrate additional gestures for interacting with content displayed within an application while in a shared screen mode, in accordance with some embodiments. In some embodiments, users are able to drag content from a first application (e.g., a main application or a side application) to within a predetermined distance of an edge (e.g., 2 pixels, 5 pixels, or 7 pixels) of touch screen 112 in order to reveal an application selector, and after revealing the application selector, users are able to drag the content on top of an application-specific affordance displayed in the application selector. For example, gesture 4230 (FIG. 42C), is detected (e.g., by contact/motion module 130) as dragging content 4210 from application 1 and past application 2 towards an edge of touch screen 112 that is horizontally adjacent to application 2. In response to gesture 4230 reaching the edge (or in some embodiments, in response to gesture 4230 satisfying a threshold as described with reference to other similar gestures), an application selector is revealed on the touch-sensitive display (as pictured in FIG. 42D).

In some embodiments, the displayed application selector contains a filtered list of application-specific affordances. For example, if content 4210 is an image, then the list of applications associated with the application selector is filtered to display only those applications capable of accepting (e.g., displaying, processing, or sending) images. For example, applications such as a weather widget 149-1 or calculator widget 149-3 would be filtered out of the list, in accordance with some embodiments. In some embodiments, the application selector is filtered before displaying the application selector with the plurality of affordances. In some embodiments, the application selector is filtered when the determination is made that that gesture is within the predetermined distance of the edge of the touch-sensitive display.

In some embodiments, while still continuing gesture 4230 (e.g., a liftoff event has not yet occurred), a user is able to drag content 4210 on top of (or substantially on top of) one of the application-specific affordances within application selector 182. As pictured in FIG. 42D, gesture 4230 is completed when gesture 4230 drags content 4210 on top of the affordance for application 4 and a liftoff event is detected corresponding to gesture 4230. In response to detecting completion of gesture 4230, application 4 is displayed in a portion of touch screen 112 previously occupied by application 2 and content 4210 is also displayed within application 4 (as pictured in FIG. 42E).

Figure 42D:
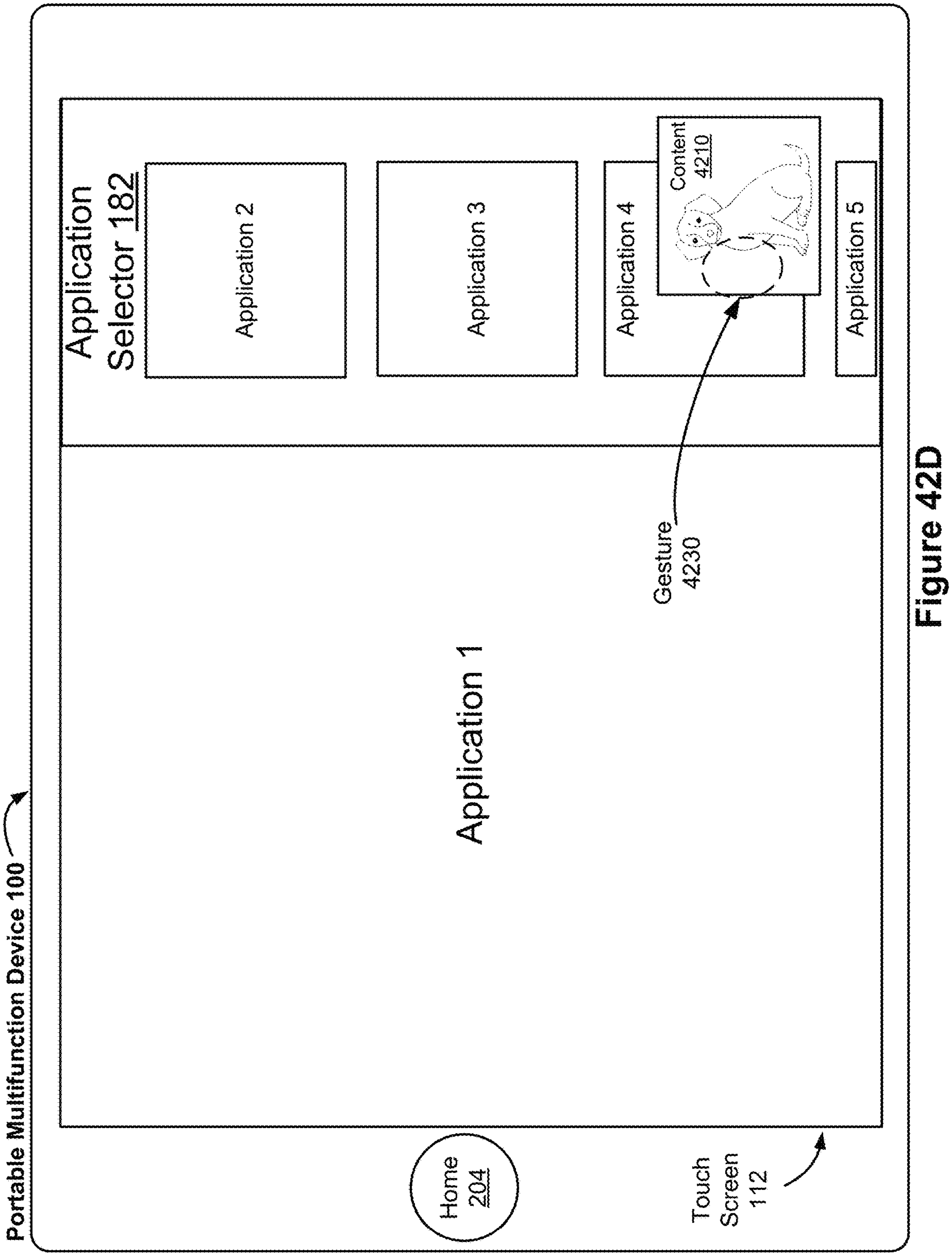
Figure 42E:
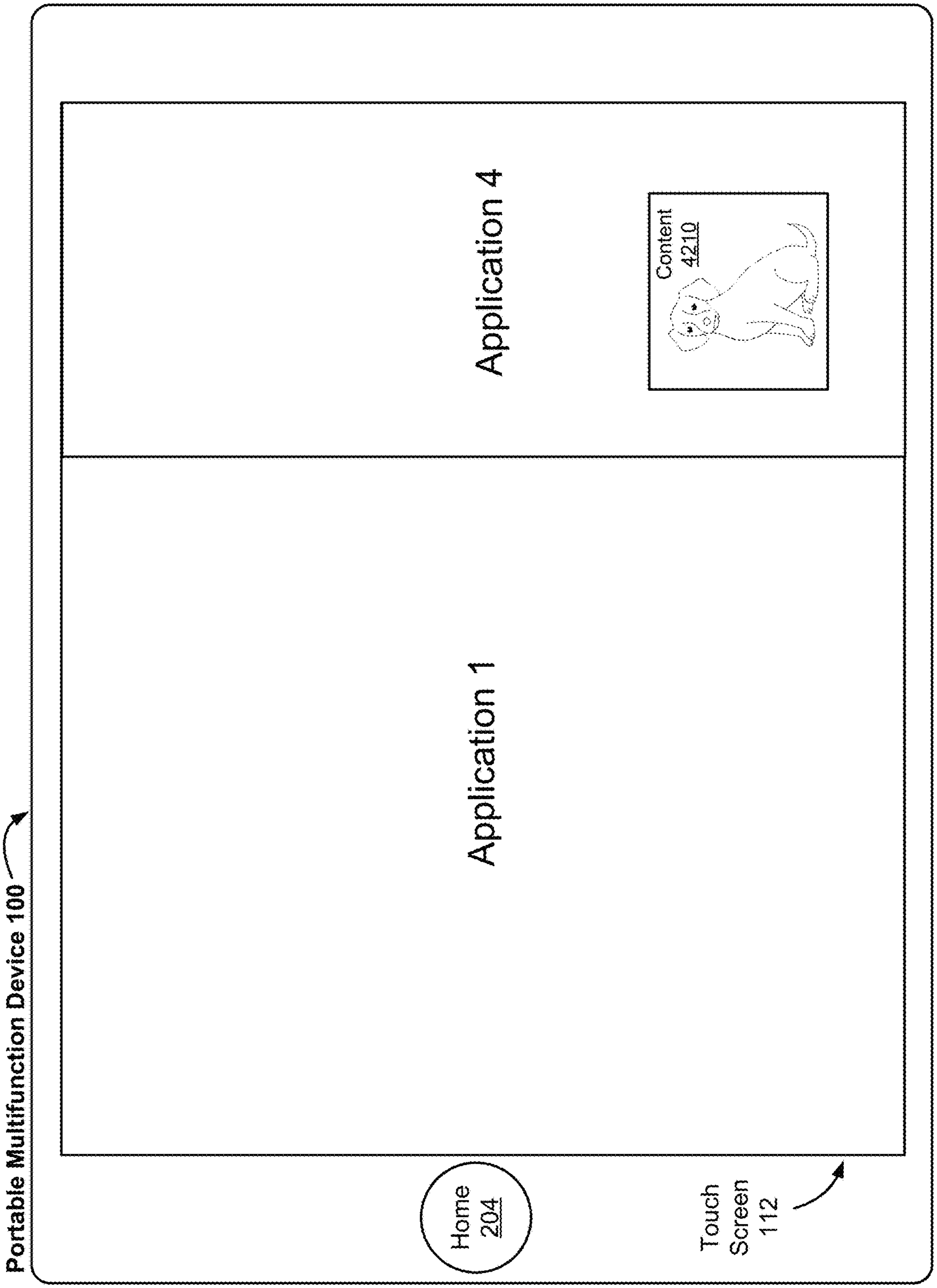

In some embodiments, a gesture similar to gesture 4230 can be utilized to drag content from a side application (e.g., application 2 of FIG. 42A) towards an edge of touch screen 112, in order to reveal a filtered list of affordances within application selector 182 and then drop the dragged content on top of one of the affordances (resulting in a display similar to that pictured in FIG. 42E).

Figure 43A:
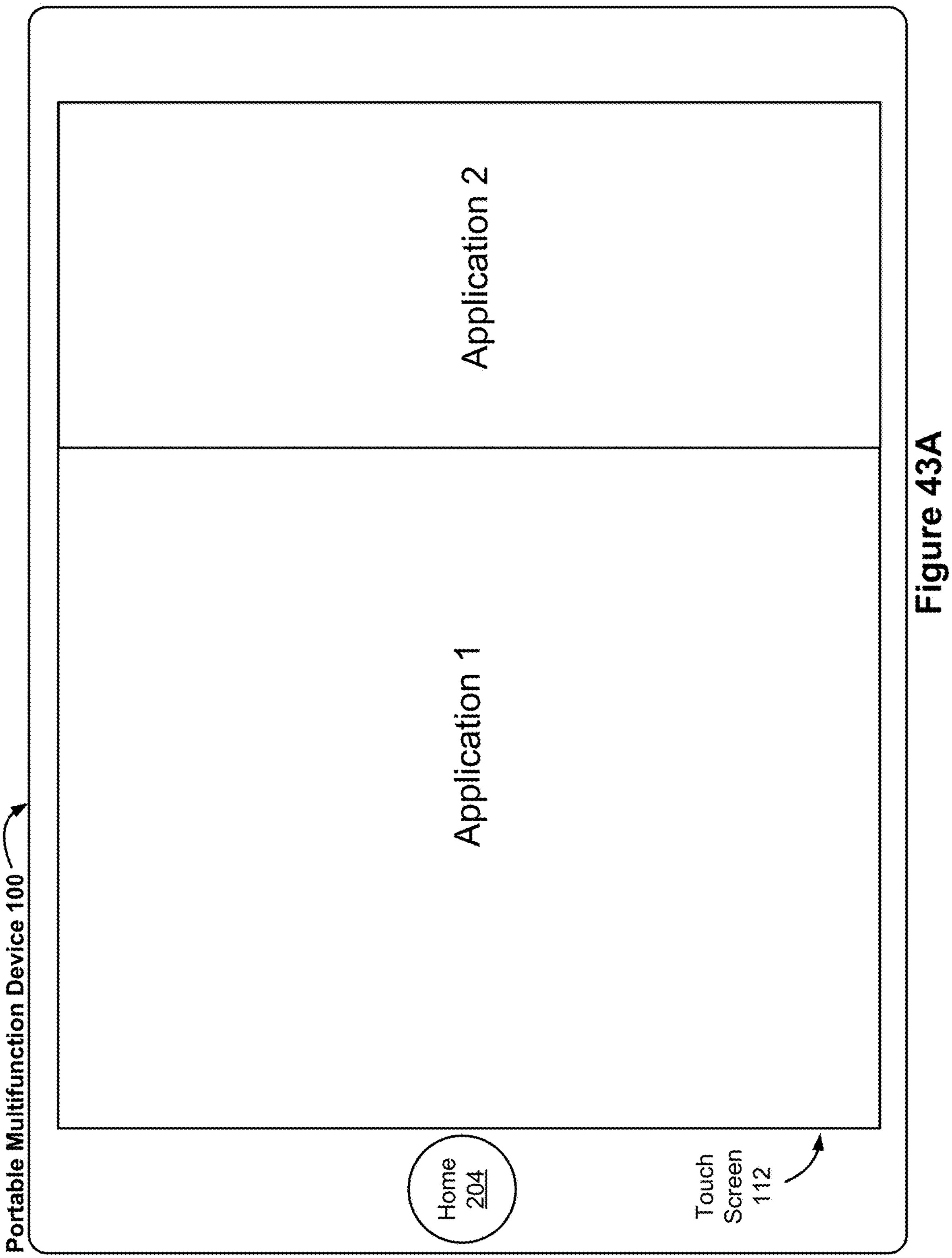
FIGS. 43A-45C are schematics of a touch-sensitive display used to illustrate stateful behavior of a side application, in accordance with some embodiments.
Figure 43B:
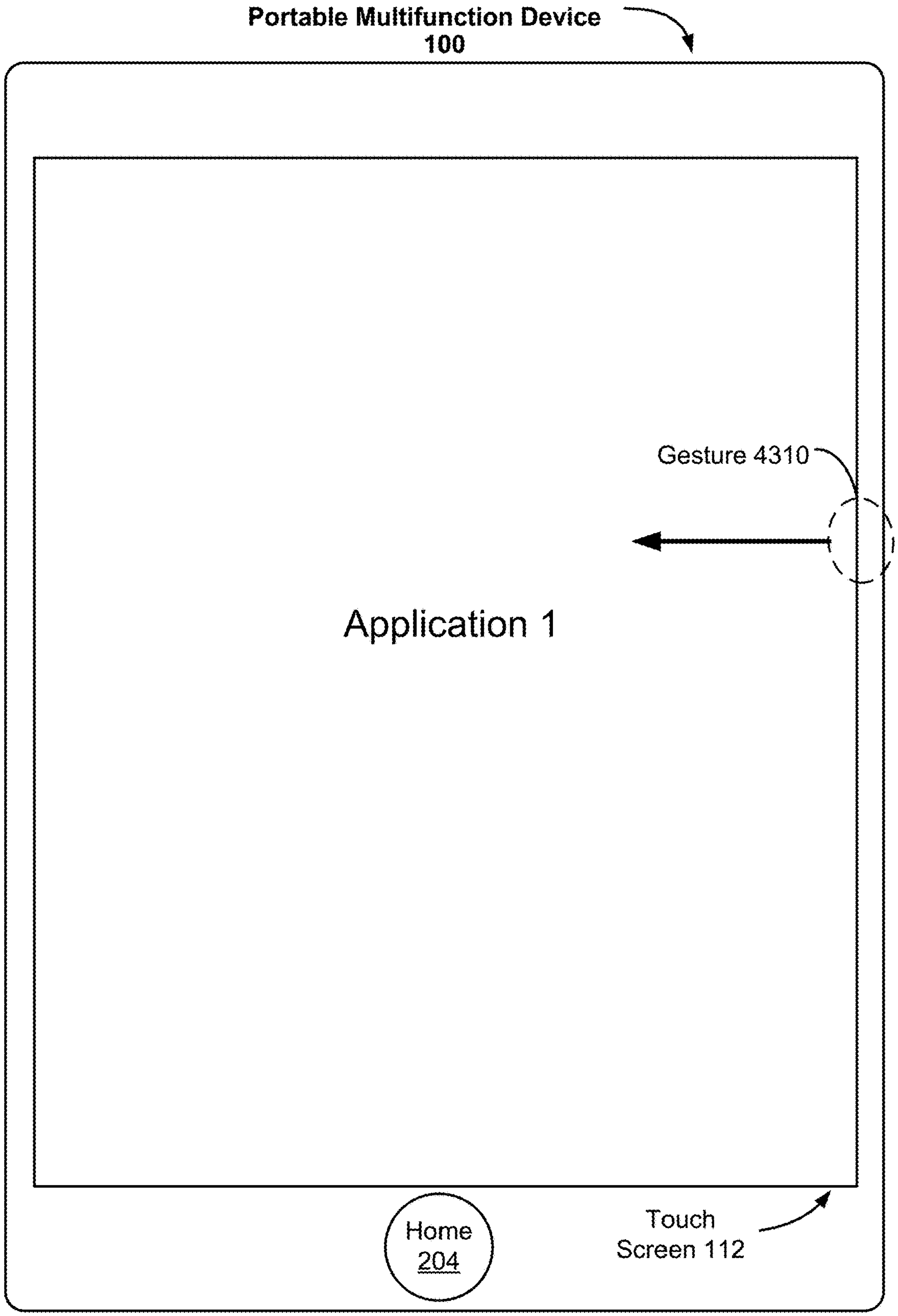
Figure 43C:
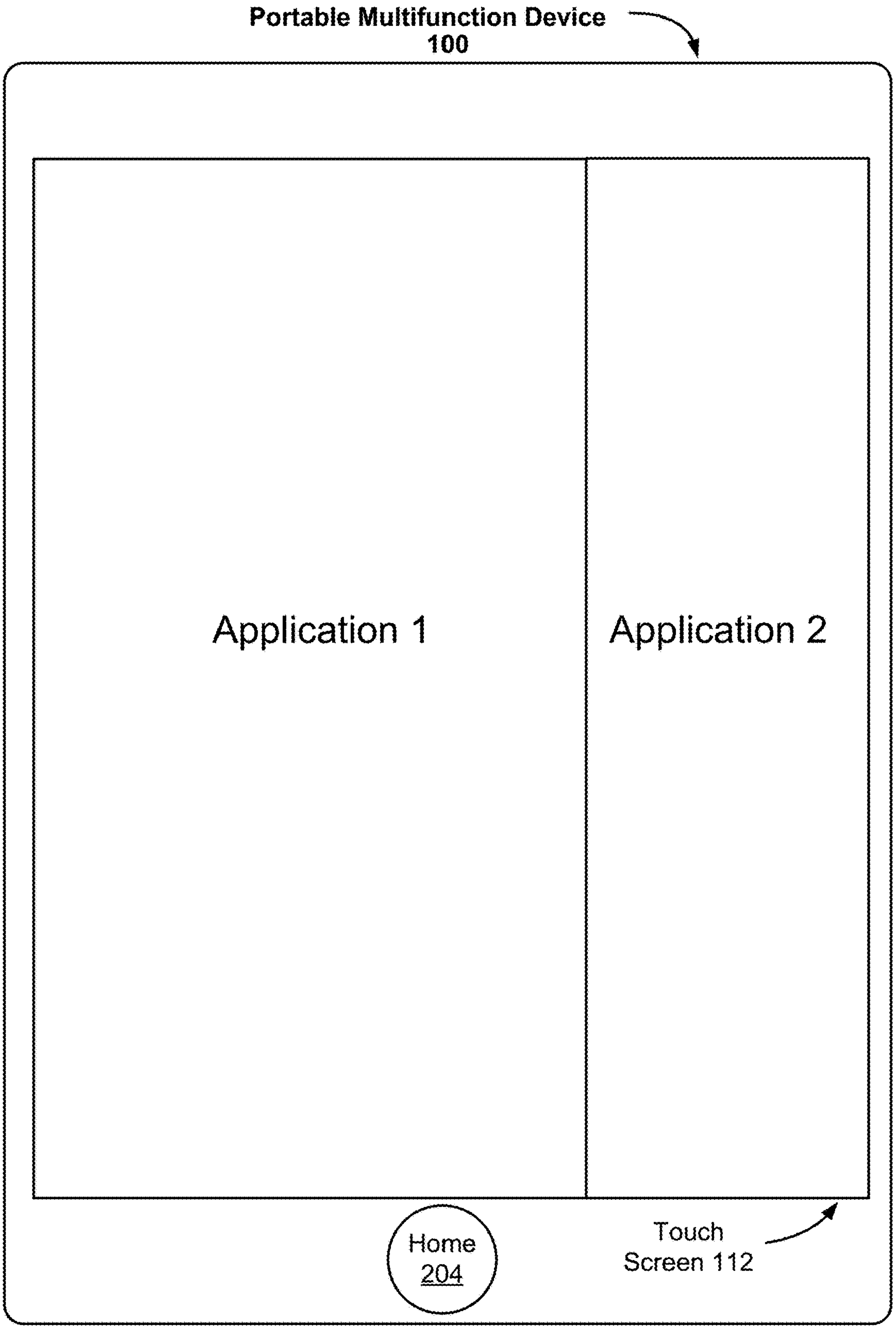

In some embodiments, in order to further enhance and improve user experience in a multitasking mode, side applications remain stateful in numerous scenarios. FIGS. 43A-45C are schematics of a touch-sensitive display used to illustrate stateful behavior of a side application, in accordance with some embodiments. More specifically, FIGS. 43A-43C are schematics of a touch-sensitive display used to illustrate stateful behavior of a side application when switching from landscape to portrait orientations/views, in accordance with some embodiments.

FIG. 43A is a schematic of a touch-sensitive display used to illustrate a multitasking view (also referred to as shared screen view, shared screen mode, multitasking mode, multitask mode, etc.) of concurrently displayed applications 1 and 2, with application 2 already pinned (pinning is discussed in more detail above in reference to FIGS. 41A-41E) and portable multifunction device 100 orientated in landscape view.

In some embodiments, a user is able to rotate portable multifunction device 100 (e.g., a user rotates the device while facing the display screen), in order to automatically switch portable multifunction device 100 from a landscape view to a portrait view (i.e., rotating device 100 results in a change in the orientation of device 100). In some embodiments, device/global internal state 157 (FIG. 1A) stores orientation information for device 100. FIG. 43B is a schematic of a touch-sensitive display used to illustrate a portrait display mode for portable multifunction device 100, in accordance with some embodiments. As illustrated in FIG. 43B, switching to portrait display mode dismisses the side application (e.g., application 2, FIG. 43A) from touch screen 112 (e.g., application 1 is displayed in full-screen mode and application 2 is no longer displayed). In some embodiments, in order to activate a shared screen mode again, a gesture (e.g., gesture 4310) is utilized. For example, gesture 4310 is initiated by dragging an edge of touch screen 112 in a substantially horizontal direction towards an opposite edge of touch screen 112. In some embodiments, gesture 4310 is the same as gesture 3325 (FIGS. 33B-33C) discussed above. After completing gesture 4310 (e.g., detecting a liftoff event associated with the gesture, such as a user lifting their finger off of the surface of touch screen 112), touch screen 112 is updated to display previously-dismissed application 2, as pictured in FIG. 43C (previously-dismissed application, in some embodiments, remains stateful and thus occupies a proportional area of touch screen 112, e.g., ⅓ of the display area of touch screen 112 based on the stored state information contained in application internal state 192 and/or multitasking data 176).

Figure 44A:
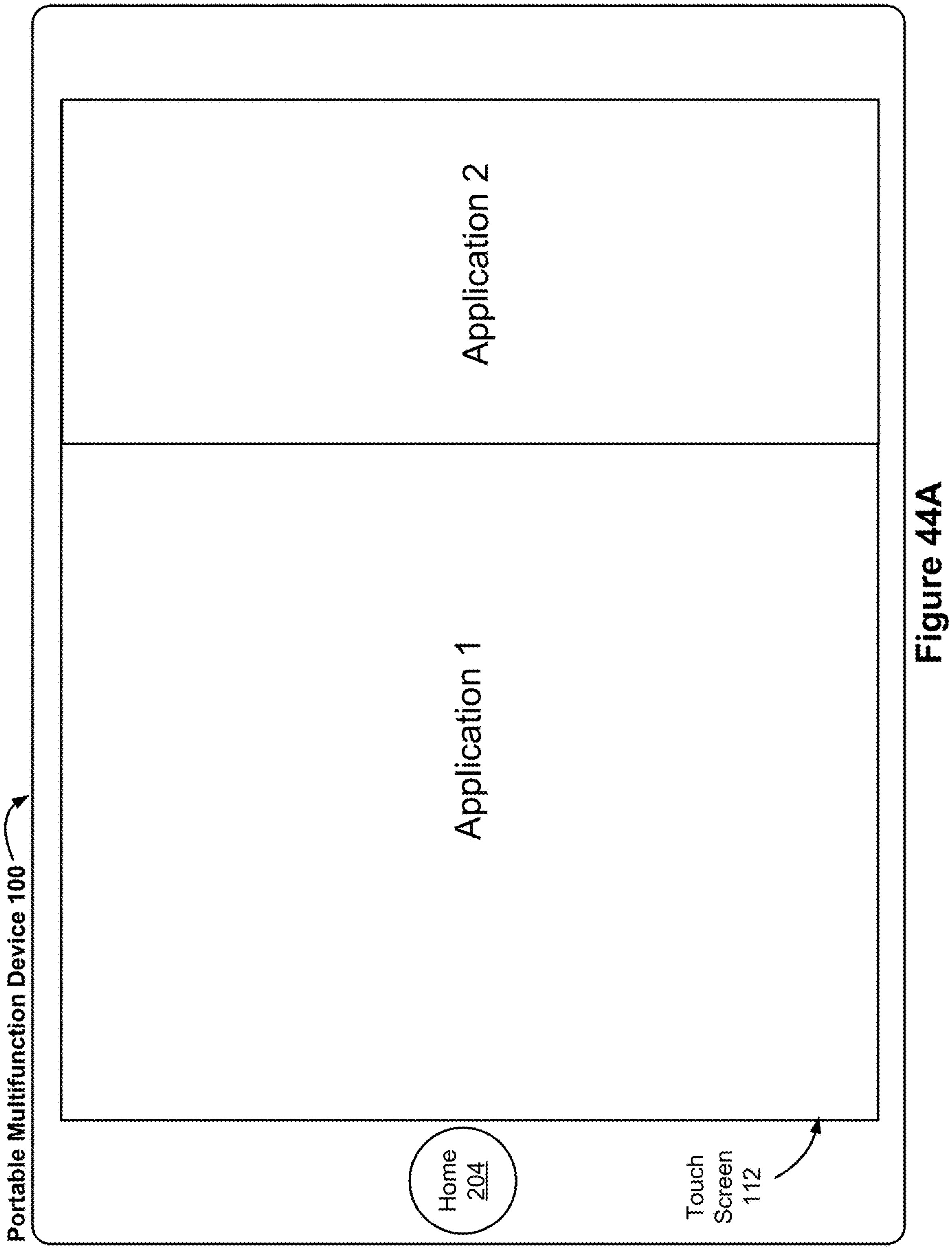
Figure 44B:
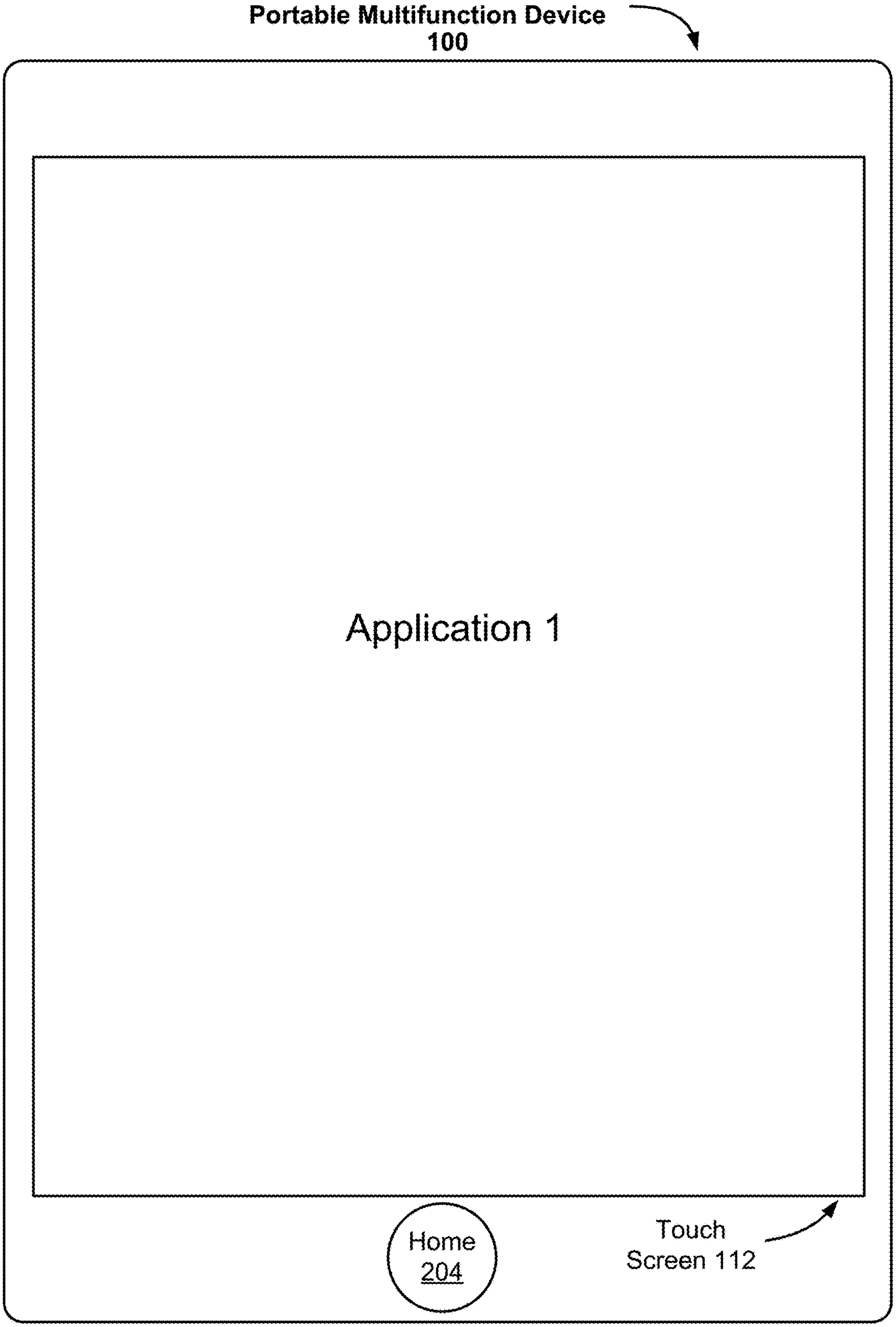
Figure 44C:
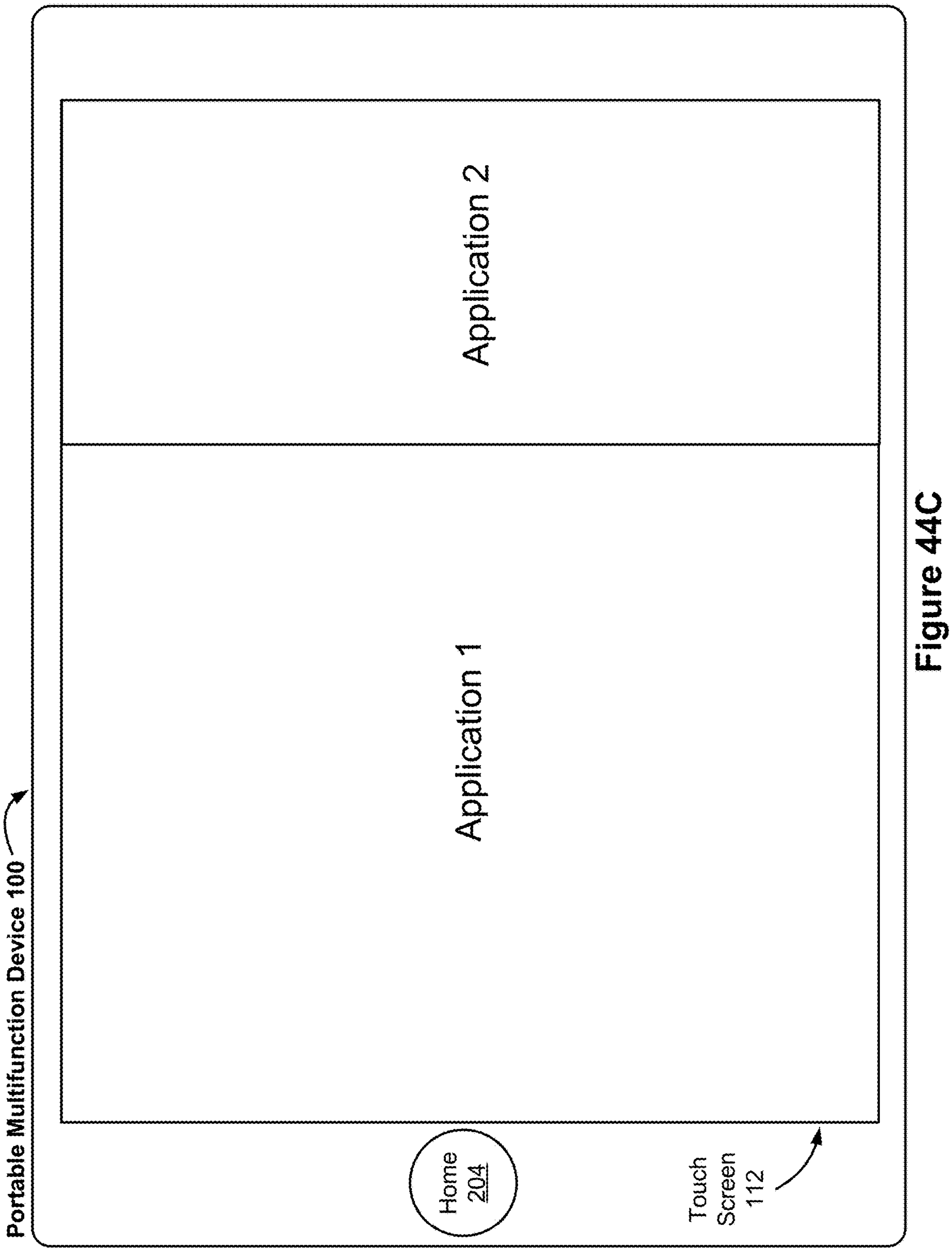

Continuing the preceding discussion of some embodiments exhibiting stateful side application behavior, FIGS. 44A-44C are schematics of a touch-sensitive display used to illustrate stateful behavior of a side application when switching from landscape view to portrait view and then back to landscape view, in accordance with some embodiments. FIG. 44A is a schematic of a touch-sensitive display used to illustrate a shared screen mode of device 100 operating in landscape view mode with concurrently displayed applications 1 and 2, in accordance with some embodiments. After rotating device 100 to trigger a portrait view (e.g., device/global internal state 157 is updated to portrait view), FIG. 44B illustrates device 100 in the portrait view with touch screen 112 displaying only application 1 (discussed in more detail above with respect to FIGS. 43A-43C).

After rotating device 100 again to activate a landscape view, FIG. 44C illustrates that the shared screen view of concurrently displayed applications 1 and 2 is revealed. The revealed shared screen view of FIG. 44C is, in some embodiments, identical to the shared screen view of FIG. 44A (e.g., the positioning and relative sizes of applications 1 and 2 are identical but, items and or content displayed within applications 1 and/or may have changed if data has been updated during the process of rotating device 100 between orientations).

Figure 45A:
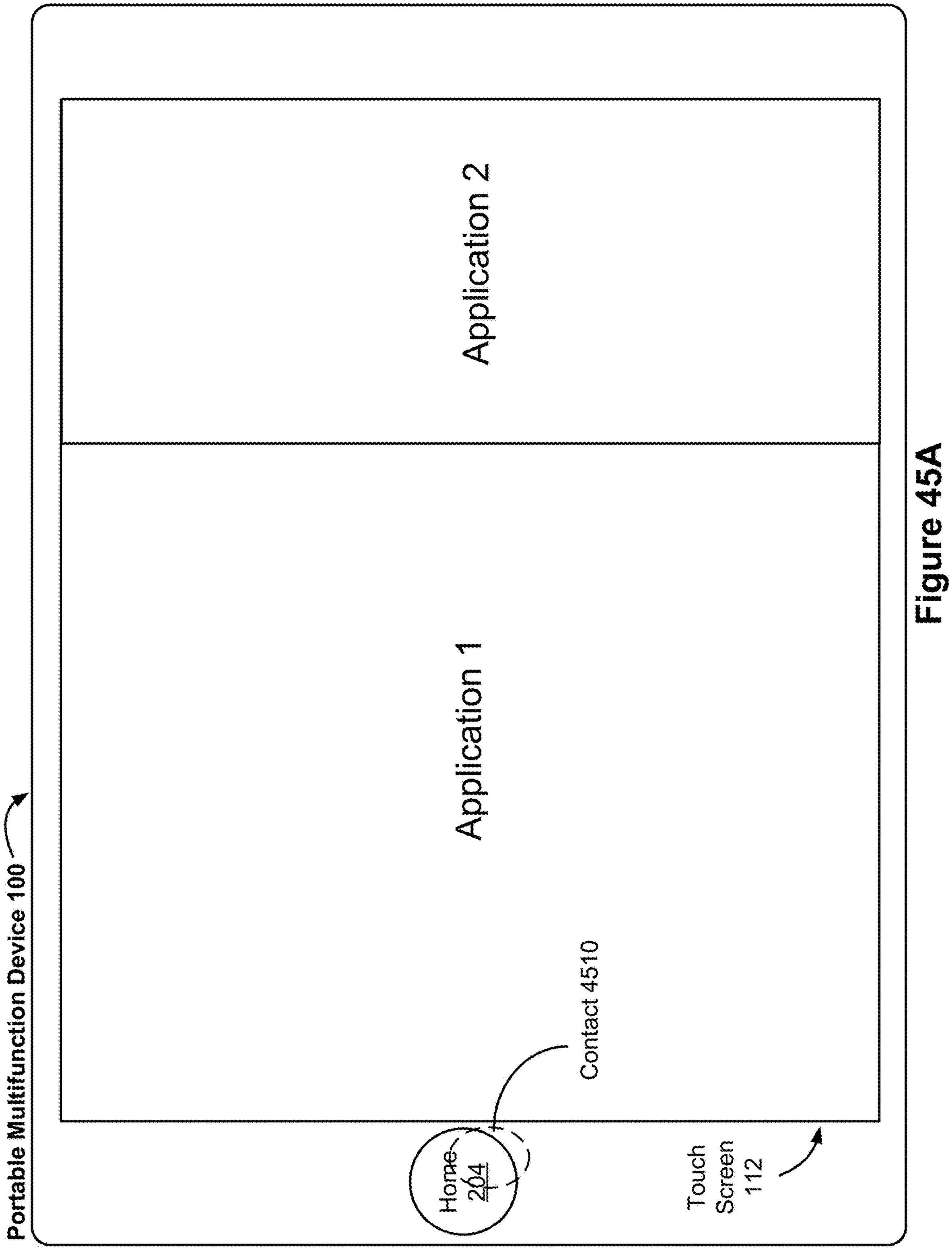
Figure 45B:
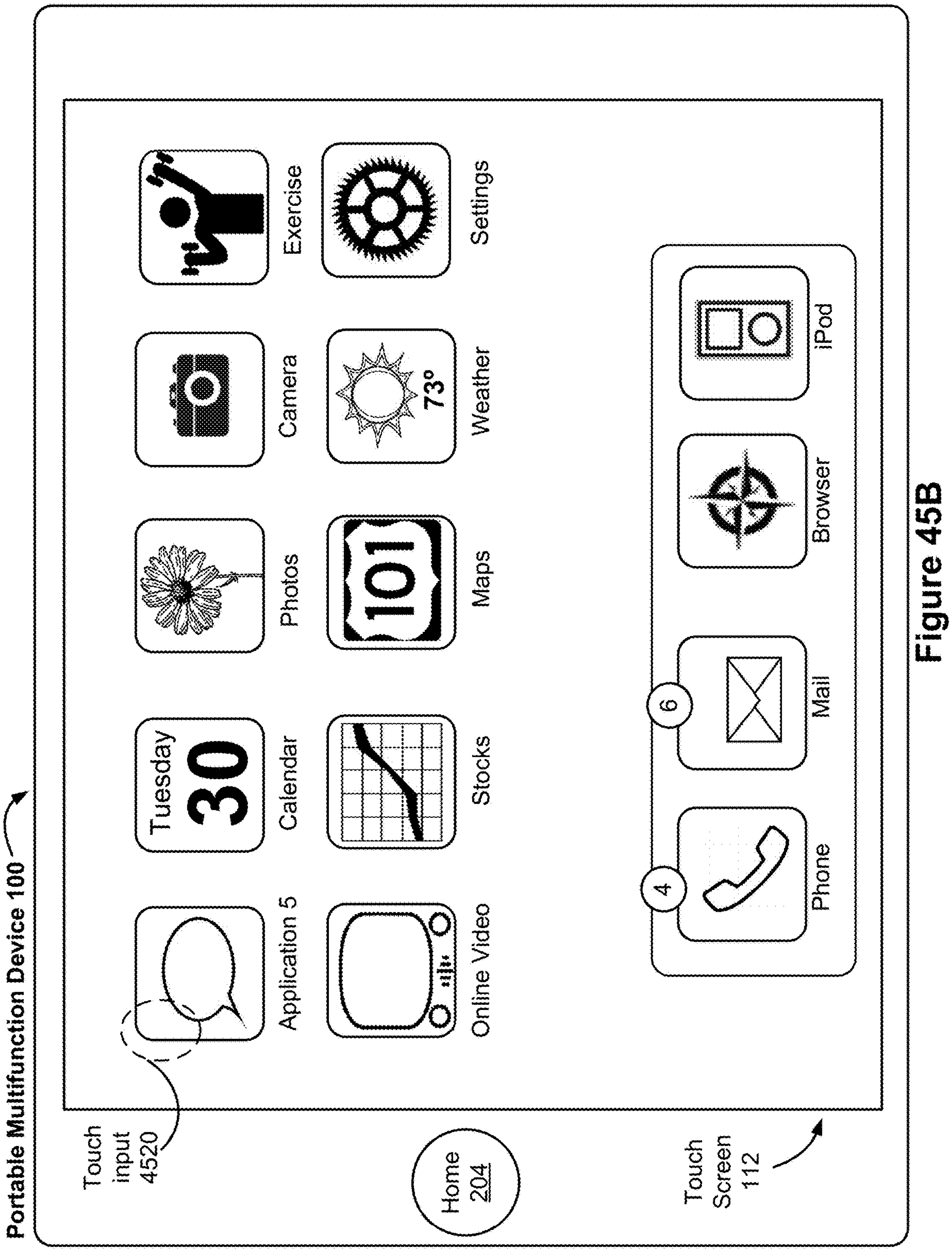
Figure 45C:
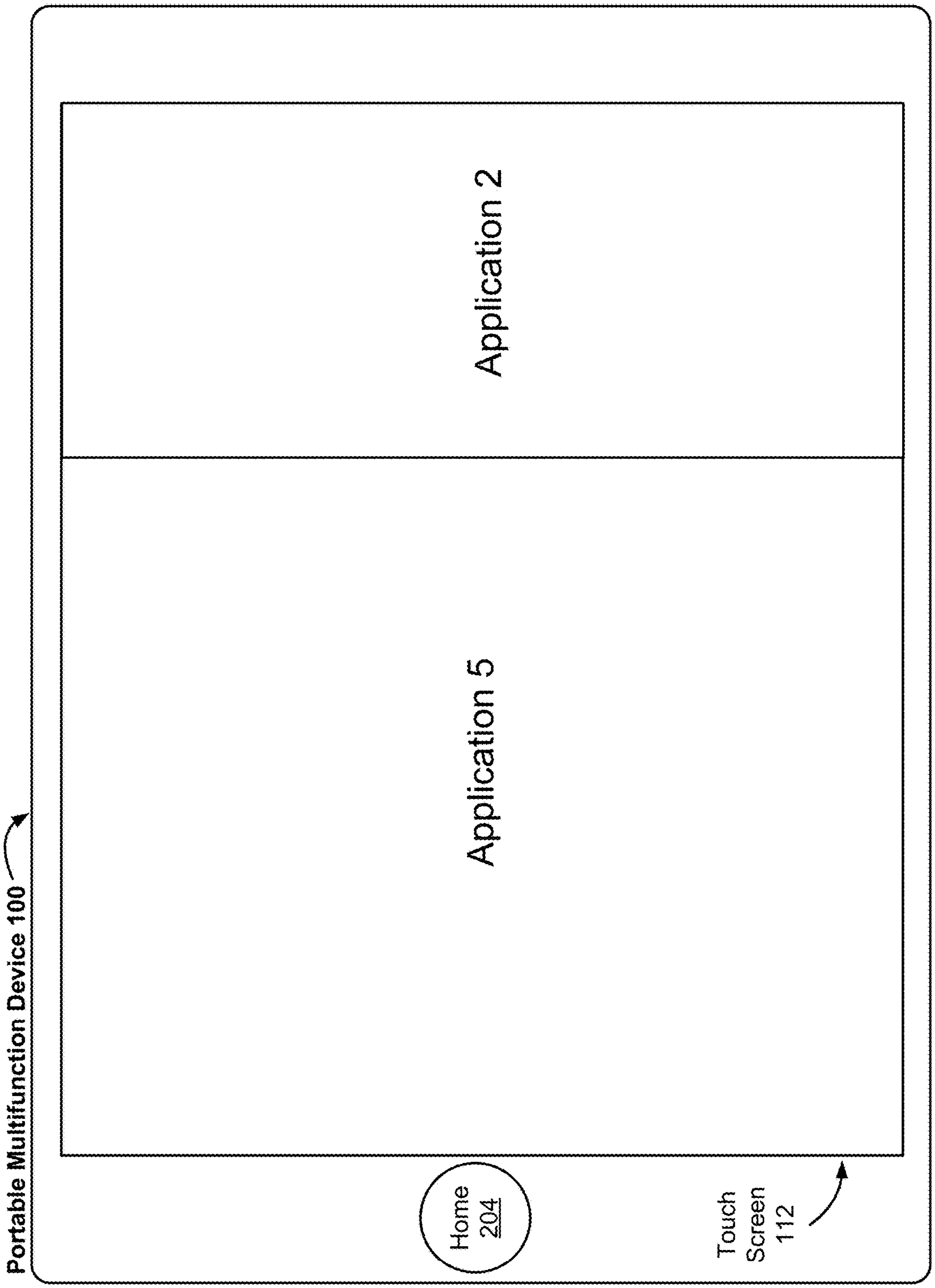

Concluding the above discussion of some embodiments exhibiting stateful side application behavior, FIGS. 45A-45C are schematics of a touch-sensitive display used to illustrate stateful behavior of a side application when navigating between a shared screen display mode and a home screen of device 100 (e.g., springboard of APPLE's iOS). FIG. 45A shows a shared screen view of concurrently displayed applications 1 and 2, in accordance with some embodiments. Additionally, FIG. 45A shows a gesture (e.g., contact 4510 which may include a single tap or an extended press) at the home button of device 100 (in some embodiments, contact 4510 may be at any other hardware button of device 100).

In response to the gesture at the home button of device 100, touch screen 112 ceases to display the shared screen view and instead displays a home screen associated with device 100, as pictured in FIG. 45B. While displaying the home screen, a touch input (e.g., touch input 4520 at an affordance corresponding to application 5) is detected by contact/motion module 130 (or some other component of device 100, e.g., event handler 177).

In response to touch input 4520 at an affordance corresponding to application 5, the shared screen view is again activated with concurrently displayed applications 5 and 2 (as pictured in FIG. 45C). In this way, a user of device 100 is able to launch new applications from the home screen and automatically activate a shared screen view with a stateful side application. In these embodiments, application 5 replaces application 1 as the main application and application 2 remains as the side application. In other embodiments, application 5 may instead replace application 2 as the side application, while application 1 remains as the main application. In some embodiments, the default behavior (e.g., whether the newly launched application becomes a main or a side application) is configured by a user of device 100. In other embodiments, the exemplary embodiments of FIGS. 45A-45C represent the default behavior.

FIGS. 46A-47C are schematics of a touch-sensitive display used to illustrate gestures for interacting with a notification while in a shared screen mode, in accordance with some embodiments. In some embodiments, a notification can be dragged into a portion of a shared screen corresponding to a main application or a side application and, thereafter, the application associated with the notification is displayed instead of the side or main application. As pictured in FIG. 46A, a shared screen view of concurrently displayed applications 1 and 2 is active and a notification from application 3 overlays the concurrent display. In some embodiments, the notification opaquely overlays (e.g., content within applications 1 and 2 is not visible beneath the notification), while in other embodiments, the notification semi-transparently overlays (e.g., content within applications 1 and 2 is partially visible beneath content displayed within the notification).

Figure 46A:
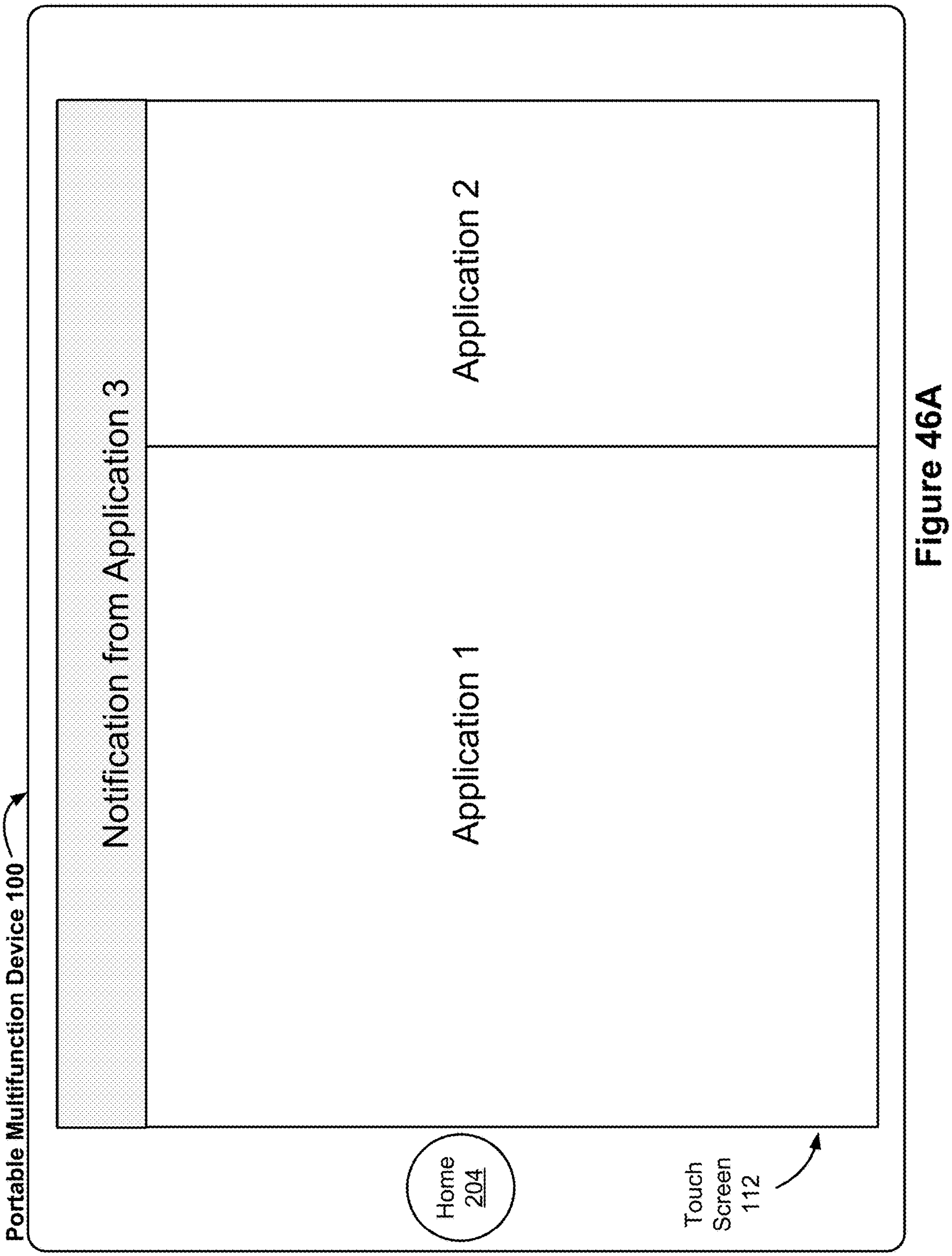
FIGS. 46A-47C are schematics of a touch-sensitive display used to illustrate gestures for interacting with a notification while in a shared screen mode, in accordance with some embodiments.
Figure 46B:
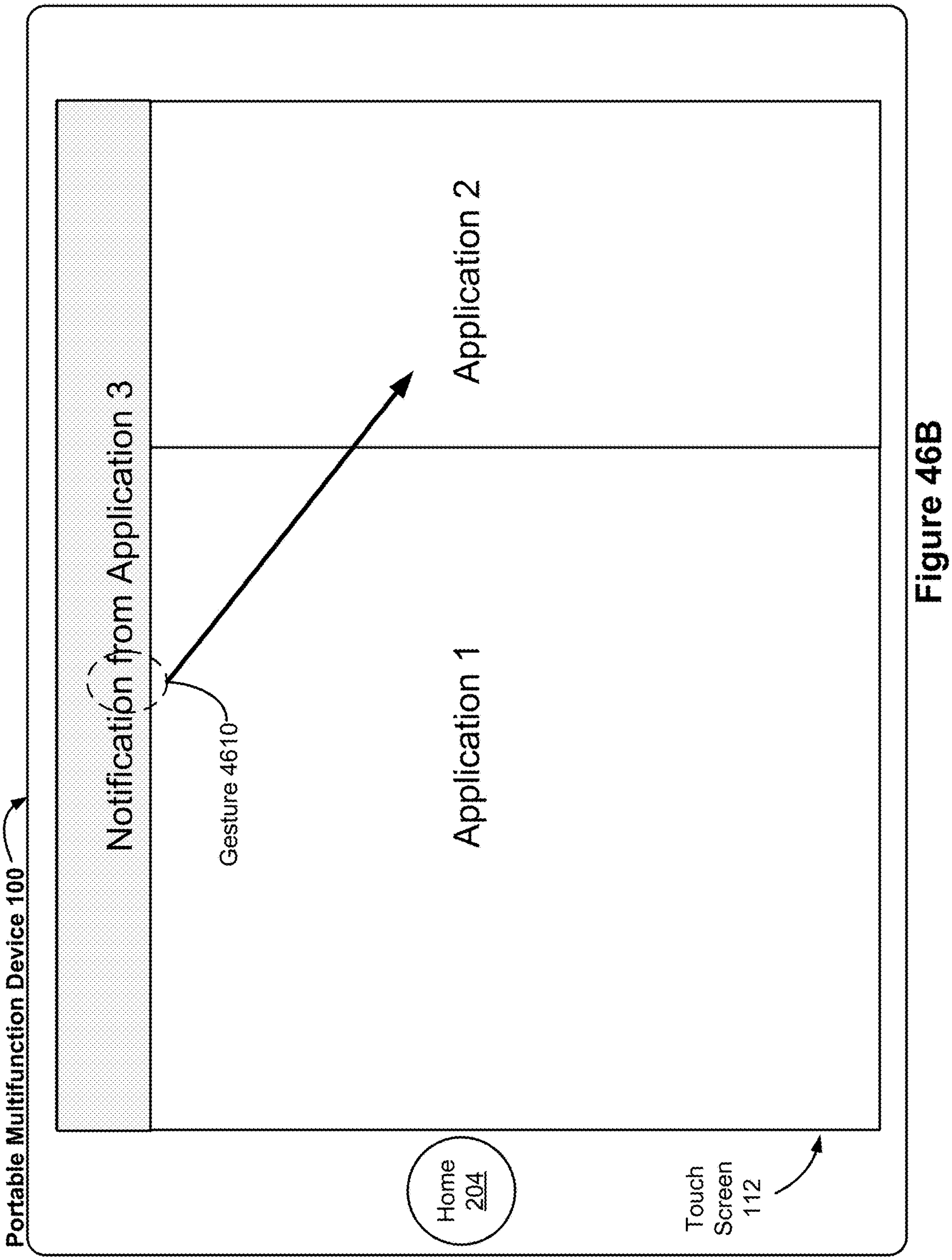
Figure 46C:
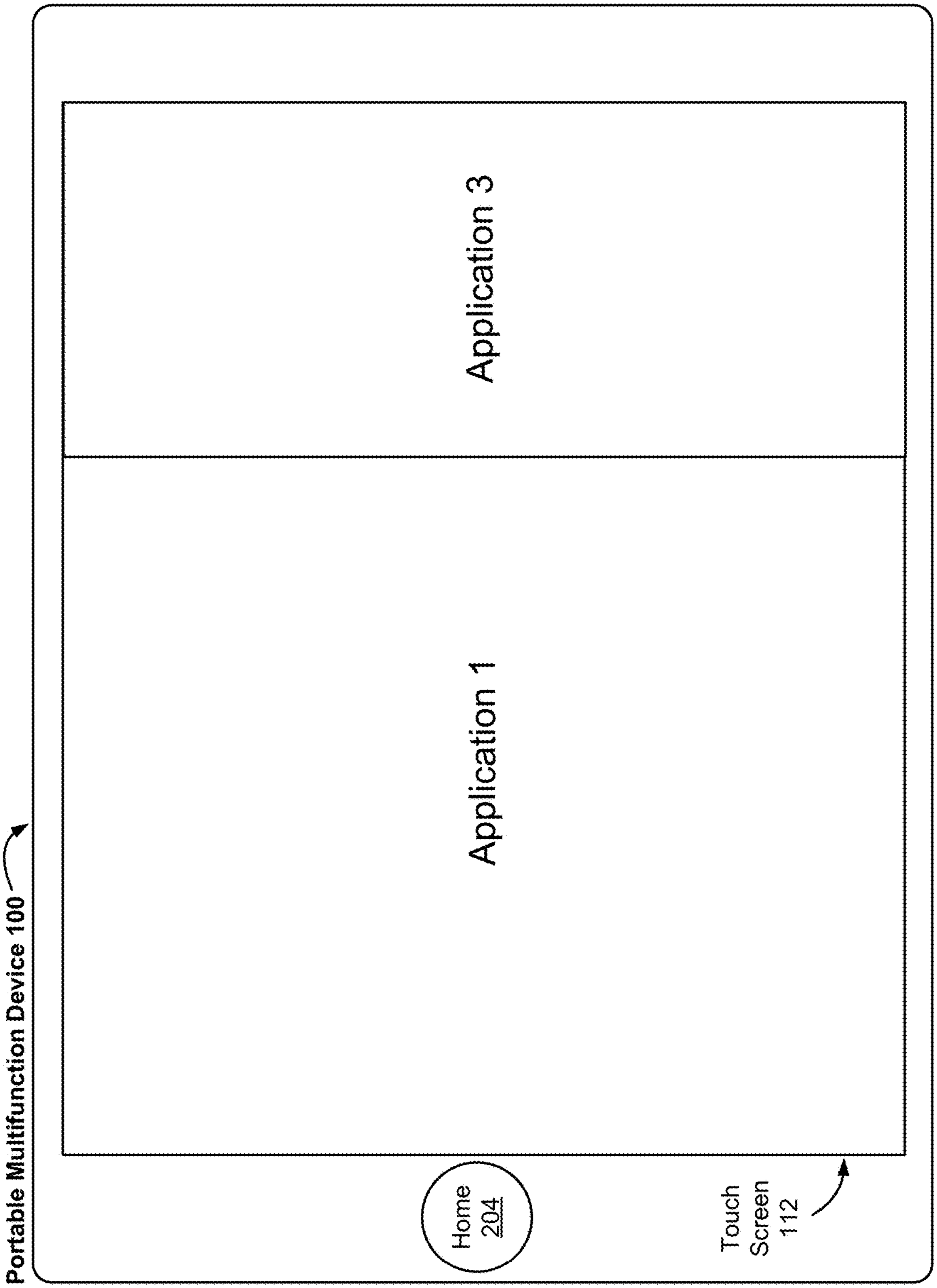

FIG. 46B is a schematic of a touch-sensitive display used to illustrate a gesture for promoting an application associated with a displayed notification to be the side application in a shared screen view, in accordance with some embodiments. For example, gesture 4610 is detected at (e.g., on top of, within, or substantially within, etc.) a displayed notification (e.g., the displayed notification from application 3) and gesture 4610 is detected as moving (e.g., by contact/motion module 130) in a direction towards (and, in other embodiments, over) application 2 (the currently displayed side application in the shared screen view). After detecting a liftoff event corresponding to gesture 4610 (e.g., a finger used to initiate the gesture no longer contacts touch screen 112), then application 2 is no longer displayed in the shared screen view and application 3 is instead displayed (as pictured in FIG. 46C). In some embodiments, in order to replace application 2 with application 3 as the side application, gesture 4610 first satisfies a threshold (e.g., travels a certain distance, possesses a certain velocity, or reaches a certain area of touch screen 112 (e.g., the portion of touch screen 112 occupied by application 2)).

Similar to FIGS. 46A-46C, FIGS. 47A-47C are schematics of a touch-sensitive display used to illustrate a gesture for interacting with a notification while in a shared screen mode, in accordance with some embodiments. In contrast to FIGS. 46A-46C, FIGS. 47A-47C illustrate a gesture for promoting an application associated with a notification to be the main application (i.e., not the side application).

Figure 47A:
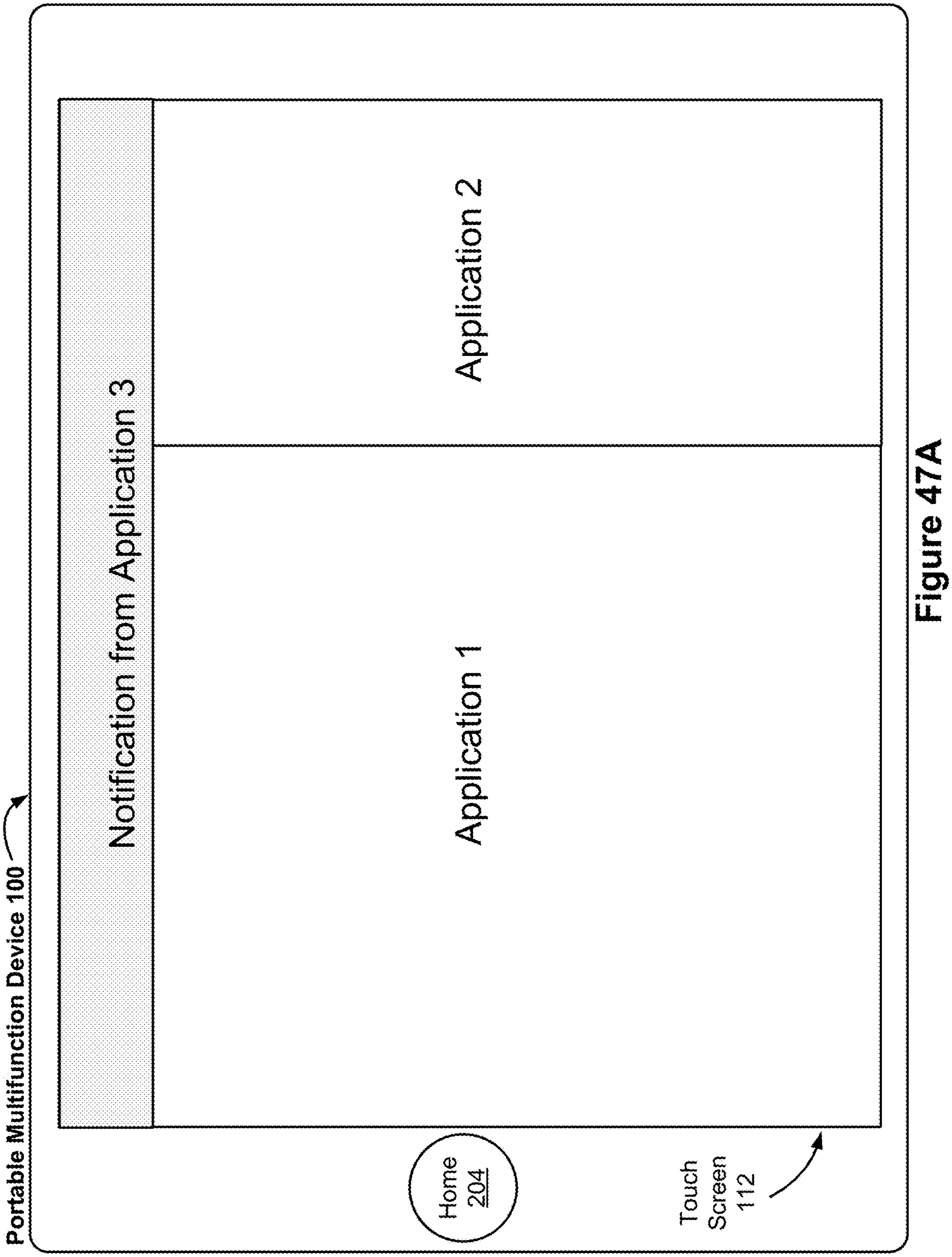
Figure 47B:
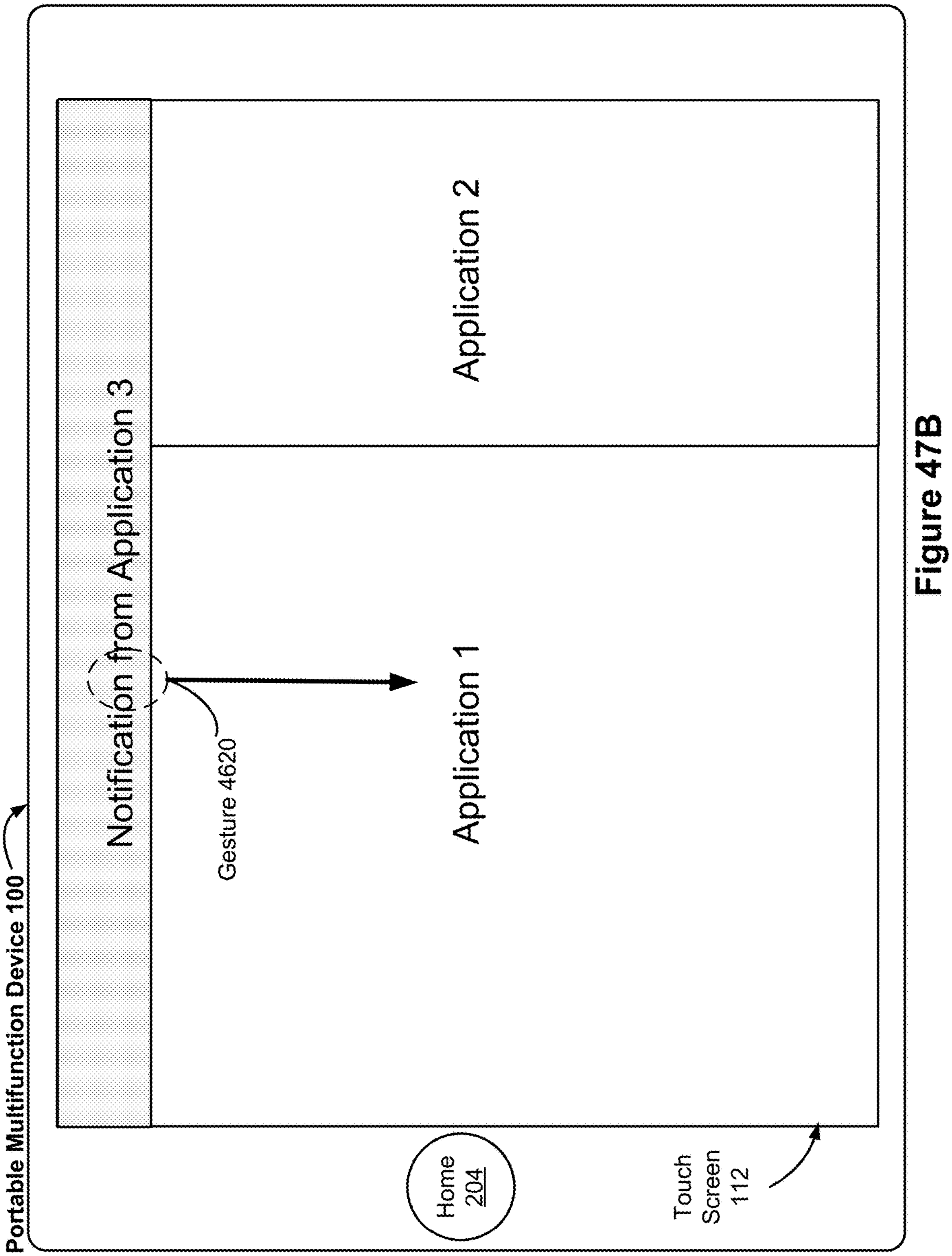
Figure 47C:
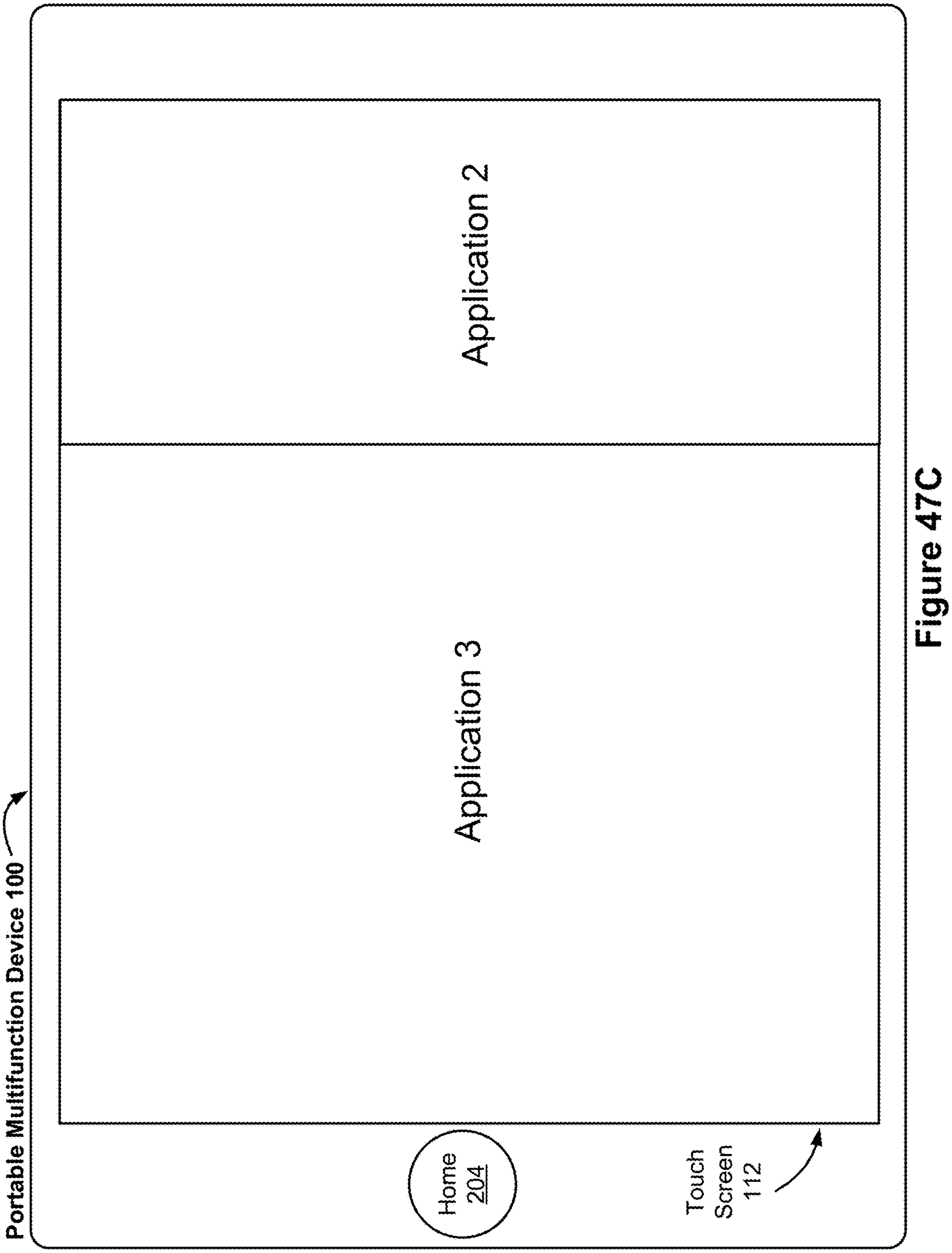

Similar to FIG. 46A, FIG. 47A is a schematic of a touch-sensitive display used to illustrate a notification from application 3 overlaying a concurrent display (i.e., a shared screen view) of applications 1 and 2, in accordance with some embodiments. As pictured in FIG. 47B, gesture 4620 is detected as contacting the displayed notification from application 3 and, in response to movement of gesture 4620 towards application 1 and a liftoff event associated with gesture 4620, application 3 is promoted to be the main application (as pictured in FIG. 47C). In some embodiments, the notification is animated as following the movement of gesture 4620 on touch screen 112, in order to provide users with a visual indication that the notification can be dragged and then dropped at a different location. In some embodiments (as discussed above), gesture 4620 satisfies a threshold (e.g., velocity, distance travelled, location of liftoff event) before application 3 replaces application 1 as the main application.

Figure 48A:
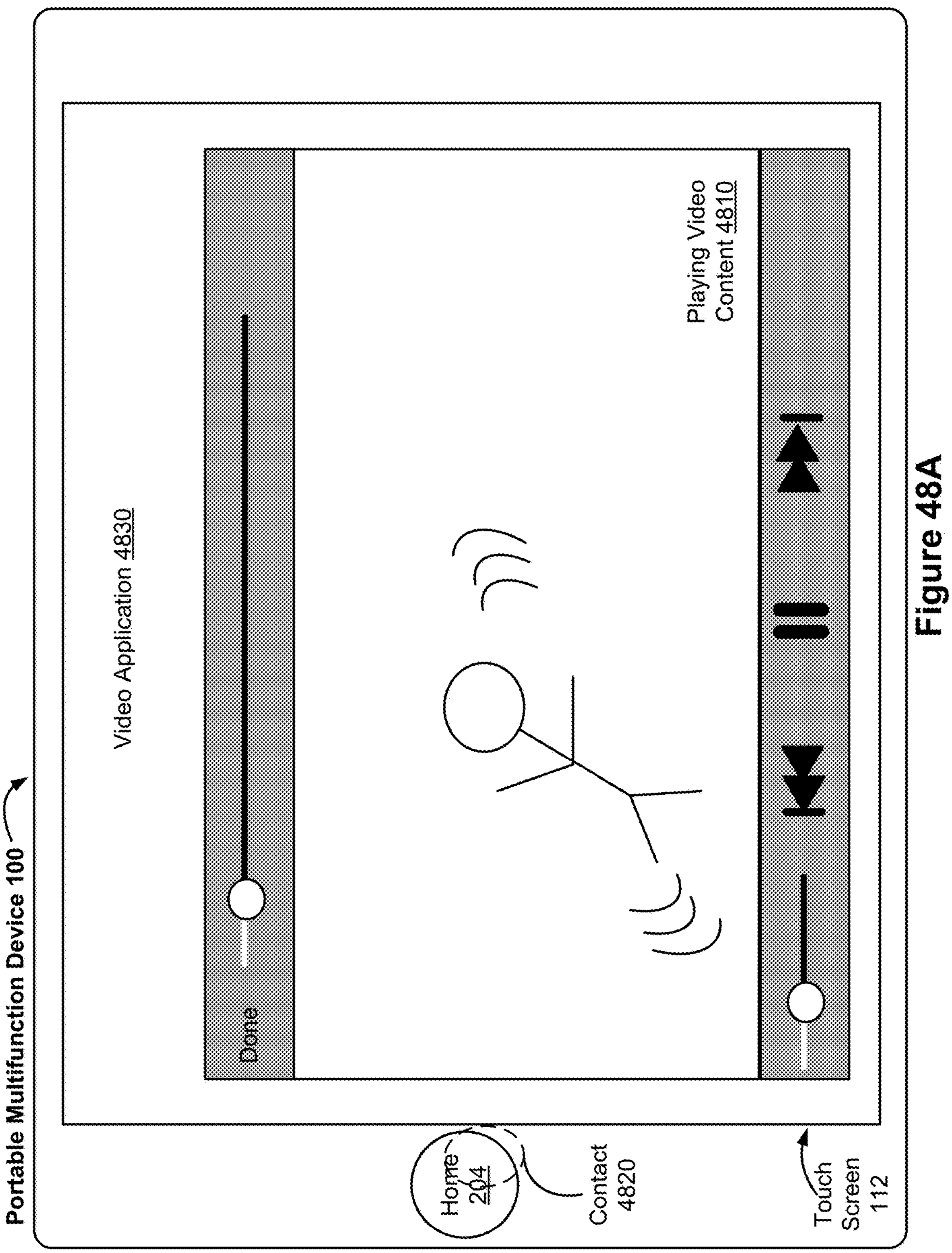
FIGS. 48A-52D are schematics of a touch-sensitive display used to illustrate gestures related to a picture-in-picture display mode, in accordance with some embodiments.

FIGS. 48A-52D are schematics used to illustrate additional gestures related to picture-in-picture display modes, in accordance with some embodiments. FIG. 48A illustrates a full-screen mode/view of an application (e.g., video application 4830, which, in some embodiments, is the same as video & music player module 152 of device 100, FIG. 1A) that is currently playing video content (e.g., playing video content 4810). In some embodiments playing video content 4810 includes live video content, such as a live stream, a video chat window (e.g., FACETIME from APPLE Inc. or video conference module 139), or any other content that is compatible with the picture-in-picture display mode. In some embodiments, content other than video content is also compatible with the picture-in-picture display mode, such as a voice memo application, a maps application (e.g., map module 154), a phone application (e.g., telephone module 138), a music application (e.g., music player module 152), or any other application 136 described above in reference to FIG. 1A that is compatible with a picture-in-picture display mode. In some embodiments, a full-screen mode displays video content as occupying substantially all of a touch-sensitive display (e.g., only the video content and, optionally, a status bar are visible on the touch-sensitive display). While viewing playing video content 4810, in some embodiments, a gesture is available to activate a picture-in-picture (PIP) display mode for playing video content 4810. In some embodiments, for example, clicking (e.g., contact 4820) on a hardware button (e.g., home button 204) while video content is displayed in a full-screen mode, in some embodiments, triggers a determination as to whether activation of a PIP mode for the video content is appropriate (in some embodiments, the determination is performed by PIP module 186, FIG. 1A).

Figure 48B:
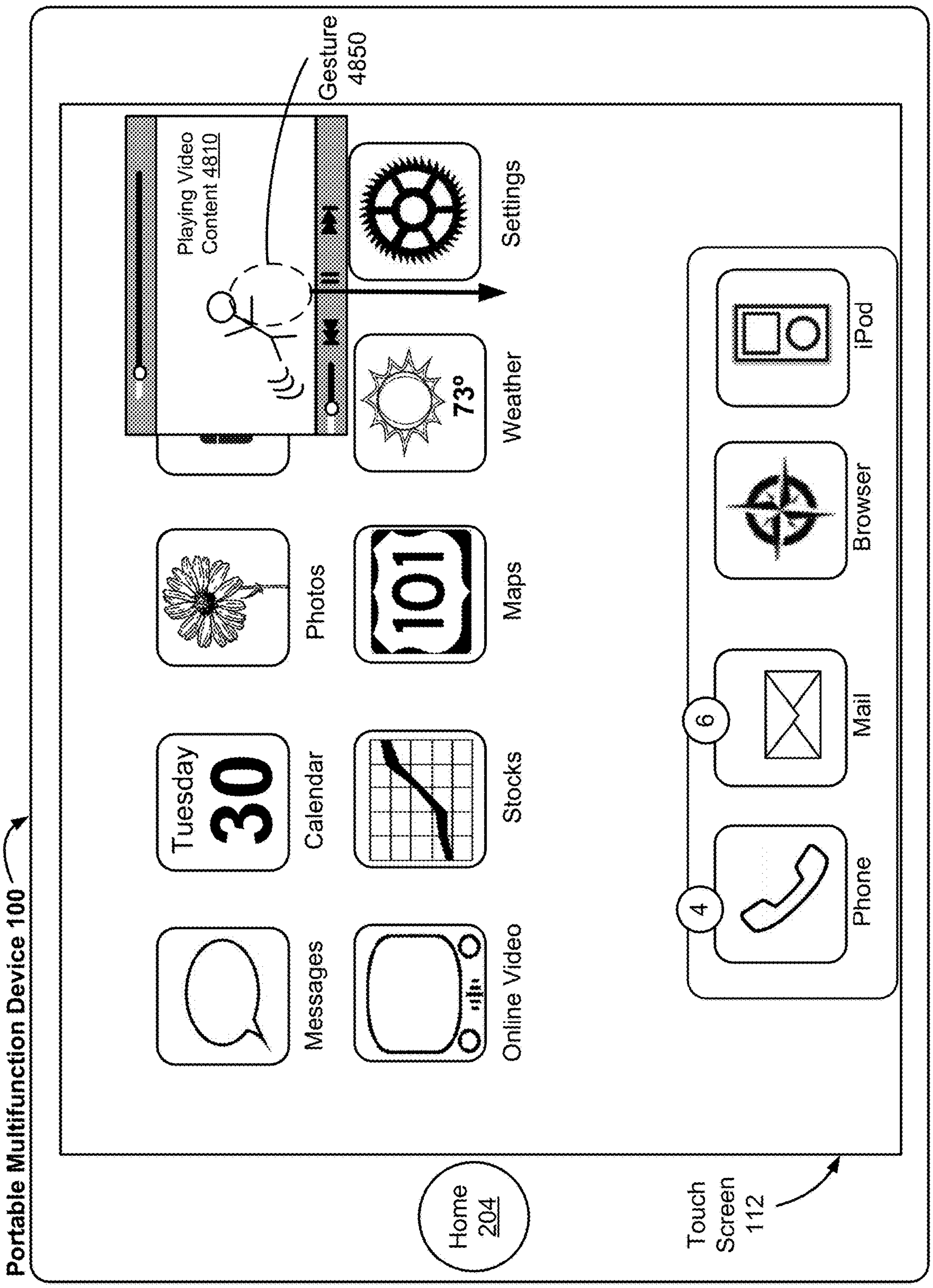

In some embodiments, upon determining that the full-screen video content (e.g., playing video content 4810 or video application 4830) is compatible with PIP mode, the video content is displayed with a reduced size and overlaying a home screen of device 100 (as pictured in FIG. 48B). In some embodiments, only the video content (e.g., playing video content 4810) is displayed with the reduced size, while in other embodiments, all of video application 4830 is displayed with the reduced size. In some embodiments, the reduced size is referred to as PIP display mode or, simply, PIP-ed content. In some embodiments, the PIP-ed content is automatically adjusted to have an appropriate aspect ratio (e.g., the aspect ratio is calculated by PIP module 186 based on the reduced size). In some embodiments, the PIP-ed content (e.g., playing video content 4810 from video application 4830) is a video layer that is hosted by the device 100 (or a component thereof, such as operating system 126) separate from the rest of the logic for the video application 4830. In some embodiments, while displaying video content in PIP display mode, the application (e.g., video application 4830) is suspended. In some embodiments, PIP display mode appears opaque (as pictured in FIG. 48B), while in other embodiments, PIP display mode appears semi-transparent (e.g., applications on the home screen beneath playing video content 4810 would still be partially visible). In some embodiments, a user is able to configure a setting as to whether PIP display mode should appear opaque or semi-transparent (e.g., this configuration is stored in PIP module 186, FIG. 1A) and, in some embodiments, the user can dynamically configure the level of transparency (i.e., modify transparency levels while video content is displayed in a PIP display mode).

FIG. 48B also illustrates a gesture (e.g., gesture 4850) for moving video content in a PIP display mode (e.g., playing video content 4810) across touch screen 112. For example, a dragging gesture on top of the PIP-ed content is detected (e.g., by contact/motion module 130 or event handler 177) moving in a downward direction on the touch-sensitive display. In response to detecting the gesture, the PIP-ed content, in some embodiments follows gesture 4850 across touch screen 112 and, upon determining that a liftoff event has occurred, the PIP-ed content remains at the new location corresponding to the location of the liftoff event (as pictured in FIG. 48C, in which PIP-ed playing video content 4810 has been dragged to a new location on touch screen 112). In some embodiments, PIP-ed playing video content 4810 can be dragged to a location such that only part of the video content is visible (e.g., half of the PIP-ed content is visible but the other half is not visible, in some embodiments, this is referred to as parking the PIP-ed content in a location such that the video content is partially visible). In this way, a user is able to quickly move PIP-ed content to a convenient location and interact with an application that is overlaid by the PIP-ed content, without having to pause or close the video content.

Figure 49A:
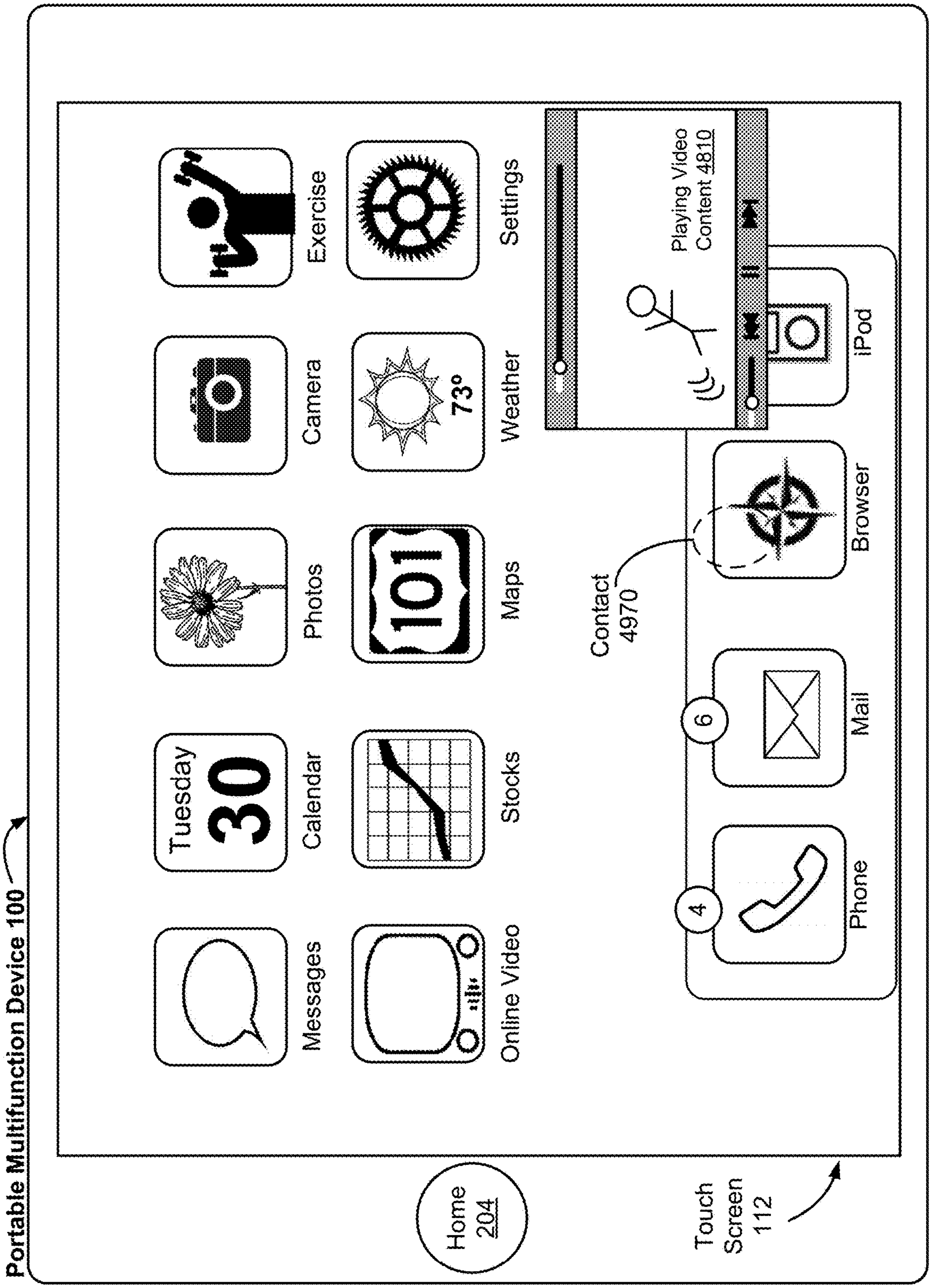

FIG. 49A is a schematic of a touch-sensitive display used to illustrate a touch input at an affordance (e.g. contact 4970 at a browser icon) to open a new application (e.g., browser module 147 which corresponds to the browser icon), while PIP-ed content is displayed on the home screen of device 100. In some embodiments, in response to receiving contact 4970, browser module 147 is opened in a full-screen mode on touch screen 112 (as pictured in FIG. 49B). Additionally, PIP-ed content (e.g., playing video content 4810) also remains on touch screen 112 with the same reduced size and the PIP-ed content overlays content associated with browser module 147 (e.g., as pictured in FIG. 49B, the content behind playing video content 4810 is not visible).

In some embodiments, a location and/or a new size for displaying PIP-ed content in the new application is determined in accordance with a location corresponding to important content within the new application (e.g., the new location, in some embodiments is determined by PIP module 186, FIG. 1A). For example, browser module 147, as pictured in FIG. 49B, is displayed with advertisements 4925, news categories 4945, secondary news article 4935, a different secondary news article 4965, other news hyperlinks 4975, and a primary news article 4955. In some embodiments, device 100 determines (e.g., using graphics module 130) that the browser module contains a primary news article 4955 and that the primary news article likely includes important content (in some embodiments, important content includes a keyboard or an input field). After determining the location of important content, PIP-ed content is displayed at a location (and/or resized to fit at the location) on touch screen 112 that does not include (e.g., does not overlay or overlap) the important content of browser module 147. In some embodiments, device 100 (or a component thereof) receives information from browser module 147 identifying the important content and uses that information to determine an appropriate location for currently displayed PIP-ed content. In some embodiments, the appropriate location for PIP-ed content is also selected so that the PIP-ed content avoids contacting any content of a predetermined content type (e.g., important content of an application, and also including objects that are used for interacting with an application, such as a soft keyboard and/or a status bar). In some embodiments, determining (or selecting) the appropriate location for PIP-ed content includes determining the location of important content and/or content of the predetermined type, so that the appropriate location for the PIP-ed content avoids obscuring important content and/or content of the predetermined type. In some embodiments, a first component of the device (e.g., graphics module 132 or GUI updater 177-3) reports the location of the important content and/or the content of the predetermined type to a second component (e.g., PIP Module 186). In some embodiments, reporting the location includes determining at least one inset (also referred to as a margin, or more generally, a measurement corresponding to the location of a piece of important content relative to at least one edge (e.g., a top edge) of the touch-sensitive display). In some embodiments, reporting the location includes determining four insets, one inset relative to each edge of the touch-sensitive display (e.g., relative to top, bottom, left, and right edges). For example, as shown in FIG. 49B, the first component measures inset 4993 (i.e., distance from a leftmost edge of the touch-sensitive display to the important content) and inset 4994 (i.e., distance from a bottommost edge of the touch-sensitive display to the important content) corresponding to primary news article 4955 and reports those insets to the second component. The second component then uses the reported insets to determine the appropriate location for PIP-ed content on the touch-sensitive display. The reporting, determining, and use of insets to determine the appropriate location for PIP-ed content applies as well to the discussion above regarding FIGS. 48A-48C and to the discussion below regarding FIGS. 50A-52D.

Figure 50A:
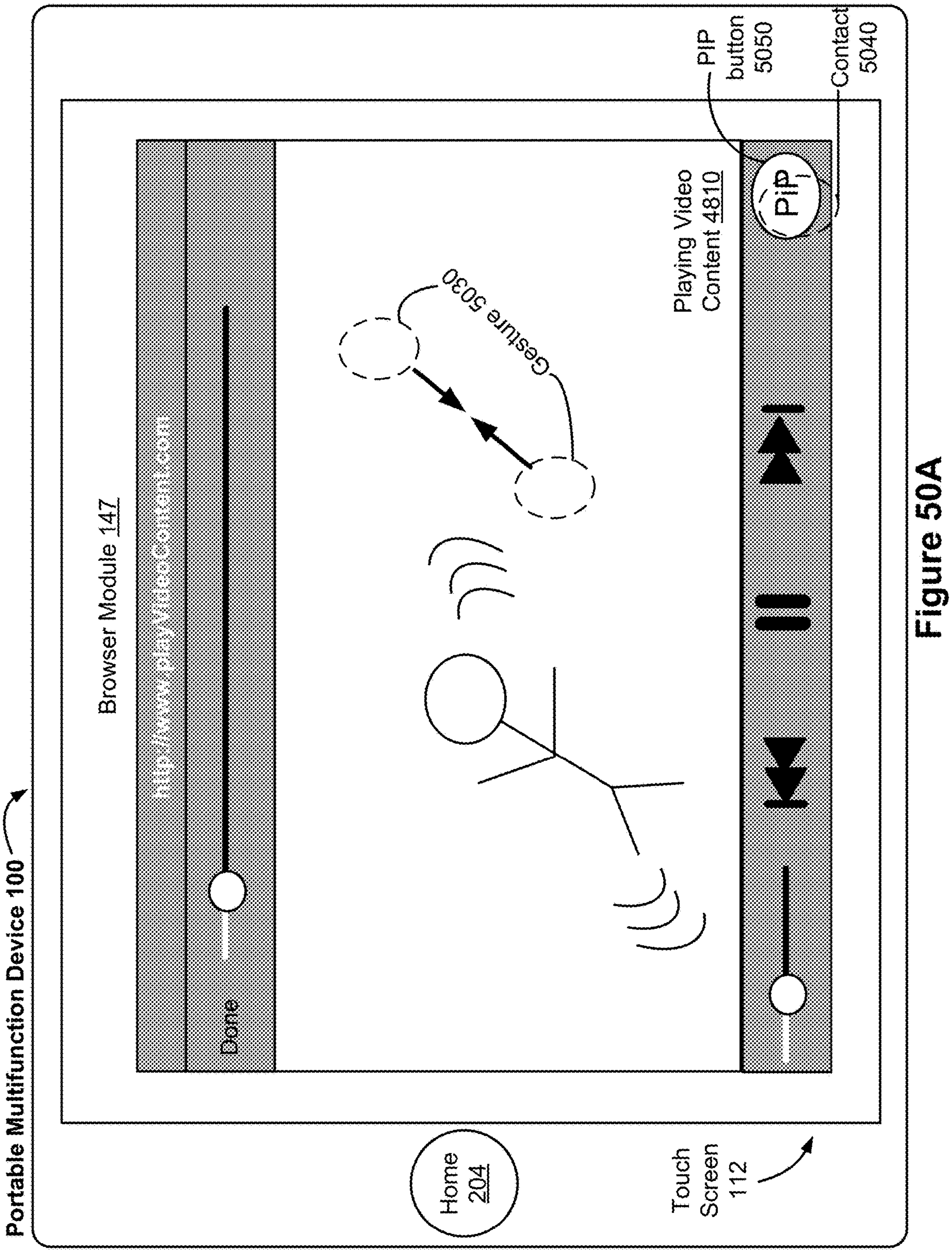

FIG. 50A is a schematic of a touch-sensitive display used to illustrate an additional gesture for activating a PIP display mode, in accordance with some embodiments. Specifically, FIG. 50A illustrates a full-screen view of an application (e.g., browser module 147 that is currently playing video content (e.g., playing video content 4810)). While playing video content 4810, in some embodiments, multiple gestures (in addition to clicking on the home button, as described above) are available to activate a PIP display mode for playing video content 4810. For example, in some embodiments, clicking on PiP button 5050 (e.g., using contact 5040) or using a pinch gesture (e.g., gesture 5030) on top of playing video content 4810, while video content is displayed in a full-screen mode triggers activation of PIP display mode. In some embodiments, PiP button 5050 is only displayed with applications (e.g., browser module 147) after determining that the application (or the video content displayed therein) is compatible with the PIP display mode. In response to receiving the pinch gesture or a contact at the PiP button, the video content is displayed with a reduced size and overlays the currently displayed application (e.g., browser module 147 in this example is displaying a website with numerous available videos (e.g., YOUTUBE or Vimeo) and, after clicking the PiP button, PIP-ed content 5080 is displayed overlaying full-screen content 5090 within the website). In this way, a user is able to conveniently and intuitively browse through video content and easily switch back-and-forth between full-screen and picture-in-picture display modes. In some embodiments, the user is able to open additional PIP-ed content, such that more than one PIP-ed content 5080 window is displayed at the same time (e.g., the user can continue watching PIP-ed content 5080 and also open a picture-in-picture view of a notes application, in order to watch a video while simultaneously reviewing notes or a to-do list contained within the notes application and browsing the web in a web browser that is overlaid by the two picture-in-picture windows). In some embodiments, multiple picture-in-picture windows can overlay a shared screen view (e.g., two picture-in-picture windows displaying two different sports games can be displayed at the same time, while the user also has a messages application and a web browser open in the shared screen view). By providing this flexible PIP functionality, users are able to easily multitask and create customized multitasking workspaces including one or more picture-in-picture windows.

In some embodiments, a second instance of the video content is instantiated (e.g., PIP-ed content 5080 with playing video content 4810) and the full-screen video content is simultaneously paused (e.g., full-screen content 5090 with paused video content 5010). In some embodiments, the reduced size for PIP-ed content 5080 is determined in accordance with information associated with a user of device 100 (e.g., in accordance with desired PIP display sizes configured by the user and stored with PIP module 186, FIG. 1A). In some embodiments, after a first video (e.g., a preview of a first new movie) completes playback within the picture-in-picture window (PIP-ed content 5080), then the same picture-in-picture window displays a next video (e.g., a preview of a second new movie). As discussed above with reference to FIGS. 48B-48C, in some embodiments, a user is able to configure a setting as to whether PIP display mode should appear opaque or semi-transparent. Additionally, as discussed with reference to FIGS. 49A-49B, an appropriate location and/or size for the PIP-ed content can, in some embodiments, be determined based on the location of important content in browser module 147 (e.g., in this example, UI avoidance can be employed to make sure that PIP-ed content doesn't overlay or obscure important content within browser module 147 or important user interface objects (such as a soft keyboard) displayed with browser module 147).

Figure 51A:
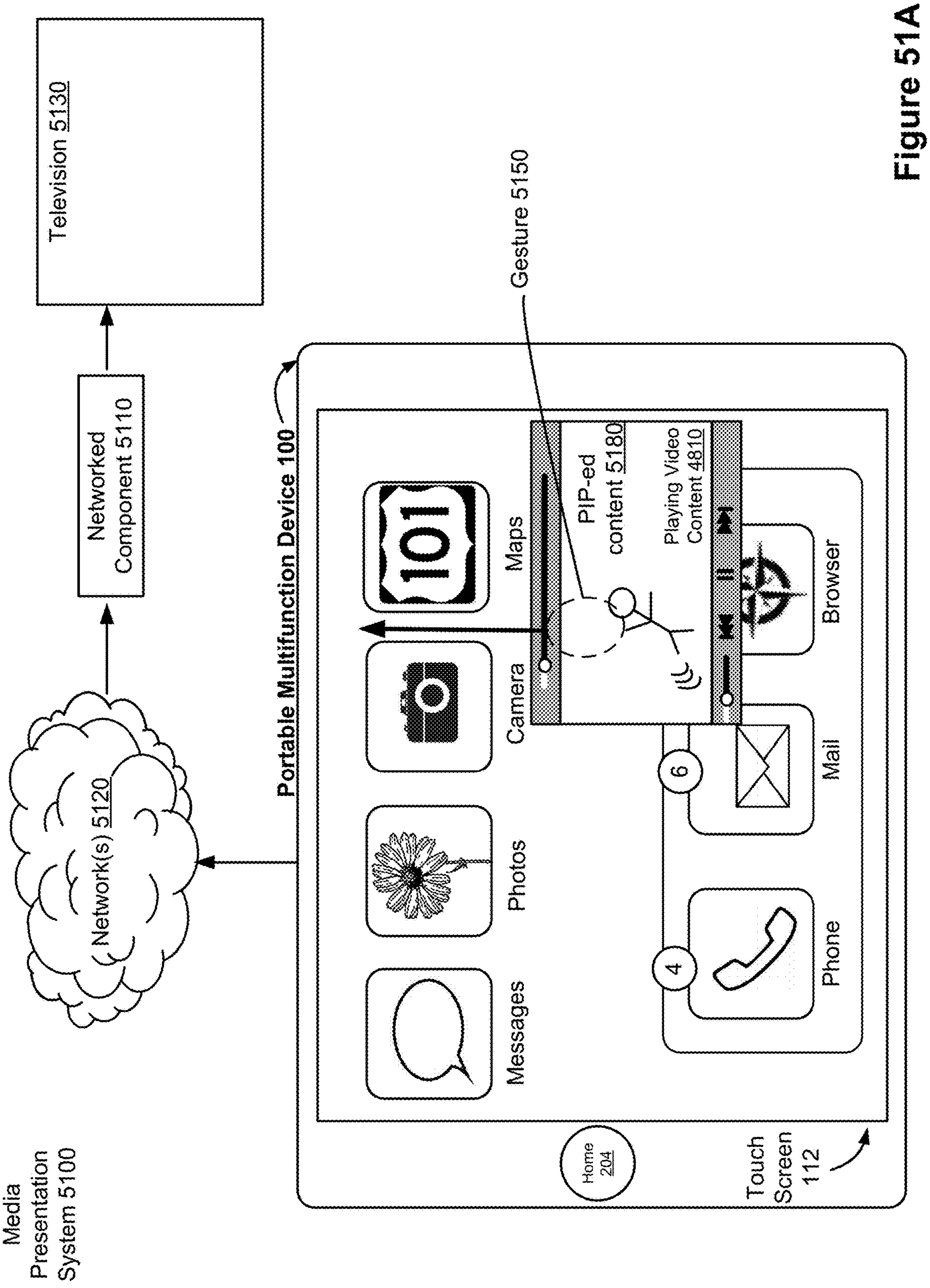
Figure 51B:
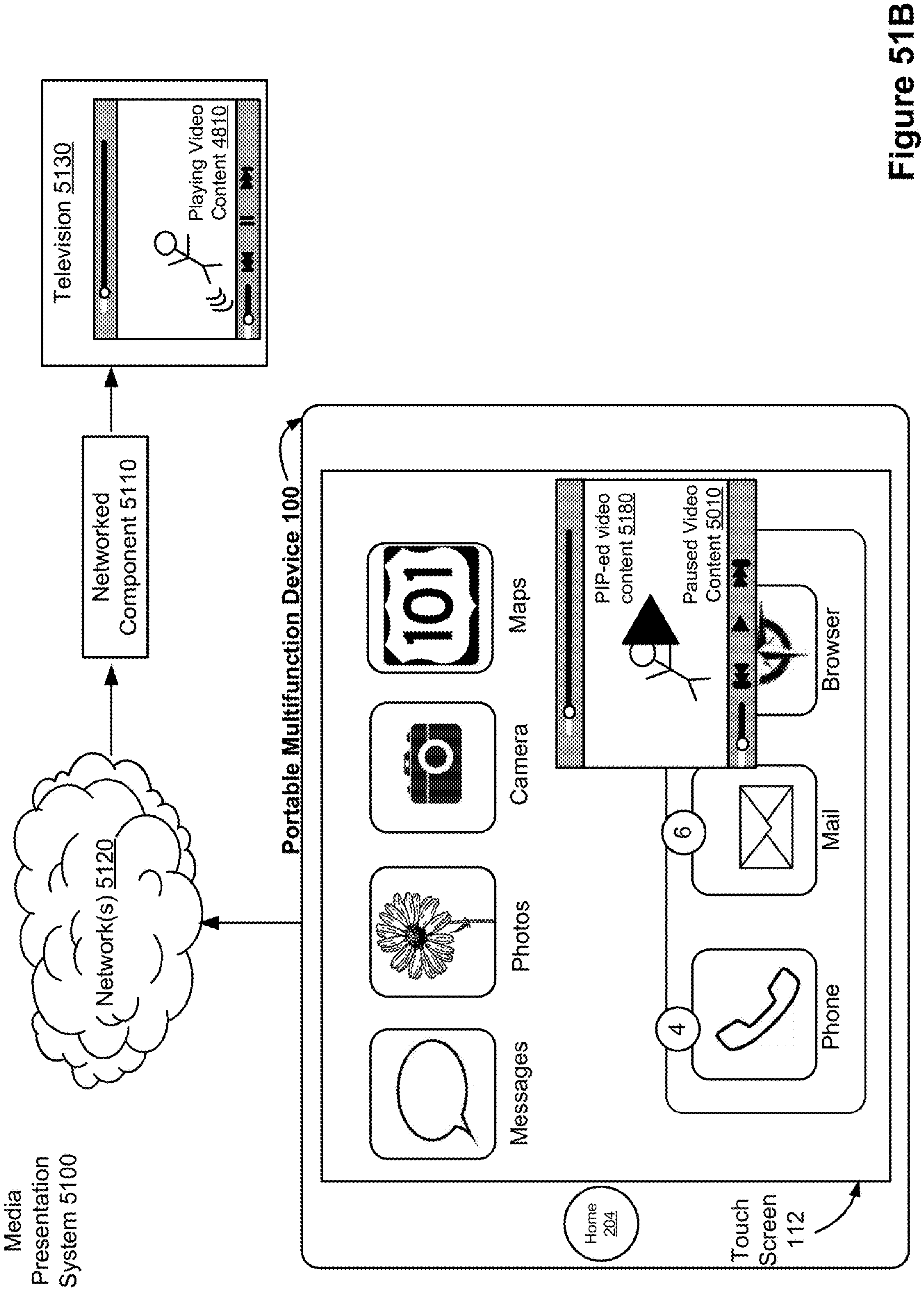

FIGS. 51A-51B are schematics of a touch-sensitive display used to illustrate additional features associated with PIP-ed content, in accordance with some embodiments. In some embodiments, gestures are provided that allow a user to send PIP-ed content (e.g., PIP-ed content 5180 with playing video content 4810) to a different device (e.g., a distinct device from device 100, such as television 5100 of FIG. 51A). In some embodiments, the provided gesture is a flick gesture on top of the PIP-ed content, while in other embodiments, a sliding gesture and a predefined threshold (e.g., a threshold velocity associated with movement of the flick gesture, a threshold distance travelled of the flick gesture, or a location of a liftoff event associated with the flick gesture) are utilized (e.g., once the sliding gesture crosses the predefined threshold, then the PIP-ed content is sent to the distinct device).

In some embodiments, with reference to FIG. 51A, a media presentation system 5100 is provided. Media presentation system 5100 includes device 100, networks 5120 for interconnecting the components of media presentation system 5100, an optional networked component 5110 (e.g., for providing network connectivity to a device that lacks built-in network connectivity, in some embodiments networked component 5110 is an APPLE TV device from APPLE Inc. of Cupertino, CA), and television 5130 (or any other device capable of receiving PIP-ed content from device 100). In some embodiments, device 100 is already displaying PIP-ed content and a gesture (e.g., flick gesture 5150) is received at the PIP-ed content (e.g., a flick gesture is detected when a contact is made on the PIP-ed content and the contact moves quickly towards the top of the touch-sensitive display). Upon determining that gesture 5150 is requesting to send the PIP-ed content to television 5130, the PIP-ed content is sent to television 5130 (e.g., using network(s) 5120 and, optionally, networked component 5110).

As pictured in FIG. 51B, after sending the PIP-ed content to television 5130, the video content is displayed on television 5130 (in some embodiments, the playing video content 4810 is displayed in a full-screen mode on television 5130, while in other embodiments, the video content is displayed in a PIP-ed display mode on television 5130). Playing video content 4810 on television 5130 is, in some embodiments, the same playing video content 4810 in PIP-ed content 5180. Stated another way, when PIP-ed content is sent from device 100 to a different device (e.g., television 5130), then playing video content 4810 continues playing on television 5130. In some embodiments, the PIP-ed content is paused on device 100 while it is being played on television 5130 (e.g., PIP-ed video content 5180 contains paused video content 5010, FIG. 51). In other embodiments, the PIP-ed video content 5180 continues to play on the device 100, but the sound is muted, and in still other embodiments, PIP-ed video content 5180 is closed and is no longer displayed on device 100.

Furthermore, to provide a seamless user experience with PIP-ed content, in some embodiments, gestures are provided to re-display PIP-ed content in a full-screen display mode. As pictured in FIG. 52A, a gesture (e.g., a de-pinch (two substantially simultaneous contacts on touch screen 112 followed by movement of the two contacts in opposite directions on touch screen 112), such as gesture 5220) is detected at playing video content 4810 (displayed in PIP-ed mode). In response to detecting the de-pinch gesture, a determination is made as to whether a threshold has been satisfied (e.g., the determination is performed by PIP module 186, FIG. 1A). In some embodiments, the threshold is a size or area threshold (e.g., threshold 5210), wherein if the de-pinch gesture re-sizes the PIP-ed content beyond threshold 5210, then the content is again displayed in a full-screen display mode. As pictured in FIG. 52A, however, gesture 5220 does not satisfy threshold 5210 and, thus, gesture 5220 resizes the PIP-ed content to a larger size that is still smaller than a size corresponding to the full-screen display mode (as pictured in FIG. 52B).

Figure 52A:
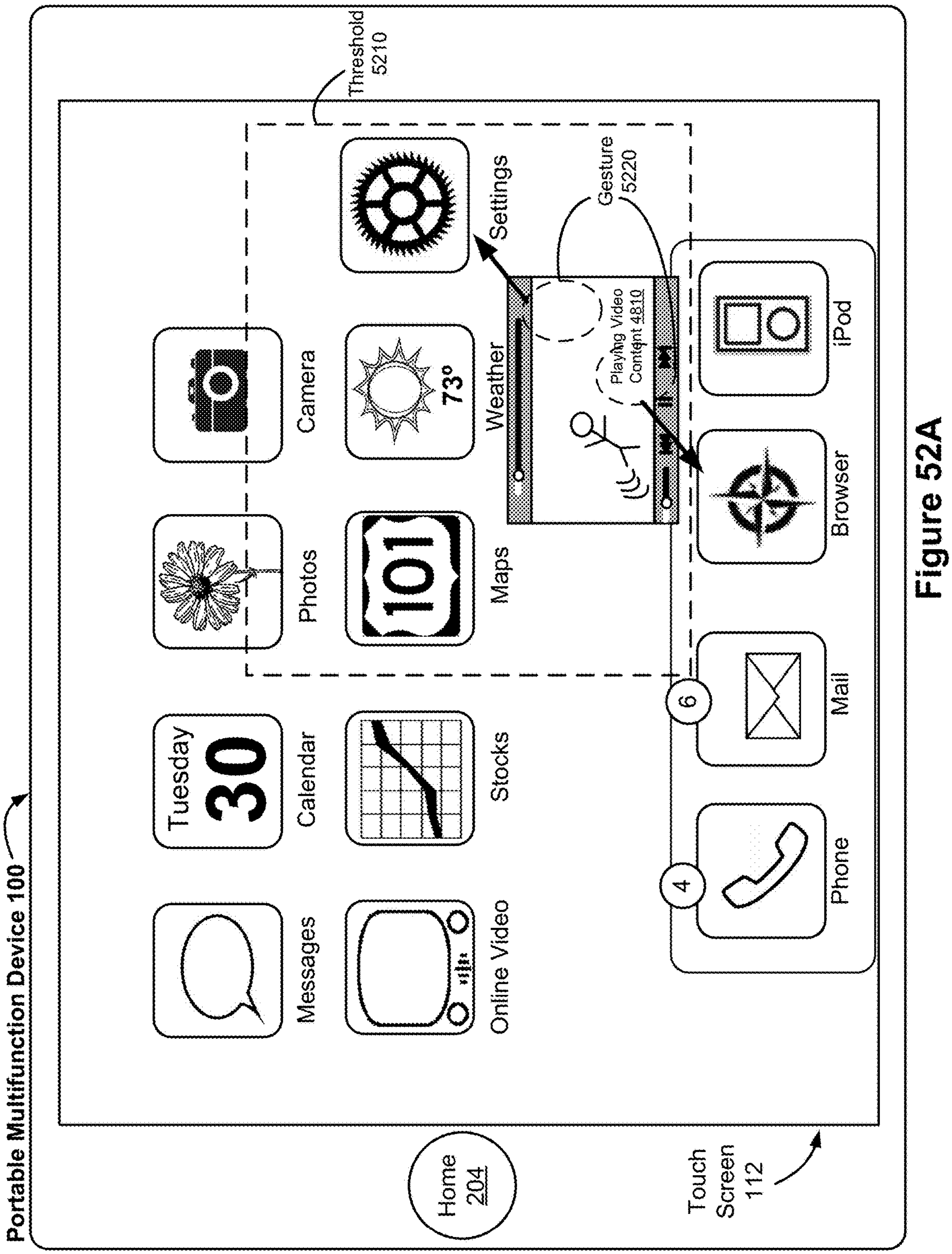
Figure 52B:
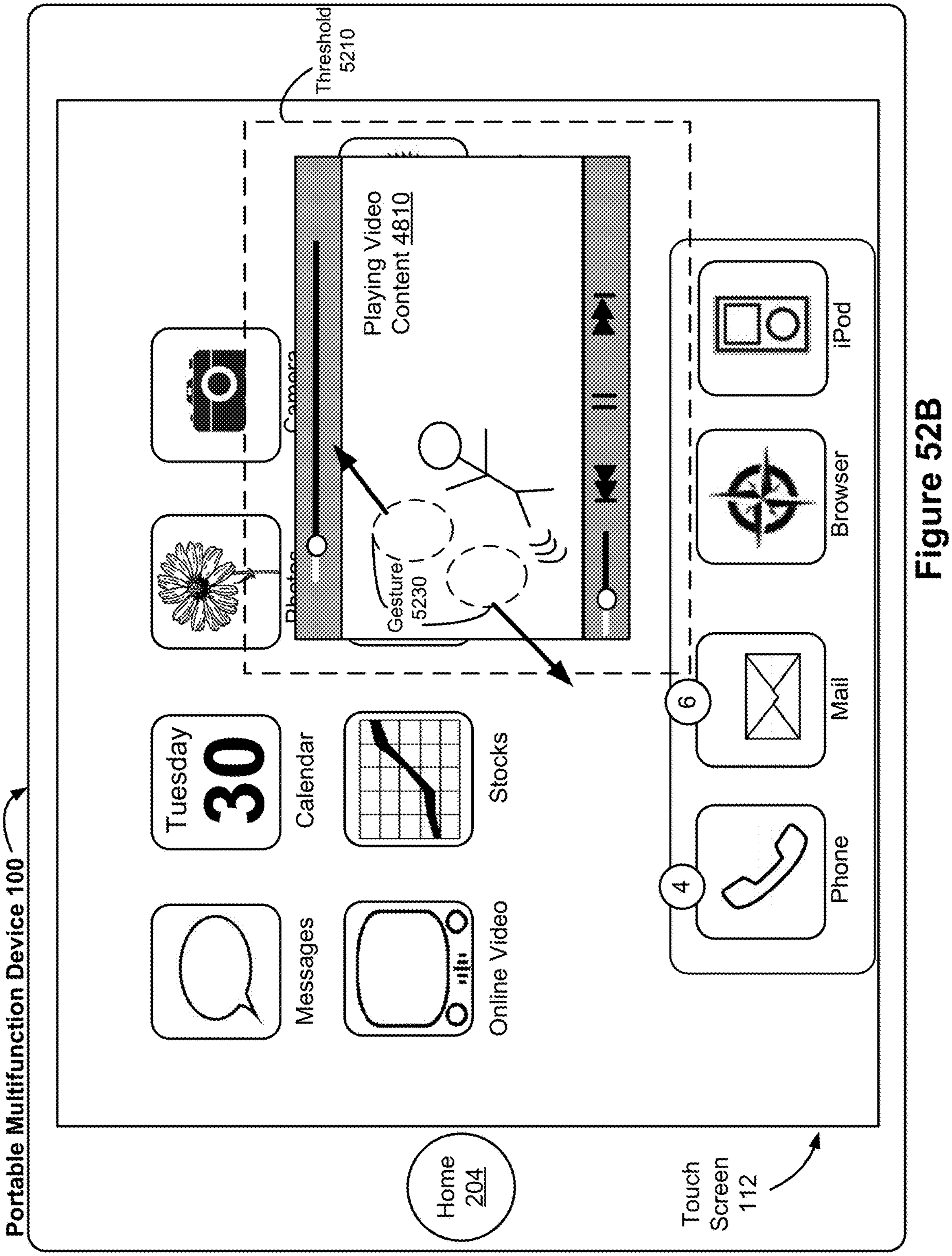

Turning now to FIG. 52B, a second de-pinch gesture is illustrated (e.g., gesture 5230). The second de-pinch gesture 5230 is detected at the PIP-ed content and does satisfy threshold 5210. Upon determining that gesture 5230 re-sizes the PIP-ed content beyond threshold 5210 (i.e. gesture 5230 satisfies threshold 5210), the PIP-ed content is displayed in a full-screen mode (as pictured in FIG. 52D). In some embodiments, threshold 5210 may be defined using distance along a vertical plane, distance along a horizontal plane, or distance along both horizontal and vertical planes.

Figure 52C:
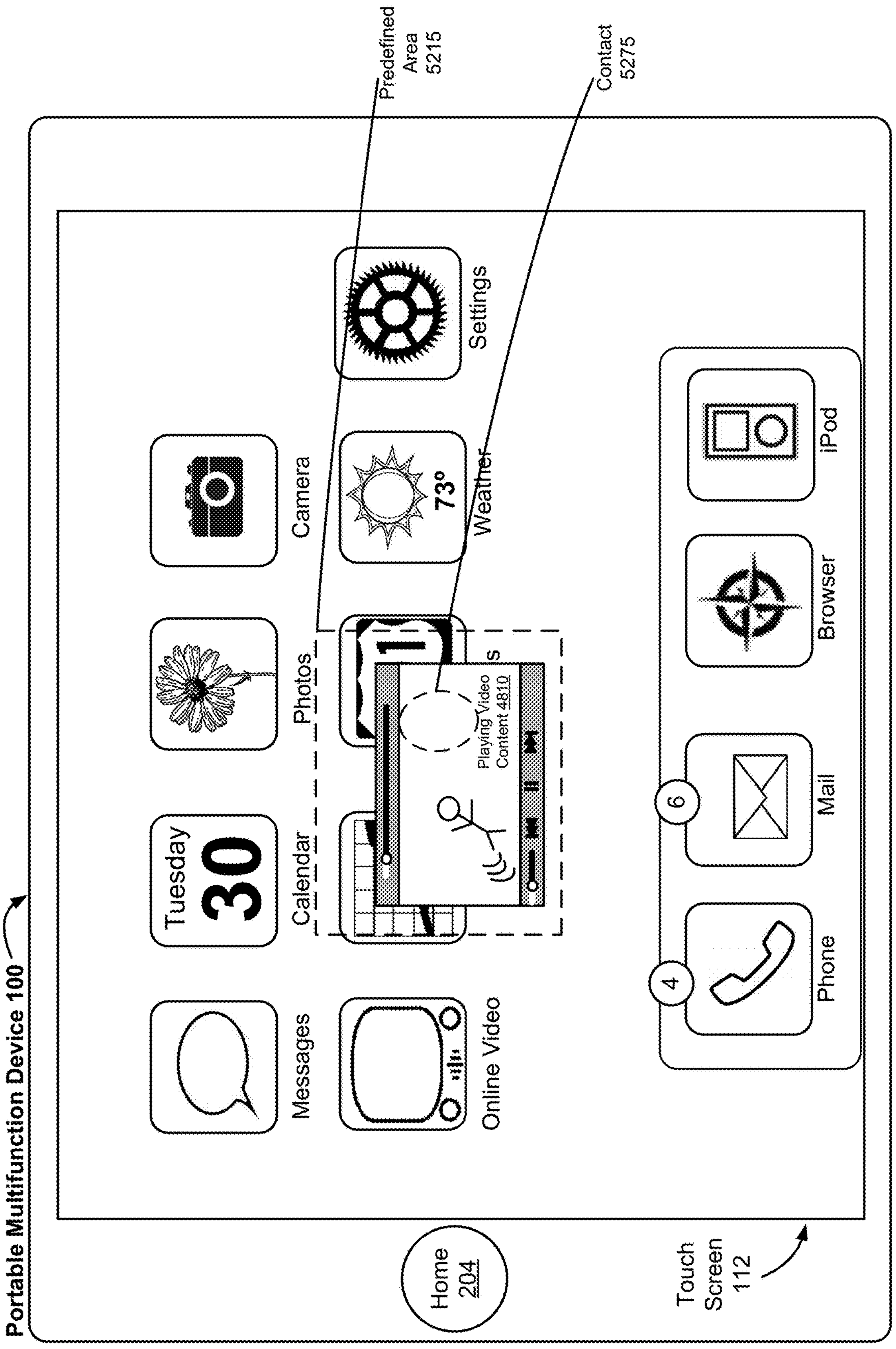
Figure 52D:
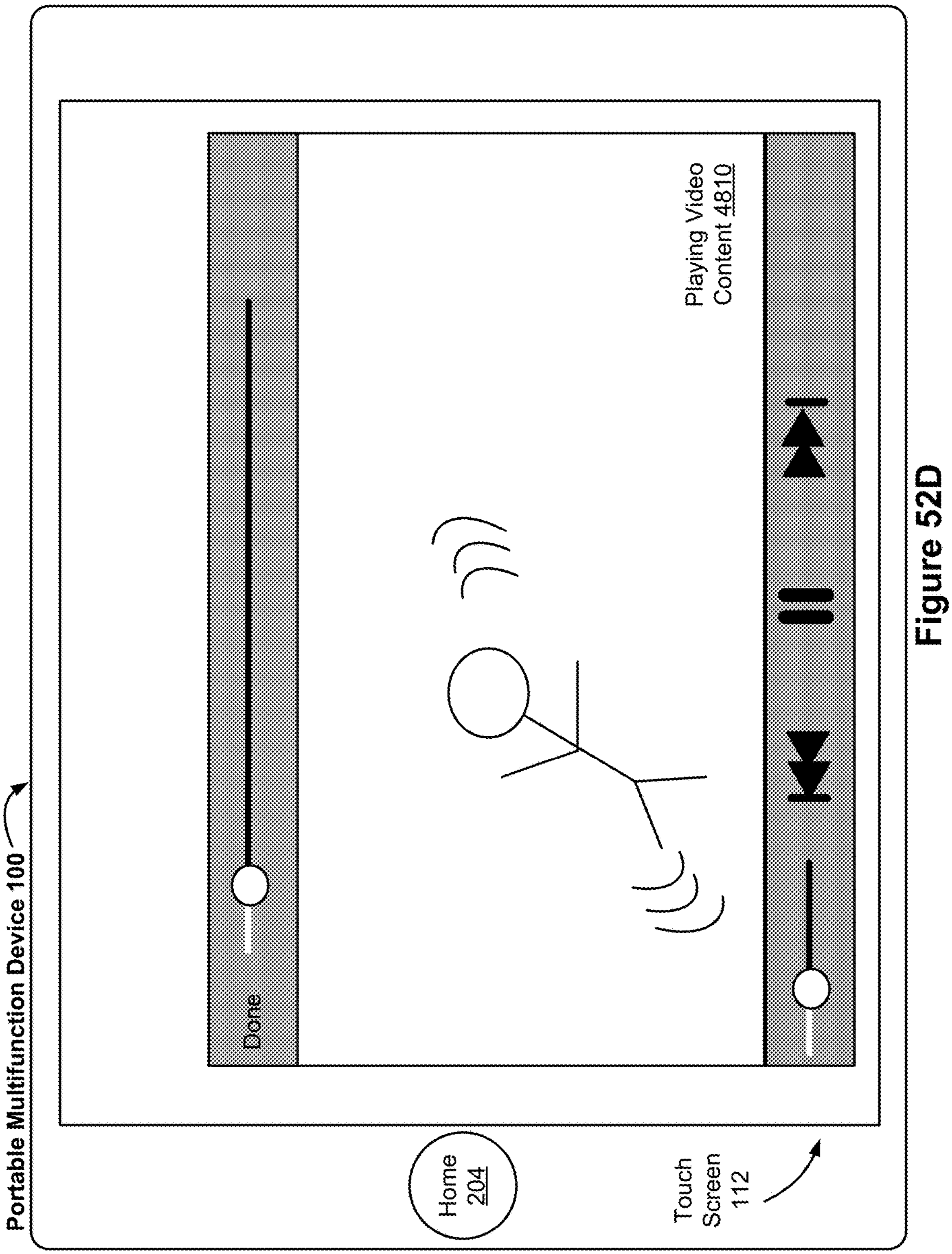

Turning now to FIG. 52C, an additional gesture for re-displaying PIP-ed content in the full-screen display mode is presented. In some embodiments, a predefined area (e.g., predefined area 5215, substantially in the center of touch screen 112) is retrieved or determined on an ad hoc basis based on usage patterns (e.g., usage patterns describing gestures and other interactions with the touch screen 112 while viewing PIP-ed content) associated with a user of the device 100. The predefined area 5215 is used to define an additional gesture to re-display PIP-ed content in the full-screen display mode. In some embodiments, dragging PIP-ed content to the predefined area 5215 (or dragging PIP-ed content to be substantially within the predefined area 5215, as pictured in FIG. 52C) and holding the PIP-ed content in that predefined area for more than a threshold amount of time (e.g., 2 seconds, 3 seconds, 4 seconds, or 5 seconds), results in re-displaying the content in the full-screen display mode. In some embodiments, in response to dragging and holding the PIP-ed content in the predefined area for more than the threshold amount of time, a PIP module (e.g., PIP module 186, FIG. 1A, or some other component of a device including the touch screen 112) communicates with the touch screen 112 to present a preview of the PIP-ed content increasing in size and the preview optionally overlays or replaces the PIP-ed content on the touch screen 112 (e.g., the preview is an animation of the PIP-ed content gradually increasing in size, in order to present a visual cue to a user of device 100 that the threshold amount of time has been satisfied). In some embodiments, while displaying the preview and in response to detecting a liftoff event (e.g., contact 5275 ceasing to touch the touch screen 112), the PIP-ed content is displayed in the full-screen mode (as shown in FIG. 52D). In some embodiments, in accordance with a determination (e.g., by contact/motion module 130, FIG. 1A) that the PIP-ed content has been moved a predefined distance away from the predefined area (e.g., 5 pixels, 7 pixels, or 10 pixels away), the PIP-ed content remains at its current size and is not displayed in the full-screen mode (and the preview is no longer displayed). In this way, a user performing the above gestures and contacts can efficiently view a preview of the PIP-ed content as it would appear in the full-screen mode and then determine whether to display the PIP-ed content in the full-screen mode or whether to keep displaying the PIP-ed content at its current size.

Figure 53A:
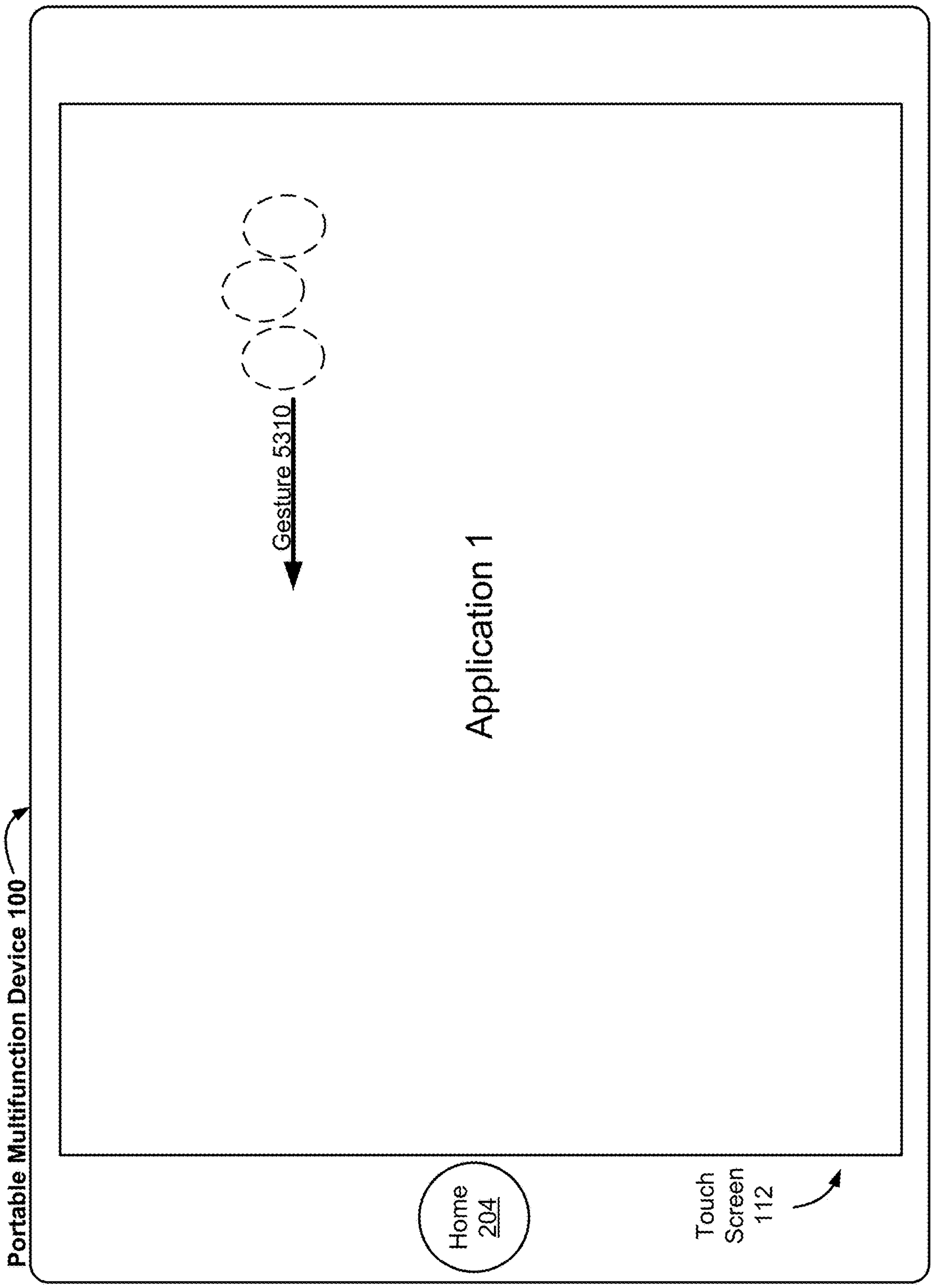
FIGS. 53A-53L are schematics of a touch-sensitive display used to illustrate gestures for navigating to recently-used applications, in accordance with some embodiments.
Figure 53B:
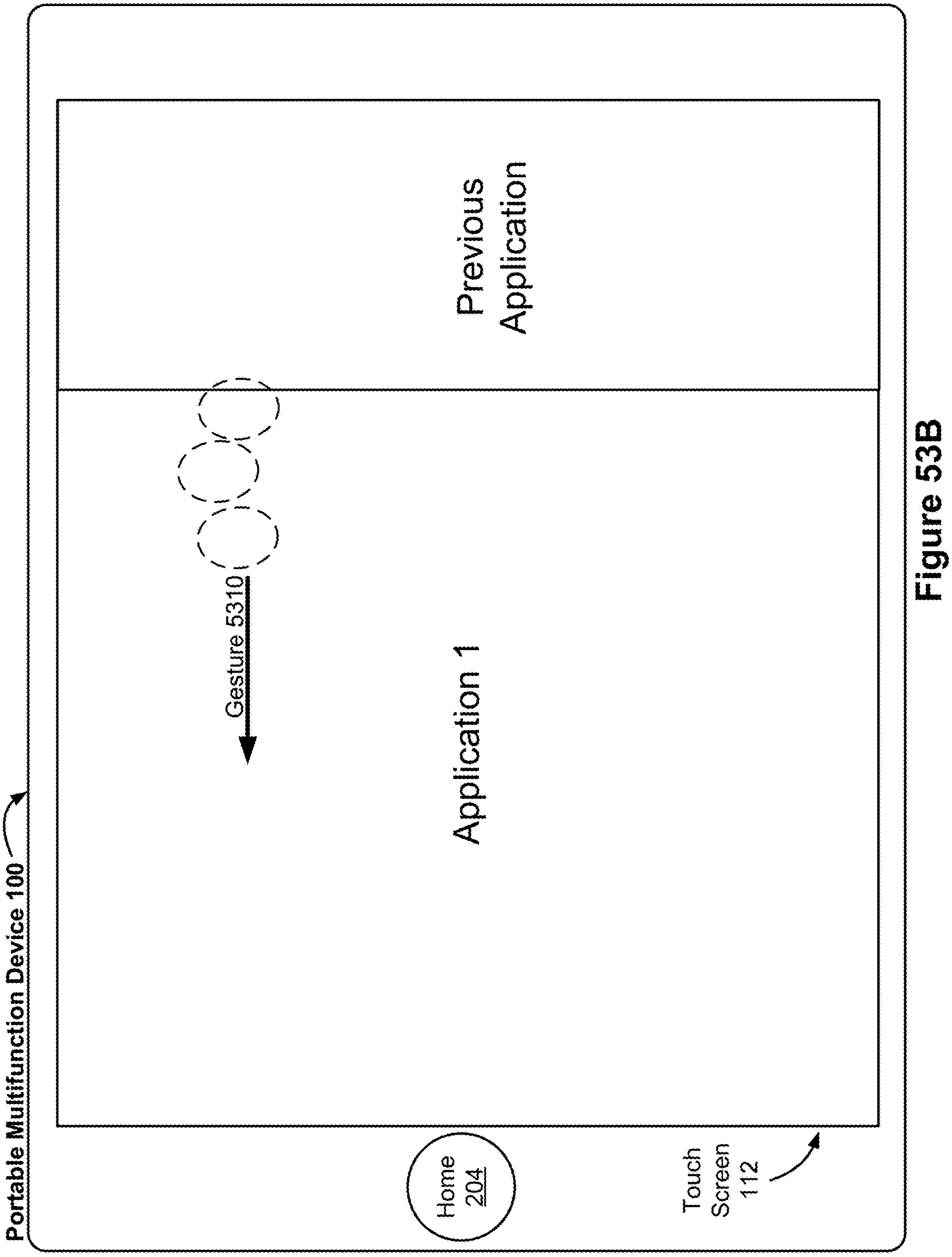
Figure 53C:
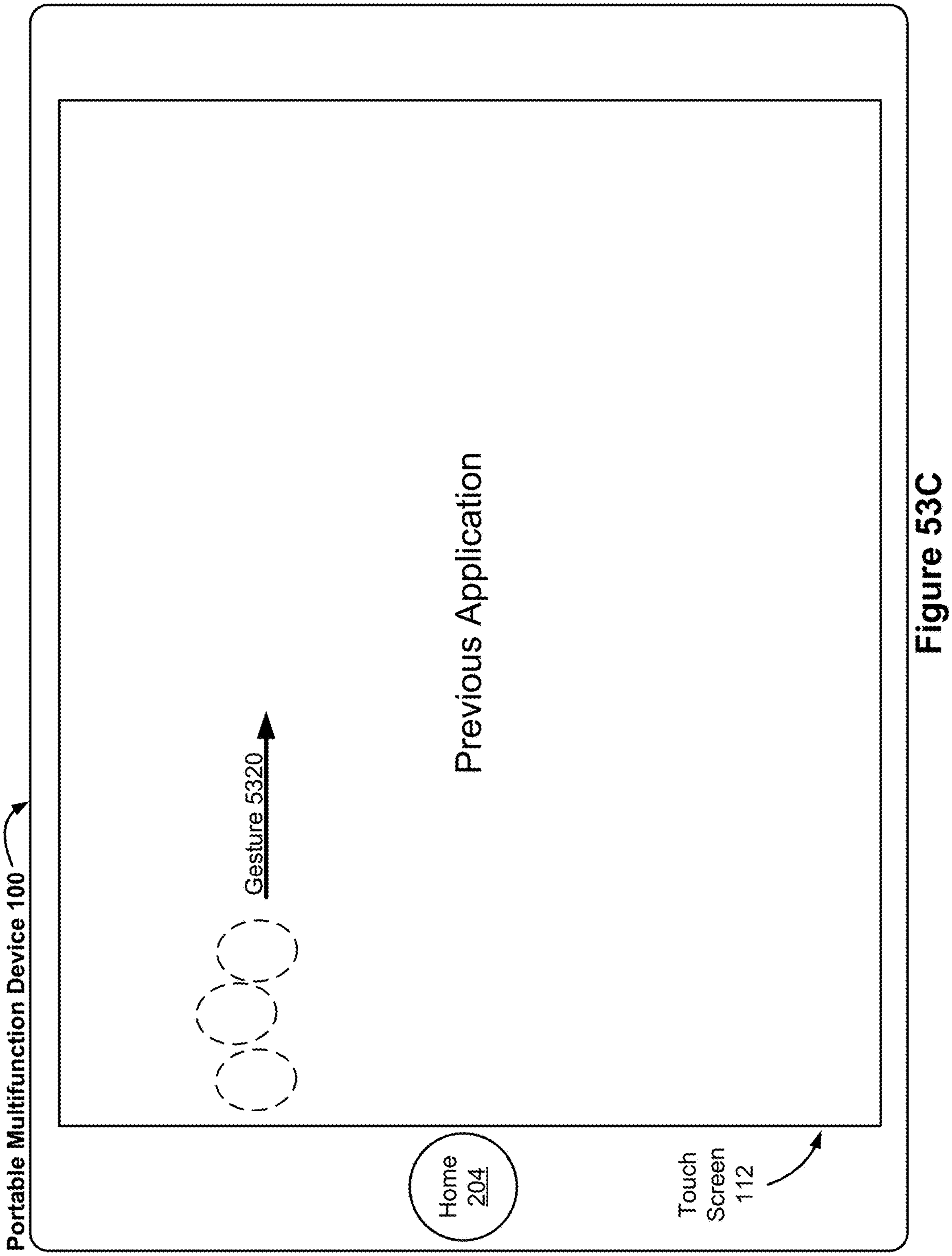
Figure 53D:
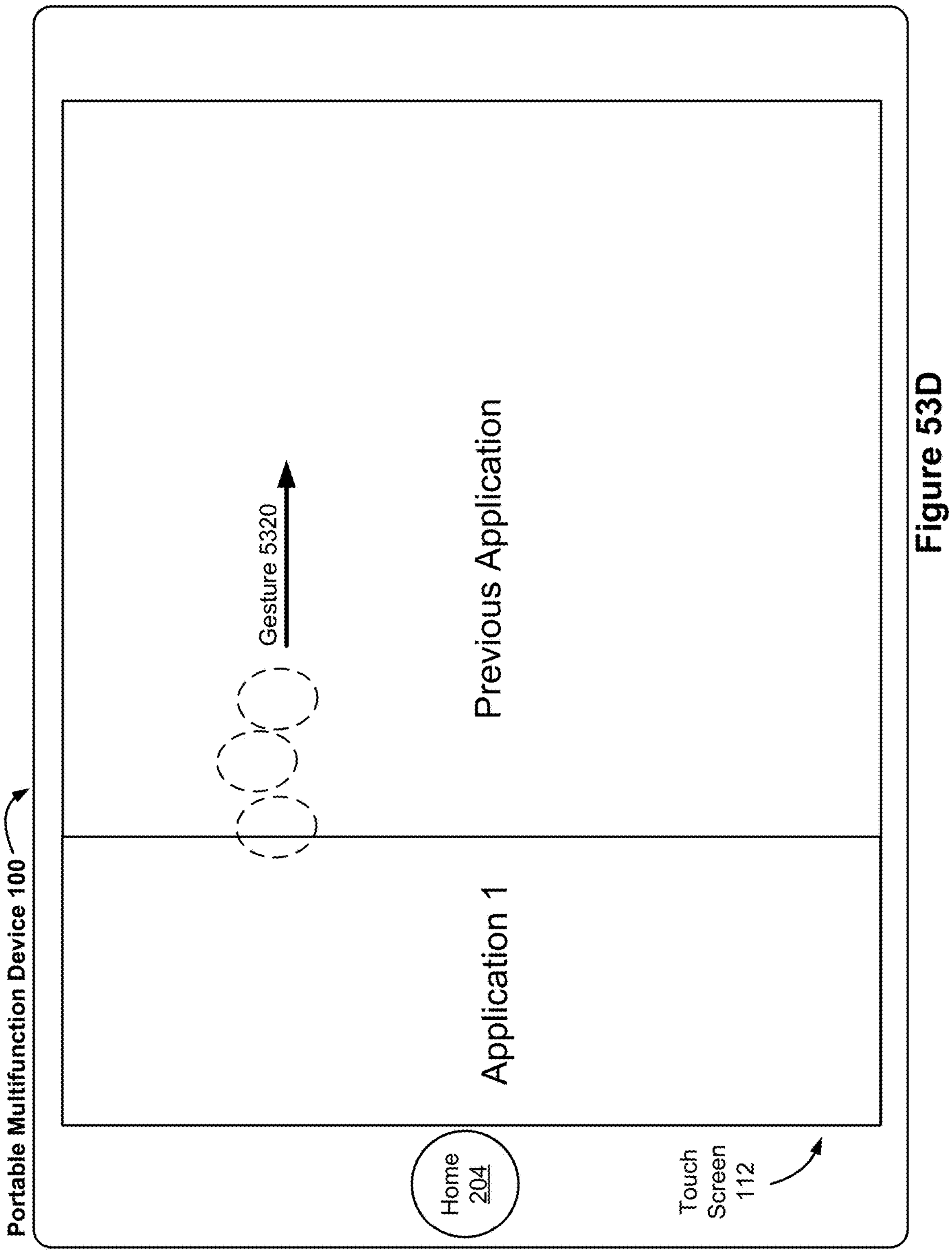

FIGS. 53A-53E are schematics of a touch-sensitive display used to illustrate navigating to recently-used (also referred to interchangeably as recently-displayed, previously-used, or previously-displayed) applications, in accordance with some embodiments. With reference to FIG. 53A, in some embodiments, a three-finger touch input (i.e., three substantially simultaneous contacts, or, alternatively, four substantially simultaneous contact) is detected at touch screen 112 (e.g., by contact/motion module 132), followed by a slide gesture 5310 in a substantially horizontal and leftward direction. In response to detecting gesture 5310, a previously displayed application is revealed in accordance with movement of gesture 5310 (e.g., as gesture 5310 slides in a leftward direction, more of the previous application is displayed, while a corresponding portion of a currently displayed application (e.g., application 1) is no longer displayed (as pictured in FIG. 53B). Upon determining that gesture 5310 satisfies a threshold (e.g., above a certain velocity, travels beyond a certain distance, or liftoff occurs at a certain location on touch screen 112), application 1 is no longer displayed and the previous application occupies substantially all of touch screen 112 (as pictured in FIG. 53C).

Continuing with the example, while displaying the previous application, a new three-finger gesture (e.g., gesture 5320) is detected on the touch screen 112 moving in a substantially horizontal and rightward direction. In response to detecting gesture 5320, application 1 is revealed (or some other next application optionally identified by device 100 in accordance with a usage history (e.g., stored with multitasking data 176, FIG. 1B) associated with a user of device 100) in accordance with movement of gesture 5320 (e.g., as gesture 5320 slides in a rightward direction, more of application 1 is displayed, while a corresponding portion of the previous application is no longer displayed (as pictured in FIG. 53D). Upon determining that gesture 5320 satisfies a threshold (e.g., above a certain velocity, travels beyond a certain distance, or liftoff occurs at a certain location on touch screen 112), the previous application is no longer displayed and the application 1 again occupies substantially all of touch screen 112 (as pictured in FIG. 53A).

Figure 53E:
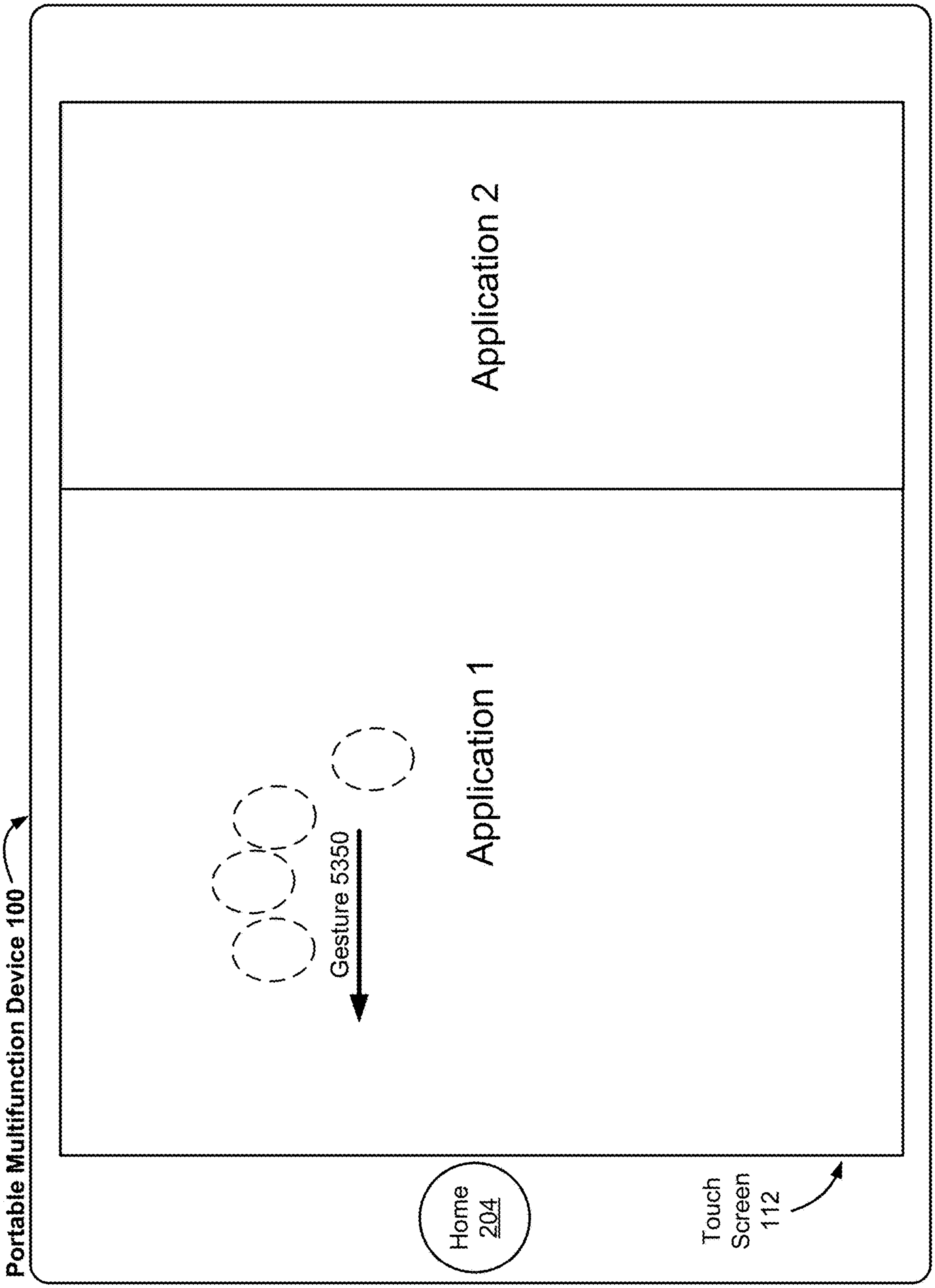
Figure 53F:
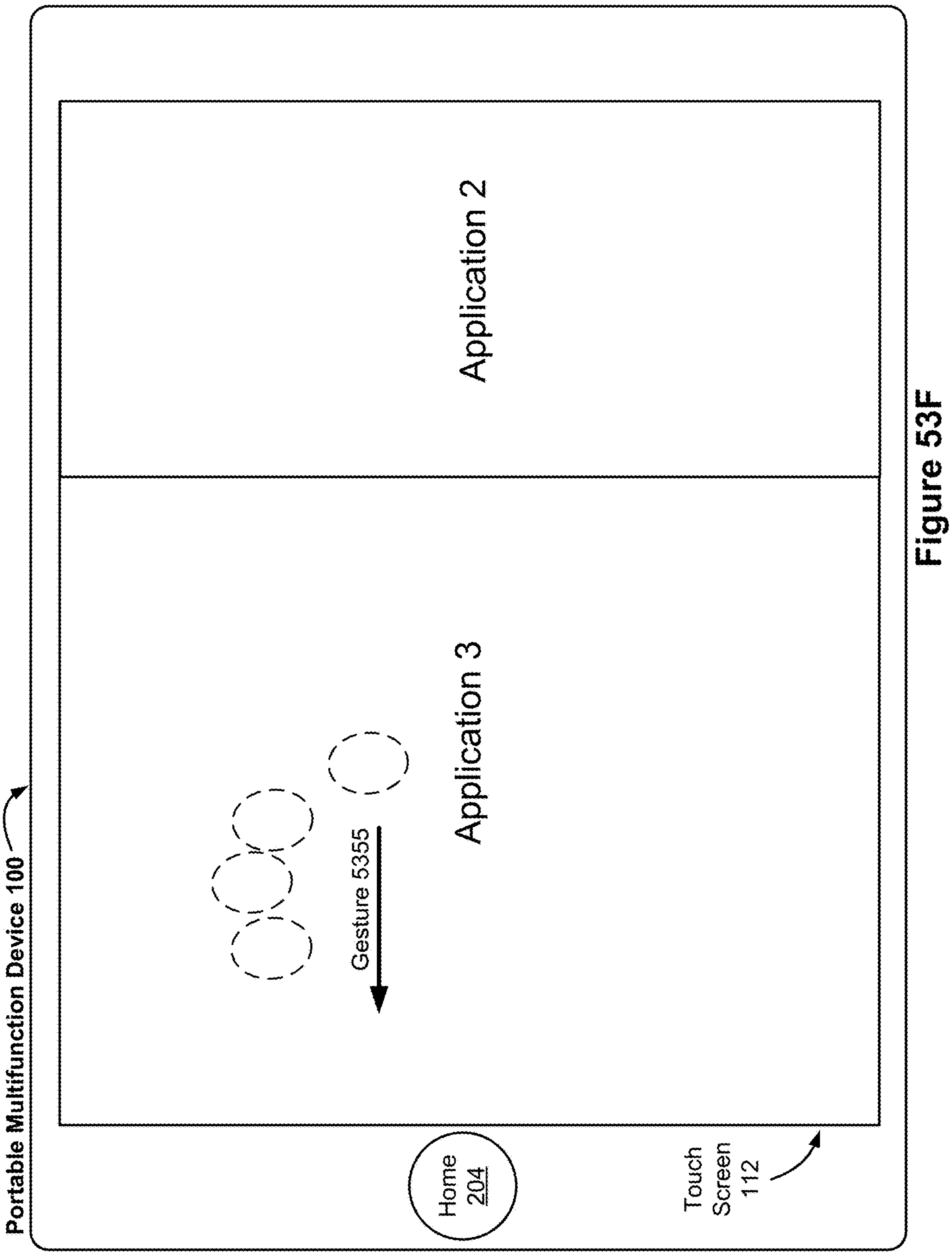
Figure 53G:
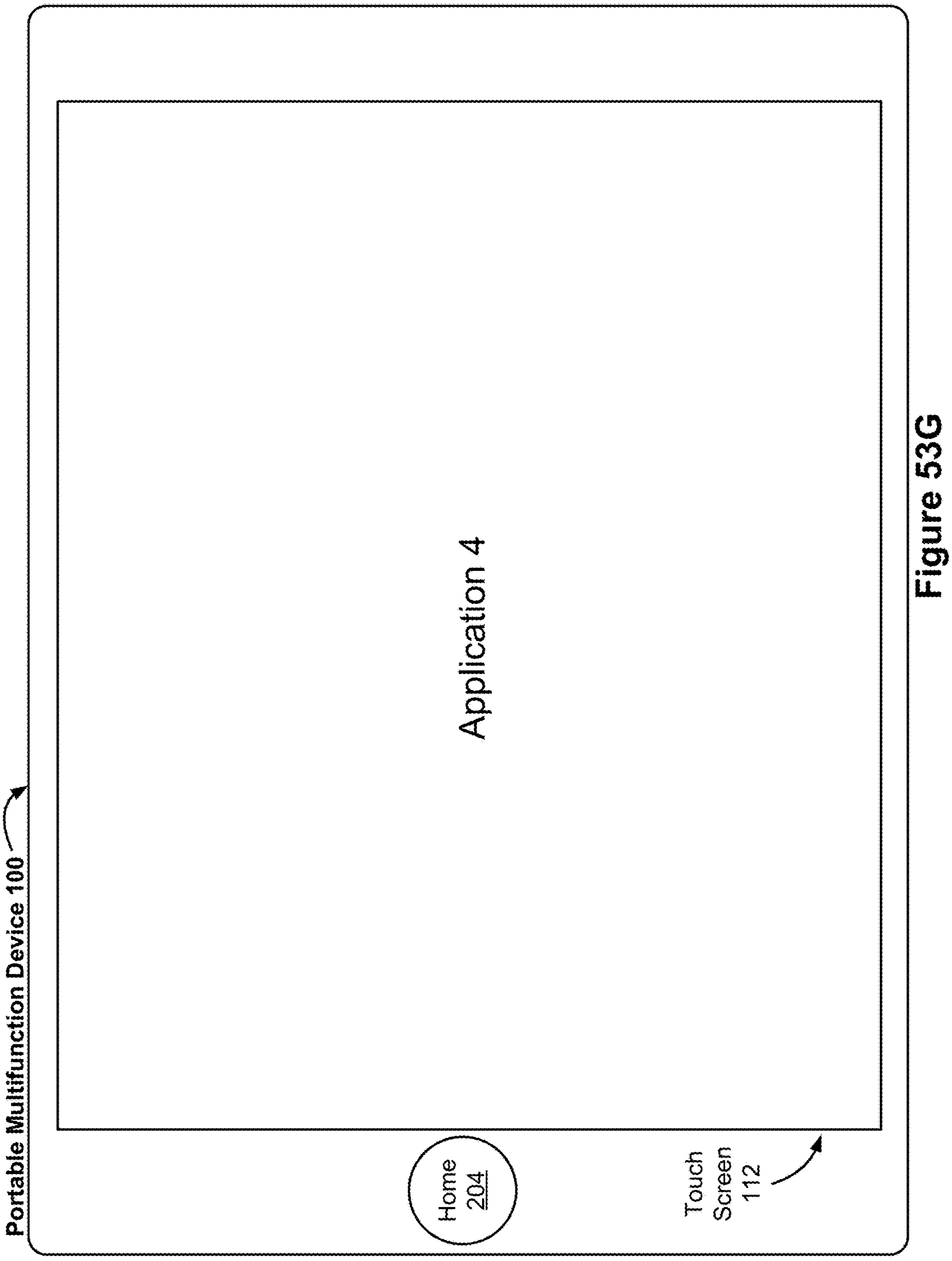

In some embodiments, the gestures described above for swiping between previous and next applications are also available in a shared screen view. For example, FIGS. 53E-53G are schematics of a touch-sensitive display used to illustrate an exemplary gesture for swiping between applications within a shared screen view. As shown in FIG. 53E, a four-finger swipe gesture over a main application (e.g., gesture 5350 over application 1) is available in some embodiments for swiping between applications. In some embodiments, in accordance with a determination that the gesture 5350 has satisfied a threshold (e.g., travelled a threshold distance on the touch screen 112 and/or travelled at a velocity above a threshold velocity), the device 100 ceases to display the main application and displays a previously-displayed application in the space previously occupied by the main application (e.g., device 100 ceases to display application 1 as the main application and instead displays application 3, as shown in FIG. 53F). In some embodiments in which side applications are pinned to individual main applications (various implementations of pinning are discussed above in reference to FIGS. 41A-41E), after using the four-finger swipe gesture to switch to a previously-displayed application, the side application is then pinned to the previously-displayed application and is no longer pinned to application 1 (e.g., with reference to FIG. 53F, application 2 is now pinned to application 3 and is no longer pinned to application 1). In some embodiments in which side applications are pinned to the shared screen view, after user the four-finger swipe gesture to switch to a previously-displayed application, the side application remains pinned to the shared screen view (i.e., the four-finger swipe does not affect pinning of the side application).

In some embodiments, the previously-displayed application (application 3 in the preceding example) is selected based on a history of previously-displayed applications associated with a user of the device 100 (e.g., the history is retrieved by the device 100 from memory 102 and the device 100 then selects a previously-displayed application from the retrieved history). In some embodiments, the device 100 also determines whether the previously-displayed application is compatible with the shared screen mode (e.g., compatibility module 184 performs the determination and reports back to graphics module 132 with the result of the determination). In accordance with a determination that the previously-selected application is compatible with the shared screen mode, the graphics module 132 renders application 3 in the space previously occupied by application 1 (as shown in FIG. 53F).

In some embodiments, in accordance with a determination that the previously-selected application is not compatible with the shared screen mode, the graphics module 132 renders the previously-selected application in full-screen mode (i.e., not in shared screen mode). With reference to FIGS. 53F-53G, after the device 100 displays a previously-displayed application as the main application (in response to receiving the gesture 5350 and determining that a first previously-displayed application (application 3) is compatible with the shared screen mode), a user of the device 100 can continue to swipe through previously-displayed applications. For example, the device 100 detects gesture 5355 on the touch screen 112 (e.g., contact/motion module 130 detects four substantially simultaneous contacts on the touch screen 112 and then detects movement of the four contacts in a substantially horizontal direction relative to a top edge of the touch screen 112) and, in response to detecting the gesture 5355, the device 100 retrieves a second previously-displayed application from the history of previously-displayed applications associated with the user. The second previously-displayed application was displayed before the first previously-displayed application (e.g., at 3:30 PM, the user opened application 4, at 3:32 PM the user opened application 3, and then at 3:35 PM, the user opened applications 1 and 2 in the shared screen mode). After (or in response to) determining that the second previously-displayed application is not compatible with the shared screen mode, the second previously-displayed is displayed in the full-screen mode (as pictured in FIG. 53G).

Figure 53H:
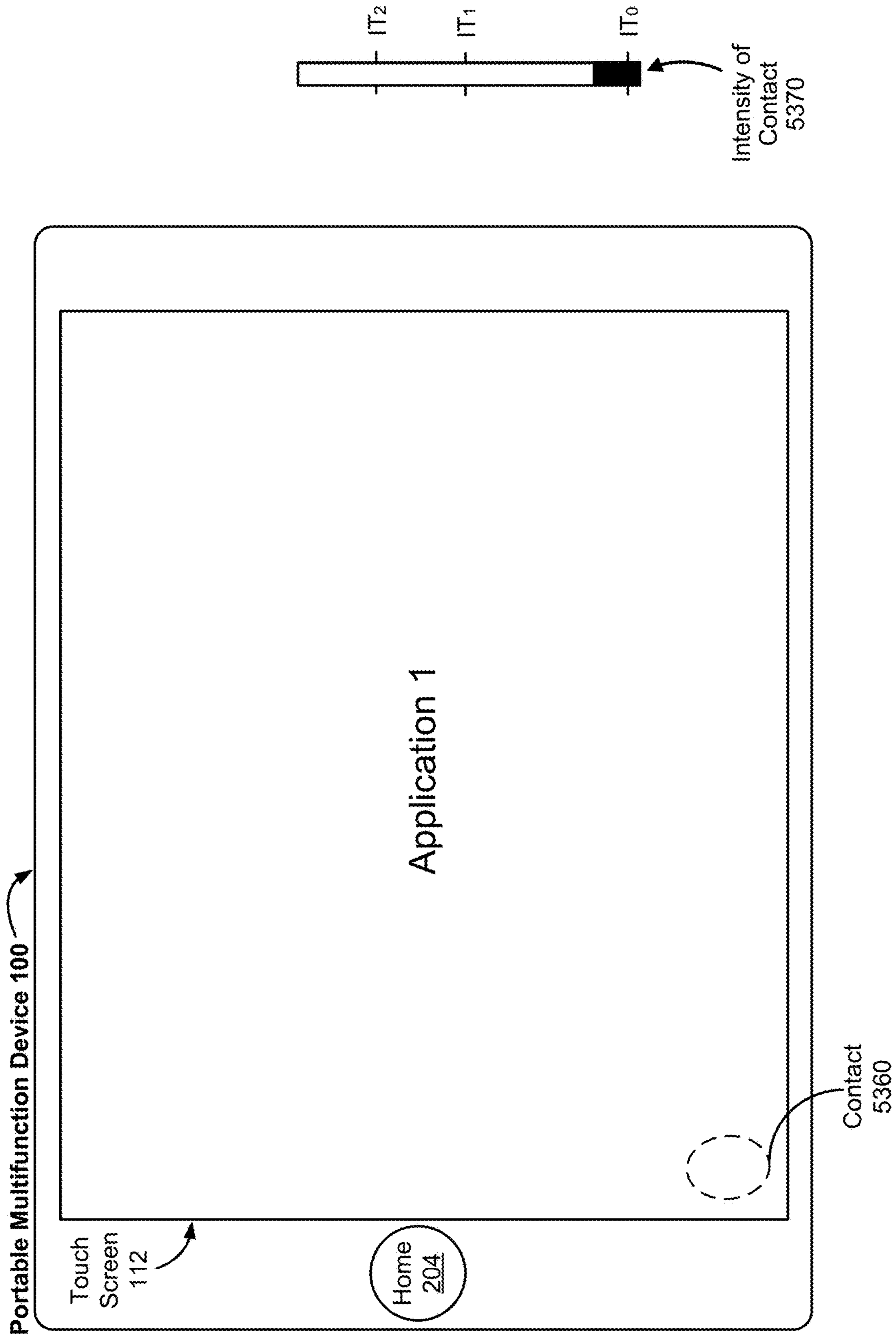

In addition to the aforementioned gestures for navigating between previous and next applications, in some embodiments, additional gestures are also available for quickly navigating to previously-displayed applications. FIGS. 53H-53L are schematics of a touch-sensitive display used to illustrate gestures for quickly navigating between previously-displayed applications, in accordance with some embodiments. As shown in FIG. 53H, in some embodiments, the device 100 detects an intensity of contacts (e.g., force or pressure of the contacts on the touch screen 112, explained in more detail above in reference to FIG. 1A) on the touch screen 112 using intensity sensors 165 (FIG. 1A). For example, the device 100 monitors (receives signals associated with the contacts from the intensity sensors 165) an intensity of contact associated with contact 5360 after detecting contact 5360 on touch screen 112. While contact 5360 remains on the surface of touch screen 112, the device 100 continues to monitor/determine the intensity of contact associated with contact 5360 in order to determine whether the intensity of contact exceeds one or more thresholds (e.g., $IT_0$ (first threshold), $IT_1$ (second threshold), and $IT_2$ (third threshold)).

Figure 53I:
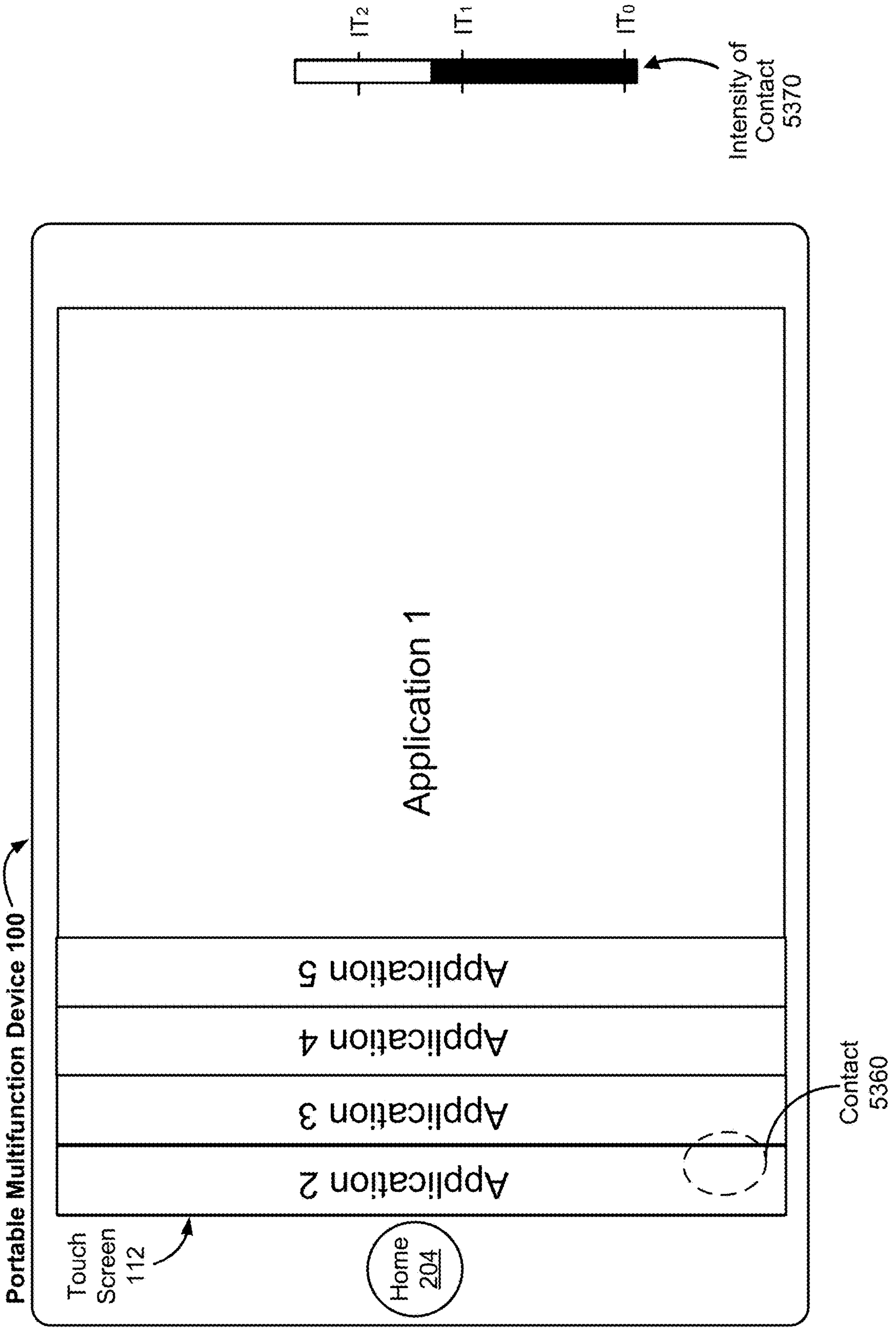
Figure 53J:
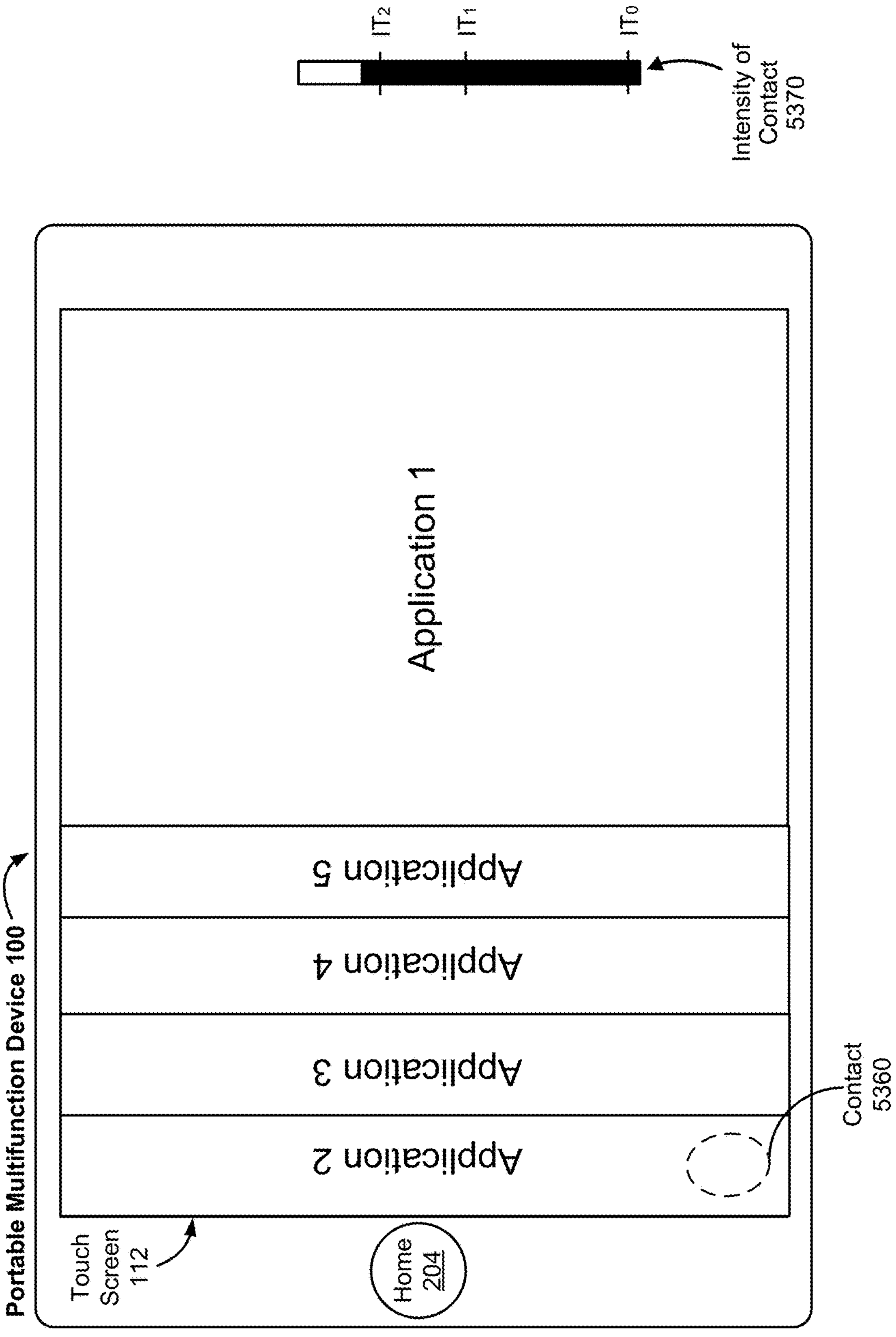
Figure 53K:
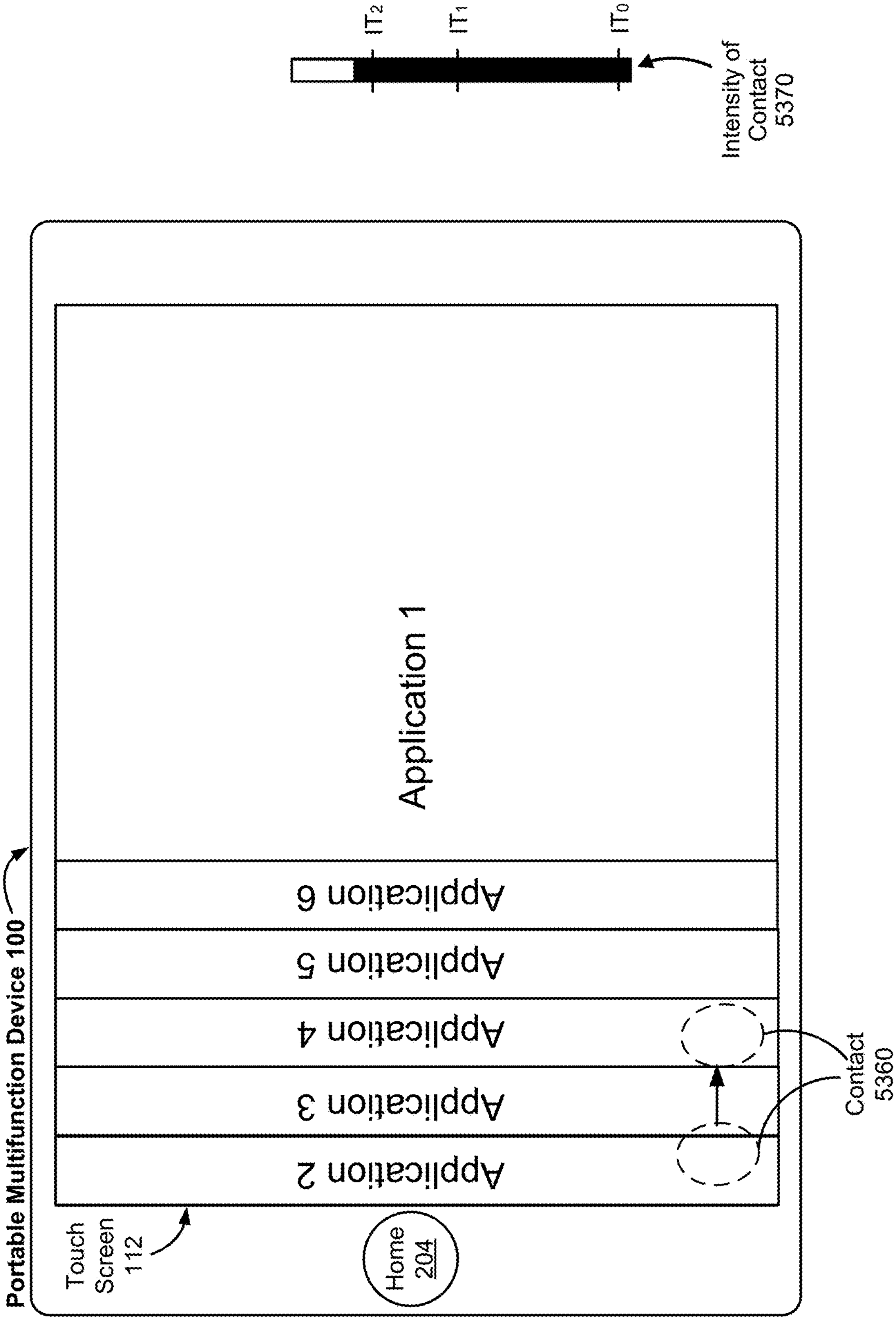
Figure 53L:
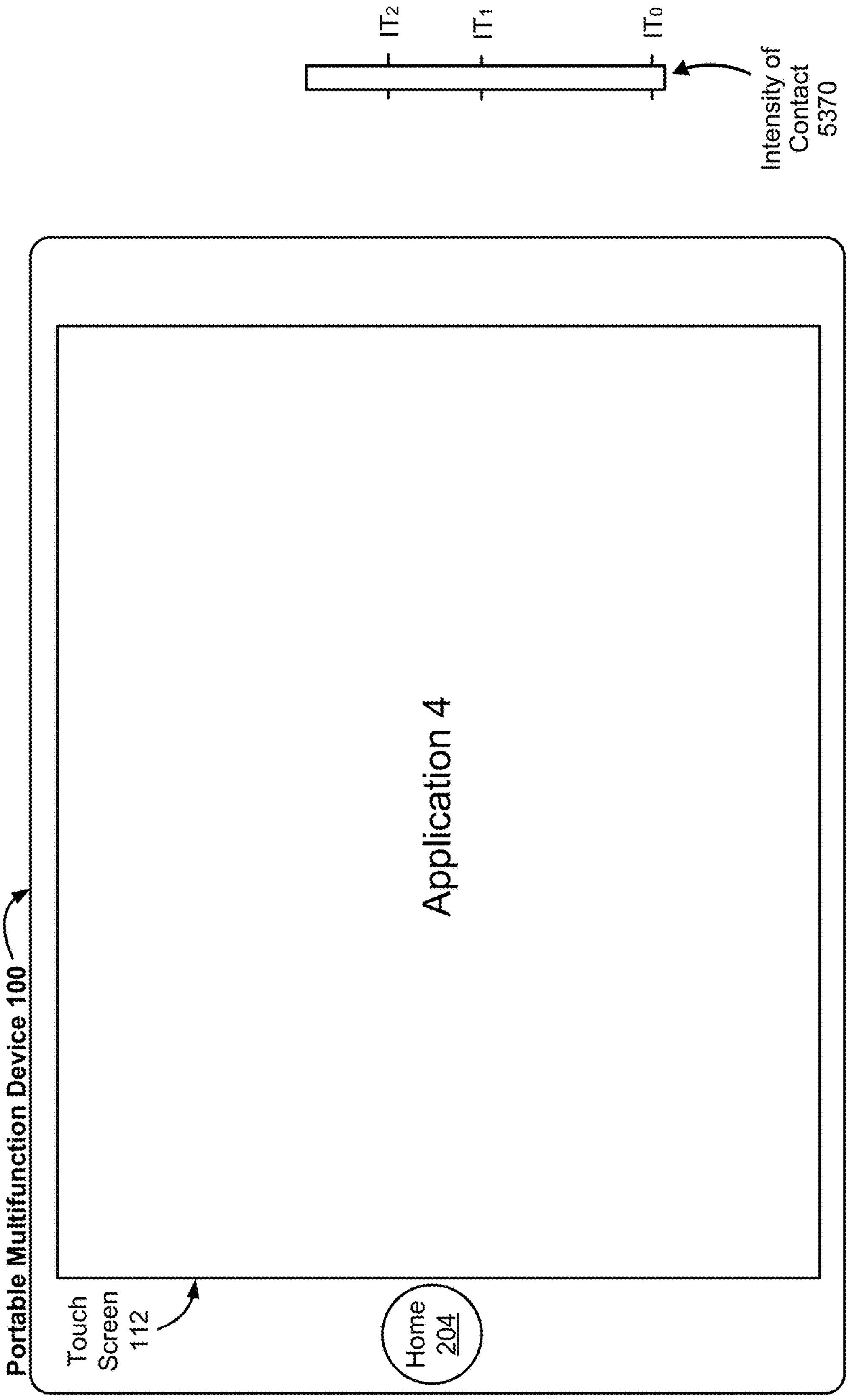

As shown in FIG. 53I, in accordance with a determination that the intensity of contact associated with contact 5360 exceeds the second threshold, the device 100 displays affordances associated with previously-displayed applications (e.g., the device 100 displays affordances for application 2, application 3, application 4, and application 5 in response to determining that the intensity of contact associated with contact 5360 has exceeded the second threshold). FIGS. 53J, 53K, and 53L show additional user interfaces shown on touch screen 112 in response to changes in the intensity of the contact 5360 and these additional user interfaces are described in more detail below in reference to FIG. 62C.

Additional details regarding FIGS. 53H-53L are provided below, in reference to FIGS. 62A-62C.

Attention is now directed to FIGS. 54A-54E, representing a flowchart of a method for activating and interacting with a shared screen mode, in accordance with some embodiments. In some embodiments, the method 5400 is performed by an electronic device with a touch-sensitive display (e.g., portable multifunction device 100, FIG. 1A). FIGS. 54A-54E correspond to instructions stored in a computer-readable storage medium (e.g., memory 102 of the portable multifunction device 100, FIG. 1A).

Figure 54A:
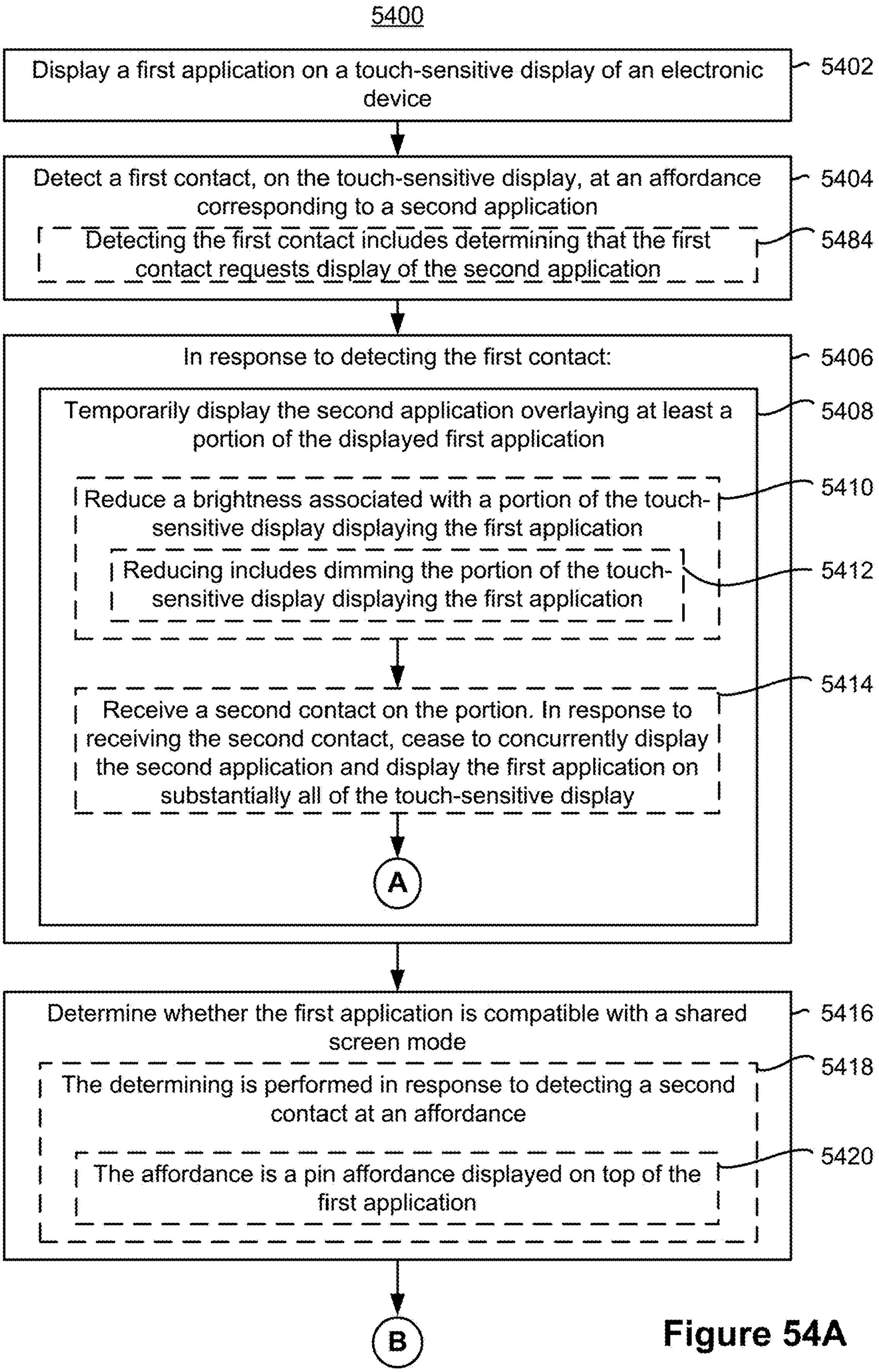

Referring now to FIG. 54A, the electronic device displays (5402) a first application on the touch-sensitive display (e.g., on touch screen 112, as pictured in FIG. 33A). The electronic device detects (5404) a first contact, on the touch-sensitive display, at an affordance corresponding to a second application (e.g., at an application-specific affordance for the second application that is displayed within an application selector). In some embodiments, detecting the first contact includes determining that the first contact requests display of the second application (e.g., the first contact is over an affordance displayed within an application selector, e.g., contact 3630 discussed in detail with respect to FIG. 36A). In response to detecting the first contact (5406), the electronic device temporarily displays (5408) the second application overlaying at least a first portion of the displayed first application (e.g., as pictured in FIGS. 41A and 36D, in which part of the content displayed within application 1 is not visible because application 2 is opaquely overlaying application 1). In some embodiments, the second application moves onto the display in accordance with movement of the first contact (e.g., as the first contact moves, more of the second application is displayed). In some embodiments, the temporary display of the second application only lasts while the first contact remains on the touch-sensitive display and, therefore, if a liftoff event is detected for the first contact, then the second application is no longer displayed and the first application is displayed in a full-screen mode.

In some embodiments, while temporarily displaying the second application, the electronic device optionally reduces (5410) a brightness associated with a second portion of the touch-sensitive display displaying the first application (e.g., FIG. 41B shows application 1 displayed with a reduced brightness). Reducing the brightness, in some embodiments, includes dimming (5412) the second portion of the touch-sensitive display displaying the first application. After reducing the brightness, the electronic device receives (5414) a second contact on the second portion (e.g., contact 4130, FIG. 41D). In response to receiving (or detecting) the second contact within the second portion, the electronic device ceases (5414) to concurrently display the second application and displays the first application on substantially all of the touch-sensitive display (e.g., as pictured in FIG. 41E). In some embodiments, after the first application is re-displayed on substantially all of the touch-sensitive display, a user of the electronic device is still able to conveniently redisplay the second application using a multi-finger gesture.

Figure 54B:
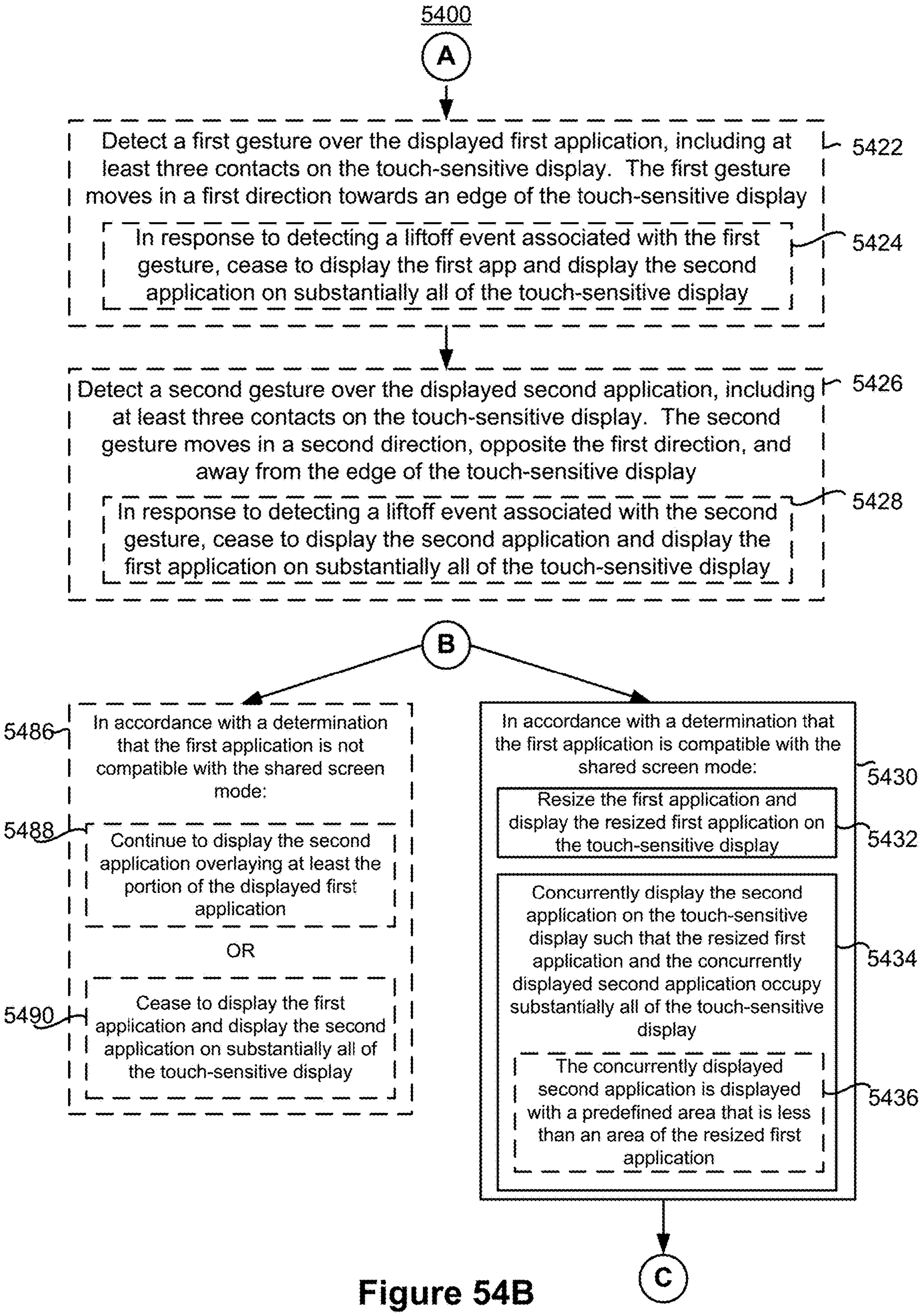

Specifically with reference to FIG. 54B, in some embodiments, the electronic device detects (5422) a first gesture over the displayed first application (e.g., gesture 5310, FIG. 53A), the first gesture including at least three contacts on the touch-sensitive display and the first gesture is moving in a first direction (e.g., a leftward direction). The first gesture moves in a first direction that is towards an edge of the touch-sensitive display. In response to detecting a liftoff event associated with the first gesture (5424), the electronic device ceases to display the first application and instead displays the second application on substantially all of the touch-sensitive display (as pictured in FIGS. 53B-53C, in which the previous application represents the second application and application 1 represents the first application). In some embodiments, previous and next applications are stored in device/global internal state 157 for retrieval by multitasking module 180 (FIG. 1A) in order to quickly switch between previous and next applications in response to the gesture discussed above.

Additionally, a similar gesture (similar to gesture 5310) allows users to redisplay the first application in an efficient and intuitive manner. Specifically, in some embodiments, the electronic device detects (5426) a second gesture over the displayed second application (e.g., gesture 5320, FIG. 53D), the second gesture moving in a second direction opposite the first direction and away from the edge of the touch-sensitive display. In response to detecting a liftoff event associated with the second gesture (5428), the electronic device ceases to display the second application and displays the first application on substantially all of the touch-sensitive display.

Returning back to FIG. 41A and the flowchart of FIG. 54A, while the second application overlays the first application on touch screen 112, the electronic device determines (5416) whether the first application is compatible with a shared screen mode (this determination is discussed in more detail above in the description of FIGS. 41A-41C). In some embodiments, determining whether the first application is compatible with the shared screen mode is performed in response to detecting a second contact at an affordance (5418). In some embodiments, the affordance is a pin affordance (as pictured in FIG. 41B and discussed above) displayed on top of the first application (5420).

Referring now to FIG. 54B, in accordance with a determination that the first application is not compatible with the shared screen mode (5486), the electronic device: (i) continues (5488) to display the second application overlaying at least the portion of the displayed first application; or (ii) ceases to display the first application and displays the second application on substantially all of the touch-sensitive display. In some embodiments, a user of device 100 is able to configure whether option i or option ii is chosen.

In accordance with a determination that that the first application is compatible with the shared screen mode (5430), the electronic device: (i) resizes the first application and display the resized first application on the touch-sensitive display (5432); and (ii) concurrently displays the second application on the touch-sensitive display such that the resized first application and the concurrently displayed second application occupy substantially all of the touch-sensitive display (5434, see also FIG. 41C). In some embodiments, the concurrently displayed second application is displayed with a predefined area that is less than an area of the resized first application (5436). For example, in some embodiments, the concurrently displayed second application is displayed so as to occupy 25% of the touch-sensitive display by default.

Figure 54C:
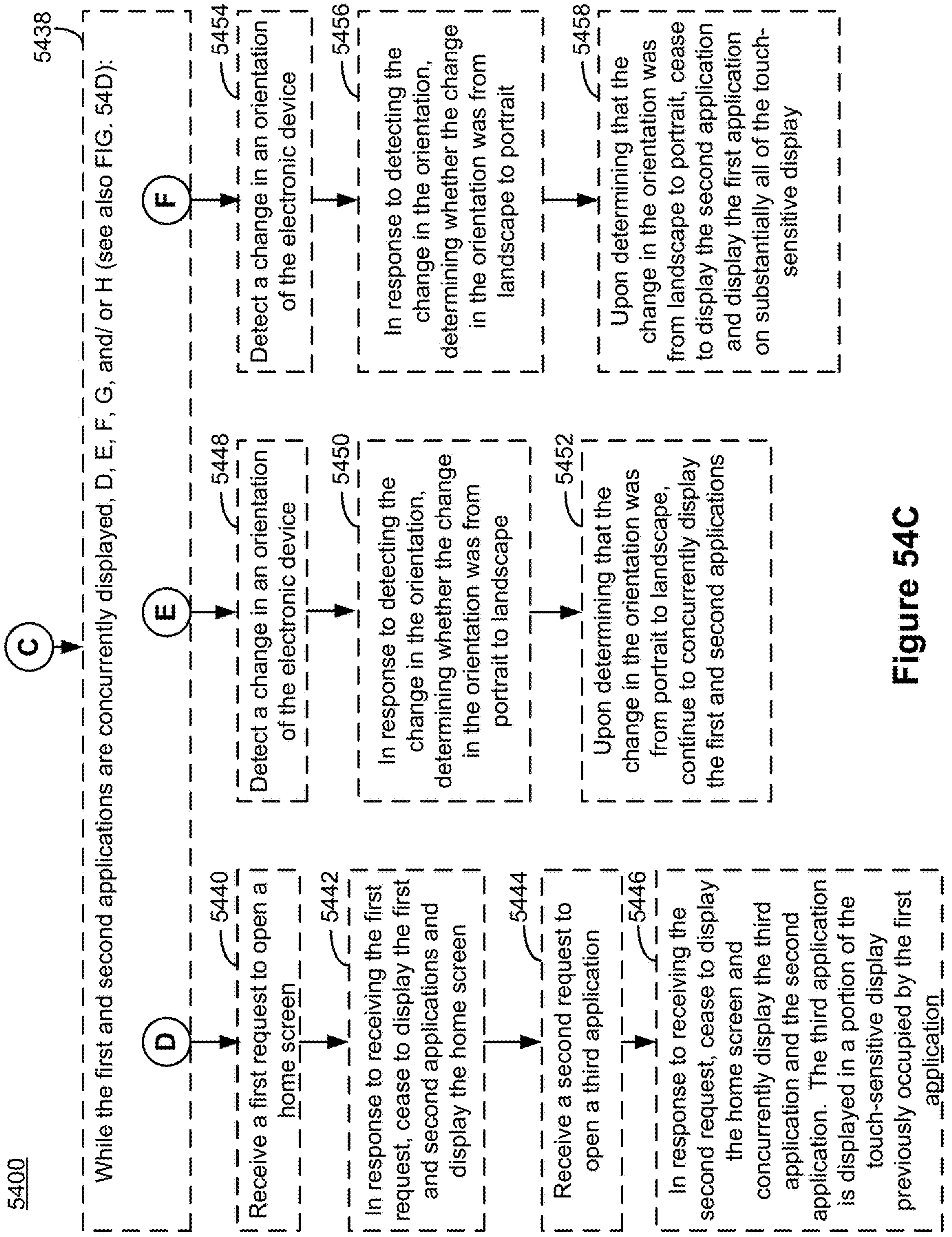

Continuing on with the current example and now referencing FIG. 54C, while the first and second applications are concurrently displayed (5438), the electronic device offers (i.e., makes available, activates, enables, etc.) a number of functions. For example, in some embodiments, users are able to access numerous distinct functions while the first and second applications are currently displayed, including at least the following: 1) interact with a home screen (5440-5446, FIG. 54C); 2) change an orientation of the electronic device (5448-5452 and 5454-5458, FIG. 54C); 3) swap the first and second applications on the touch-sensitive display (5460-5464, FIG. 54D); and 4) resize the first and second applications (5466-5482, FIG. 54E).

First, with reference to 5440-5446 of FIG. 54C, while the first and second applications are concurrently displayed (5438), the electronic device allows users to interact with a home screen. In some embodiments, the electronic device receives (5440) a first request to display a home screen (e.g., a press on home button 204, as pictured using contact 4510 in FIG. 45A). In response to receiving the first request (5442), the electronic device ceases to display the first and second applications and displays the home screen (e.g., FIG. 45B). The electronic device then receives (5444) a second request (e.g., touch input 4520 over application 5 in FIG. 45B) to open a third application. In response to receiving the second request (5446), the electronic device, in some embodiments, ceases to display the home screen and concurrently displays the third application and the second application (e.g., FIG. 45C). In some embodiments, the third application is displayed in a portion of the touch-sensitive display previously occupied by the first application.

Second, with reference to 5448-5452 of FIG. 54C, while the first and second applications are concurrently displayed (5438), the electronic device allows users to change an orientation of the electronic device from portrait to landscape. In some embodiments, the electronic device detects (5448) a change in the orientation of the electronic device. In response to detecting the change in the orientation (5450), the electronic device determines whether the change in the orientation was from portrait to landscape. Upon determining that the change in the orientation was from portrait to landscape (5452), the electronic device continues to display the first and second applications (e.g., as pictured in FIGS. 43C and 44A).

Third, with reference to 5454-5458 of FIG. 54C, while the first and second applications are concurrently displayed (5438), the electronic device allows users to change an orientation of the electronic device from landscape to portrait. In some embodiments, the electronic device detects (5454) a change in the orientation of the electronic device. In response to detecting the change in the orientation (5456), the electronic device determines whether the change in the orientation was from landscape to portrait. Upon determining that the change in the orientation was from landscape to portrait (5458), the electronic device ceases to display the second application and displays the first application on substantially all of the touch-sensitive display (e.g., as pictured in FIGS. 44A and 44B). Additionally, as pictured in FIG. 44C, a user can also change the orientation from portrait back to landscape and, in response to changing the orientation back to landscape (i.e., the user rotated the device from landscape to portrait and then back to landscape again, as in FIGS. 44A-44C), the concurrent display of the first and second applications is re-activated (e.g., FIG. 44C).

Fourth, with reference to 5460-5464 of FIG. 54D, while the first and second applications are concurrently displayed (5438), the electronic device allows users to swap the displayed locations of the first and second applications. In some embodiments, the electronic device detects (5460) a second contact on the first application (e.g., 801A of FIG. 8A) and a substantially simultaneous third contact on the second application (e.g., 801B of FIG. 8A). The electronic device detects (5462) a gesture (i) from a location of the second contact in a substantially circular direction towards the second application and (ii) from a location of the third contact in a substantially circular direction towards the first application (e.g., FIGS. 8A-8B). In response to detecting the gesture (5464), the electronic device then displays the first application in an area of the touch-sensitive display previously occupied by the second application and displays the second application in an area of the touch-sensitive display previously occupied by the first application (e.g., FIG. 8C).

Figure 54E:
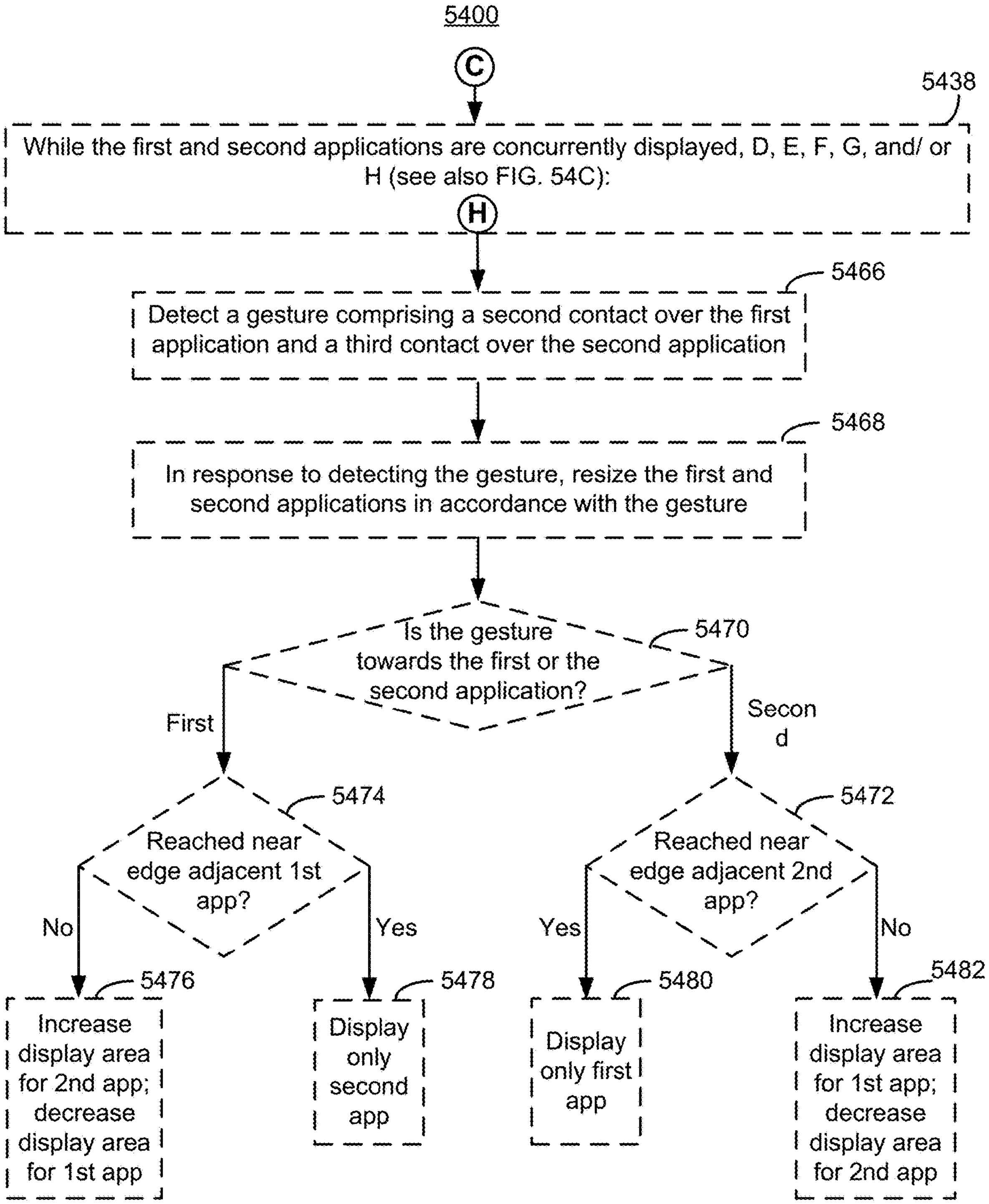

Fifth, with reference to 5466-5482 of FIG. 54E, while the first and second applications are concurrently displayed (5438), the electronic device allows users to resize the first and second applications. In some embodiments, the electronic device detects (5466) a gesture comprising a second contact over the first application and a third contact over the second application (e.g., 607A and 607B of FIG. 6B). In some circumstances, detecting the gesture includes detecting movement of the second and third contacts in a substantially horizontal direction on the touch-sensitive display (e.g., a leftward or a rightward direction). In some circumstances, the second and third contacts are substantially concurrent contacts, such that the second and third contacts make initial contact with the touch-sensitive display at substantially the same time. In response to detecting the gesture, the electronic device resizes (5468) the first and second applications in accordance with the gesture (e.g., FIGS. 6B-6C and FIGS. 6E-6F).

In some embodiments, the electronic device determines (5470) whether movement of the gesture is towards the first or the second application. If the electronic device determines that movement of the gesture is towards the first application (5470—First) and additionally determines that the gesture has reached near to (e.g., within a predetermined distance of) an edge of the touch-sensitive display adjacent to the first application (5474—Yes), then the electronic device displays (5478) only the second application and ceases to display the first application (in other words, the first application has been dismissed, e.g., FIGS. 6E-6G).

If the electronic device determines that movement of the gesture is towards the first application (5470—First) and additionally determines that the gesture has not reached near to (e.g., within a predetermined distance of) an edge of the touch-sensitive display adjacent to the first application (5474—No), then the electronic device increases (5476) a display area for the second application and decreases a display area for the first application (e.g., FIGS. 6E-6F).

If the electronic device determines that movement of the gesture is towards the second application (5470—Second) and additionally determines that the gesture has reached near to (e.g., within a predetermined distance of) an edge of the touch-sensitive display adjacent to the second application (5472—Yes), then the electronic device displays (5480) only the first application and ceases to display the second application (in other words, the second application has been dismissed, e.g., FIGS. 6B-6D).

If the electronic device determines that movement of the gesture is towards the second application (5470—Second) and additionally determines that the gesture has not reached near to (e.g., within a predetermined distance of) an edge of the touch-sensitive display adjacent to the second application (5472—No), then the electronic device increases (5482) a display area for the first application and decreases a display area for the second application (e.g., FIGS. 6B-6C).

Figure 55:
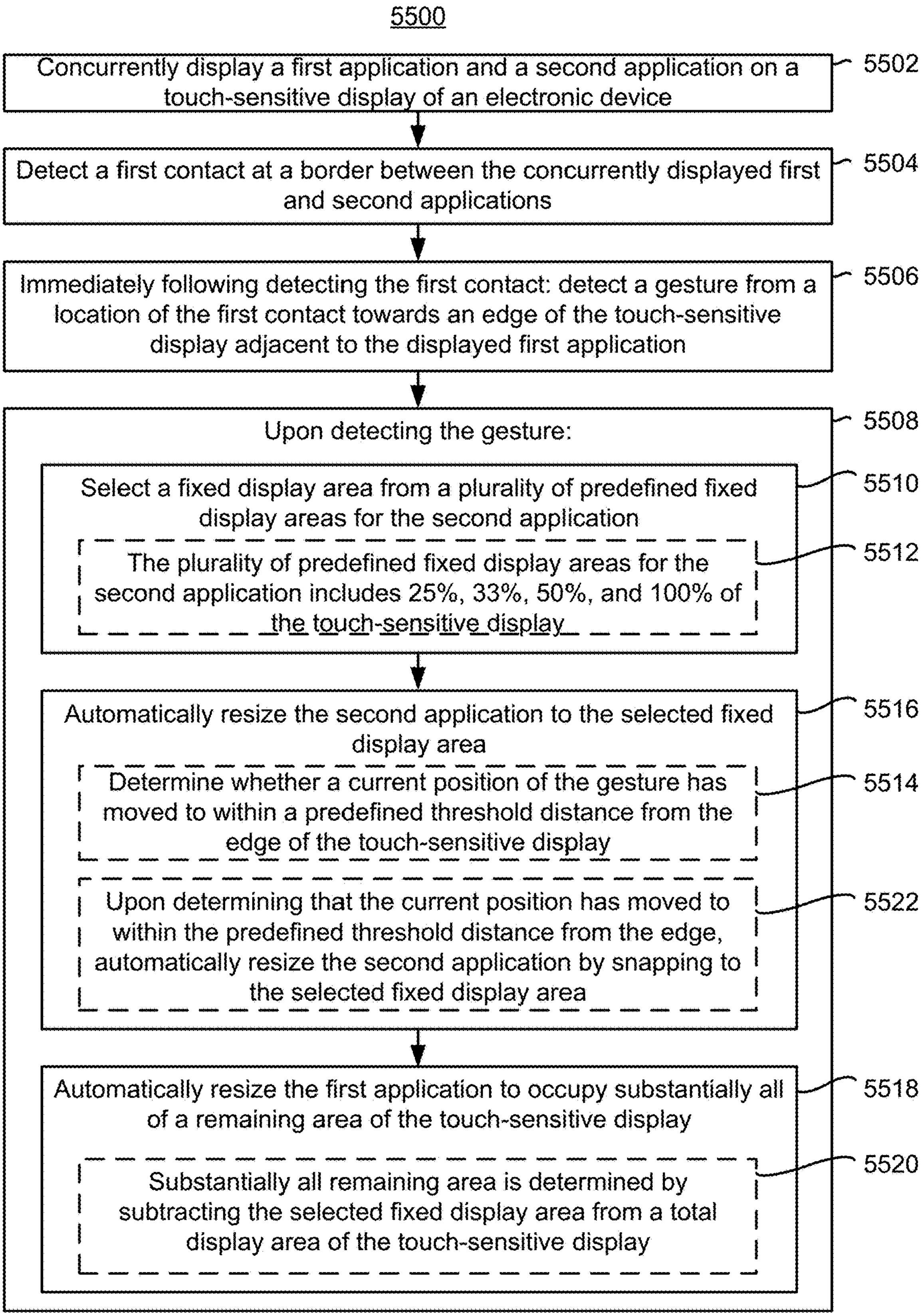

Attention is now directed to FIG. 55. FIG. 55 is a flowchart depicting a method 5500 of interacting with a shared screen mode, in accordance with some embodiments. The method 5500, in accordance with some implementations, is performed by an electronic device with a touch-sensitive display (e.g., portable multifunction device 100, FIG. 1A). FIG. 55 corresponds to instructions stored in a computer-readable storage medium (e.g., memory 102 of the portable multifunction device 100, FIG. 1A).

In some embodiments, the electronic device concurrently displays (5502) a first application and a second application on a touch-sensitive display of the electronic device (e.g., FIG. 40A). The electronic device detects (5504) a first contact at a border between the concurrently displayed first and second applications (e.g., gesture 4030, FIG. 40B). Immediately following detecting the first contact: the electronic device detects (5506) a gesture from a location of the first contact towards an edge of the touch-sensitive display adjacent to the displayed first application (e.g., gesture 4030, FIG. 40C). Upon detecting the gesture (5508) the electronic device: (i) selects (5510) a fixed display area from a plurality of predefined fixed display areas for the second application (e.g., the plurality of predefined fixed display areas for the second application includes 25%, 33%, 50%, and 100% of the (available screen real estate on the) touch-sensitive display (5512)); (ii) determines (5514) whether a current position of the gesture has moved to within a predefined threshold distance (e.g., distance threshold 4020, FIG. 40C) from the edge; (iii) automatically resizes the second application to the selected fixed display area (5516); and (iv) automatically resizes the first application to occupy substantially all of the a remaining area of the touch-sensitive display (5518). In some embodiments, substantially all remaining area is determined by subtracting the selected fixed display area from a total display area of the touch-sensitive display (5520). In some embodiments, the first and second applications are not automatically resized until after the determination reveals that the gesture has moved beyond the predefined threshold distance away from the edge (or moved a predefined distance or moved to a threshold position on the touch-sensitive display or moved to within a threshold distance of an edge of the touch-sensitive display). In some embodiments, resizing the second application to the selected fixed display area includes: (i) determining (5514) whether the current position of the gesture has moved to within the predefined threshold distance (e.g., distance threshold 4020, FIG. 40C) from the edge of the touch-sensitive display; and (ii) upon determining that the current position has moved to within the predefined distance threshold, the electronic device automatically resizes (5522) the second application by snapping to the selected fixed display area. Stated another way, the second application is not resized until the current position of the gesture has moved to within the predefined threshold distance from the edge and, thus, when the current position is determined to be within the predefined threshold distance from the edge, the second application appears to jump to a larger size (e.g., the selected fixed display area). In some embodiments, instead of (or in addition to) determining a current position of the gesture, the device also determines a current position of the border between applications 1 and 2 as the gesture moves across the touch-sensitive display and the device compares the current position of the border to the predefined threshold distance from the edge of the touch-sensitive display. In some embodiments, the device monitors a distance travelled by the gesture (or by the border) and determines whether the distance travelled satisfies a threshold distance travelled on the touch-sensitive display, in order to determine when to snap the second application to the selected fixed display area.

Figure 56:
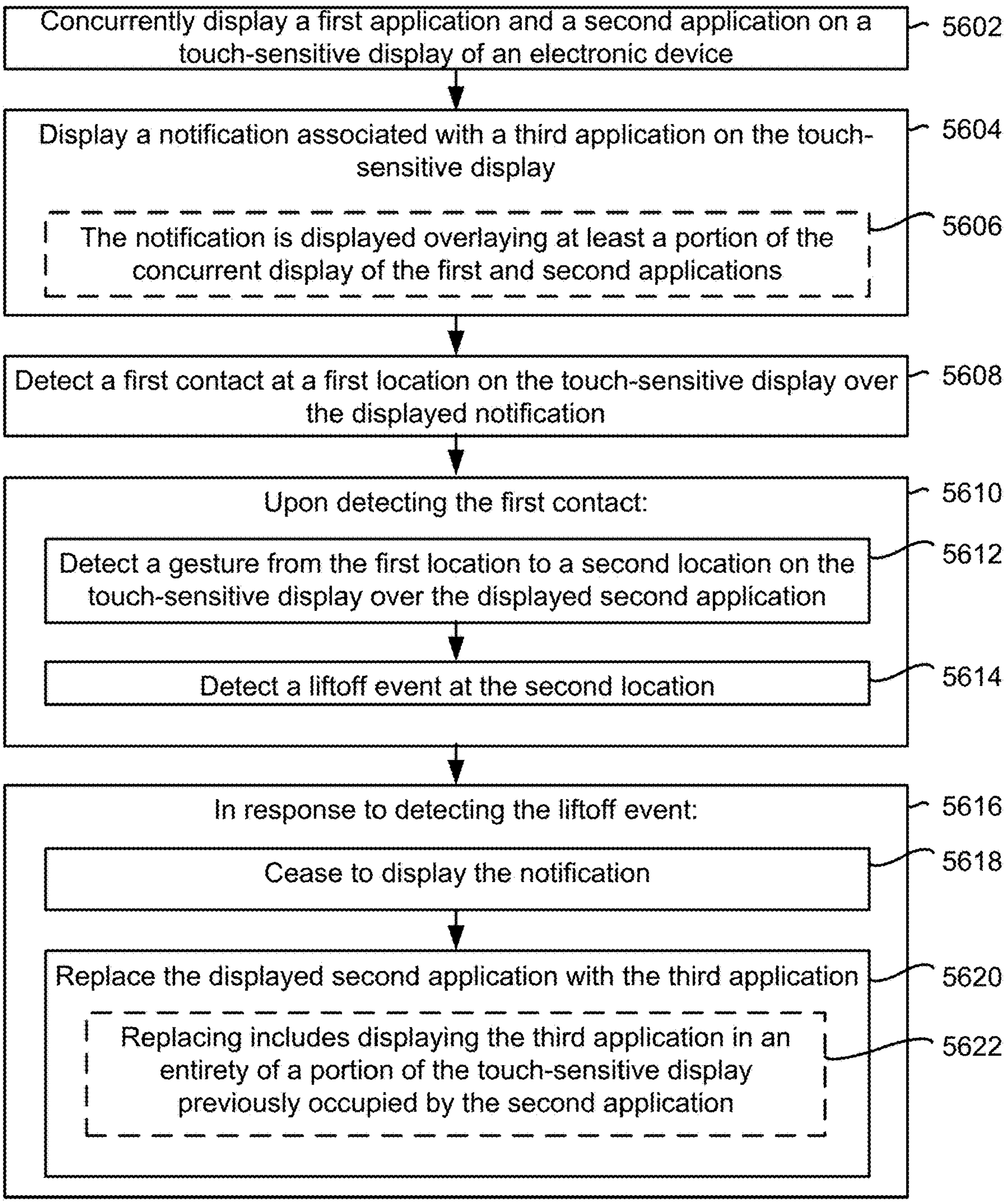

Attention is now directed to FIG. 56. FIG. 56 is a flowchart depicting a method 5600 of interacting with notifications while in a shared screen mode, in accordance with some embodiments. The method 5600, in accordance with some embodiments, is performed by an electronic device with a touch-sensitive display (e.g., portable multifunction device 100, FIG. 1A). FIG. 56 corresponds to instructions stored in a computer-readable storage medium (e.g., memory 102 of the portable multifunction device 100, FIG. 1A).

In some embodiments, the electronic device concurrently displays (5602) a first application and a second application on the touch-sensitive display. The electronic device displays (5604) a notification associated with a third application on the touch-sensitive display (e.g., FIG. 46A). In some embodiments, the notification is displayed overlaying (5606) at least a portion of the concurrent display of the first and second applications (e.g., as pictured in FIG. 46A and discussed in more detail above with reference to FIGS. 46A-47C).

The electronic device, in some embodiments, detects (5608) a first contact at a first location on the touch-sensitive display over the displayed notification (e.g., gesture 4610, FIG. 46B). Upon detecting the first contact (5610), the electronic device: (i) detects (5612) a gesture from the first location to a second location on the touch-sensitive display over the display second application (e.g., FIG. 46B); and (ii) detects a liftoff event (5614) at the second location (e.g., the user's finger of gesture 4610 is removed from the touch-sensitive display). In response to detecting the liftoff event (5616), the electronic device: (i) ceases to display (5618) the notification; and (ii) replaces (5620) the displayed second application with the third application (e.g., as pictured in FIG. 46C). In some embodiments, replacing includes displaying the third application in an entirety of a portion of the touch-sensitive display previously occupied by the second application (5622).

Further details relating to some embodiments of methods 5400, 5500, and 5600 are also provided in more detail above, in reference to FIGS. 33-53E.

Attention is now directed to FIGS. 57A-57C. FIGS. 57A-57C depict a flowchart of a method 5700 of activating and interacting with an application selector, in accordance with some embodiments. The method 5700, in accordance with some implementations, is performed by an electronic device with a touch-sensitive display (e.g., portable multifunction device 100, FIG. 1A). FIGS. 57A-57C correspond to instructions stored in a computer-readable storage medium (e.g., memory 102 of the portable multifunction device 100, FIG. 1A).

In some embodiments and as shown in FIG. 57A, the electronic device displays (5702) a first application in a full-screen mode on the touch-sensitive display and receives (5704) a first contact (over the first application and) on the touch-sensitive display (e.g., gesture 3325, FIG. 33C or gesture/contact 3930, FIG. 39C). In some embodiments, the first contact is at an affordance used to launch the application selector (5706). In some embodiments, before receiving the first contact, the electronic device detects a gesture on the touch-sensitive display at a location on the touch-sensitive display that is away from a middle area of the touch-sensitive display (e.g., gesture 3910, FIG. 39A). In response to detecting the gesture, the electronic device displays an affordance used to launch the application selector (e.g., tongue affordance 3920, FIG. 39B). In some embodiments, tongue affordance 3920 is displayed on the touch-sensitive display if a currently displayed application (e.g., application 1, FIG. 39B) is compatible with the shared screen mode and, thus, in these embodiments a gesture is not needed to activate display of the tongue affordance.

In response to receiving the first contact, the electronic device displays (5708) an application selector on the touch-sensitive display (e.g., FIGS. 33D and 39D). In some embodiments, the displayed application selector overlays (5710) at least a portion of the displayed first application. Displaying the application selector, in some embodiments, includes revealing (5710) a first portion of the application selector (e.g., FIG. 33C) and revealing additional portions of the application selector in accordance with movement (i.e., as the gesture moves, more of the application selector continues to be revealed/displayed, e.g., FIGS. 33C-33D).

In some embodiments, displaying the application selector also includes populating (5712) the application selector with a plurality of default affordances (e.g., affordances for applications 2-5 are displayed in application selector 182, FIG. 33D). After initially populating the application selector with the plurality of default affordances, in some embodiments, the electronic device gradually replaces (5714) one or more default affordances with affordances selected in accordance with a user's application usage history (e.g., if application 2 is rarely used by a particular user, but the particular user's application usage history shows that application 10 is used daily, then an affordance for application 10, in some embodiments, replaces the affordance for application 2, while in other embodiments, the affordance for application 10 moves to a location within application selector 182 above application 2). In some embodiments, the application usage history is stored on a per application basis with multitasking data 176 of a respective application 136-1 (FIG. 1). In some embodiments, instead of replacing the default affordances, the device 100 adds additional affordances to the application selector based on the particular user's application usage history.

In some embodiments, while displaying the application selector, the electronic device displays (5750) a first set of affordances within the application selector and detects (5752) a gesture substantially within the application selector. In response to detecting the gesture (5754), the electronic device: (i) determines whether the application selector is associated with additional affordances not contained within the first set of affordances; (ii) in accordance with a determination that the application selector is associated with additional affordances, displays one or more of the additional affordances (e.g., FIGS. 35A-35B); and (iii) in accordance with a determination that the application selector is not associated with additional affordances, continues to display the first set of affordances.

Turning now to FIG. 57B, in some embodiments, the electronic device detects (5716) a second contact at an affordance (e.g., contact 3630 at affordance for application 2, FIG. 36A) displayed within the application selector (e.g., at a default affordance or at one of the affordances selected in accordance with a user's application usage history). Detecting the second contact, in some embodiments, includes determining (5718) whether an intensity (e.g., as determined by contact intensity sensor(s) 165, FIG. 1A) associated with the second contact satisfies an intensity threshold. For example, intensity thresholds, in some embodiments, are utilized to activate different functions based on pressure (or an intensity of a contact) applied to the touch-sensitive display of the electronic device (e.g., more pressure applied to the touch screen 112, in some embodiments, triggers a function to allow removal of affordances from application selector 182, while less pressure, in these embodiments, triggers opening of the application associated with the affordance).

In response to detecting the second contact at the affordance (5720), the electronic device: (i) ceases to display the application selector (5722, FIGS. 36A-36B); and (ii) displays (5724) a second application corresponding to the selected affordance in an area of the touch-sensitive display previously occupied by the application selector (e.g., application 2, FIG. 36B, is displayed in the area previously occupied by application selector 182, FIG. 36A).

In some embodiments of method 5700 and as diagrammed in FIG. 57C, the electronic device then displays (5726) content within the first application or the second application (or the content is already displayed within either application, e.g., content 4210, FIG. 42A and FIG. 42B). The electronic device detects (5728) a gesture, at a location of the displayed content, moving towards an edge of the touch-sensitive display (e.g., gesture 4230, FIG. 42C).

In response to detecting the gesture, the electronic device determines (5730) whether the gesture has moved to within a predetermined distance of the edge (e.g., 0 cm, 1 cm, or 2 cm or 2 pixels, 5 pixels, or 7 pixels) of the touch-sensitive display. Upon determining that the gesture has moved to within a predetermined distance of the edge, the electronic device temporarily displays the application selector with a plurality of affordances (e.g., FIG. 42D). The plurality of affordances, in some embodiments, is filtered (5734) to display affordances corresponding only to applications capable of displaying (or emailing, editing, accessing, etc.) the content.

The electronic device then detects (5736) movement of the gesture towards a displayed affordance within the application selector and the displayed affordance corresponds to a third application (e.g., application 4 of FIG. 42D). In some embodiments, the electronic device detects (5738) a liftoff of the gesture from the touch-sensitive display and, in response to detecting the liftoff (5740), opens the third application and displays the content within the third application (e.g., as pictured in FIG. 42E, application 4 now displays content 4210).

To provide users with the ability to customize affordances displayed within the application selector, some embodiments also provide gestures for removal of affordances from the application selector. For example, in some embodiments and as diagrammed in FIG. 57C, the electronic device detects (5742) a third contact at an affordance displayed within the application selector (e.g., contact 3810 of FIG. 38A). In some embodiments, the third contact lasts (in other words, remains in contact with the touch-sensitive display) for an amount of time that is monitored by the electronic device, or a component thereof (e.g., contact/motion module 130, FIG. 1A). Next, the electronic device determines (5744) whether the amount of time satisfies a threshold amount of time (e.g., 2 seconds, 3 seconds, or 4 seconds) and upon determining that the amount of time satisfies the threshold, the electronic device displays an x-symbol within the application selector (e.g., x-symbols 3820 of FIG. 38B). In some embodiments, the electronic device also modifies the visual appearance of the affordances within the application selector so that they appear to jiggle or sway slowly (e.g., FIG. 38B). In some embodiments, the electronic device detects (5748) a fourth contact at the x-symbol (e.g., contact 3830 at x-symbol 3820 displayed on the affordance for application 2, FIG. 38B). In response to detecting the fourth contact, the electronic device removes an affordance from the application selector (e.g., application 2 is removed from application selector 182, FIGS. 38B-38C).

Further details relating to some embodiments of method 5700 are also provided in more detail above, in reference to FIGS. 33-53E.

Attention is now directed to FIGS. 58 and 59A-59B. FIGS. 58 and 59A-59B depict flowcharts of methods 5800 and 5900, respectively, of activating and interacting with full-screen and reduced size video content, in accordance with some embodiments. The methods 5800 and 5900, in accordance with some implementations, are performed by an electronic device with a touch-sensitive display (e.g., portable multifunction device 100, FIG. 1A). FIGS. 58 and 59A-59B correspond to instructions stored in a computer-readable storage medium (e.g., memory 102 of the portable multifunction device 100, FIG. 1A).

As shown in FIG. 58, in some embodiments, the electronic device plays (5802) video content in a full-screen mode on the touch-sensitive display (e.g., playing video content 4810 of FIG. 48A). While playing the video content in the full-screen mode, the electronic device in some embodiment detects (5804) a selection of a hardware button of the electronic device (e.g., contact 4820 at home button 204, FIG. 48A).

In response to detecting the selection, the electronic device: (i) resizes (5808) the video content to fit within a reduced area of the touch-sensitive display; and (ii) displays (5810) the resized video content overlaying a screen associated with the hardware button (e.g., a home screen, FIG. 48B). In some embodiments, the electronic device then detects (5812) a first contact on the home screen at a location that corresponds to an affordance associated with a first application (e.g., contact 4970 at a browser icon) and ceases (5814) to display the home screen and displays the first application (e.g., home screen is no longer displayed and browser module 147 is displayed, FIG. 49B).

The electronic device, in some embodiments, next determines (5816) whether the first application contains any content of a predetermined content type. The predetermined content type is optionally identified by the first application (5818) and/or the predetermined content type is optionally identified by a user (5820). Upon determining that the first application contains content of the predetermined content type, the electronic device: (i) determines (5824) one or more locations on the touch-sensitive display that correspond to the content of the predetermined content type; and (ii) resizes and/or moves (5826) the resized video content to avoid the one or more locations (e.g., as pictured in FIG. 49B, resized video content corresponding to playing video content 4810 avoids primary news article 4955 displayed within browser module 147).

Figure 48C:
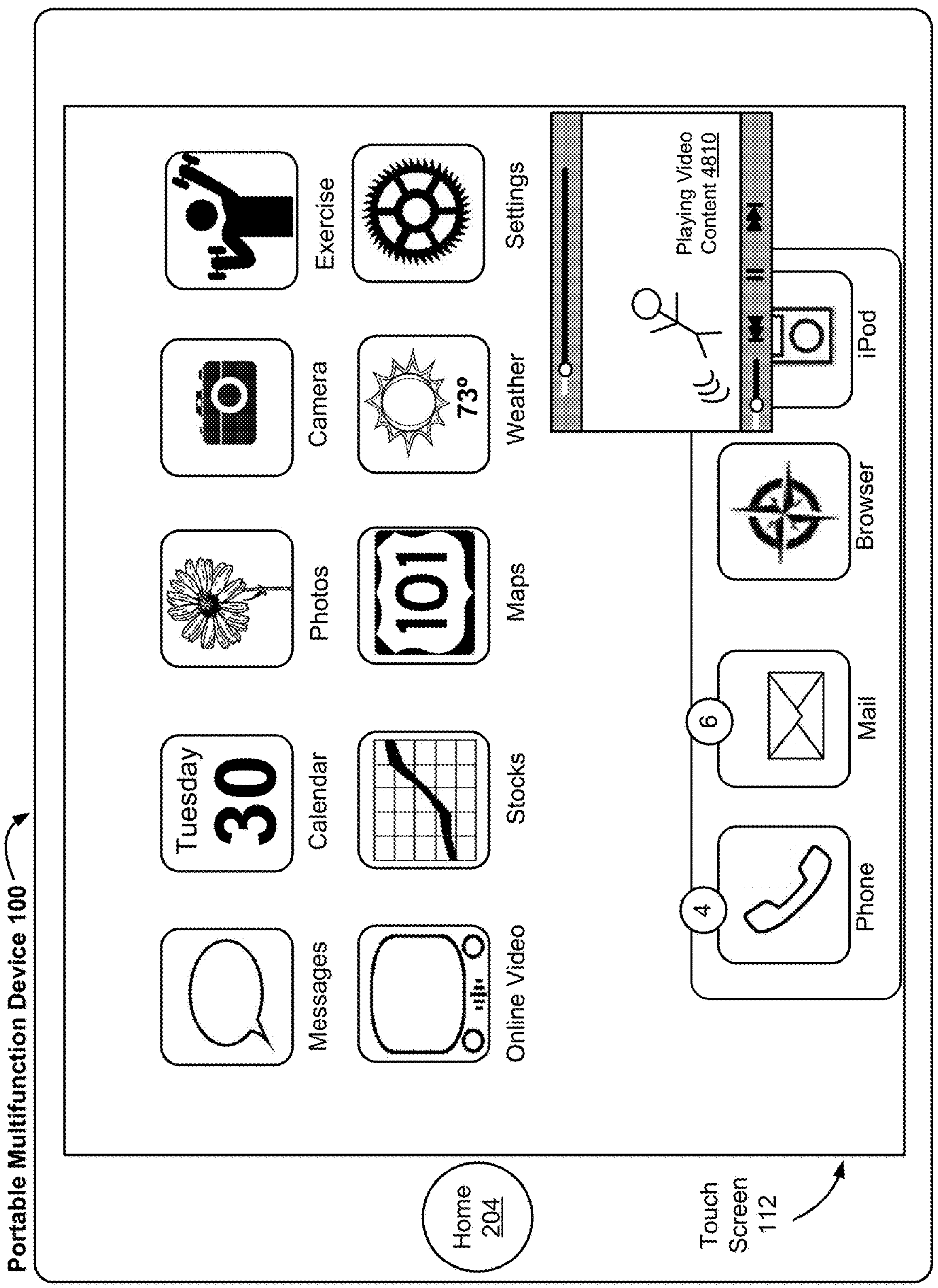
Figure 49B:
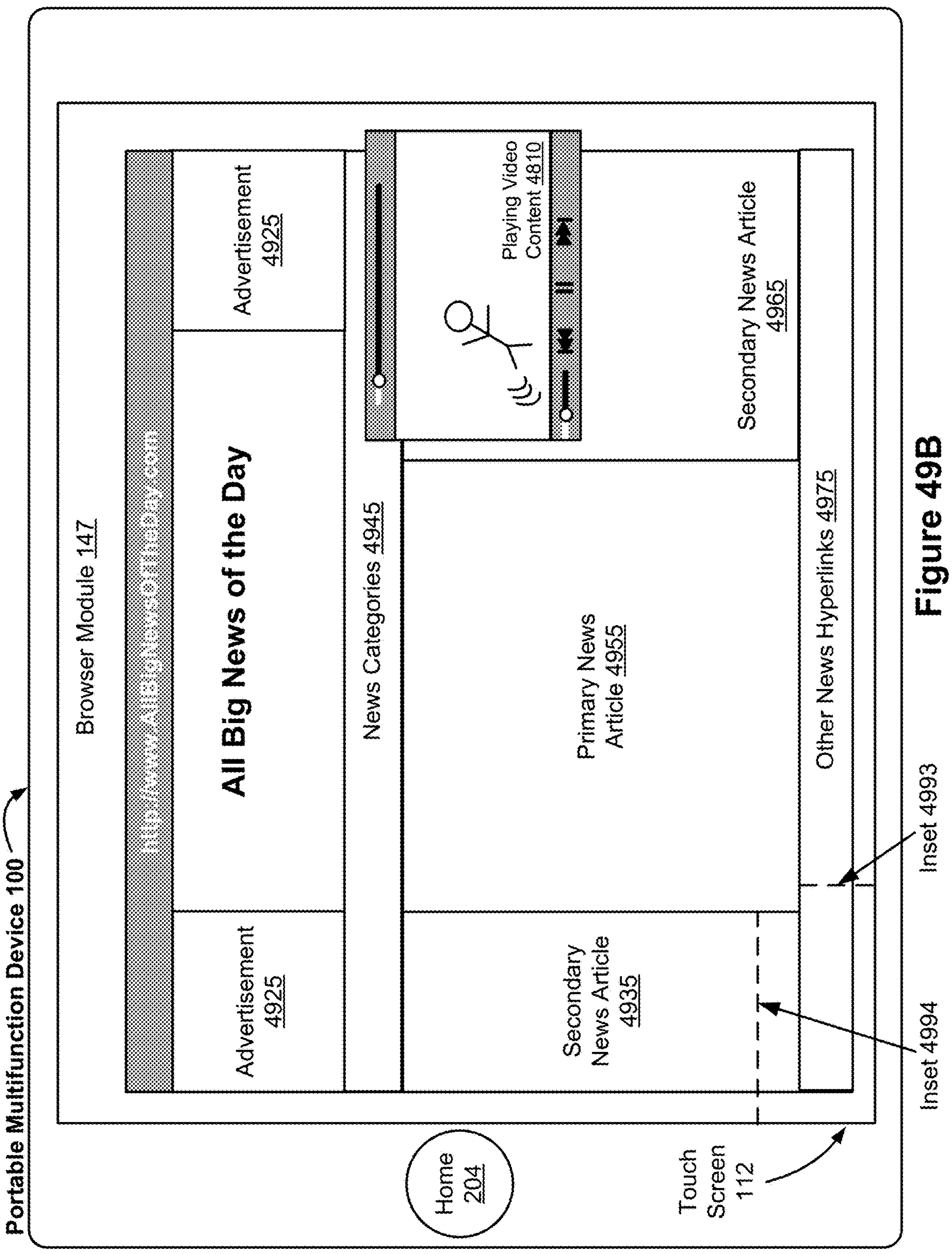

In some embodiments, the electronic device detects a second contact (5828) on the resized video content and, in response to detecting the second contact, moves the resized video content in accordance with movement of the contact on the touch-sensitive display (e.g., gesture 4850 on playing video content 4810 moves in a downward direction and, in response to gesture 4850, playing video content 4810 moves to a new location, FIGS. 48B-48C).

Figure 50B:
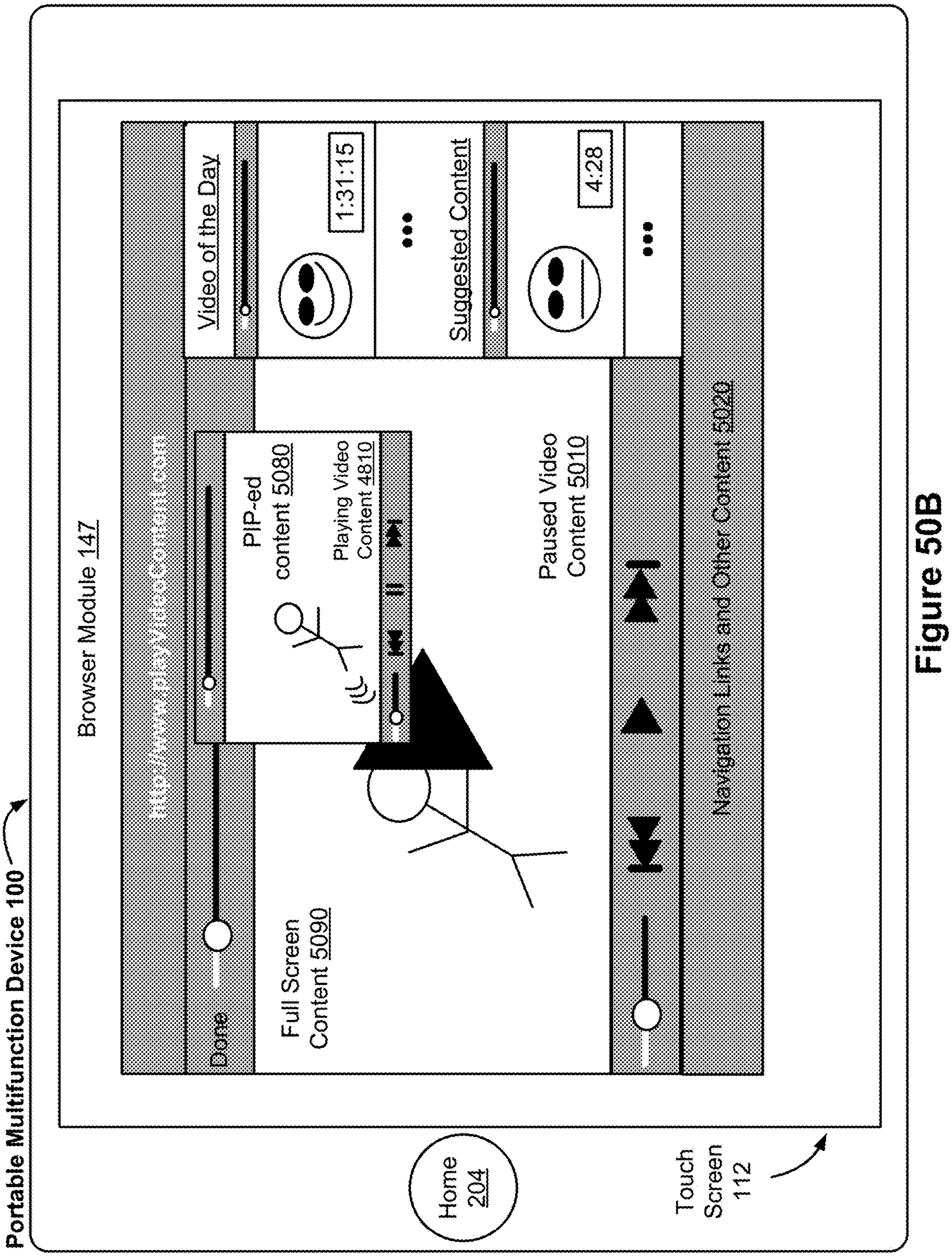

In some embodiments, numerous additional gestures are provided to allow users to interact with full size and reduced size video content. For example, some embodiments of a method 5900 are shown in FIG. 59A. Specifically, in some embodiments, the electronic device plays (5902) video content associated with a first application in a full-screen mode on the touch-sensitive display. While playing the video content in the full-screen mode, the electronic device receives (5904) a pinch gesture at the displayed video content (e.g., gesture 5030, FIG. 50A). In response to receiving the pinch gesture (5906): the electronic device: (i) determines (5908) a reduced display size for the video content (e.g., an appropriate PIP size); (ii) resizes (5912) the video content to the reduced display size; and (iii) displays (5914) the video content having the reduced display size overlaying a portion of the first application. FIGS. 50A and 50B provide exemplary user interfaces for the pinch gesture and the exemplary three steps taken in response to receiving the pinch gesture, in accordance with some embodiments. In some embodiments, the reduced display size is determined in accordance with a characteristic (e.g., velocity, distance travelled, or location of a liftoff event (5910)) of the pinch gesture.

In some embodiments, the electronic device detects (5916) a de-pinch gesture on the resized video content (e.g., gestures 5220 and 5230, FIGS. 52A and 58B, respectively). In response to detecting the de-pinch gesture (5918), the electronic device determines whether a characteristic (e.g., velocity, distance travelled, or location of a liftoff event (5920)) of the de-pinch gesture satisfies a threshold. Upon determining that the characteristic of the de-pinch gesture satisfies the threshold, the electronic device automatically displays (5922) the resized video content in a full-screen mode (e.g., FIG. 52A shows a de-pinch gesture that resizes the video content to less than full-screen (i.e., characteristic of the de-pinch gesture did not satisfy the threshold) and FIG. 52B shows a de-pinch gesture that satisfies a threshold 5210 and, thus, FIG. 52D shows the video content in full-screen mode again).

In some embodiments of the method 5900, additional gestures are provided that allows users to send resized video content to various other devices (i.e., other than the electronic device). For example, in some embodiments, the electronic device detects (5924) a gesture on the resized video content (e.g., gesture 5150, FIG. 51A) and then determines (5926) whether the gesture is of a predetermined type. The predetermined type, in some embodiments, is selected (5928) from the group consisting of: (i) a flick gesture having a velocity exceeding a predefined velocity; and (ii) a flick gesture travelling more than a predefined distance on the touch-sensitive display. In other embodiments, the predetermined type is a custom gesture configured, customized, and/or created by a user of the electronic device (5930). In some embodiments, upon determining that the gesture is of the predetermined type, the electronic device transmits (5932) the video to a video playback device separate and apart from the electronic device (e.g., television 5130, FIG. 51B).

Further details relating to some embodiments of methods 5800 and 5900 are also provided in more detail above, in reference to FIGS. 33-53E.

Figure 60A:
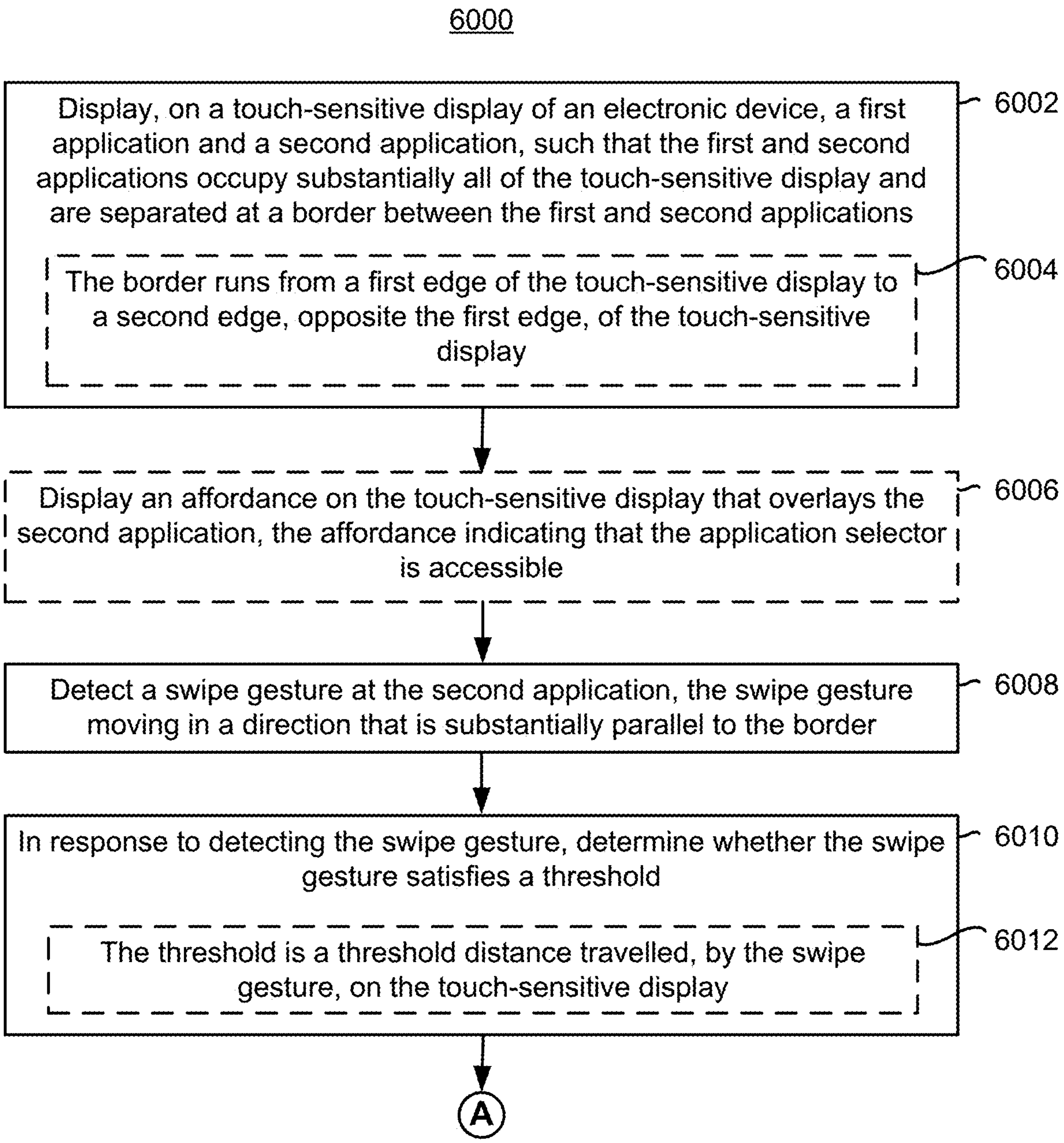
FIGS. 60A-60B are flowcharts depicting methods of activating and interacting with an application selector, in accordance with some embodiments.
Figure 60B:
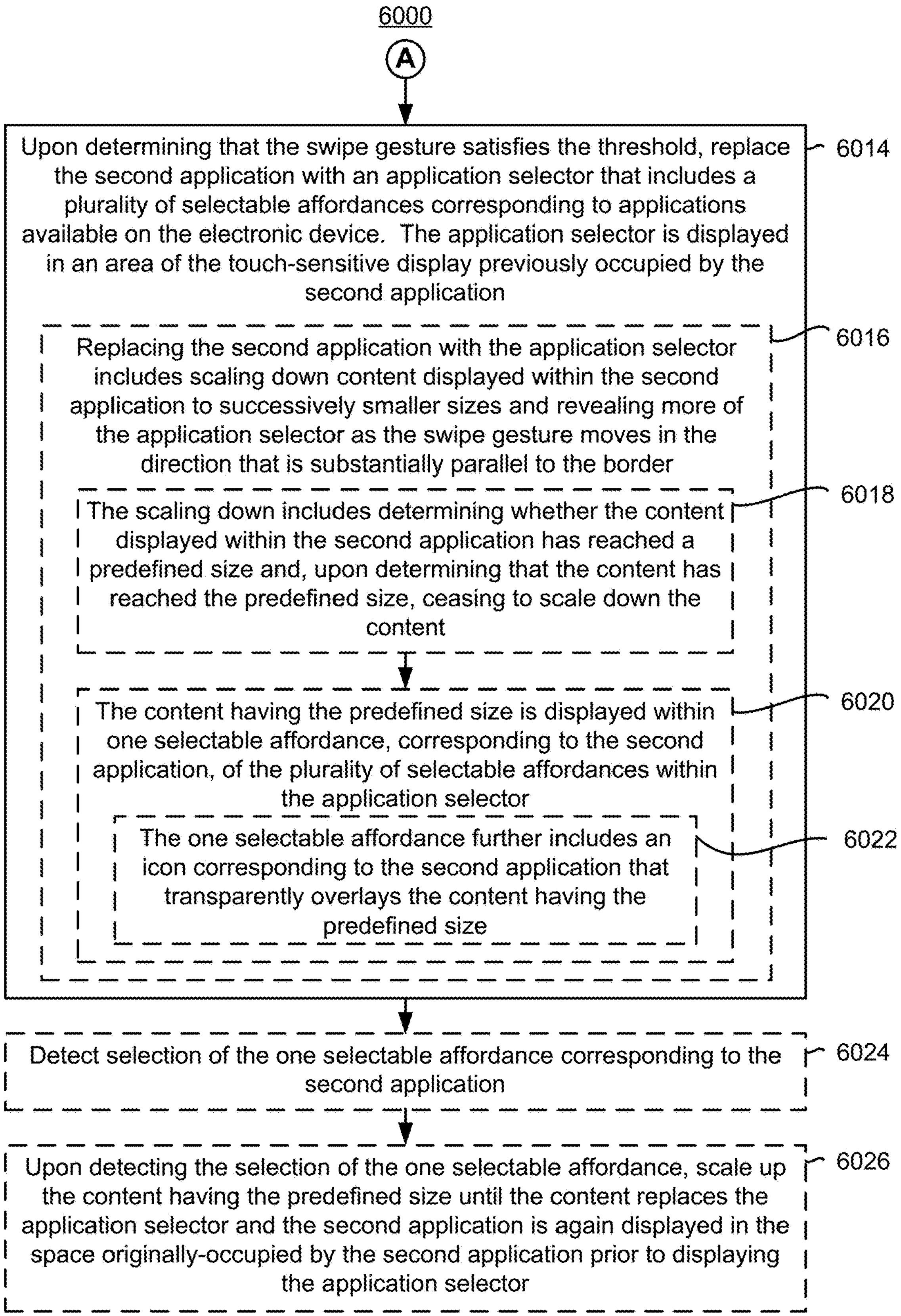

Attention is now directed to FIGS. 60A-60B, depicting flowcharts of a method 6000 of activating and interacting with an application selector, in accordance with some embodiments. The method 6000, in accordance with some embodiments, is performed by an electronic device with a touch-sensitive display (e.g., portable multifunction device 100, FIG. 1A). In some embodiments, FIGS. 60A-60B correspond to instructions stored in a computer-readable storage medium (e.g., memory 102 of the portable multifunction device 100, FIG. 1A).

As shown in FIG. 60A, in some embodiments, method 6000 begins when the electronic device displays (6002), on the touch-sensitive display, a first application (e.g., application 1, FIG. 36B) and a second application (e.g., application 2), such that the first and second applications occupy substantially all of the touch-sensitive display (e.g., applications 1 and 2 are displayed in the shared screen view and occupy substantially all of the display) and are separated at a border between the first and second applications (e.g., border 3692). In some embodiments, the border runs (6004) from a first edge of the touch-sensitive display to a second edge, opposite the first edge of the touch-sensitive display. In some embodiments, the border is a vertical border that separates the first application from the second application and the border runs from a top edge of the touch-sensitive display to a bottom edge. In some embodiments, the border is not a distinct user interface element but is instead the line or point at which the first and second applications meet on the touch-sensitive display (e.g., an imaginary line at the interface between the applications).

In some embodiments, the device displays (6006) an affordance on the touch-sensitive display that overlays the second application, the affordance indicating that the application selector is accessible. In this way, a user of the device is provided with a visual indication that the application selector is accessible. In some embodiments, the affordance includes a transparent (or translucent) horizontal bar-shaped user interface element that overlays a top portion of the second application. In some embodiments, the affordance includes text that provides additional information about accessing the application selector (e.g., "swipe to display app selector").

In some embodiments, method 6000 continues when the device detects (6008) a swipe gesture at the second application (e.g., gesture 3640-2, FIG. 36B), the swipe gesture moving in a direction that is substantially parallel to the border. In some embodiments, the gesture 3640-2 begins at or near a top edge of the touch-sensitive display (e.g., a top edge that borders the second application (application 2 in FIG. 36B)) and proceeds in a substantially downward, vertical direction towards a bottom edge (opposite to the top edge) of the touch-sensitive display. In response to detecting the swipe gesture, the device determines (6010) whether the swipe gesture satisfies a threshold. In some embodiments, the determination is made when a characteristic associated with the gesture (e.g., velocity, distance travelled, and the like) changes. In some embodiments the threshold (6012) is a threshold distance travelled, by the swipe gesture (e.g., gesture 3640-2), on the touch-sensitive display. For example, threshold 3685 (FIG. 36E) represents a position on the touch-sensitive display that, once passed by the gesture 3640-2, results in the determination indicating that the threshold has been satisfied (in other words, after the gesture 3640-2 crosses over threshold 3685, the device determines that the threshold 3685 is satisfied).

Upon determining that the swipe gesture satisfies that threshold, the device replaces (6014) the second application with an application selector that includes a plurality of selectable affordances corresponding to applications available on the electronic device. The application selector is displayed in an area of the touch-sensitive display previously occupied by the second application (FIG. 36E).

In some embodiments, replacing the second application with the application selector includes (6016) scaling down the second application (and content displayed therein) to successively smaller sizes and revealing more of the application selector as the swipe gesture moves in the direction that is substantially parallel to the border. Stated another way, replacing includes gradually replacing and gradually scaling down, in accordance with movement of the gesture 3640-2 in the downward direction, such that more of the application selector is revealed as the gesture travels closer to the bottom edge of the touch-sensitive display, and such that the content associated with the second application is gradually scaled down as the gesture 3640-2 travels in the downward direction (e.g., content 3602 in FIG. 36B (illustrating a first size for content 3602) and FIG. 36E (illustrating a second, scaled-down size for content 3602)).

In some embodiments, the scaling down includes (6018) determining whether the second application has reached a predefined size and, upon determining that the second application has reached the predefined size, ceasing to scaled down the second application (and the content displayed therein). In some embodiments, the predefined size is determined by the device after detecting that the gesture 3640-2 has satisfied the threshold. In some embodiments, as the content is scaled down from the first size (e.g., content 3602 in FIG. 36B) to the predefined size (e.g., content 3602 in FIG. 36F), the device blurs the content 3602 (e.g., content 3602 in FIG. 36E is displayed in a blurry format). In this way, as the gesture 3640-2 moves and the second application continues to be scaled down accordingly, the user sees only a blurred version of the content displayed within the second application.

In some embodiments, the content having the predefined size is displayed (6020) within a particular selectable affordance, corresponding to the second application, of the plurality of selectable affordances within the application selector (as shown in FIG. 36E). In some embodiments, the particular selectable affordance further includes (6022) an icon corresponding to the second application that overlays (or transparently overlays) the content having the predefined size. In some embodiments, the device also detects (6024) selection of the particular selectable affordance (e.g., content 3670, FIG. 36F) corresponding to the second application. Upon detecting the selection of the particular selectable affordance, the device scales up (6026) the content having the predefined size until the content replaces the application selector and the second application is again displayed in the space originally-occupied by the second application prior to displaying the application selector (as shown in FIGS. 36F-36H). In some embodiments, the content that is scaled up is content that has been updated since the content was scaled down to the predefined size (for example, the content corresponds to a text message conversation and the content includes updated messaging information that was received after the scaling down but before the scaling up).

Further details relating to some embodiments of method 6000 are also provided in more detail above, in reference to FIGS. 36B and 36E-36H.

Figure 61A:
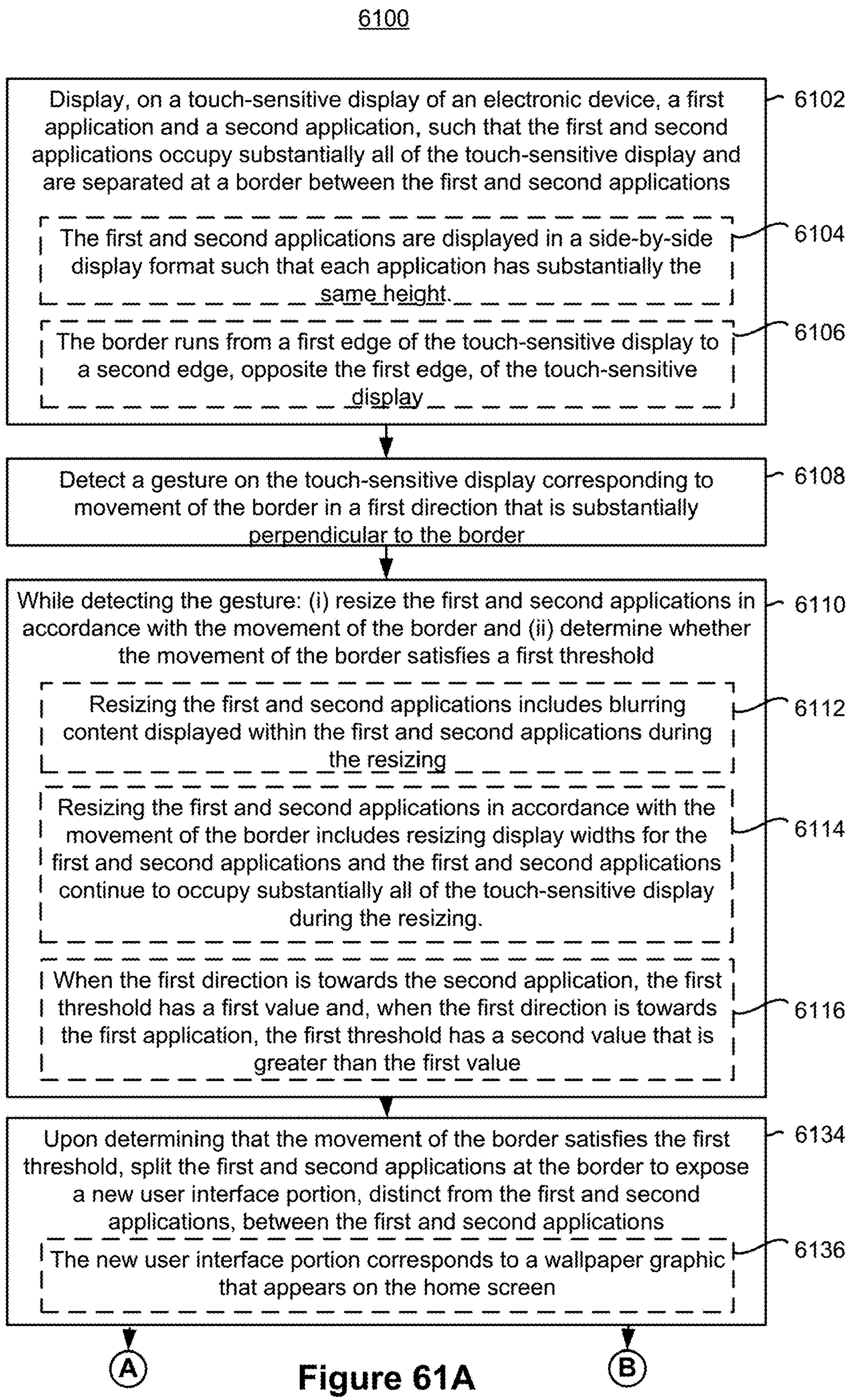
FIGS. 61A-61B are flowcharts depicting methods of resizing and dismissing applications displayed in a shared screen mode, in accordance with some embodiments.
Figure 61B:
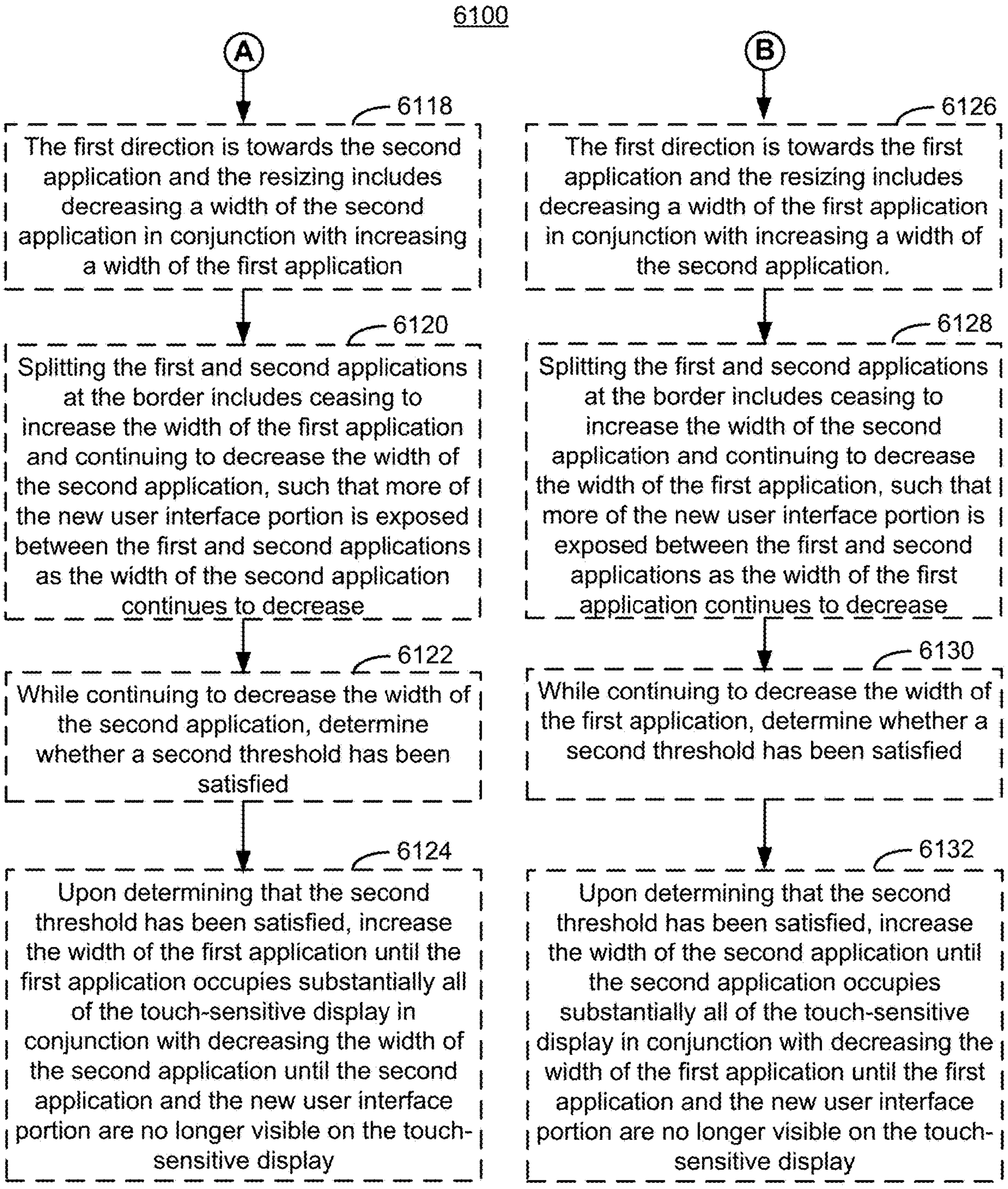

Attention is now directed to FIGS. 61A-61B, depicting flowcharts of a method 6100 of interacting with applications displayed using a shared screen mode, in accordance with some embodiments. The method 6100, in accordance with some embodiments, is performed by an electronic device with a touch-sensitive display (e.g., portable multifunction device 100, FIG. 1A). In some embodiments, FIGS. 61A-61B correspond to instructions stored in a computer-readable storage medium (e.g., memory 102 of the portable multifunction device 100, FIG. 1A).

As shown in FIG. 61A, in some embodiments, method 6100 begins when the electronic device displays (6102), on the touch-sensitive display, a first application and a second application such that the first and second applications occupy substantially all of the touch-sensitive display and are separated at a border between the first and second applications (e.g., applications 1 and 2 of FIG. 37H occupy substantially all of the touch-sensitive display and are separated at a border 3792). In some embodiments, the first and second applications are displayed (6104) in a side-by-side display format (i.e., the shared screen view) such that each application has substantially the same height. In some embodiments, the border runs (6106) from a first edge of the touch-sensitive display to a second edge, opposite the first edge of the touch-sensitive display. In some embodiments, the border is a vertical border that separates the first application from the second application and the border runs from a top edge of the touch-sensitive display to a bottom edge. In some embodiments, the border is not a distinct user interface element but is instead the point at which the first and second applications meet on the touch-sensitive display.

Method 6100 also includes the electronic device detecting (6108) a gesture on the touch-sensitive display corresponding to movement of the border in a first direction that is substantially perpendicular to the border. In some embodiments, the gesture includes a contact at the border (e.g., border 3792) between the first and second applications and movement of the contact in a first direction that is substantially perpendicular to the border (i.e., a leftward direction towards the main application (application 1) or a rightward direction towards the side application (application 2)). In some embodiments, the gesture includes two substantially simultaneous contacts (e.g., contacts 607A and 607B, FIG. 6B) on the touch-sensitive surface, including a first contact over the first application and a second contact over the second application, and movement of the contacts in the first direction.

In some embodiments, while detecting the gesture the electronic device: (i) resizes (6110) the first and second applications in accordance with movement of the border and (ii) determines whether the movement of the border satisfies a first threshold (e.g., determines whether a current position of the border has moved beyond threshold 3781). In some embodiments, the determination instead involves determining whether a width corresponding to the first or the second application during the resizing satisfies a threshold width (e.g., the width is greater than a maximum width or less than a minimum width). In some embodiments, resizing the first and second applications involves blurring (6112) content displayed within the first and second applications during the resizing. In some embodiments, blurring the content displayed within the first and second applications during the resizing includes displaying an icon associated with the first application over the blurred content of the first application and displaying an icon associated with the second application over the blurred content of the second application. In some embodiments, resizing the first and second applications in accordance with the movement of the border includes (6114) resizing display widths for the first and second applications (i.e., display heights remain constant) and, during the resizing, the first and second applications continue to occupy substantially all of the touch-sensitive display.

Upon determining that the movement of the border satisfies the first threshold (or, alternatively, upon determining that a characteristic of the gesture (e.g., distance travelled, velocity, or the like) satisfies a threshold), the electronic device splits (6134) the first and second applications at the border, exposing a new user interface portion (e.g., a background portion of a home screen) between the first and second applications. In some embodiments, the new user interface portion corresponds (6136) to a wallpaper graphic that appears on the home screen. In some embodiments, the new user interface portion is a wallpaper (e.g., a wallpaper selected by a user of the electronic device) that appears on a springboard interface of the electronic device. In some embodiments, the home screen comprises (i) a springboard interface that includes selectable icons corresponding to applications available on the electronic device and also includes (ii) a dock portion, at a bottom portion below the springboard interface, that includes additional applications (distinct from those displayed within the springboard interface). When the first direction is towards the second application (6116), the first threshold has a first value and, when the first direction is towards the first application, the first threshold has a second value that is greater than the first value. In some embodiments, the first and second thresholds correspond to available sizes for the side or main application. In some embodiments, when the first direction is towards the second application, the first threshold has a first value that corresponds to a first distance away from an edge of the touch-sensitive display and, when the first direction is towards the first application, the first threshold has a second value that corresponds to a second distance away from the edge of the touch-sensitive display, wherein the second distance is a greater distance away from the edge than the first distance. The method 6100 includes two processing paths depending on the first direction. Processing operations 6118 through 6124 correspond to the first processing path that is taken when the first direction is towards the second application and processing operations 6126 through 6132 correspond to the second processing path that is taken when the first direction is towards the first application.

In some embodiments, in the first processing path, the first direction is towards (6118) the second application and the resizing includes decreasing a width of the second application in conjunction with increasing a width of the first application (e.g., gesture 3730, FIG. 37K is moving towards application 2 and, as shown in FIG. 37L, as the gesture 3730 moves across the touch-sensitive display, the width of application 1 increases and the width of application 2 decreases). In some embodiments, splitting the first and second applications at the border includes (6120) ceasing to increase the width of the first application and continuing to decrease the width of the second application, such that more of the new user interface portion (e.g., a background portion of the home screen) is exposed between the first and second applications as the width of the second application continues to decrease. For example, as shown in FIGS. 37K-37L, after a position of the border (or a characteristic of the gesture) satisfies the threshold 3782, the device ceases to increase the width of application 1 and continues to decrease the width of application 2, exposing home screen wallpaper 3792 between applications 1 and 2 (FIG. 37L). After ceasing to increase the width of application 1, gesture 3730 continues to move across the touch-sensitive display and, in accordance with the movement of the gesture 3730, the device continues to decrease the width of application 1 in conjunction with exposing more of the home screen wallpaper 3792.

Additionally, in some embodiments, while continuing to decrease the width of the second application, the device determines (6122) whether a second threshold (e.g., threshold 3783) has been satisfied (e.g., determines whether a current position of the border has move beyond the threshold 3783). Upon determining that the second threshold has been satisfied, the device increases (6124) the width of the first application until the first application occupies substantially all of the touch-sensitive display in conjunction with decreasing the width of the second application until the second application and the new user interface portion (e.g., a background portion of the home screen) are no longer visible on the touch-sensitive display (as shown in FIG. 37M, application 2 is just about to be dismissed from the touch-sensitive display and application 1 will then occupy substantially all of the touch-sensitive display). In some embodiments, application 1 appears to catch up to application 2, as application 2 is dismissed from the touch-sensitive display (i.e., as application 2 slides off of the edge of the touch-sensitive display, application 1 slides over, covering the exposed home screen wallpaper 3792, and just catching up to application 2 before application 2 is no longer displayed).

In some embodiments, in the second processing path, the first direction is towards (6126) the first application and the resizing includes decreasing a width of the first application in conjunction with increasing a width of the second application (e.g., gesture 3710, FIG. 37H is moving towards application 2 and, as shown in FIG. 37I, as the gesture 3710 moves across the touch-sensitive display, the width of application 1 decreases and the width of application 2 increases). In some embodiments, splitting the first and second applications at the border includes (6128) ceasing to increase the width of the second application and continuing to decrease the width of the first application, such that more of the new user interface portion is exposed between the first and second applications as the width of the first application continues to decrease. For example, as shown in FIGS. 37H-37I, after a position of the border (or a characteristic of the gesture) satisfies the threshold 3781, the device ceases to increase the width of application 2 and continues to decrease the width of application 1, exposing home screen wallpaper 3792 between applications 1 and 2 (FIG. 37I). After ceasing to increase the width of application 2, gesture 3710 continues to move across the touch-sensitive display and, in accordance with the movement of the gesture 3710, the device continues to decrease the width of application 1 in conjunction with exposing more of the home screen wallpaper 3792.

Additionally, in some embodiments, while continuing to decrease the width of the first application, the device determines (6130) whether a second threshold (e.g., threshold 3780) has been satisfied (e.g., determines whether a current position of the border has moved beyond the threshold 3780). Upon determining that the second threshold has been satisfied, the device increases (6132) the width of the second application until the second application occupies substantially all of the touch-sensitive display in conjunction with decreasing the width of the first application until the first application and the new user interface portion are no longer visible on the touch-sensitive display (as shown in FIG. 37J, application 1 is just about to be dismissed from the touch-sensitive display and application 2 will then occupy substantially all of the touch-sensitive display). In some embodiments, application 2 appears to catch up to application 1, as application 1 is dismissed from the touch-sensitive display (i.e., as application 1 slides off of the edge of the touch-sensitive display, application 2 slides over, covering the exposed home screen wallpaper 3792, and just catching up to application 1 before application 1 is no longer displayed).

Further details relating to some embodiments of method 6100 are also provided in more detail above, in reference to FIGS. 37H-37M.

Figure 62A:
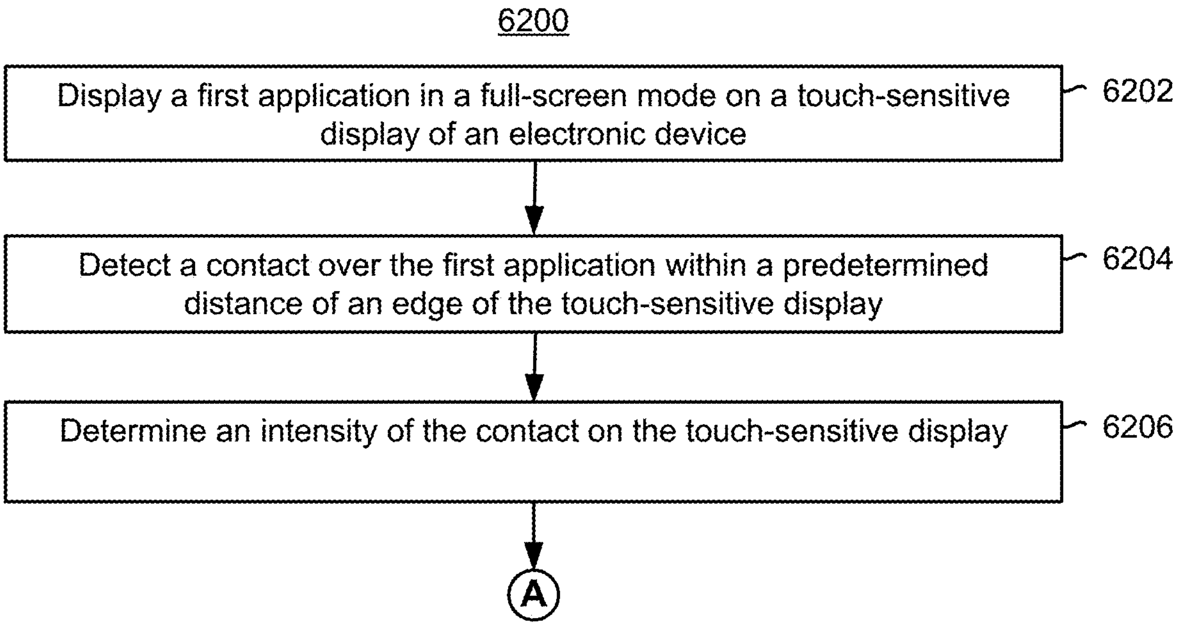
FIGS. 62A-62C are flowcharts depicting methods of displaying and interacting with previously-displayed applications, in accordance with some embodiments.
Figure 62B:
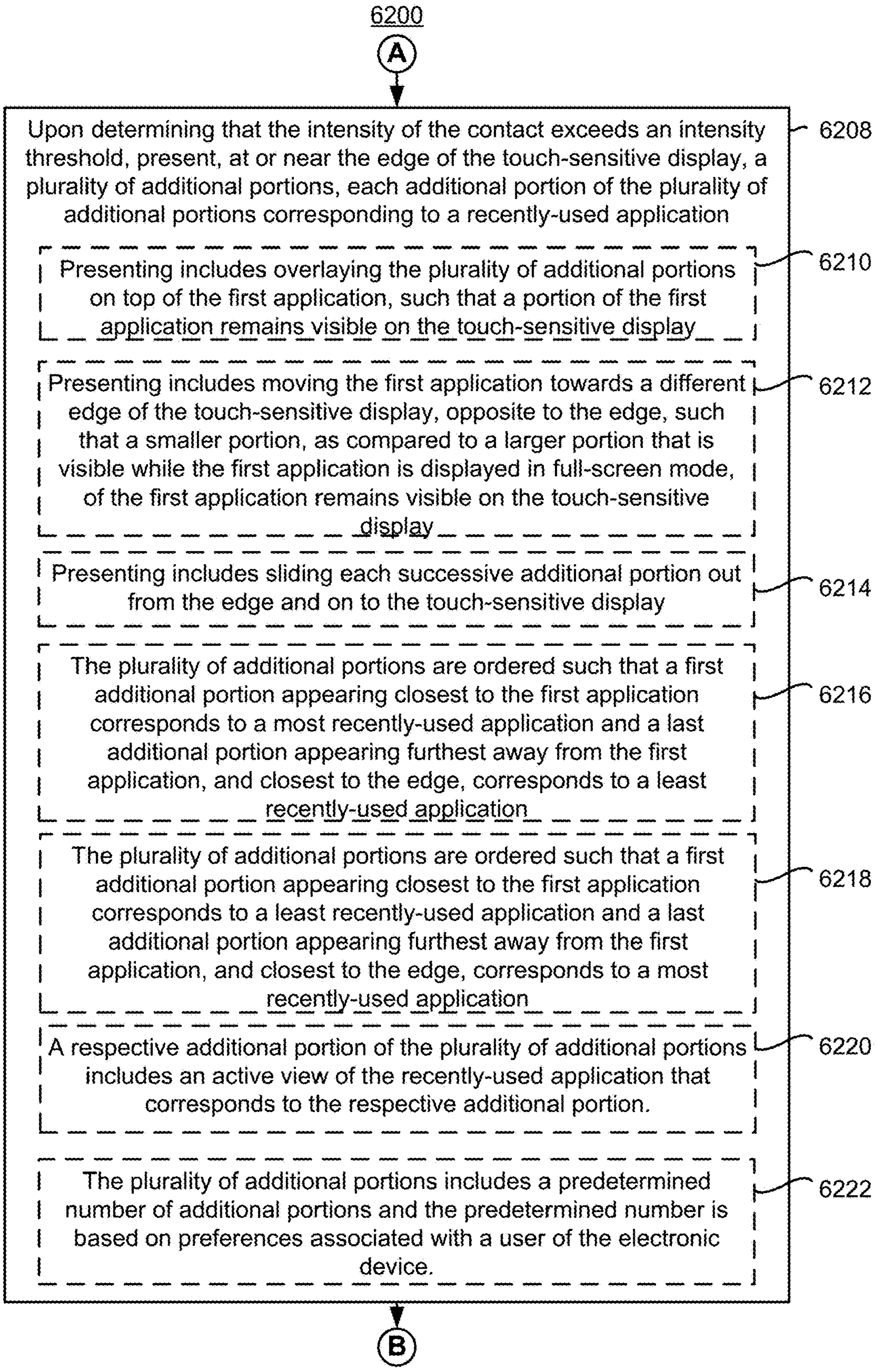

Attention is now directed to FIGS. 62A-62B, depicting flowcharts of a method 6200 of activating and interacting with an application selector, in accordance with some embodiments. The method 6200, in accordance with some embodiments, is performed by an electronic device with a touch-sensitive display (e.g., portable multifunction device 100, FIG. 1A). In some embodiments, FIGS. 62A-62B correspond to instructions stored in a computer-readable storage medium (e.g., memory 102 of the portable multifunction device 100, FIG. 1A).

As shown in FIG. 62A, in some embodiments, method 6200 begins when the electronic device displays (6202), on the touch-sensitive display, a first application in a full-screen mode (i.e., such that the first application occupies substantially all of the touch-sensitive display, as shown for application 1 in FIG. 53H). The electronic device detects (6204) a contact (e.g., contact 5360) over the first application near an edge (e.g., a leftmost edge or within a predetermined distance of the leftmost edge) of the touch-sensitive display.

The electronic device determines (6206) an intensity of the contact on the touch-sensitive display (e.g., the electronic device monitors signals received from one or more contact intensity sensors included in the electronic device and determines the intensity of the contact based on the monitored signals). In some embodiments, the electronic device determines the intensity of the contact in response to detecting the contact over the first application and within the predetermined distance of the leftmost edge of the touch-sensitive display. With reference to FIG. 62B, upon determining that the intensity of the contact exceeds an intensity threshold (e.g., $IT_1$ of intensity of contact 5370, FIG. 53H), the electronic device presents (6208), at or near the edge of the touch-sensitive display, a plurality of additional portions, each additional portion of the plurality of additional portions corresponding to a recently-used application (FIG. 52I). Each respective recently-used application is a distinct and different application from the first application. In some embodiments, the additional portions include content corresponding to each recently-used application (e.g., the additional portions display an active view or a representation of an active view of content associated with each recently-used application). In some embodiments, the additional portions each correspond to application-specific thin strips (i.e., each thin strip is associated with one particular application and displays content associated with that one particular application) of the touch-sensitive display that run along the length of an edge of the touch-sensitive display (e.g., each thin strip runs from a bottom to a top of a leftmost edge of the touch-sensitive display). In some embodiments the additional portions/thin strips are evenly-spaced and evenly-sized narrow, rectangular portions of the touch-sensitive display. In some embodiments, each rectangular portion spans from a bottom edge of the touch-sensitive display to a top edge of the touch-sensitive display.

In some embodiments, presenting includes (6210) overlaying the plurality of additional portions on top of the first application such that a portion of the first application remains visible on the touch-sensitive display. In other words, each additional portion covers up a portion of the first application. Alternatively, presenting includes moving (6212) the first application towards a different edge (e.g., a rightmost edge) of the touch-sensitive display, opposite to the edge, such that a smaller portion, as compared to a larger portion that is visible while the first application is displayed in the full-screen mode, of the first application remains visible on the touch-sensitive display. As shown in FIG. 53I, the plurality of additional portions (e.g., the additional portions corresponding to applications 2, 3, 4, and 5) either overlay application 1 or push application 1 towards the different edge, such that a portion of application 1 is no longer displayed.

In some embodiments, presenting includes sliding (6214) each successive additional portion out from the edge and on to the touch-sensitive display. In some embodiments, the plurality of additional portions are ordered (6216) such that a first additional portion appearing closest to the first application (e.g., the additional portion corresponding to application 5, FIG. 53I) corresponds to a most-recently-used application (e.g., an application that was open immediately before opening the currently-displayed application (application 1)) and a last additional portion appearing furthest away from the first application (e.g., the additional portion corresponding to application 2), and closest to the edge, corresponds to a least-recently-used application. Alternatively, the plurality of additional portions are ordered (6218) such that a first additional portion appearing closest to the first application corresponds to a least-recently-used application and a last additional portion appearing furthest away from the first application, and closest to the edge, corresponds to a most-recently-used application.

Figure 62C:
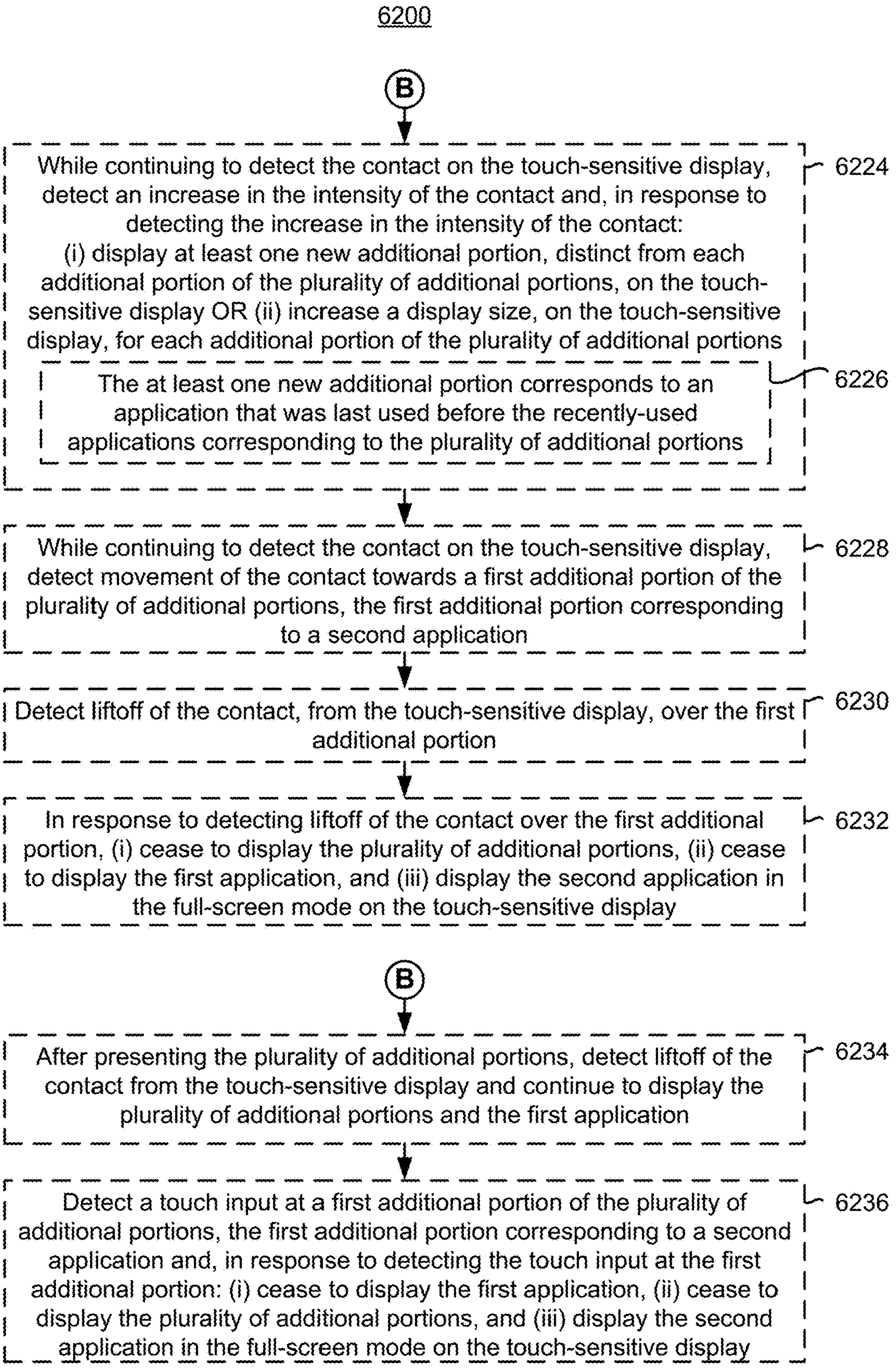

Turning now to FIG. 62C, in some embodiments, a respective additional portion of the plurality of additional portions includes (6220) an active view of the recently-used application that corresponds to the respective additional portion. In some embodiments, the plurality of additional portions includes (6222) a predetermined number of additional portions and the predetermined number is based on preferences associated with a user of the electronic device. For example, multitasking module 180 of memory 102 (FIG. 1A) stores a preference that indicates a number of recently-used applications that the user would like to see in response to the contact exceeding the intensity of contact threshold.

In some embodiments, while continuing to detect the contact (i.e., contact 5360 continues to remain in contact with the touch-sensitive display and does not break contact with the touch-sensitive display) on the touch-sensitive display, the device detects (6224) an increase in the intensity of the contact. In some circumstances, the increase in the intensity of the contact corresponds to a user pressing harder on the touch-sensitive display, such that the force/pressure applied by the contact increases. In response to detecting the increase in the intensity of the contact (or in accordance with a determination that an intensity of the contact after the increase in the intensity satisfies another threshold (e.g., $IT_2$) or that the increase in the intensity satisfies the another threshold), the device: displays at least one new additional portion, distinct from each additional portion of the plurality of additional portions, on the touch-sensitive display. For example, as shown in FIG. 53K, the intensity of the contact 5360 (as shown in intensity of contact measurement 5370) has satisfied (i.e., force of the contact is greater than or equal to) a second threshold, $IT_2$. As such, touch screen 112 now displays at least one new additional portion (e.g., the new additional portion corresponding to application 6). In some embodiments, the device displays more additional portions as the intensity of the contact continues to increase. In other embodiments, the device displays one new additional portion each time the intensity of the contact exceeds the second threshold. For example, consistent with these other embodiments, a user presses harder on the touch-sensitive display, such that the contact exceeds the second threshold, to reveal a new additional portion, releases some of the pressure such that the intensity of the contact falls below the second threshold and then again press harder on the touch-sensitive display such that the intensity of the contact again satisfies the second threshold and, in response, the device displays one more new additional portion, and so on. In some embodiments, the at least one new additional portion corresponds (6266) to an application that was last used before the recently-used applications corresponding to the plurality of additional portions. Stated another way, application 6 (in the example shown in FIG. 53K) was last used before any of applications 2-5.

In some embodiments, instead of or in addition to revealing the at least one new additional portion in response to the increase in the intensity of the contact, the device increases a display size, on the touch-sensitive display, for each additional portion of the plurality of additional portions (e.g., as shown in FIG. 53J). In some embodiments, as the intensity of the contact continues to increase, the display size for each additional portion continues to increase accordingly, up to a predefined maximum size for each additional portion (e.g., ⅙ of the total display area available on the touch-screen display).

In some embodiments, while continuing to detect the contact on the touch-sensitive display (i.e., the contact is a continuous contact and does not break contact with the surface of the touch-sensitive display), the device detects (6228) movement of the contact towards a first additional portion of the plurality of additional portions (e.g., as shown in FIG. 53K, contact 5360 moves from a first position near applications 2 and 3 to a second position that is substantially over application 4), the first additional portion corresponding to a second application (e.g., application 4 in the example illustrated in FIG. 53K) that is distinct from the first application. The device detects liftoff of the contact (6230), from the touch-sensitive display, over the first additional portion. For example, the contact 5360 in FIG. 53K lifts off from the touch-sensitive display at the second position that is substantially over application 4. In response to detecting liftoff of the contact over the first additional portion, the device: (i) ceases to display the plurality of additional portions, (ii) ceases to display the first application, and (iii) displays the second application in the full-screen mode on the touch-sensitive display. For example, as shown in FIG. 53L, the plurality of additional portions and the first application (e.g., application 1) are no longer displayed on touch screen 112 and the second application (e.g., application 4) is displayed in the full-screen mode on touch screen 112.

In some embodiments, after presenting the plurality of additional portions (e.g., in operation 6208), the device detects (6234) liftoff of the contact from the touch-sensitive display and continues to display the plurality of additional portions and the first application on the touch-sensitive display. In this way, a user of the device is able to press hard enough to satisfy the first intensity threshold (e.g., $IT_1$) and then release the contact and the device will continue to display the plurality of additional portions without the user needing to maintain the contact on the touch-sensitive display. For example, if the user lifts off contact 5360 from the touch-sensitive display after satisfying $IT_1$ and causing the device to present the plurality of additional portions, the device will, in these embodiments, continue to display the plurality of additional portions even after the liftoff of the contact (e.g., the additional portions corresponding to each of applications 2-5, as shown in FIG. 53I). In some embodiments, the device then detects (6236) a touch input (e.g., a second contact) at a first additional portion of the plurality of additional portions (e.g., the second contact is substantially over the additional portion corresponding to application 4, FIG. 53I). The first additional portion corresponds to a second application (e.g., application 4 in the current example illustrated in FIG. 53I). In response to detecting the touch input at the first additional portion, the device: (i) ceases to display the first application, (ii) ceases to display the plurality of additional portions, and (iii) displays the second application in the full-screen mode on the touch-sensitive display (e.g., as shown in FIG. 53L).

In some embodiments, a user of the device configures a preference as to whether a liftoff event will cause the device to continue displaying the additional portions or whether a liftoff event will cause the device to cease displaying the additional portions.

In some embodiments, the additional portions described above (in reference to FIGS. 53H-53L) are additionally activated in response to a double-tap on the home button (e.g., home button 204, FIG. 53I). In this way, users are able to quickly access the additional portions corresponding to recently-used applications by either pressing hard enough to satisfy an intensity threshold (as discussed above) or by double-tapping on the home button.

In some embodiments, the additional portions described above are displayed at varying levels of depth and/or blurring based on when the application corresponding to each additional portion was last used. For example, with reference to FIG. 53I, if application 5 is the most recently-used application and application 2 is the least recently-used application then, consistent with these embodiments, the additional portion corresponding to application 2 is displayed such that it appears farther away from (at a greater depth away from) a user of the device than the additional portion corresponding to application 5 (which appears closest to the user). In some embodiments, the content associated with application 5 that is displayed within the additional portion corresponding to application 5 is displayed without any blurring and the content for application 2 within the additional portion corresponding to application 2 is blurred. In some embodiments, the content for each application within each additional portion is blurred at a level that corresponds to when each application was last used, such that an additional portion corresponding to a least recently-used application (e.g., application 2 in the above example) is displayed with the most blurriness and an additional portion corresponding to the most recently-used application is displayed with a least amount of blurriness, and such that the additional portions therebetween, corresponding to applications 3 and 4, are displayed at intermediary levels of blurriness. Stated another way, each additional portion between the additional portions corresponding to applications 2 through 5 (and the content displayed therein), is displayed with decreasing levels of blurriness, when moving from the least recently-used application to the most recently-used application. In this way, the user of the device is provided with an easily-understandable visual representation of when (and in what order) each recently-used application corresponding to the additional portions was used. The user is thus able to quickly identify and select a desired recently-used application (selecting recently-used applications corresponding to the displayed additional portions is discussed above, e.g., in reference to operations 6228-6230 and 6234-6236 of FIG. 62C).

Further details relating to some embodiments of method 6200 are also provided above, in reference to FIGS. 53H-53L.

Although FIGS. 54A-54E, 55, 56, 57A-57C, 58, 59A-59B, 60A-60B, 61A-61B, and 62A-62C illustrate a number of operations in a particular order, operations which are not order dependent may be reordered and other operations may be combined or broken out. Furthermore, in some implementations, some operations may be performed in parallel and/or simultaneously with other operations. While some reordering or other groupings are specifically mentioned, others will be apparent to those of ordinary skill in the art, so the ordering and groupings presented herein are not an exhaustive list of alternatives. Moreover, it should be recognized that the operations could be implemented in hardware, firmware, software, or any combination thereof.

In accordance with some embodiments, FIGS. 63-71 show functional block diagrams of an electronic device configured in accordance with the principles of the various described embodiments. The functional blocks of the electronic device are, optionally, implemented by hardware, software, firmware, or a combination thereof to carry out the principles of the various described embodiments. It is understood by persons of skill in the art that the functional blocks described in FIGS. 63-71 are, optionally, combined or separated into sub-blocks to implement the principles of the various described embodiments. Therefore, the description herein optionally supports any possible combination or separation or further definition of the functional blocks described herein. For ease of discussion, each electronic device (e.g., electronic device 6300, 6400, 6500, 6600, 6700, 6800, 6900, 7000, and 7100, FIGS. 63-71, respectively) is implemented as a portable multifunction device 100 (FIGS. 1A-1B).

Figure 63:
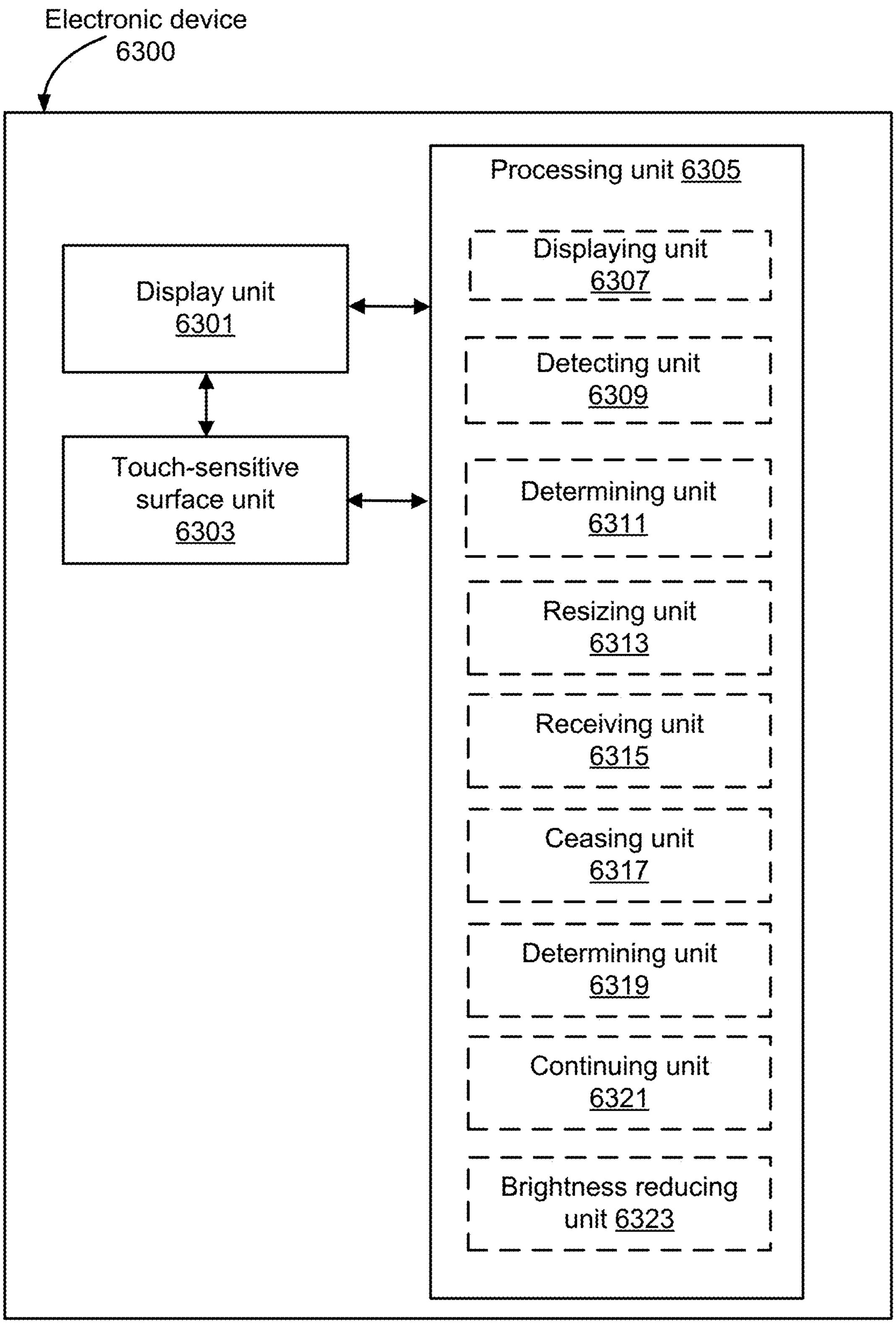
FIGS. 63-71 are functional block diagrams of an electronic device, in accordance with some embodiments.

As shown in FIG. 63, the electronic device 6300, includes a display unit 6301 configured to display information (e.g., touch-sensitive display system 112 (also referred to as a touch screen and touch-sensitive display), FIG. 1A), a touch-sensitive surface unit 6303 (e.g., display controller 156 and touch-sensitive display system 112, FIG. 1A) configured to receive contacts, gestures, and other user inputs on the touch-sensitive display, and a processing unit 6305 coupled with the display unit 6301 and the touch-sensitive surface unit 6303. In some embodiments, the processing unit 6305 includes a displaying unit 6307, a detecting unit 6309, a determining unit 6311, a resizing unit 6313, a receiving unit 6315, a ceasing unit 6317, a determining unit 6319, a continuing unit 6321, and/or a brightness reducing unit 6323.

The processing unit 6305 is configured to: cause display of (e.g., using display unit 6301) a first application on the touch-sensitive display (e.g., with the displaying unit 6307); detect a first contact on the touch-sensitive display (e.g., with detecting unit 6309 and touch-sensitive surface unit 6303); in response to detecting the first contact: temporarily display the second application overlaying at least a portion of the displayed first application (e.g., with displaying unit 6307 and display unit 6301); determine whether the first application is compatible with a shared screen mode (e.g., with determining unit 6311); upon determining that the first application is compatible with the shared screen mode: (i) resize the first application (e.g., with resizing unit 6313) and display the resized first application on the touch-sensitive display (e.g., with display unit 6301 and displaying unit 6307); and (ii) concurrently display the second application on the touch-sensitive display (e.g., with displaying unit 6307 and display unit 6301) such that the resized first application and the concurrently displayed second application occupy substantially all of the touch-sensitive display. In some embodiments of the electronic device 6300, the processing unit (or one or more components thereof, such as units 6307-6323) is further configured to perform the method in any one of A2-A22 described above in the "Summary" section.

Figure 64:
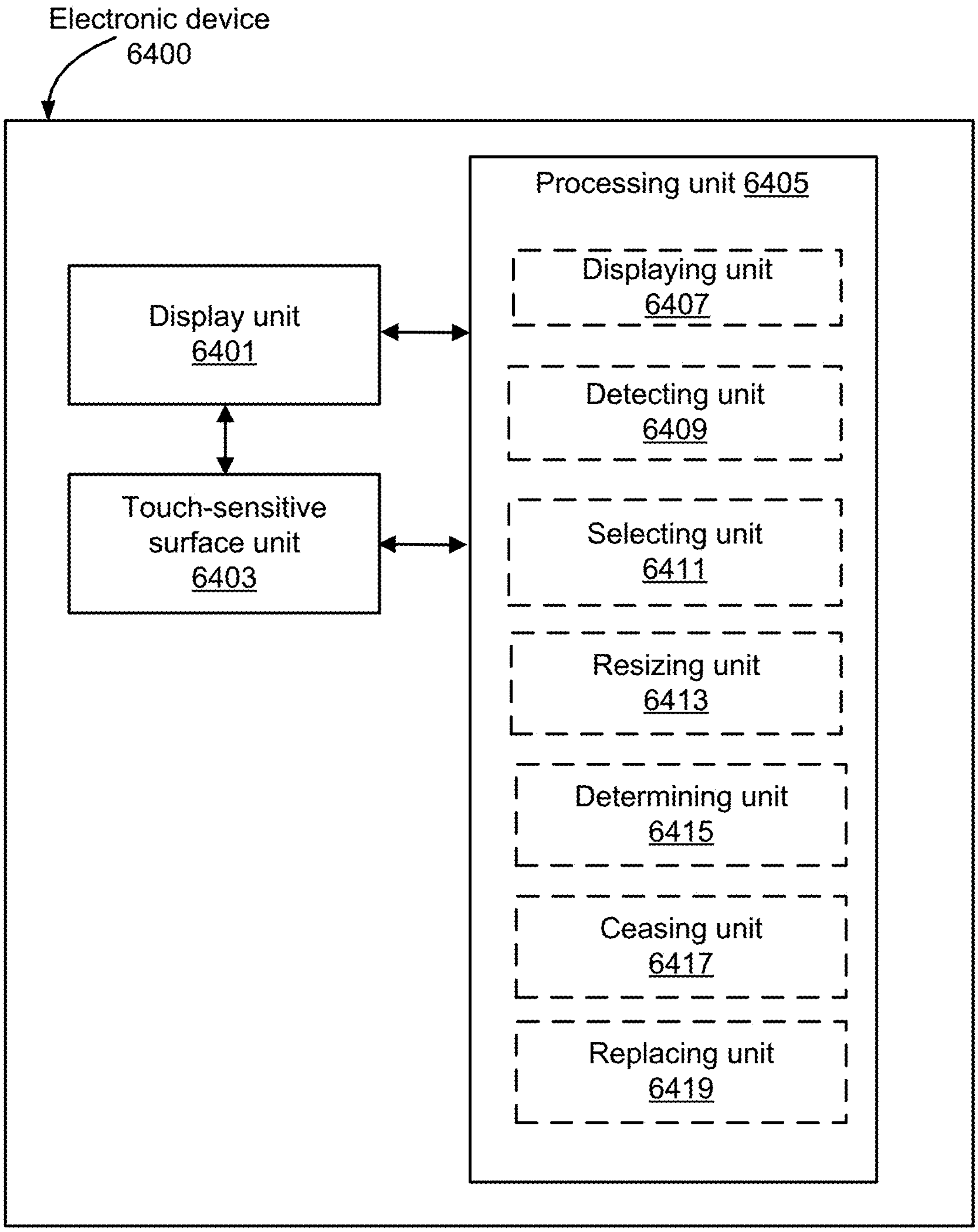

As shown in FIG. 64, the electronic device 6400, includes a display unit 6401 configured to display information (e.g., touch-sensitive display system 112 (also referred to as a touch screen and touch-sensitive display), FIG. 1A), a touch-sensitive surface unit 6403 (e.g., display controller 156 and touch-sensitive display system 112, FIG. 1A) configured to receive contacts, gestures, and other user inputs on the touch-sensitive display, and a processing unit 6405 coupled with the display unit 6401 and the touch-sensitive surface unit 6403. In some embodiments, the processing unit 6405 includes a displaying unit 6407, a detecting unit 6409, a selecting unit 6411, a resizing unit 6413, a determining unit 6415, a ceasing unit 6417, and/or a replacing unit 6419.

The processing unit 6405 is configured to: cause concurrent display of (e.g., using display unit 6401) a first application and a second application on the touch-sensitive display (e.g., with the displaying unit 6407); detect a first contact at a border between the concurrently displayed first and second applications (e.g., with detecting unit 6409 and touch-sensitive surface unit 6403); immediately following detecting the first contact, detect a gesture from a location of the first contact towards an edge of the touch-sensitive display adjacent to the displayed first application temporarily display the second application overlaying at least a portion of the displayed first application (e.g., with detecting unit 6409 and touch-sensitive surface unit 6403); upon detecting the gesture: (i) select a fixed display area from a plurality of predefined fixed display areas for the second application (e.g., with selecting unit 6411), (ii) automatically resize the second application to the selected fixed display area (e.g., with resizing unit 6413), and (iii) automatically resize the first application to occupy substantially all of a remaining area of the touch-sensitive display (e.g., with resizing unit 6413). In some embodiments of the electronic device 6400, the processing unit (or one or more components thereof, such as units 6407-6419) is further configured to perform the method in any one of A24-A26 described above in the "Summary" section.

Figure 65:
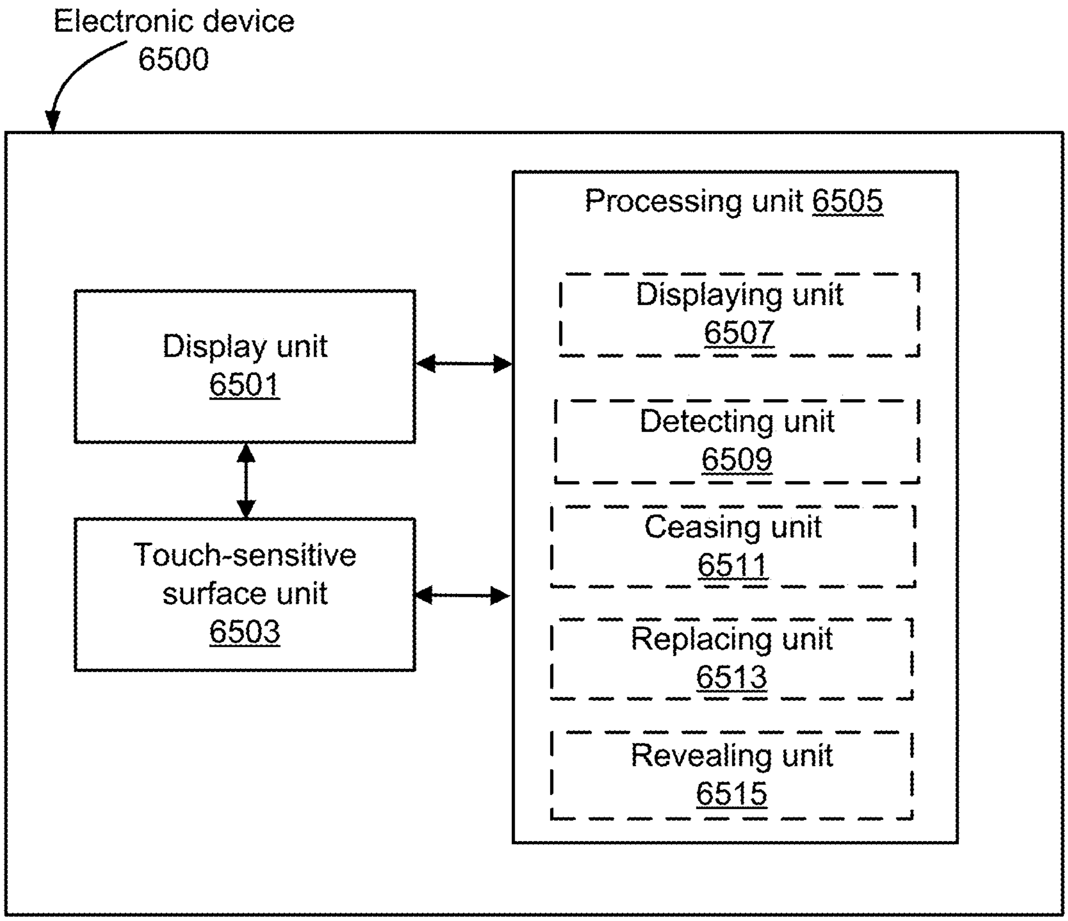

As shown in FIG. 65, the electronic device 6500, includes a display unit 6501 configured to display information (e.g., touch-sensitive display system 112 (also referred to as a touch screen and touch-sensitive display), FIG. 1A), a touch-sensitive surface unit 6503 (e.g., display controller 156 and touch-sensitive display system 112, FIG. 1A) configured to receive contacts, gestures, and other user inputs on the touch-sensitive display, and a processing unit 6505 coupled with the display unit 6501 and the touch-sensitive surface unit 6503. In some embodiments, the processing unit 6505 includes a displaying unit 6507, a detecting unit 6509, a ceasing unit 6511, a replacing unit 6513, and/or a revealing unit 6515.

The processing unit 6505 is configured to: cause concurrent display of (e.g., using display unit 6501) a first application and a second application on the touch-sensitive display (e.g., with the displaying unit 6507); display a notification associated with a third application on the touch-sensitive display (e.g., with the displaying unit 6507); detect a first contact at a first location on the touch-sensitive display over the displayed notification (e.g., with detecting unit 6509 and touch-sensitive surface unit 6503); upon detecting the first contact: (i) detect a gesture from the first location to a second location on the touch-sensitive display over the displayed second application (e.g., with detecting unit 6509 and touch-sensitive surface unit 6503) and (ii) detect a liftoff event at the second location (e.g., with detecting unit 6509 and touch-sensitive surface unit 6503); in response to detecting the liftoff event: (i) cease to display the notification (e.g., with ceasing unit 6511 and displaying unit 6507) and (ii) replace the displayed second application with the third application (e.g., with replacing unit 6513 and displaying unit 6507). In some embodiments of the electronic device 6500, the processing unit (or one or more components thereof, such as units 6507-6515) is further configured to perform the method in any one of A28-A29 described above in the "Summary" section.

Figure 66:
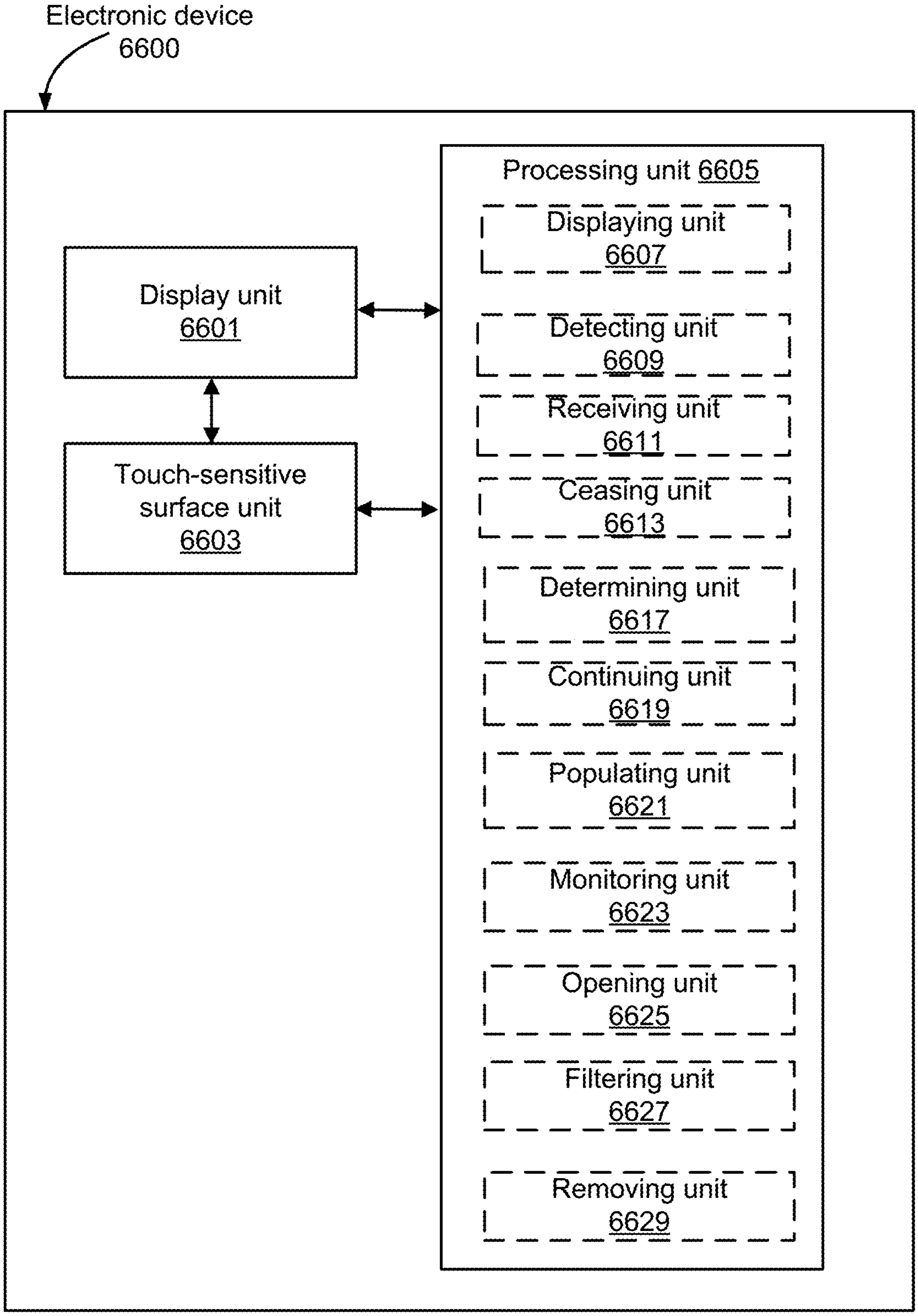

As shown in FIG. 66, the electronic device 6600, includes a display unit 6601 configured to display information (e.g., touch-sensitive display system 112 (also referred to as a touch screen and touch-sensitive display), FIG. 1A), a touch-sensitive surface unit 6603 (e.g., display controller 156 and touch-sensitive display system 112, FIG. 1A) configured to receive contacts, gestures, and other user inputs on the touch-sensitive display, and a processing unit 6605 coupled with the display unit 6601 and the touch-sensitive surface unit 6603. In some embodiments, the processing unit 6605 includes a displaying unit 6607, a detecting unit 6609, a receiving unit 6611, a ceasing unit 6613, a determining unit 6617, a continuing unit 6619, a populating unit 6621, a monitoring unit 6623, an opening unit 6623, a filtering unit 6627, and/or a removing unit 6629.

The processing unit 6605 is configured to: cause display of (e.g., using display unit 6601) a first application in a full-screen mode on the touch-sensitive display (e.g., with the displaying unit 6607); receive a first contact on the touch-sensitive display (e.g., with the receiving unit 6611); in response to receiving the first contact, display an application selector on the touch-sensitive display, wherein the displayed application selector overlays at least a portion of the displayed first application (e.g., with the displaying unit 6607); detect a second contact at an affordance displayed within the application selector (e.g., with the detecting unit 6609 and the touch-sensitive surface unit 6603); in response to detecting the second contact at the affordance: (i) cease to display the application selector (e.g., with the ceasing unit 6613 and the displaying unit 6607) and (ii) display a second application corresponding to the selected affordance in an area of the touch-sensitive display previously occupied by the application selector (e.g., with the displaying unit 6607). In some embodiments of the electronic device 6600, the processing unit (or one or more components thereof, such as units 6607-6629) is further configured to perform the method in any one of B2-B12 described above in the "Summary" section.

Figure 67:
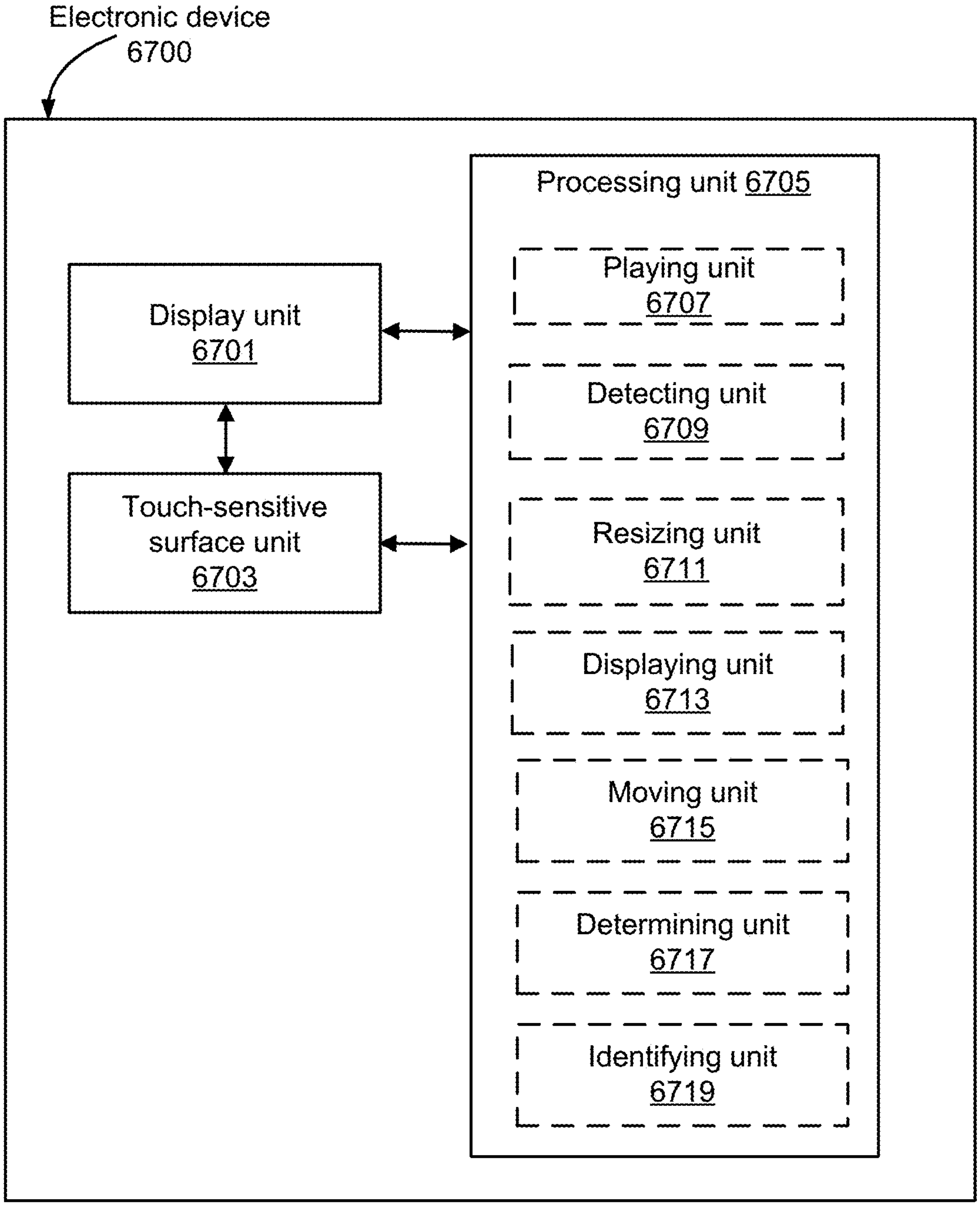

As shown in FIG. 67, the electronic device 6700, includes a display unit 6701 configured to display information (e.g., touch-sensitive display system 112 (also referred to as a touch screen and touch-sensitive display), FIG. 1A), a touch-sensitive surface unit 6703 (e.g., display controller 156 and touch-sensitive display system 112, FIG. 1A) configured to receive contacts, gestures, and other user inputs on the touch-sensitive display, and a processing unit 6705 coupled with the display unit 6701 and the touch-sensitive surface unit 6703. In some embodiments, the processing unit 6705 includes a playing unit 6707, a detecting unit 6709, a resizing unit 6711, a displaying unit 6713, moving unit 6715, determining unit 6717, and/or identifying unit 6719.

The processing unit 6705 is configured to cause the electronic device to: play video content in a full-screen mode on the touch-sensitive display (e.g., using display unit 6701 and with the playing unit 6707); while playing the video content in the full-screen mode, detect a selection of a hardware button of the electronic device (e.g., with the detecting unit 6709); in response to detecting the selection: (i) resize the video content to fit within a reduced area of the touch-sensitive display (e.g., with the resizing unit 6711) and (ii) display the resized video content overlaying a screen associated with the hardware button (e.g., with the displaying unit 6713). In some embodiments of the electronic device 6700, the processing unit (or one or more components thereof, such as units 6707-6719) is further configured to perform the method in any one of C2-C6 described above in the "Summary" section.

Figure 68:
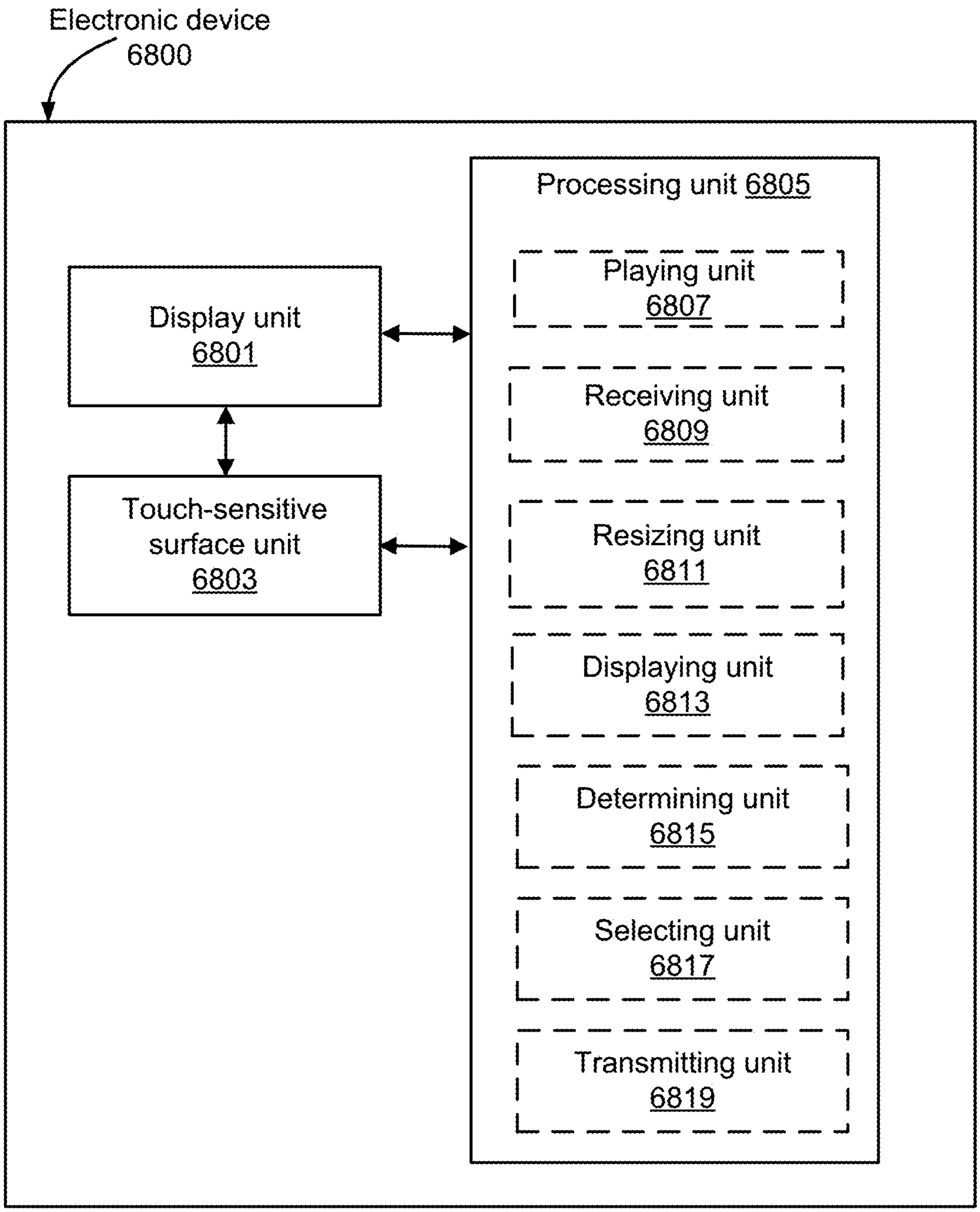

As shown in FIG. 68, the electronic device 6800, includes a display unit 6801 configured to display information (e.g., touch-sensitive display system 112 (also referred to as a touch screen and touch-sensitive display), FIG. 1A), a touch-sensitive surface unit 6803 (e.g., display controller 156 and touch-sensitive display system 112, FIG. 1A) configured to receive contacts, gestures, and other user inputs on the touch-sensitive display, and a processing unit 6805 coupled with the display unit 6801 and the touch-sensitive surface unit 6803. In some embodiments, the processing unit 6805 includes a playing unit 6807, a receiving unit 6809, a resizing unit 6811, a displaying unit 6813, a determining unit 6815, a selecting unit 6817, and/or a transmitting unit 6819.

The processing unit 6805 is configured to cause the electronic device to: play video content in a full-screen mode on the touch-sensitive display (e.g., using display unit 6801 and with the playing unit 6807), the video content being associated with a first application; while playing the video content in the full-screen mode, receive a pinch gesture at the displayed video content (e.g., with the receiving unit 6809); in response to receiving the pinch gesture: (i) resize the video content to a reduced display size (e.g., with the resizing unit 6811) and (ii) display the video content having the reduced display size overlaying a portion of the first application (e.g., with the displaying unit 6813). In some embodiments of the electronic device 6800, the processing unit (or one or more components thereof, such as units 6807-6819) is further configured to perform the method in any one of C8-C13 described above in the "Summary" section.

Figure 69:
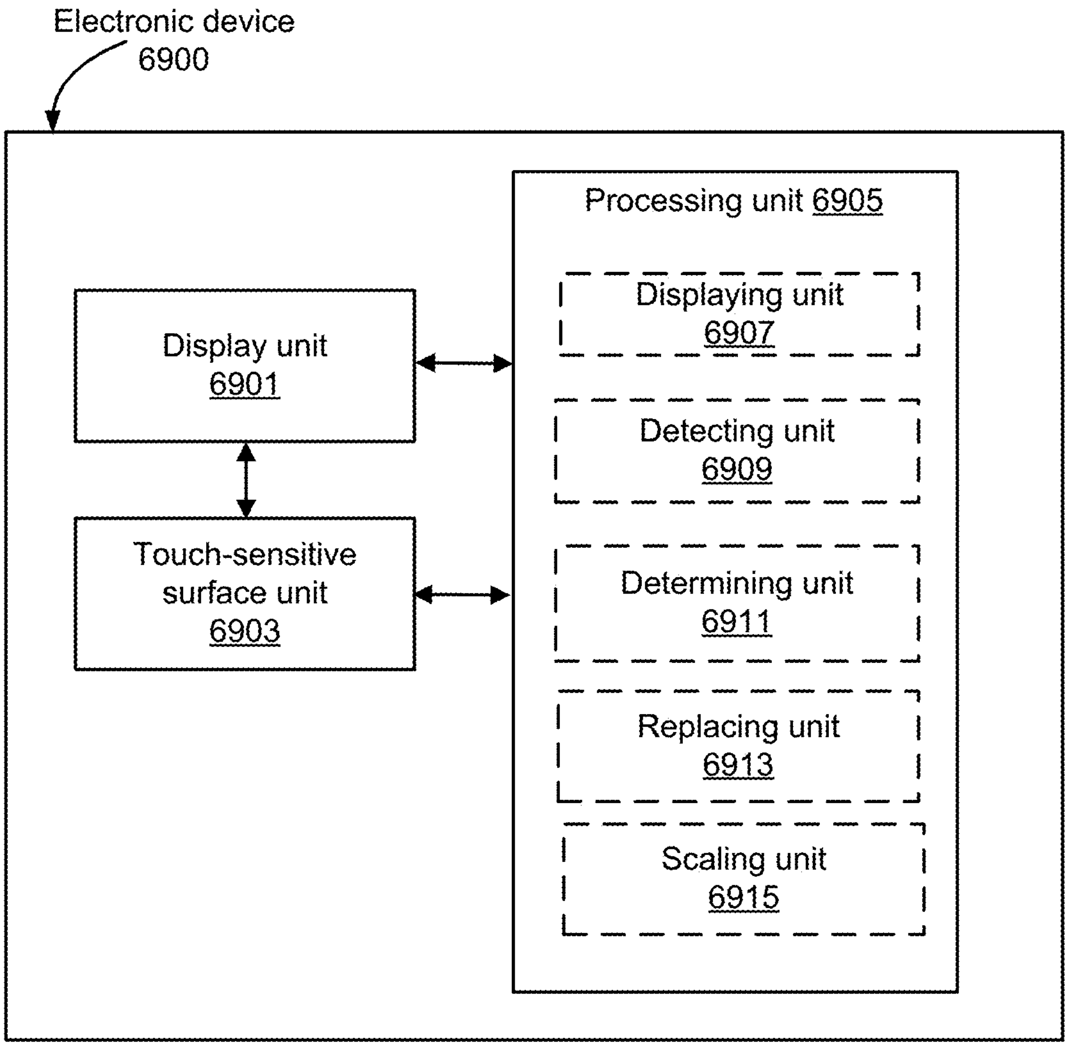

As shown in FIG. 69, the electronic device 6900, includes a display unit 6901 configured to display information (e.g., touch-sensitive display system 112 (also referred to as a touch screen and touch-sensitive display), FIG. 1A), a touch-sensitive surface unit 6903 (e.g., display controller 156 and touch-sensitive display system 112, FIG. 1A) configured to receive contacts, gestures, and other user inputs on the touch-sensitive display, and a processing unit 6905 coupled with the display unit 6901 and the touch-sensitive surface unit 6903. In some embodiments, the processing unit 6905 includes a displaying unit 6907, a detecting unit 6909, a determining unit 6911, a replacing unit 6913, and/or a scaling unit 6915.

The processing unit 6905 is configured to cause the electronic device to: display, on the touch-sensitive display, a first application and a second application, such that the first and second applications occupy substantially all of the touch-sensitive display and are separated at a border between the first and second applications (e.g., using display unit 6901 and with the displaying unit 6907); detect a swipe gesture at the second application (e.g., with the detecting unit 6909), the swipe gesture moving in a direction that is substantially parallel to the border; in response to detecting the swipe gesture, determine whether the swipe gesture satisfies a threshold (e.g., with the determining unit 6911); and upon determining that the swipe gesture satisfies the threshold, replace the second application with an application selector that includes a plurality of selectable affordances corresponding to applications available on the electronic device, the application selector being displayed in an area of the touch-sensitive display previously occupied by the second application (e.g., with the replacing unit 6913). In some embodiments of the electronic device 6900, the processing unit (or one or more components thereof, such as units 6907-6915) is further configured to perform the method in any one of D2-D9 described above in the "Summary" section.

Figure 70:
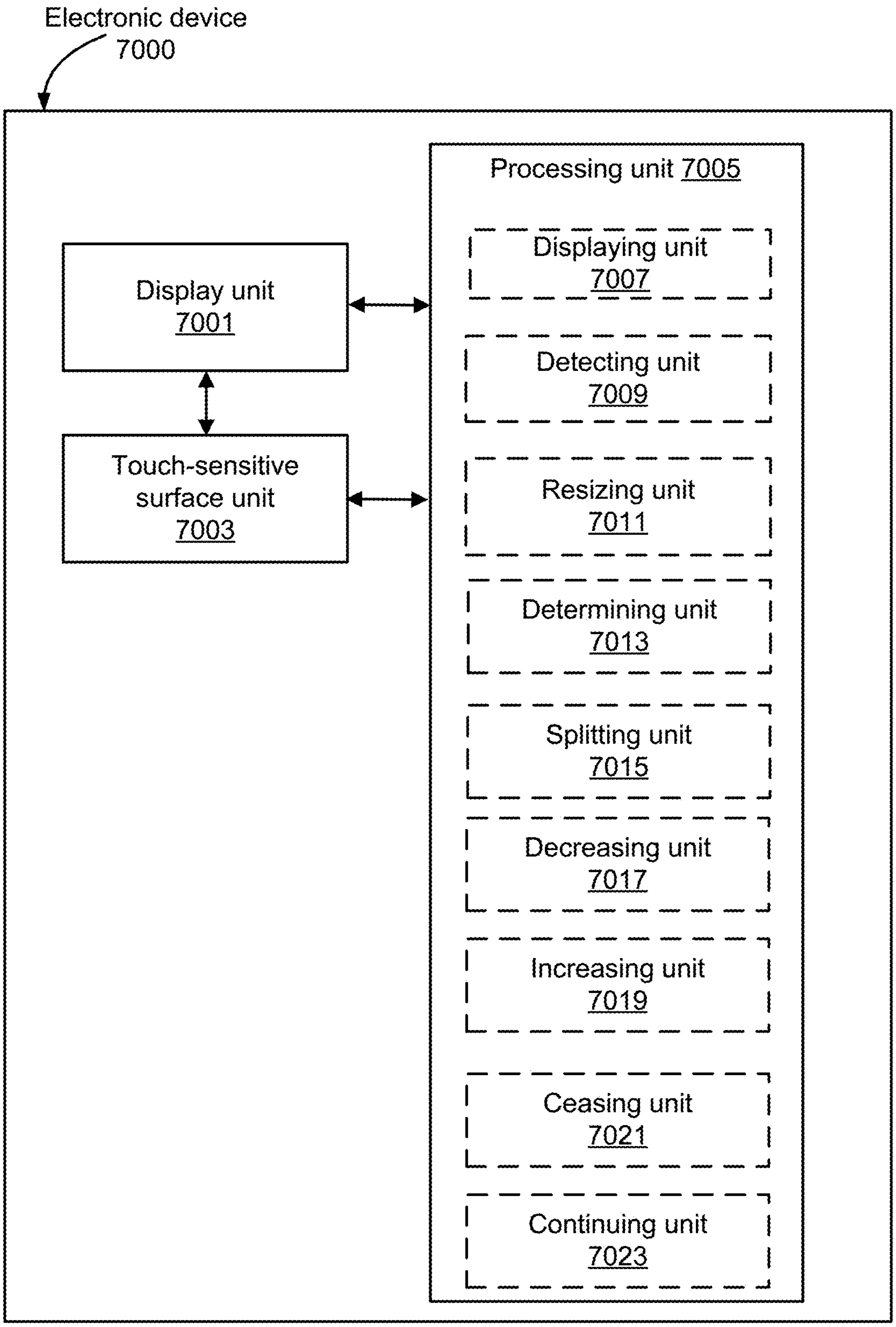

As shown in FIG. 70, the electronic device 7000, includes a display unit 7001 configured to display information (e.g., touch-sensitive display system 112 (also referred to as a touch screen and touch-sensitive display), FIG. 1A), a touch-sensitive surface unit 7003 (e.g., display controller 156 and touch-sensitive display system 112, FIG. 1A) configured to receive contacts, gestures, and other user inputs on the touch-sensitive display, and a processing unit 7005 coupled with the display unit 7001 and the touch-sensitive surface unit 7003. In some embodiments, the processing unit 7005 includes a displaying unit 7007, a detecting unit 7009, a resizing unit 7011, and a determining unit 7013, a splitting unit 7015, a decreasing unit 7017, an increasing unit 7019, a ceasing unit 7021, and/or a continuing unit 7023.

The processing unit 7005 is configured to cause the electronic device to: display, on the touch-sensitive display, a first application and a second application such that the first and second applications occupy substantially all of the touch-sensitive display and are separated at a border between the first and second applications (e.g., using display unit 7001 and with the displaying unit 7007); detect a gesture on the touch-sensitive surface corresponding to movement of the border in a first direction that is substantially perpendicular to the border (e.g., with the detecting unit 7009); while detecting the gesture, (i) resize the first and second applications in accordance with the movement of the border (e.g., with the resizing unit 7011) and (ii) determine whether the movement of the border satisfies a first threshold (e.g., with the determining unit 7013); and upon determining that the movement of the border satisfies the first threshold, split the first and second applications at the border to expose a new user interface portion (e.g., a background portion of a home screen) between the first and second applications (e.g., with the splitting unit 7015). In some embodiments of the electronic device 7000, the processing unit (or one or more components thereof, such as units 7007-7023) is further configured to perform the method in any one of E2-E13 described above in the "Summary" section.

Figure 71:
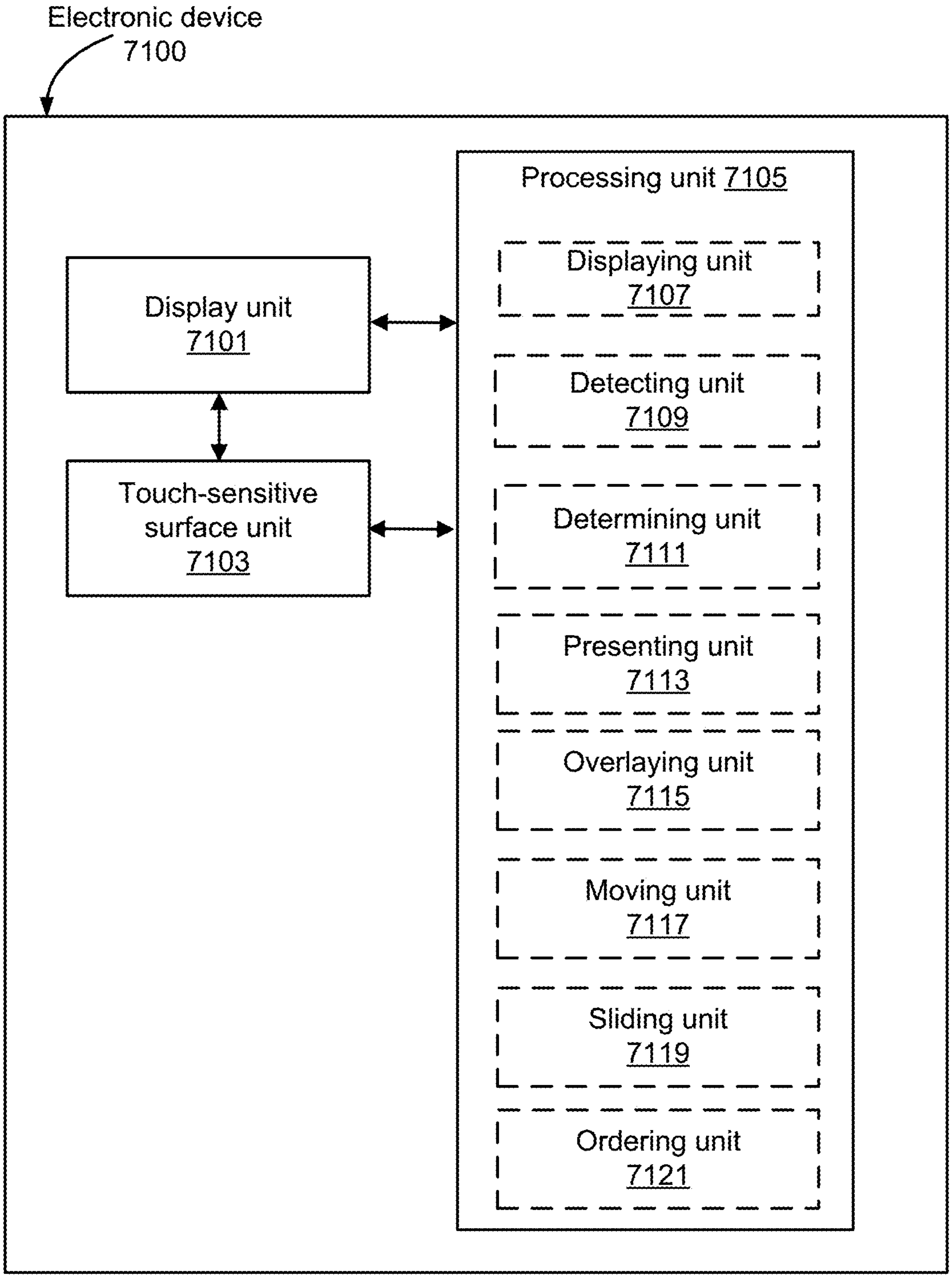

As shown in FIG. 71, the electronic device 7100, includes a display unit 7101 configured to display information (e.g., touch-sensitive display system 112 (also referred to as a touch screen and touch-sensitive display), FIG. 1A), a touch-sensitive surface unit 7103 (e.g., display controller 156 and touch-sensitive display system 112, FIG. 1A) configured to receive contacts, gestures, and other user inputs on the touch-sensitive display, and a processing unit 7105 coupled with the display unit 7101 and the touch-sensitive surface unit 7103. In some embodiments, the processing unit 7105 includes a displaying unit 7107, a detecting unit 7109, a determining unit 7111, a presenting unit 7113, an overlaying unit 7115, a moving unit 7117, a sliding unit 7119, and/or an ordering unit 7121.

The processing unit 7105 is configured to cause the electronic device to: display a first application in a full-screen move on the touch-sensitive display (e.g., using display unit 7101 and with the displaying unit 7107); detect a contact over the first application within a predetermined distance of an edge of the touch-sensitive display (e.g., with the detecting unit 7109); determine an intensity of the contact on the touch-sensitive display (e.g., with the determining unit 7111); and upon determining that the intensity of the contact exceeds an intensity threshold, present, at or near the edge of the touch-sensitive display, a plurality of additional portions, each additional portion of the plurality of additional portions corresponding to a recently-display application (e.g. with the presenting unit 7113). In some embodiments of the electronic device 7100, the processing unit (or one or more components thereof, such as units 7107-7121) is further configured to perform the method in any one of F2-F14 described above in the "Summary" section.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best use the invention and various described embodiments with various modifications as are suited to the particular use contemplated.

What is claimed is:

1. A non-transitory computer-readable storage medium storing executable instructions that, when executed by an electronic device with a touch-sensitive display, cause the electronic device to:

play video content in a full-screen mode on the touch-sensitive display, wherein the video content is associated with a respective application;

while playing the video content in the full-screen mode, receive a gesture that includes movement of a contact over the displayed video content;

in response to receiving the gesture that includes movement of the contact over the displayed video content:

resize the video content to a reduced display size; and display the video content having the reduced display size overlaying at least one application icon on a home screen user interface while continuing to play the video content, wherein the home screen user interface includes an arrangement of application icons, including a first application icon for launching a first application and a second application icon for launching a second application.

2. The non-transitory computer-readable storage medium of claim 1, wherein the executable instructions, when executed by the electronic device, further cause the electronic device to:

detect a second gesture on the resized video content;

in response to detecting the second gesture, determine whether a characteristic of the second gesture satisfies a threshold; and upon determining that the characteristic of the second gesture satisfies the threshold, automatically display the resized video content in a full-screen mode.

3. The non-transitory computer-readable storage medium of claim 2, wherein the characteristic of the gesture and the characteristic of the second gesture are selected from the group consisting of: velocity, distance travelled, and location of a liftoff event.

4. The non-transitory computer-readable storage medium of claim 1, wherein the executable instructions, when executed by the electronic device, further cause the electronic device to:

detect a respective gesture on the resized video content;

determine whether the respective gesture is of a predetermined type; and upon determining that the respective gesture is of a predetermined type, transmit the video content to a video playback device separate and apart from the electronic device.

5. The non-transitory computer-readable storage medium of claim 1, wherein the executable instructions, when executed by the electronic device, further cause the electronic device to:

continue playing the video content while resizing the video content.

6. The non-transitory computer-readable storage medium of claim 1, wherein the executable instructions, when executed by the electronic device, further cause the electronic device to:

while displaying the video content having the reduced display size at a first location, detect a second gesture directed to the video content having reduced display size, the second gesture includes a movement in a first direction; and in response to the second gesture, move the video content having the reduced display size in the first direction from the first location to a second location while overlaying the home screen user interface.

7. The non-transitory computer-readable storage medium of claim 6, wherein moving the video content having the reduced display size from the first location to the second location occurs while continuing to play the video content.

8. The non-transitory computer-readable storage medium of claim 1, wherein the executable instructions, when executed by the electronic device, further cause the electronic device to:

while the video content having the reduced display size is overlaying the home screen user interface, detect a second gesture over the video content having the reduced display size; and in response to detecting the second gesture:

while the video content is overlaying the home screen user interface, resize the video content to an increased display size that is less than a full-screen size.

9. The non-transitory computer-readable storage medium of claim 1, wherein the executable instructions, when executed by the electronic device, further cause the electronic device to:

while playing the video content in the full-screen mode, display a button for activating a picture-in-picture display mode.

10. The non-transitory computer-readable storage medium of claim 9, wherein the executable instructions, when executed by the electronic device, further cause the electronic device to:

while playing the video content in the full-screen mode, detect a first input selecting the button for activating the picture-in-picture display mode; and in response to detecting the first input selecting the button for activating the picture-in-picture display mode:

resize the video content to a reduced display size; and display the video content having the reduced display size overlaying a user interface of the respective application.

11. The non-transitory computer-readable storage medium of claim 1, wherein a picture-in-picture display mode is activated in response to the gesture.

12. The non-transitory computer-readable storage medium of claim 1, wherein the executable instructions, when executed by the electronic device, further cause the electronic device to:

while the video content having the reduced display size is displayed overlaying the home screen user interface, detect a selection input directed at a respective application icon of one of the first application icon or the second application icon displayed on the home screen user interface; and in response to the selection input, display the video content having the reduced display size overlaying a user interface of a respective application associated with the selected respective application icon application icon or the second application icon.

13. The non-transitory computer-readable storage medium of claim 12, wherein the user interface of the respective application is displayed in full-screen mode.

14. The non-transitory computer-readable storage medium of claim 12, wherein the video content having the reduced display size continues to play while overlaying the user interface of the respective application.

15. An electronic device, comprising:

a touch-sensitive display unit configured to display user interfaces and to receive contacts from a user;

a processing unit coupled with the touch-sensitive display unit, the processing unit configured to:

play video content in a full-screen mode on the touch-sensitive display unit, wherein the video content is associated with a respective application;

while playing the video content in the full-screen mode, receive a gesture that includes movement of a contact over the displayed video content;

in response to receiving the gesture that includes movement of the contact over the displayed video content:

resize the video content to a reduced display size; and display the video content having the reduced display size overlaying at least one application icon on a home screen user interface while continuing to play the video content, wherein the home screen user interface includes an arrangement of application icons, including a first application icon for launching a first application and a second application icon for launching a second application.

16. The electronic device of claim 15, wherein the processing unit is further configured to:

detect a second gesture on the resized video content;

in response to detecting the second gesture, determine whether a characteristic of the second gesture satisfies a threshold; and upon determining that the characteristic of the second gesture satisfies the threshold, automatically display the resized video content in a full-screen mode.

17. The electronic device of claim 16, wherein the characteristic of the gesture and the characteristic of the second gesture are selected from the group consisting of: velocity, distance travelled, and location of a liftoff event.

18. The electronic device of claim 15, wherein the processing unit is further configured to:

detect a respective gesture on the resized video content;

determine whether the respective gesture is of a predetermined type; and upon determining that the respective gesture is of a predetermined type, transmit the video content to a video playback device separate and apart from the electronic device.

19. The electronic device of claim 15, wherein the processing unit is further configured to:

continue playing the video content while resizing the video content.

20. The electronic device of claim 15, wherein the processing unit is further configured to:

while displaying the video content having the reduced display size at a first location, detect a second gesture directed to the video content having reduced display size, the second gesture includes a movement in a first direction; and in response to the second gesture, move the video content having the reduced display size in the first direction from the first location to a second location while overlaying the home screen user interface.

21. The electronic device of claim 20, wherein moving the video content having the reduced display size from the first location to the second location occurs while continuing to play the video content.

22. The electronic device of claim 15, wherein the processing unit is further configured to:

while the video content having the reduced display size is overlaying the home screen user interface, detect a second gesture over the video content having the reduced display size; and in response to detecting the second gesture:

while the video content is overlaying the home screen user interface, resize the video content to an increased display size that is less than a full-screen size.

23. The electronic device of claim 15, wherein the processing unit is further configured to while playing the video content in the full-screen mode, display a button for activating a picture-in-picture display mode.

24. The electronic device of claim 23, wherein the processing unit is further configured to:

while playing the video content in the full-screen mode, detect a first input selecting the button for activating the picture-in-picture display mode; and in response to detecting the first input selecting the button for activating the picture-in-picture display mode:

resize the video content to a reduced display size; and display the video content having the reduced display size overlaying a user interface of the respective application.

25. The electronic device of claim 15, wherein a picture-in-picture display mode is activated in response to the gesture.

26. The electronic device of claim 15, wherein the processing unit is further configured to:

while the video content having the reduced display size is displayed overlaying the home screen user interface, detect a selection input directed at a respective application icon of one of the first application icon or the second application icon displayed on the home screen user interface; and in response to the selection input, display the video content having the reduced display size overlaying a user interface of a respective application associated with the selected respective application icon application icon or the second application icon.

27. The electronic device of claim 26, wherein the user interface of the respective application is displayed in full-screen mode.

28. The electronic device of claim 26, wherein the video content having the reduced display size continues to play while overlaying the user interface of the respective application.

29. A method, comprising:

at an electronic device with a touch-sensitive display:

playing video content in a full-screen mode on the touch-sensitive display, wherein the video content is associated with a respective application;

while playing the video content in the full-screen mode, receiving a gesture that includes movement of a contact over the displayed video content;

in response to detecting the gesture that includes movement of the contact over the displayed video content:

resizing the video content to a reduced display size; and displaying the video content having the reduced display size overlaying at least one application icon on a home screen user interface while continuing to play the video content, wherein the home screen user interface includes an arrangement of application icons, including a first application icon for launching a first application and a second application icon for launching a second application.

30. The method of claim 27, including:

detecting a second gesture on the resized video content;

in response to detecting the second gesture, determining whether a characteristic of the second gesture satisfies a threshold; and upon determining that the characteristic of the second gesture satisfies the threshold, automatically displaying the resized video content in a full-screen mode.

31. The method of claim 30, wherein the characteristic of the gesture and the characteristic of the second gesture are selected from the group consisting of: velocity, distance travelled, and location of a liftoff event.

32. The method of claim 27, including:

detecting a respective gesture on the resized video content;

determining whether the respective gesture is of a predetermined type; and upon determining that the respective gesture is of a predetermined type, transmitting the video content to a video playback device separate and apart from the electronic device.

33. The method of claim 29, including:

continue playing the video content while resizing the video content.

34. The method of claim 17, including:

while displaying the video content having the reduced display size at a first location, detecting a second gesture directed to the video content having reduced display size, the second gesture includes a movement in a first direction; and in response to the second gesture, moving the video content having the reduced display size in the first direction from the first location to a second location while overlaying the home screen user interface.

35. The method of claim 34, wherein moving the video content having the reduced display size from the first location to the second location occurs while continuing to play the video content.

36. The method of claim 29, including:

while the video content having the reduced display size is overlaying the home screen user interface, detecting a second gesture over the video content having the reduced display size; and in response to detecting the second gesture:

while the video content is overlaying the home screen user interface, resizing the video content to an increased display size that is less than a full-screen size.

37. The method of claim 29, including:

while playing the video content in the full-screen mode, displaying a button for activating a picture-in-picture display mode.

38. The method of claim 37, including:

while playing the video content in the full-screen mode, detecting a first input selecting the button for activating the picture-in-picture display mode; and in response to detecting the first input selecting the button for activating the picture-in-picture display mode:

resizing the video content to a reduced display size; and displaying the video content having the reduced display size overlaying a user interface of the respective application.

39. The method of claim 29, wherein a picture-in-picture display mode is activated in response to the gesture.

40. The method of claim 29, including:

while the video content having the reduced display size is displayed overlaying the home screen user interface, detecting a selection input directed at a respective application icon of one of the first application icon or the second application icon displayed on the home screen user interface; and in response to the selection input, displaying the video content having the reduced display size overlaying a user interface of a respective application associated with the selected respective application icon application icon or the second application icon.

41. The method of claim 40, wherein the user interface of the respective application is displayed in full-screen mode.

42. The method of claim 40, wherein the video content having the reduced display size continues to play while overlaying the user interface of the respective application.

* * * * *